United States Patent [19]

Fernandes et al.

[11] Patent Number: 4,689,752

[45] Date of Patent: Aug. 25, 1987

[54] SYSTEM AND APPARATUS FOR MONITORING AND CONTROL OF A BULK ELECTRIC POWER DELIVERY SYSTEM

[75] Inventors: Roosevelt A. Fernandes, Liverpool, N.Y.; William R. Smith-Vaniz, Darien, Conn.

[73] Assignee: Niagara Mohawk Power Corporation, Syracuse, N.Y.

[21] Appl. No.: 484,681

[22] Filed: Apr. 13, 1983

[51] Int. Cl.[4] .......................... G01R 19/00; H04B 7/00

[52] U.S. Cl. .................................... 364/492; 340/538; 340/657; 364/483

[58] Field of Search ................ 364/492, 483; 324/127; 340/538, 539, 657, 870.17, 870.38

[56] References Cited

U.S. PATENT DOCUMENTS

| | | | |
|---|---|---|---|
| 3,453,544 | 7/1969 | Schweitzer | 324/127 |
| 3,460,042 | 8/1969 | Harner | 324/127 |
| 3,983,477 | 9/1976 | Stuchly et al. | 324/127 X |
| 4,158,810 | 6/1979 | Leskovar | 324/127 |
| 4,268,818 | 5/1981 | Davis et al. | 340/870.38 |
| 4,371,908 | 2/1983 | Andow et al. | 364/492 X |
| 4,384,289 | 5/1983 | Stillwell et al. | 340/870.17 |
| 4,415,896 | 11/1983 | Allgood | 324/127 X |
| 4,420,752 | 12/1983 | Davis et al. | 340/870.17 |
| 4,429,299 | 1/1984 | Kabat et al. | 340/538 X |
| 4,446,458 | 5/1984 | Cook | 340/538 X |
| 4,484,290 | 11/1984 | Bagnall et al. | 340/538 X |
| 4,513,382 | 4/1985 | Faulkner, Jr. | 364/492 |

OTHER PUBLICATIONS

Stephen D. Foss, Sheng H. Lin, and Roosevelt A. Fernandes, Dynamic Thermal Line Ratings, Part I, IEEE paper No. 82 SM 377-0, presented at IEEE PES 1982 Summer Meeting.

Stephen D. Foss, Howard R. Stillwill, Sheng H. Lin, and Roosevelt A. Fernandes, Dynamic Thermal Line Ratings, Part I, IEEE paper No. 82 SM 378-8, presented at IEEE PES 1982 Summer Meeting.

*Primary Examiner*—Errol A. Krass

*Assistant Examiner*—Kevin J. Teska

*Attorney, Agent, or Firm*—Lalos, Keegan & Kaye

[57] ABSTRACT

Self contained radio transmitting state estimator modules are mounted on power conductors on both sides of power transformers in electrical substations and on power conductors at various places along electrical transmission lines. They are electrically isolated from ground and all other conductors. These modules are capable of measuring current, voltage, frequency and power factor (or the Fouier components thereof), the temperature of the conductor and the temperature of the ambient air. The modules transmit these parameters to local receivers. The receivers are connected by an appropriate data transmission link to a power control center which allows determination of the state of the power system. Appropriate control signals are transmitted back to the electrical switchgear of the system to bring it to the apppropriate optimum state. Direct local control may also be effected, for example, the prevention of overloading a transformer.

26 Claims, 73 Drawing Figures

© 1983 PDS

© 1983 PDS

FIG. 38

| Word | | | |
|---|---|---|---|
| 0 | SPARE | AUX I.D. | DONUT I.D. |
| 1 | $V_A$ | | |
| 2 | $V_B$ | | |
| 3 | $I_A$ | | |
| 4 | $I_B$ | | |
| 5 | AUXILLIARY DATA | | |
| 6 | CRC | | |

| AUXILLIARY I D: | | |
|---|---|---|
| | 0100 | TEMPERATURE 1 |
| | 0110 | TEMPERATURE 2 |
| | 1000 | CHECK GROUND |
| | 1010 | CHECK VOLTAGE |
| | 1100 | SPARE |
| | 1110 | SPARE |

THE MOST SIGNIFICANT BIT OF EACH WORD IS TRANSMITTED FIRST.

© 1983 PDS

© 1983 PDS

© 1983 PDS

© 1983 PDS

© 1983 PDS

© 1983 PDS

© 1983 PDS

© 1983 PDS

© 1983 PDS

© 1983 PDS

© 1983 PDS

© 1983 PDS

© 1983 PDS

© 1983 PDS

© 1983 PDS

© 1983 PDS

© 1983 PDS

©1983 PDS

© 1983 PDS

© 1983 PDS

© 1983 PDS

© 1983 PDS

© 1983 PDS

© 1983 PDS

FIG. 65

| WORD | | | |
|---|---|---|---|
| 0 | GP | PH | |
| 1 | VOLTAGE SCALE FACTOR | | |
| 3 | CURRENT SCALE FACTOR | | |
| 5 | TEMPERATURE SCALE FACTOR | | |
| 7 | TEMPERATURE OFFSET | | |

FIG. 66

| WORD | | | | | | | |
|---|---|---|---|---|---|---|---|
| 0 | DI | AC | VP | IT | DONUT ID | | BUFFER AGE |
| 1 | $V_a$ | | | | | | |
| 3 | $V_b$ | | | | | | |
| 5 | $I_a$ | | | | | | |
| 7 | $I_b$ | | | | | | |
| 9 | TEMP | | | | | | |
| 10 | VEFF | | | | | | |
| 12 | IEFF | | | | | | |
| 14 | SCALED TEMP | | | | | | |
| 16 | TOTAL WATTS | | | | | | |
| 17 | WATT SECONDS | | | | | | |
| 18 | KILOWATT HOURS | | | | | | |

FIG. 67

| WORD | | | | | |
|---|---|---|---|---|---|
| 0 | IT | GP | PH | | LINK |
| 1 | | | | | VG |
| 2 | CORRECTION FACTOR # 1 | | | | |
| 4 | CORRECTION FACTOR # 2 | | | | |
| 6 | CORRECTION FACTOR # 3 | | | | |
| 8 | CORRECTION FACTOR # 4 | | | | |

FIG. 68

| WORD | | | | | | |
|---|---|---|---|---|---|---|
| 0 | DI | AC | VP | IT | INPUT # | |
| 1 | RAW SAMPLE #1 | | | | | |
| 2 | RAW SAMPLE #2 | | | | | |
| 3 | RAW SAMPLE #3 | | | | | |
| 4 | RAW SAMPLE #4 | | | | | |
| 5 | RAW SAMPLE #5 | | | | | |
| 6 | RAW SAMPLE #6 | | | | | |
| 7 | RAW SAMPLE #7 | | | | | |
| 8 | RAW SAMPLE #8 | | | | | |
| 9 | RAW SAMPLE #9 | | | | | |
| 10 | COSINE COMPONENT (FROM FOURIER ANALYSIS) | | | | | |
| 12 | SINE COMPONENT (FROM FOURIER ANALYSIS) | | | | | |
| 14 | EFFECTIVE VALUE | | | | | |
| 16 | TOTAL WATTS | | | | | |
| 17 | WATT SECONDS | | | | | |
| 18 | KILOWATT HOURS | | | | | |

SYSTEM AND APPARATUS FOR MONITORING AND CONTROL OF A BULK ELECTRIC POWER DELIVERY SYSTEM

RELATED APPLICATION

This application is related to the prior U.S. patent application of Howard R. Stillwel and Roosevelt A. Fernandes entitled TRANSPONDER UNIT FOR MEASURING TEMPERATURE AND CURRENT ON LIVE TRANSMISSION LINES, U.S. Pat. No. 4,384,289, issued May 17, 1983, which application is incorporated herein by reference.

TECHNICAL FIELD

This invention relates to a system and apparatus for monitoring and control of a bulk electric power delivery system. More particularly it relates to such systems employing transmission line mounted radio transmitting electrically isolated modules, preferably mounted on all power conductors connected to both the primary and secondary sides of each power transformer to be monitored, on the highest temperature portions of transmission lines, and at intervals through the power delivery system. When so attached the modules form the basis for a dynamic state estimation for real-time computer control of an electric power delivery system.

Each module takes the form of a two piece donut that may be hot stick mounted on a live conductor utilizing a novel hinge clamp and novel hot stick tool.

Novel voltage measuring and fourier component measuring apparatus and a novel common channel unsynchronized transmission system are disclosed.

BACKGROUND ART

Various power line monitored sensors have been disclosed in the prior art. For example, see U.S. Pat. Nos. 3,428,896, 3,633,191, 4,158,810 and 4,268,818. It has been proposed to use sensors of this type and of the greatly improved form disclosed in the above-identified Stillwel and Fernandes application for dynamic line rating of electrical power transmission lines. See for example, papers numbered 82 SM 377-0 and 82 SM 378-8 entitled DYNAMIC THERMAL LINE RATINGS, PART I, DYNAMIC AMPACITY RATING ALGORITHM; and, DYNAMIC THERMAL LINE RATINGS, PART II, CONDUCTOR TEMPERATURE SENSOR AND LABORATORY FIELD TEST EVALUATION; papers presented at the Institute of Electrical and Electronic Engineers P.E.S. 1982 summer meeting. These papers are incorporated herein by reference. However, the full potential of this new technology has not been realized.

Today, for control and protection, power supply to and from an electrical substation over various transmission lines is monitored by separate devices (current transformers, potential transformers and reactive power transducers) for measuring electrical potential, power factor and current in the conductors of the transmission line and the conductors connected to substation power transformers. These measurements are transmitted in analog fashion by various wires to a central console at the substation where their values may or may not be digitized and sent to a central station for control of the entire power system. The wiring of these devices is difficult and expensive, and every excess wire in a substation presents an additional electrical shock hazard or an induction point for electromagnetic interference on protection/telemetry circuits. Furthermore, when a failure occurs, these sensor lines may be abruptly raised to higher voltages, thus increasing the possibility of shock and failure in the measurement system.

The high cost of capital, uncertain power utility load growth trends, coupled with increasing constraints in acquiring and licensing new facilities including right-of-way for transmission lines make greater use of existing power delivery facilities (remote generating stations, the EHV bulk power network, subtransmission and distribution facilities) a paramount consideration. With deferrals that have occurred in new generation and power transmission facilities, all elements of the power system will be strained to a greater degree than in the past. In order to maintain current reliability levels under these conditions, additional real-time monitoring will be required to assist the dispatch operator and other bulk network functions conducted through a modern Power Control Center.

Some of the functions in a hierarchical modern Power Control Center, operating through Regional Control Centers down to the distribution level, that require a real-time Supervisory Control and Data Acquisition System are as follows:

1. State Estimation
2. On-Line Load Flow Detection
3. Optimum Power Flow Control for Real and Reactive Power Dispatch
4. Security (i.e. Stability) Constrained Economic Dispatch
5. Contingency Analysis
6. Automatic Generation Control and Minimum Area Control Error
7. Dynamic System Security Analysis
8. Energy Interchange Billing
9. System Restoration After an Emergency
10. Load Shedding and Generation Redispatch
11. Determination of Effects of Voltage Reduction and Real and Reactive Power
12. Synchronization of System Load Profiles to validate various computer models and to provide snap shots of maximum, minimum loads, peak day real and reactive powers on lines and equipment
13. Maintain Power Delivery Quality Including Harmonic Content for Critical Loads and Power Factor
14. Limit checking of voltage, line thermal loadings and rate of change under contingency conditions
15. Protective Relaying.

The key parameters that require measurement for a modern Power Control Center State Estimator and On-Line Load Flow that provide the input data base for the various functions listed above are:

Line and Transformer Bank or Bus Power (MW) Flows
Line and Transformer Bank or Bus Reactive Power (MVAR)
Flow
Branch Currents (I), Bus Voltage and Phase Angles
Bus MW and MVAR Injections
Energy (MWh) and Reactive Energy (MVAR-h)
Circuit Breaker Status
Manual Switch Positions
Tap Changer Positions
Frequency (f)
Protective Relaying (Differential Currents, etc.)
Operation
Power Line Dynamic Ratings Based on Conductor Thermal (Temperature) Limits or Sag
Ambient Temperature/Wind Speed
Line and Equipment Power Factors
Sequence-of-Events Monitoring One of the major problems in implementing a modern Power Control System is to add instrumentation throughout the bulk transmission network at Extra High Voltage (up to 765 kV) line voltages and at distribution substations and feeders. This must be done without disrupting existing operations of equipment and facilities that are largely in place. Another requirement is to avoid adding too many transducers that might alter the burden on existing current transformers and degrade accuracy of existing metering or relaying instrumentation.

The toroidal conductor State Estimator Module and ground station processor, receiver/transmitter of the present invention eliminates the necessity for multiple wiring of transducers required with conventional current and potential transformers and collects all the data required from lines and station buses with a compact system. The invention results in significant investment, installation labor and time savings. It completely eliminates the need for multiple transducers, hard-wiring to current transformers and potential transformers and any degrading effects on existing relaying or metering links. The system can be retrofitted on existing lines or stations or new installations with equal ease and measures:

Line Voltage
Power Factor or Phase Angle
Power Per Phase
Line Current
Reactive Power Per Phase
Conductor Temperature
Ambient Temperature
Wind Speed
Harmonic Currents
Frequency
Mw-h and MVAR-h (processed quantities)
Profiles of above quantities from stored values The state-estimator data collection system described in this application enables power utilities to implement modern power control systems more rapidly, at lower cost and with considerable flexibility, since the devices can be moved around using hot-sticks without having to interrupt power flow. The devices can be calibrated and checked through the radio link and the digital output can be multiplexed with other station data to a central processor via remote communication link.

Many problems had to be overcome to provide an electrically isolated state estimator module that can be hot stick mounted to energized conductors including the highest used in electrical transmission.

Among these were: The design of a positive acting mechanism for hinging the two parts of the module and securely clamping and unclamping them about a live conductor while they were supported by a hot stick. Measurement of the voltage of the conductor in a self-contained electrically isolated module. The desire to make many electrical measurements with a necessarily small and light module and common utilization of a single radio channel by the up to 15 modules which might be required at a single substation.

Such hot stick activated hinge and clamp mechanisms do not exist in the prior art. The voltage transformers and capacitive dividers of the prior art are not electrically isolated. Separate measurements of all electrical quantities desired would require too much apparatus in the module. Synchronization of module transmissions would require a radio receiver in each module.

DISCLOSURE OF THE INVENTION

Referring to FIG. 1, toroidal shaped sensor and transmitter modules 20 are mounted on live power conductors 22 by use of a special, detachable hot-stick tool 108 (see FIG. 2) which opens and closes a positively actuated hinging and clamping mechanism. Each module contains means for sensing one or more of a plurality of parameters associated with the power conductor 22 and its surrounding environment. These parameters include the temperature of the power conductor 22, the ambient air temperature near the conductor, the current flowing in the conductor, and the conductor's voltage, frequency, power factor and harmonic currents. Other parameters such as wind velocity and direction and solar thermal load could be sensed, if desired. In addition, each module 20 contains means for transmitting the sensed information to a local receiver 24.

Referring to FIG. 3, each toroidal module 20 is configured with an open, spoked area 26 surrounding the mounting hub 28 to permit free air circulation around the conductor 22 so that the conductor temperature is not disturbed. The power required to operate the module is collected from the power conductor by coupling its magnetic field to a transformer core encircling the line within the toroid. The signals produced by the various sensors are converted to their digital equivalents by the unit electronics and are transmitted to the ground receiver in periodic bursts of transmission, thus minimizing the average power required.

One or more of these toroidal sensor units, or modules, may be mounted to transmission lines within the capture range of the receiver and operated simultaneously on the same frequency channel. By slightly varying the intervals between transmissions on each module, keeping them integral numbers without a common factor and limiting the maximum number of modules in relation to these intervals, the statistical probability of interference between transmissions is controlled to an acceptable degree. Thus, one receiver, ground station 24, can collect data from a plurality of modules 20.

The ground station 24, containing a receiver and its antenna 30, which processes the data received, stores the data until time to send or deliver it to another location, and provides the communication port indicated at 32 linking the system to such location. The processing of the data at the ground station 24 includes provisions for scaling factors, offsets, curve correction, waveform analysis and correlative and computational conversion of the data to the forms and parameters desired for transmission to the host location. The ground station processor is programmed to contain the specific calibration corrections required for each sensor in each module in its own system.

Referring to FIG. 5, the ground stations 24 are connected to the Power Control Center 54 by appropriate data transmission links 32 (radio, land lines or satellite channels) where the measured data is processed by a Dynamic State Estimator which then issues appropriate control signals over other transmission links 33 to the switchgear 58 at electrical substations 44. Thus the power supply to transmission lines may be varied in accordance with their measured temperatures and measured electrical parameters. Similarly, when sensors are located in both the primary and secondary circuits of power transformers, transformer faults may be detected and the power supplied to the transformer controlled by the Dynamic State Estimator through switchgear.

In one aspect of the invention a Dynamic State Estimator may be located at one or more substations to control the supply of electrical power to the transformers located there or to perform other local control functions.

Thus, as shown in FIG. 4, an electrical substation 34 may be totally monitored by the electrically isolated modules 20 of the invention. Up to 15 of these modules may be connected as shown transmitting to a single receiver 24. The receiver may have associated therewith local control apparatus 36 for controlling the illustrative transformer bank 38 and the electrical switchgear indicated by the small squares 40. The modules 20 may be mounted to live conductors without the expense and inconvenience of disconnecting any circuits and require no wiring at the substation 34. The receiver 24 also transmits via its transmission link 32 the information received, from the modules 20 (for determining the total state of the electrical substation) to the Central Control Station 54 of the electrical delivery system.

The system of the invention is adapted for total monitoring and control of a bulk electrical power delivery system as illustrated in FIG. 5. Here, modules 20 are located throughout the delivery system monitoring transformer banks 40 and 42, substations 44 and 46, transmission lines generally indicated at 48 and 50, and feeder sections generally indicated at 52.

A number of modules are preferably located along transmission lines such as lines 48 and 50, one per phase at each monitoring position. By monitoring the temperature of the conductors they indicate the instantaneous dynamic capacity of the transmission line. Since they are located at intervals along the transmission line they can be utilized to determine the nature and location of faults and thus facilitate more rapid and effective repair.

The ground stations 24 collect the data from their local modules 20 and transmit it to the Power Control Center 54 on transmission links 33. The Power Control Center, in turn, controls automatic switching devices 56, 58 and 60 to control the system.

As illustrated in FIG. 5, ground station 24 located at transformer bank 42 may be utilized to control the power supplied to transformer bank 42 via a motorized tap system generally indicated at 62.

As shown in FIG. 6, the module 20 according to the invention comprises two halves of a magnetic core 64 and 66, and a power takeoff coil 68, and two spring loaded temperature probes 70 and 72 which contact the conductor and an ambient temperature probe 74.

In order to insure that the case 76 is precisely at the potential of the conductor 22 when the conductors are contacted by the probes 70 and 72, a spring 78 is provided, which engages the conductor 22 and remains engaged with the conductor and connects it to the case 76 before and during contact of the probes 70 and 72 with the conductor. Alternatively, or simultaneously, contact may be maintained through conductive inputs in the hub 28.

The electrical current in the conductor is measured by a Rogowski coil 80 shown in FIG. 7.

The voltage of the conductor is measured by a pair of arcuate capacitor plates 82 in the cover portions of the donut, only one of which is shown in FIGS. 8 and 9. The electronics is contained in sealed boxes 84 within the donut 20 as shown in FIG. 10.

Block diagrams of the electronics of the donut 20 are shown in FIGS. 28 and 30.

Referring to FIG. 30, the voltage sensing plates 82 are connected to one of a plurality of input amplifiers generally indicated at 86. The input amplifier 86 connected to the voltage sensing plates 82 measures the current between them and local ground indicated at 88, which is the electrical potential of the conductor 22 on which the donut 20 is mounted. Thus the amplifier 86 provides a measure of the current flowing between the plates 82 and the earth through a capacitance $C_1$ (see FIGS. 32 and 33). That is, it measures the current collected by the plates 86 which would otherwise flow to local ground. This is a direct measure of the voltage of the conductor with respect to earth.

As also shown in FIG. 30, the temperature transducers 70, 72, and 74, and Rogowski coil 80 are each connected to one of the input amplifiers 86. An additional temperature transducer may be connected to one of the spare amplifiers 86 to measure the temperature of the electronics in the donut. The outputs of the amplifiers are multiplexed by multiplexer 90 and supplied to a digital-to-analog converter and computer generally indicated at 92, coded by encoder 94, and transmitted by transmitter 96 via antenna 98, which may be a patch antenna on the surface of the donut as illustrated in FIG. 3.

As illustrated in the timing diagram of FIG. 34, the current and voltage are sampled by the computer 92 nine times at one-ninth intervals of the current wave form; each measurement being taken in a successive cycle. The computer initially goes through nine cycles to adjust the one-ninth interval timing period to match the exact frequency of the current at that time, and then makes the nine measurements. These measurements are transmitted to the ground station 24 and another computer 334 at the ground station (FIG. 62) calculates the current, voltage, power, reactive power, power factor, and harmonics as desired; provides these to a communications board 106; and thus to a communications link 32.

For a maximum of fifteen donuts for which it is desired to transmit information each second or two, the relative transmission intervals can be chosen to be between 37/60ths and 79/60ths of a second; each transmission interval being an integral number of 60ths of a second which do not have a common factor. This form of semi-random transmission according to the invention will insure 76% successful transmission with less than two seconds between successful transmissions from the same donut in the worst case.

The hot stick mounting tool of the invention generally indicated at 108 in FIG. 3 is shown in detail in FIGS. 25, 26, and 27. It comprises a Allen wrench portion 110 and a threaded portion 112, mounted to a universal generally indicated at 114. Universal 114 is mounted within a shell 116 which in turn is mounted to a conventional hot stick mounting coupling generally indicated at 118; and thus the hot stick 176.

When the hot stick tool 108, as shown in FIG. 3, is inserted into the opening 122 in the donut 20, the Allen wrench portion engages barrel 124 (FIG. 24) which is oppositely threaded on each of its ends 126 and 128. Threaded portion 126 is engaged with a mating threaded portion of a cable clamp 130 and threaded portion 128 engages a mating threaded portion 144 of a nut 132. The nut 132 is fixed by means of bosses 134 in plates 136 and 138, mounted to hinge pins 140 and 142 (FIG. 23). Thus, when the hot stick tool 108 is inserted, and barrel 124 rotated in one direction, cable clamp 130 is brought towards nut 132, while when barrel 124 is rotated in the other direction, cable clamp 130 moves away from nut 132. Threaded portion 144 of nut 132 engages the threaded portion 112 of the hot stick tool 108, such that when cable clamp 130 and nut 132 are spread apart the threaded portion 112 of the hot stick tool is threaded into nut 132 so that the donut module 20 may be supported on the tool 108.

Since hinge pins 140 and 142 are located near the outer edge of the donut 20 and fixed pins 146 and 148 are affixed to the donut more inwardly, if the pins 146 and 148 are spread apart, the donut will open to the position shown in FIG. 6 and if the pins 146 and 148 are brought together, the donut will close. The pins 142 and 146 and 140 and 148 are joined by respective ramp arms 150 and 152. When cable clamp 130 is separated from nut 132, the ramp arms, and thus pins 146 and 148, are spread apart by the wedge portions 154 and 156 of cable clamp 130. At the same time the threaded portion 112 of the hot stick tool 108 engages the threaded portion 144 of nut 132 so that the donut 20 is securely mounted to the tool 108. A cable 158 passes around pins 146 and 148 and is held in cable clamp 130 by cable terminating caps 160 and 162. Thus when cable clamp 130 and nut 132 are brought together, the cable 158 pulls fixed pins 146 and 148 together to securely close the donut 20 and clamp it about the conductor 22. Shortly after it is drawn tight, the threaded portion of the hot stick tool 108 disengages the threaded portion 144 of nut 132 by continued turning in the same direction.

If for any reason the donut 20 cannot be removed from a donductor 22 by using the hot stick tool 108, another hot stick tool generally indicated at 164 in FIG. 20 may be used to cut the cable 158. Tool 164 has a file 166 mounted thereon for this purpose. It may also be provided with a threaded portion 168 to engage the threaded portion 144 of nut 132 after the cable 158 has been secured.

OBJECTS OF THE INVENTION

It is therefore an object of the invention to provide a system and apparatus for monitoring and control of an electric power delivery system.

Another object of the invention is to provide such a system predominantly employing radio transmitting modules mounted to power conductors.

A further object of the invention is to provide such a system greatly reducing, if not eliminating, the use of wiring to transmit measurements at an electrical substation.

Still another object of the invention is to provide such a system for determining the state of a substation dynamically.

Yet still another object of the invention is to provide such a system for determining the state of an electrical power delivery system dynamically.

Yet still another object of the invention is to provide such a system for determining dynamic thermal line ratings.

A further object of the invention is to provide such a system for monitoring and controlling the status of electrical power station equipment.

Another object of the invention is to provide such a system wherein the sensors are capable of measuring, as desired, current, voltage, frequency, phase angle, the fourier components of current and voltage from which other quantities may be calculated, the temperature of the conductor to which they are attached, or the temperature of the ambient air surrounding the conductor to which they are attached.

Another object of the invention is to provide a state estimator module to sense various power quantities including those necessary for dynamic line ratings that can be rapidly, safely and reliably installed and removed from an energized high voltage transmission facility, up to 344 KV line to line.

A further object of the invention is to provide a state estimator module that can be installed and removed with standard utility "hot stick" tools with an adaptor tailored for the module and for operation by a single lineman or robot.

Still another object of the invention is to provide a "hot stick" mountable unit that is light weight, compact in size, can be remotely calibrated, is toroidal in shape with a metallic housing consisting of a central hub suitable for various conductor sizes with the "hot stick" tool capable of opening and closing the toroidal housing around the conductor; the hub being provided with ventilating apertures and thermally insulated inserts which grip the transmission line.

A still further object of the invention is to provide a module of the above character that is brought to conductor potential before delicate electric equipment contacts the conductor.

Yet another object of the invention is to provide a state estimator module that maintains positive engagement with a hot stick mountable tool except when it is "snap shut" around the conductor.

Yet still another object of the invention is to provide a hinge clamp for a module of the above character.

A yet still further object of the invention is to provide a hinge clamp of the above character that may be opened by an alternative hot stick mounted tool in case of failure of the hinge clamp.

Another object of the invention is to provide an electrically isolated voltage sensor for a state estimator module of the above character.

Still another object of the invention is to provide an unsynchronized single channel radio transmission system for a plurality of modules of the above character.

Other objects of the invention will in part be obvious and will in part appear hereinafter. The invention accordingly comprises the functions and relationship thereof and the features of construction, organization and arrangement of parts, which will be exemplified in the system and apparatus hereinafter set forth. The scope of the invention is indicated in the claims.

BRIEF DESCRIPTION OF THE DRAWINGS

For a fuller understanding of the nature and objects of the invention reference should be had to the following detailed description taken in connection with the accompanying drawings, in which:

FIG. 38 is a diagram of the message transmitted by the donuts 20;

FIGS. 65, 66, 67, and 68 are diagrams of tables and buffers utilized in the program of FIG. 64.

The same reference characters refer to the same elements throughout the several views of the drawings.

BEST MODE FOR CARRYING OUT THE INVENTION

The State Estimator Module

General

Figure 1:
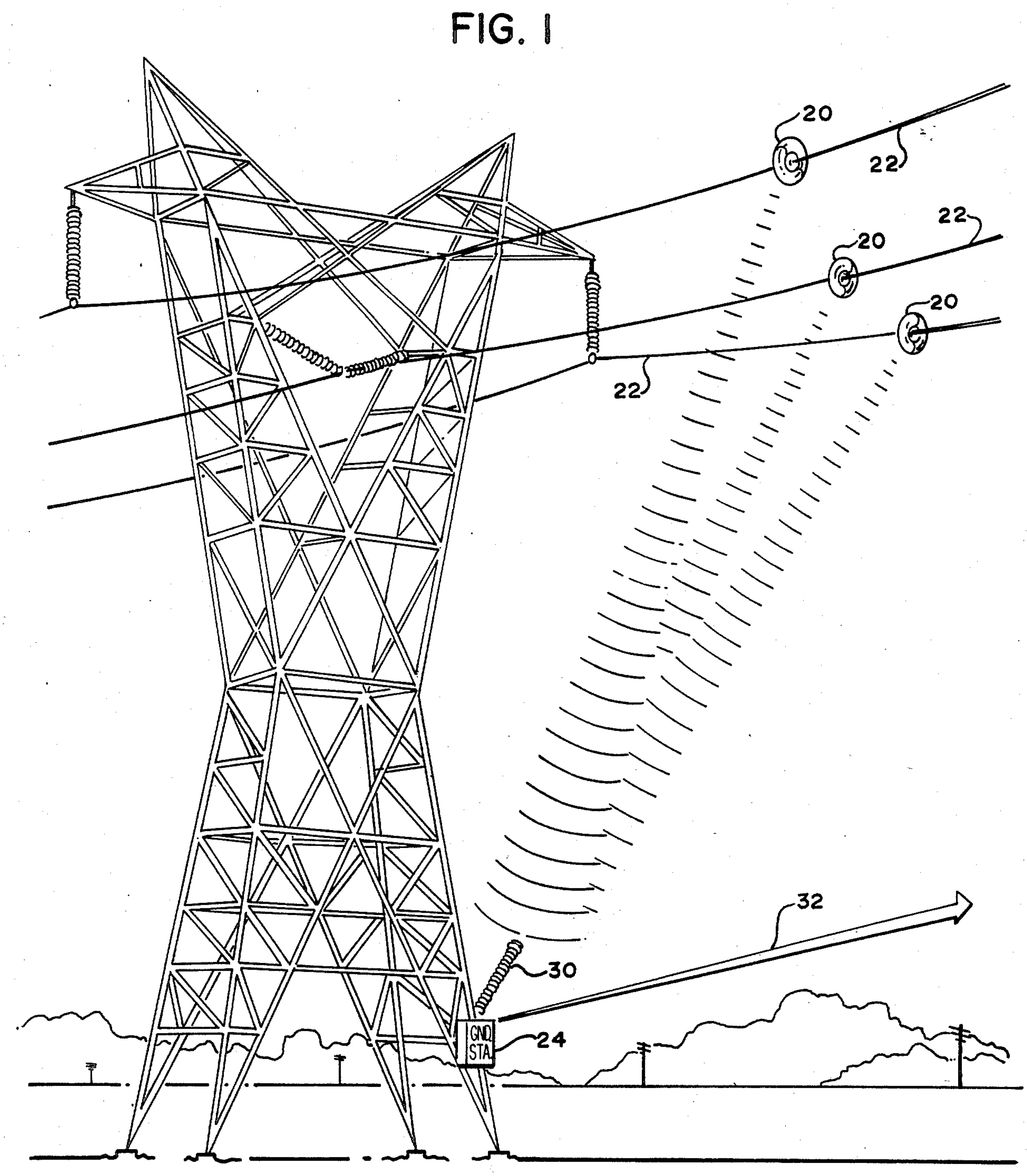
FIG. 1 is a perspective view of the state estimator module of the invention installed on an electrical transmission line.
Figure 2:
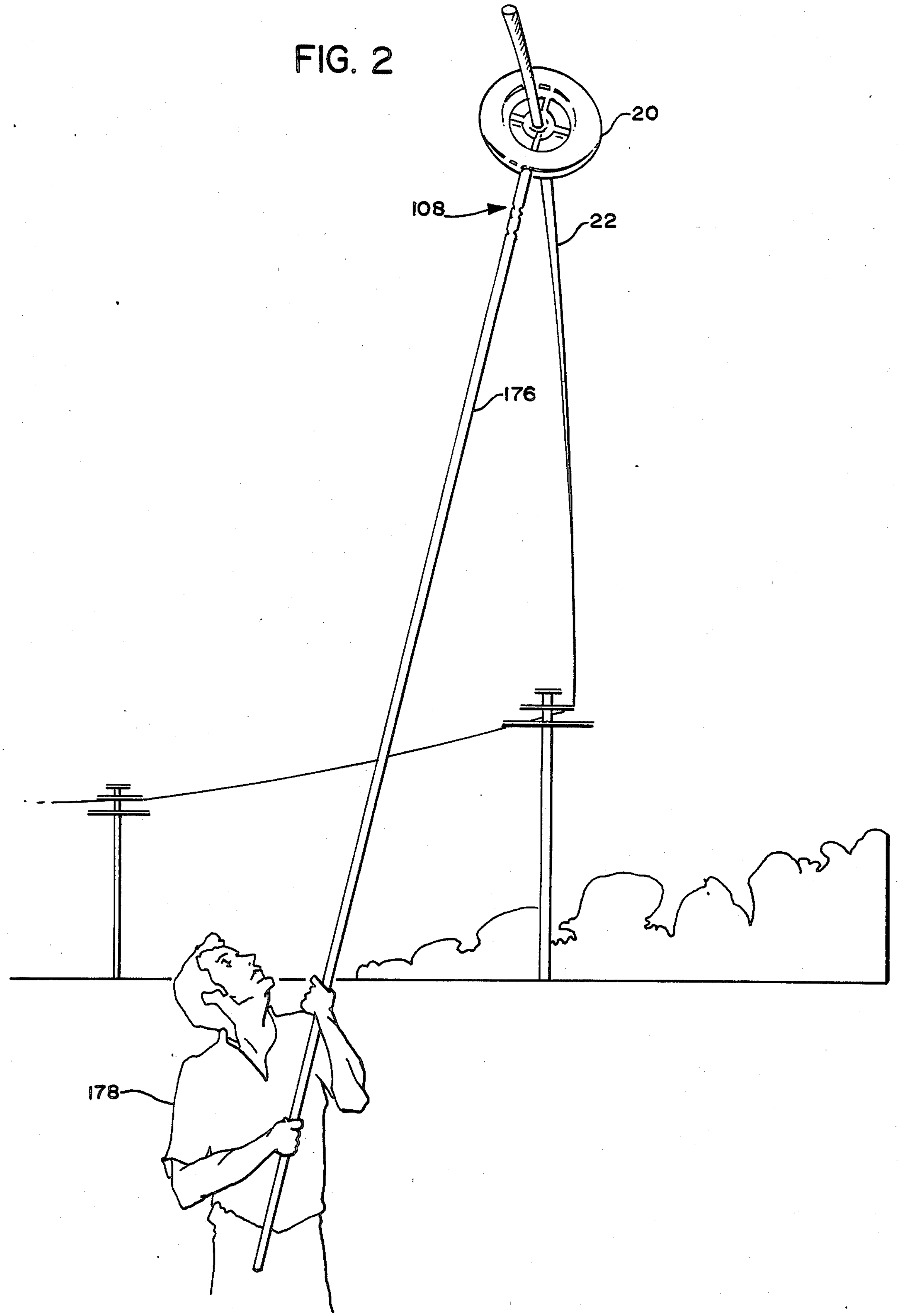
FIG. 2 is a perspective view showing how a state estimator module according to the invention may be hot stick mounted to a live conductor.

The state estimator modules 20 ("Donuts") clamp to a high-tension power conductor 22 and telemeter power parameters to a ground station 24 (FIG. 1). Each module obtains its operating power from the magnetic field generated by the current flowing in the high-tension conductor 22. Each module is relatively small and shaped like a donut, with a $12\frac{5}{8}''$ major diameter and a maximum thickness of $4\frac{3}{4}''$. It weighs approximately 16 pounds and may be mounted in the field in a matter of minutes using a "hot stick" (FIG. 2).

Typically, three donuts 20 are used on a circuit; one for each phase. Each donut is equipped to measure line current, line to neutral voltage, frequency, phase angle, conductor temperature and ambient temperature. Digital data is transmitted by means of a 950 MHz FM radio link in a 5–10 millisecond burst. A microcomputer at the ground station 24 processes data from the 3 phase set and calculates any desired power parameter such as total circuit kilowatts, kilovars, and volt-amps. Individual conductor current and voltage is also available. This data may then be passed on to a central monitoring host computer (typically once a second) over a data link 32.

Figure 4:
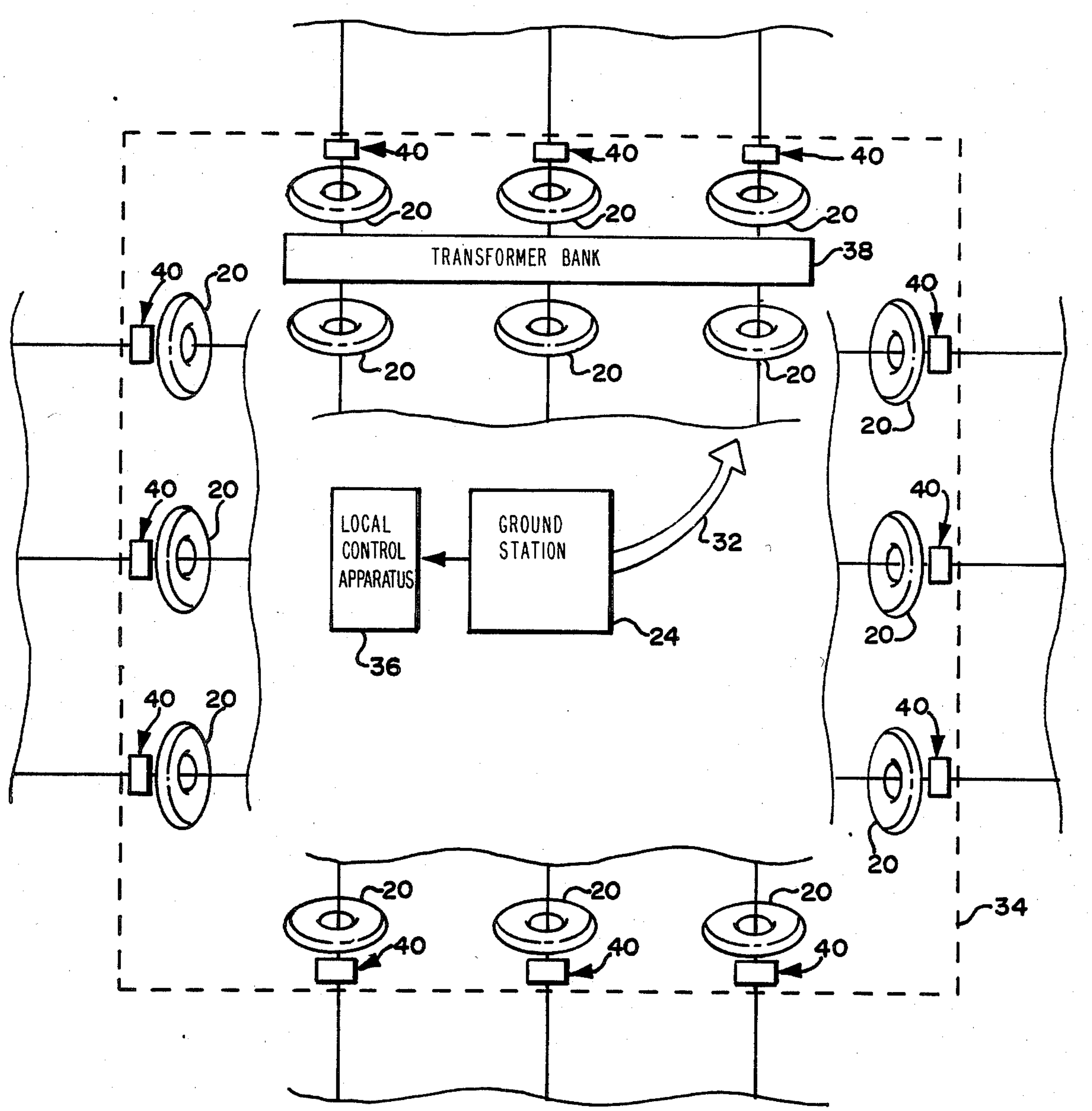
FIG. 4 is a diagrammatic view of a substation totally monitored by means of the system of the invention.

One ground station 24 may receive data from as many as 15 donuts 20, all on the same RF frequency (FIG. 4). Each donut transmits with a different interval between its successive transmission bursts, ranging from approximately 0.3 seconds to 0.7 seconds. Thus, there will be occasional collisions, but on the average, greater than 70% of all transmissions will get through.

Environmental operating conditions include an ambient air temperature range of −40° F. to +100° F.; driving rain, sleet, snow, and ice buildup; falling ice from conductor overhead; sun loading; and vibrations of conductors 22.

Current measurements over a range of 80–3000 amperes must be accurate to within 0.5%. Voltage measurements over a range of 2.4–345 KV (line-line) must be accurate to within 0.5%. Conductor diameters range from 0.5 to 2 inches.

Figure 13:
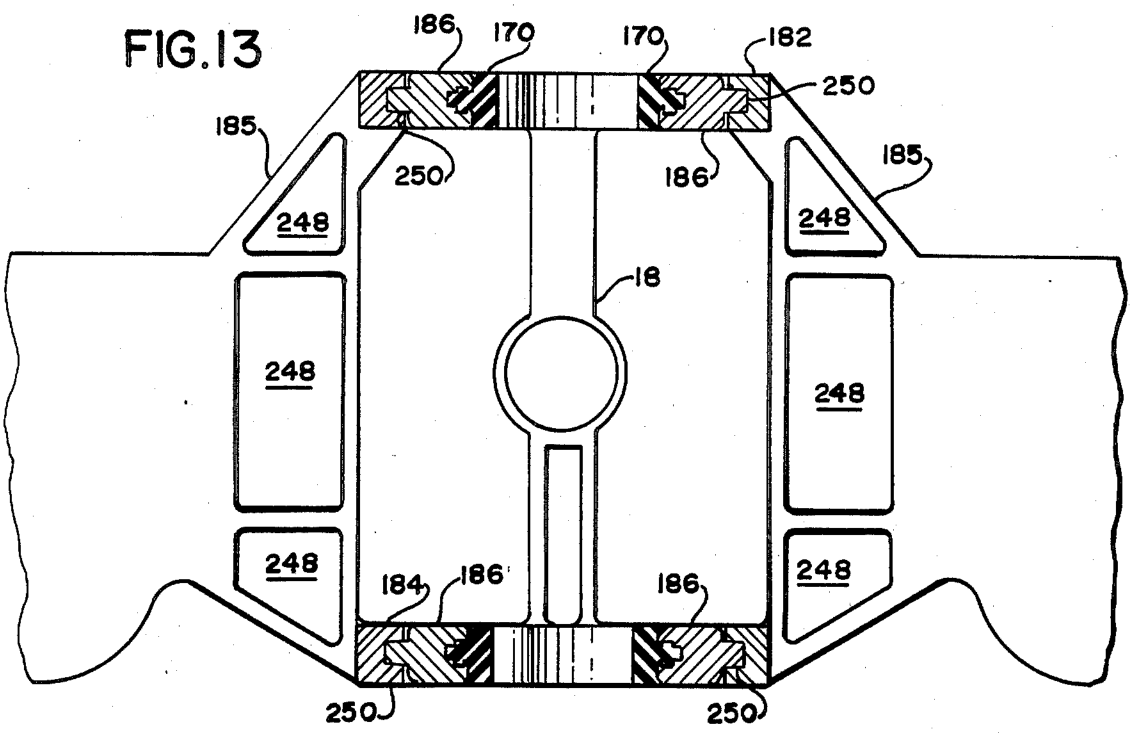
FIG. 13 is a cross sectional view taken along the line 13—13 of FIG. 12.

All exterior surfaces are rounded and free from sharp edges so as to prevent corona. The module weighs approximately 16 pounds. It is provided with clamping inserts for different conductor diameters which are easily removeable and replaceable. The conductor clamping does not damage the conductor, even after prolonged conductor vibration due to the use of neoprene conductor facings 170 in the inserts 186 (FIG. 13).

The special hot stick tool 108 is inserted into the donut 20. Turning of the hot stick causes the donut to split so that it may be placed over a conductor. Turning the hot stick in the opposite direction causes the donut to close over a conductor and clamp onto it tightly. The tool 108 may then be removed by simply pulling it away. Reinsertion and turning will open the donut and allow it to be removed from the line.

Conductor temperature probes 70 and 72 (FIG. 6) are spring loaded against the conductor when the donut is installed. The contacting tip 174 (FIG. 10) is beryllia and inhibits corrosion and yet conducts heat efficiently to the temperature transducer within. It is also a nonconductor of electricity so as not to create a low resistance path from the conductor to the electronics.

The hub and spoke area in the center of the donut 20 and the temperature probe placement are designed with as much free space as possible so as not to effect the temperature of the conductor.

Figure 10:
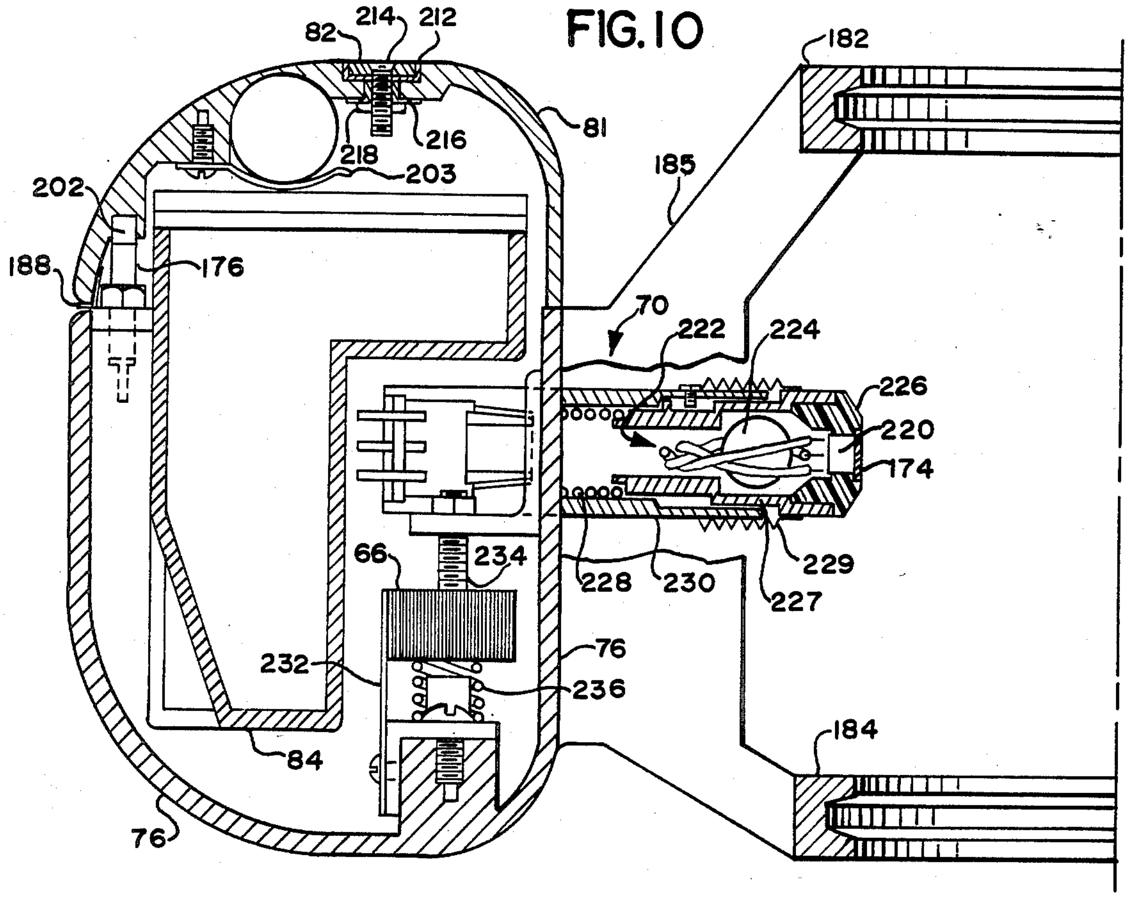
FIG. 10 is an enlarged cross sectional view taken along the line 10—10 of FIG. 6 with the cover in place.

All electronics within the donut are sealed in watertight compartments 84 (FIG. 10).

The radio frequency transmitter power of the donut 20 is typically 100 milliwatts. However, it may be as high as 4 watts. The donut 20 is protected against lightning surges by MOV devices and proper grounding and shielding practice. All analog and digital circuitry to CMOS to minimize power consumption.

No potentiometers or other variable devices are used for calibration in donut 20. All calibration is done by the ground station 24 by scaling factors recorded in computer memory.

Each donut is jumper programmable for current ranges of 80–3000 amperes or 80–1500 amperes.

Figure 7:
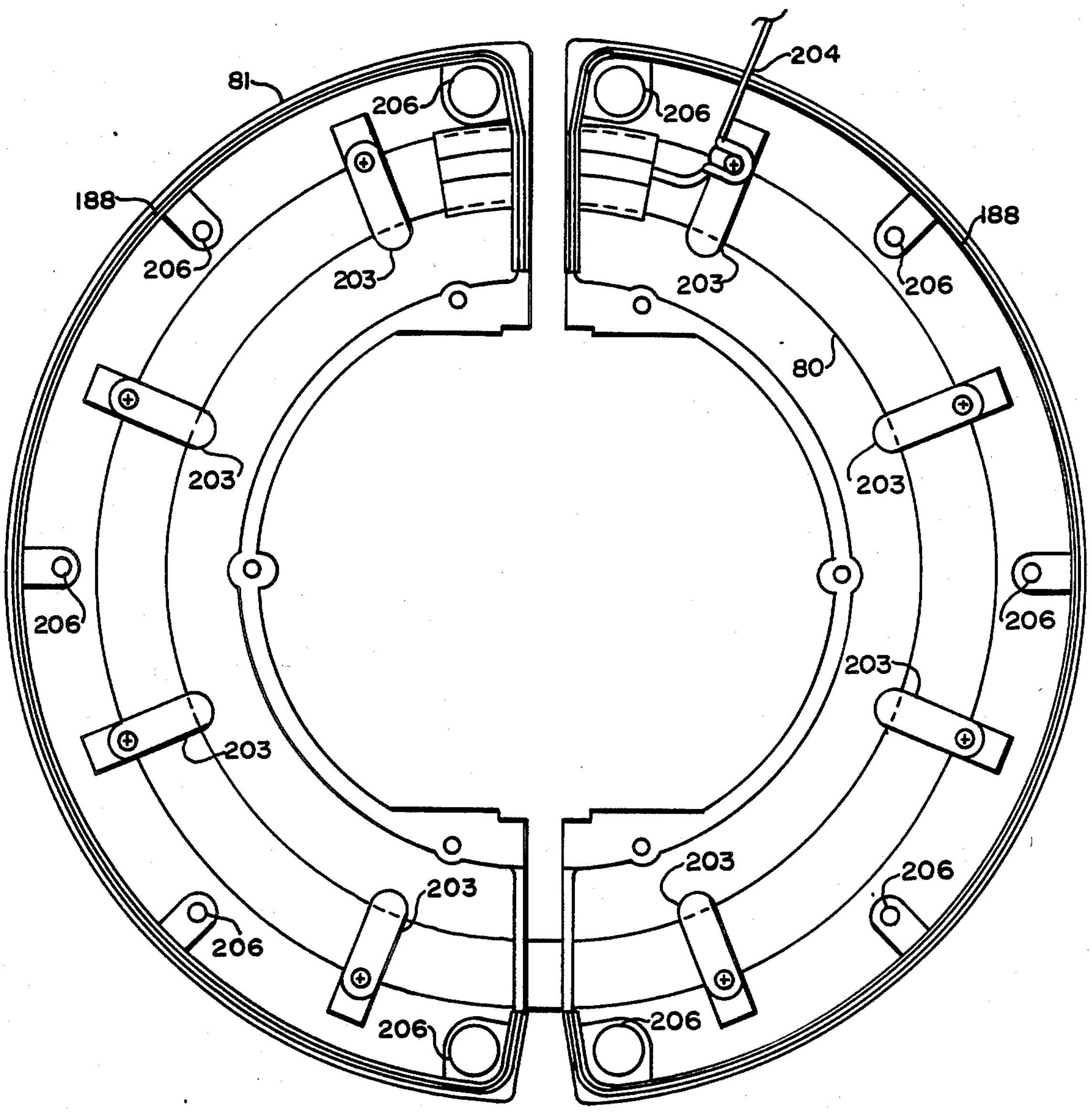
FIG. 7 is a bottom view of the covers of a state estimator module according to the invention.

Current is measured by using a Rogowski coil 80 (FIG. 7). Voltage is measured by two electrically insulated strips of metal 82 (FIG. 8) imbedded flush on the exterior of one face of the donut. These strips act as one plate of a capacitor at the potential of the conductor. The other plate is the rest of the universe and is essentially at calibrated ground (neutral) potential with respect to the donut. The amount of current collected by the donut plate from ground is thus proportional to the potential of the donut and the conductor on which it is mounted.

Power to operate donut electronics is derived from a winding 68 on a laminated iron core 64–66 which surrounds the line conductor. This core is split to accommodate the opening of the donut when it clamps around the conductor. The top and bottom portions of the aluminum outer casing of the donut are partially insulated from each other so as not to form a short circuited turn. The insulation is shunted at high frequency by capacitors 176 (FIG. 10) to insure that the top and bottom portions 76 and 81 are at the same radio frequency potential.

The data is transmitted in Manchester code. Each message comprises the latest measured Fourier components of voltage and current and another measured condition called the auxiliary parameter, as well as an auxiliary parameter number to identify each of the five possible auxiliary parameters. Thus, each message format is as follows:

| | |
|---|---|
| Donut Identification Number | 4 bits |
| Auxiliary Parameter Number | 4 bits |
| Voltage Sine Component (Fourier Fundamental) | 12 bits |
| Voltage Cosine Component (Fourier Fundamental) | 12 bits |
| Current Sine Component (Fourier Fundamental) | 12 bits |
| Current Cosine Component (Fourier Fundamental) | 12 bits |
| Auxiliary Parameter | 12 bits |
| Cyclic Redundancy Check | 12 bits |

The auxiliary parameter rotates among 5 items on each successive transmission as follows:

| Auxiliary Parameter No. | Parameter |
|---|---|
| 0 | Conductor Temperature |
| 1 | Ambient Exterior Temperature |
| 2 | Check Ground (0 volts nominal) |
| 3 | Check Voltage (1.25 volts nominal) |
| 4 | Interior Temperature |

More specifically, and referring to FIG. 2, the hot stick tool 108 may be mounted on a conventional hot stick 176 so that the module 20 may be mounted on an energized conductor 22 by a man 178.

Figure 3:
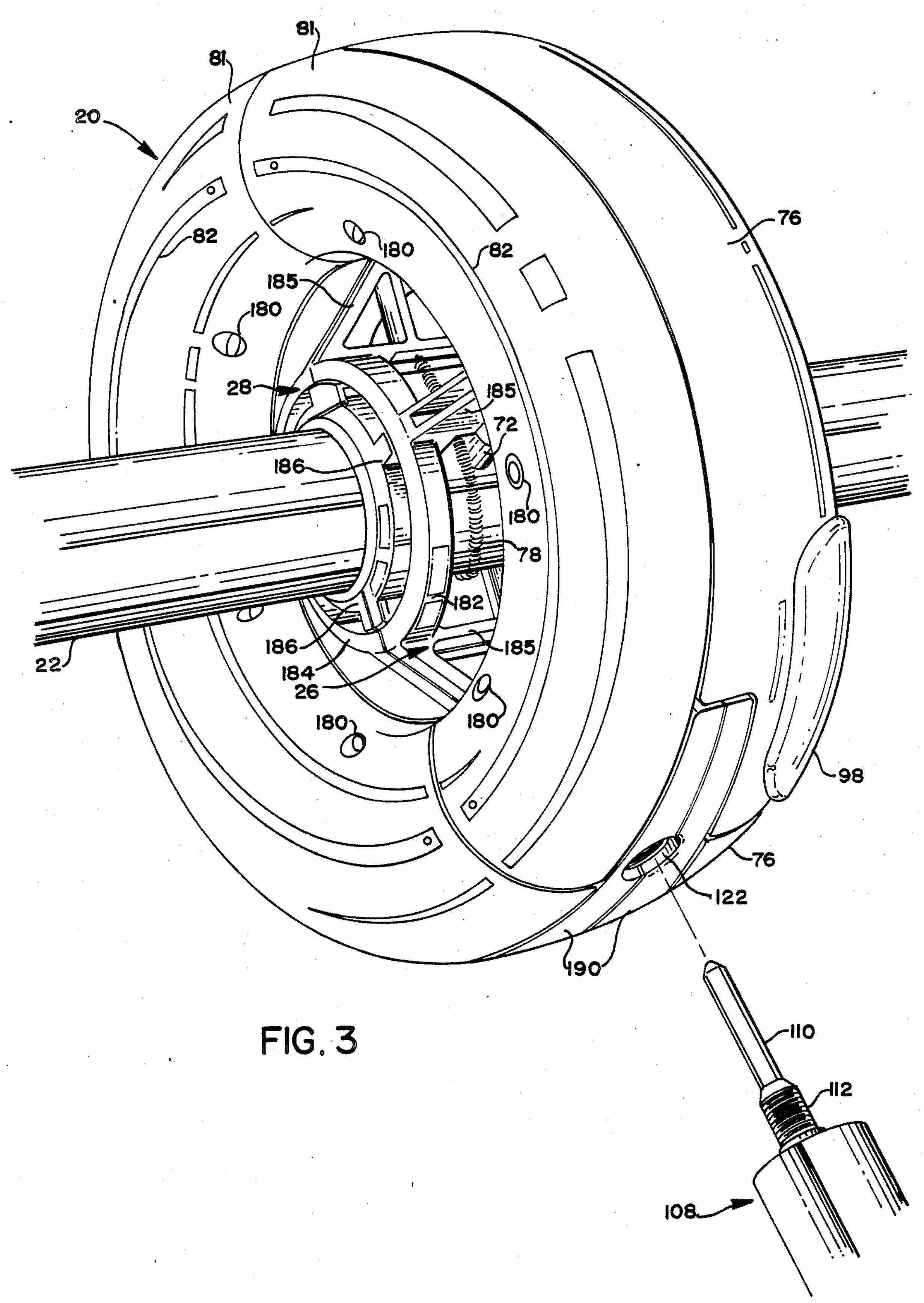
FIG. 3 is a perspective view of a state estimator module according to the invention mounted to a conductor.

In FIG. 3 it can be seen how the hot stick tool 108 provided with an Allen wrench portion 110 and a threaded portion 112 fits within a hole 122 provided in the donut 20 mounted on conductor 22. The donut comprises two bottom portions 76 and two covers, or top portions 81, held together by six bolts 180. Each bottom portion 76 is provided with a top hub 182 and a bottom hub 184 (see also FIG. 13), supported on three relatively open spokes 185.

Conductor temperature probes 70 and 72 (see also FIG. 6) are aligned within opposed spokes 185.

Identical clamping inserts 186 are held within opposed hubs 182 and 184 (see FIG. 13) and clamp conductor 22 with hard rubber facings 170 provided therein. The tops 81 (FIG. 3) are each provided with an arcuate flat flush conductor 82 insulated from the housing for measuring voltage and one of the bottom portions 76 is provided with a patch antenna 98 for transmitting data to the ground station.

Although the top portions 81 are each provided with a non-conductive rubber seal 188 (FIG. 7) and the area around the hinge is closed by cover plates 190, water escape vents are provided in and around the access opening 122, which due to the hot stick mounting is always at the lower portion of the donut 20 when installed on a conductor 22.

Figure 6:
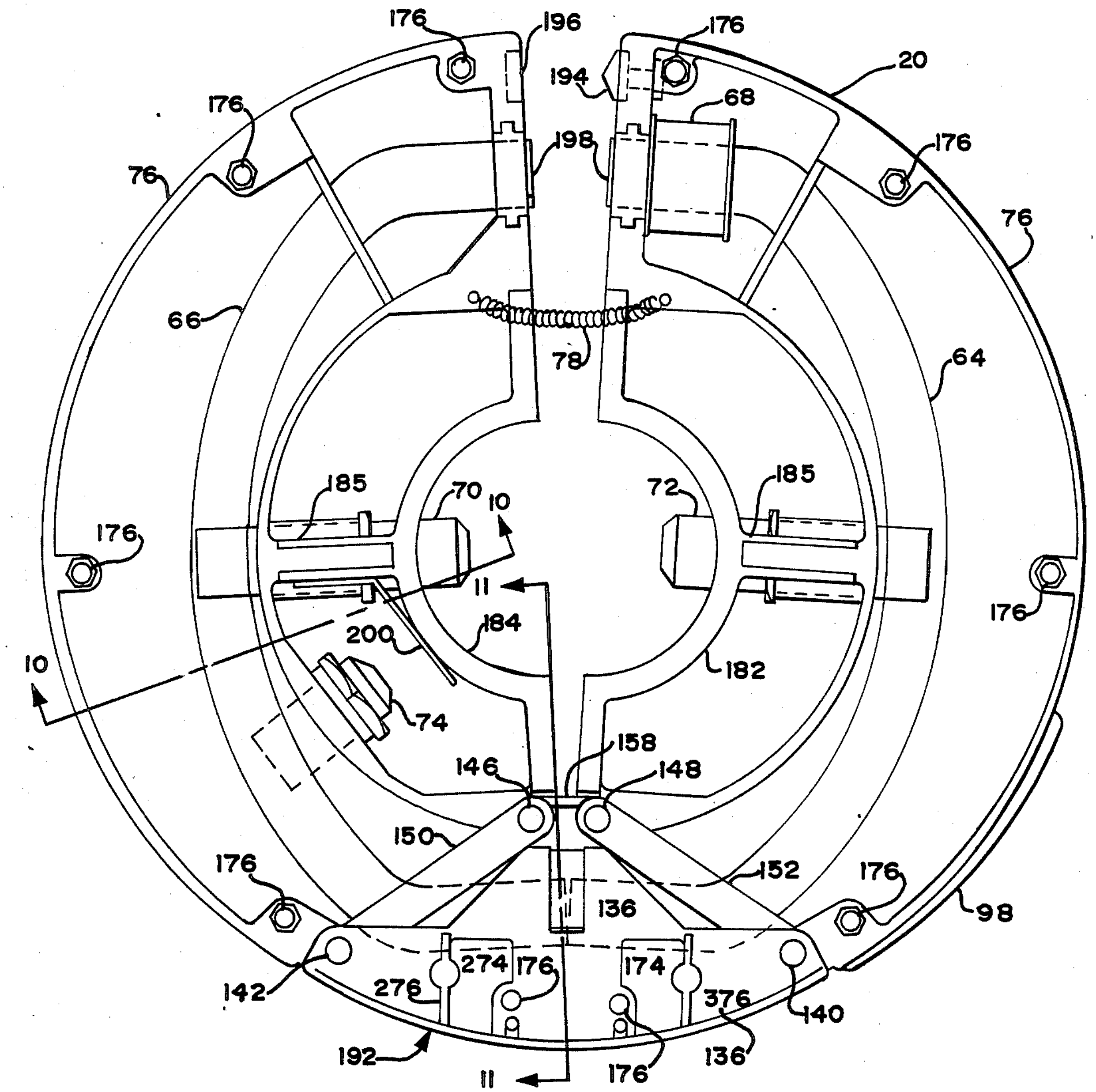
FIG. 6 is a top view of a state estimator according to the invention with the covers thereof removed.

Now referring to FIG. 6, a hinge mechanism is provided, generally indicated at 192. It comprises hinge pins 140 and 142, mounted in a top plate 136 and a bottom plate 138 (see FIG. 23). When opening or closing, the bottom portions 76 along with their covers 81 rotate about pins 140 and 142. The two halves of the donut 76—76 are drawn together to clamp the conductor by bringing fixed pins 146 and 148 together by means of cable 158. They are separated by pushing a wedge against wedge arms 150 and 152 to separate pins 146 and 148 which are affixed to the bottom portion 76—76.

To make certain that the bottom portions 76—76 of the donut 20 are at the potential of the conductor, a spring 78 is provided which continuously contacts the conductor during use and contacts it before it comes in contact with the temperature probes 70 and 72, protecting them against arcing.

To insure that the unit comes together precisely, a locating pin 194 and locating opening 196 are provided. The multi-layer power transformer cores 64 and 66 come together with their faces in abutting relationship when the unit is closed. They are spring loaded against each other and mounted for slight relative rotations so that the flat faces, such as the upper faces 198 shown in FIG. 6 will fit together with a minimum air gap when the unit is closed. The temperature probes 70 and 72 are spring loaded so that they press against the conductor when the unit is closed. The ambient probe 74 is provided with a shield 200 covering the hub area so that it looks at the temperature of the shield 200 rather than the temperature of the conductor.

The temperature probes 70 and 72 are located in alignment with opposed spokes 185 so as to provide the least amount of wind resistance so that the conductor at the probes 70 and 72 will be cooled by the ambient air in substantially the same way as the conductor a distance away from the module 20.

The ten radio frequency shunting capacitors 176 can also be seen in FIG. 6, as well as the patch antenna 98.

Now referring to FIG. 7, a Rogowski coil 80 is affixed to the covers 81 by eight brackets 202 and is connected by lead 203 to the electronics in the bottom portions 76 (FIG. 10). The non-conductive rubber seal 188 may be seen in FIG. 7, as well as recesses 206 for stainless steel fiber contacting pads 202 which contact the RF shunting capacitors 176 (FIG. 10).

Figure 9:
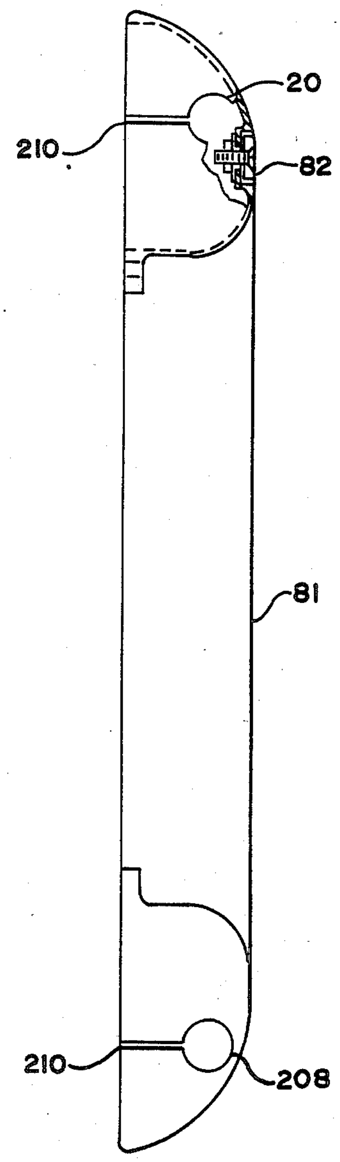
FIG. 9 is a side view of one of the covers, partly in cross section.
Figure 8:
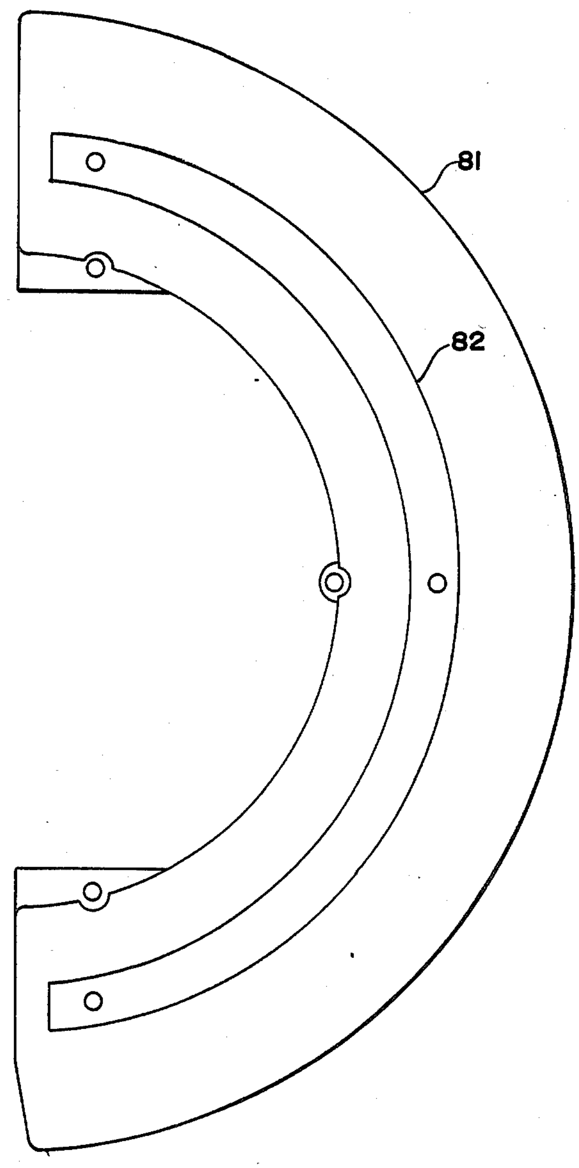
FIG. 8 is a top view of one of the covers.

Now referring to FIGS. 8 and 9, the capacitor plate 82 can be seen mounted flush with the surface of one of the covers 81. It may also be seen in FIG. 9 how the openings 206–208 for the Rogowski coil are provided with slots 210 to prevent the formation of a short circuiting path around it.

Now referring to FIG. 10, the arcuate capacitor plates 82 are insulated from the case 81 by teflon or other non-conducting material 212. The surface gap between the capacitor plate 82 and the surface of the case 81 is 0.005 inches. The plates 82 are mounted to the tops 81 by means of screws 214 passing through insulated bushings 216 and nuts 218, or by other comparable insulated mounting means. Connection between the capacitor plates 82 and the electronics may be made by means of the screws 214. A stainless steel wool pad 202 may be seen in FIG. 10 connecting to the shunt capacitor 176 which may be in the form of a feed through capacitor. The insulating seal 188 is shown next to the shunt capacitor 176.

The temperature probe 70 comprises an Analog Device AD-590 sensor 220 mounted against a beryllia insert 174 which contacts the conductor 22. The three conductors generally indicated at 222 connect the electronics to the sensor 220 through an MOV 224.

The sensor 220 and beryllia insert 174 are mounted in a probe head 226 which in turn is mounted to a generally cylindrical carriage 227 pushed out by spring 228 to force the beryllia insert 174 against the conductor. A rubber boot 229 protects the interior of the probe 70. The probe head 226 is formed of an electrical and heat insulating material. The probe 72 is mounted in a cylindrical post 230 which preferably is adjustable in and out of the lower casing 76 for adjustment to engage conductors of differing diameters. The other conductor temperature probe 72 is identical.

An electronics box 84 is mounted within each of the two bottom portions 76 and top portion 81. The boxes 84 are hermetically sealed. The power pickup transformer core 66 and its mating transformer core 64 (FIG. 6) in the other half of the module is pressed by leaf spring 232 against the mating core 64 and is pushed against post 234 by means of spring 236 so that the flat faces 198 of the two cores 64 and 66, shown in FIG. 6, will come together in a flat face to face alignment when the module is closed.

Figure 11:
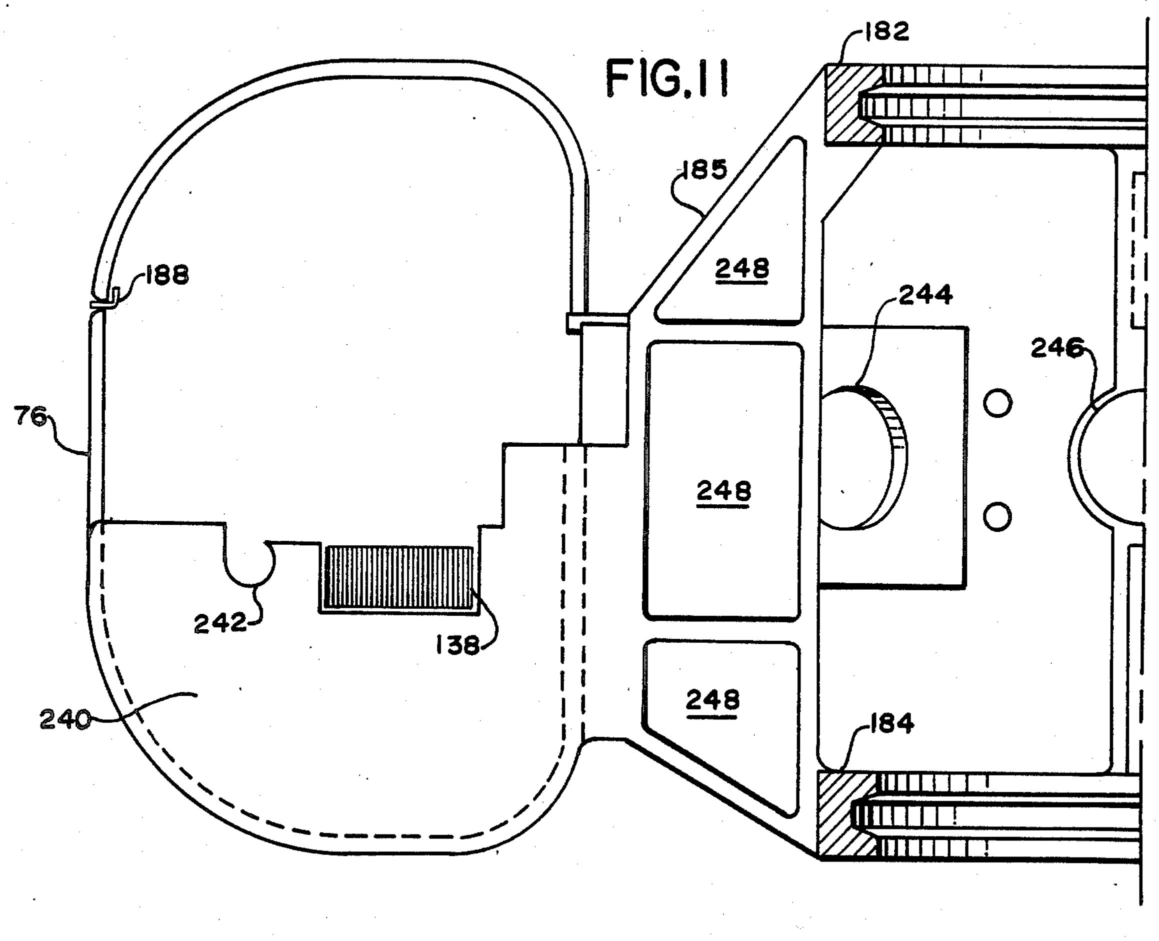
FIG. 11 is an enlarged cross sectional view taken along the line 11—11 of FIG. 6 with the cover in place.

Referring now to FIG. 11, it can be seen how the end face 238 of the core 66 passes through the end plate 240 of lower portion 76. Opening 242 is provided for electrical wiring connecting the sealed circuit containers 84 in both halves of the device. It should be noted how opening 242 is open, again to prevent encircling the wiring.

The opening 244 for the ambient sensor 74 and the opening 246 for the conductor sensor 70 may be seen in FIG. 11. The hubs 182 and 184 and spokes 185 may be seen in FIGS. 10 and 11 although the openings 248 in the spoke 185 of FIG. 10 are not shown in order that the temperature probe 70 may be shown in detail.

Figure 12:
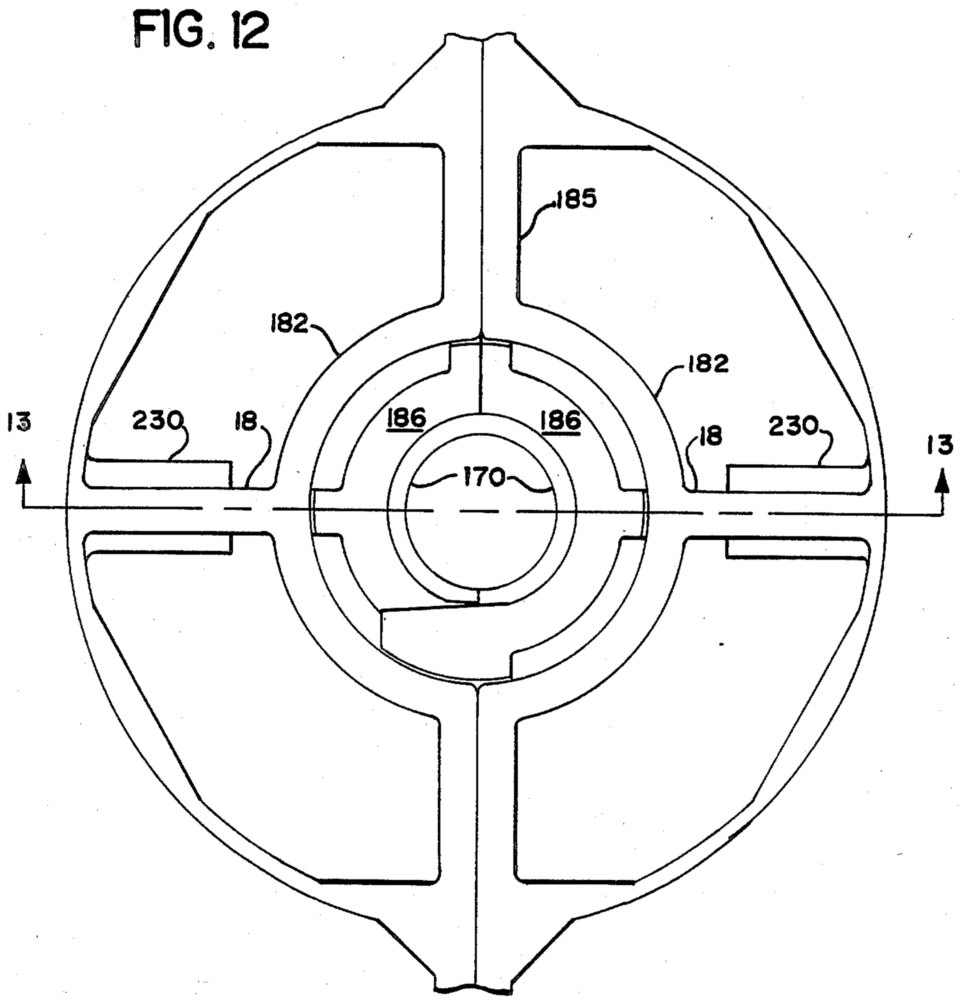
FIG. 12 is an enlarged fragmentary view of the hub portion of the state estimator module of FIG. 6.

Now referring to FIGS. 12 and 13, it can be seen how the clamping inserts 186 fit within the hubs 182 and 184 and how the facings 170 fit within the inserts 186. The inserts 186 are made in sets having differing inner diameters to accommodate conductors 22 of differing diameters.

Figure 15:
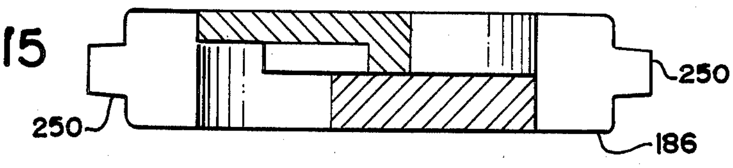
FIG. 15 is a cross section taken along the line 15—15 of FIG. 14.
Figure 14:
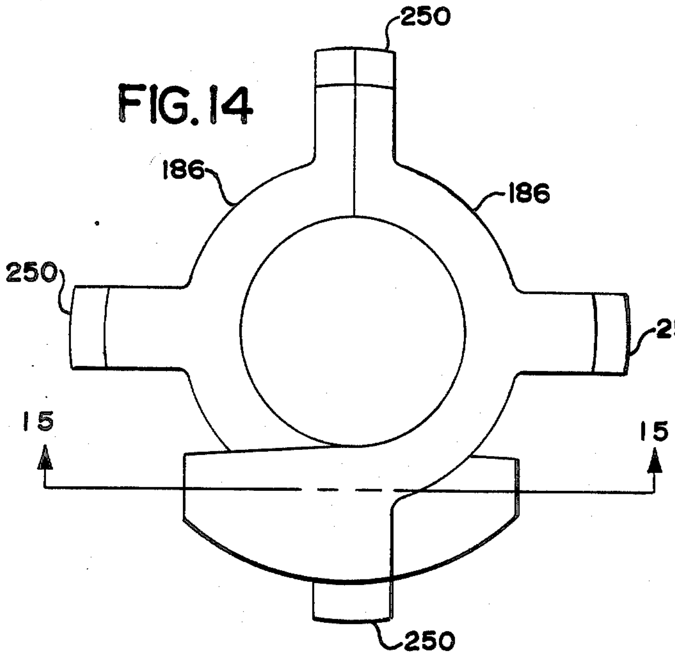
FIG. 14 is an enlarged view of the conductor clamping jaws shown in FIG. 12.
Figure 16:
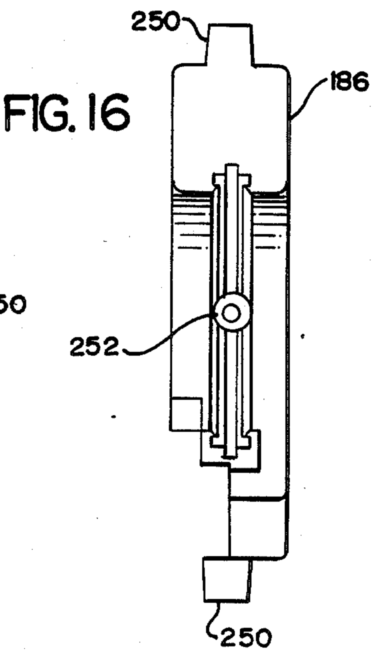
FIG. 16 is a side view showing the inside of one of the jaws shown in FIG. 14.
Figure 17:
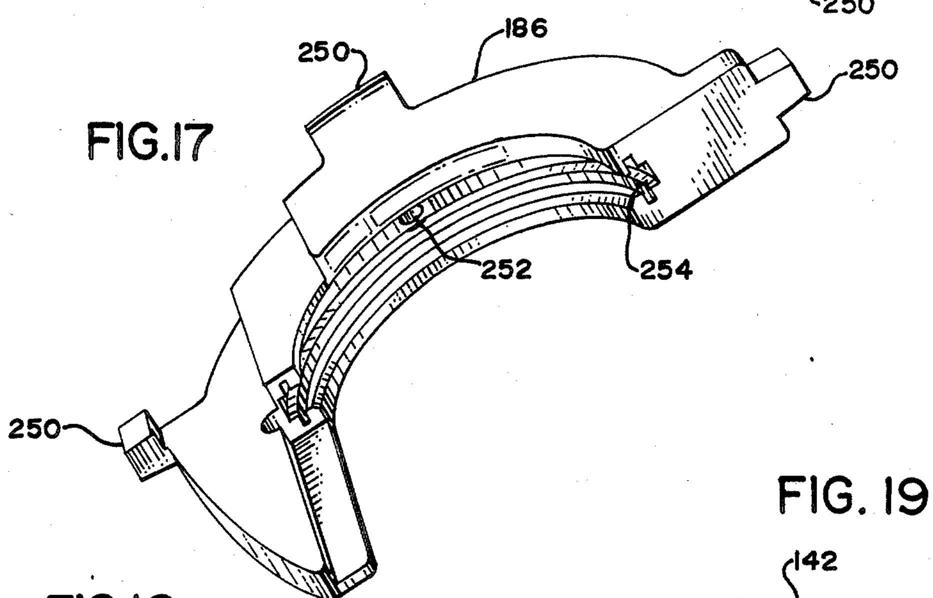
FIG. 17 is a enlarged perspective view of one of the jaws of FIG. 14.

As shown in FIGS. 15 through 17, the clamping inserts 186 are provided with alignment tabs 250 which fit into the hubs 182 and 184. Each of the inserts 186 is identical, one being upside down with respect to the other when installed as shown in FIG. 14. Each is provided with a screw hole 252 for screw mounting them within hubs 182 and 184 and are provided with a raceway 254 for insertion of and to hold the hard conducting neoprene rubber facings 170, which may be of material, having a hardness of 70 durometer on the Shore A scale. The facings 170 are preferably filled with a conducting powder, such as graphite, to establish electrical contact with the conductor 22.

Figure 18:
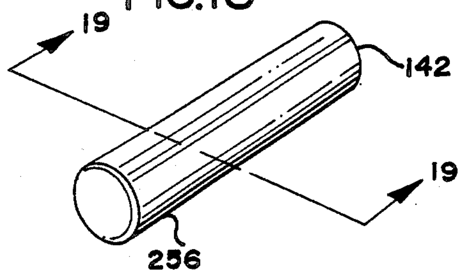
FIG. 18 is a view of one of the pins of the hinge clamp mechanism of the invention.
Figure 19:
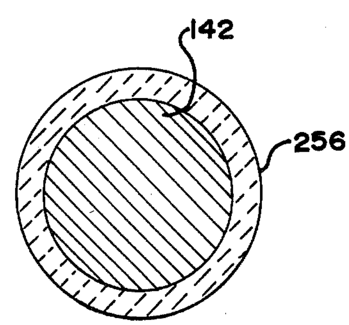
FIG. 19 is a cross sectional view thereof taken along the line 19—19 of FIG. 18.

One of the pins 142 of the hinge is shown in FIG. 18. All of the pins are provided with a non-conducting ceramic coating 256 which may be plasma sprayed thereon, so that the pins do not provide, together with the plates 136 and 138 of the hinge (FIG. 23), a shorted turn.

Figure 20:
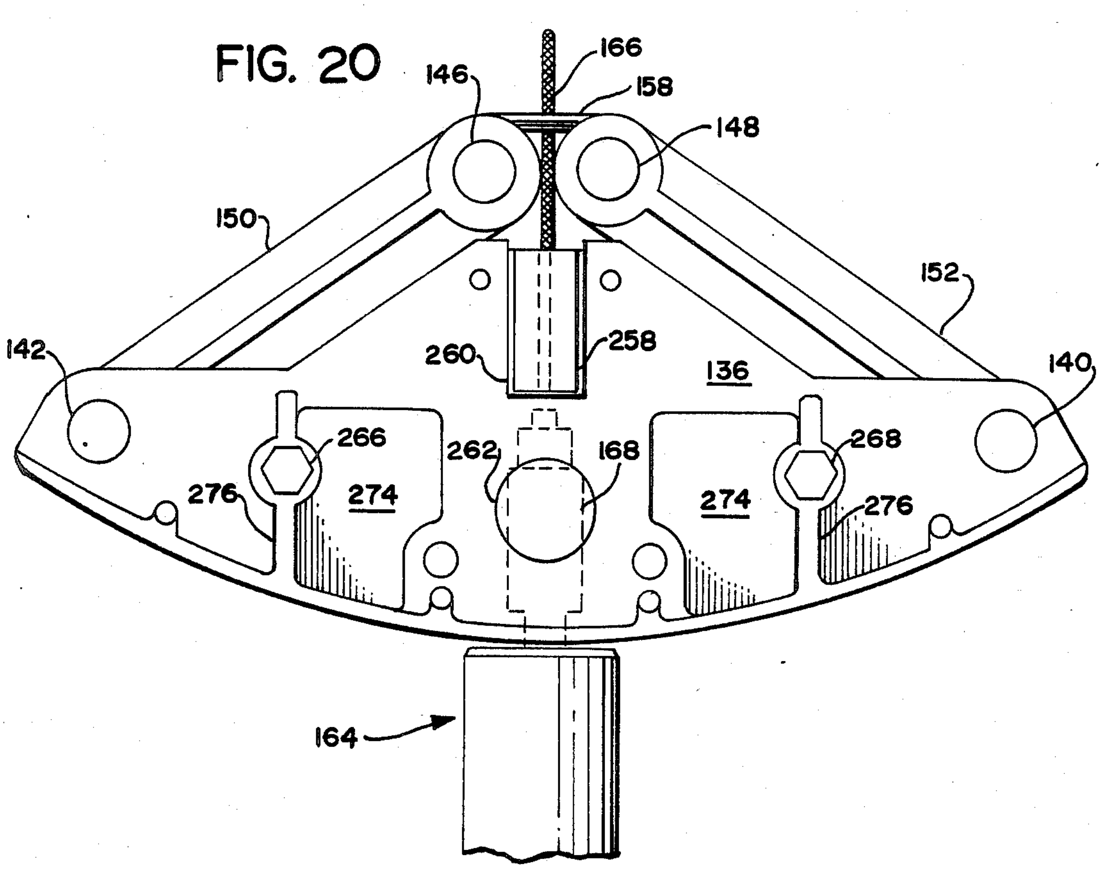
FIG. 20 is a fragmented partially diagrammatic top view of the hinge clamp of the invention and the tool utilized to open it if it jams.
Figure 24:
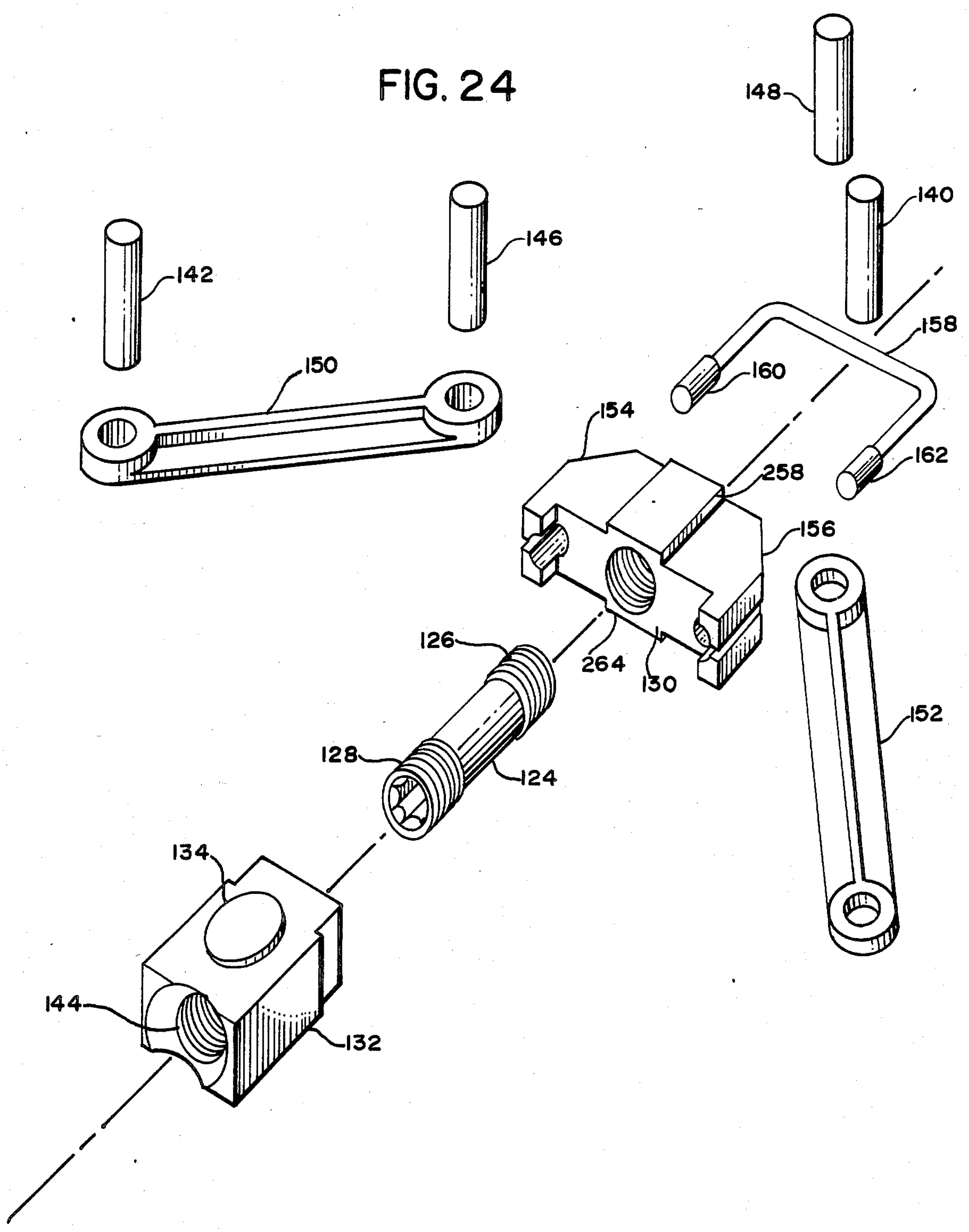
FIG. 24 is an exploded cross sectional view of the working mechanism of the hinge clamp of the invention.

Now referring to FIG. 20, an emergency hot stick mountable tool 164 can be used to open the donut 20 if for any reason the hinge clamp jams. This tool comprises an elongated file 166 used to cut the cable 158. After the cable 158 has been cut, a threaded portion 168 of the emergency tool may be threaded into the thread portion 144 of nut 132 (see FIG. 24) to remove the opened donut 20.

Also, in FIG. 20, it can be seen how the cable clamp 130 is provided with a raised key portion 258 which guides the cable clamp's motion in a guideway opening 260 in the top plate 136. Also, the circular opening 262 in the top plate 136 may be seen, in which the boss 134 of nut 132 fits to keep it from moving. A similar boss on the bottom of the nut 132 fits into a circular opening in bottom plate 138, as does a similar key 264 on the bottom of cable clamp 130 fit into a guiding opening in bottom plate 138. The plates 136 and 138 are secured together by bolts 266 and 268 and are held apart by spacers 270 and 272 (FIGS. 21 and 23) about the bolts 266 and 268. Cover plate 136 is machined with openings 274 and ribs 276 to make it as strong and light as possible.

Figure 21:
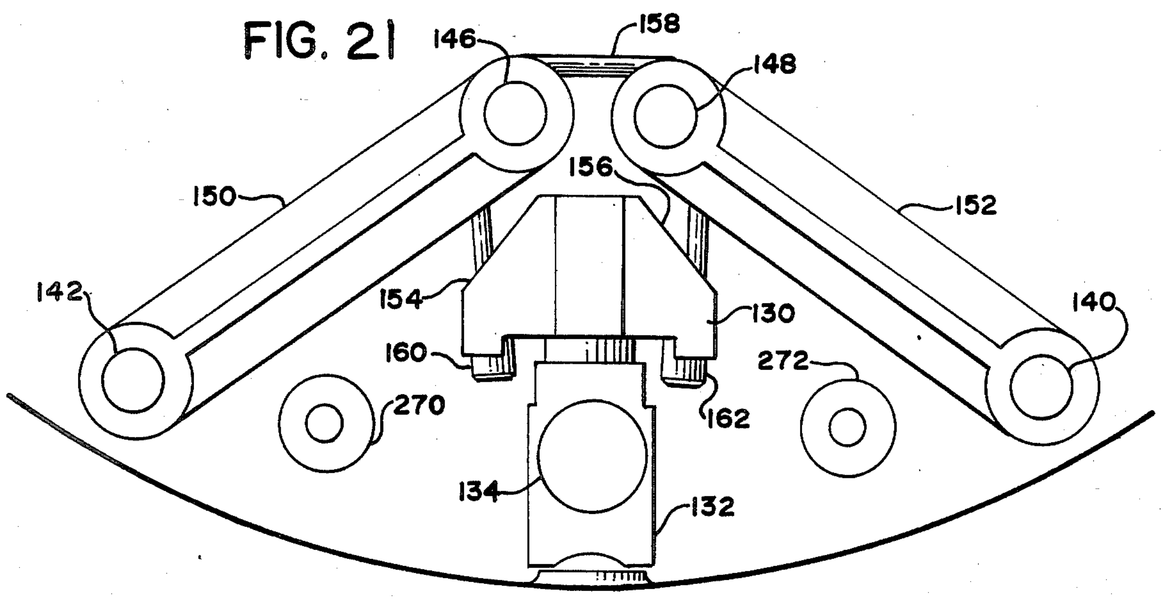
FIG. 21 is a top view similar to FIG. 20 showing the hinge clamp mechanism of the invention when the state estimator module of the invention is clamped about a conductor.

FIG. 21 shows the hinge clamp mechanism with the top plate 136 removed and the donut 20 closed, the cable 158 pulling pins 146 and 148 tightly together.

Figure 22:
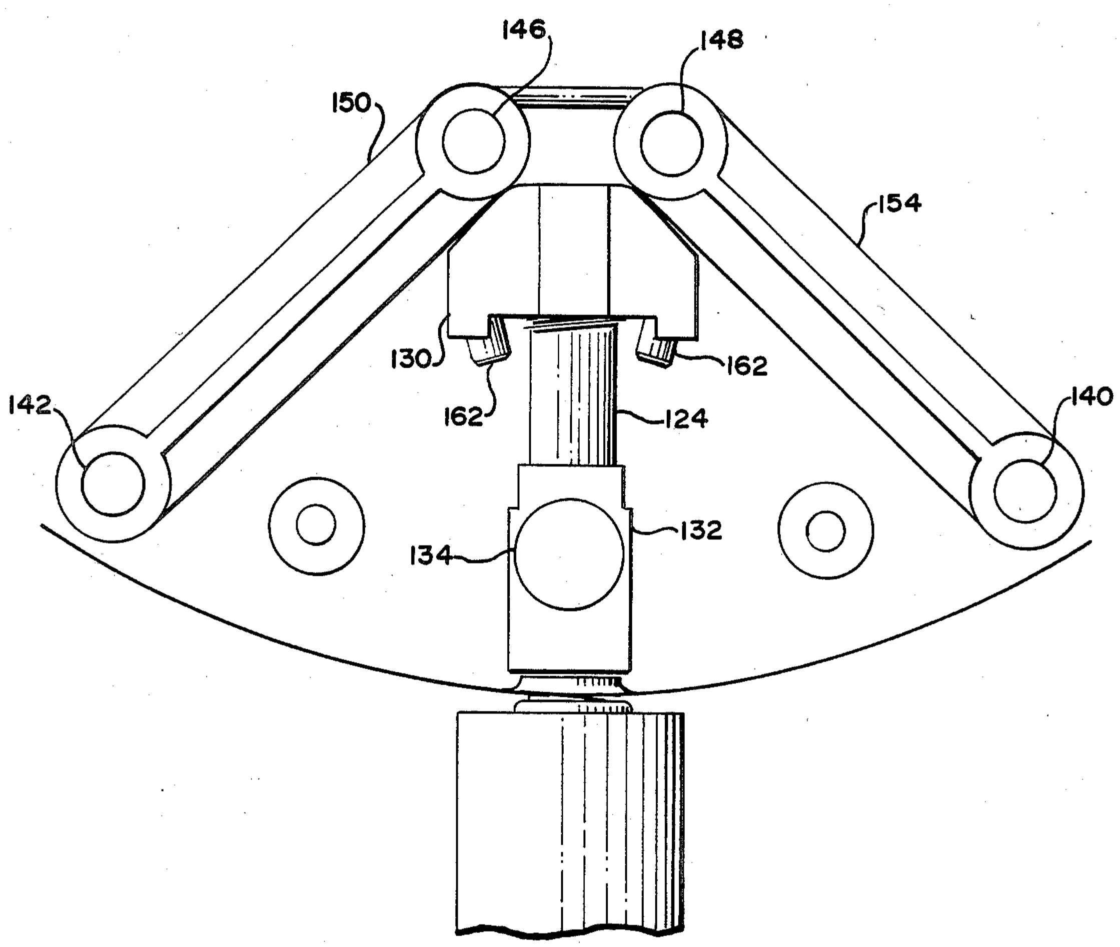
FIG. 22 is a view similar to FIG. 21 showing the hinge clamp mechanism when the state estimator module of the invention is opened for engagement or removal from a conductor.

In FIG. 22 the hinge clamp mechanism is shown with top plate 136 removed and the cable clamp 130 spread apart from the nut 132 by the barrel 124. The wedges 154 and 156 have pushed ramp arms 150 and 154 to spread apart fixed pins 146 and 148, to open the donut.

Figure 23:
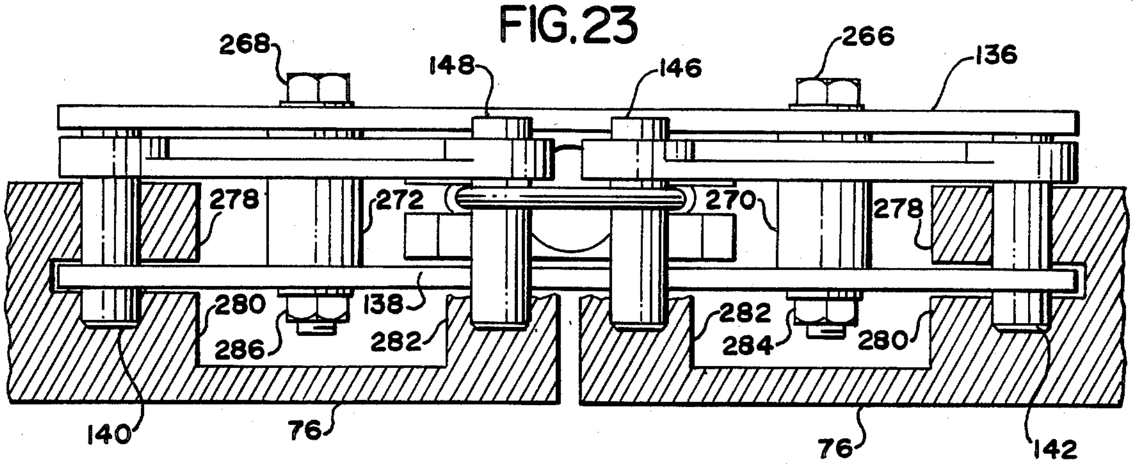
FIG. 23 is a fragmentary side view, partially in cross section taken from the top of FIG. 22.

In FIG. 23 it can be seen how hinge pins 140 and 142 fit into receiving portions 278 and 280 of each bottom portion 76 of the donut 20. Similarly, fixed pins 146 and 148 fit into portions 282 which are shown partly cut away in FIG. 23. Portions 282 are located closer to the central axis of the donut 20 than hinge pins 142.

Also seen in FIG. 23 are the nuts 284 and 286 on the bolts 266 and 268.

Figure 25:
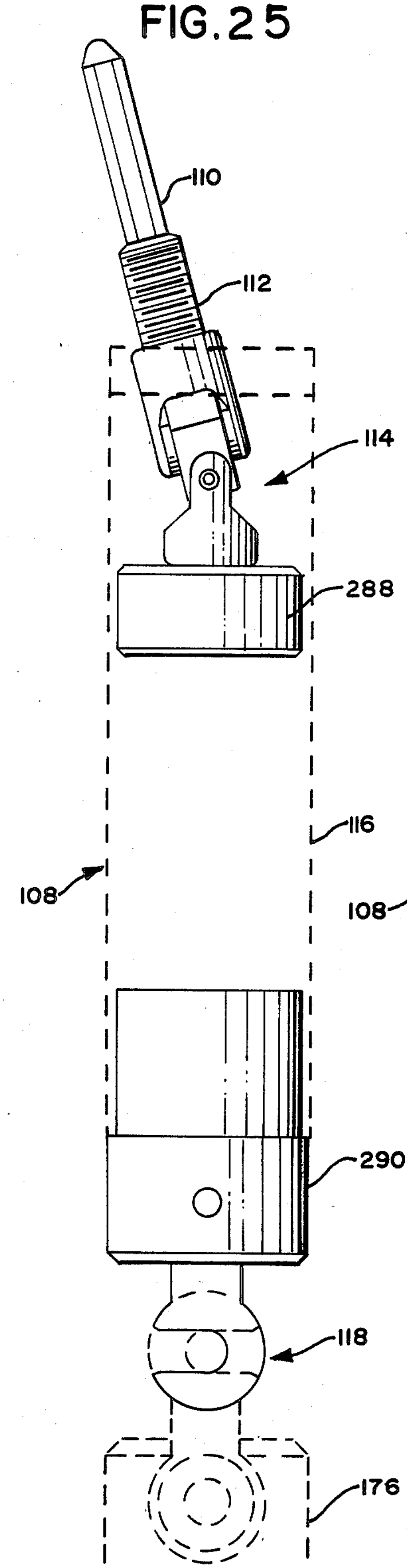
FIG. 25 is a diagrammatic front view of the hot stick hinge clamp operating tool of the invention.
Figure 26:
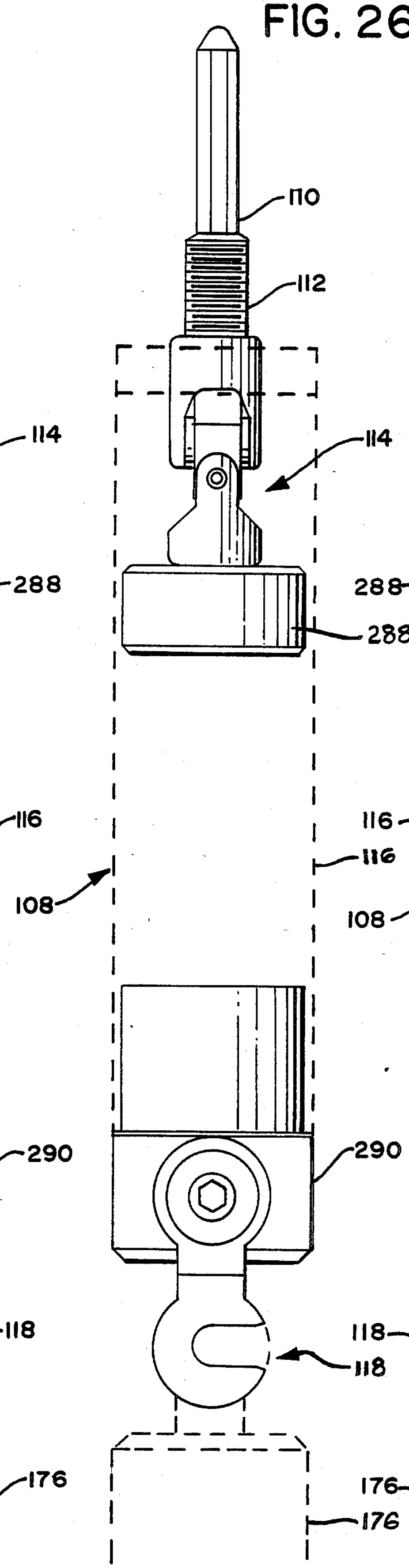
FIG. 26 is a back view thereof.
Figure 27:
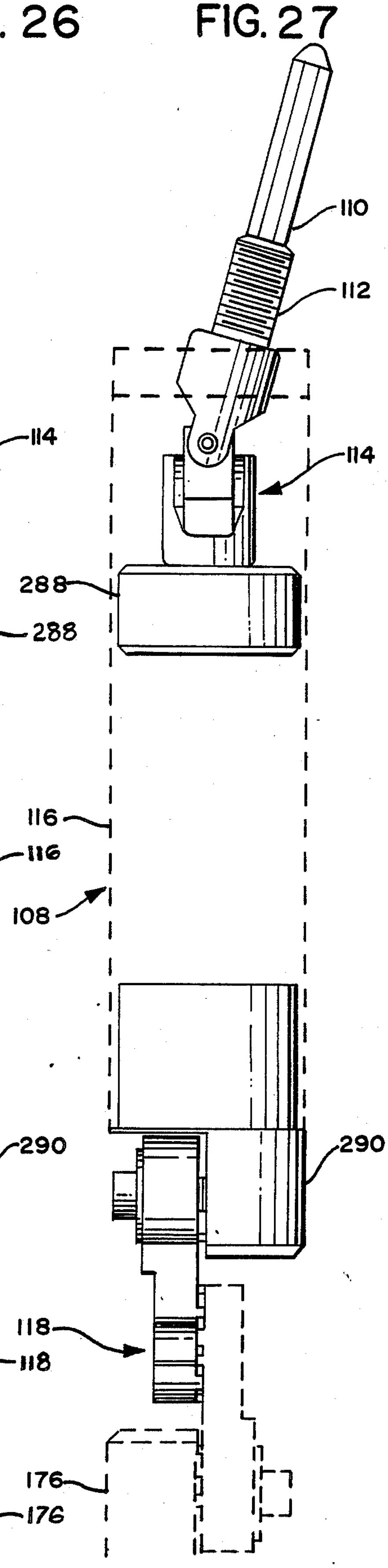
FIG. 27 is a side view thereof.

As previously described the hot stick tool 108 (FIGS. 25, 26 and 27) for mounting to a conventional hot stick 176 comprises a conventional hot stick mounting coupling 118, a barrel portion 116, a universal joint 114 which accommodates misalignment of the line of the stick 120 and the receiving opening 122 (see FIG. 3) in the donut 20. Also seen in FIGS. 25, 26, and 27 are the donut engaging Allen wrench portion 110 and threaded portion 112 of the hot stick tool 108, and the sleeve 116 which holds the base 288 of the universal 114 rigidly to the mounting 290 for the hot stick tool mounted portion of the coupling 118.

State Estimator Module Electronics

Figure 28:
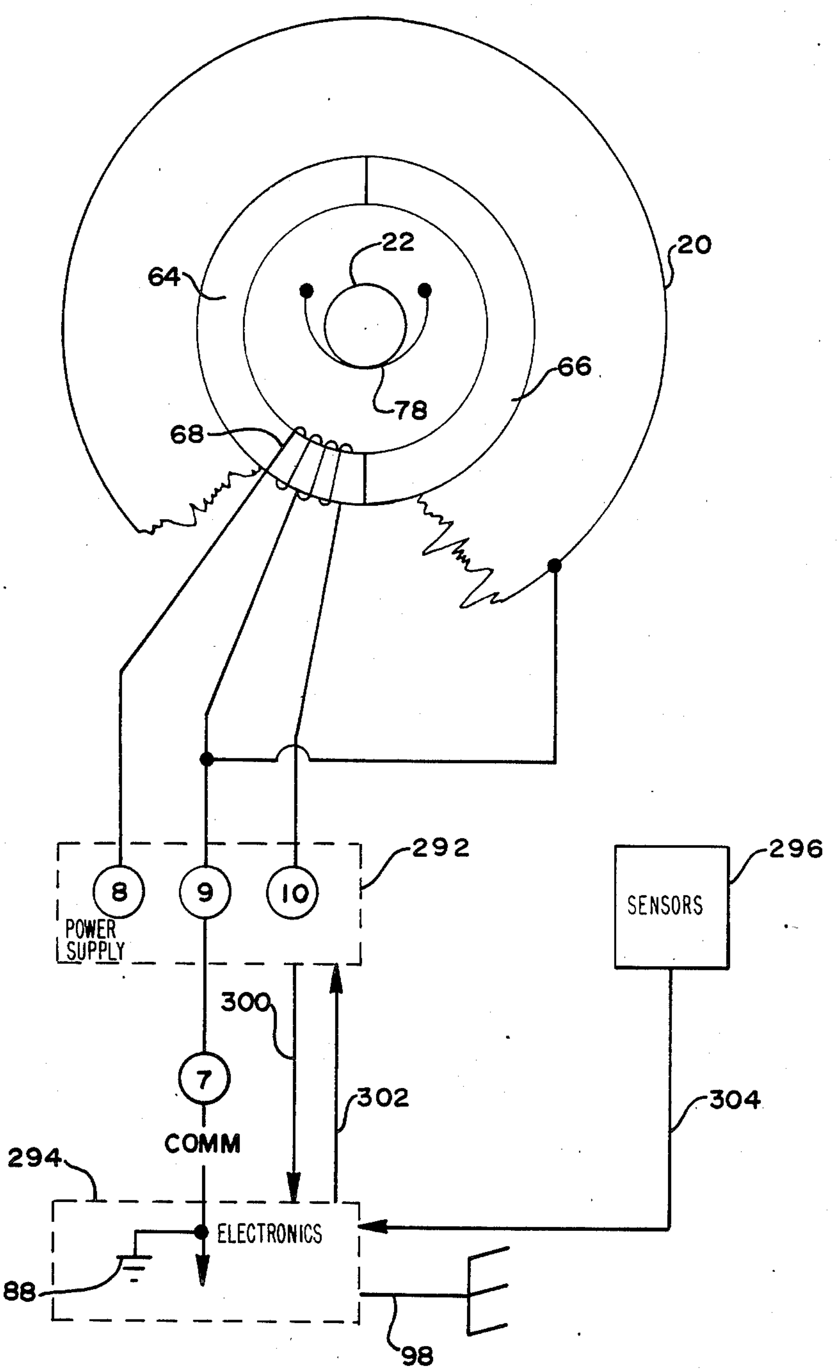
FIG. 28 is a schematic block diagram of the electronics of the state estimator of the invention.

The state estimator module electronics are shown in their overall configuration in FIG. 28. They comprise a power supply 292, digitizing and transmitting electronics 294, sensors indicated by the box 296, and antenna 98.

Figure 29:
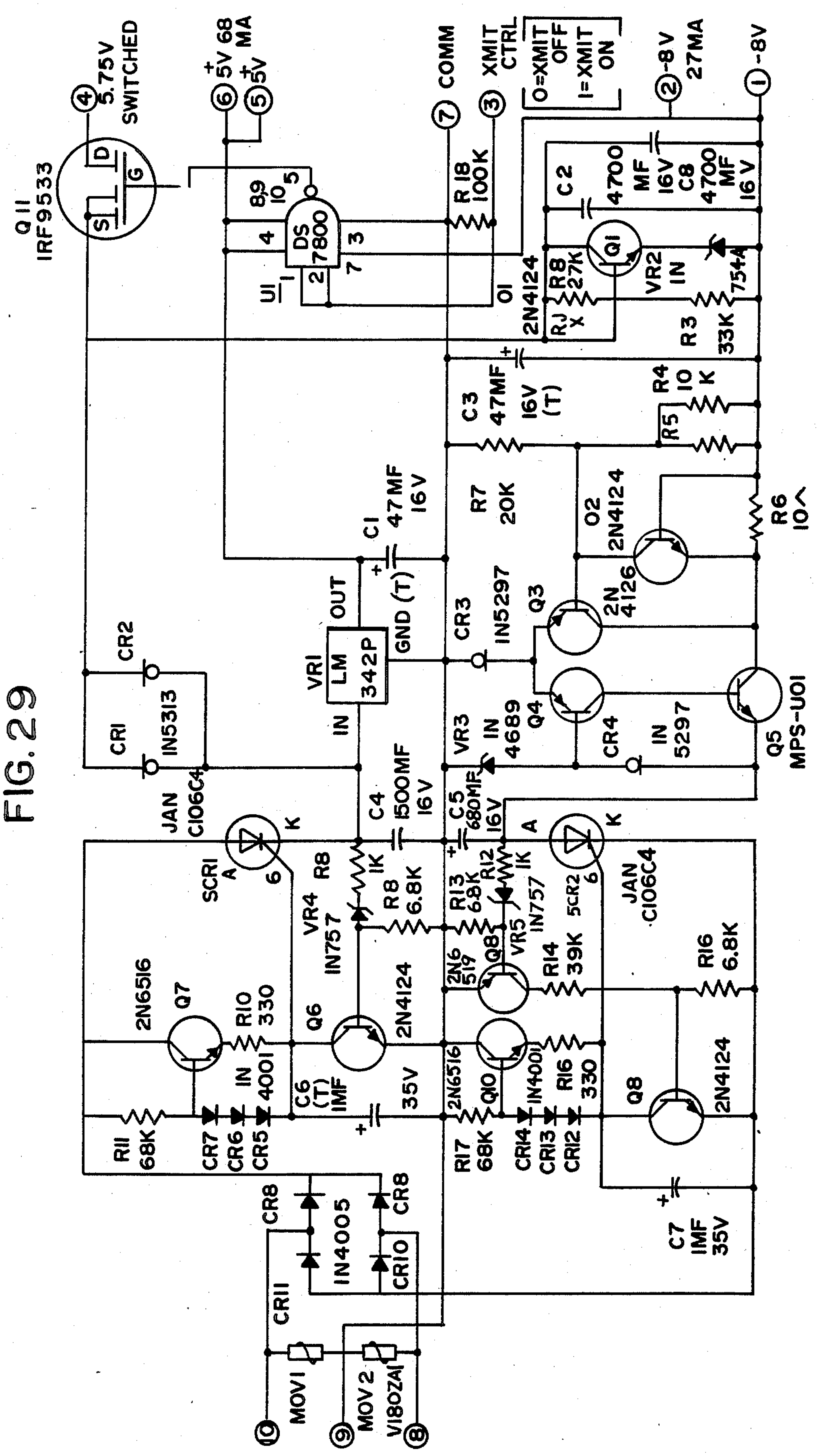
FIG. 29 is a detailed schematic electrical circuit diagram of the power supply of the state estimator of the invention.

The center tap 9 of the power pickoff coil 68 is connected to the aluminum shell of the module 20, which in turn is connected directly to the power conductor 22 by spring 78 and by the conducting facings 170 (FIGS. 12 and 13). Thus, the power conductor 22 becomes the local ground as shown at 88 for the electronics 294. The power supply supplies regulated +5 and −8 volts to the electronics 294 and an additional switched 5.75 volts for the transmitter as indicated at 300. The electronics 294 provides a transmitter control signal on line 302 to control the power supply to the transmitter. The sensors 296 provide analog signals as indicated at 304 to the electronics 294. The detailed schematic electrical circuit diagram of the power supply 292 is shown in FIG. 29.

Figure 30:
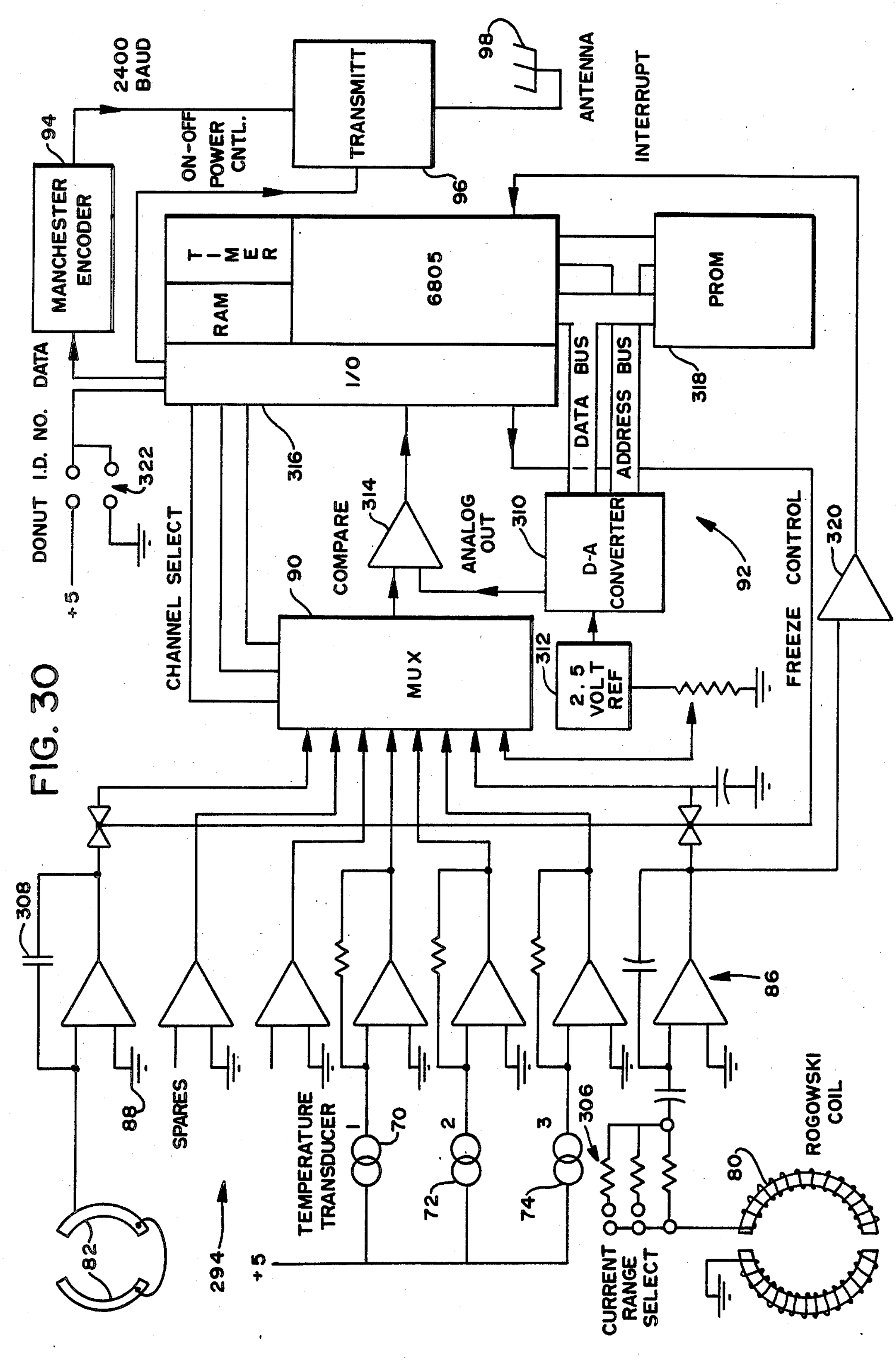
FIG. 30 is a detailed electrical schematic block diagram of a portion of the electronics illustrated in FIG. 28.

FIG. 30 is a schematic block diagram of the electronics 294. As shown therein, the Rogowski coil 80 is connected to one of a plurality of input amplifiers 86 through current range select resistors 306. The voltage sensing plates 82 are connected to the uppermost amplifier which is provided with a capacitor 308 in the feedback circuit which sets gain and provides an amplifier output voltage in phase with line to neutral high tension voltage. It also provides integrator action for the measurement of current the same way as the amplifier connected to the Rogowski coil. Thus amplifier 86 connected to the voltage sensing plate 82 is a low impedance current measuring means connected between the power conductor 22 (i.e., ground 88) and the plates 82.

Each of the temperature transducers 72 and 74 is connected to a separate one of the amplifiers 86 as shown. Spare amplifiers are provided for measurement of additional characteristics such as the interior temperature of the donut 20. Each of the amplifiers 86 is connected for comparison with the output of digital analog converter means 310, 2.5 volt reference source 312 at comparator 314 by the multiplexer 90 under control of the digital computer 316. The digital computer may be a Motorola CMOS 6805 microprocessor having I/O, RAM, and timer components. A programmable read only memory 318 is connected thereto for storing the program. A zero crossing detector 320 detects the zero crossings of the current in the Rogowski coil 80 and provide basic synchronization. The donut ID number is selected by jumpers generally indicated at 322. The digitized data assembled into appropriate messages is encoded in Manchester code by the encoder 94 and supplied to a 950 megahertz transmitter 96 which then supplies it to the antenna 98.

Figure 31:
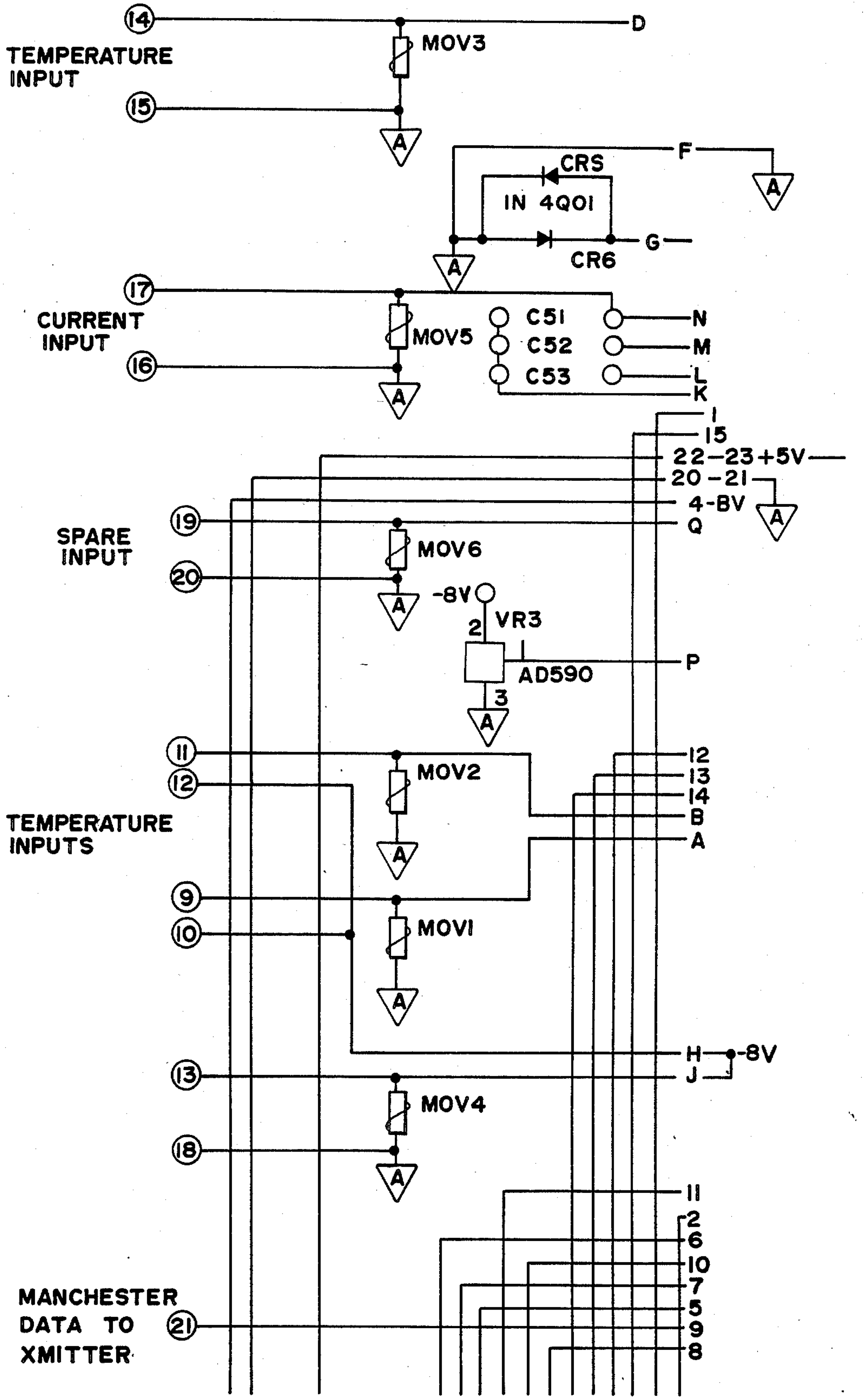
FIG. 31, comprising FIGS. 31A through 31D which may be put together as shown in FIG. 31E, is a detailed schematic electrical circuit diagram of the electronics shown in FIG. 30.
Figure 31:
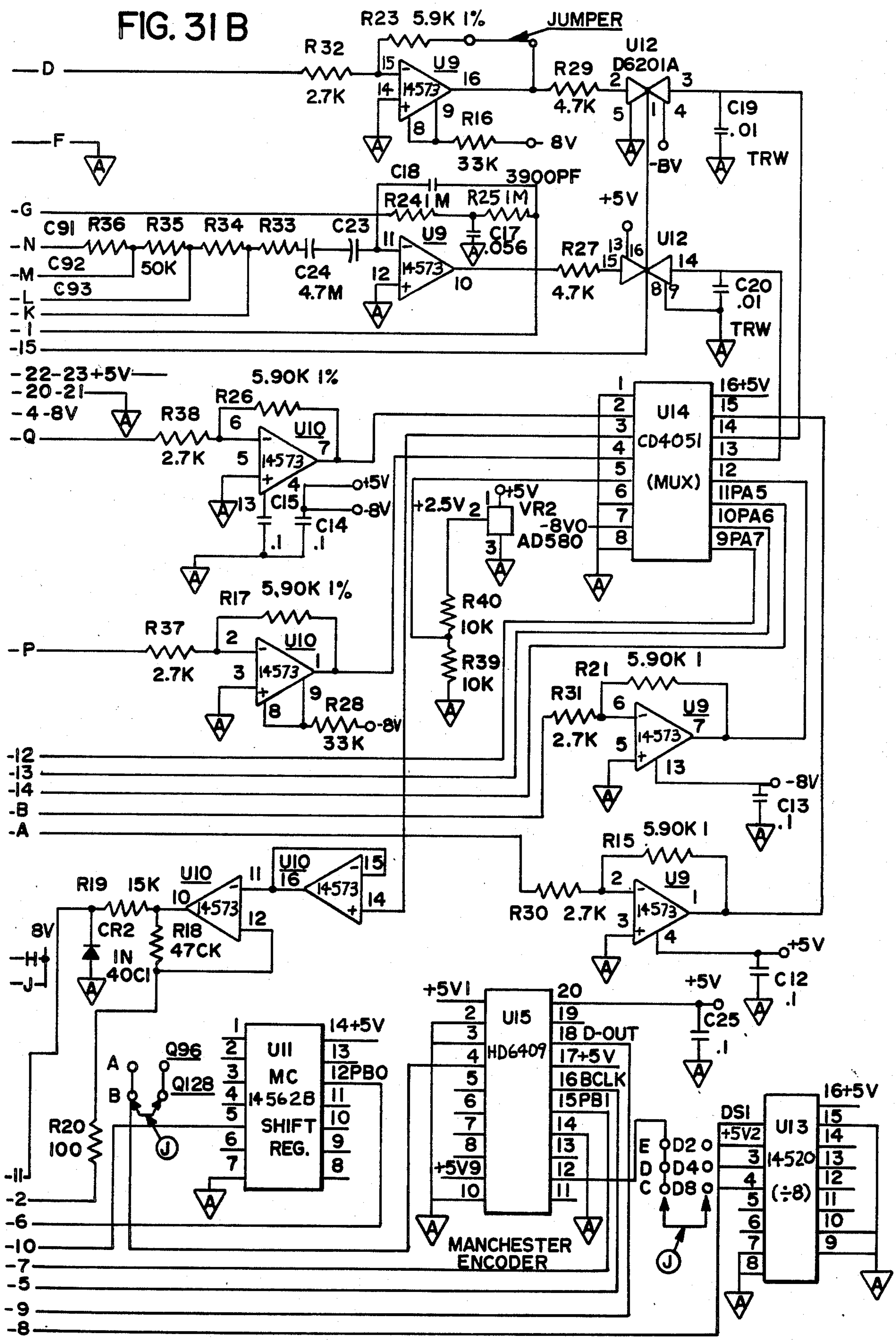
Figure 31:
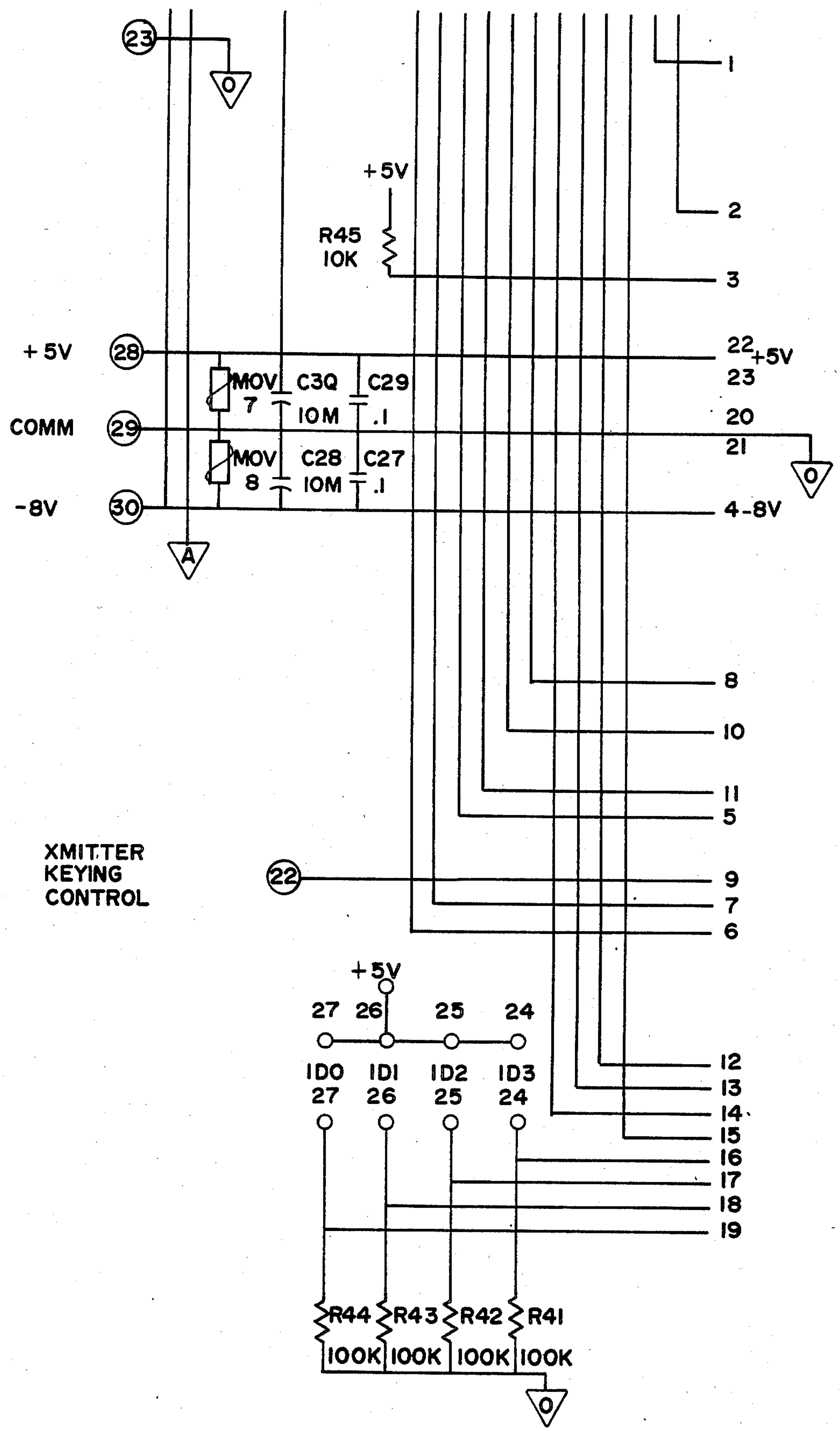
Figure 31:
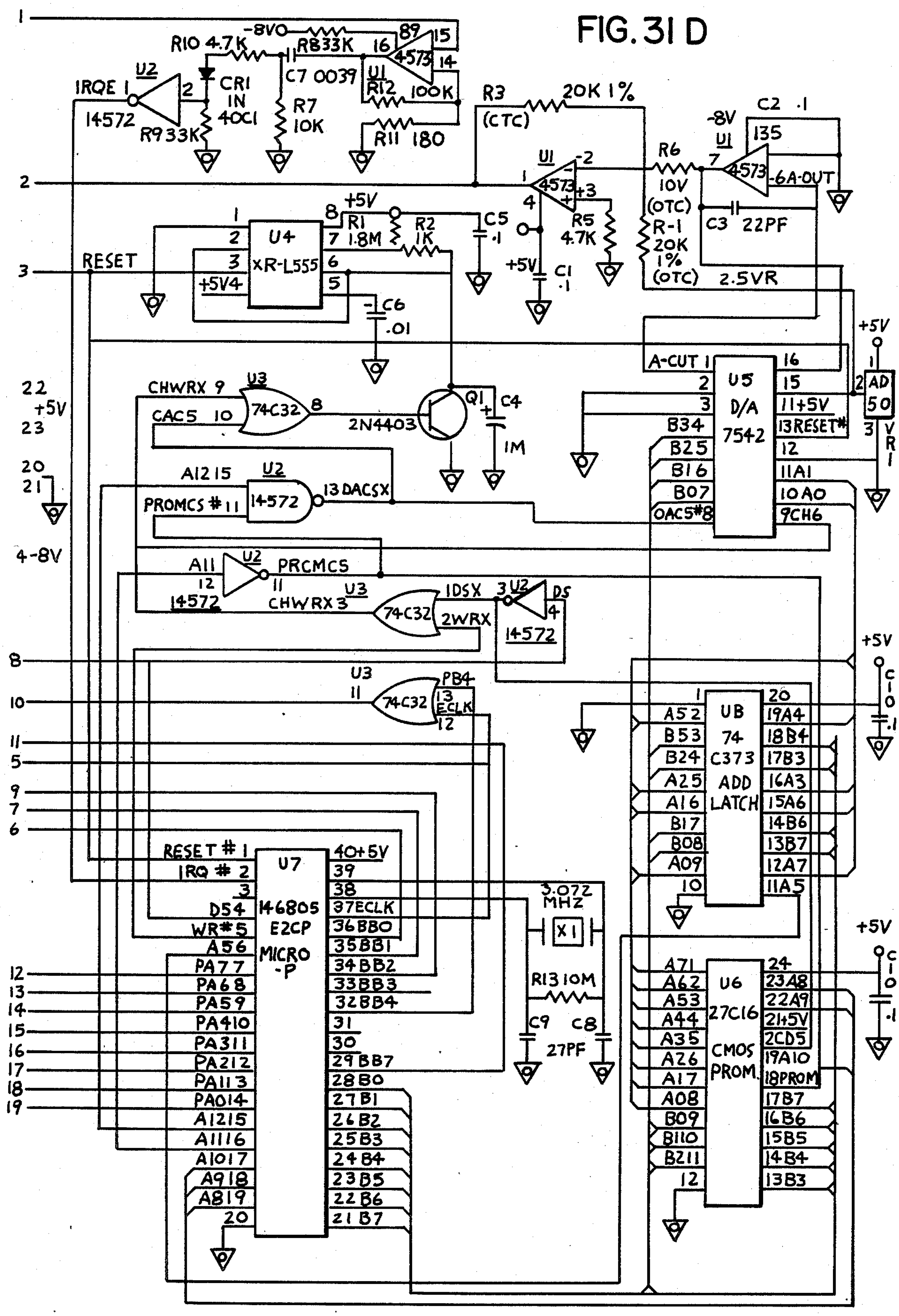
Figure 31:
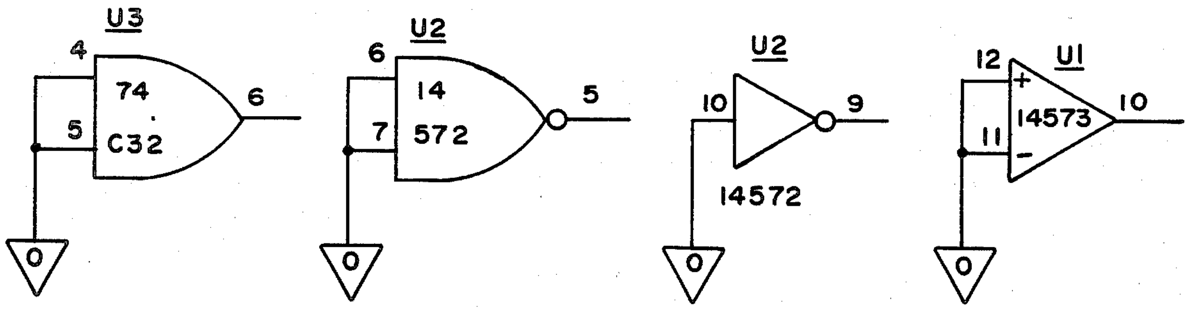
Figure 31:
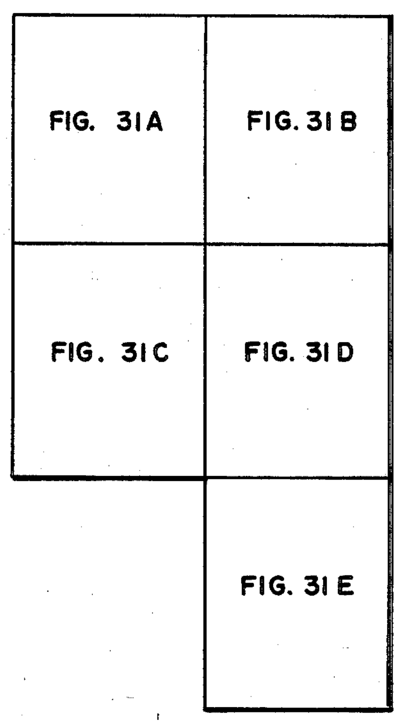

The schematic electrical circuit diagram of the electronics 294 is shown in FIG. 31, comprising FIGS. 31A through 31D which may be put together to form FIG. 31 as shown in FIG. 31E. The grounds therein are shown as triangles. A inside the triangle indicates an analog ground and D a digital ground. Both are connected to the common terminal as indicated in FIGS. 28 and 31C.

The Voltage Sensor

Figure 32:
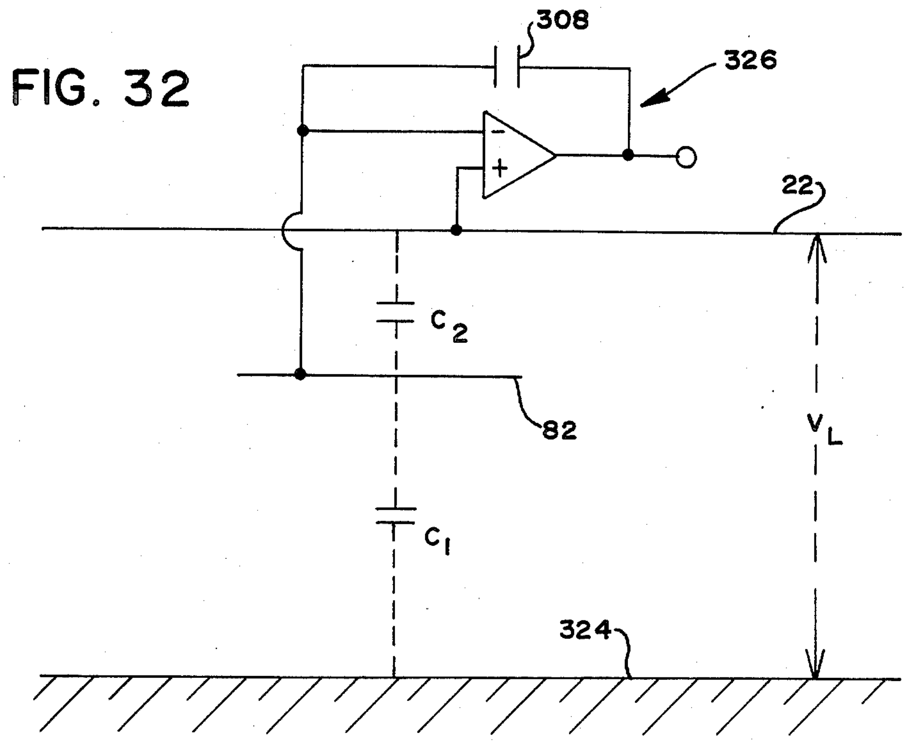
FIGS. 32 and 33 are schematic electrical circuit diagrams illustrating the voltage measurement system according to the invention.

The operation of the voltage sensor may be understood with reference to FIG. 32. We wish to measure the alternating current voltage $V_L$ between the conductor 22 and the ground 324. The metal plates 82 form one plate of a capacitive divider between conductor 22 and ground, comprising the equivalent capacitor C1 between ground and plate 82 and equivalent C2 between conductor 22 and the plate 82.

The voltage $V_L$ between ground and the conductor 22 is thus divided across the equivalent capacitor C1 and C2.

Prior art methods have attempted to measure the potential developed across capacitance C2. However this capacitance can change value and affect the accuracy of the measurement. It may also develop a spurious voltage across it due to the high electric field in the vicinity of the high voltage conductor 22. The low impedance integrating operational amplifier to the invention, generally indicated at 326, shunts capacitance C2 and effectively eliminates it from the circuit. The potential of plates 82 is therefore made to be the same as that of conductor 22 through the operational amplifier 326. Now the potential between the plates 82 and ground 324 is the potential $V_L$ between the line 22 and the ground 324. Therefore, the current in the capacitance $C_1$ is now directly proportional to the voltage $V_L$. Therefore, the low impedance integrater connected operational amplifier 326 will provide an AC output voltage exactly proportional to the current in the capacitance $C_1$ and thus directly proportional to the high voltage $V_L$ on the conductor 22.

Figure 33:
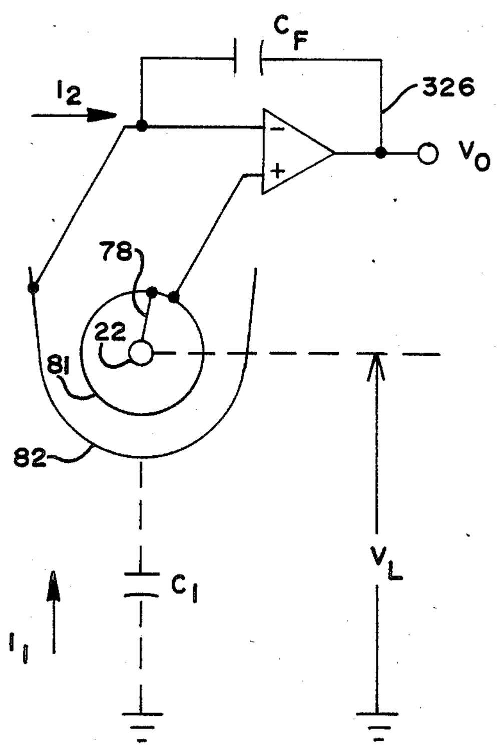

Now referring to FIG. 33, all of the circuitry including the integrater connected operational amplifier 326 is housed within a metal housing 81, which is connected to the conductor 22 via the spring 78. The plates 82 are on the outside of the housing 81 and must be electrically insulated from it. The plates 82 cannot protrude from the housing 81 since this would invite corona on very high voltage lines. It therefore must either be flush with the surface of the housing 81 or recessed slightly in it.

Unfortunately rain water or snow collecting on the surface will provide a path of high dielectric constant shunting the high electric field about the conductor 22 so that the current $I_2$ to the operational amplifier 326 will not be equal to the current $I_1$ in the capacitance $C_1$. Thus the measurement will be in error.

In order to minimize this effect the width and length of the sensing plates must be made very large in comparison with the width of the gap separating them from the housing and if any protective coating is used over the sensing plate it must have no appreciable thickness. Furthermore, the outer surface of the sensing plate must conform, as closely as possible, with the outer surface of the housing 81.

Thus the sensing plates 82 shown in FIGS. 8, 9, and 10, are made very long and have gaps to the housing at their ends of only 0.020 inches and gaps 212 along them of 0.005 inches in width. The plates 82 are approximately ⅜ths of an inch in width, which is of course very much greater than the gaps of 0.05 inches and 0.020 inches.

When constructed in this manner, water droplets covering the metallic sensing plate and bridging the adjacent housing do not materially affect the measurement of $V_L$. This is true because:

1. the sensing plates 82 are directly exposed and water overlying them which has a high dielectric constant, simply conducts the capacitive current $I_1$ directly to the plate;
2. the amount of current shunted by water at the gap between the plates 82 and the housing 81 is very small in proportion to the amount collected by the much larger area sensing plates themselves;
3. the alternating current lost through the shunt path across the gap between the plates 82 and housing 81 is very small because of the low input impedance of the integrater connected operational amplifier 326.

Deriving the Fourier Components of Current and Voltage

Since the state estimator module 20 is mounted in isolation on a high-tension transmission line it is desirable to derive as much information as possible from the sensors contained within it with a minimum of complexity and to transmit this raw data to the ground station 24 (FIG. 1). Calculation of various desired quantities may then be made on the ground.

It is therefore convenient to sample and hold both the current and voltage simultaneously and to send these quantities to the ground sequentially by pulse code modulation.

When it is desired to derive phase and harmonic data rather than merely transmitting the root mean square of the voltage and current to the ground, the shape of the waveforms and their relative phase must be transmitted.

We do this by transmitting Fourier components. We sample the waveform of both current and voltage at intervals of 1/9th of a cycle. However, rather than doing this during one cycle, we do this making one measurement at each cycle, changing the interval over nine cycles.

The ground station can then easily compute the quantities of interest, for example, RMS amplitude of voltage and current, their relative phase and harmonic content.

Since current and voltage are sampled simultaneously, their relative phases are the same as the relative phases of the sample sequence. The harmonic structures are also the same, so that, except for brief phenomena, any desired analysis may be made by the ground station.

The data transmissions take place in a five to ten second millisecond interval, which is synchronized with the zero crossing of the donut 20. With this information, the relative phase of three phases of a transmission line as shown in FIG. 1 may be derived.

In the embodiment disclosed herein we only compute the fundamental Fourier components of $V_A$ and $V_B$ and $I_A$ and $I_B$ which are:

$$V_A = \frac{2}{S_T} \cdot \sum_{S=1}^{S_T} V_S \cdot \cos\left(\frac{2\pi}{S_T} \cdot S\right)$$

$$V_B = \frac{2}{S_T} \cdot \sum_{S=1}^{S_T} V_S \cdot \sin\left(\frac{2\pi}{S_T} \cdot S\right)$$

$$I_A = \frac{2}{S_T} \cdot \sum_{S=1}^{S_T} I_S \cdot \cos\left(\frac{2\pi}{S_T} \cdot S\right)$$

$$I_B = \frac{2}{S_T} \cdot \sum_{S=1}^{S_T} I_S \cdot \sin\left(\frac{2\pi}{S_T} \cdot S\right)$$

where $S_T$ equals the total number of samples in the apparatus disclosed 9, S equals the sample, and $V_S$ and $I_S$ are the value of the measured voltage and current at each sample S. From these the RMS voltage V and current I may be derived by the formulas:

$$V = [(V_a)^2 + (V_B)^2]^{\frac{1}{2}}$$

$$I = [(I_A)^2 + (I_B)^2]^{\frac{1}{2}}$$

real power is:

$$(V_B \times I_B) + (V_A \times I_A)$$

and reactive power is:

$$(V_A \times I_B) - (V_B \times I_A).$$

If it is desired to have information about the shape of the waveform (that is harmonic data) more samples may be taken and the desired Fourier harmonic components calculated and transmitted.

"Random" Transmissions on a Single Radio Channel

As shown in FIG. 4, a single substation 34 may have as many as fifteen donuts 20 transmitting data to a single receiver 24. Since radio receivers are expensive and radio frequency channel allocations are hard to obtain, it is desirable to have all units share a single channel. For weight and economy it is desirable to minimize the equipment in the donuts 20 at the expense of complicating the receiver 24.

Idealy, all donuts 20 transmitting on a single channel would transmit, in turn, in assigned time slots. Unfortunately, the only way to synchronize them according to the prior art would be to provide them each with a radio receiver.

Our donuts 20 are programmed to send out short burst transmissions at "random" with respect to each other, and to do so often enough that occasional interference between two or more transmissions does not destroy a significant portion of the data. This is accomplished by assigning to each donut 20 transmitting to a single receiver 24 a fixed transmission repetition interval so that no synchronization is required. The interval between transmissions of each of the donuts is an integral number and these numbers are chosen so that no two have a common factor.

For example, for fifteen donuts, we choose the intervals W measured in sixtieths of a second according to the following table:

| Donut Number | W |
|---|---|
| 0 | 37 |
| 1 | 41 |
| 2 | 43 |
| 3 | 47 |
| 4 | 51 |
| 5 | 53 |
| 6 | 59 |
| 7 | 61 |
| 8 | 64 |
| 9 | 65 |
| 10 | 67 |
| 11 | 71 |
| 12 | 73 |
| 13 | 77 |
| 14 | 79 |

It is desirable that the message length be reduced to a bare minimum in order to minimize simultaneous message transmission. One way we accomplish this is to transmit "auxiliary" information in repeating cycles of five transmissions.

Timing of the Measurements and Transmissions

Figure 34:
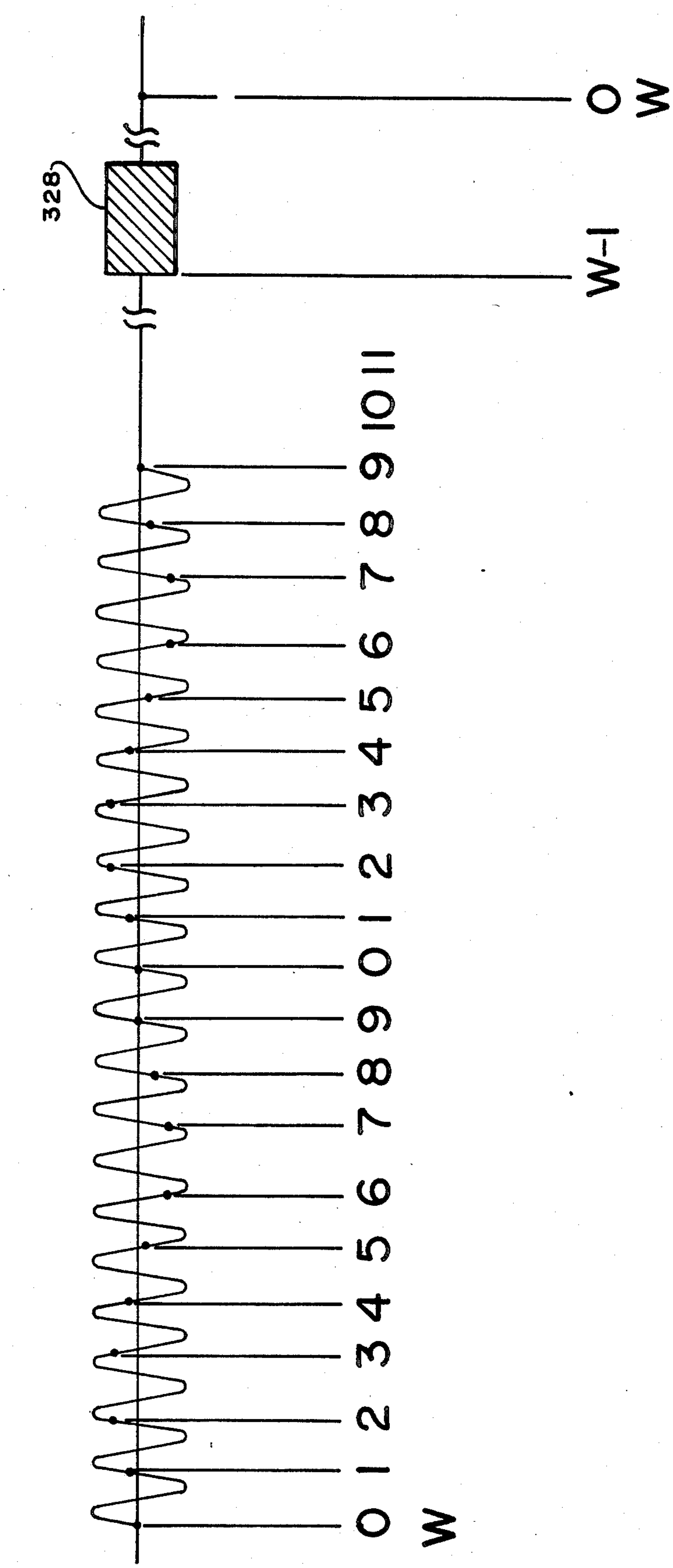
FIG. 34 is a timing diagram of the electronics illustrated in FIG. 30.

A timing diagram is shown in FIG. 4, where the sine wave is the current as measured by the Rogowski coil. At zero crossing labeled Ø timing is started. During the next cycle labled 1 and succeeding cycles through the eighth, the nine successive Fourier measurements $I_S$ and $V_S$ are made. During the ninth cycle the period of the previous eight cycles is utilized to define the sampling interval and the Fourier samples of the current and voltage are again taken during the next eight cycles. These measurements are utilized to compute $V_A$, $V_B$, $I_A$ and $I_B$. At the end of the next cycle labeled 9 at the Ø crossings, twenty-one cycles have occurred. During the followup period of time, up to a total of W−1 cycles, the program loads shift registers with the identification number of the donut, the auxiliary number, the Fourier components $V_A$, $V_B$, $I_A$, $I_B$, the digitized auxiliary parameters and the CRC (a check sum). At W−1 the transmission 328 begins and takes place over a short interval of 5 to 10 milliseconds, (approximately 5 milliseconds in the apparatus disclosed). Then at the Ø crossing at the end of the cycle beginning at W−1, that is after W cycles, the program is reset to Ø going back to the left hand side of the timing diagram of FIG. 34.

In the program discussed below there is a timer labeled Z which is set to Ø at the far left, beginning Ø cross over. It is reset to Z=21 at the end of the twenty-first cycle, the second nine to the right in FIG. 34.

The Donut Software

Copyright ©1983,
Product Development Services, Incorporated (PDS)

Scope

The state estimator module 20 (sometimes called herein the substation monitor) is a MC146805E2 microprocessor device.

Introduction

The "Donut" software specification is divided into three major sections, reflecting the three tasks performed by the software. They are:

Data structures,

The background processing that performs the bulk of the "Donut" operations. Included are transmitter control, sample rate timing, analog value conversion, and general "housekeeping", Common utility sub-routines, The interrupt processing that handles A.C. power zero-crossing interrupts and maintains the on-board clock which is used for cycle timing, and The restart processing that occurs whenever the microprocessor is restarted.

The program listings are found in Appendix A.

Notation Conventions

(a) Logic Statements

Program modules are described via flowcharts and an accompanying narrative. The flowcharts use standard symbols, and within each symbol is noted the function being performed, and often a detailed logic statement.

Detailed statements conform to the following conventions:

| | |
|---|---|
| IX | Index Register |
| SP | Stack Pointer |
| PC | Program Counter |
| A,B | Register A or B |
| CC | Condition Codes |
| Y | Contents of register or contents of memory location Y. |
| (y) | Contents of memory location addressed by the contents of register or contents of memory location y. |
| A,X | Contents of location whose address is A - IX. |
| y(m-n) | Bits m-n of the contents of register y or the contents of memory location y. |
| a→b | a replaces b. The length of the move (one or two bytes) is determined by the longer of a or b. |

For instance:

| | |
|---|---|
| ABC→XYZ | Move the contents of memory location ABC to memory location XYZ. |
| IX→XYZ | Save the Index Register in location XYZ. |
| (IX)→XYZ | Store the contents of the address pointed to by the Index Register in location XYZ. |
| Ø,X→XYZ | Same as above. |
| XYZ+2,X→SP | Move the bytes in location XYZ+2+(IX) and XYZ+3+(IX) to the Stack Pointer. |
| IX→(XYZ) | Store the Index Register in the memory location pointed to by location XYZ. |
| (IX)→(XYZ) | Store the contents of the memory location pointed to by the Index Register in the memory location pointed to by location XYZ. |
| ABC (2-3) | Bits 2-3 of memory location ABC. |

(b) Subroutine Calls

Figure 35:
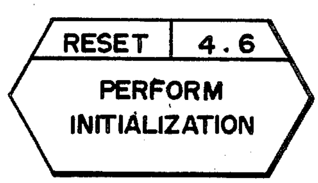
FIG. 35 shows a sub-routine call as utilized in the flow charts of FIGS. 40 through 61.

Subroutine calls contain the name of the subroutine, a statement of the sub-outline, a statement of its function, and the flowchart section which describes it as shown in FIG. 35.

Data Structures

Figure 36:
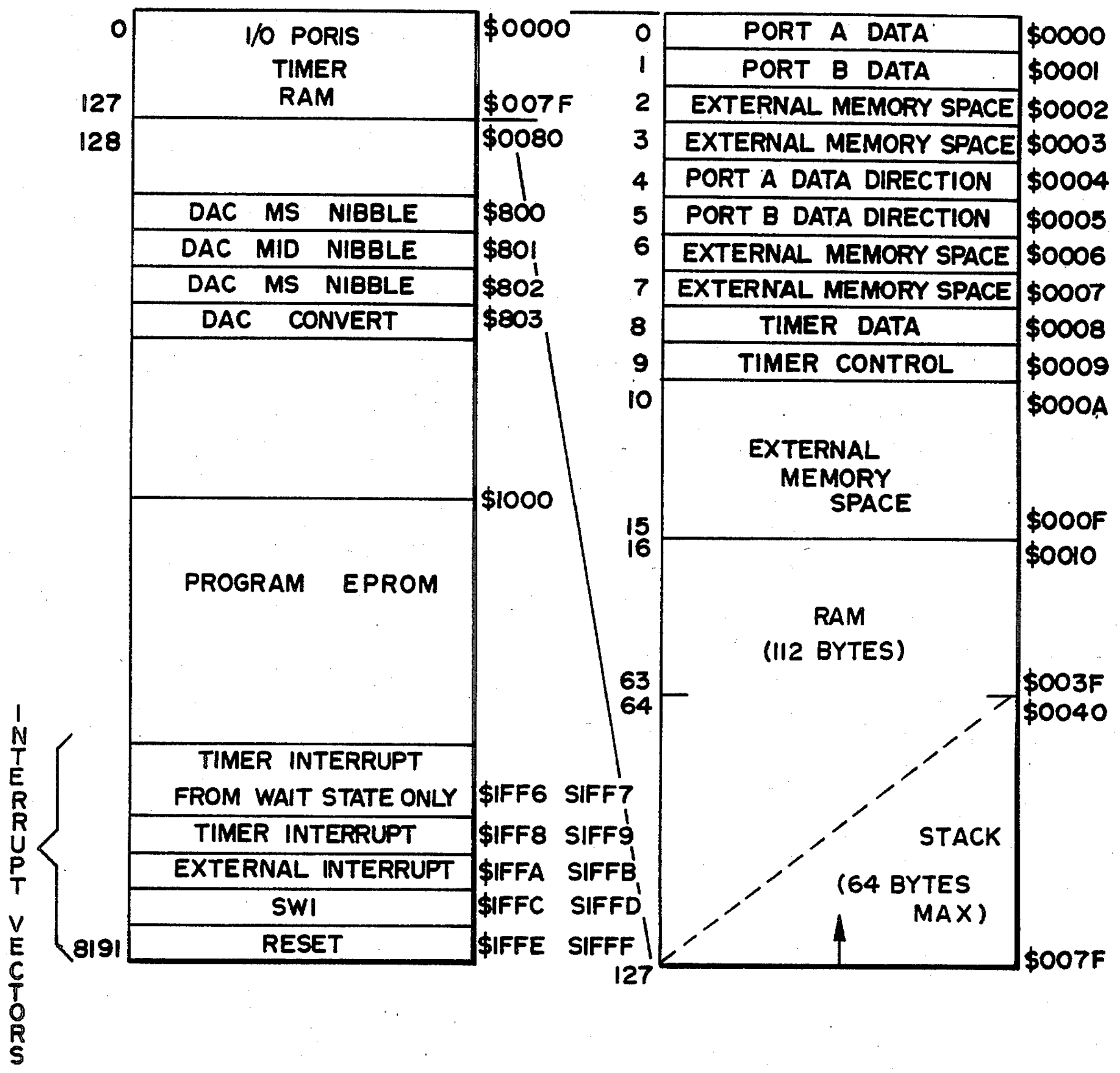
FIG. 36 is a memory map of the program.
Figure 37:
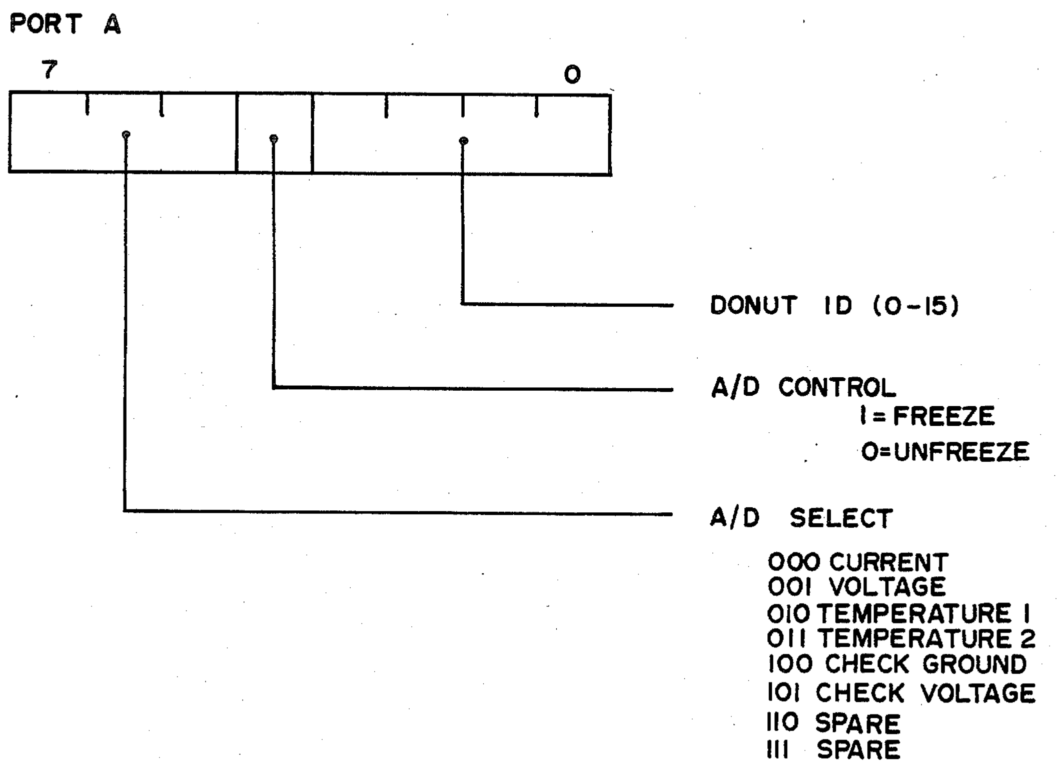
FIG. 37 is a diagram of PIA port assignments of the program.
Figure 37:
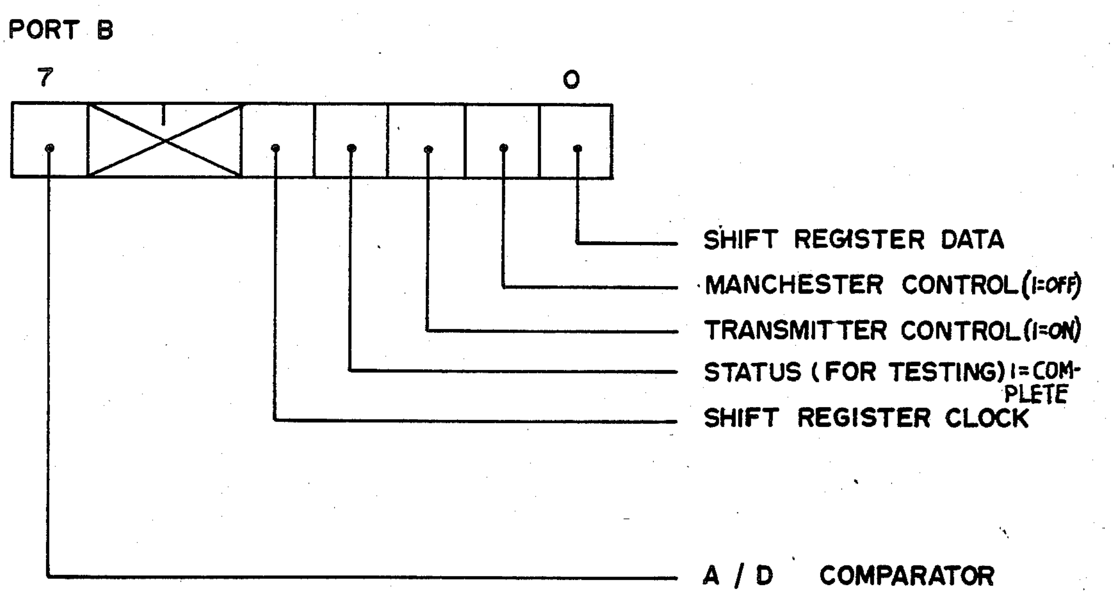

The memory map is shown in FIG. 36, the PIA Definitions in FIG. 37, and the Data Transmission Format in FIG. 38.

Background Processing

Figure 39:
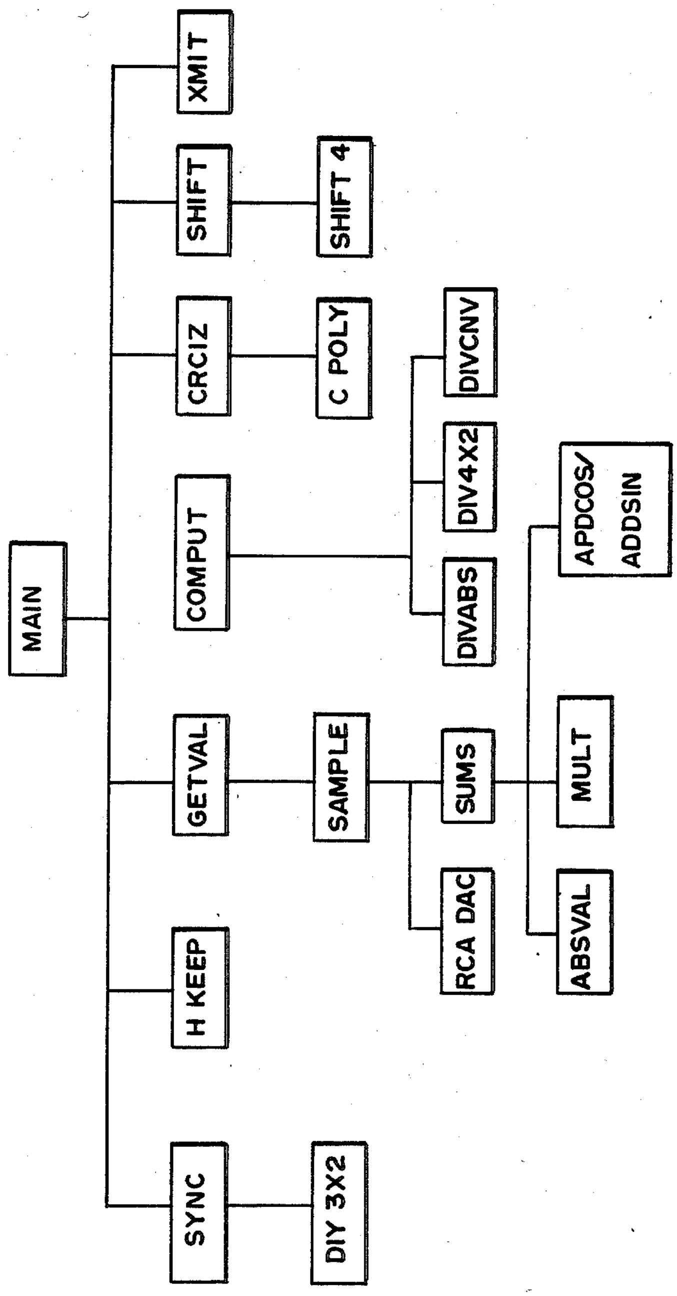
FIG. 39 is a diagram of task management of the program.

The Background Processing Hierarchy is shown in FIG. 39.

Figure 40:
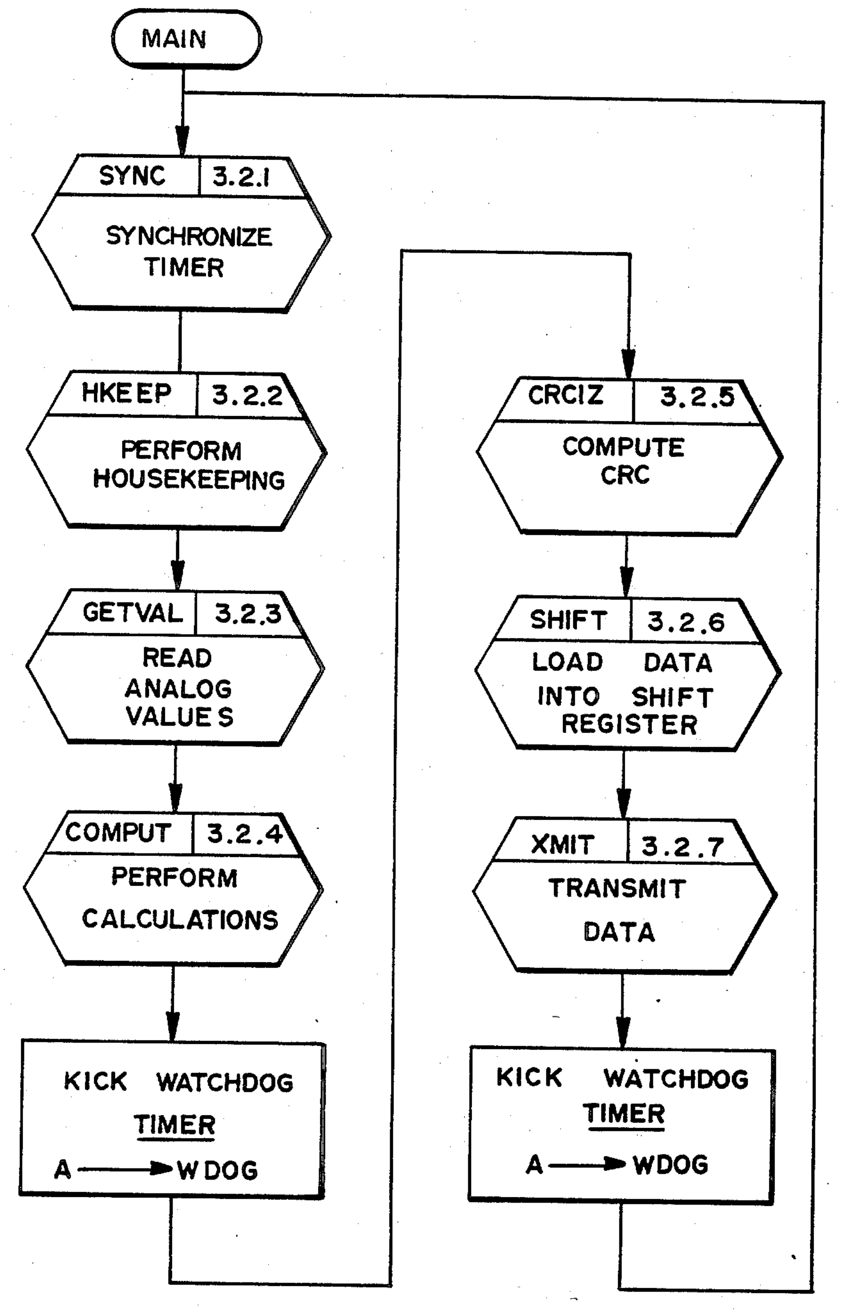
FIGS. 40 through 61 are flow charts of the subroutines of a program that may be utilized in the donuts 20.

Substation Monitor Mainline (MAIN) FIG. 40

PURPOSE: MAIN is the monitor background processing loop.
ENTRY POINT: MAIN
CALLING SEQUENCE: JMP MAIN (from RESET)
REGISTER STATUS: A, X not preserved.
TABLES USED: None.
CALLED BY: RESET
CALLS: SYNC, HKEEP, GETVAL, COMPUT, CRC12, SHIFT, XMIT
EXCEPTION CONDITIONS: None.
DESCRIPTION:

MAIN calls SYNC to time the AC frequency and compute the sampling rate, HKEEP to perform general initialization, and GETVAL to sample the analog values. COMPUT is called to finish the Fourier calculations, the watchdog timer is kicked, and CRC12 is called to calculate the CRC value for the data to be transmitted. SHIFT is called to load the shift register, XMIT is called to transmit the data to the ground station, the watchdog is kicked, and the entire cycle is repeated.

Figure 41:
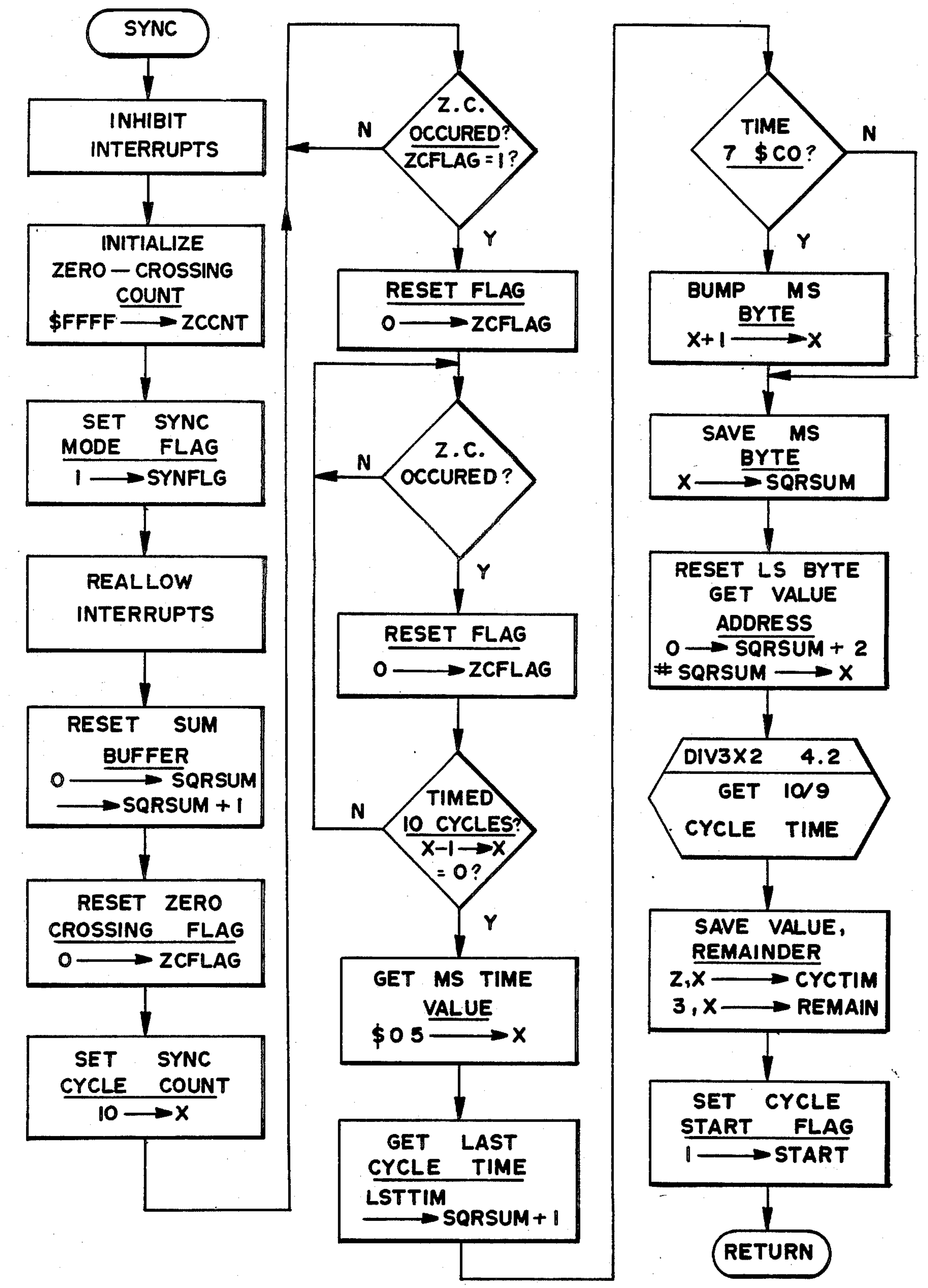

Synchronize Timing (SYNC) FIG. 41

PURPOSE: SYNC times the AC frequency and calculates the sampling interval.
ENTRY POINT: SYNC
CALLING SEQUENCE: JSR SYNC Return
REGISTER STATUS: A, X not preserved.
TABLES USED: None.
CALLED BY: MAIN
CALLS: DIV3X9
EXCEPTION CONDITIONS: None.
DESCRIPTION:

SYNC initializes the zero crossing count and sets the sync mode flag. The sum buffer is cleared for use as a time accumulator, the zero crossing occurred flag is reset, and the cycle counter is set to 10. The zero crossing occurred flag is monitored until 10 zero crossing interrupts have occurred, at which point the time value is moved to the sum buffer. DIV3X2 is called to divide the 10 cycle time by 9, the quotient is saved as the sampling time, the start flag is set, and a return is executed.

Figure 42:
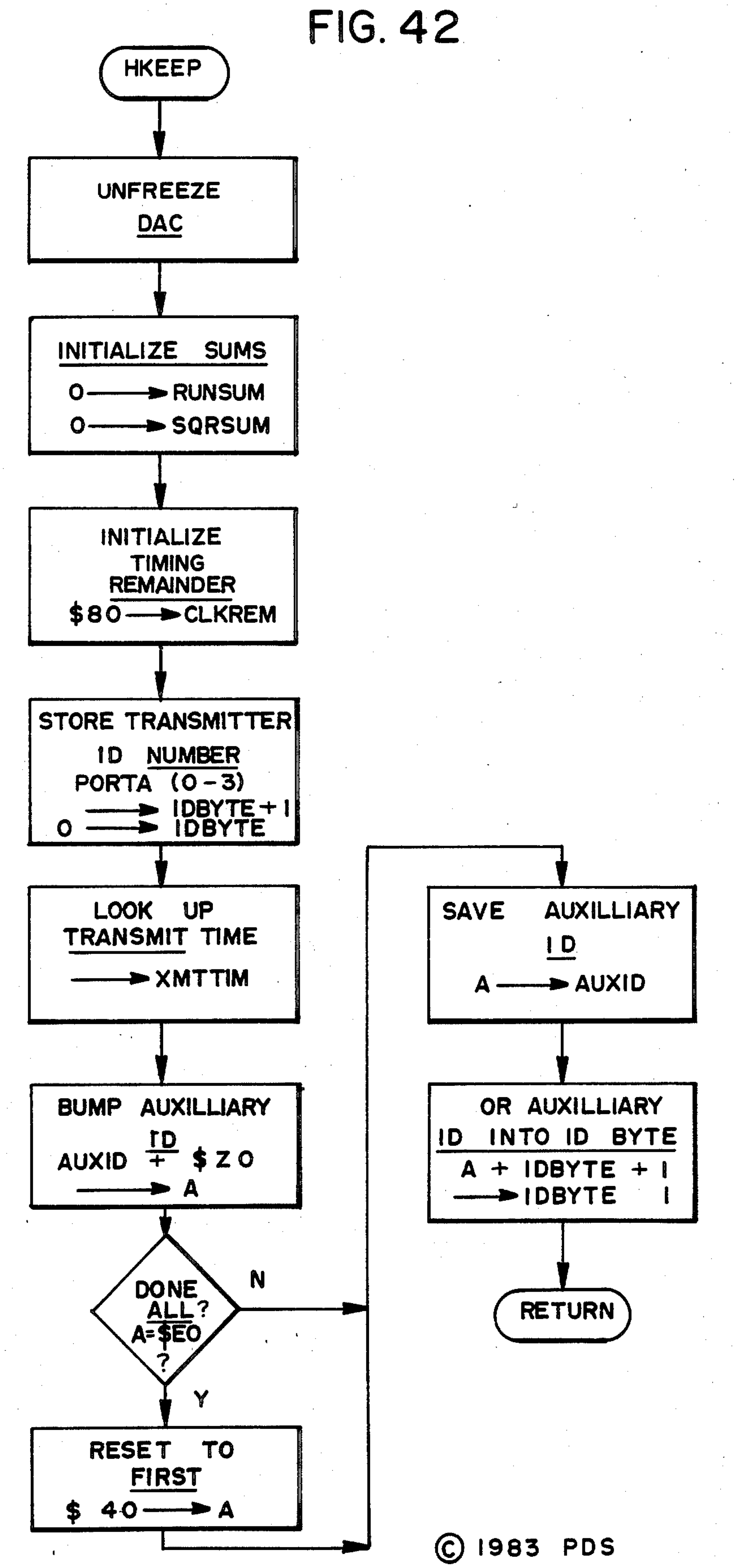

Perform Housekeeping (HKEEP) FIG. 42

PURPOSE: HKEEP performs cycle initialization,
ENTRY POINT: HKEEP
CALLING SEQUENCE: JSR HKEEP Return
REGISTER STATUS: A, X not preserved.
TABLES USED: TIMTBL-Timing Interval Table
CALLED BY: MAIN
CALLS: None.
EXCEPTION CONDITIONS: None.
DESCRIPTION:

HKEEP releases the DAC tracking register, clears the sum buffers, and resets the timing value remainder. The Donut I. D. number is read and stored in the data buffer, the cycle interval time is retrieved from the TIMTBL based on the I. D. number, and the auxilliary data I. D. number is bumped. A return is then executed.

Figure 43:
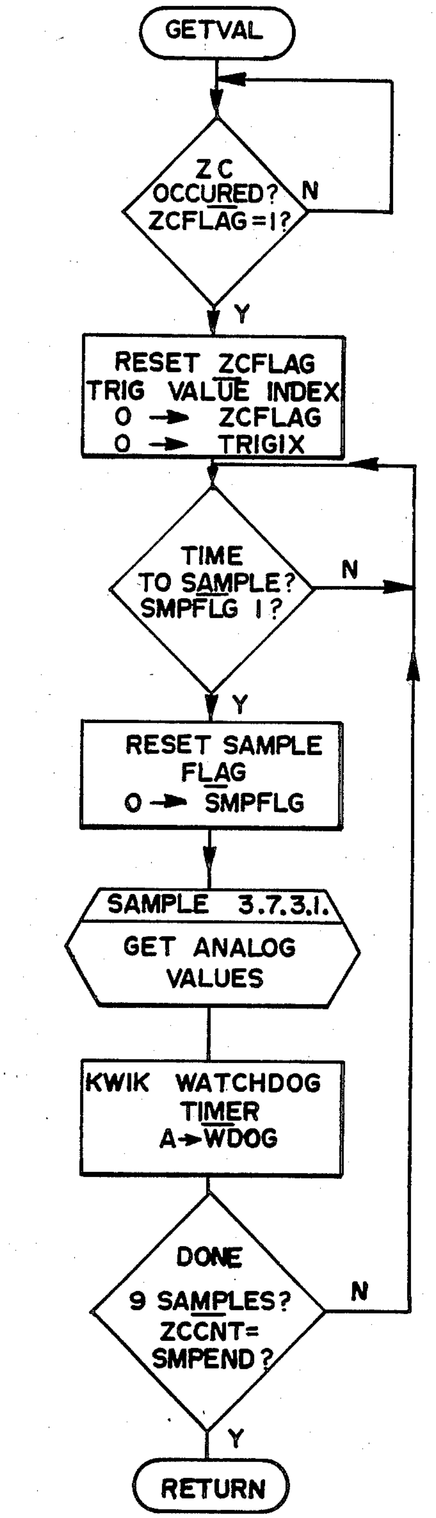

Collect All Data (GETVAL) FIG. 43

PURPOSE: GETVAL reads the nine data samples.
ENTRY POINT: GETVAL
CALLING SEQUENCE: JSR GETVAL Return
REGISTER STATUS: A, X not preserved.
TABLES USED: None.
CALLED BY: MAIN
CALLS: SAMPLE
EXCEPTION CONDITIONS: None.
DESCRIPTION:

GETVAL monitors the time-to-sample flag. When set, the flag is reset, SAMPLE is called to sample the analog values, and the watchdog timer is kicked. When the cycle has been repeated nine times, a return is executed.

Figure 44:
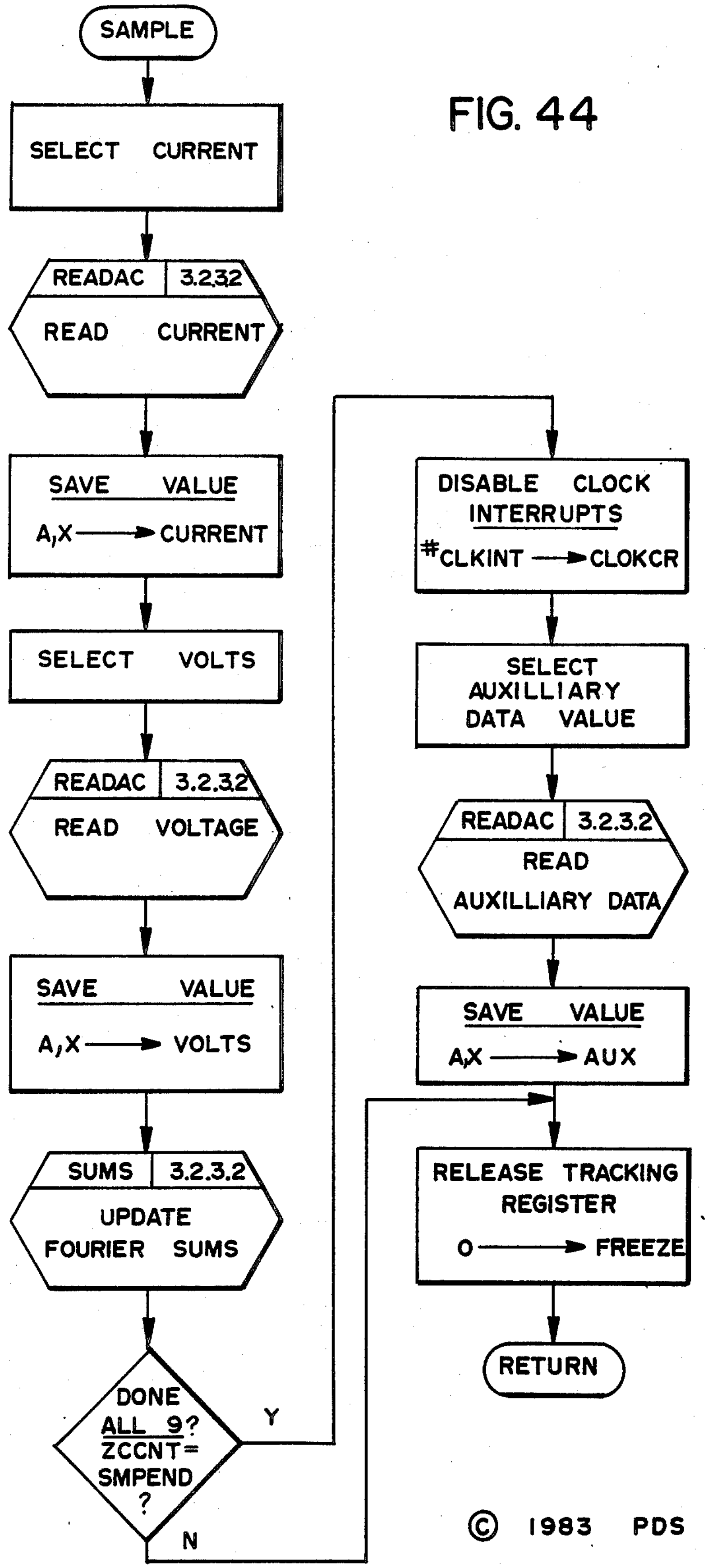

Read Analog Values (SAMPLE) FIG. 44

PURPOSE: SAMPLE reads and saves the analog values.
ENTRY POINT: SAMPLE
CALLING SEQUENCE: JSR SAMPLE Return
REGISTER STATUS: A, X not preserved.
TABLES USED: None.
CALLED BY: GETVAL
CALLS: READAC, SUMS
EXCEPTION CONDITIONS: None.
DESCRIPTION:

SAMPLE calls READAC to read the current and voltage values and SUMS to update the Fourier sums. A return is executed unless all nine samples have been taken, in which case READAC is called to read the auxilliary data value. The analog value tracking register is released, and a return is executed.

Figure 45:
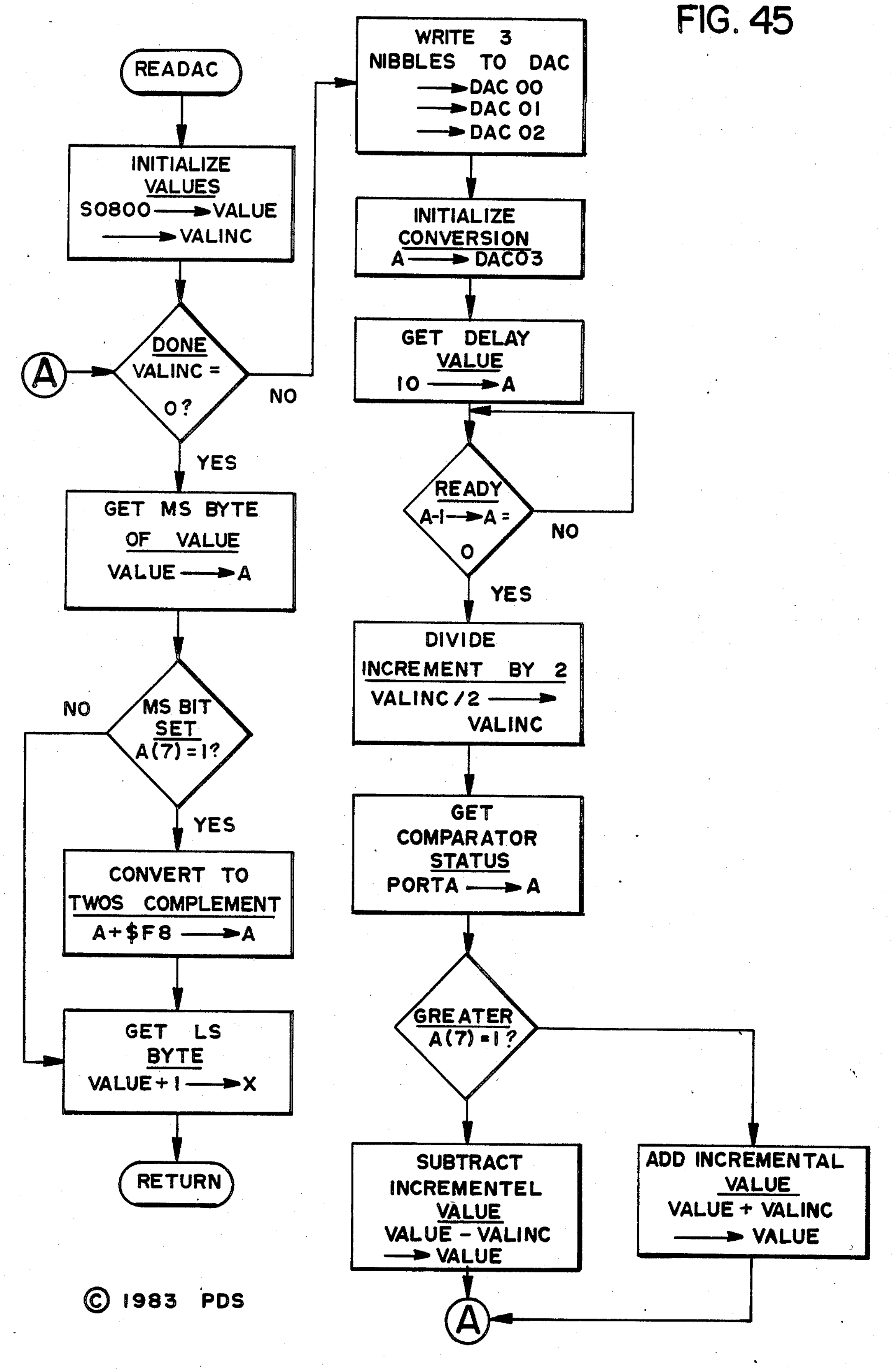

Read DAC/Comparator Circuit (READAC) FIG. 45

PURPOSE: READAC converts the analogs to digital values.
ENTRY POINT: READAC
CALLING SEQUENCE:
JSR READAC
Return
A, X=12 bit value
REGISTER STATUS: A, B, X not preserved.
TABLES USED: None
CALLED BY: SAMPLE
CALLS: None
EXCEPTION CONDITIONS: None
DESCRIPTION: READAC Initializes the trial and incremental values. The trial value is written to the DAC as three four-bit values, and the DAC conversion is initiated. A short register-decrement delay loop allows the DAC time to convert, the incremental value is divided by two, and the comparator input is checked. The incremental value is subtracted/added to the test value if the test value was higher/lower than the actual analog value.

When the incremental value reaches zero, the value is converted to true two's complement and a return is executed with the value in A, X.

Figure 46:
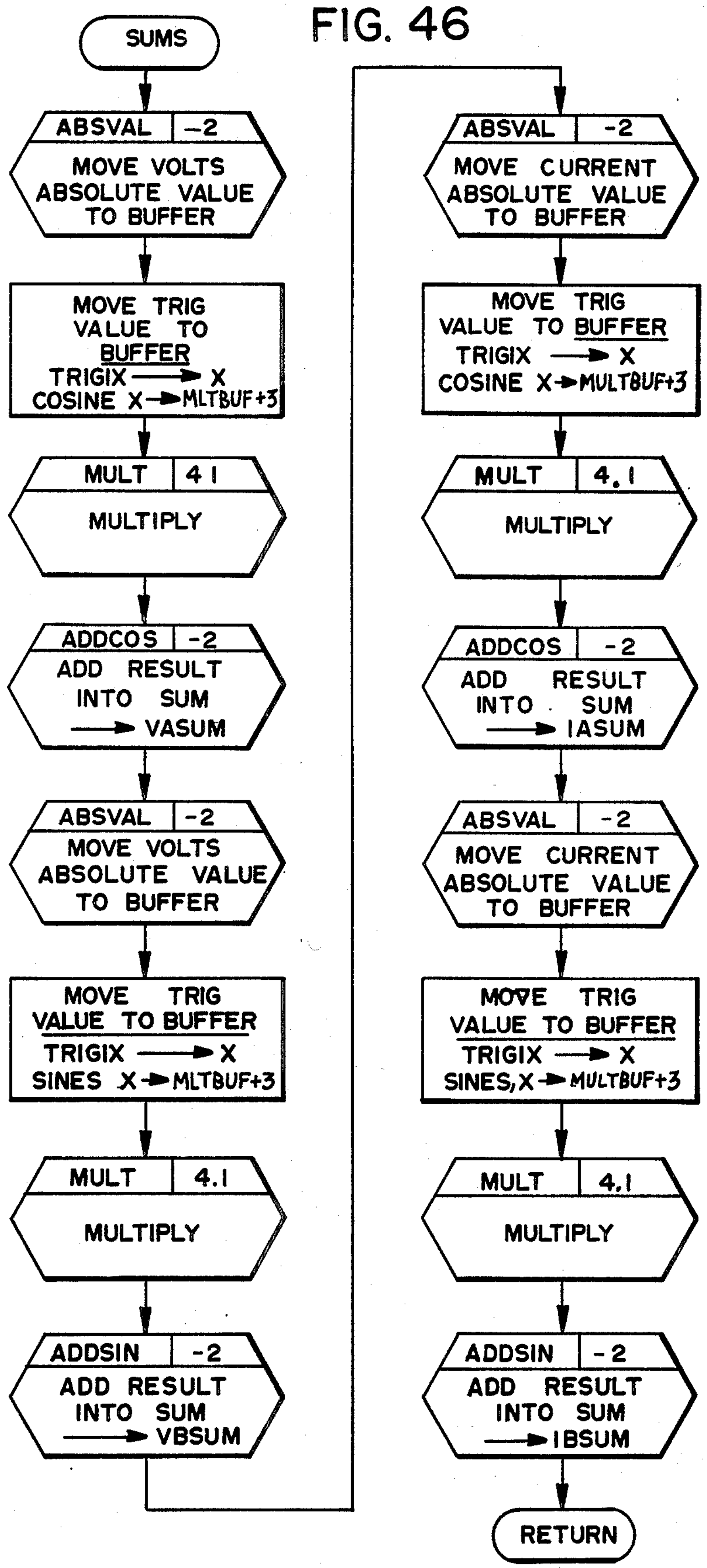

Maintain Fourier Sums (SUMS) FIG. 46

Figure 47:
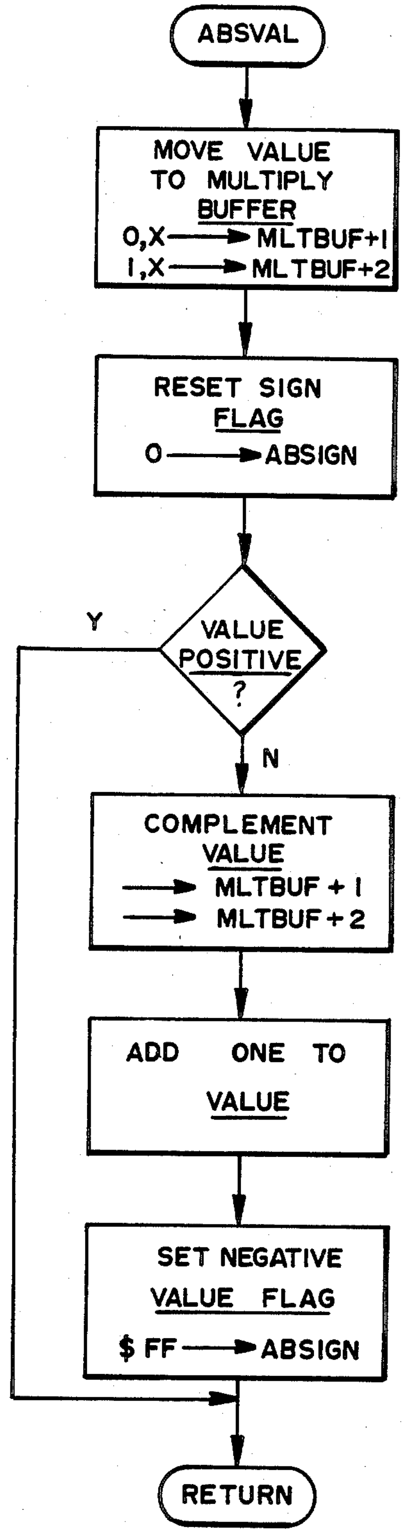
Figure 48:
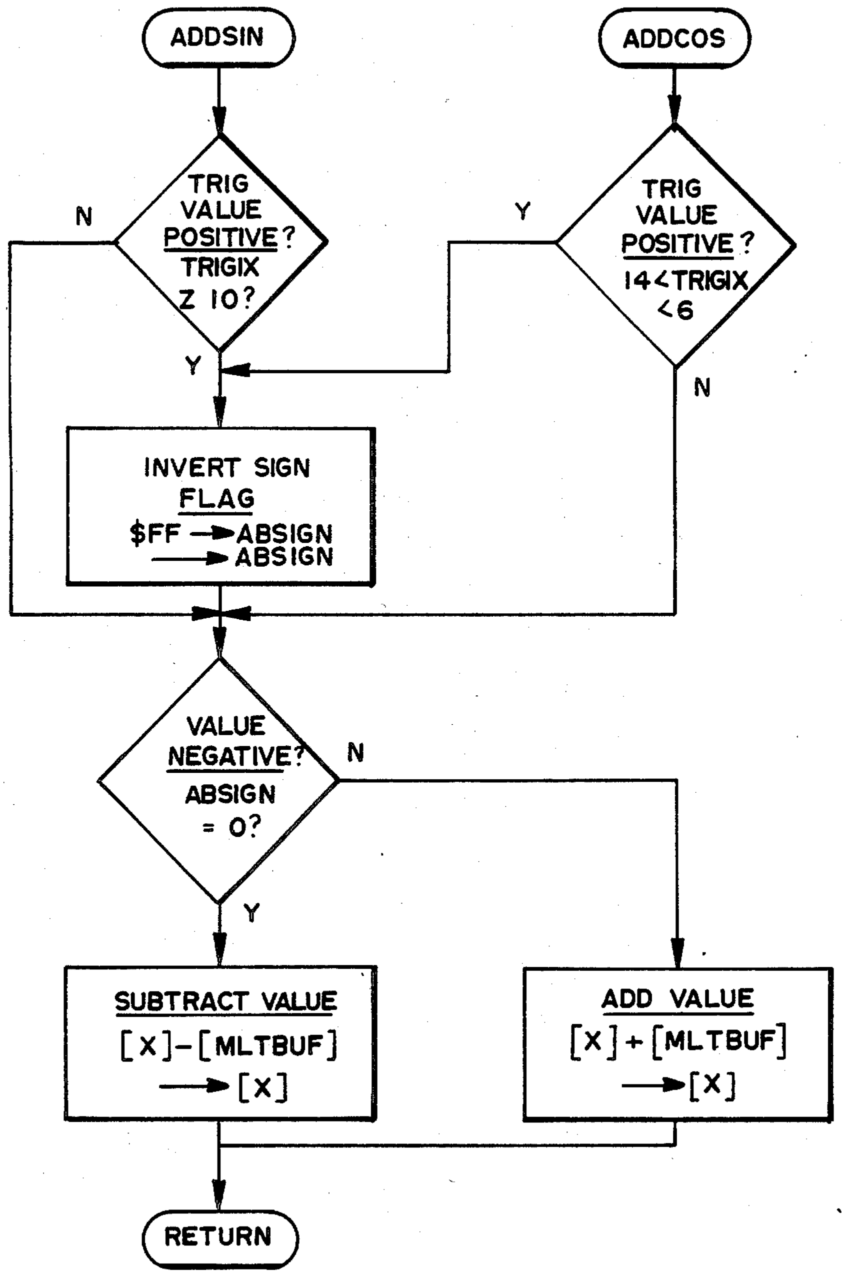

PURPOSE: SUMS multiplies the analog values by the trigonometric values of the phase angles and sums the results.
ENTRY POINT: SUMS CALLING SEQUENCE: JSR SUMS Return
REGISTER STATUS: A, X not preserved.
TABLES USED:
COSINE—Table of cosine values
SINES—Table of sine values
CALLED BY: GETVAL
CALLS: MULT Local subroutines: ABSVAL, ADDCOS/ADDSIN—FIGS. 47 & 48
EXCEPTION CONDITIONS: None.
DESCRIPTION:

SUMS calls ABSVAL to move the absolute value of the analog value to the multiply buffer, moves the trig value to the buffer, and calls MULT to perform the multiplication. ADDCOS or ADDSIN is called to add the product to the appropriate sum buffer. This cycle is repeated for the sine and cosine values for both voltage and current.

Figure 49:
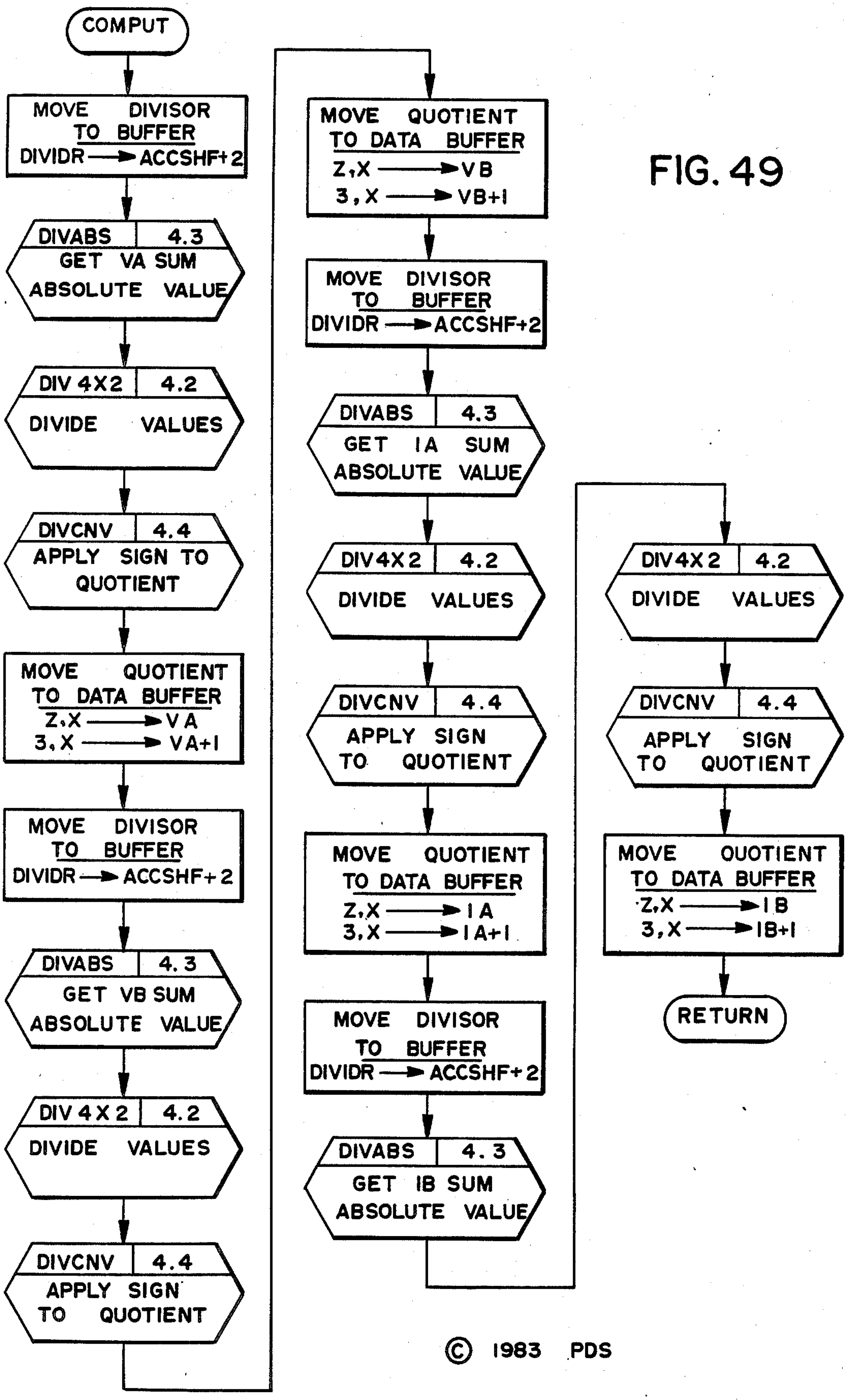

Perform Data Manipulations (COMPUT) FIG. 49

PURPOSE: COMPUT performs necessary scaling functions.
ENTRY POINT: COMPUT
CALLING SEQUENCE:
JSR COMPUT
Return
REGISTER STATUS: A, X not preserved.
TABLES USED: None.
CALLED BY: MAIN
CALLS: DIVABS, DIV4X2, DIVCNV
EXCEPTION CONDITIONS: None.
DESCRIPTION:

COMPUT moves the scale factor to the divide buffer, calls DIVABS to move the absolute value of the fourier sum to the buffer, and calls DIV4X2 to perform the division. DIVCNV is called to apply the proper sign to the quotient, and the value is moved to the data buffer. This cycle is repeated for each of the four fourier sums, and a return is executed.

Figure 50:
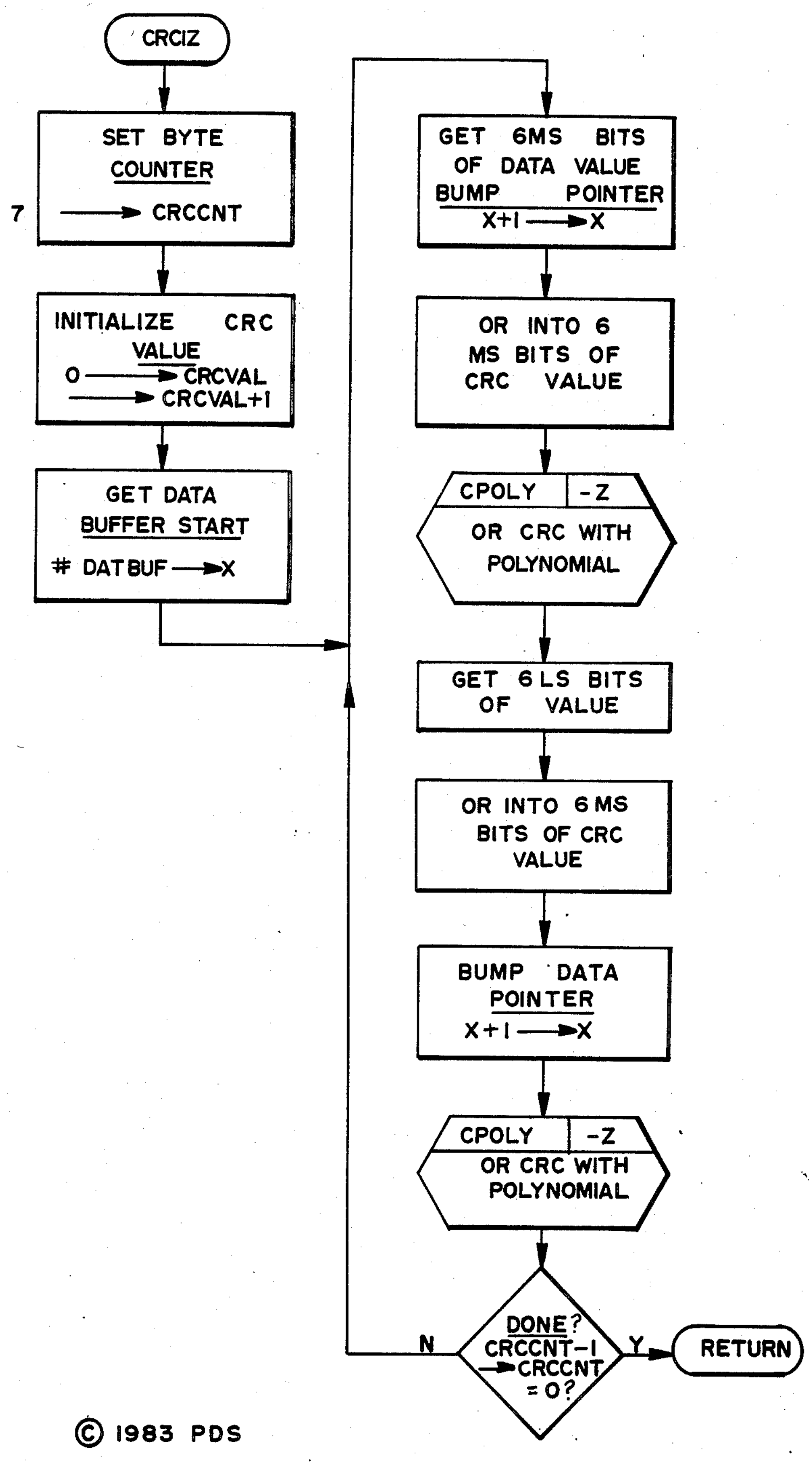

Compute Cyclic Redundancy Check Value (CRC12) FIG. 50

Figure 51:
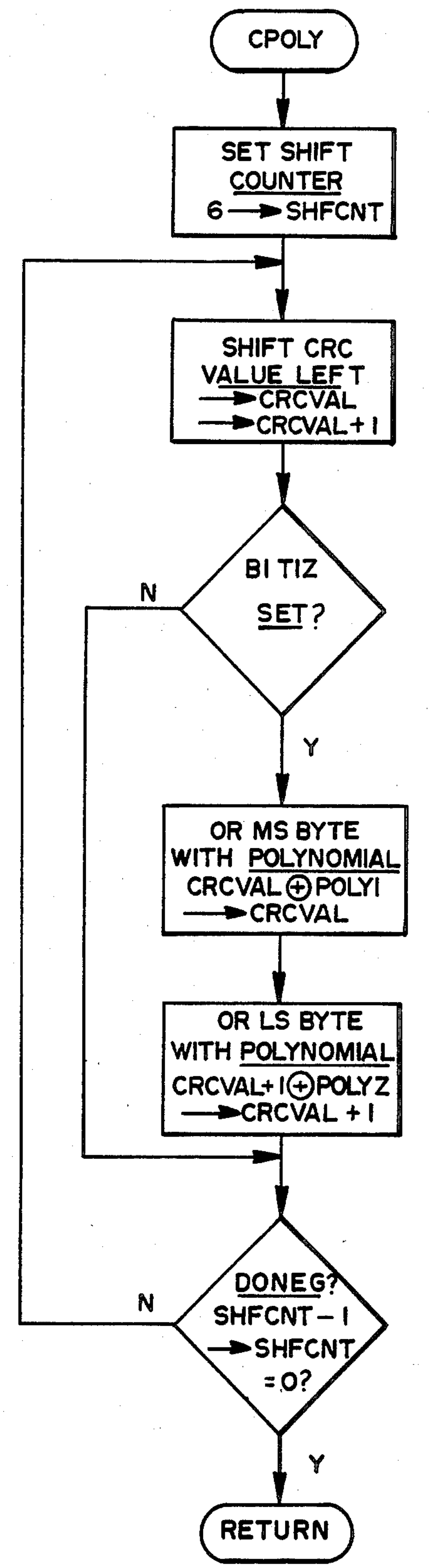

PURPOSE: CRC12 computes the CRC value.
ENTRY POINT: CRC12
CALLING SEQUENCE:
JSR CRC12
Return
REGISTER STATUS: A, X not preserved.
TABLES USED: None.
CALLED BY: MAIN
CALLS: Local Subroutine: CPOLY—FIG. 51
EXCEPTION CONDITIONS: None.
DESCRIPTION:

CRC12 sets a counter to the number of bytes in the data buffer, initializes the CRC value, and gets the data buffer start address. Each 6 bit group of data is exclusively "or" ed into the CRC value, and CPOLY is called to "or" the resulting value with the polynomial value. When all bits have been processed, a return is executed.

CPOLY sets a shift counter for 6 bits. The CRC value is shifted left one bit. If the bit shifted out in a one, the CRC value is exclusively "or" ed with the polynomial value. When 6 bits have been shifted, a return is executed.

Figure 52:
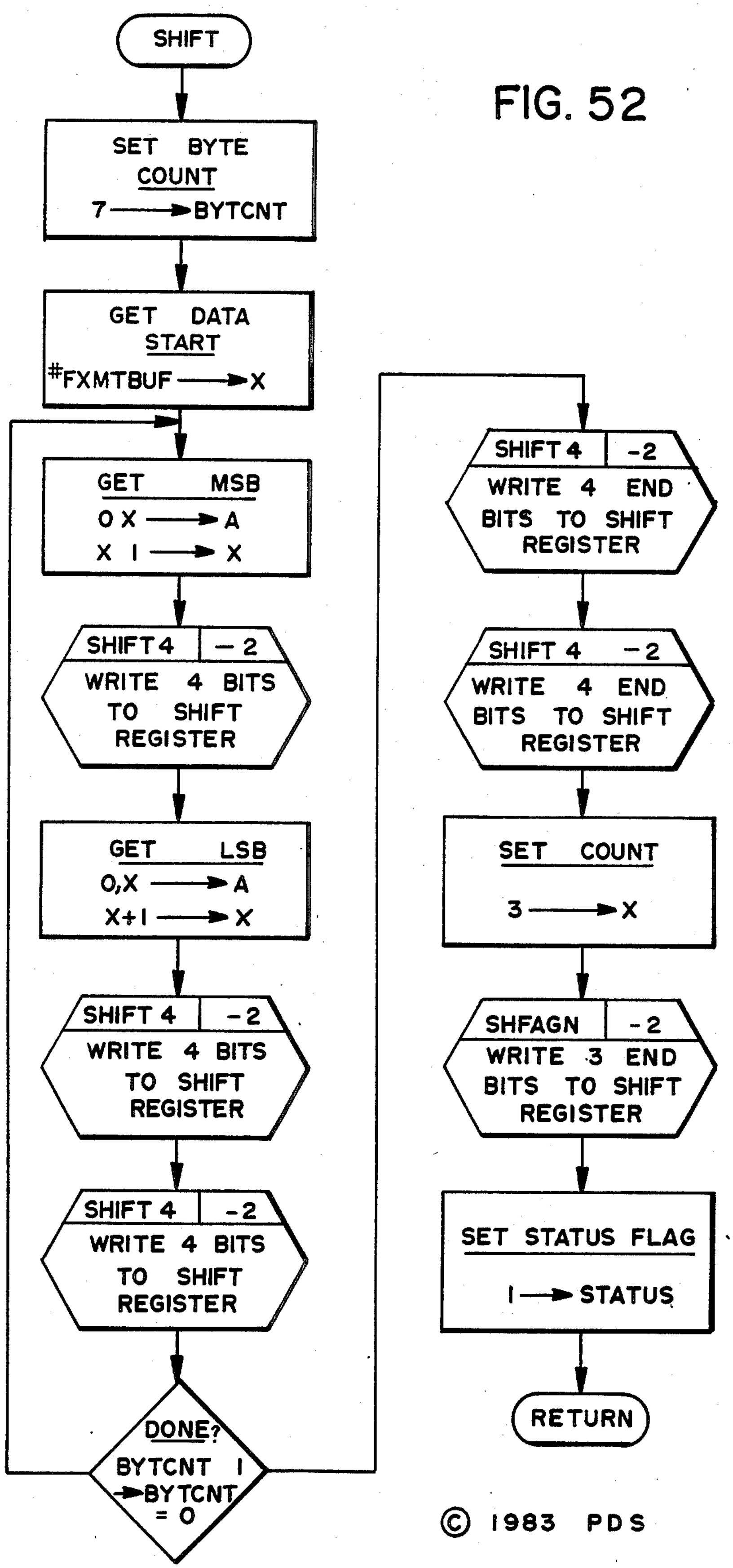

Load Shift Register (SHIFT) FIG. 52

Figure 53:
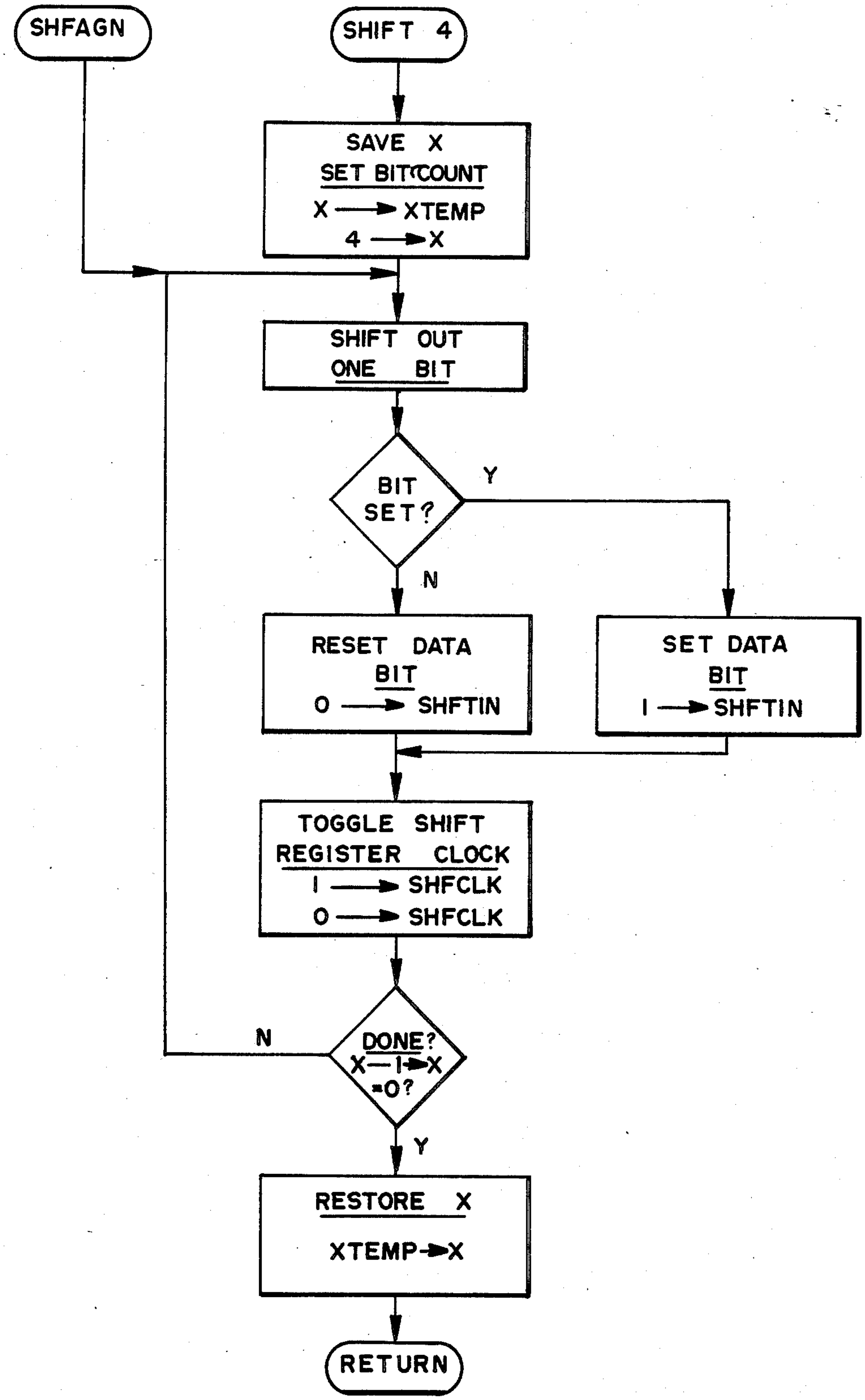

PURPOSE: SHIFT loads the shift register with the data to be transmitted.
ENTRY POINT: SHIFT
CALLING SEQUENCE:
JSR SHIFT
Return
REGISTER STATUS: A, X not preserved.
TABLES USED: None.
CALLED BY: MAIN
CALLS: Local Subroutine: SHIFT4/SHFAGN—FIG. 53
EXCEPTION CONDITIONS: None.
DESCRIPTION:

SHIFT calls SHIFT4 successively to shift four bits of data at a time into the shift register, starting with the most significant bit. When all twelve-bit values have been shifted in, SHIFT4 and SHFAGN are called to fill the shift register with trailing zeroes and a return is executed.

SHIFT4 shifts the four data bits in A(0-3) into the hardware shift register by setting/resetting the data bit and toggling the register clock bit. When four bits have been shifted, a return is executed.

SHFAGN is a special entry to SHIFT4 which allows the desired bit count (1-4) to be passed in X.

Figure 54:
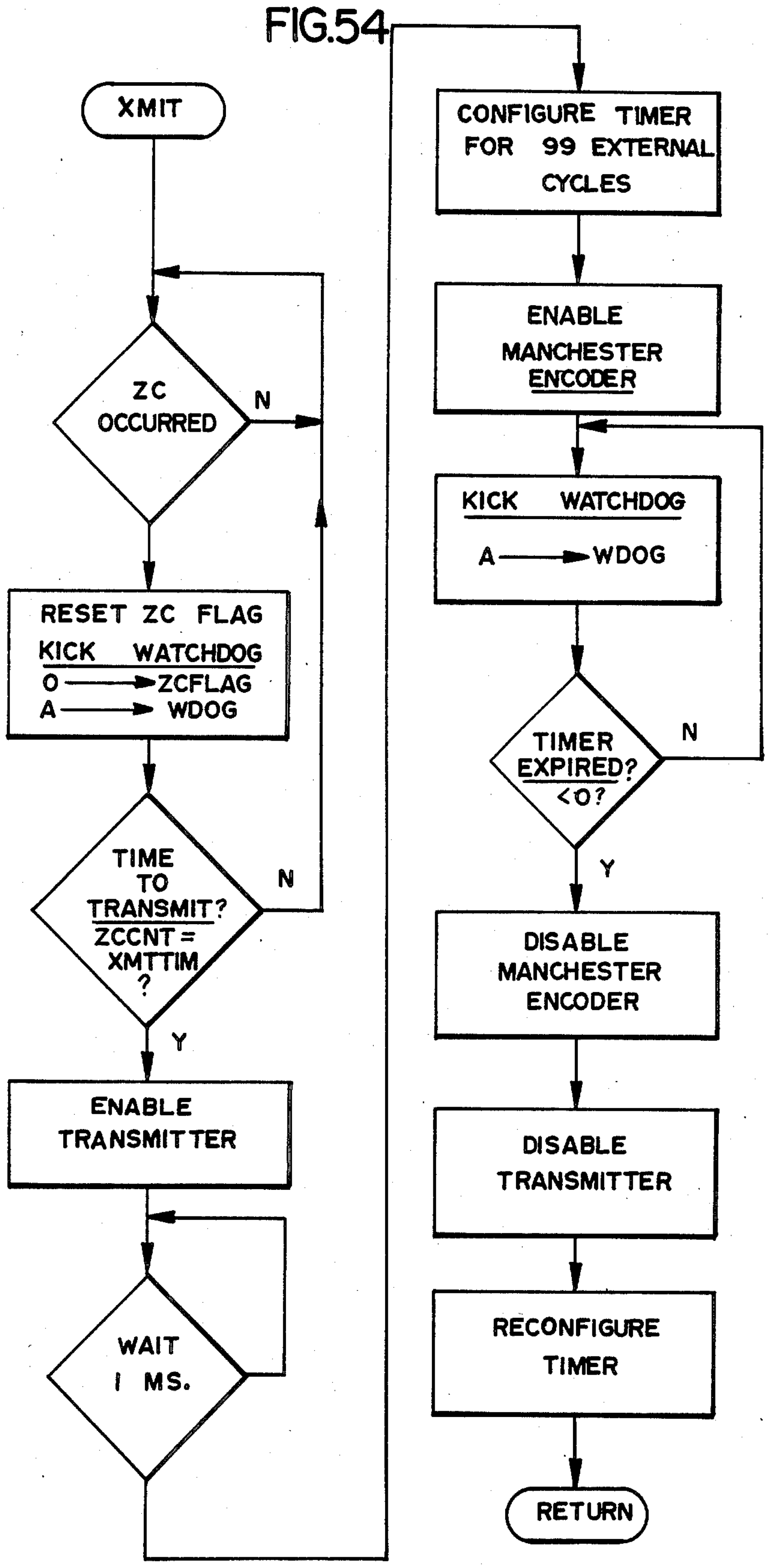

Transmit Data (XMIT) FIG. 54

PURPOSE: XMIT transmits the contents of the shift register to the ground station.
ENTRY POINT: XMIT
CALLING SEQUENCE:
JSR XMIT
Return
REGISTER STATUS: A, X not preserved.
TABLES USED: None.
CALLED BY: MAIN
CALLS: None.
EXCEPTION CONDITIONS: None.
DESCRIPTION:

XMIT monitors the zero-crossing count. When the count reaches the time-to-transmit count, the transmitter is enabled, and a one millisecond warmup delay is executed. The processor clock is initialized for external oscillator, and the clock value is set to the bit count plus shut-off delay. The Manchester encoder is enabled and the watchdog timer is kicked while monitoring the clock. When all data has been sent (clock=0), the Manchester encoder and transmitter are disabled, the timer is reconfigured for its internal oscillator, and a return is executed.

Figure 55:
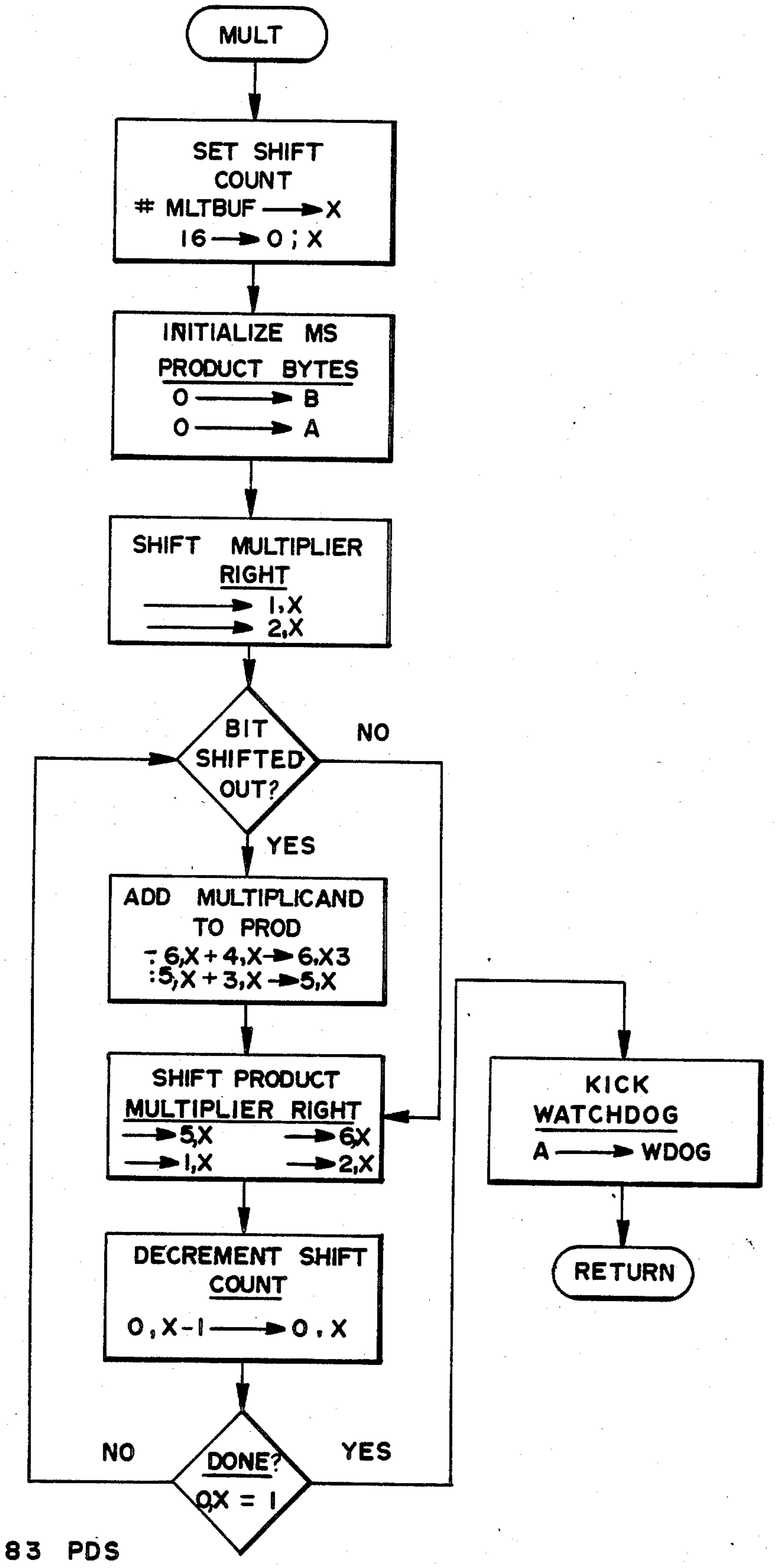

Double Precision Multiply (MULT) FIG. 55

Purpose: MULT performs a double precision multiply.
ENTRY POINT: MULT
CALLING SEQUENCE:
MLTBUF+1,2=Multiplier
MLTBUF+3,4=Multiplicand
JSR MULT2
Return
MLTBUF+5,6,1,2=Product
REGISTER STATUS: A, X not preserved.
TABLES USED: None
CALLED BY: COMPUT, SUMS
CALLS: None
EXCEPTION CONDITIONS: None
DESCRIPTION:

MULT performs a double precision multiplication by shifting a bit out of the multiplier, successively adding the multiplicand to the product, and shifting the product. When finished, the watchdog timer is kicked, and a return is executed.

Figure 56:
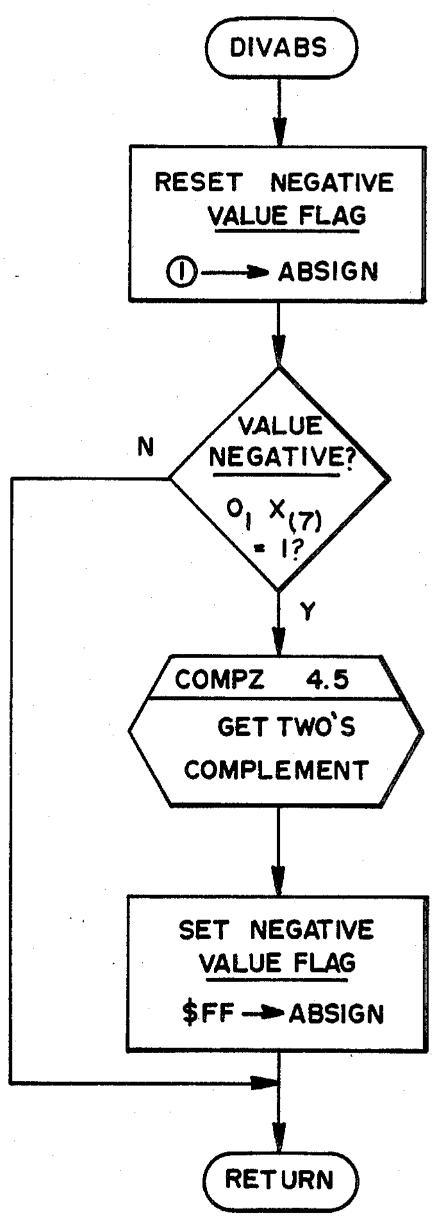

Get Absolute Value (DIVABS) FIG. 56

PURPOSE: DIVABS gets the absolute value of the value at X and sets the sign flag.
ENTRY POINT: DIVABS
CALLING SEQUENCE:
X=Value Address
JSR DIVABS
Return
ABSIGN=Sign flag ($FF=Negative)
REGISTER STATUS: X is preserved.
TABLES USED: None.
CALLED BY: COMPUT
CALLS: COMP2
EXCEPTION CONDITIONS: None.
Description:

DIVABS resets the sign flag and tests the most significant bit of the value at X. If set, COMP2 is called to find the two's complement of the four byte value, and the sign flag is set to $FF. A return is then executed.

Figure 57:
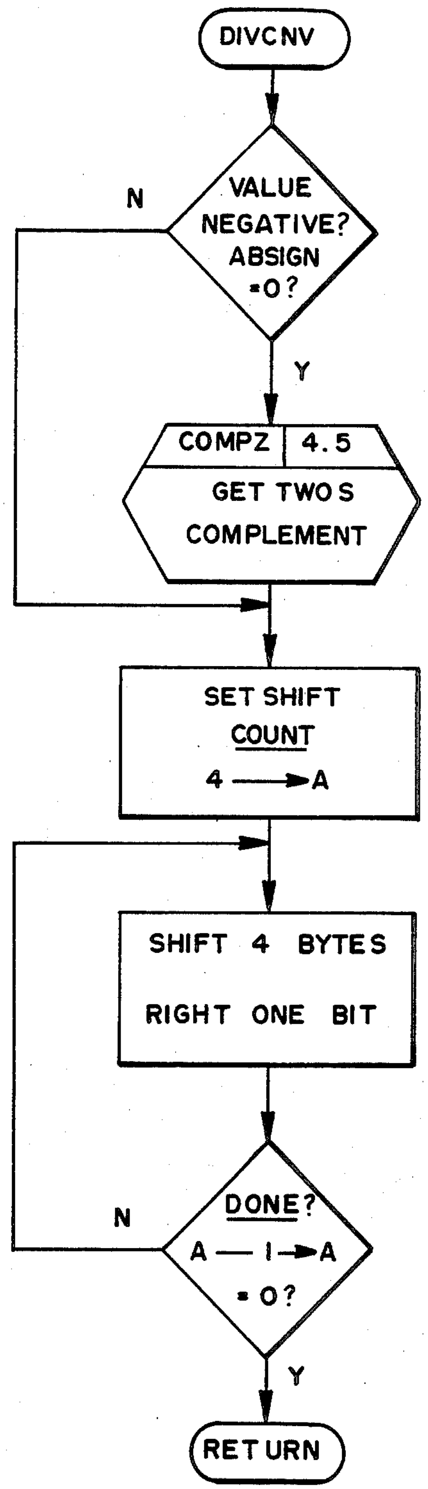

Convert Scaled Value (DIVCNV) FIG. 57

PURPOSE: DIVCNV applies the sign and divides the value by sixteen.
ENTRY POINT: DIVCNV
CALLING SEQUENCE:
X=Value Address
JSR DIVCNV
Return
REGISTER STATUS: A, X not preserved.
TABLES USED: None.
CALLED BY: COMPUT
CALLS: COMP2
EXCEPTION CONDITIONS: None.
DESCRIPTION:

DIVCNV tests the sign flag, ABSIGN. If non-zero, COMP2 is called to find the two's complement of the four byte value at X. The value is then shifted right four bits, and a return is executed.

Figure 58:
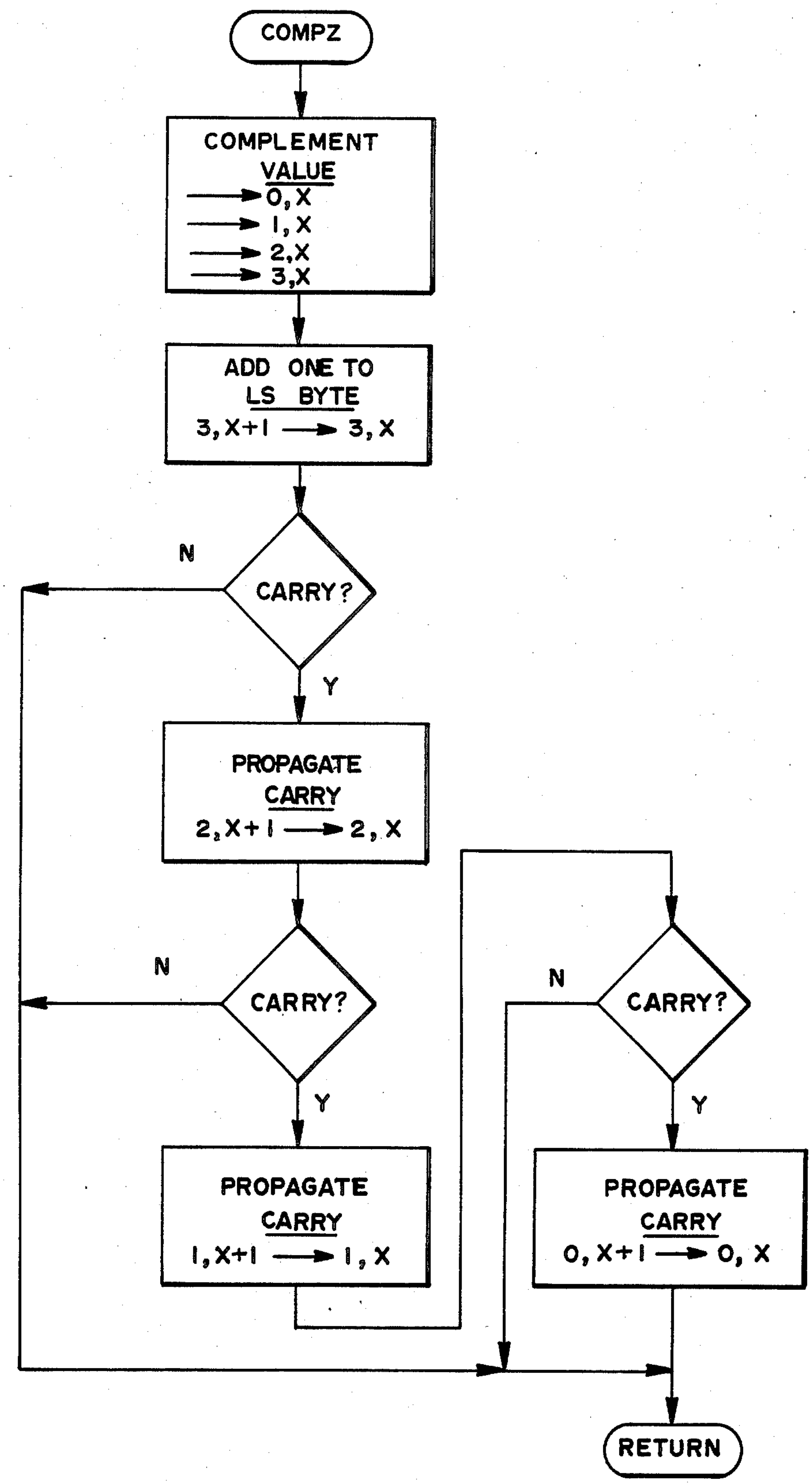

Find Two's Complement Value (COMP2) FIG. 58

PURPOSE: COMP2 finds the two's complement value of the value at X.
ENTRY POINT: COMP2
CALLING SEQUENCE:
X=Value Address
JSR COMP2
Return
REGISTER STATUS: X is Preserved.
TABLES USED: None.
CALLED BY: DIVABS, DIVCNV
CALLS: None.
EXCEPTION CONDITIONS: None.
DESCRIPTION:

COMP2 complements each byte of the four byte value at X, adds one to the least significant byte, and propagates the carry through the remaining bytes.

Figure 59:
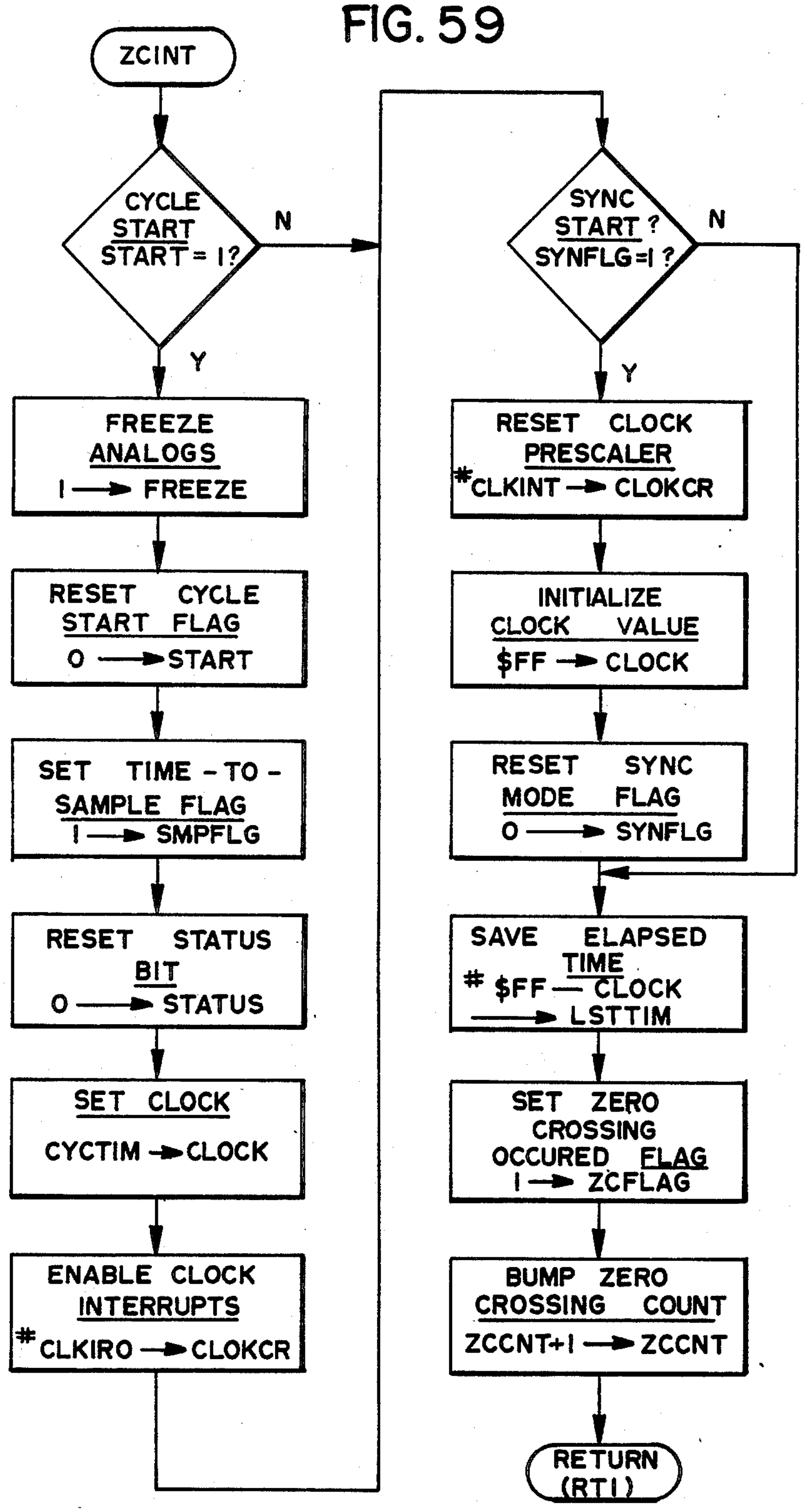

Process Zero Crossing Interrupts (ZCINT) FIG. 59

PURPOSE: ZCINT processes zero crossing interrupts.
ENTRY POINT: ZCINT
CALLING SEQUENCE:
From IRQ Vector
Return (RTI)
REGISTER STATUS: A, X are preserved.
TABLES USED: None.
CALLED BY: Hardware IRQ Vector
CALLS: None.
EXCEPTION CONDITIONS: None.
DESCRIPTION:

ZCINT tests the cycle start flag. If set, the analog tracking register is frozen, the cycle start flag is reset, the time-to-sample flag is set, and the clock is set to the 1-1/9 cycle time.

If the start synchronize flag is set, the clock prescaler is reset, the colck is reset to maximum value, and the start synchronize flag is reset.

The elapsed clock time is saved as the last cycle time, the zero-crossing-occurred flag is set, the zero-crossing count is bumped, and a return is executed.

Figure 60:
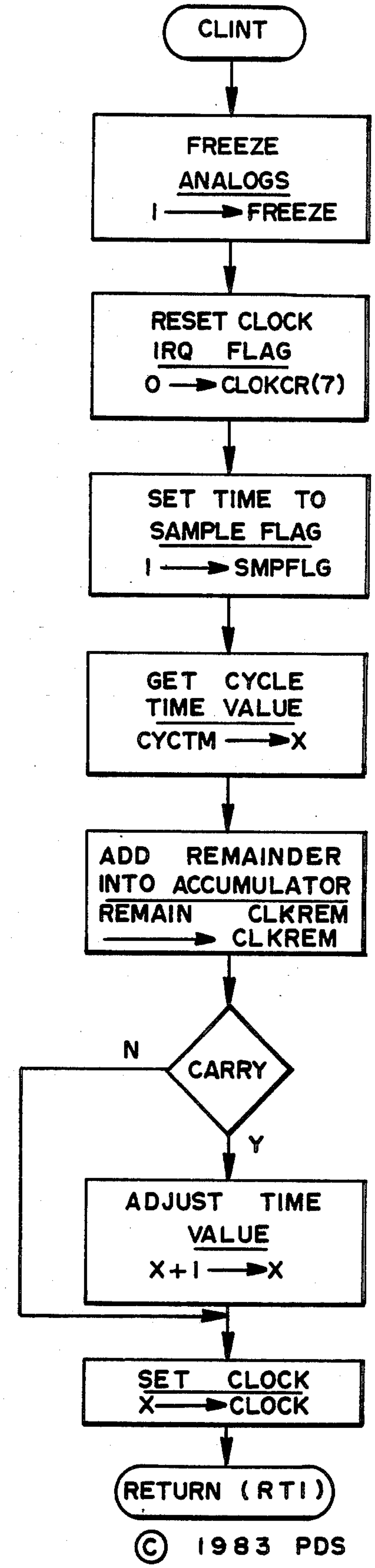

Process Clock Interrupt (CLINT) FIG. 60

PURPOSE: CLINT processes clock interrupts.
ENTRY POINT: CLINT
CALLING SEQUENCE:
From IRQ Vector
Return (RTI)
REGISTER STATUS: A, X are preserved.
TABLES USED: None.
CALLED BY: Hardware Clock IRQ Vector
CALLS: None.
EXCEPTION CONDITIONS: None.
DESCRIPTION:

CLINT freezes the analog tracking register, resets the clock IRQ flag, and sets the time-to-sample flag. The cycle time remainder value is added into the time accumulator. If a carry results, the 1-1/9 cycle time is increased by one. The clock is reset to the cycle time, and a return is executed.

Figure 61:
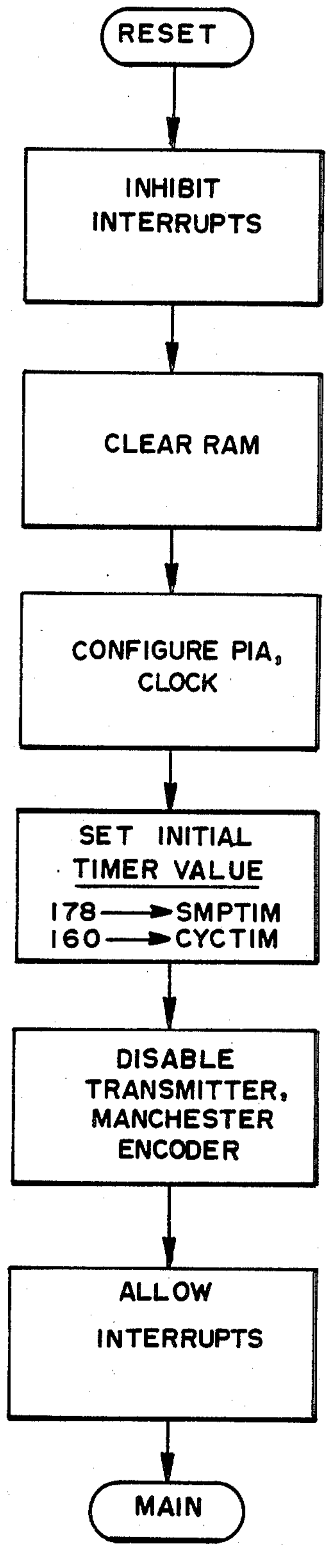

Perform Power-On Reset (RESET) FIG. 61

PURPOSE: RESET performs power-on initialization.
ENTRY POINT: RESET
CALLING SEQUENCE: From Hardware Reset Vector JMP MAIN
REGISTER STATUS: A, X not preserved.
TABLES USED: None.
CALLED BY: Hardware Reset Vector
CALLS: MAIN
EXCEPTION CONDITIONS: None.
DESCRIPTION:

RESET inhibits interrupts, clears RAM to zeros, and initializes the internal clock and PIA's. The initial time values are initialized, and the Manchester encoder and transmitter are disabled. Interrupts are reallowed, and a jump to the background processing loop is executed.

The Receiver

The receiver 24 at a substation 34 as shown in FIG. 4 receives data from fifteen donuts.

Figure 62:
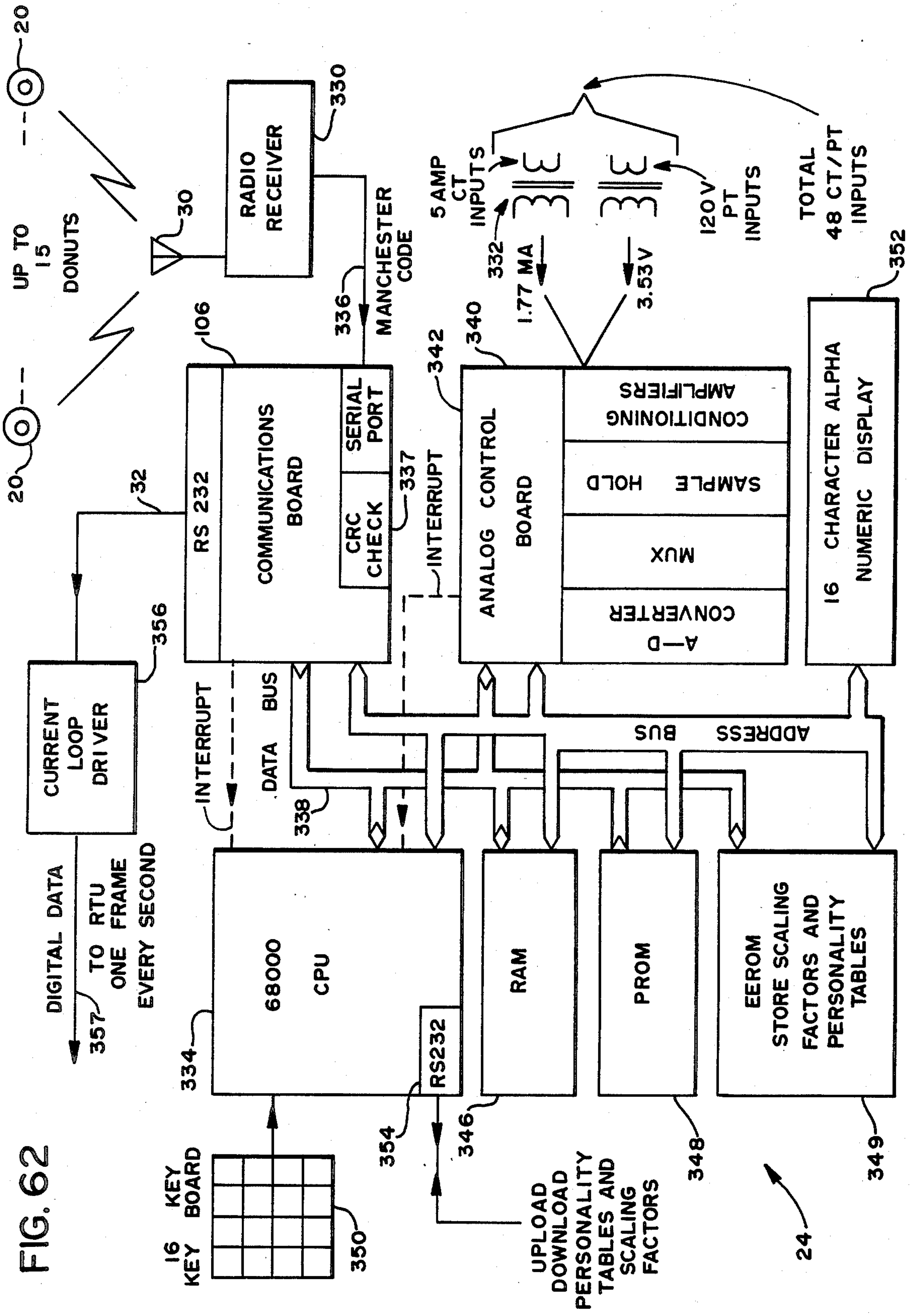
FIG. 62 is an overall block diagram of a ground station receiver remote terminal interface according to the invention.

In FIG. 62 there is shown an overall circuit block diagram for such a receiver 24.

In addition to receiving tramsmissions from up to fifteen donuts 20, via its antenna 30 and radio receiver 330, the receiver 24 can also receive analog data from up to 48 current transformers and potential transformers generally indicated at 332. The receiver 24 is operated by a type 68000 Central Processing Unit 334. The Manchester coded transmissions from the donuts 20 received by the receiver 330 are transmitted via line 336 to a communication board 106 and thence on data bus 338 to the 68000 CPU 334. The transformer inputs 332 are conditioned in analog board 340 comprising conditioning amplifiers, sample and hold, multiplexing and analog-to-digital conversion circuits under control of analog control board 342. The digitized data is supplied on data bus 338 to the CPU 334. The CPU 334 is provided with a random access memory 346, a programmable read only memory 348 for storing its program, and an electrically erasable read only memory 349 for storing the scaling factors and personality tables.

The central processing unit 334 may be provided with a keyboard 350 and a 16 character single line display 352. It is also provided with an RS232 port 354 for loading and unloading so called personality tables comprising scaling factors and the like for the donuts 20 and the transformer inputs 332. The receiver 24 which is sometimes called herein a remote terminal unit interface, supplies data to a remote terminal unit via current loop 356 from an RS232 communications port on communications board 106.

The Receiver Software

Copyright ©1983,
Product Development Services, Incorporated (PDS)

Functional Specification of the Receiver

Figure 5:
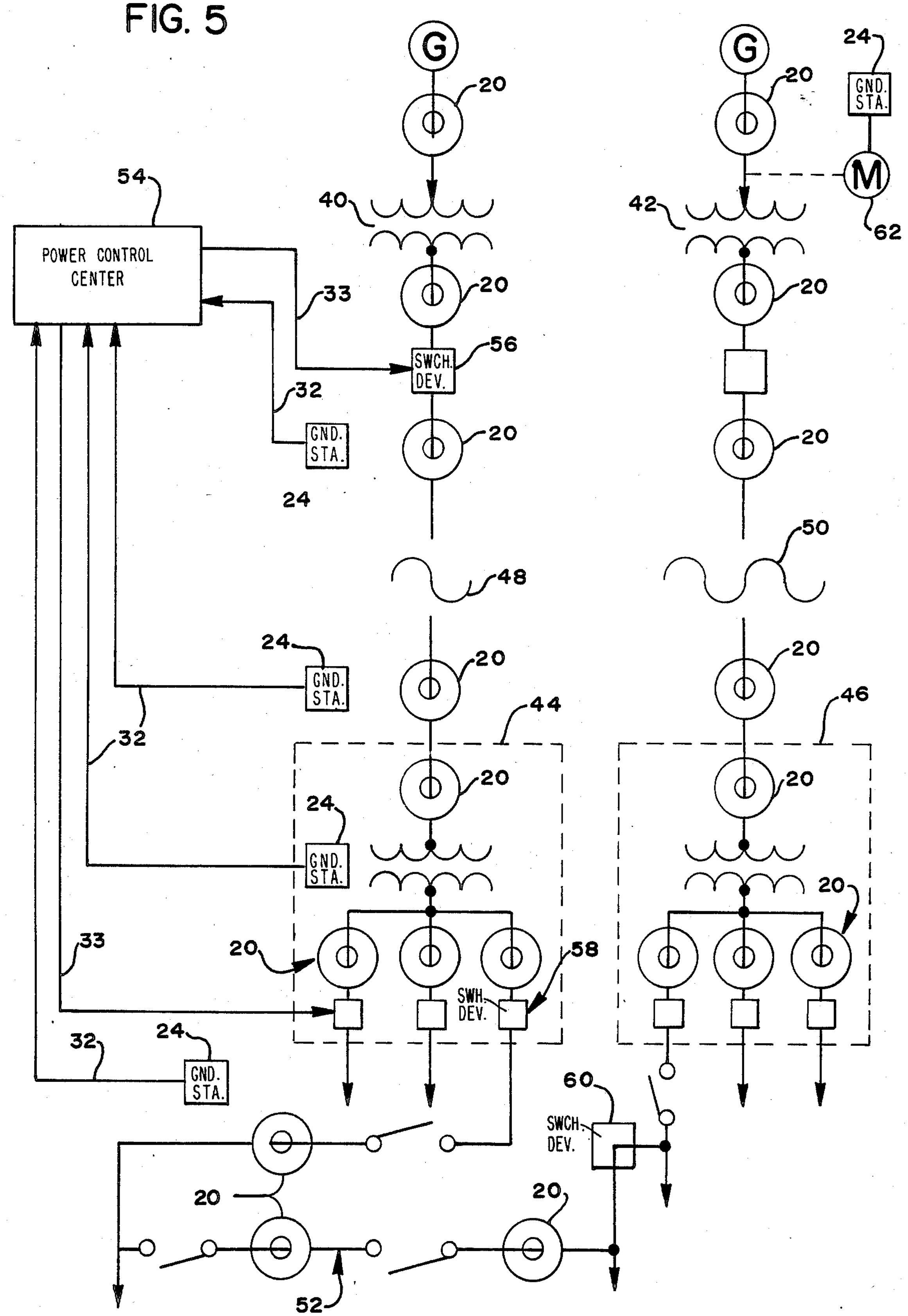
FIG. 5 is a diagrammatic schematic view of a power deliver system monitored and controlled according to the system of the invention.

The remote terminal unit may be a Moore MPS-9000-S manufactured by Moore Systems, Inc., 1730 Technology Drive, San Jose, Calif. 95110, modified to receive and store a table of digital data each second sent on line 357. Unmodified, the MPS-900-S receives inputs from potential and current transformers, temperature sensors and the like at a substation, and converts these measurements to a digital table for transmission to a power control center 54 (FIG. 5) or for use in local substation control.

Simultaneous transmissions from two or more donuts 20 are ignored since the garbled message received will not produce a check sum (CRC) that matches the check sum as received. The CRC check portion of the circuit is shown at 337.

Overview

An integral part of commercial power generation is monitoring the amount of power delivered to customers and, if necessary, purchase of power from other companies during peak demand periods. It is advantageous to the power company to be able to make measurements at remote substations, and be able to relay all the measurements to a central point for monitoring. Because of the large voltages and currents involved in commercial power distribution, direct measurement is not feasible. Instead, these values are scaled down to easily measured values through the use of Potential Transformers (PT's) for voltage, and Current Transformers (CT's) for current. Recently, we have developed another means for monitoring power line voltage and current. This is the Remote Line Monitor, a donut shaped (hence the nickname "donut") device which clamps around the power line itself, and transmits the measured values to a radio receiver on the ground.

The Remote Terminal Interface (RTI) monitors power line voltage, current, and temperature by means of Potential Transformers (PT's), Current Transformers (CT's), and temperature transducers respectively. These parameters may also be obtained from Remote Line Monitors, or "donuts" which are attached to the power line themselves. It is the job of the RTI to receive this data, and in the case of PT's, CT's and temperature transducers, digitize and analyze the data. This data is then used to calculate desired output parameters which include voltage, current, temperature, frequency, kilowatt hours, watts, va, and vars, (the last three being measured of power). These values are then sent to the Remote Terminal Unit (RTU), and are updated once per second.

Data obtained from PT's, CT's, and temperature transducers must be digitized by the RTI before it can be used. Data obtained in this way is termed "analog" data. Donuts, on the other hand, send their data to the RTI in digital form. For this reason, input received from donuts is said to be "digital" input. Each donut supplies three parameters, (voltage, current, and temperature) thus it is equivalent to three analog inputs.

Virtually all commercial power systems in the United States today are three phrase systems. There are two configurations used: the 3 conductor or delta configuration, and the 4 conductor or wye configuration. To calculate power (va, vars) it is necessary to measure the voltage and current in all but one of the conductors. That one conductor is used as a reference point for all voltages measured. For a delta configuration, voltage and current in two of the three conductors must be measured (only two phases). This is referred to as the two wattmeter method. It is desirable to use the two wattmeter method whenever possible because only 2 PT's and CT's are required. For a wye configuration however, voltage and current must be measured in all 3 phases. (The fourth conductor is an explicit reference point. No such reference is provide in the delta configuration, so one of the phases must be used instead.) This latter method is known as the three wattmeter method.

The program listings for the receiver remote terminal interface are found in Appendix B. They comprise a number of subroutines on separately numbered sets of pages. The subroutines are in alphabetical order in Appendix B. At the top of page 1 of each subroutine the name of the subroutine is given, (e.g., ACIA at the top of the first page of Appendix B). The routine INIT initializes the computer and begins all tasks.

Appendix C comprises equates and macro definitions used in the system. Those headed STCEQU are for the system timing controller (an AM9513 chip). Those headed XECEQU are for the Executive program EXEC in Appendix B. Those headed RTIEQU are unique to the remote terminal interface and used throughout the programs of Appendix B.

GENERAL

A. Accuracy:

All calculations will be performed to 5 significant digits, representing an accuracy of 0.01% of full scale.

B. Input ranges:

Analog voltages and currents will be digitized to a 12 bit bipolar value ranging from −2048 to 2047.

Analog temperature will also be digitized to a 12 bit value which may or may not be bipolar.

All incoming digital data will be 12 bit values ranging from −2048 to 2047.

C. Number of inputs/outputs:

There shall be no more than 48 analog inputs and 15 digital inputs, and no more than 64 outputs. The analog inputs may monitor no more than 5 separate groups. (A group is defined as a circuit whose voltage is used for the frequency reference and power calculations). The donuts may be used to monitor a maximum of 5 additional groups.

D. Digital inputs:

Digital inputs, if used, will be supplied by 'donuts'. (see donut documentation)

E. Scaling Ranges:

1. Range of donut scaling factors will be from 0.5 to 2. In addition, the temperature value may also have an offset from −1024 to +1023 added to it.

2. Each PT has a scaling factor associated with it. This factor may range from 0.5 to 2.0.

3. Each CT has four scaling factors associated with it. These factors may each range from 0.5 to 2.0.

Data Acquisition:

A. Analog data input:

Analog data can come from three sources: Potential Transformers, (PT's), Current Transformers (CT's), or temperature transducers. The order of sampling will be determined by the outputs desired. (see Data Output) For voltage and current, 9 equally spaced samples must be taken over the space of a power line voltage cycle for the purposes of data analysis. (see Data Processing). For each voltage group (maximum of 5), a timer must be maintained to provide proper sampling intervals. This timer will be checked each sampling period and adjusted if necessary. The first phase of the voltage sampled will be used as the reference for checking the sampling period timer.

The input task knows it may begin sampling for a given group of inputs (cluster) when all of the input buffers connected with it are ready for input. The necessary data is collected from the A/D converter, and stored into appropriate input buffer. When this sampling is complete, the buffer is marked as unavailable for further input, and made available for Fourier analysis. The sampling timer is then adjusted if necessary, and the input task then proceeds to the next group of buffers in the Input Sequence Table.

B. Digital Input:

Input from the 'donuts' (if used) is already digitized and analyzed. It is ony necessary to apply a scaling factor (unique for each paramater from each donut) to the data, and convert it to 2's complement form. After this has been done, the data is in suitable form to calculate output data.

Donut input is not solicited, but rather is transmitted in a continuous stream to the RTI. When data is received from a donut, the processor is interrupted. The incoming data is then collected in a local buffer until a full message from a donut is received and validated. If the data is not valid, the transmission is ignored, and normal processing continues. If the buffer has already received valid input data for this sampling period, the transmission is ignored. Otherwise, the new data is moved from the receive buffer into the appropriate data buffer, the age count is cleared, is marked as waiting to be processed, and is made available for effective value calculations.

C. Analog Input Error Detection/Action:

None.

D. Digital Input Error Detection/Action:

A Cyclical Redundancy Check (CRC) word will be provided at the end of each donut transmission. If the CRC fails, the last good data transmitted by that particular donut will be reused. If the output task references the buffer before new data comes in, the old data will be reused. If a donut should fail more than N (to be defined) consecutive times, that donut will be considered to be bad, and its data will be reset to zero.

Data Processing

Analog data must be subjected to Fourier transformation to extract the sine and cosine components of the voltage and current prior to calculating output values. Also, if the input was a voltage, the sine and cosine components must be scaled by a factor between 0.5 and 2.0. This scaling factor is found in the Input Personality Table, and is unique to each input. If the input was a current, the effective value and the Fourier components must be scaled by one of four factors ranging between B 0.5 and 2.0. The scale factor used is dependent on the raw value of the effective current (Ieff). Each current input has a unique set of four factors. These may also be found in the Input Personality Table.

The purpose of Fourier transformation is to extract the peak sine and cosine components of an input waveform. These components are then used to calculate the amplitude (effective value) of the waveform. For this application, we are only concerned with the components of the fundamental (60 Hz) line frequency.

If the buffer is an analog input buffer, then the 9 samples are analyzed, yielding the sine and cosine components of the fundamental. The effectiv value of the waveform is then computed and stored in the buffer. The buffer is then marked as being ready for more raw data.

If the buffer is a digital (donut) buffer, then only the effective voltage and current are computed and stored in the buffer. When these calculations are complete, the buffer is marked as being ready for more raw data.

After the data has been appropriately processed, then the output values may be calculated. Parameters that may be calculated are: voltage, current, kilowatt hours, watts, va, and vars. Also, temperature, and frequency may be output. (These are measured, not calculated parameters).

Error Detection/Action:

None.

Data Output

Output data will be transmitted to the host in serial fashion. Data to be transmitted to the host will be stored in a circular FIFO buffer to be emptied by the transmission routine which will be interrupt driven. All data must be converted to offset binary and formatted before transmission. A new set of output data will be transmitted to the host once per second.

When a buffer is ready to be output, the wattage must be calculated (If it hasn't been already) and stored in the buffer corresponding to the phase 1 of the current involved in the calculation. When the wattage is calculated, the kilowatt hour value is updated also. After calculating power and updating KWH, the output task will calculate the requested output parameter and output it (if the appropriate buffers to perform the calculation are ready). The output task will then proceed to the next entry in the Output Personality Table. When the end of the table is reached, all buffers, both analog and digital, are marked as ready for analysis. In addition, the output task will enable the transmission of the block of data just calculated, and wait until the start of the next one second interval before starting at the top of the table again.

If the second current input specifier in the output table entry is not −1, the parameter will be calculated using the Breaker-and-a-half method. (see glossary)

Error Detection/Action

If the requested parameter cannot be calculated because the requisite buffers are not yet ready, and the output buffer is empty, we have a fatal error in that we haven't been able to calculate the requisite data in time for transmission. For now we'll just wait until the data does come along.

RTI Monitoring/Programming

The RTI will be supplied with an integral 16 key keypad, and single line (16 column) display. From this keyboard, the user may:

continuously monitor any particular output value (the display being updated once per second).

display all diagnostic error counts.

transmit an upload request to the host thru the auxiliary port.

In addition, the RTI will have the capability to upload/-download any EEPROM based table through the auxiliary port upon request from the host. All programming of the RTI (configuration and scaling factor entry) will be performed through this link. Communications protocols will be defined in the design spec.

Error Detection/Action

When each table is up/down loaded, a 16 bit CRC word is transmitted with it. Should this CRC check fail on down load, the RTI will request a retransmission and the table in EEPROM will not be updated. On upload, it is the responsibility of the host to request a retransmission.

Initalization

A. Various hardware must be initialized prior to start of operation. Presently defined hardware is:

STC (System Timing Controller).

The STC consists of 5 independent timers, any one of which may be selected to generate an interrupt upon timing out. This is used to insure that the analog samples are taken at the proper time. The STC is made by Advanced Micro Devices, and its part number is 9513.

PI/T:

Set timer to provide interrupts at one second intervals to signal the start of data transmission to the host.

ACIA 1: Host interface 4800 baud

Odd parity 1 stop bit 8 data bits

Host interface monitor (RCV half of ACIA 1)

ACIA 2: Auxiliary link

To be defined.

Error Detection/Action:

None.

B. Software initialization:

The analog and digital buffers must be initialized at startup time. Also at this time, the Input Sequence Table and Cluster Status Masks are built. Finally, the various tasks must be initialized and started.

Equations:

Fourier analysis (voltage and current):

$$Va \text{ (cosine component)} = \sum_{S=1}^{9} Vs \times \cos(s \times 40°)/4.5$$

$$Vb \text{ (sine component)} = \sum_{S=1}^{9} Vs \times \sin(s \times 40°)/4.5$$

Where s is the sample number.

Note: sin (s×40°)/4.5 and cos (s×40°)/4.5 are constants, and may be stored in a table.

Effective voltage (current):

$$Veff = \sqrt{Va^2 - Vb^2}$$

Temperature: no calculation-the input valve is just passed on.

Power:

Watts:

per phase: Watts=(Vb×Ib)+(Va×Ia)

Total power: (this applies to Watts, VARS, and VA)

Three phase (wattmeter) method: pwr=(Phase 1 pwr+Phase 2 pwr+Phase 3 pwr)/6144

Two phase (wattmeter) method: pwr=(Phase 1 pwr+Phase 2 pwr)/4096 where pwr may be WATTS, VARS, or VA.

Note: The constants 6144 and 4096 above are included so that full scale voltage and full scale current will yield full scale power. Proper scaling to actual watts, vars, va, or watt-hours will be performed by the host.

VARS:

VARS=(Va×Ib)−(Vb×Ia) (per phase)

Total VARS calculated as per total watts above.

VA:

VA=Veff×Ieff

Total VA calculated as per total watts above.

Tables

A. Input Personality Table:

This table is EEPROM based, and binds a specific input member to an input type (voltage, current, temperature), group #, phase #, and set of correction factors. This table is of a fixed size and may have no more than 48 entires. Unused entries will have a value of 0. The values in this table will be determined at installation time.

B. Output Personality Table:

The Output Personality Table is an EEPROM based table which defines each of the parameters to be output, and which parameters are necessary to calculate them. The number of entries (up to 64) in the table is unique to the site, and is determined at installation time. The entries are arranged in the order in which they are to be output. There may be no more than 64 entries in this table.

When donuts are used, both voltage and current readings from the selected donut(s) will be used for power (volt-amp) calculations. (ie. using voltage from a donut and current from a CT will not be permitted)

Donuts shall have ID's ranging from 1 to 15. Each installation using donuts must start the donut ID's from 1.

Donuts must be used in groups of three. (Their output is suitable only for use in the 3 wattmeter method.) The ID's of the donuts must be consecutive, the lowest numbered one being assumed to be phase one, and the highest numbered one will be assumed to be phase 3.

Zero entries in the table will be ignored.

C. Input Sequence Table

The Input Sequence Table is RAM based, and built at RTU startup time, based on the Output and Input Personality tables. For each group, this table specifies which inputs must be sampled simultaneously to calculate the desired outputs. The groups are entered into the table in order of their first reference in the Output Personality Table. The Input Personality Table is then referenced to find the input numbers of all phases of a given input type (ie. current) for any group. Each group is terminated by a zero word. The table is terminated by a word set to all ones.

D. Donut Scale Factor Table

This table is EEPROM based and contains the donut's group number, and scaling factors to be applied to donut inputs. Scale factors are unique to each parameter input from each donut. In addition, the temperature input may also have an offset from −1024 to 1023 added to it. This offset is added after the scaling factor has been applied. The entries are arranged in order of donut ID's.

Data Formats:

A. Incoming Donut Data Format:

| word | bits | function |
|---|---|---|
| 1 | 11-8 | don't care |
| | 7-4 | donut id |
| | 3-0 | aux. id |
| 2 | 11-0 | Va (cosine component of voltage) |
| 3 | 11-0 | Vb (sine component of voltage) |
| 4 | 11-0 | Ia (cosine component of current) |
| 5 | 11-0 | Ib (sine component of current) |
| 6 | 11-0 | Aux |
| 7 | 11-0 | CRC word |

B. Host Transmission Format

| word | bits | function |
|---|---|---|
| | For data types 0-6: | |
| 1 | 7-6 | always zero |
| | 5-0 | value ≠ |
| 2 | 7-6 | always one |
| | 5-0 | MS 6 bits of value |
| 3 | 7-6 | always one |
| | 5-0 | LS 6 bits of value |
| | For data type 7 (KWH): | |
| 1 | 7 | always one |
| | 6 | always zero |
| | 5-0 | value ≠ |
| 2 | 7-6 | always one |
| | 5-0 | MS 6 bits of value |
| 3 | 7-6 | always one |
| | 5-0 | LS 6 bits of value |

C. Upload/Download format:

| byte | bits | function |
|---|---|---|
| 0-4 | 0-7 | syne character - SYN (≠16) |
| 5 | 0-7 | table I.D. - ASCII digit 0-3 where: |
| | | 0—I.D. table |
| | | 1—Input Personality Table |
| | | 2—Output Personality Table |
| | | 3—Donut Scale Factor Table |
| 6-7 | 0-7 | byte count - ≠ of bytes of table transmitted |
| 8-N | 0-7 | table data − N = byte count + 8 |
| N+1−N+2 | 0-7 | CRC word, CRC includes bytes 5 thru N |

E. Fourier constant table

In the Fourier analysis, the values sin $(s\times40)/4.5$ and cos $(s\times40)/4.5$ (where s ranges from 1 to 9) are constants, and thus may be stored in a table. This avoids needless computation. Each entry will be a 32 bit floating point number. There will be 9 entries for each table. (sine and cosine)

F. Analog Input Buffer

There are 48 of these buffers, one per A/D channel. The number of buffers actually used is installation dependent. These buffers accept raw input from the A/D, and hold the results of intermediate calculations until output time. The intermediate values are the cosine and sine components oo the Fourier analysis of the 9 input samples, the effective value (computed from these components), total wattage, watt seconds, and kilowatt hours. The last three parameters are only defined for Analog Input buffers corresponding to phase 1 CT's.

G. Digital Input Buffer

There are 16 digital input buffers in the system. The number of buffers actually used is installation dependent. This buffers are similar in function to the analog input buffers, but their format is different due to the fact that data from donuts has already been analyzed, and voltage, current and temperature data are sent from each donut, being equivalent to three analog inputs. That data contained in these tables are the cosine and sine components of the voltage, cosine and sine components of current, temperature, effective voltage and current, total watts, watt seconds, and kilowatt hours. The last three parameters are used only in buffers corresponding to donuts connected to phase one of a group.

GLOSSARY

Figure 63:
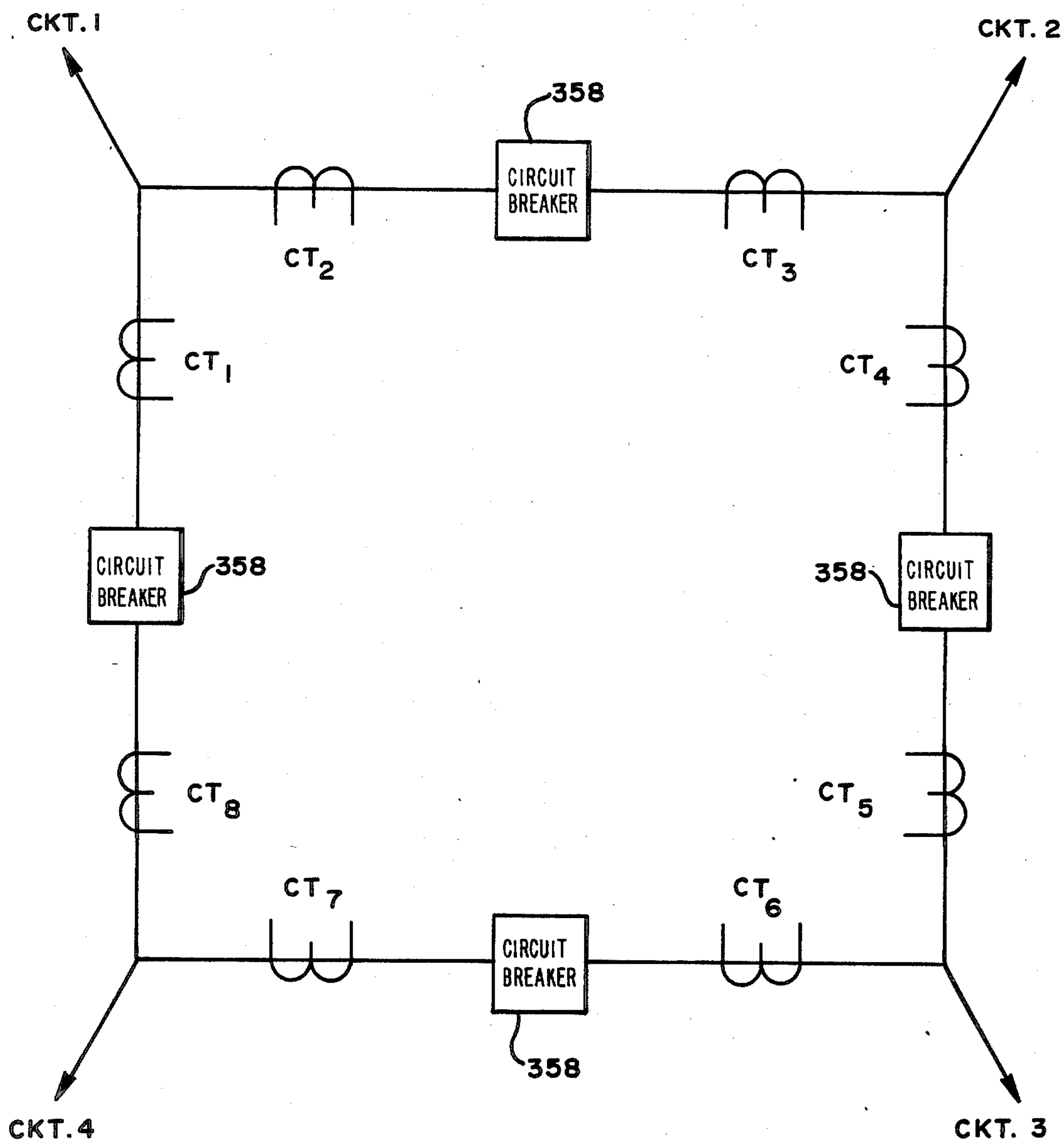
FIG. 63 is a diagram of a type of substation that may be monitored by the electronics shown in FIG. 62.

Breaker-and-a-half method:

Method used to calculate parameters when the substation bus is configured as shown in FIG. 63 Such a configuration is called a Ring Bus. In this configuration, any given circuit is fed from two sources. As a result, two CT's are used to calculate the current in the circuit, one CT on each source. As a result, any parameter requiring current must be calculated in a special way. The currents from each source must be summed and then used in the calculation. This is true whether the effective value (Ieff) is used, or the components (Ia, Ib) are used. To calculate power, then, the results of 3 inputs are now necessary rather than two as before. Circuit breakers are identified as 358.

Circuit: Three (or four) wires whose purpose is to transmit power from the power company. Also called a bus.

Cluster: A collection of inputs which must be sampled at the same time due to phase considerations. (ie. A given voltage group and all the currents related to it through the output personality table constitute a cluster. Also, an 'entry' in the input sequence table)

Current Group: A three phase circuit (3 or 4 conductor) whose current is measured. There may be a maximum of 23 current groups.

Donut: Remote power line monitoring device—linked to RTI via radio link.

I: Current (abbr.)

Ia: Cosine component of current waveform.

Ib: Sine component of current waveform.

Phase:

1. A power carrying wire in a circuit or bus.
2. Time relationship between two signals, (often voltage and current) usually expressed in degrees or radians, (ie. The phase relationship between any two phases of a three phase circuit is 120 degrees)

V: Voltage (abbr.)

Va: Cosine component of voltage waveform.

Vb: Sine component of voltage waveform.

VA: Volt Amps—The vector sum of resistive (watts) and reactive power (VARS).

Voltage Group: A three phase circuit (3 or 4 conductor) whose voltage is used both as a frequency reference and as a voltage reference for subsequent calculations. There may be a maximum of five of these voltage groups (1 per cluster).

Receiver Operation

Figure 64:
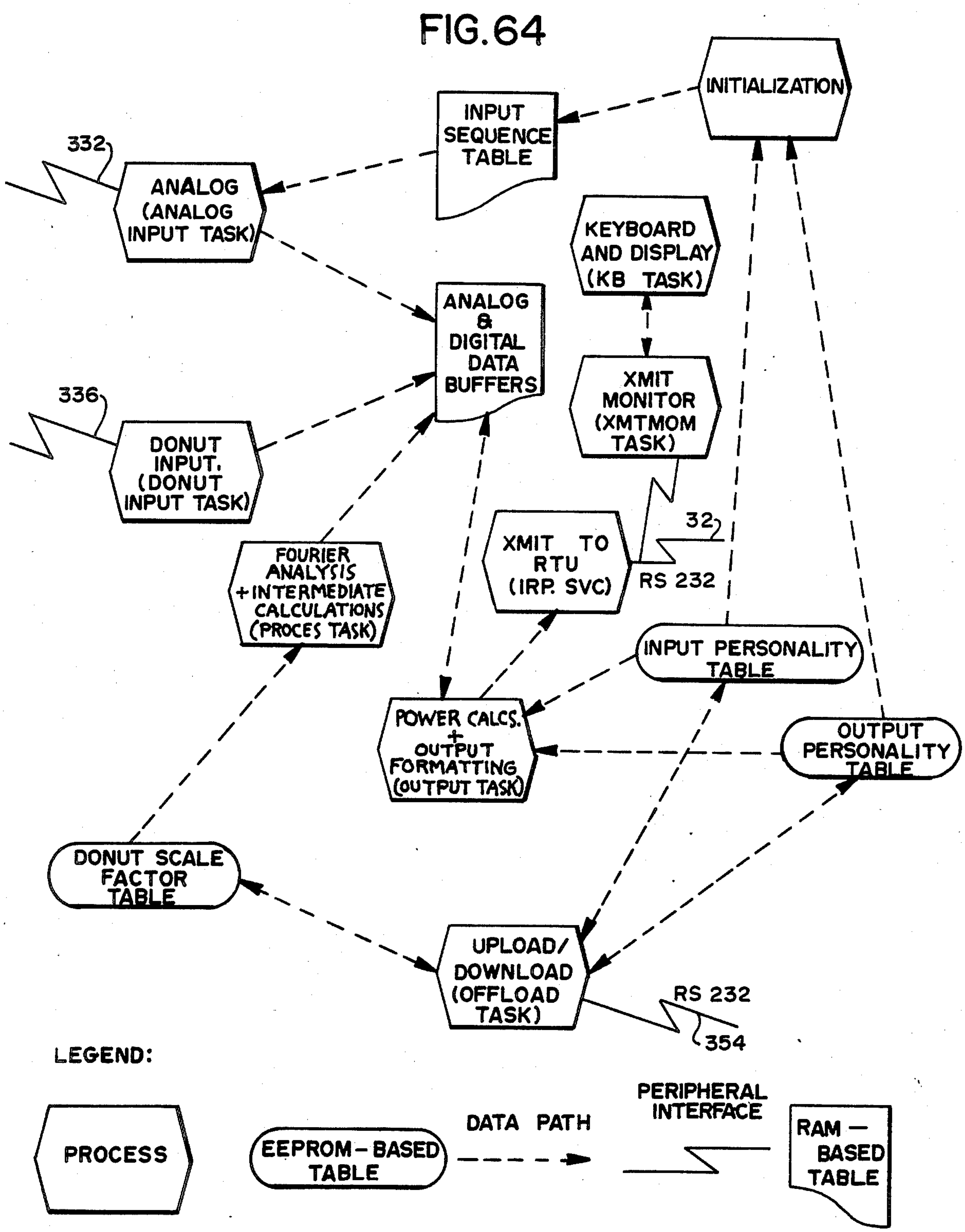
FIG. 64 is a state diagram of a program that may be utilized in the receiver 24.

A state diagram for the program of the central processing unit 334 of FIG. 62 of the receiver 24 is shown in FIG. 64. Processing tasks are indicated by the six-sided blocks. Tables stored in the electrically erasable read only memory 349 are indicated by the elongated oval boxes. Data paths are shown by dotted lines and peripheral interfaces are indicated by zig-zag lines. The transformer inputs 332 and donut input 336 are shown in the upper left. The RS232 port 354 is shown in the lower right and the output RS232 port 32 is indicated in the middle of the diagram.

The donut scale factor table is shown in FIG. 65. Since donuts are normally operated in groups of three for three-phased power measurement, word Ø comprises the group number of the donut (GP), followed by the phase number of the donut (PH). The following words are the voltage scale factor, current scale factor, temperature scale factors, and temperature offset respectively. Temperature offset is an 11 bit value, sign extended to 16 bits. All two word values are a floating point. There is, of course, a separate scale factor table for each of the fifteen donuts provided for. The donut scale factor tables are stored in the electrically erasable read only memory 349.

FIG. 66 is a table of the digital input buffers. There are sixteen required, one to store the received value of each of the fifteen donuts and one to act as a receiver buffer for the serial port of the communication board 106.

Word Ø comprises, in addition to the donut ID and a number called buffer age, indicating how long since the information in the buffer has been updated; the following flags:

DI(Data In)—Set when all data has been received and is ready for analysis. Clear when ready for new data.

AC(analysis Complete)—Set when effective value and temperature scaling calculations are complete.

VP(Valid Power)—Set if total watts has already been calculated.

IT(Input type)—Always 3. Identifies this buffer as donut input.

All single word values are 12 bits, sign extended to 16 bits. All double word values are floating point. Buffer age is the number of times this data has been used. The first buffer (buffer Ø) is used to assemble incoming donut data. Words 14–16 are defined for Ø 1 donuts only. Word Ø in the buffer number Ø is used for the donut status map. The digital input buffers are stored in the read only memory 346.

FIG. 67 is the input personality table of which there are 48 corresponding to the 48 potential transformer and current transformer inputs. IT identifies the input type which may be voltage, current, or temperature. Link is the input number of the next phase of this group of donuts. It is −1 if there are no other donuts in the group. Correction factor number 1 is used for correcting voltage values. Each of the four correction factors corresponds to a range of input values from the current transformers. Again, as with the donuts, the group number identifies groups of transformers associated with a single power line and PH identifies the phase number of the particular transormer. VG identifies the voltage group that the current is to be associated (that is, sampled) with. It is used, of course, only when the table is used to store values from a current transformer. The input personality tables are stored in the electrically erasable read only member 349.

48 analog input buffers are provided to store measurements received from the 48 current potential transformers. The form of each of these buffers is shown in FIG. 68.

The following flags are provided:

DI(Data In)—Set when all raw data has been received and sign extended. Clear when buffer is ready for more data.

AC(Analysis Complete)—Set when Fourier analysis and effective value computations are complete.

VP(Valid Power)—Set if total watts value has already been calculated.

IT(Input Type)—Ø=voltage, 1=current, 2=temperature.

Words 1–9 and 10–18 are 12 bit values, sign extended to 16 bits. All 2 word values are floating point. Words 16–18 are defined for Ø 1 of current inputs only. Words 10–18 are undefined for temperature inputs. VP only applies to buffers associated with Ø 1 current inputs. If IT=2 (temperature), the first sample will be converted to floating point and stored at offset 1Ø.

In operation, transmissions are received randomly from the donuts 20, transmitted in Manchester code to the serial port to the communications board 106. The checked sum (CRC) is calculated and if it agrees with the check sum (CRC) received, an interrupt is provided to the central processing unit 334, which then transfers the data to data bus 338. The central processing unit 68000 applies the scale factors and temperature offset to the received values, and calculates the Temperature, effective Voltage ($V_{EFF}$), effective Current ($I_{EFF}$), Scaled Temperature, Total Watts, Watt Seconds and kilowatt hours from the received data and stores the data in the appropriate Digital Input Buffer in random access memory 346.

In the analog board 340, each of the 48 transformer inputs is sampled in turn. After its condition has been converted to digital form, an interrupt is generated, and the data is supplied to data bus 338. It should be noted that the analog board 340 causes the inputs from the potential and current transformers 332 to be Fourier sampled nine times just as current and voltage are sampled in the donuts (see FIG. 34). Thus, the data supplied to the data bus 338 from the analog board 340 comprises 9 successive values over nine alternating current cycles. After all nine have been stored in the random access memory 346, and the appropriate correction factors (FIG. 67) applied, the fundamental sine and cosine Fourier components are calculated just as in the donuts 20.

Then the effective value of current or voltage is calculated and, if appropriate, the Total Watts, Watt Seconds, and Kilowatt hours, and the entire table (FIG. 68) stored in the random access memory 346.

When the receiver 24 is initially set up, the appropriate donut scale factors (FIG. 65) are loaded through RS232 port 354 into the electrical erasable read only memory 349, and these are used to modify the values received from the donuts 20 before they are recorded in the digital input buffers of the random access memory 346. Similarly, an input personality table (FIG. 67) is stored in the electrical erasable read only memory 349 corresponding to each of the current and potential transformers and this is utilized to apply the appropriate corrections to the data received by the analog board 340 before it is recorded in the analog input buffers of the random access memory 346. The scaled data stored in the digital input buffers and the corrected data stored in the analog input buffers is then assembled into a frame or message containing all of the defined data from all of the donuts 20 and all of the transformers 332 and transmitted via transmission link 32 to a receiver which may be the remote terminal interface of the prior art as previously described.

The form of the analog-to-digital, multiplexed input sample and hold circuitry and program in the receiver 24 may be essentially the same as that in the donut. The same is true for the Fourier component calculation program and the calculation of the check sum (CRC). The programs are appropriately modified to run in the 6800 central processing unit with its associated memories.

If harmonic data is desired, then higher Fourier harmonics are calculated in the donuts 20 and transmitted to the receiver 24. The receiver then uses the higher harmonic values to calculate the amplitude of each harmonic it is desired to measure.

The frequency at any donut 20 may be determined, if desired, by measuring the time between transmissions received from the donut as these are an integral multiple (W, see FIG. 34) of the line frequency at the donut. Alternatively, the donut may employ an accurate quartz clock to measure the time between zero crossings (FIG. 34) and transmit this frequency measurement to the receiver.

If desired, power factor may be calculated from the Fourier components and stored in the input buffers (FIGS. 66 and 68). Reactive power (Vars) may be calculated from the Fourier components rather than real power (Watts) as selected by an additional flag in each of the Donut Scale Factor Tables (FIG. 65) and the Input Personality Table (FIG. 67). Alternatively, all of these calculations and others, as well as other information such as frequency, may be stored in expanded Input Buffers (FIGS. 66 and 68).

The electrical erasable read only memory 349 may be unloaded through the RS232 port 354 when desired to check the values stored therein. They may also be displayed in the display 352 and entered or changed by means of the keyboard 350.

The output from the receiver 24 is a frame of 64 (for example) data values from the Input Buffers (FIGS. 66 and 68) chosen by an output Personality Table (not shown) stored in the electrically erasable read only memory 349. This frame of values is transmitted to the Moore remote terminal unit once each second. The output personality table may be displayed on display 352 and entered by keyboard 350 or entered on read out through RS232 port 354.

Practical Application

It will thus be seen that a number of separate novel concepts have been applied to develop a practical state estimator module which may be applied to live power lines; a module which is capable of measuring the temperature of the power line, the ambient temperature, the voltage and current of the line; the frequency and harmonic content of the line; and transmits this information to a receiver where power information such as real and reactive power and power factor may be calculated.

Thus, we have provided a state estimator module which may be installed to all of the live power lines leading to and from a substantion and to both sides of power transformers in the substation, and thus provide the totality of information required for complete remote control of the power station from a power control center, and also provide for local control. Our state estimator modules may be installed on live monitored circuits in an existing substation having current and voltage transformers and our receiver used to collect this totality of information and transmit it to a remote terminal unit and thence to a power system control center.

Some of the important concepts which make this novel system possible are the metallic toroidal housing for the module (which is a high frequency but not a low frequency shunt about its contents); the supporting hub and spoke means; spring loaded temperature sensors; novel voltage measuring means; transmission of Fourier components; random burst transmission on a single radio channel with the timing between bursts being artfully chosen to minimize simultaneous transmissions from two or more donuts; novel hinge clamp which may be operated by a novel hot stick mounted tool facilitating the mounting of the module to a energized power conductor; and the concept that such hot stick mounted modules when distributed throughout a power delivery system, can provide for total automatic dynamic state estimator control.

It will thus be seen that the objects set forth above, among those made apparent from the preceding description, are efficiently attained and, since certain changes may be made in the above circuits, constructions and systems, without departing from the scope of the invention, it is intended that all matter contained in the above description, or shown in the accompanying drawings, shall be interpreted as illustrative and not in a limiting sense.

It is also to be understood that the following claims are intended to cover all of the generic and specific features of the invention herein described and all statements of the scope of the invention which as a matter of language might be said to fall therebetween.

APPENDIX A

Copyright © 1983

Product Development Services, Inc. (PDS)

```
* SUBHDR
******************************************************************
******************************************************************
***                                                             *
***                                                             *
***                       NMPC - 803                            *
```

```
                 ***                                                 *
                 ***         N I A G A R A   M O H H A W K            *
                 ***                                                 *
                 ***       P O W E R   C O R P O R A T I O N          *
                 ***                                                 *
                 ***              SUB-STATION MONITOR                 *
                 ***                                                 *
                 ***                                                 *
                 *****************************************************
                 *****************************************************
                 * SYSCFG
                 ******************************************************
                 *                                                    *
                 *     SUBSTATION MONITOR                             *
                 *     SYSTEM CONFIGURATION DEFINITIONS               *
                 *                                                    *
                 ******************************************************

                 ******************************
                 *   SYSTEM ADDRESS EQUATES   *
                 ******************************

       0010    A RAMSTR EQU    $0010    RAM START ADDRESS
       0080    A RAMEND EQU    $0080    RAM END ADDRESS PLUS ONE
       1800    A PGMSTR EQU    $1800    PROGRAM ROM START ADDRESS

                 ******************************
                 *   CRC POLYNOMIAL EQUATES   *
                 ******************************
       0018    A POLY1  EQU    $18
       000F    A POLY2  EQU    $0F

                 ******************************
                 *  I/O EQUATES               *
                 ******************************

       0000    A PORTA  EQU    $0000    PORT A DATA REGISTER
       0001    A PORTB  EQU    $0001    PORT B DATA REGISTER
       0004    A PADDR  EQU    $0004    PORT A DATA DIRECTION REGISTER
       0005    A PBDDR  EQU    $0005    PORT B DATA DIRECTION REGISTER
       0008    A CLOCK  EQU    $0008    CLOCK DATA
       0009    A CLOKCR EQU    $0009    CLOCK CONTROL REGISTER

       1000    A DAC00  EQU    $1000    DAC/COMPARATOR LS NIBBLE
       1001    A DAC01  EQU    $1001    DAC/COMPARATOR MID NIBBLE
       1002    A DAC02  EQU    $1002    DAC/COMPARATOR MS NIBBLE
       1003    A DAC03  EQU    $1003    DAC/COMPARATOR CONVERT
       1000    A WDOG   EQU    DAC00    WATCH DOG TIMER
                 ******************************
                 *  TRANSMITTER TIMING        *
                 ******************************
       0054    A XBITS  EQU    84       TRANSMIT 84 DATA BITS
       0003    A XDELAY EQU    3        DELAY 3 BITS BEFORE DISABLE

                 ******************************
                 *  I/O BIT DEFINITIONS       *
                 ******************************

                 *  A SIDE

       000F    A IDMASK EQU    %00001111 DONUT ID JUMPER
       0004    A FREEZE EQU    4        A/D TRACKING REGISTER FREEZE

                 *  B SIDE

       0000    A SHFTIN EQU    0        SHIFT REGISTER DATA
```

```
00078           0001     A MANCTL EQU    1          MANCHESTER ENCODER ENABLE
00079           0002     A XMTTER EQU    2          TRANSMITTER CONTROL BIT
00080           0003     A STATUS EQU    3          CYCLE STATUS BIT (FOR TESTING)
00081           0004     A SHFCLK EQU    4          SHIFT REGISTER CLOCK

00083           00E0     A SMASK  EQU    %11100000 DAC SAMPLE SELECT MASK
00084           0000     A SCURR  EQU    %00000000 CURRENT SELECT
00085           0020     A SVOLT  EQU    %00100000 VOLTAGE SELECT
00087                      *****************************
00088                      *   CLOCK CONFIGURATION     *
00089                      *****************************
00090           004E     A CLKINT EQU    %01001110 NO IRQ,INTERNAL OSC,DIVIDE BY 6
00091           0078     A CLKEXT EQU    %01111000 NO IRQ,EXTERNAL OSC,DIVIDE BY 1
00092           000E     A CLKIRQ EQU    %00001110 IRQ,INTERNAL OSC,DIVIDE BY 64


00094                      *****************************
00095                      *   GLOBAL RAM DEFINTIONS   *
00096                      *****************************

00098A 0010                       ORG    RAMSTR

00100A 0010     0001     A LSTTIM RMB    1          LAST CYCLE TIME
00101A 0011     0001     A CYCTIM RMB    1          SAMPLE TIME (1-1/9 ZC TIME)
00102A 0012     0001     A REMAIN RMB    1          SAMPLE TIME REMAINDER
00103A 0013     0002     A XMTTIM RMB    2          TRANSMIT START Z.C. COUNT
00104A 0015     0001     A ZCFLAG RMB    1          ZERO CROSSING OCCURRED FLAG
00105A 0016     0001     A ZCCNT  RMB    1          ZERO CROSSING COUNTER
00106A 0017     0001     A SMPNUM RMB    1          CURRENT SAMPLE NUMBER (0-7)
00107A 0018     0001     A SMPTIM RMB    1          CURRENT SAMPLE DELAY TIME
00108A 0019     0001     A SMPFLG RMB    1          SAMPLE TIME FLAG
00109A 001A     0001     A SYNFLG RMB    1          SYNC MODE FLAG
00110A 001B     0001     A START  RMB    1          CYCLE START FLAG
00111A 001C     0002     A CURENT RMB    2          CURRENT VALUE
00112A 001E     0002     A VOLTS  RMB    2          VOLTAGE VALUE
00113A 0020     0001     A AUXID  RMB    1          AUXILLIARY VALUE SELECT BITS
00114           0040     A AUX1   EQU    $40        FIRST AUX VALUE SELECT
00115A 0021     0001     A TRIGIX RMB    1          GETVAL/SUMS TRIG TABLE INDEX
00116A 0022     0007     A MLTBUF RMB    7          MULT MULTIPLICATION BUFFER
00117                      ****************
00118A 0029     0004     A ACCQUO RMB    4          DIVID9 BUFFER
00119A 002D     0004     A ACCVAL RMB    4
00120A 0031     0004     A ACCPOS RMB    4
00121A 0035     0004     A ACCSHF RMB    4
00122A 0039     0004     A ACCSUM RMB    4
00123                      ****************

00125                      *===============
00126           003D     A SUMBUF EQU    *
00127A 003D     0004     A VASUM  RMB    4
00128A 0041     0004     A VBSUM  RMB    4
00129A 0045     0004     A IASUM  RMB    4
00130A 0049     0004     A IBSUM  RMB    4
00131           004D     A SUMCLR EQU    *
00132                      *===============

00134                      ****************
00135           004D     A DATBUF EQU    *          DATA BUFFER
00136A 004D     0002     A IDBYTE RMB    2
00137A 004F     0002     A VA     RMB    2          VOLTAGE FOURIER COSINE SUM
00138A 0051     0002     A VB     RMB    2          VOLTAGE FOURIER SINE SUM
00139A 0053     0002     A IA     RMB    2          CURRENT FOURIER COSINE SUM
00140A 0055     0002     A IB     RMB    2          CURRENT FOURIER SINE SUM
00141A 0057     0002     A AUX    RMB    2          AUXILLIARY DATA VALUE
00142A 0059     0002     A CRCVAL RMB    2          CRC VALUE
00143                      ****************


00145                      *****************************
00146                      *   LOCAL RAM DEFINITIONS   *
00147                      *****************************
```

```
A 005B     0001     A BYTCNT RMB    1        SHIFT LOCAL COUNTER
A 005C     0001     A XTEMP  RMB    1        SHIFT LOCAL STORAGE
A 005D     0002     A VALUE  RMB    2        READAC LOCAL STORAGE
A 005F     0002     A VALINC RMB    2        READAC LOCAL STORAGE
A 0061     0001     A CLKREM RMB    1        CLKINT TIMER VALUE REMAINDER
A 0062     0001     A CRCCNT RMB    1        CRC12 LOOP COUNTER
A 0063     0001     A SHFCNT RMB    1        CPOLY LOOP COUNTER
A 0064     0001     A ABSIGN RMB    1        ABSVAL, ADDSIN, ADDCOS SIGN FLAG
                      *****************************
                      *  ZERO CROSSING COUNTS     *
                      *****************************
           0014     A SMPEND EQU    20       SAMPLING COMPLETE
           0000     A XMTCNT EQU    0        TIME TO TRANSMIT

A 1800                       ORG    PGMSTR   EPROM START ADDRESS
                      ***************************
                      *  TIMING TABLE           *
                      ***************************

           1800     A TIMTBL EQU    *
A 1800     0025     A        FDB    37       DONUT ID 0
A 1802     0029     A        FDB    41       DONUT ID 1
A 1804     002B     A        FDB    43       2
A 1806     002F     A        FDB    47       3
A 1808     0033     A        FDB    51       4
A 180A     0035     A        FDB    53       5
A 180C     003B     A        FDB    59       6
A 180E     003D     A        FDB    61       7
A 1810     0040     A        FDB    64       8
A 1812     0041     A        FDB    65       9
A 1814     0043     A        FDB    67       10
A 1816     0047     A        FDB    71       11
A 1818     0049     A        FDB    73       12
A 181A     004D     A        FDB    77       13
A 181C     004F     A        FDB    79       14
A 181E     0053     A        FDB    83       15
                      *****************************
                      *  TRIG TABLES              *
                      *****************************

           1820     A SINES  EQU    *
A 1820     0000     A S0     FDB    0000     SINE 0    (+)
A 1822     191C     A S1     FDB    6428     SINE 40   (+)
A 1824     2678     A S2     FDB    9848     SINE 80   (+)
A 1826     21D4     A S3     FDB    8660     SINE 120  (+)
A 1828     0D5C     A S4     FDB    3420     SINE 160  (+)
A 182A     0D5C     A S5     FDB    3420     SINE 200  (-)
A 182C     21D4     A S6     FDB    8660     SINE 240  (-)
A 182E     2678     A S7     FDB    9848     SINE 280  (-)
A 1830     191C     A S8     FDB    6428     SINE 320  (-)

           1832     A COSINE EQU    *
A 1832     2710     A C0     FDB    10000    COSINE 0    (+)
A 1834     1DEC     A C1     FDB    7660     COSINE 40   (+)
A 1836     06C9     A C2     FDB    1737     COSINE 80   (+)
A 1838     1388     A C3     FDB    5000     COSINE 120  (-)
A 183A     24B5     A C4     FDB    9397     COSINE 160  (-)
A 183C     24B5     A C5     FDB    9397     COSINE 200  (-)
A 183E     1388     A C6     FDB    5000     COSINE 240  (-)
A 1840     06C9     A C7     FDB    1737     COSINE 280  (+)
A 1842     1DEC     A C8     FDB    7660     COSINE 320  (+)

                      ****************************
                      *  FOURIER SCALING DIVISOR *
                      ****************************
A 1844     2710     A DIVIDR FDB    10000    DIVIDE BY 10000 TO SET DECIMAL PO
                      * MAIN
                      ***************************************************
                      *
                      *  MAIN:  IS THE SUBSTATION MONITOR BACKGROUND
                      *         ROUTINE.
```

```
00222                          *
00223                          *        CALLING SEQUENCE:
00224                          *           JMP MAIN (FROM RESET)
00225                          *
00226                          ******************************************************


00228            1846      A MAIN   EQU    *
00229A 1846 CD 1863        A        JSR    SYNC      SYNCHRONIZE TIMING.
00230A 1849 CD 18B1        A        JSR    HKEEP     RESET FOR NEXT PASS.
00231A 184C CD 18EB        A        JSR    GETVAL    READ ANALOG VALUES.
00232A 184F CD 1A0D        A        JSR    COMPUT    PERFORM NECESSARY CALCULATIONS.
00233A 1852 C7 1000        A        STA    WDOG      KICK WATCHDOG.
00234A 1855 CD 1A82        A        JSR    CRC12     COMPUTE CHECKSUM.
00235A 1858 CD 1AD4        A        JSR    SHIFT     FILL SHIFT REGISTER WITH DATA.
00236A 185B CD 1B10        A        JSR    XMIT      TRANSMIT DATA.
00237A 185E C7 1000        A        STA    WDOG      KICK WATCHDOG.
00238A 1861 20 E3     1846          BRA    MAIN
00240                          * SYNC
00241                          ******************************************************
00242                          *
00243                          *  SYNC:  CHECKS THE FREQUENCY AND ADJUSTS THE
00244                          *         SAMPLE TIMER ACCORDINGLY.
00245                          *
00246                          *         CALLING SEQUENCE:
00247                          *            JSR  SYNC
00248                          *            RETURN
00249                          *
00250                          ******************************************************


00252            1863      A SYNC   EQU    *
00253A 1863 9B                      SEI              INHIBIT INTERRUPTS.
00254A 1864 A6 FF          A        LDA    #$FF      INITIALIZE Z.C. COUNT.
00255A 1866 B7 16          A        STA    ZCCNT
00256A 1868 B7 17          A        STA    ZCCNT+1
00257A 186A A6 01          A        LDA    #1        SET SYNC MODE FLAG.
00258A 186C B7 1A          A        STA    SYNFLG
00259A 186E A6 4E          A        LDA    #CLKINT   DISABLE CLOCK IRQ.
00260A 1870 B7 09          A        STA    CLOKCR
00261A 1872 9A                      CLI              REALLOW INTERRUPTS.
00262A 1873 3F 4F          A        CLR    VA        CLEAR VA FOR CYCLE CALCULATION.
00263A 1875 3F 50          A        CLR    VA+1
00264A 1877 3F 15          A        CLR    ZCFLAG    RESET ZERO CROSSING FLAG.
00265A 1879 AE 0A          A        LDX    #10       SET SYNC COUNT.
00266A 187B 3D 15          A SYNWAI TST    ZCFLAG    ZERO CROSSING OCCURRED?
00267A 187D 27 FC     187B          BEQ    SYNWAI    NO.
00268A 187F 3F 15          A        CLR    ZCFLAG    YES.  IGNORE FIRST ONE.
00269A 1881 3D 15          A SYNNXT TST    ZCFLAG    ZERO CROSSING OCCURRED?
00270A 1883 27 FC     1881          BEQ    SYNNXT    NO.
00271A 1885 3F 15          A        CLR    ZCFLAG    YES.  RESET FLAG.
00272A 1887 5A                      DEX              TIMED 10 CYCLES?
00273A 1888 26 F7     1881          BNE    SYNNXT    NO.
00274A 188A AE 05          A        LDX    #$05      YES.  GET MS TIME VALUE.
00275A 188C B6 10          A        LDA    LSTTIM    GET LAST CYCLE TIME.
00276A 188E B7 50          A        STA    VA+1      SAVE IN SUM BUFFER.
00277A 1890 A1 C0          A        CMP    #$C0      CARRY NEEDED?
00278A 1892 22 01     1895          BHI    SYNNC     NO.
00279A 1894 5C                      INX              YES.  BUMP MS VALUE.
00280A 1895 BF 4F          A SYNNC  STX    VA        SAVE MS VALUE.
00281A 1897 3F 51          A        CLR    VA+2      RESET LS BYTE.
00282A 1899 AE 4F          A        LDX    #VA
00283A 189B A6 09          A        LDA    #9        MOVE DIVISOR TO BUFFER.
00284A 189D B7 38          A        STA    ACCSHF+3
00285A 189F 3F 37          A        CLR    ACCSHF+2
00286A 18A1 CD 1C2D        A        JSR    DIV3X2    GET 1-1/9 CYCLE TIME.
00287A 18A4 E6 02          A        LDA    2,X
00288A 18A6 B7 11          A        STA    CYCTIM    SAVE SAMPLING TIME.
00289A 18A8 E6 03          A        LDA    3,X
00290A 18AA B7 12          A        STA    REMAIN    SAVE REMAINDER.
00291A 18AC A6 01          A        LDA    #1
00292A 18AE B7 1B          A        STA    START     SET CYCLE START FLAG.
00293A 18B0 81                      RTS
```

```
                        * HKEEP
                        ****************************************************
                        *                                                  *
                        *  HKEEP:  MAINTAINS THE SAMPLE TIME INCREMENT AND *
                        *          PERFORMS GENERAL HOUSEKEEPING.          *
                        *                                                  *
                        *          CALLING SEQUENCE:                       *
                        *              JSR HKEEP                           *
                        *              RETURN                              *
                        *                                                  *
                        ****************************************************

          18B1        A HKEEP  EQU    *
18B1 19 00            A        BCLR   FREEZE,PORTA RELEASE TRACKING REGISTER.
18B3 AE 3D            A        LDX    #SUMBUF  GET SUM BUFFER START.
18B5 A6 00            A        LDA    #0
18B7 F7                 HKCLR  STA    0,X      CLEAR A BYTE.
18B8 5C                        INX             BUMP BUFFER POINTER.
18B9 A3 4D            A        CPX    #SUMCLR  DONE?
18BB 26 FA       18B7          BNE    HKCLR    NO.  CONTINUE CLEARING.
18BD A6 80            A        LDA    #$80     YES.  INITIALIZE TIMER REMAINDER.
18BF B7 61            A        STA    CLKREM
18C1 B6 00            A        LDA    PORTA    GET DONUT ID NUMBER.
18C3 A4 0F            A        AND    #IDMASK  MASK TO VALID BITS.
18C5 B7 4E            A        STA    IDBYTE+1 STORE IN DATA BUFFER.
18C7 3F 4D            A        CLR    IDBYTE
18C9 BE 4E            A        LDX    IDBYTE+1 GET ID NUMBER.
18CB 58                        ASLX            MULTIPLY BY TWO.
18CC D6 1801          A        LDA    TIMTBL+1,X GET TIMING TABLE ENTRY.
18CF A0 01            A        SUB    #1       COMPUTE TRANSMIT TIME.
18D1 B7 14            A        STA    XMTTIM+1
18D3 D6 1800          A        LDA    TIMTBL,X
18D6 A2 00            A        SBC    #0
18D8 B7 13            A        STA    XMTTIM
18DA B6 20            A        LDA    AUXID    GET AUXILLIARY ID.
18DC AB 20            A        ADD    #$20     BUMP TO NEXT AUX. VALUE.
18DE A1 E0            A        CMP    #$E0     DONE ALL?
18E0 26 02       18E4          BNE    HK01     NO.
18E2 A6 40            A        LDA    #AUX1    YES.  RESET TO FIRST.
18E4 B7 20            A HK01   STA    AUXID    SAVE AUXILLIARY ID.
18E6 BA 4E            A        ORA    IDBYTE+1 STORE IN DATA BUFFER.
18E8 B7 4E            A        STA    IDBYTE+1
18EA 81                        RTS             RETURN.
                        * GETVAL
                        ****************************************************
                        *                                                  >
                        *   GETVAL:  MONITORS THE SAMPLING TIMER AND       >
                        *            UPDATES THE CURRENT VALUE BUFFER.     >
                        *                                                  >
                        *            CALLING SEQUENCE:                     >
                        *                JSR GETVAL                        >
                        *                RETURN                            >
                        *                                                  >
                        ****************************************************


          18EB        A GETVAL EQU    *
18EB B6 15            A        LDA    ZCFLAG   ZERO CROSSING OCCURRED?
18ED 27 FC       18EB          BEQ    GETVAL   NO.
18EF 3F 15            A        CLR    ZCFLAG   YES.  RESET FLAG.
18F1 3F 21            A        CLR    TRIGIX   RESET TRIG VALUE INDEX.
18F3 3D 19            A GVWAIT TST    SMPFLG   TIME TO SAMPLE?
18F5 27 FC       18F3          BEQ    GVWAIT   NO.
18F7 3F 19            A        CLR    SMPFLG   YES.  RESET SAMPLE FLAG.
18F9 C7 1000          A        STA    WDOG     KICK WATCHDOG TIMER.
18FC CD 190C          A        JSR    SAMPLE   READ ANALOG VALUE.
18FF B6 21            A        LDA    TRIGIX   BUMP TRIG VALUE INDEX.
1901 AB 02            A        ADD    #2
1903 B7 21            A        STA    TRIGIX
1905 B6 17            A        LDA    ZCCNT+1  DONE ALL NINE SAMPLES?
1907 A1 14            A        CMPA   #SMPEND
1909 25 E8       18F3          BLO    GVWAIT   NO.
190B 81                        RTS             YES.  RETURN.
```

```
                              * SAMPLE
                              ******************************************************
                              *                                                    *
                              *  SAMPLE:  READS ALL ANALOG DATA VALUES.            *
                              *                                                    *
                              *           CALLING SEQUENCE:                        *
                              *               JSR SAMPLE                           *
                              *               RETURN                               *
                              *                                                    *
                              *  C. 13 MS                                          *
                              ******************************************************


              190C          A SAMPLE EQU    *
       190C B6 00           A        LDA    PORTA    GET PORT STATUS.
       190E A4 1F           A        AND    #$FF-SMASK MASK OFF DAC SELECT BITS.
       1910 AA 00           A        ORA    #SCURR   SET CURRENT SELECT.
       1912 B7 00           A        STA    PORTA    SELECT CURRENT.
       1914 CD 1B94         A        JSR    READAC   GET CURRENT VALUE.
       1917 B7 1C           A        STA    CURENT   SAVE VALUE.
       1919 BF 1D           A        STX    CURENT+1
       191B B6 00           A        LDA    PORTA    SELECT VOLTAGE.
       191D A4 1F           A        AND    #$FF-SMASK
       191F AA 20           A        ORA    #SVOLT
       1921 B7 00           A        STA    PORTA
       1923 CD 1B94         A        JSR    READAC   GET VOLTAGE VALUE.
       1926 B7 1E           A        STA    VOLTS    SAVE VALUE.
       1928 BF 1F           A        STX    VOLTS+1
       192A CD 1949         A        JSR    SUMS     COMPUTE CURRENT SUMS.
       192D B6 17           A        LDA    ZCCNT+1  DONE ALL 9?
       192F A1 14           A        CMP    #SMPEND
       1931 26 13        1946        BNE    SAMRET   NO.
       1933 A6 4E           A        LDA    #CLKINT  YES.  DISABLE CLOCK INTERRUPTS.
       1935 B7 09           A        STA    CLOKCR
       1937 B6 00           A        LDA    PORTA    GET PORT STATUS.
       1939 A4 1F           A        AND    #$FF-SMASK MASK OFF DAC SELECT BITS.
       193B BA 20           A        ORA    AUXID    SET AUXILLIARY DATA BITS.
       193D B7 00           A        STA    PORTA    SELECT AUXILLIARY DATA.
       193F CD 1B94         A        JSR    READAC   GET CURRENT VALUE.
       1942 B7 57           A        STA    AUX      SAVE MS BYTE.
       1944 BF 58           A        STX    AUX+1    SAVE LS BYTE.
       1946 19 00           A SAMRET BCLR   FREEZE,PORTA RELEASE TRACKING REGISTER.
       1948 81                       RTS             RETURN.
                              * SUMS
                              ******************************************************
                              *                                                    *
                              *  SUMS:  MULTIPLIES THE VOLTAGE AND CURRENT TIMES   *
                              *         THE PHASE ANGLE TRIG VALUES AND SUMS THE   *
                              *         RESULTS.                                   *
                              *                                                    *
                              *         CALLING SEQUENCE:                          *
                              *             JSR SUMS                               *
                              *             RETURN                                 *
                              *                                                    *
                              ******************************************************

              1949          A SUMS   EQU    *
       1949 AE 1E           A        LDX    #VOLTS   MOVE VOLTAGE TO BUFFER.
       194B CD 19AA         A        JSR    ABSVAL
       194E BE 21           A        LDX    TRIGIX   GET TRIG VALUE INDEX.
       1950 D6 1832         A        LDA    COSINE,X MOVE TRIG VALUE TO BUFFER.
       1953 B7 25           A        STA    MLTBUF+3
       1955 D6 1833         A        LDA    COSINE+1,X
       1958 B7 26           A        STA    MLTBUF+4
       195A CD 1CD2         A        JSR    MULT     MULTIPLY VOLTS BY COSINE.
       195D AE 3D           A        LDX    #VASUM   GET SUM ADDRESS.
       195F AD 63        19C4        BSR    ADDCOS   ADD RESULT INTO SUM.

       1961 AE 1E           A        LDX    #VOLTS   MOVE VOLTAGE TO BUFFER.
       1963 CD 19AA         A        JSR    ABSVAL
       1966 BE 21           A        LDX    TRIGIX   GET TRIG VALUE INDEX.
       1968 D6 1820         A        LDA    SINES,X  MOVE TRIG VALUE TO BUFFER.
       196B B7 25           A        STA    MLTBUF+3
```

```
00442A 196D D6 1821      A         LDA    SINES+1,X
00443A 1970 B7 26        A         STA    MLTBUF+4
00444A 1972 CD 1CD2      A         JSR    MULT      MULTIPLY VOLTS BY SINE.
00445A 1975 AE 41        A         LDX    #VBSUM    GET SUM ADDRESS.
00446A 1977 AD 57     19D0         BSR    ADDSIN    ADD RESULT INTO SUM.

00448A 1979 AE 1C        A         LDX    #CURENT   MOVE CURRENT TO BUFFER.
00449A 197B CD 19AA      A         JSR    ABSVAL
00450A 197E BE 21        A         LDX    TRIGIX    GET TRIG VALUE INDEX.
00451A 1980 D6 1832      A         LDA    COSINE,X MOVE TRIG VALUE TO BUFFER.
00452A 1983 B7 25        A         STA    MLTBUF+3
00453A 1985 D6 1833      A         LDA    COSINE+1,X
00454A 1988 B7 26        A         STA    MLTBUF+4
00455A 198A CD 1CD2      A         JSR    MULT      MULTIPLY CURRENT BY COSINE.
00456A 198D AE 45        A         LDX    #IASUM    GET SUM ADDRESS.
00457A 198F AD 33     19C4         BSR    ADDCOS    ADD RESULT INTO SUM.

00459A 1991 AE 1C        A         LDX    #CURENT   MOVE CURRENT TO BUFFER.
00460A 1993 CD 19AA      A         JSR    ABSVAL
00461A 1996 BE 21        A         LDX    TRIGIX    GET TRIG VALUE INDEX.
00462A 1998 D6 1820      A         LDA    SINES,X   MOVE TRIG VALUE TO BUFFER.
00463A 199B B7 25        A         STA    MLTBUF+3
00464A 199D D6 1821      A         LDA    SINES+1,X
00465A 19A0 B7 26        A         STA    MLTBUF+4
00466A 19A2 CD 1CD2      A         JSR    MULT      MULTIPLY VOLTS BY SINE.
00467A 19A5 AE 49        A         LDX    #IBSUM    GET SUM ADDRESS.
00468A 19A7 AD 27     19D0         BSR    ADDSIN    ADD RESULT INTO SUM.
00470A 19A9 81                     RTS              RETURN.
00472                        * SUMS
00473                        *****************************************************
00474                        *
00475                        *   ABSVAL:  MOVES THE ABSOLUTE VALUE OF THE VALUE AT
00476                        *            X TO THE MULTIPLY BUFFER AND SETS THE SIGN
00477                        *            FLAG FOR LATER USE.
00478                        *
00479                        *            CALLING SEQUENCE:
00480                        *                X = VALUE ADDRESS
00481                        *                JSR ABSVAL
00482                        *                RETURN
00483                        *                ABSIGN = SIGN FLAG ($FF = NEGATIVE)
00484                        *
00485                        *****************************************************


00487              19AA      A ABSVAL EQU    *
00488A 19AA F6                     LDA    0,X       MOVE VALUE TO BUFFER.
00489A 19AB B7 23        A         STA    MLTBUF+1
00490A 19AD E6 01        A         LDA    1,X
00491A 19AF B7 24        A         STA    MLTBUF+2
00492A 19B1 3F 64        A         CLR    ABSIGN    RESET SIGN FLAG.
00493A 19B3 3D 23        A         TST    MLTBUF+1 VALUE POSITIVE?
00494A 19B5 2A 0C     19C3         BPL    ABSRET    YES.  RETURN WITH ABSIGN=0.
00495A 19B7 33 23        A         COM    MLTBUF+1 NO.  TWOS COMPLEMENT VALUE.
00496A 19B9 33 24        A         COM    MLTBUF+2
00497A 19BB 3C 24        A         INC    MLTBUF+2
00498A 19BD 26 02     19C1         BNE    ABSNEG    CARRY?  NO.
00499A 19BF 3C 23        A         INC    MLTBUF+1 YES.  BUMP MS BYTE.
00500A 19C1 33 64        A ABSNEG COM    ABSIGN    SET NEGATIVE VALUE FLAG.
00501A 19C3 81             ABSRET RTS              RETURN.
00503                        * SUMS
00504                        *****************************************************
00505                        *
00506                        *   ADDCOS:  ADDS THE SIGNED COSINE PRODUCT TO THE SUM.
00507                        *   ADDSIN:  ADDS THE SIGNED SINE PRODUCT TO THE SUM.
00508                        *
00509                        *            CALLING SEQUENCE:
00510                        *                ABSIGN = VALUE SIGN ($00 = POSITIVE)
00511                        *                                    ($FF = NEGATIVE)
00512                        *                X = SUM ADDRESS
00513                        *                JSR ADDCOS/ADDSIN
00514                        *                RETURN
00515                        *
00516                        *****************************************************
```

```
00518            19C4       A ADDCOS EQU    *
00519A 19C4 B6 21           A        LDA    TRIGIX    GET TRIG INDEX.
00520A 19C6 A1 06           A        CMP    #6        VALUE POSITIVE?
00521A 19C8 25 0C      19D6          BLO    ASPOS     YES.  TEST RESULT SIGN.
00522A 19CA A1 0E           A        CMP    #14       NO.  VALUE NEGATIVE?
00523A 19CC 25 0A      19D8          BLO    ASNEG     YES.  TEST RESULT SIGN.
00524A 19CE 20 06      19D6          BRA    ASPOS     POSITIVE.  TEST RESULT SIGN.

00526            19D0       A ADDSIN EQU    *
00527A 19D0 B6 21           A        LDA    TRIGIX    GET TRIG INDEX.
00528A 19D2 A1 0A           A        CMP    #10       IS TRIG VALUE POSITIVE?
00529A 19D4 24 02      19D8          BHS    ASNEG     NO.
00530A 19D6 33 64           A ASPOS  COM    ABSIGN    INVERT SIGN FLAG.
00531A 19D8 3D 64           A ASNEG  TST    ABSIGN    IS VALUE NEGATIVE?
00532A 19DA 26 1A      19F6          BNE    ASADD     YES.  ADD RESULT.
00533A 19DC 20 00      19DE          BRA    ASSUB     NO.  SUBTRACT RESULT.
00534A 19DE E6 03           A ASSUB  LDA    3,X       NO.  SUBTRACT VALUE FROM SUM.
00535A 19E0 B0 24           A        SUB    MLTBUF+2
00536A 19E2 E7 03           A        STA    3,X
00537A 19E4 E6 02           A        LDA    2,X
00538A 19E6 B2 23           A        SBC    MLTBUF+1
00539A 19E8 E7 02           A        STA    2,X
00540A 19EA E6 01           A        LDA    1,X
00541A 19EC B2 28           A        SBC    MLTBUF+6
00542A 19EE E7 01           A        STA    1,X
00543A 19F0 F6                       LDA    0,X
00544A 19F1 B2 27           A        SBC    MLTBUF+5
00545A 19F3 F7                       STA    0,X
00546A 19F4 20 16      1A0C          BRA    ASRET     RETURN.
00547A 19F6 E6 03           A ASADD  LDA    3,X       ADD VALUE TO SUM.
00548A 19F8 BB 24           A        ADD    MLTBUF+2
00549A 19FA E7 03           A        STA    3,X
00550A 19FC E6 02           A        LDA    2,X
00551A 19FE B9 23           A        ADC    MLTBUF+1
00552A 1A00 E7 02           A        STA    2,X
00553A 1A02 E6 01           A        LDA    1,X
00554A 1A04 B9 28           A        ADC    MLTBUF+6
00555A 1A06 E7 01           A        STA    1,X
00556A 1A08 F6                       LDA    0,X
00557A 1A09 B9 27           A        ADC    MLTBUF+5
00558A 1A0B F7                       STA    0,X
00559A 1A0C 81                ASRET  RTS              RETURN.
00561                         * COMPUT
00562                         *****************************************************
00563                         *                                                   *
00564                         *   COMPUT:  PERFORMS NECESSARY DATA MANIPULATIONS.  *
00565                         *                                                   *
00566                         *            CALLING SEQUENCE:                      *
00567                         *                JSR COMPUT                         *
00568                         *                RETURN                             *
00569                         *                                                   *
00570                         *  C. 35 MS                                         *
00571                         *****************************************************


00573            1A0D       A COMPUT EQU    *
00574A 1A0D C6 1844         A        LDA    DIVIDR    MOVE DIVISOR TO BUFFER.
00575A 1A10 B7 37           A        STA    ACCSHF+2
00576A 1A12 C6 1845         A        LDA    DIVIDR+1
00577A 1A15 B7 38           A        STA    ACCSHF+3
00578A 1A17 AE 3D           A        LDX    #VASUM    GET FOURIER VOLTAGE SUM
00579A 1A19 CD 1BFA         A        JSR    DIVABS    GET DIVIDEND ABSOLUTE VALUE.
00580A 1A1C CD 1C31         A        JSR    DIV4X2    DIVIDE VALUE.
00581A 1A1F CD 1C1A         A        JSR    DIVCNV    RECONVERT TO SIGNED RESULT.
00582A 1A22 E6 02           A        LDA    2,X       MOVE VALUE TO DATA BUFFER.
00583A 1A24 B7 4F           A        STA    VA
00584A 1A26 E6 03           A        LDA    3,X
00585A 1A28 B7 50           A        STA    VA+1

00587A 1A2A C6 1844         A        LDA    DIVIDR    MOVE DIVISOR TO BUFFER.
00588A 1A2D B7 37           A        STA    ACCSHF+2
00589A 1A2F C6 1845         A        LDA    DIVIDR+1
00590A 1A32 B7 38           A        STA    ACCSHF+3
```

```
00591A 1A34 AE 41        A         LDX   #VBSUM    GET FOURIER VOLTAGE SUM.
00592A 1A36 CD 1BFA      A         JSR   DIVABS    GET DIVIDEND ABSOLUTE VALUE.
00593A 1A39 CD 1C31      A         JSR   DIV4X2    DIVIDE VALUE.
00594A 1A3C CD 1C1A      A         JSR   DIVCNV    RECONVERT TO SIGNED RESULT.
00595A 1A3F E6 02        A         LDA   2,X       MOVE VALUE TO DATA BUFFER.
00596A 1A41 B7 51        A         STA   VB
00597A 1A43 E6 03        A         LDA   3,X
00598A 1A45 B7 52        A         STA   VB+1

00600A 1A47 C6 1844      A         LDA   DIVIDR    MOVE DIVISOR TO BUFFER.
00601A 1A4A B7 37        A         STA   ACCSHF+2
00602A 1A4C C6 1845      A         LDA   DIVIDR+1
00603A 1A4F B7 38        A         STA   ACCSHF+3
00604A 1A51 AE 45        A         LDX   #IASUM    GET FOURIER CURRENT SUM.
00605A 1A53 CD 1BFA      A         JSR   DIVABS    GET DIVIDEND ABSOLUTE VALUE.
00606A 1A56 CD 1C31      A         JSR   DIV4X2    DIVIDE VALUE.
00607A 1A59 CD 1C1A      A         JSR   DIVCNV    RECONVERT TO SIGNED RESULT.
00608A 1A5C E6 02        A         LDA   2,X       MOVE VALUE TO DATA BUFFER.
00609A 1A5E B7 53        A         STA   IA
00610A 1A60 E6 03        A         LDA   3,X
00611A 1A62 B7 54        A         STA   IA+1

00613A 1A64 C6 1844      A         LDA   DIVIDR    MOVE DIVISOR TO BUFFER.
00614A 1A67 B7 37        A         STA   ACCSHF+2
00615A 1A69 C6 1845      A         LDA   DIVIDR+1
00616A 1A6C B7 38        A         STA   ACCSHF+3
00617A 1A6E AE 49        A         LDX   #IBSUM    GET FOURIER CURRENT SUM.
00618A 1A70 CD 1BFA      A         JSR   DIVABS    GET DIVIDEND ABSOLUTE VALUE.
00619A 1A73 CD 1C31      A         JSR   DIV4X2    DIVIDE VALUE.
00620A 1A76 CD 1C1A      A         JSR   DIVCNV    RECONVERT TO SIGNED RESULT.
00621A 1A79 E6 02        A         LDA   2,X       MOVE VALUE TO DATA BUFFER.
00622A 1A7B B7 55        A         STA   IB
00623A 1A7D E6 03        A         LDA   3,X
00624A 1A7F B7 56        A         STA   IB+1

00626A 1A81 81                     RTS             RETURN.
00628                    * CRC12
00629                    ***********************************************************
00630                    *                                                         *
00631                    *   CRC12:  COMPUTES A CYCLIC REDUNDANCY CHECK VALUE      *
00632                    *           FOR THE DATA IN THE DATA BUFFER.              *
00633                    *                                                         *
00634                    *           CALLING SEQUENCE:                             *
00635                    *              JSR CRC12                                  *
00636                    *              RETURN                                     *
00637                    *                                                         *
00638                    ***********************************************************


00640          1A82      A CRC12   EQU   *
00641A 1A82 A6 09        A         LDA   #9        SET BYTE COUNTER.
00642A 1A84 B7 62        A         STA   CRCCNT
00643A 1A86 3F 59        A         CLR   CRCVAL    INITIALIZE CRC VALUE.
00644A 1A88 3F 5A        A         CLR   CRCVAL+1
00645A 1A8A AE 4D        A         LDX   #DATBUF   GET DATA BUFFER START ADDRESS.
00646A 1A8C F6             CRCNXT  LDA   0,X       GET MS 4 BITS.
00647A 1A8D A4 0F        A         AND   #$0F
00648A 1A8F B8 59        A         EOR   CRCVAL    OR INTO CRC VALUE.
00649A 1A91 B7 59        A         STA   CRCVAL
00650A 1A93 5C                     INX             BUMP DATA POINTER.
00651A 1A94 F6                     LDA   0,X       GET NEXT MS 2 BITS.
00652A 1A95 A4 C0        A         AND   #$C0
00653A 1A97 B8 5A        A         EOR   CRCVAL+1  OR INTO CRC VALUE.
00654A 1A99 B7 5A        A         STA   CRCVAL+1
00655A 1A9B AD 1B     1AB8         BSR   CPOLY     OR CRC WITH POLYNOMIAL.
00656A 1A9D F6                     LDA   0,X       GET MS 4 BITS.
00657A 1A9E 44                     LSRA
00658A 1A9F 44                     LSRA
00659A 1AA0 A4 0F        A         AND   #$0F
00660A 1AA2 B8 59        A         EOR   CRCVAL    OR INTO CRC VALUE.
00661A 1AA4 B7 59        A         STA   CRCVAL
00662A 1AA6 F6                     LDA   0,X       GET LS 2 BITS.
00663A 1AA7 47                     ASRA            SHIFT TO BITS 7,6.
```

```
00664A 1AA8 46                    RORA
00665A 1AA9 46                    RORA
00666A 1AAA A4 C0        A        AND      #$C0
00667A 1AAC B8 5A        A        EOR      CRCVAL+1
00668A 1AAE B7 5A        A        STA      CRCVAL+1
00669A 1AB0 5C                    INX               BUMP DATA POINTER.
00670A 1AB1 AD 05     1AB8        BSR      CPOLY    OR CRC WITH POLYNOMIAL.
00671A 1AB3 3A 62        A        DEC      CRCCNT   DONE?
00672A 1AB5 26 D5     1A8C        BNE      CRCNXT   NO.  CONTINUE.
00673A 1AB7 81                    RTS               YES.  RETURN.
00675                    * CRC12
00676                    *****************************************************
00677                    *                                                   *
00678                    *   CPOLY:  PERFORMS THE EXCLUSIVE OR OF THE CRC    *
00679                    *           VALUE WITH THE POLYNOMIAL.              *
00680                    *                                                   *
00681                    *           CALLING SEQUENCE:                       *
00682                    *              JSR CPOLY                            *
00683                    *              RETURN                               *
00684                    *              X IS PRESERVED                       *
00685                    *                                                   *
00686                    *****************************************************

00688          1AB8      A CPOLY  EQU      *
00689A 1AB8 A6 06        A        LDA      #6        SET SHIFT COUNTER.
00690A 1ABA B7 63        A        STA      SHFCNT
00691A 1ABC 38 5A        A CP00   ASL      CRCVAL+1 SHIFT CRC VALUE.
00692A 1ABE 39 59        A        ROL      CRCVAL
00693A 1AC0 09 59 0C 1ACF         BRCLR    4,CRCVAL,CP01 BIT 12 SET?  NO.
00694A 1AC3 B6 59        A        LDA      CRCVAL    YES.  OR WITH POLYNOMIAL.
00695A 1AC5 A8 18        A        EOR      #POLY1
00696A 1AC7 B7 59        A        STA      CRCVAL
00697A 1AC9 B6 5A        A        LDA      CRCVAL+1
00698A 1ACB A8 0F        A        EOR      #POLY2
00699A 1ACD B7 5A        A        STA      CRCVAL+1
00700A 1ACF 3A 63        A CP01   DEC      SHFCNT    DONE?
00701A 1AD1 26 E9     1ABC        BNE      CP00      NO.  CONTINUE SHIFTING.
00702A 1AD3 81                    RTS                YES.  RETURN.
00704                    * SHIFT
00705                    *****************************************************
00706                    *                                                   *
00707                    *   SHIFT:  LOADS THE SHIFT REGISTER WITH CURRENT   *
00708                    *           DATA.                                   *
00709                    *                                                   *
00710                    *           CALLING SEQUENCE:                       *
00711                    *              JSR SHIFT                            *
00712                    *              RETURN                               *
00713                    *                                                   *
00714                    *****************************************************

00716          1AD4      A SHIFT  EQU      *
00717A 1AD4 A6 07        A        LDA      #7        SET WORD COUNT.
00718A 1AD6 B7 5B        A        STA      BYTCNT
00719A 1AD8 AE 4D        A        LDX      #DATBUF   GET DATA BUFFER START.
00720A 1ADA F6             SHFNXT LDA      0,X       GET A BYTE.
00721A 1ADB 5C                    INCX               BUMP DATA POINTER.
00722A 1ADC 48                    ASLA               DISCARD UNUSED BITS.
00723A 1ADD 48                    ASLA
00724A 1ADE 48                    ASLA
00725A 1ADF 48                    ASLA
00726A 1AE0 AD 17     1AF9        BSR      SHIFT4    TOGGLE INTO SHIFT REGISTER.
00727A 1AE2 F6                    LDA      0,X       GET NEXT BYTE.
00728A 1AE3 5C                    INCX
00729A 1AE4 AD 13     1AF9        BSR      SHIFT4    TOGGLE INTO SHIFT REGISTER.
00730A 1AE6 AD 11     1AF9        BSR      SHIFT4    TOGGLE INTO SHIFT REGISTER.
00731A 1AE8 3A 5B        A        DEC      BYTCNT    DONE?
00732A 1AEA 26 EE     1ADA        BNE      SHFNXT    NO.
00733A 1AEC A6 00        A        LDA      #0        YES.  FILL UP 96 BIT REGISTER.
00734A 1AEE AD 09     1AF9        BSR      SHIFT4    SHIFT IN 4 ZEROS.
00735A 1AF0 AD 07     1AF9        BSR      SHIFT4    SHIFT IN FOUR ZEROS.
```

```
1AF2 AE 03          A         LDX    #3
1AF4 AD 07       1AFD         BSR    SHFAGN   SHIFT IN ANOTHER 3 ZEROS.
1AF6 16 01          A         BSET   STATUS,PORTB SET STATUS FLAG FOR TEST.
1AF8 81                       RTS             RETURN.


            1AF9    A SHIFT4 EQU    *
1AF9 BF 5C          A         STX    XTEMP    SAVE X.
1AFB AE 04          A         LDX    #4       SET BIT COUNT.
1AFD 48               SHFAGN ASLA            GET NEXT BIT.
1AFE 24 04       1B04         BCC    SHFCLR   SET?  NO.
1B00 10 01          A         BSET   SHFTIN,PORTB YES.  SET DATA BIT.
1B02 20 02       1B06         BRA    SHFTOG
1B04 11 01          A SHFCLR BCLR   SHFTIN,PORTB CLEAR DATA BIT.
1B06 18 01          A SHFTOG BSET   SHFCLK,PORTB TOGGLE DATA SHIFT CLOCK.
1B08 19 01          A         BCLR   SHFCLK,PORTB
1B0A 5A                       DECX            DONE?
1B0B 26 F0       1AFD         BNE    SHFAGN   NO.
1B0D BE 5C          A         LDX    XTEMP    YES.  RESTORE X.
1B0F 81                       RTS             RETURN.
                      * XMIT
                      ******************************************************
                      *                                                    *
                      *    XMIT:  TRANSMITS THE DATA BLOCK.                *
                      *                                                    *
                      *           CALLING SEQUENCE:                        *
                      *               JSR XMIT                             *
                      *               RETURN                               *
                      *                                                    *
                      ******************************************************


            1B10    A XMIT   EQU    *
1B10 3D 15          A         TST    ZCFLAG   ZERO CROSSING OCCURRED?
1B12 27 FC       1B10         BEQ    XMIT     NO.
1B14 3F 15          A         CLR    ZCFLAG   YES.  RESET FLAG.
1B16 C7 1000        A         STA    WDOG     KICK WATCHDOG TIMER.
1B19 B6 16          A         LDA    ZCCNT    TIME TO TRANSMIT?
1B1B B1 13          A         CMPA   XMTTIM
1B1D 26 F1       1B10         BNE    XMIT     NO.
1B1F B6 17          A         LDA    ZCCNT+1  MAYBE.
1B21 B1 14          A         CMPA   XMTTIM+1 TIME TO TRANSMIT?
1B23 25 EB       1B10         BLO    XMIT     NO.
1B25 14 01          A         BSET   XMTTER,PORTB YES.  ENABLE TRANSMITTER.
1B27 A6 4E          A         LDA    #CLKINT  DISABLE CLOCK INTERRUPTS.
1B29 B7 09          A         STA    CLOKCR
1B2B A6 0A          A         LDA    #10
1B2D B7 08          A         STA    CLOCK    SET CLOCK FOR 1 MS.
1B2F B6 08          A XMWAIT LDA    CLOCK    GET CURRENT CLOCK VALUE.
1B31 26 FC       1B2F         BNE    XMWAIT   TIME UP?  NO.
1B33 A6 78          A         LDA    #CLKEXT  YES.  SET UP CLOCK FOR EXT. INPUT
1B35 B7 09          A         STA    CLOKCR
1B37 A6 57          A         LDA    #XBITS+XDELAY SET DATA BIT COUNT.
1B39 B7 08          A         STA    CLOCK
1B3B 13 01          A         BCLR   MANCTL,PORTB ENABLE MANCHESTER ENCODER.
1B3D B6 08          A XMWMAN LDA    CLOCK    ALL DATA TRANSMITTED?
1B3F 26 FC       1B3D         BNE    XMWMAN   NO.
1B41 12 01          A         BSET   MANCTL,PORTB YES.  DISABLE MANCHESTER ENCO
1B43 15 01          A         BCLR   XMTTER,PORTB DISABLE TRANSMITTER.
1B45 A6 4E          A         LDA    #CLKINT  SET CLOCK FOR INTERNAL OSCILLATOR
1B47 B7 09          A         STA    CLOKCR
1B49 81                       RTS             RETURN.
                      * INTRPT
                      ******************************************************
                      *
                      *   ZCINT:  PROCESSES ZERO CROSSING INTERRUPTS.
                      *
                      *           CALLING SEQUENCE:
                      *               FROM HARDWARE IRQ VECTOR
                      *               RETURN FROM INTERRUPT
                      *
                      ******************************************************
```

```
00809          1B4A     A ZCINT  EQU    *
00810A 1B4A 3D 1B       A        TST    START    TIME TO INITIATE CYCLE?
00811A 1B4C 27 12    1B60        BEQ    ZCGO     NO.
00812A 1B4E 18 00       A        BSET   FREEZE,PORTA YES.  FREEZE ANALOGS.
00813A 1B50 3F 1B       A        CLR    START    RESET CYCLE INITIATE FLAG.
00814A 1B52 A6 01       A        LDA    #1
00815A 1B54 B7 19       A        STA    SMPFLG   SET TIME TO SAMPLE FLAG.
00816A 1B56 17 01       A        BCLR   STATUS,PORTB CLEAR STATUS BIT.
00817A 1B58 B6 11       A        LDA    CYCTIM   SET CLOCK.
00818A 1B5A B7 08       A        STA    CLOCK
00819A 1B5C A6 0E       A        LDA    #CLKIRQ  ENABLE CLOCK INTERRUPTS.
00820A 1B5E B7 09       A        STA    CLOKCR
00821A 1B60 3D 1A       A ZCGO   TST    SYNFLG   INITIATE SYNC MODE?
00822A 1B62 27 0A    1B6E        BEQ    ZCBUMP   NO.
00823A 1B64 A6 4E       A        LDA    #CLKINT  YES.  RESET CLOCK PRESCALER.
00824A 1B66 B7 09       A        STA    CLOKCR
00825A 1B68 A6 FF       A        LDA    #$FF
00826A 1B6A B7 08       A        STA    CLOCK    INITIALIZE CLOCK VALUE.
00827A 1B6C 3F 1A       A        CLR    SYNFLG   RESET SYNC MODE FLAG.
00828A 1B6E B6 08       A ZCBUMP LDA    CLOCK    GET CURRENT CLOCK READING.
00829A 1B70 43                   COMA            COMPLEMENT TO GET ELAPSED TIME.
00830A 1B71 B7 10       A        STA    LSTTIM   SAVE AS LAST CYCLE TIME.
00831A 1B73 A6 01       A        LDA    #1       SET ZERO CROSSING OCCURRED FLAG.
00832A 1B75 B7 15       A        STA    ZCFLAG
00833A 1B77 3C 17       A        INC    ZCCNT+1  BUMP ZERO CROSSING COUNT.
00834A 1B79 26 02    1B7D        BNE    ZCRET    CARRY?  NO.
00835A 1B7B 3C 16       A        INC    ZCCNT    YES.  BUMP MS BYTE.
00836A 1B7D 80            ZCRET  RTI             RETURN.
00838                     * INTRPT
00839                     *****************************************************
00840                     *                                                   *
00841                     *   CLINT:  PROCESSES CLOCK INTERRUPTS.             *
00842                     *                                                   *
00843                     *          CALLING SEQUENCE:                        *
00844                     *              FROM HARDWARE CLOCK VECTOR           *
00845                     *              RETURN FROM INTERRUPT                *
00846                     *                                                   *
00847                     *****************************************************


00849          1B7E     A CLINT  EQU    *
00850A 1B7E 18 00       A        BSET   FREEZE,PORTA FREEZE ANALOG VALUES.
00851A 1B80 1F 09       A        BCLR   7,CLOKCR RESET IRQ FLAG.
00852A 1B82 A6 01       A        LDA    #1
00853A 1B84 B7 19       A        STA    SMPFLG   SET TIME TO SAMPLE FLAG.
00854A 1B86 BE 11       A        LDX    CYCTIM   RESET CLOCK.
00855A 1B88 B6 12       A        LDA    REMAIN   GET TIMER REMAINDER VALUE.
00856A 1B8A BB 61       A        ADD    CLKREM   ADD TO REMAINDER ACCUMULATOR.
00857A 1B8C B7 61       A        STA    CLKREM
00858A 1B8E 24 01    1B91        BCC    CLKSTR   CARRY?  NO.
00859A 1B90 5C                   INX             YES.  ADJUST TIMER VALUE.
00860A 1B91 BF 08       A CLKSTR STX    CLOCK
00861A 1B93 80                   RTI             RETURN.
00863                     * READAC
00864                     *****************************************************
00865                     *                                                   *
00866                     *  READAC:  READS THE DAC/COMPARATOR CIRCUIT TO     *
00867                     *           DETERMINE TRANSDUCER VALUES.            *
00868                     *                                                   *
00869                     *           CALLING SEQUENCE:                       *
00870                     *               JSR READAC                          *
00871                     *               RETURN                              *
00872                     *               A,X = 12 BIT VALUE                  *
00873                     *                                                   *
00874                     *****************************************************


00876          1B94     A READAC EQU    *
00877A 1B94 AE 08       A        LDX    #$08     GET INITIAL TEST VALUE.
00878A 1B96 BF 5D       A        STX    VALUE    SAVE AS MS TEST VALUE.
00879A 1B98 BF 5F       A        STX    VALINC   SAVE AS MS INCREMENTAL VALUE.
00880A 1B9A AE 00       A        LDX    #0
```

```
00881A 1B9C BF 5E        A        STX    VALUE+1  RESET LS TEST VALUE.
00882A 1B9E BF 60        A        STX    VALINC+1 RESET LS INCREMENTAL VALUE.

00884A 1BA0 3D 5F        A RDLOOP TST    VALINC   GET INCREMENATAL VALUE.
00885A 1BA2 26 04     1BA8        BNE    RDMORE   DONE?  NO.  CONTINUE.
00886A 1BA4 3D 60        A        TST    VALINC+1 MAYBE.  CHECK LS BYTE.
00887A 1BA6 27 43     1BEB        BEQ    RDEND    DONE?  YES.
00888A 1BA8 B6 5E        A RDMORE LDA    VALUE+1  NO.  GET LS NIBBLE OF VALUE.
00889A 1BAA A4 0F        A        AND    #$0F
00890A 1BAC C7 1000      A        STA    DAC00    WRITE TO DAC.
00891A 1BAF B6 5E        A        LDA    VALUE+1  GET MIDDLE NIBBLE.
00892A 1BB1 44                    LSRA
00893A 1BB2 44                    LSRA
00894A 1BB3 44                    LSRA
00895A 1BB4 44                    LSRA
00896A 1BB5 C7 1001      A        STA    DAC01    WRITE TO DAC.
00897A 1BB8 B6 5D        A        LDA    VALUE    GET MS NIBBLE.
00898A 1BBA A4 0F        A        AND    #$0F
00899A 1BBC C7 1002      A        STA    DAC02    WRITE TO DAC.
00900A 1BBF C7 1003      A        STA    DAC03    INITIATE CONVERSION.
00901A 1BC2 A6 0A        A        LDA    #10      GIVE DAC A CHANCE TO THINK.
00902A 1BC4 4A             RDWAIT DECA            WAITED LONG ENOUGH?
00903A 1BC5 26 FD     1BC4        BNE    RDWAIT   NO.
00904A 1BC7 34 5F        A        LSR    VALINC   YES.  DIVIDE INCREMENTAL VALUE BY
00905A 1BC9 36 60        A        ROR    VALINC+1
00906A 1BCB B6 01        A        LDA    PORTB    GET COMPARATOR VALUE.
00907A 1BCD 2A 0E     1BDD        BPL    RDADD    GREATER THAN?  YES.

00909A 1BCF B6 5E        A        LDA    VALUE+1  NO.  GET VALUE.
00910A 1BD1 B2 60        A        SBC    VALINC+1 SUBTRACT INCREMENTAL VALUE.
00911A 1BD3 B7 5E        A        STA    VALUE+1
00912A 1BD5 B6 5D        A        LDA    VALUE
00913A 1BD7 B2 5F        A        SBC    VALINC
00914A 1BD9 B7 5D        A        STA    VALUE
00915A 1BDB 20 C3     1BA0        BRA    RDLOOP   TEST AGAIN.

00917A 1BDD B6 5E        A RDADD  LDA    VALUE+1  GET VALUE.
00918A 1BDF BB 60        A        ADD    VALINC+1 ADD INCREMENTAL VALUE.
00919A 1BE1 B7 5E        A        STA    VALUE+1
00920A 1BE3 B6 5D        A        LDA    VALUE
00921A 1BE5 B9 5F        A        ADC    VALINC
00922A 1BE7 B7 5D        A        STA    VALUE
00923A 1BE9 20 B5     1BA0        BRA    RDLOOP   TEST AGAIN.

00925A 1BEB B6 5D        A RDEND  LDA    VALUE    GET MS VALUE BYTE.
00926A 1BED A5 08        A        BIT    #$08     IS MS VALUE BIT SET?
00927A 1BEF 26 04     1BF5        BNE    RDSET    YES.
00928A 1BF1 AA F8        A        ORA    #$F8     NO.  CONVERT TO NEGATIVE TWOS CO
00929A 1BF3 20 02     1BF7        BRA    RDRET
00930A 1BF5 A4 07        A RDSET  AND    #$07     CONVERT TO POSITIVE TWOS COMPLEME
00931A 1BF7 BE 5E        A RDRET  LDX    VALUE+1
00932A 1BF9 81                    RTS             RETURN.
00934                      * DIVUTL
00935                      ***********************************************************
00936                      *                                                         *
00937                      *    DIVABS:  GETS THE TWO'S COMPLEMENT OF THE VALUE      *
00938                      *             AT X, IF NEGATIVE, AND SETS A SIGN FLAG.    *
00939                      *                                                         *
00940                      *             CALLING SEQUENCE:                           *
00941                      *                  X = VALUE ADDRESS (4 BYTES)            *
00942                      *                  JSR DIVABS                             *
00943                      *                  RETURN                                 *
00944                      *                  ABSIGN = SIGN ($FF = NEGATIVE)         *
00945                      *                                ($00 = POSITIVE)         *
00946                      *                                                         *
00947                      ***********************************************************
00949            1BFA    A DIVABS EQU    *
00950A 1BFA 3F 64        A        CLR    ABSIGN   RESET NEGATIVE VALUE FLAG.
00951A 1BFC 7D                    TST    0,X      NEGATIVE VALUE?
00952A 1BFD 2A 05     1C04        BPL    DARET    NO.
00953A 1BFF CD 1C05      A        JSR    COMP2    YES.  TWO'S COMPLEMENT IT.
00954A 1C02 33 64        A        COM    ABSIGN   SET NEGATIVE VALUE FLAG.
00955A 1C04 81             DARET  RTS             RETURN.
```

```
                                * DIVUTL
                                ****************************************************
                                *                                                  *
                                *   COMP2:  GETS THE TWO'S COMPLEMENT OF THE VALUE *
                                *           AT X.                                  *
                                *                                                  *
                                *             CALLING SEQUENCE:                    *
                                *                 X = VALUE ADDRESS (4 BYTES)      *
                                *                 JSR COMP2                        *
                                *                 RETURN                           *
                                *                                                  *
                                ****************************************************


            1C05      A COMP2  EQU     *
 1C05 73                       COM     0,X       GET TWO'S COMPLEMENT.
 1C06 63 01           A        COM     1,X
 1C08 63 02           A        COM     2,X
 1C0A 63 03           A        COM     3,X
 1C0C 6C 03           A        INC     3,X
 1C0E 26 09    1C19            BNE     CMPRET    CARRY? NO.
 1C10 6C 02           A        INC     2,X       YES.  PROPAGATE IT.
 1C12 26 05    1C19            BNE     CMPRET    CARRY?  NO.
 1C14 6C 01           A        INC     1,X       YES.  PROPAGATE IT.
 1C16 26 01    1C19            BNE     CMPRET    CARRY?  NO.
 1C18 7C                       INC     0,X       YES.  PROPAGATE IT.
 1C19 81                CMPRET RTS               RETURN.
                                * DIVUTL
                                ****************************************************
                                *                                                  *
                                *   DIVCNV:  FINDS THE TWO'S COMPLEMENT OF THE FOUR *
                                *            BYTE VALUE AT X, IF 'ABSIGN' IS NON-ZERO. *
                                *            ALSO SHIFTS RESULT RIGHT ONE NIBBLE.  *
                                *                                                  *
                                *            CALLING SEQUENCE:                     *
                                *                X = VALUE ADDRESS                 *
                                *                JSR DIVCNV                        *
                                *                RETURN                            *
                                *                                                  *
                                ****************************************************


            1C1A      A DIVCNV EQU     *
 1C1A 3D 64           A        TST     ABSIGN    IS VALUE NEGATIVE?
 1C1C 27 02    1C20            BEQ     DCRET     NO.  RETURN.
 1C1E AD E5    1C05            BSR     COMP2     YES.  GET TWO'S COMPLEMENT.
 1C20 A6 04           A DCRET  LDA     #4        SET SHIFT COUNT.
 1C22 74                DIV16  LSR     0,X       SHIFT RIGHT ONE NIBBLE.
 1C23 66 01           A        ROR     1,X
 1C25 66 02           A        ROR     2,X
 1C27 66 03           A        ROR     3,X
 1C29 4A                       DECA              DONE?
 1C2A 26 F6    1C22            BNE     DIV16     NO.
 1C2C 81                       RTS               YES.  RETURN.
                                * DIVID9
                                ****************************************************
                                *                                                  *
                                *   DIV3X2:  DIVIDES A THREE BYTE VALUE BY A TWO   *
                                *            BYTE VALUE.                           *
                                *   DIV4X2:  DIVIDES A FOUR BYTE VALUE BY A TWO    *
                                *            BYTE VALUE.                           *
                                *                                                  *
                                *            CALLING SEQUENCE:                     *
                                *                X = ADDRESS OF DIVIDEND           *
                                *                ACCSHF+2,3 = DIVISOR              *
                                *                JSR DIV4X2/DIV3X2/DIV2X2          *
                                *                RETURN                            *
                                *                X = ADDRESS OF FOUR BYTE QUOTIENT *
                                *                                                  *
                                *   NOTE:  THIS ROUTINE HAS NO PROTECTION AGAINST  *
                                *          DIVISION BY ZERO.                       *
                                *                                                  *
                                ****************************************************
```

```
01031           1C2D      A DIV3X2 EQU    *
01032A 1C2D 3F  2D        A        CLR    ACCVAL    RESET MS BYTE.
01033A 1C2F 20  04     1C35        BRA    DIVST2
01034           1C31      A DIV4X2 EQU    *
01035A 1C31 F6                     LDA    0,X
01036A 1C32 B7  2D        A        STA    ACCVAL
01037A 1C34 5C                     INX
01038A 1C35 F6              DIVST2 LDA    0,X
01039A 1C36 B7  2E        A        STA    ACCVAL+1
01040A 1C38 5C                     INX
01041A 1C39 F6                     LDA    0,X
01042A 1C3A B7  2F        A        STA    ACCVAL+2
01043A 1C3C 5C                     INX
01044A 1C3D F6                     LDA    0,X
01045A 1C3E B7  30        A        STA    ACCVAL+3
01046A 1C40 AE  2D        A        LDX    #ACCVAL   GET DIVIDEND ADDRESS.
01047A 1C42 A6  00        A        LDA    #0
01048A 1C44 B7  35        A        STA    ACCSHF+0 RESET MS DIVISOR BYTES.
01049A 1C46 B7  36        A        STA    ACCSHF+1
01050A 1C48 B7  39        A        STA    ACCSUM+0 RESET WORKING LOCATIONS.
01051A 1C4A B7  3A        A        STA    ACCSUM+1
01052A 1C4C B7  3B        A        STA    ACCSUM+2
01053A 1C4E B7  3C        A        STA    ACCSUM+3
01054A 1C50 B7  29        A        STA    ACCQUO+0
01055A 1C52 B7  2A        A        STA    ACCQUO+1
01056A 1C54 B7  2B        A        STA    ACCQUO+2
01057A 1C56 B7  2C        A        STA    ACCQUO+3
01058A 1C58 B7  32        A        STA    ACCPOS+1
01059A 1C5A B7  33        A        STA    ACCPOS+2
01060A 1C5C B7  34        A        STA    ACCPOS+3
01061A 1C5E A6  01        A        LDA    #%00000001 SET POSITION REGISTER.
01062A 1C60 B7  34        A        STA    ACCPOS+3
01063A 1C62 AD  09     1C6D        BSR    SHFTLF    LEFT JUSTIFY VALUES.
01064A 1C64 AD  1A     1C80 DIVAGN BSR    SUBPR     PERFORM DIVIDE.
01065A 1C66 AD  59     1CC1        BSR    SHFTRT    SHIFT RIGHT.
01066A 1C68 24  FA     1C64        BCC    DIVAGN    DONE?  NO.
01067A 1C6A AE  29        A        LDX    #ACCQUO   YES.  GET QUOTIENT ADDRESS.
01068A 1C6C 81                     RTS              RETURN.
01070           1C6D      A SHFTLF EQU    *
01071A 1C6D 38  34        A        ASL    ACCPOS+3 SHIFT POSITION BIT.
01072A 1C6F 39  33        A        ROL    ACCPOS+2
01073A 1C71 39  32        A        ROL    ACCPOS+1
01074A 1C73 39  31        A        ROL    ACCPOS+0
01075A 1C75 38  38        A        ASL    ACCSHF+3 SHIFT DIVISOR.
01076A 1C77 39  37        A        ROL    ACCSHF+2
01077A 1C79 39  36        A        ROL    ACCSHF+1
01078A 1C7B 39  35        A        ROL    ACCSHF+0
01079A 1C7D 2A  EE     1C6D        BPL    SHFTLF    LEFT JUSTIFIED?  NO.
01080A 1C7F 81                     RTS              YES.  RETURN.


01082           1C80      A SUBPR  EQU    *
01083A 1C80 E6  03        A        LDA    3,X
01084A 1C82 B0  38        A        SUB    ACCSHF+3
01085A 1C84 B7  3C        A        STA    ACCSUM+3
01086A 1C86 E6  02        A        LDA    2,X
01087A 1C88 B2  37        A        SBC    ACCSHF+2
01088A 1C8A B7  3B        A        STA    ACCSUM+2
01089A 1C8C E6  01        A        LDA    1,X
01090A 1C8E B2  36        A        SBC    ACCSHF+1
01091A 1C90 B7  3A        A        STA    ACCSUM+1
01092A 1C92 F6                     LDA    0,X
01093A 1C93 B2  35        A        SBC    ACCSHF+0
01094A 1C95 B7  39        A        STA    ACCSUM+0
01095A 1C97 25  27     1CC0        BCS    SURET     BORROW?  YES.
01096A 1C99 B6  29        A        LDA    ACCQUO+0
01097A 1C9B BA  31        A        ORA    ACCPOS+0
01098A 1C9D B7  29        A        STA    ACCQUO+0
01099A 1C9F B6  2A        A        LDA    ACCQUO+1
01100A 1CA1 BA  32        A        ORA    ACCPOS+1
01101A 1CA3 B7  2A        A        STA    ACCQUO+1
01102A 1CA5 B6  2B        A        LDA    ACCQUO+2
01103A 1CA7 BA  33        A        ORA    ACCPOS+2
```

```
01104A 1CA9 B7 2B        A        STA    ACCQUO+2
01105A 1CAB B6 2C        A        LDA    ACCQUO+3
01106A 1CAD BA 34        A        ORA    ACCPOS+3
01107A 1CAF B7 2C        A        STA    ACCQUO+3
01108A 1CB1 B6 39        A        LDA    ACCSUM+0
01109A 1CB3 F7                    STA    0,X
01110A 1CB4 B6 3A        A        LDA    ACCSUM+1
01111A 1CB6 E7 01        A        STA    1,X
01112A 1CB8 B6 3B        A        LDA    ACCSUM+2
01113A 1CBA E7 02        A        STA    2,X
01114A 1CBC B6 3C        A        LDA    ACCSUM+3
01115A 1CBE E7 03        A        STA    3,X
01116A 1CC0 81             SURET  RTS             RETURN.


01118A 1CC1 34 35        A SHFTRT LSR    ACCSHF+0 SHIFT RIGHT.
01119A 1CC3 36 36        A        ROR    ACCSHF+1
01120A 1CC5 36 37        A        ROR    ACCSHF+2
01121A 1CC7 36 38        A        ROR    ACCSHF+3
01122A 1CC9 34 31        A        LSR    ACCPOS+0
01123A 1CCB 36 32        A        ROR    ACCPOS+1
01124A 1CCD 36 33        A        ROR    ACCPOS+2
01125A 1CCF 36 34        A        ROR    ACCPOS+3
01126A 1CD1 81                    RTS
01128                      * MULT
01129                      ****************************************************
01130                      *                                                  *
01131                      *  MULT:  PERFORMS A 16 BIT BY 16 BIT MULTIPLICATION.*
01132                      *                                                  *
01133                      *       CALLING SEQUENCE:                          *
01134                      *           MLTBUF+1,2 = VALUE 1                   *
01135                      *           MLTBUF+3,4 = VALUE 2                   *
01136                      *           JSR MULT                               *
01137                      *           RETURN                                 *
01138                      *           MLTBUF+5,6,1,2 = PRODUCT               *
01139                      *                                                  *
01140                      ****************************************************


01142            1CD2    A MULT   EQU    *
01143A 1CD2 AE 22        A        LDX    #MLTBUF  GET BUFFER POINTER.
01144A 1CD4 A6 10        A        LDA    #16
01145A 1CD6 F7                    STA    0,X      SET BIT COUNTER.
01146A 1CD7 6F 05        A        CLR    5,X      CLEAR PRODUCT BYTES.
01147A 1CD9 6F 06        A        CLR    6,X
01148A 1CDB 66 01        A        ROR    1,X      SHIFT MULTIPLIER.
01149A 1CDD 66 02        A        ROR    2,X
01150A 1CDF 24 0C     1CED MULNXT BCC    MULROT   BIT SHIFTED OUT?  NO.
01151A 1CE1 E6 06        A        LDA    6,X      YES.  ADD MULTIPLICAND TO PRODUCT
01152A 1CE3 EB 04        A        ADD    4,X
01153A 1CE5 E7 06        A        STA    6,X
01154A 1CE7 E6 05        A        LDA    5,X
01155A 1CE9 E9 03        A        ADC    3,X
01156A 1CEB E7 05        A        STA    5,X
01157A 1CED 66 05        A MULROT ROR    5,X
01158A 1CEF 66 06        A        ROR    6,X
01159A 1CF1 66 01        A        ROR    1,X
01160A 1CF3 66 02        A        ROR    2,X
01161A 1CF5 7A                    DEC    0,X      DONE?
01162A 1CF6 26 E7     1CDF        BNE    MULNXT   NO.
01163A 1CF8 81                    RTS             YES.  RETURN.
01164                      * PRODUCT IN MLTBUF+5,6,1,2
01166                      * RESET
01167                      ****************************************************
01168                      *                                                  *
01169                      *  RESET:  HANDLES POWER-ON RESET INITIALIZATION.  *
01170                      *                                                  *
01171                      *       CALLING SEQUENCE:                          *
01172                      *           FROM HARDWARE VECTOR                   *
01173                      *           JMP  MAIN                              *
01174                      *                                                  *
01175                      ****************************************************
```

```
01177          1CF9       A RESET  EQU    *
01178A 1CF9 9B                     SEI              INHIBIT INTERRUPTS.
01179A 1CFA 9C                     RSP              RESET STACK IF NOT A HARDWARE RES
01180A 1CFB AE 10         A        LDX    #RAMSTR   GET RAM START POINTER.
01181A 1CFD 7F              RSTCLR CLR    0,X       INITIALIZE RAM.
01182A 1CFE 5C                     INX              BUMP RAM POINTER.
01183A 1CFF A3 80         A        CPX    #RAMEND   DONE ALL?
01184A 1D01 26 FA    1CFD          BNE    RSTCLR    NO.  CONTINUE.

01186A 1D03 A6 F0         A        LDA    #$F0      SET PORT A DATA DIRECTION.
01187A 1D05 B7 04         A        STA    PADDR
01188A 1D07 A6 1F         A        LDA    #$1F      SET PORT B DATA DIRECTION.
01189A 1D09 B7 05         A        STA    PBDDR
01190A 1D0B A6 46         A        LDA    #$46      SET CLOCK (NO IRQ, DIVIDE BY 64)
01191A 1D0D B7 09         A        STA    CLOKCR
01192A 1D0F A6 FF         A        LDA    #$FF      INITIALIZE CLOCK.
01193A 1D11 B7 08         A        STA    CLOCK
01194A 1D13 15 01         A        BCLR   XMTTER,PORTB INHIBIT TRANSMITTER.
01195A 1D15 12 01         A        BSET   MANCTL,PORTB INHIBIT MANCHESTER ENCODER.
01196A 1D17 AE A0         A        LDX    #160      INITIALIZE CYCLE TIME.
01197A 1D19 BF 10         A        STX    LSTTIM
01198A 1D1B AE B2         A        LDX    #178      INITIALIZE SAMPLE TIMER VALUE.
01199A 1D1D BF 11         A        STX    CYCTIM

01201A 1D1F 9A                     CLI              ENABLE INTERRUPTS.
01202A 1D20 CC 1846       A        JMP    MAIN      JUMP TO MAINLINE.
01204                       *  UPDATES
01205                       ************************************************
01206                       *                                              *
01207                       *    PROGRAM REVISION HISTORY                  *
01208                       *                                              *
01209                       ************************************************
01210
01211                       *  00 - 08 JAN 83   INITIAL PROTOTYPE VERSION
01212                       *  01 - 10 JAN 83   MISCELLANEOUS CLEANUP
01213                       *  02 - 11 JAN 83   DIVUTL ADDED, MISC CLEANUP
01214                       *  03 - 11 JAN 83   ADDED SHIFT RIGHT TO DIVCNV
01215                       *       13 JAN 83   CORRECTED TRANSMIT TIMING
01216                       *                   ADDED SPARE AUX VALUE
01218                       * VECTOR
01219                       ****************************************************
01220                       *
01221                       *
01222                       *          HARDWARE RESET AND INTERRUPT VECTOR
01223                       *                    DEFINITIONS
01224                       *
01225                       *
01226                       ****************************************************


01228A 1FF6                        ORG    $1FF6
01229A 1FF6     1CF9      A        FDB    RESET     WAIT STATE INTERRUPT (WAI)
01230A 1FF8     1B7E      A        FDB    CLINT     CLOCK INTERRUPT VECTOR
01231A 1FFA     1B4A      A        FDB    ZCINT     INTERRUPT VECTOR (IRQ)
01232A 1FFC     1CF9      A        FDB    RESET     INTERRUPT VECTOR (SWI)
01233A 1FFE     1CF9      A        FDB    RESET     POWER ON RESET
01235                              END
TOTAL ERRORS 00000--00000


   0064 ABSIGN 00156*00492 00500 00530 00531 00950 00954 00999
   19C1 ABSNEG 00498 00500*
   19C3 ABSRET 00494 00501*
   19AA ABSVAL 00427 00438 00449 00460 00487*
   0031 ACCPOS 00120*01058 01059 01060 01062 01071 01072 01073 01074 01097 01100
               01103 01106 01122 01123 01124 01125
   0029 ACCQUO 00118*01054 01055 01056 01057 01067 01096 01098 01099 01101 01102
               01104 01105 01107
   0035 ACCSHF 00121*00284 00285 00575 00577 00588 00590 00601 00603 00614 00616
               01048 01049 01075 01076 01077 01078 01084 01087 01090 01093 01118
               01119 01120 01121
```

```
0039 ACCSUM 00122*01050 01051 01052 01053 01085 01088 01091 01094 01108 01110
            01112 01114
002D ACCVAL 00119*01032 01036 01039 01042 01045 01046
19C4 ADDCOS 00435 00457 00518*
19D0 ADDSIN 00446 00468 00526*
19F6 ASADD  00532 00547*
19D8 ASNEG  00523 00529 00531*
19D6 ASPOS  00521 00524 00530*
1A0C ASRET  00546 00559*
19DE ASSUB  00533 00534*
0057 AUX    00141*00407 00408
0040 AUX1   00114*00333
0020 AUXID  00113*00329 00334 00404
005B BYTCNT 00149*00718 00731
1832 C0     00202*
1834 C1     00203*
1836 C2     00204*
1838 C3     00205*
183A C4     00206*
183C C5     00207*
183E C6     00208*
1840 C7     00209*
1842 C8     00210*
1B7E CLINT  00849*01230
0078 CLKEXT 00091*00785
004E CLKINT 00090*00259 00400 00779 00794 00823
000E CLKIRQ 00092*00819
0061 CLKREM 00153*00316 00856 00857
1B91 CLKSTR 00858 00860*
0008 CLOCK  00051*00782 00783 00788 00790 00818 00826 00828 00860 01193
0009 CLOKCR 00052*00260 00401 00780 00786 00795 00820 00824 00851 01191
1C19 CMPRET 00976 00978 00980 00982*
1C05 COMP2  00953 00970*01001
1A0D COMPUT 00232 00573*
1832 COSINE 00201*00429 00431 00451 00453
1ABC CP00   00691*00701
1ACF CP01   00693 00700*
1AB8 CPOLY  00655 00670 00688*
1A82 CRC12  00234 00640*
0062 CRCCNT 00154*00642 00671
1A8C CRCNXT 00646*00672
0059 CRCVAL 00142*00643 00644 00648 00649 00653 00654 00660 00661 00667 00668
            00691 00692 00693 00694 00696 00697 00699
001C CURENT 00111*00387 00388 00448 00459
0011 CYCTIM 00101*00288 00817 00854 01199
1000 DAC00  00054*00058 00890
1001 DAC01  00055*00896
1002 DAC02  00056*00899
1003 DAC03  00057*00900
1C04 DARET  00952 00955*
004D DATBUF 00135*00645 00719
1C20 DCRET  01000 01002*
1C22 DIV16  01003*01008
1C2D DIV3X2 00286 01031*
1C31 DIV4X2 00580 00593 00606 00619 01034*
1BFA DIVABS 00579 00592 00605 00618 00949*
1C64 DIVAGN 01064*01066
1C1A DIVCNV 00581 00594 00607 00620 00998*
1844 DIVIDR 00215*00574 00576 00587 00589 00600 00602 00613 00615
1C35 DIVST2 01033 01038*
0004 FREEZE 00073*00308 00409 00812 00850
18EB GETVAL 00231 00351*00353
18F3 GVWAIT 00356*00357 00366
18E4 HK01   00332 00334*
18B7 HKCLR  00311*00314
18B1 HKEEP  00230 00307*
0053 IA     00139*00609 00611
0045 IACUM  00129*00456 00604
0055 IB     00140*00622 00624
0049 IBSUM  00130*00467 00617
004D IDBYTE 00136*00319 00320 00321 00335 00336
000F IDMASK 00072*00318
0010 LSTTIM 00100*00275 00830 01197
1846 MAIN   00228*00238 01202
```

```
0001 MANCTL 00078*00789 00792 01195
0022 MLTBUF 00116*00430 00432 00441 00443 00452 00454 00463 00465 00489 00491
            00493 00495 00496 00497 00499 00535 00538 00541 00544 00548 00551
            00554 00557 01143
1CDF MULNXT 01150*01162
1CED MULROT 01150 01157*
1CD2 MULT   00433 00444 00455 00466 01142*
0004 PADDR  00049*01187
0005 PBDDR  00050*01189
1800 PGMSTR 00035*00163
0018 POLY1  00040*00695
000F POLY2  00041*00698
0000 PORTA  00047*00308 00317 00382 00385 00389 00392 00402 00405 00409 00812
            00850
0001 PORTB  00048*00738 00746 00748 00749 00750 00778 00789 00792 00793 00816
            00906 01194 01195
0080 RAMEND 00034*01183
0010 RAMSTR 00033*00098 01180
1BDD RDADD  00907 00917*
1BEB RDEND  00887 00925*
1BA0 RDLOOP 00884*00915 00923
1BA8 RDMORE 00885 00888*
1BF7 RDRET  00929 00931*
1BF5 RDSET  00927 00930*
1BC4 RDWAIT 00902*00903
1B94 READAC 00386 00393 00406 00876*
0012 REMAIN 00102*00290 00855
1CF9 RESET  01177*01229 01232 01233
1CFD RSTCLR 01181*01184
1820 S0     00191*
1822 S1     00192*
1824 S2     00193*
1826 S3     00194*
1828 S4     00195*
182A S5     00196*
182C S6     00197*
182E S7     00198*
1830 S8     00199*
190C SAMPLE 00360 00381*
1946 SAMRET 00399 00409*
0000 SCURR  00084*00384
1AFD SHFAGN 00737 00744*00752
0004 SHFCLK 00081*00749 00750
1B04 SHFCLR 00745 00748*
0063 SHFCNT 00155*00690 00700
1ADA SHFNXT 00720*00732
0000 SHFTIN 00077*00746 00748
1C6D SHFTLF 01063 01070*01079
1B06 SHFTOG 00747 00749*
1CC1 SHFTRT 01065 01118*
1AD4 SHIFT  00235 00716*
1AF9 SHIFT4 00726 00729 00730 00734 00735 00741*
1820 SINES  00190*00440 00442 00462 00464
00E0 SMASK  00083*00383 00390 00403
0014 SMPEND 00160*00365 00398
0019 SMPFLG 00108*00356 00358 00815 00853
0017 SMPNUM 00106*
0018 SMPTIM 00107*
001B START  00110*00292 00810 00813
0003 STATUS 00080*00738 00816
1C80 SUBPR  01064 01082*
003D SUMBUF 00126*00309
004D SUMCLR 00131*00313
1949 SUMS   00396 00425*
1CC0 SURET  01095 01116*
0020 SVOLT  00085*00391
1863 SYNC   00229 00252*
001A SYNFLG 00109*00258 00821 00827
1895 SYNNC  00278 00280*
1881 SYNNXT 00269*00270 00273
187B SYNWAI 00266*00267
1800 TIMTBL 00169*00323 00326
0021 TRIGIX 00115*00355 00361 00363 00428 00439 00450 00461 00519 00527
004F VA     00137*00262 00263 00276 00280 00281 00282 00583 00585
```

```
005F VALINC 00152*00879 00882 00884 00886 00904 00905 00910 00913 00918 00921
005D VALUE  00151*00878 00881 00888 00891 00897 00909 00911 00912 00914 00917
            00919 00920 00922 00925 00931
003D VASUM  00127*00434 00578
0051 VB     00138*00596 00598
0041 VBSUM  00128*00445 00591
001E VOLTS  00112*00394 00395 00426 00437
1000 WDOG   00058*00233 00237 00359 00771
0054 XBITS  00063*00787
0003 XDELAY 00064*00787
1B10 XMIT   00236 00767*00769 00774 00777
0000 XMTCNT 00161*
0002 XMTTER 00079*00778 00793 01194
0013 XMTTIM 00103*00325 00328 00773 00776
1B2F XMWAIT 00783*00784
1B3D XMWMAN 00790*00791
005C XTEMP  00150*00742 00753
1B6E ZCBUMP 00822 00828*
0016 ZCCNT  00105*00255 00256 00364 00397 00772 00775 00833 00835
0015 ZCFLAG 00104*00264 00266 00268 00269 00271 00352 00354 00768 00770 0083
1B60 ZCGO   00811 00821*
1B4A ZCINT  00809*01231
1B7D ZCRET  00834 00836*
```

APPENDIX B

Copyright © 1983

Product Development Services, Inc. (PDS)

```
ACIA     IDNT     0,8                  ACIA I/O port handler  3/21/83
         OPT      FCS,BSS
*
*
* SUBROUTINE:     AUXIO/HOSTIO
*
* REVISED:        3/21/83
*
* AUTHOR:         D. A. ZEICHNER
*
* PURPOSE:        IRP SVC ROUTINES FOR 6850 ACIA
*
* INPUTS:         None.
*
* OUTPUTS:        Character transmitted or received as appropriate.
*
* EXTERNAL REFERENCES/DEFINITIONS:
*
         XDEF     AUXIO
         XDEF     HOSTIO
*
*
* HARDWARE REFERENCES:
*
         XREF     AUXACIA
         XREF     HOSTACIA
*
* RAM REFERENCES:
*
         XREF.S   5:AUXIO$
         XREF.S   5:AUXOO$
         XREF.S   5:AUXTRAK
         XREF.S   5:HSTIO$
         XREF.S   5:HSTOO$
         XREF.S   5:HOSTRAK
         XREF.S   5:T_OFFLOD
```

```
                                XREF.S   5:T_OUTPUT
                                XREF.S   5:T_XMON
                        *
                        * EPROM (PROGRAM) REFERENCES!
                        *
                                XREF.S   9:DEQUE
                                XREF.S   9:DISPLY
                                XREF.S   9:ENQUE
                        *
                        REGS    REG      A0-A3/D0/D1
                        *
                        *
           00000009             SECTION  PROM
                        *
9 00000000              AUXIO   PUSH     REGS               SAVE REGISTERS
9 00000004 45FAFFFA             LEA      T_OFFLOD(PC),A2    POINT TO TASK FRAME
9 00000008 41FAFFF6             LEA      AUXOQ$(PC),A0      ASSUME OUTPUT
9 0000000C 4241                 CLR      D1                 (NO TASK FRAME OR FLAGS FOR OUTPUT)
9 0000000E 43F900000000         LEA      AUXACIA,A1         POINT TO ACIA
9 00000014 47FAFFEA             LEA      AUXTRAK(PC),A3     POINT TO TRACKING REGISTER
9 00000018 08110000             BTST     #0,(A1)
9 0000001C 6754                 BEQ      ACOUT              THE XMITTER INTERRUPTED
                        *
9 0000001E 41FAFFE0             LEA      AUXIQ$(PC),A0      POINT TO QUEUE
9 00000022 323C0800             MOVE     #F$FDI,D1          GET WAKEUP FLAGS
9 00000026 602C                 BRA      ACIN
                        *
                        *
                        *
9 00000028              HOSTIO  PUSH     REGS               SAVE REGISTERS
9 0000002C 41FAFFD2             LEA      HSTOQ$(PC),A0      ASSUME XMITTER INTERRUPTED
9 00000030 45FAFFCE             LEA      T_OUTPUT(PC),A2
9 00000034 323C0200             MOVE     #F$XMIT,D1
9 00000038 43F900000000         LEA      HOSTACIA,A1        POINT TO ACIA
9 0000003E 47FAFFC0             LEA      HOSTRAK(PC),A3     POINT TO TRACKING REGISTER
9 00000042 08110000             BTST     #0,(A1)
9 00000046 672A                 BEQ      ACOUT              GO XMIT CHARACTER
                        *
9 00000048 41FAFFB6             LEA      HSTIQ$(PC),A0      GET QUEUE POINTER
9 0000004C 45FAFFB2             LEA      T_XMON(PC),A2      GET TASK FRAME POINTER
9 00000050 323C0080             MOVE     #F$MON,D1          & WAKEUP FLAGS
                        *
                        *
9 00000054 10290002     ACIN    MOVE.B   2(A1),D0           GET DATA FROM ACIA
9 00000058 08130007             BTST     #7,(A3)
9 0000005C 6746                 BEQ      ACXIT              RECVD IRP DISABLED
9 0000005E 4EBAFFA0             JSR      ENQUE(PC)          PUT ON QUEUE
9 00000062 6402                 BCC      ACROK              & RETURN OK
9 00000064 4E71                 NOP                         NOP IN CASE QUEUE FILLS UP
                        *
9 00000066 304A         ACROK   MOVE     A2,A0              POINT TO TASK FRAME
9 00000068 3001                 MOVE     D1,D0              GET STARTUP FLAGS
9 0000006A 6738                 BEQ      ACXIT              NO STARTUP FLAGS - QUIT NOW
9 0000006C                      XSVC     READY              WAKE HIM UP
9 00000070 6032                 BRA      ACXIT              & RETURN
                        *
                        *
9 00000072 1013         ACOUT   MOVE.B   (A3),D0            CHECK TRACK-REG FOR XMIT IRP
9 00000074 08110002             BTST     #2,(A1)            CHECK FOR CARRIER ON ACIA
9 00000078 6630                 BNE      NOCAR              WE DON'T HAVE A CARRIER DETECT!
9 0000007A 02000060             AND.B    #$60,D0
9 0000007E 0C000020             CMP.B    #$20,D0            XMIT ENABLED
9 00000082 6620                 BNE      ACXIT
                        *
9 00000084 4EBAFF7A             JSR      DEQUE(PC)          GET DATA FROM QUEUE
9 00000088 6506                 BCS      IRPOFF             QUEUE EMPTY - TURN OFF XMITTER
```

```
9 0000008A 13400002           MOVE.B   D0,2(A1)             TRANSMIT CHARACTER
9 0000008E 6014               BRA      ACXIT                DONE - RETURN
                       *
9 00000090 1013        IRPOFF MOVE.B   (A3),D0              GET TRACKING REGISTER
9 00000092 08800005           BCLR     #5,D0                TURN OFF XMIT ENABLE
9 00000096 1280               MOVE.B   D0,(A1)              SHUT OFF XMITTER
9 00000098 1680               MOVE.B   D0,(A3)              AND UPDATE TRACKING REGISTER
9 0000009A 304A               MOVE     A2,A0
9 0000009C 3001               MOVE     D1,D0
9 0000009E 6704               BEQ      ACXIT                NO ONE TO WAKE UP
9 000000A0                    XSVC     READY
                       *
9 000000A4             ACXIT  PULL     REGS                 RESTORE REGISTERS
9 000000A8 4E73               RTE                           & RETURN
                       *
                       *
9 000000AA 1013        NOCAR  MOVE.B   (A3),D0              GET TRACKING REGISTER
9 000000AC 08800007           BCLR     #7,D0                & TURN OFF RECEIVE IRP
9 000000B0 1280               MOVE.B   D0,(A1)              SHUT OFF RECEIVER
9 000000B2 1680               MOVE.B   D0,(A3)              & UPDATE TRACKING REGISTER
                       *
9 000000B4 41FA0008           LEA      MSG0(PC),A0          GET THE MESSAGE
9 000000B8 4EBAFF46           JSR      DISPLY(PC)           PRINT IT
9 000000BC 60E6               BRA      ACXIT                & QUIT
                       *
                       * MESSAGES:
                       *
9 000000BE 0C2020204E4F MSG0  DC.B     FF,'   NO CARRIER',EOT

                       *
                       *
                              END

xxxxxx TOTAL ERRORS     0--
xxxxxx TOTAL WARNINGS   0--
```

SYMBOL TABLE LISTING

| SYMBOL NAME | SECT | VALUE | CROSS-REF (LINENUMBERS) |
|---|---|---|---|
| .1SEC | | 0000000A | -14 |
| .AIQSIZ | | 0000003B | -80 |
| .AOQSIZ | | 00000038 | -81 |
| .COSINE | | 00000014 | -44 |
| .DIQSIZ | | 0000001C | -82 |
| .EFFECT | | 0000001C | -43 |
| .HIQSIZ | | 000000C8 | -84 |
| .HOQSIZ | | 00000180 | -85 |
| .ICOS | | 0000000A | -51 |
| .IEFF | | 00000018 | -55 |
| .ISCALE | | 00000006 | -67 |
| .ISIN | | 0000000E | -52 |
| .IPH | | 00000024 | -62 |
| .PIOSIZ | | 0000003F | -83 |
| .RBFSIZ | | 00000400 | -86 |
| .SAMPLE | | 00000002 | -42 |
| .SCALE1 | | 00000004 | -73 |
| .SCALE2 | | 00000008 | -74 |
| .SCALE3 | | 0000000C | -75 |
| .SCALE4 | | 00000010 | -76 |
| .SINE | | 00000018 | -45 |
| .SPHUP | MACR | * | -291 |
| .STEMP | | 0000001C | -56 |
| .TEMP | | 00000012 | -53 |
| .TOFSET | | 0000000E | -69 |

```
.TSCALE                 0000000A   -68
.VCOS                   00000002   -49
.VEFF                   00000014   -54
.VSCALE                 00000002   -66
.VSIN                   00000006   -50
.WATTS                  00000020   -60
.WATTSEC                00000022   -61
ACIN              9     00000054   -377   359
ACOUT             9     00000072   -391   355    370
ACRON             9     00000066   -384   381
ACXIT             9     000000A4   -411   379    386    388    396    401    409    423
AIBENT$                 00000026   -33
AUXACIA   XREF    x     00000000   -321   352
AUXIO     XDEF    9     00000000   -347   -315
AUXIO$    XREF    5     00000000   -326   357
AUXOO$    XREF    5     00000000   -327   350
AUXTRAK   XREF    5     00000000   -328   353
CHGENT                  00000034   -228
CNTR                    0000002E   -119
CPR                     00000024   -118
CR                      0000000D   -25
CTRL13                  00000000   -124
CTRL2                   00000002   -125
DEQUE     XREF    9     00000000   -338   398
DEVINI                  00000014   -220
DI$DEV                  0000000A   -257
DI$EVF                  00000000   -254
DI$IOM                  0000001B   -262
DI$ISV                  00000006   -256
DI$LNK                  00000016   -260
DI$OWN                  00000002   -255
DI$PTR                  00000012   -259
DI$QUE                  0000000E   -258
DI$RSO                  0000001A   -261
DI$SIZ                  00000020   -265
DI$STA                  0000001C   -263
DI$USR                  0000001E   -264
DIBENT$                 00000026   -32
DISPLY    XREF    9     00000000   -339   422
DSFTENT$                00000010   -36
EEPROM                  00000007   -7
ENQUE     XREF    9     00000000   -340   380
EOT                     00000004   -22    427
EOS       MACR    x                -190   1      210    211    212    213    214    220    221    222    223    224    225    226
                                   227    228    229    230    237    238    239    240    241    242    243    244    245    246
                                   254    255    256    257    258    259    260    261    262    263    264    271    272    273
                                   277    278    279    280    281    282    283    284
ETX                     00000003   -21
EX$DV0                  0000000A   -277
EX$DV1                  0000000E   -278
EX$DV2                  00000012   -279
EX$DV3                  00000016   -280
EX$DV4                  0000001A   -281
EX$DV5                  0000001E   -282
EX$DV6                  00000022   -283
EX$DV7                  00000026   -284
EX$NXT                  00000006   -273
EX$SIZ                  0000002A   -285
EX$TIM                  00000000   -271
EX$TSK                  00000002   -272
EXEC                    00000000   -210
F$ASMFL                 00004000   -90
F$DMUT                  00000400   -94
F$EEPM                  00000040   -98
F$KYBD                  00000100   -96
F$MON                   00000080   -97    374
```

```
F$OST                  00001000    -92
F$PDI                  00000800    -93    358
F$PROC                 00002000    -91
F$XMIT                 00000200    -95    366
FF                     0000000C    -24    427
HOSTACIA   XREF   x    00000000   -322    367
HOSTIO     XDEF   9    00000028   -362   -316
HOSTRAK    XREF   5    00000000   -331    368
HSTIQ$     XREF   5    00000000   -329    372
HSTOQ$     XREF   5    00000000   -330    364
HT                     00000009    -23
IPTENT$                00000014    -34
IRPOFF            9    00000090   -403    399
MAXAGE                 00000004    -16
MSGO              9    0000008E   -427    421
NEXTSK                 00000030   -227
NOCAR             9    000000AA   -416    393
ONESEC                 00030D090   -13
ONETIK                 000009C4    -15
OPTENT$                00000004    -35
PAAR                   00000014   -112
PACR                   0000000C   -108
PADDR                  00000004   -104
PADR                   00000010   -110
PBAR                   00000016   -113
PBCR                   0000000E   -109
PBDDR                  00000006   -105
PBDR                   00000012   -111
PCDDR                  00000008   -106
PCDR                   00000018   -114
PGCR                   00000000   -102
PIVR                   00000006   -107
PROM                   00000009     -6    346
PSR                    0000001A   -115
PSRR                   00000002   -103
PULL       MACR   x               -149      1    412
PUSH       MACR   x               -134      1    348    363
RAM                    00000005     -8
RDYALL                 00000008   -212
READY                  00000004   -211    397    410
REGS       REG    x               -342    348    363    412
RELEAS                 0000002C   -226
RESERV                 00000028   -225
RESTRT                 0000003C   -230
S60                    000039DF    -12
SAV$                   0000002A
         -284  -283  -282  -281  -280  -279  -278  -277  -273  -272  -271  -269  -264  -263
         -262  -261  -260  -259  -258  -257  -256  -255  -254  -252  -246  -245  -244  -243
         -242  -241  -240  -239  -238  -237  -235  -230  -229  -228  -227  -226  -225  -224
         -223  -222  -221  -220  -214  -213  -212  -211  -210  -206    -1     1   210   211
          212   213   214   220   221   222   223   224   225   226   227   228   229   230
          237   238   239   240   241   242   243   244   245   246   247   254   255   256
          257   258   259   260   261   262   263   264   265   271   272   273   277   278
          279   280   281   282   283   284   285
SPACE                  00000020    -26
STX                    00000002    -20
SUSPEN                 0000000C   -213
TCR                    00000020   -116
TIMR1                  00000004   -126
TIMR2                  00000008   -127
TIMR3                  0000000C   -128
TIVR                   00000022   -117
TK$CON                 00000012   -243
TK$ENT                 00000004   -238
TK$ID                  00000000   -237
TK$LPT                 00000016   -244
TK$NXT                 0000001A   -245
```

```
TK$RS0                  0000001E   -246
TK$SIZ                  00000022   -247
TK$SSP                  00000008   -239
TK$STF                  0000000C   -240
TK$STn                  0000000E   -241
TK$TIM                  00000010   -242
TSKEND                  00000038   -229
TSKINI                  00000010   -214
TSR                     00000034   -120
T_OFFLOD    XREF   5    00000000   -332    349
T_OUTPUT    XREF   5    00000000   -333    365
T_XMON      XREF   5    00000000   -334    373
WAIT                    0000001C   -222
WAITCN                  00000020   -223
WAITLP                  00000024   -224
WAKEUP                  00000018   -221
XSVC        MACR   *               -200     1     397     410

                            ADIRP   IDNT    0,6              A/D Interrupt Service 3/1/83
                                    OPT     PCS,BRS
                            *
                            *
                            * SUBROUTINE:   ADIRP
                            *
                            * REVISED:      3/1/83
                            *
                            * AUTHOR:       D. A. ZEICHNER
                            *
                            * PURPOSE:      DIGITIZE INPUTS AS DICTATED BY THE INPUT SEQUENCE TABLE.
                            *
                            * INPUTS:       ANALOG TASK FRAME + TK$RS0:   CLUSTER POINTER - 2 BYTES
                            *               ANALOG TASK FRAME + TK$RS0+2: SAMPLE NUMBER
                            *
                            *               (CLUSTER POINTER POINTS TO THE FIRST INPUT SEQUENCE
                            *               TABLE ENTRY FOR THIS CLUSTER)
                            *
                            * OUTPUTS:      UPDATED ANALOG INPUT BUFFERS.
                            *
                            * REGISTER USAGE:
                            *
                            *       A0 - ADDRESS OF ANALOG TASK FRAME (T_ANALOG)
                            *       A1 - ADDRESS OF CURRENT INPUT PERSONALITY TABLE ENTRY
                            *       A2 - ADDRESS OF CURRENT ANALOG INPUT BUFFER
                            *
                            *       D0,D1 - TEMPORARY
                            *
                            * EXTERNAL REFERENCES/DEFINITIONS:
                            *
                                    XDEF    ADIRP
                            *
                            * HARDWARE REFERENCES:
                            *
                                    XREF    ADCTRL
                                    XREF    CTRLP
                                    XREF    DATAP
                            *
                            * RAM REFERENCES:
                            *
                                    XREF.S  5:EX.RAM
                                    XREF.S  5:T_ANALOG
                            *
                            * LOCAL ASSIGNMENTS:
                            *
                0000001E    CPTR    EQU     TK$RS0            OFFSET TO START OF CLUSTER PTR
                            *
                            *                          *** THE BYTE TK$RS0+2 IS NOT AVAILABLE FOR
                            *                              USE! THIS LOCATION IS USED BY ANALOG
```

```
                           *                                    AS PART OF THE SAMPLE NUMBER (SNUM).
                           *
            00000021       SNUM     EQU     TK$RSO+3             SAMPLE NUMBER
            00000000       ALLOFF   EQU     $0                   CTRS OFF, UNFREEZE, ZERO CROSS DISABLED
            00000060       ZROFF    EQU     $60                  COUNTERS RUNNING, ZERO CROSS DISABLED
            00000006       CHOLD    EQU     6                    CTR HOLD BIT (ACTIVE LOW)
            00000005       UNFRZ    EQU     5                    UNFREEZE BIT (ACTIVE LOW - MUST TOGGLE)
            00000004       ZCEN     EQU     4                    0 CROSS ENABLE BIT (ACTIVE HIGH)
                           *
                           REGS     REG     A0-A2/D0-D1          REGISTER LIST
                           *
                           *
            00000009                SECTION PROM
                           *
9 00000000 13FC00600000 ADIRP    MOVE.B  #ZROFF,PADR+ADCTRL   DISABLE 0 CROSS, INPUTS FROZEN, CTRS ON
           0010
9 00000008                        PUSH    REGS                 SAVE REGISTERS
                           *
9 0000000C 41FAFFF2               LEA     T_ANALOG(PC),A0      GET PTR TO TASK FRAME
9 00000010 0C2800090021           CMP.B   #9,SNUM(A0)          SAMPLE COUNT = 9?
9 00000016 6D26                   BLT     NXTSAM               NO - DO NEXT SAMPLE
                           *
                           * WE HAVE TAKEN 9 SAMPLES ALREADY, STOP THE PERIOD
                           * COUNTER & DISABLE THE ZERO CROSSING DETECTOR
                           * SO WE WON'T GET ANY MORE INTERRUPTS FROM HERE.
                           * THE PERIOD OF THIS WAVEFORM IS IN COUNTER #5.
                           *
9 00000018                        DSV$    5                    SHUT DOWN & SAVE PERIOD COUNTER
9 00000020 13FC00000000           MOVE.B  #ALLOFF,PADR+ADCTRL  MAKE SURE WE DON'T HAVE COUNTER IRPS.
           0010
9 00000028 303C4000               MOVE    #F$ASMPL,D0          FLAGS (TASK FRAME ALREADY IN A0)
9 0000002C                        XSVC    READY                WAKE UP ANALOG TASK
9 00000030 43FAFFCE               LEA     EX.RAM(PC),A1        POINTER TO EXEC RAM
9 00000034 23480006               MOVE.L  A0,EX$NXT(A1)        MAKE ANALOG TASK THE NEXT TO RUN
9 00000038                        PULL    REGS                 RESTORE ALL REGISTERS
9 0000003C 4E73                   RTE
                           *
9 0000003E 3268001E       NXTSAM  MOVE    CPTR(A0),A1          GET CLUSTER POINTER INTO A1.
                           *
9 00000042 10290001       NXTINP  MOVE.B  1(A1),D0             GET INPUT #
9 00000046 08C00007               BSET    #7,D0                DISABLE CONVERSION BIT
9 0000004A 13C000000018           MOVE.B  D0,PCDR+ADCTRL       SELECT INPUT
9 00000050 08B900070000           BCLR    #7,PCDR+ADCTRL       START CONVERSION
           0018
9 00000058 08F900070000           BSET    #7,PCDR+ADCTRL       ALLOW A/D TO BE READ
           0018
9 00000060 247C00000000           MOVE.L  #ADCTRL,A2           POINT TO A/D CONVERTER PI/T
                           *
9 00000066 010A0010       CONLUP  MOVEP   PADR(A2),D0          READ A/D
9 0000006A 4A40                   TST     D0                   SET 'N' BIT
9 0000006C 6BF8                   BMI     CONLUP               NOT DONE - WAIT
                           *
                           * CONVERSION FINISHED, DIGITIZED VALUE IN D0.
                           * USING SAMPLE COUNT, CALCULATE OFFSET TO APPROPRIATE
                           * ENTRY IN INPUT BUFFER. 2ND WORD OF IST ENTRY
                           * PROVIDES POINTER TO START OF BUFFER.
                           *
9 0000006E 02400FFF               AND     #$FFF,D0             ISOLATE A/D DATA
9 00000072 12280021               MOVE.B  SNUM(A0),D1          GET SAMPLE NUMBER
9 00000076 E341                   ASL     #1,D1
9 00000078 4881                   EXT     D1                   CALCULATE OFFSET FROM 1ST SAMPLE
9 0000007A 34690002               MOVE    2(A1),A2             GET PTR TO ANALOG INPUT BUFFER
9 0000007E 35801002               MOVE    D0,.SAMPLE(A2,D1)    MOVE VALUE INTO BUFFER
9 00000082 43E90004               LEA     4(A1),A1             BUMP PTR TO NEXT IST ENTRY
9 00000086 0C51FFFF               CMP     #$FFFF,(A1)          END OF CLUSTER?
9 0000008A 66B6                   BNE     NXTINP               NO - DO NEXT INPUT
                           *
```

```
9 0000008C 52280021              ADD.B    #1,SNUM(A0)          YES - BUMP SAMPLE NUMBER
                        *
9 00000090 0C2800090021          CMP.B    #9,SNUM(A0)          LAST SAMPLE TAKEN?
9 00000096 6D34                  BLT      NOTLAST              NO - JUST UNFREEZE INPUTS & RETURN
                        *
                        * LAST SAMPLE HAS BEEN TAKEN: STOP SAMPLE COUNTER,
                        * - (LETTING PERIOD COUNTER RUN)
                        * - UNFREEZE INPUTS AND SELECT FIRST INPUT IN
                        *   CLUSTER, (PERIOD TIMING REFERENCE)
                        * - CLEAR THAN ENABLE ZERO CROSSING DETECTOR.
                        *
9 00000098                       DSA$     4                    STOP SAMPLE COUNTER
9 000000A0 3268001E              MOVE     CPTR(A0),A1          GET 1ST INPUT IN CLUSTER
9 000000A4 10290001              MOVE.B   1(A1),D0
9 000000A8 08C00007              BSET     #7,D0                DON'T START A/D THIS TIME -
9 000000AC 13C000000018          MOVE.B   D0,PCDR+ADCTRL       JUST SELECT
                        *
9 000000B2 08B900050000          BCLR     #UNFRZ,PADR+ADCTRL   UNFREEZE INPUTS (PULSE LINE)
           0010
9 000000BA 08F900050000          BSET     #UNFRZ,PADR+ADCTRL
           0010
                        *
9 000000C2 08F900040000          BSET     #ZCEN,PADR+ADCTRL    & ENABLE 0 CROSSING DETECTOR
           0010
9 000000CA 6010                  BRA      ADXIT
                        *
9 000000CC 08B900050000 NOTLAST  BCLR     #UNFRZ,PADR+ADCTRL   JUST UNFREEZE INPUTS (PULSE LINE)
           0010
9 000000D4 08F900050000          BSET     #UNFRZ,PADR+ADCTRL
           0010
                        *
9 000000DC              ADXIT    PULL     REGS                 RESTORE REGISTERS
9 000000E0 4E73                  RTE
                        *
                        *
                                 END

****** TOTAL ERRORS     0--
****** TOTAL WARNINGS   0--
```

SYMBOL TABLE LISTING

| SYMBOL NAME | SECT | VALUE | SYMBOL NAME | SECT | VALUE |
|---|---|---|---|---|---|
| .1SEC | | 0000000A | GET$ | MACR | * |
| .AIQSIZ | | 00000038 | GOF$ | MACR | * |
| .AOQSIZ | | 00000038 | GON$ | MACR | * |
| .COSINE | | 00000014 | HT | | 00000009 |
| .DIQSIZ | | 0000001C | INTL$ | MACR | * |
| .EFFECT | | 0000001C | IPTENT$ | | 00000014 |
| .HIQSIZ | | 00000010 | LAM$ | MACR | * |
| .HOQSIZ | | 00000180 | LOD$ | MACR | * |
| .ICOS | | 0000000A | MAXAGE | | 00000004 |
| .IEFF | | 00000018 | MMR | | 00000000 |
| .ISCALE | | 00000006 | MMR$ | MACR | * |
| .ISIN | | 0000000E | NEXTSK | | 00000030 |
| .KWH | | 00000024 | NOSEQ$ | MACR | * |
| .PIQSIZ | | 0000003F | NOTLAST | 9 | 000000CC |
| .RBFSIZ | | 00000400 | NXTINP | 9 | 00000042 |
| .SAMPLE | | 00000002 | NXTSAM | 9 | 0000003E |
| .SCALE1 | | 00000004 | ONESEC | | 00030D90 |
| .SCALE2 | | 00000008 | ONETIK | | 000009C4 |
| .SCALE3 | | 0000000C | OPTENT$ | | 00000004 |
| .SCALE4 | | 00000010 | PAAR | | 00000014 |

| | | | | | | | |
|---|---|---|---|---|---|---|---|
| .SINE | | | 00000018 | PACR | | | 0000000C |
| .SPNJP | MACR | x | | PADDR | | | 00000004 |
| .STEMP | | | 0000001C | PADR | | | 00000010 |
| .TEMP | | | 00000012 | PBAR | | | 00000016 |
| .TOFSET | | | 0000000E | PBCR | | | 0000000E |
| .TSCALE | | | 0000000A | PBDDR | | | 00000006 |
| .VCOS | | | 00000002 | PBDR | | | 00000012 |
| .VEFF | | | 00000014 | PCDDR | | | 00000008 |
| .VSCALE | | | 00000002 | PCDR | | | 00000018 |
| .VSIN | | | 00000006 | PGCR | | | 00000000 |
| .WATTS | | | 00000020 | PIVR | | | 0000000A |
| .WATTSEC | | | 00000022 | PROM | | | 00000009 |
| A1R | | | 00000002 | PSR | | | 0000001A |
| A2R | | | 00000004 | PSRR | | | 00000002 |
| ADCTRL | XREF | x | 00000000 | PULL | MACR | x | |
| ADIRP | XDEF | 9 | 00000000 | PUSH | MACR | x | |
| ADXIT | | 9 | 000000DC | RAM | | | 00000005 |
| AIBENT$ | | | 00000026 | RDYALL | | | 00000008 |
| ALLOFF | | | 00000000 | READ$ | MACR | x | |
| ARM$ | MACR | x | | READY | | | 00000004 |
| B16$ | MACR | x | | REGS | REG | x | |
| BYTE$0 | | | 0000FFC8 | RELEAS | | | 0000002C |
| C1L | | | 00000006 | RESERV | | | 00000028 |
| C1M | | | 00000008 | RESTRT | | | 0000003C |
| C2L | | | 0000000A | RITE$ | MACR | x | |
| C2M | | | 0000000C | RST$ | MACR | x | |
| C3L | | | 0000000E | S60 | | | 000037DF |
| C3M | | | 00000010 | SAV$ | MACR | x | |
| C4L | | | 00000012 | SAV$ | | | 0000002A |
| C4M | | | 00000014 | SEG$ | MACR | x | |
| C5L | | | 00000016 | SET$ | MACR | x | |
| C5M | | | 00000018 | SNUM | | | 00000021 |
| CHGENT | | | 00000034 | SPACE | | | 00000020 |
| CHOLD | | | 00000006 | STA$ | MACR | x | |
| CLP$ | MACR | x | | STA1R$ | MACR | x | |
| CHR$ | MACR | x | | STA2R$ | MACR | x | |
| CNT5$ | MACR | x | | START$ | MACR | x | |
| CNTR | | | 0000002E | STC1L$ | MACR | x | |
| CONLUP | | 9 | 00000066 | STC1M$ | MACR | x | |
| CPR | | | 00000024 | STC2L$ | MACR | x | |
| CPTR | | | 0000001E | STC2M$ | MACR | x | |
| CR | | | 0000000D | STC3L$ | MACR | x | |
| CTRLP | XREF | x | 00000000 | STC3M$ | MACR | x | |
| DATAP | XREF | x | 00000000 | STC4L$ | MACR | x | |
| DEVINI | | | 00000014 | STC4M$ | MACR | x | |
| DI$DEV | | | 0000000A | STC5L$ | MACR | x | |
| DI$EVF | | | 00000000 | STC5M$ | MACR | x | |
| DI$IOM | | | 0000001B | STCEQU | | 0 | 00000000 |
| DI$ISV | | | 00000006 | STMMR$ | MACR | x | |
| DI$LNK | | | 00000016 | STP$ | MACR | x | |
| DI$OWN | | | 00000002 | STX | | | 00000002 |
| DI$PTR | | | 00000012 | SUSPEN | | | 0000000C |
| DI$QUE | | | 0000000E | TCR | | | 00000020 |
| DI$RSO | | | 0000001A | TEACR$ | MACR | x | |
| DI$SIZ | | | 00000020 | TECL$ | MACR | x | |
| DI$STA | | | 0000001C | TECM$ | MACR | x | |
| DI$USR | | | 0000001E | TEMMR$ | MACR | x | |
| DIBENT$ | | | 00000026 | TIVR | | | 00000022 |
| DSA$ | MACR | x | | TK$CON | | | 00000012 |
| DSFTENT$ | | | 00000010 | TK$ENT | | | 00000004 |
| DSV$ | MACR | x | | TK$ID | | | 00000000 |
| EEPROM | | | 00000007 | TK$LPT | | | 00000016 |
| EOT | | | 00000004 | TK$NXT | | | 0000001A |
| EQS | MACR | x | | TK$RSO | | | 0000001E |
| ETX | | | 00000003 | TK$SIZ | | | 00000022 |
| EX$DVO | | | 0000000A | TK$SSP | | | 00000008 |

```
EX$DV1                  0000000E    TK$STF              0000000C
EX$DV2                  00000012    TK$STM              0000000E
EX$DV3                  00000016    TK$TIM              00000010
EX$DV4                  0000001A    TSKEND              00000038
EX$DV5                  0000001E    TSKINI              00000010
EX$DV6                  00000022    TSR                 00000034
EX$DV7                  00000026    T_ANALOG  XREF   5  00000000
EX$NXT                  00000006    UNFRZ               00000005
EX$SIZ                  0000002A    UPACR$    MACR   x
EX$TIM                  00000000    UPC1M$    MACR   x
EX$TSK                  00000002    UPC2M$    MACR   x
EX.RAM     XREF   5     00000000    UPC3M$    MACR   x
EXEC                    00000050    UPC4M$    MACR   x
F$ASMPL                 00004000    UPC5M$    MACR   x
F$DNUT                  00000400    UPDCL$    MACR   x
F$EEPM                  00000040    UPMMR$    MACR   x
F$KYBD                  00000100    WAIT                0000001C
F$MON                   00000080    WAITCN              00000020
F$OST                   00001000    WAITLP              00000024
F$PDI                   00000800    WAKEUP              00000018
F$PROC                  00002000    XSVC      MACR   x
F$XMIT                  00000200    ZCEN                00000004
FF                      0000000C    ZROFF               00000060
```

```
         ANALOG  IDNT    0,12                  Analog Input Task  3/11/83
                 OPT     PCS,BRS
         x
         x
         x SUBROUTINE:   ANALOG
         x
         x REVISED:      3/11/83
         x
         x AUTHOR:       D. A. ZEICHNER
         x
         x PURPOSE:      Analog data acquisition task.
         x
         x INPUTS:       N/A
         x
         x OUTPUTS:      N/A
         x
         x EXTERNAL REFERENCES/DEFINITIONS:
         x
                 XDEF    ANALOG
         x
         x HARDWARE REFERENCES:
         x
                 XREF    ADCTRL
                 XREF    CTRLP
                 XREF    DATAP
         x
         x RAM REFERENCES:
         x
                 XREF.S  5:AIB$
                 XREF.S  5:CSM$
                 XREF.S  5:IST$
                 XREF.S  5:PRCIO$
                 XREF.S  5:RAMTBL
                 XREF.S  5:T_ANALOG
         x
         x PROM REFERENCES:
         x
                 XREF.S  9:ENQUE
                 XREF.S  9:TIMRD
                 XREF.S  9:TIMWR
         x
         x LOCAL ASSIGNMENTS:
```

```
                   *
          0000001E ISPTR    EQU      TK$RS0              INPUT SEQUENCE TABLE ENTRY POINTER
          00000020 SNUM     EQU      TK$RS0+2            SAMPLE NUMBER
                   *
          00000000 CLNUM    EQU      0                   STACK OFFSET TO CLUSTER NUMBER
          00000002 CSPTR    EQU      2                   STACK OFFSET TO CLUSTER STATUS MASK POINTER
                   *
          00000000 HALT     EQU      $0                  ZERO CROSS & FREEZE DISABLED, CTRS OFF
          00000070 RUN      EQU      $70                 0 CROSS ON, CTRS ON, ALLOW INPUTS TO FREEZE
                   *
          0000001E CSMAP    EQU      30                  OFFSET TO CLUSTER STATUS MAP
                   *
                   *
          00000009          SECTION  PROM
                   *
9 00000000 42A7    ANALOG   CLR.L    -(A7)               MAKE LOCAL SCRATCH SPACE ON STACK
9 00000002 4DFAFFFC         LEA      T_ANALOG(PC),A6     GET POINTER TO TASK FRAME
9 00000006 41FAFFF8         LEA      IST$(PC),A0
9 0000000A 3D48001E         MOVE     A0,ISPTR(A6)        INITIALIZE CLUSTER POINTER
                   *
9 0000000E 3017    ANALUP   MOVE     CLNUM(A7),D0        GET CLUSTER NUMBER
9 00000010 C0FC0006         MULU     #6,D0               CALCULATE BYTE OFFSET TO CLUSTER MASK
9 00000014 45FAFFEA         LEA      CSM$(PC),A2         GET START OF CLUSTER MASKS
9 00000018 43F20000         LEA      (A2,D0),A1          CALC POINTER TO CLUSTER STATUS MASK
9 0000001C 3F490002         MOVE     A1,CSPTR(A7)        & SAVE IN STACK FOR LATER
                   *
9 00000020 13FC00000000     MOVE.B   #HALT,ADCTRL+PADR   DISABLE 0 CROSS /UNFREEZE INPUTS /STOP CTRS
           0010
9 00000028 41F80000         LEA      0,A0                CLR MS WORD
9 0000002C 426E0020         CLR      SNUM(A6)            RESET SAMPLE #
9 00000030 306E001E         MOVE     ISPTR(A6),A0        GET PTR TO IST
9 00000034 10280001         MOVE.B   1(A0),D0            GET INPUT # OF PERIOD REFERENCE
9 00000038 08C00007         BSET     #7,D0               DON'T START A/D -
9 0000003C 13C000000018     MOVE.B   D0,ADCTRL+PCDR      JUST SELECT PERIOD REFERENCE
                   *
9 00000042 3017             MOVE     CLNUM(A7),D0        GET CLUSTER NUMBER
9 00000044 4EBAFFBA         JSR      TIMRD(PC)           GET TIMER VALUE
9 00000048                  RITE$    C4,LR,D0            SET SAMPLE COUNTER (CTR #4)
9 00000064                  LOD$     4,5                 PRESET PERIOD & SAMPLE COUNTERS
9 0000006C                  ARM$     4,5                 ARM PERIOD & SAMPLE COUNTERS
                   *
9 00000074 13FC00700000     MOVE.B   #RUN,ADCTRL+PADR    ALLOW ANALOG INPUTS TO FREEZE /ENABLE ALL
           0010
9 0000007C 303C4000         MOVE     #F$ASMPL,D0
9 00000080 7206             MOVEQ    #6,D1               WAIT 6 TICKS
9 00000082                  XSVC     SUSPEN              WAIT TILL SAMPLING DONE
                   *
9 00000086 13FC00000000     MOVE.B   #HALT,ADCTRL+PADR   DISABLE 0 CROSS /UNFREEZE INPUTS /STOP CTRS
           0010
9 0000008E 4A6E000C         TST      TK$STF(A6)          DO WE HAVE A TIME OUT ?
9 00000092 6B24             BMI      DATAON              YES - BUT CONTINUE ANYWAY, NOT DONE YET

                   *
                   * ALL 9 SAMPLES HAVE BEEN TAKEN & STORED, AND THE PERIOD COUNTER
                   * CONTAINS THE TIME TAKEN BY TWO CYCLES OF THE REFERENCE WAVEFORM.
                   * CALCULATE THE NEW SAMPLE TIME & SAVE IT.
                   * NORMAL TIME (60 HZ.) FOR 2 CYCLES =$208D5. SINCE THE TIMER IS
                   * ONLY 16 BITS, WE ASSUME THE COUNTER TO HAVE A RANGE OF
                   * $18000 - $27FFF , BY SIGN EXTENDING THE COUNT AND ADDING $20000.
                   * THIS ALLOWS A RANGE OF ABOUT + / -  14 HZ.
                   *
                   * MAYBE THIS RANGE SHOULD BE CHANGED TO  + / -  2.5 HZ., ANYTHING
                   * OUT SIDE THIS RANGE WOULD ASSUME 60 HZ.

9 00000094                  READ$    C5,HR,C             READ PERIOD TIME FROM STC CHIP
9 000000A2 3001             MOVE     D1,D0
```

```
9 000000A4 48C0              EXT.L   D0                  SIGN EXTEND COUNT
9 000000A6 068000020000      ADD.L   #$20000,D0          RESTORE MS WORD FROM COUNTER
9 000000AC 80FC0009          DIVU    #9,D0               & DIVIDE BY 9 (SAMPLE TIME CALCULATION)
9 000000B0 4840              SWAP    D0                  PUT NEW TIME IN MS WORD
9 000000B2 3017              MOVE    CLNUM(A7),D0        & CLUSTER NUMBER IN LS WORD
9 000000B4 4EBAFF4A          JSR     TIMWR(PC)           & SAVE NEW SAMPLE TIME
                    *
                    * GET CLUSTER STATUS MASK FOR THIS CLUSTER, & 'OR' IT WITH
                    * THE CLUSTER STATUS MAP TO INDICATE THAT ALL OF THE BUFFERS
                    * IN THIS CLUSTER ARE UNAVAILABLE FOR NEW DATA. (THE DATA IN
                    * THEM HAS NOT BEEN PROCESSED YET.)
                    *
9 000000B8 45FAFF46 DATAON   LEA     CSM$(PC),A2         GET START ADR OF CLUSTER STATUS MASKS/MAP
9 000000BC 326F0002          MOVE    CSPTR(A7),A1        GET PTR TO CURRENT CLUSTER STATUS MASK
                    *
9 000000C0 2011              MOVE.L  (A1),D0             GET 1ST 4 BYTES OF MASK
9 000000C2 81AA001E          OR.L    D0,CSMAP(A2)        & 'OR' WITH 1ST 4 BYTES OF MAP
                    *
9 000000C6 30290004          MOVE    4(A1),D0            DO THE SAME W/ THE LAST 2 BYTES OF MASK
9 000000CA 816A0022          OR      D0,CSMAP+4(A2)
                    *
                    * STEP THRU TABLE UNTIL WE REACH THE END OF THIS CLUSTER,
                    * QUEUEING BUFFER ADDRESSES AS WE GO.
                    *
9 000000CE 41F80000          LEA     0,A0                CLEAR MSW ADDRESS REGISTER
9 000000D2 306E001E          MOVE    ISPTR(A6),A0        GET POINTER TO START OF CLUSTER
9 000000D6 0C58FFFF BMPCLS   CMP     #$FFFF,(A0)+        END OF CLUSTER?
9 000000DA 671A              BEQ     ENDCLS              YES - GET OUT OF LOOP
                    *
9 000000DC 3018              MOVE    (A0)+,D0            GET BUFFER ADRS FROM TABLE & BUMP ENTRY
9 000000DE                   PUSH    A0                  SAVE A0
9 000000E2 41FAFF1C          LEA     PRCIQ$(PC),A0       GET QUEUE ADDRESS
                    *
9 000000E6 4EBAFF18 REQUE    JSR     ENQUE(PC)
9 000000EA 6404              BCC     QOK                 QUEUE WENT OK
                    * This condition will never occur if the Q is big enough *
9 000000EC 612E              BSR     WAITQ               NG - WAIT & RETRY
9 000000EE 60F6              BRA     REQUE
                    *
9 000000F0          QOK      PULL    A0                  RESTORE INPUT SEQ TABLE POINTER
9 000000F4 60E0              BRA     BMPCLS              & TRY AGAIN
                    *
                    * WE'RE NOW POINTING TO START OF NEXT CLUSTER.
                    * IF ENTRY IS $FFFF, THEN WE'VE DONE ALL CLUSTERS.
                    * OR ELSE, WAIT TILL OUTPUT HAS FINISHED PROCESSING.
                    *
9 000000F6 5257     ENDCLS   ADDQ    #1,CLNUM(A7)        BUMP CLUSTER NUMBER
9 000000F8 3D48001E          MOVE    A0,ISPTR(A6)        SAVE NEW PTR IN TASK FRAME
9 000000FC 0C50FFFF          CMP     #$FFFF,(A0)
9 00000100 6600FF0C          BNE     ANALUP              MORE TO DO - KEEP GOING
9 00000104 303C1000          MOVE    #F$OST,D0           WAIT TILL XMIT OK
9 00000108 4241              CLR     D1                  NO TIME OUT
9 0000010A                   XSVC    SUSPEN
9 0000010E 41FAFEF0          LEA     IST$(PC),A0
9 00000112 3D48001E          MOVE    A0,ISPTR(A6)        RESET INPUT SEQUENCE TABLE POINTER
9 00000116 4257              CLR     CLNUM(A7)           AND CLUSTER NUMBER
9 00000118 6000FEF4          BRA     ANALUP
                    *
                    *
                    * SUBROUTINES:
                    *
                    * WAITQ - WAIT UNTIL THE PROCESS INPUT QUEUE IS NOT FULL.
                    *          (IE. TILL A BUFFER HAS BEEN PROCESSED)
                    *
9 0000011C          WAITQ    PUSH    D0/A0               SAVE REGS
9 00000120 303C2000          MOVE    #F$PROC,D0          WAIT FOR PROCES TO FINISH A BUFFER
9 00000124 4241              CLR     D1                  NO TIMEOUT
```

```
2766 9 00000126             XSVC   SUSPEN
2767 9 0000012A             PULL   D0/A0            RESTORE REGISTERS
2768 9 0000012E 4E75        RTS
2769                 *
2770                 *
2771                        END

****** TOTAL ERRORS    0--
****** TOTAL WARNINGS  0--
```

SYMBOL TABLE LISTING

| SYMBOL NAME | SECT | | VALUE | SYMBOL NAME | SECT | | VALUE |
|---|---|---|---|---|---|---|---|
| .1SEC | | | 0000000A | GOF$ | MACR | x | |
| .AIQSIZ | | | 00000038 | GON$ | MACR | x | |
| .AOQSIZ | | | 00000038 | HALT | | | 00000000 |
| .COSINE | | | 00000014 | HT | | | 00000009 |
| .DIQSIZ | | | 0000001C | INTL$ | MACR | x | |
| .EFFECT | | | 0000001C | IPTENT$ | | | 00000014 |
| .HIQSIZ | | | 000000C8 | ISPTR | | | 0000001E |
| .HOQSIZ | | | 00000180 | IST$ | XREF | 5 | 00000000 |
| .ICOS | | | 0000000A | LAM$ | MACR | x | |
| .IEFF | | | 00000018 | LOD$ | MACR | x | |
| .ISCALE | | | 00000006 | MAXAGE | | | 00000004 |
| .ISIN | | | 0000000E | MMR | | | 00000000 |
| .KWH | | | 00000024 | MMR$ | MACR | x | |
| .PIQSIZ | | | 0000003F | NEXTSK | | | 00000030 |
| .REFSIZ | | | 00000400 | NOSEQ$ | MACR | x | |
| .SAMPLE | | | 00000002 | ONESEC | | | 0003D090 |
| .SCALE1 | | | 00000004 | ONETIK | | | 000009C4 |
| .SCALE2 | | | 00000008 | OPTENT$ | | | 00000004 |
| .SCALE3 | | | 0000000C | PAAR | | | 00000014 |
| .SCALE4 | | | 00000010 | PACR | | | 0000000C |
| .SINE | | | 00000018 | PADDR | | | 00000004 |
| .SPNJP | MACR | x | | PADR | | | 00000010 |
| .STEMP | | | 0000001C | PBAR | | | 00000016 |
| .TEMP | | | 00000012 | PBCR | | | 0000000E |
| .TOFSET | | | 0000000E | PBDDR | | | 00000006 |
| .TSCALE | | | 0000000A | PBDR | | | 00000012 |
| .VCOS | | | 00000002 | PCDDR | | | 00000008 |
| .VEFF | | | 00000014 | PCDR | | | 00000018 |
| .VSCALE | | | 00000002 | PGCR | | | 00000000 |
| .VSIN | | | 00000006 | PIVR | | | 0000000A |
| .WATTS | | | 00000020 | PRCIQ$ | XREF | 5 | 00000000 |
| .WATTSEC | | | 00000022 | PROM | | | 00000009 |
| A1R | | | 00000002 | PSR | | | 0000001A |
| A2R | | | 00000004 | PSRR | | | 00000002 |
| ADCTRL | XREF | x | 00000000 | PULL | MACR | x | |
| AIB$ | XREF | 5 | 00000000 | PUSH | MACR | x | |
| AIBENT$ | | | 00000026 | QOK | | 9 | 000000F0 |
| ANALOG | XDEF | 9 | 00000000 | RAM | | | 00000005 |
| ANALUP | | 9 | 0000000E | RAMTBL | XREF | 5 | 00000000 |
| ARM$ | MACR | x | | RDYALL | | | 00000008 |
| B16$ | MACR | x | | READ$ | MACR | x | |
| BMPCLS | | 9 | 000000D6 | READY | | | 00000004 |
| BYTE$0 | | | 0000FF15 | RELEAS | | | 0000002C |
| C1L | | | 00000006 | REQUE | | 9 | 000000E6 |
| C1M | | | 00000008 | RESERV | | | 00000028 |
| C2L | | | 0000000A | RESTRT | | | 0000003C |
| C2M | | | 0000000C | RITE$ | MACR | x | |
| C3L | | | 0000000E | RST$ | MACR | x | |
| C3M | | | 00000010 | RUN | | | 00000070 |
| C4L | | | 00000012 | S60 | | | 000039DF |
| C4M | | | 00000014 | SAV$ | MACR | x | |
| C5L | | | 00000016 | SAV$ | | | 0000002A |

| | | | | | | | |
|---|---|---|---|---|---|---|---|
| CSM | | | 00000018 | SEQ$ | MACR | x | |
| CHGENT | | | 00000034 | SET$ | MACR | x | |
| CLNUM | | | 00000000 | SNUM | | | 00000020 |
| CLR$ | MACR | x | | SPACE | | | 00000020 |
| CHR$ | MACR | x | | STA$ | MACR | x | |
| CNT5$ | MACR | x | | STA1R$ | MACR | x | |
| CNTR | | | 0000002E | STA2R$ | MACR | x | |
| CPR | | | 00000024 | START$ | MACR | x | |
| CR | | | 0000000D | STC1L$ | MACR | x | |
| CSM$ | XREF | 5 | 00000000 | STC1M$ | MACR | x | |
| CSMAP | | | 0000001E | STC2L$ | MACR | x | |
| CSPTR | | | 00000002 | STC2M$ | MACR | x | |
| CTRL13 | | | 00000000 | STC3L$ | MACR | x | |
| CTRL2 | | | 00000002 | STC3M$ | MACR | x | |
| CTRLP | XREF | x | 00000000 | STC4L$ | MACR | x | |
| DATAON | | 9 | 000000E8 | STC4M$ | MACR | x | |
| DATAP | XREF | x | 00000000 | STC5L$ | MACR | x | |
| DEVINI | | | 00000014 | STC5M$ | MACR | x | |
| DI$DEV | | | 0000000A | STCEQU | | 0 | 00000000 |
| DI$EVF | | | 00000000 | STMMR$ | MACR | x | |
| DI$IOM | | | 0000001B | STP$ | MACR | x | |
| DI$ISV | | | 00000006 | STX | | | 00000002 |
| DI$LNK | | | 00000016 | SUSPEN | | | 0000000C |
| DI$OWN | | | 00000002 | TCR | | | 00000020 |
| DI$PTR | | | 00000012 | TEACR$ | MACR | x | |
| DI$QUE | | | 0000000E | TECL$ | MACR | x | |
| DI$RSO | | | 0000001A | TECM$ | MACR | x | |
| DI$SIZ | | | 00000020 | TEMMR$ | MACR | x | |
| DI$STA | | | 0000001C | TIMR1 | | | 00000004 |
| DI$USR | | | 0000001E | TIMR2 | | | 00000008 |
| DIBENT$ | | | 00000026 | TIMR3 | | | 0000000C |
| DSA$ | MACR | x | | TIMRD | XREF | 9 | 00000000 |
| DSFTENT$ | | | 00000010 | TIMWR | XREF | 9 | 00000000 |
| DSV$ | MACR | x | | TIVR | | | 00000022 |
| EEPROM | | | 00000007 | TK$CON | | | 00000012 |
| ENDCLS | | 9 | 000000F6 | TK$ENT | | | 00000004 |
| ENQUE | XREF | 9 | 00000000 | TK$ID | | | 00000000 |
| EOT | | | 00000004 | TK$LPT | | | 00000016 |
| EQS | MACR | x | | TK$NXT | | | 0000001A |
| ETX | | | 00000003 | TK$RSO | | | 0000001E |
| EX$DV0 | | | 0000000A | TK$SIZ | | | 00000022 |
| EX$DV1 | | | 0000000E | TK$SSP | | | 00000008 |
| EX$DV2 | | | 00000012 | TK$STF | | | 0000000C |
| EX$DV3 | | | 00000016 | TK$STM | | | 0000000E |
| EX$DV4 | | | 0000001A | TK$TIM | | | 00000010 |
| EX$DV5 | | | 0000001E | TSKEND | | | 00000038 |
| EX$DV6 | | | 00000022 | TSKINI | | | 00000010 |
| EX$DV7 | | | 00000026 | TSR | | | 00000034 |
| EX$NXT | | | 00000006 | T_ANALOG | XREF | 5 | 00000000 |
| EX$SIZ | | | 0000002A | UPACR$ | MACR | x | |
| EX$TIM | | | 00000000 | UPC1M$ | MACR | x | |
| EX$TSK | | | 00000002 | UPC2M$ | MACR | x | |
| EXEC | | | 00000000 | UPC3M$ | MACR | x | |
| F$ASMPL | | | 00004000 | UPC4M$ | MACR | x | |
| F$DNUT | | | 00000400 | UPC5M$ | MACR | x | |
| F$EEPM | | | 00000040 | UPDCL$ | MACR | x | |
| F$KYBD | | | 00000100 | UPMMR$ | MACR | x | |
| F$MON | | | 00000080 | WAIT | | | 0000001C |
| F$OST | | | 00001000 | WAITCN | | | 00000020 |
| F$PDI | | | 00000800 | WAITLP | | | 00000024 |
| F$PROC | | | 00002000 | WAITQ | | 9 | 0000011C |
| F$XMIT | | | 00000200 | WAKEUP | | | 00000018 |
| FF | | | 0000000C | XSVC | MACR | x | |
| GET$ | MACR | x | | | | | |

```
                                  BUFINI: IDNT     0,5                  Buffer Initializer  2/16/83
                                          OPT      PCS,BRS
                                  *
                                  * SUBROUTINE:    BUFINI
                                  *
                                  * REVISED:       2/16/83
                                  *
                                  * AUTHOR:        D. A. ZEICHNER
                                  *
                                  * PURPOSE:       INITIALIZE BOTH ANALOG AND DIGITAL INPUT BUFFERS.
                                  *
                                  * INPUTS:        NONE.
                                  *
                                  * OUTPUTS:       NONE.
                                  *
                                  * EXTERNAL REFERENCES/DEFINITIONS:

                                          XDEF     BUFINI
                                  *
                                  * RAM REFERENCES:
                                  *
                                          XREF.S   5:AIB$
                                          XREF.S   5:DIB$
                                  *
                                  * EEPROM REFERENCES:
                                  *
                                          XREF     IPT$
                                  *
                                  *
              00000009                    SECTION  PROM                 READ ONLY SECTION (PSCT)
                                  *
9 00000000 41FAFFFE               BUFINI: LEA      AIB$(PC),A0          PTR TO ANALOG INPUT BUFFERS
9 00000004 43F900000000                   LEA      IPT$,A1              PTR TO INPUT PERSONALTY TABLE
                                  *
                                          FOR      D7 = #0 TO #47 DO
9 00000010                        Z_L1.001
                                  *
9 00000010 7025                             MOVEQ  #AIBENT$-1,D0
9 00000012 6146                             BSR    CLRLUP           CLEAR OUT AIB
                                  *
9 00000014 3007                             MOVE   D7,D0            GET INPUT NUMBER
9 00000016 EB40                             ASL    #5,D0            POSITION INPUT NUMBER
9 00000018 3211                             MOVE   (A1),D1          GET INPUT TYPE
9 0000001A 0241C000                         AND    #$C000,D1        ISOLATE IT
9 0000001E E649                             LSR    #3,D1            POSITION INPUT TYPE
9 00000020 8240                             OR     D0,D1            BUILD HEADER
9 00000022 3081                             MOVE   D1,(A0)          SAVE HEADER IN BUFFER
                                  *
9 00000024 41E80026                         LEA    AIBENT$(A0),A0   BUMP PTR TO NEXT AIB
9 00000028 43E90014                         LEA    IPTENT$(A1),A1   BUMP PTR TO NEXT IPT ENTRY
                                  *
                                          ENDF                          END OF AIB INIT LOOP
                                  *
                                  * NOW DO THE SAME FOR DIGITAL INPUT BUFFERS
                                  *
9 00000034 41FAFFCA                       LEA      DIB$(PC),A0          PTR TO DIB'S
                                  *
                                          FOR      D7 = #0 TO #15 DO
9 0000003E                        Z_L1.003
                                  *
9 0000003E 7025                             MOVEQ  #DIBENT$-1,D0
9 00000040 6118                             BSR    CLRLUP           CLEAR OUT THIS DIB
                                  *
9 00000042 3007                             MOVE   D7,D0
9 00000044 EF40                             ASL    #7,D0            POSITION INPUT NUMBER
9 00000046 00401800                         OR     #$1800,D0        SET INPUT TYPE TO 3
```

```
9 0000004A 3080           MOVE    D0,(A0)           SAVE IN HEADER
                 *
9 0000004C 41E80026       LEA     DIBENT$(A0),A0    BUMP PTR TO NEXT ENTRY
                          ENDF
                 *
9 00000058 4E75           RTS                       DONE!
                 *
                 *
                 * SUBROUTINES:
                 *
                 * CLRLUP - CLEAR A BLOCK OF MEMORY.
                 *
                 * A0 - ADDRESS OF BLOCK
                 * D0 - # OF BYTES-1 TO CLEAR
                 *
9 0000005A 42300000 CLRLUP CLR.B  (A0,D0)           CLEAR TABLE ENTRY
9 0000005E 51C8FFFA       DBRA    D0,CLRLUP
9 00000062 4E75           RTS
                 *
                 *
                          END
```

****** TOTAL ERRORS 0--
****** TOTAL WARNINGS 0--

SYMBOL TABLE LISTING

| SYMBOL NAME | SECT | VALUE | SYMBOL NAME | SECT | VALUE |
|---|---|---|---|---|---|
| .1SEC | | 0000000A | F$ASMFL | | 00004000 |
| .AIQSIZ | | 00000033 | F$DNUT | | 00000400 |
| .AOQSIZ | | 00000038 | F$KYBD | | 00000100 |
| .COSINE | | 00000014 | F$MON | | 00000080 |
| .DIQSIZ | | 0000001C | F$OST | | 00001000 |
| .EFFECT | | 0000001C | F$POI | | 00000800 |
| .HIQSIZ | | 00000010 | F$PROC | | 00002000 |
| .HOQSIZ | | 00000180 | F$XMIT | | 00000200 |
| .ICOS | | 0000000A | FF | | 0000000C |
| .IEFF | | 00000018 | HT | | 00000009 |
| .ISCALE | | 00000006 | IPT$ | XREF * | 00000000 |
| .ISIN | | 0000000E | IPTENT$ | | 00000014 |
| .KWH | | 00000024 | MAXAGE | | 00000004 |
| .PIQSIZ | | 0000003F | ONESEC | | 0003D090 |
| .REFSIZ | | 00000400 | ONETIK | | 000009C4 |
| .SAMPLE | | 00000002 | OPTENT$ | | 00000004 |
| .SCALE1 | | 00000004 | PAAR | | 00000014 |
| .SCALE2 | | 00000008 | PACR | | 0000000C |
| .SCALE3 | | 0000000C | PADDR | | 00000004 |
| .SCALE4 | | 00000010 | PADR | | 00000010 |
| .SINE | | 00000018 | PBAR | | 00000016 |
| .STEMP | | 0000001C | PBCR | | 0000000E |
| .TEMP | | 0000001C | PBDDR | | 00000006 |
| .TOFSET | | 0000000E | PBDR | | 00000012 |
| .TSCALE | | 0000000A | PCDDR | | 00000008 |
| .VCOS | | 00000002 | PCDR | | 00000018 |
| .VEFF | | 00000014 | PGCR | | 00000000 |
| .VSCALE | | 00000002 | PIVR | | 0000000A |
| .VSIN | | 00000006 | PROM | | 00000009 |
| .WATTS | | 00000020 | PSR | | 0000001A |
| .WATTSEC | | 00000022 | PSRR | | 00000002 |
| AIB$ | XREF 5 | 00000000 | PULL | MACR * | |
| AIBENT$ | | 00000026 | PUSH | MACR * | |
| BUFINI | XDEF 9 | 00000000 | RAN | | 00000005 |
| CLRLUP | 9 | 0000005A | S60 | | 00003D0F |
| CNTR | | 0000002E | SPACE | | 00000020 |

```
CPR                 00000024    STX                00000002
CR                  00000000    TCR                00000020
DIB$      XREF   5  00000000    TIVR               00000022
DIBENT$             00000026    TSR                00000034
DSFTENT$            00000010    Z_L1.001       9   00000010
EEPROM              00000007    Z_L1.003       9   0000003E
EOT                 00000004    Z_L2.000       9   0000002E
ETX                 00000003    Z_L2.002       9   00000052

                     BUFRDY  IDNT    0,6                 CHECK BUFFERS READY FOR OUTPUT PROCESSING 3/18/83
                             OPT     PCS,BRS
                     *
                     * SUBROUTINE:   BUFRDY
                     *
                     * REVISED:      3/18/83
                     *
                     * AUTHOR:       D. A. ZEICHNER
                     *
                     * PURPOSE:      GIVEN A POINTER TO AN OUTPUT PERSONALITY TABLE ENTRY,
                     *               DETERMINE THAT THE BUFFERS REQUIRED TO CALCULATE THIS
                     *               OUTPUT VALUE CONTAIN VALID DATA. (THAT IS, THE AC FLAG
                     *               IN THE BUFFERS ARE SET.)
                     *
                     * INPUTS:       A0 - POINTS TO OPT ENTRY.
                     *
                     * OUTPUTS:      A0 - PRESERVED.
                     *               A1-A2/D0-D2 - DESTROYED.
                     *               CARRY SET IF BUFFER NOT READY.
                     *
                     *
                     * EXTERNAL REFERENCES/DEFINITIONS:
                     *
                             XDEF    BUFRDY
                     *
                     * RAM REFERENCES:
                     *
                             XREF.S  5:AIB$
                             XREF.S  5:DIB$
                     *
                     * EEPROM REFERENCES:
                     *
                             XREF    IPT$
                     *
                     *
        00000009             SECTION  PROM
                     *
9 00000000 1410      BUFRDY  MOVE.B  (A0),D2             GET OUTPUT TYPE
9 00000002 EA0A              LSR.B   #5,D2               ISOLATE IT.
9 00000004 652A              BCS     MONAD               D BIT HAS SET - ENTRY IS MONADIC
9 00000006 0C020003          CMP.B   #3,D2               FREQUENCY?
9 0000000A 672E              BEQ     BUFXIT              YES - ALWAYS READY. (NO BUFFERS)
9 0000000C 6D22              BLT     MONAD               LESS THAN 3 - ENTRY IS MONADIC
                     *
                     * IF OUTPUT TYPE IS > 3, AND THE D BIT IS CLEAR, WE HAVE A DYADIC
                     * PARAMETER. IN THIS CASE, WE HAVE TO CHECK OUT THE CHAIN POINTED
                     * TO BY THE 1ST (& POSSIBLY THE 2ND) CURRENT INPUT NUMBERS. OTHERWISE,
                     * OTHERWISE, WE NEED ONLY CHECK OUT THE BUFFER CHAIN INDICATED BY THE
                     * VOLTAGE INPUT NUMBER.
                     *
9 0000000E 30280002          MOVE    2(A0),D0            GET 2ND CURRENT INPUT #
9 00000012 0240003F          AND     #$3F,D0             REMOVE ALL JUNK BITS
9 00000016 0C40003F          CMP     #$3F,D0             UNUSED?
9 0000001A 6704              BEQ     NO2ND               YES - TRY 1ST CURRENT INPUT #
9 0000001C 611E              BSR     BUFCHN              TRACE BUFFER CHAIN
9 0000001E 651A              BCS     BUFXIT              NOT READY - EXIT BAD
                     *
```

```
9 00000020 3010          NO2ND   MOVE    (A0),D0          GET 1ST CURRENT INPUT #
9 00000022 0240003F              AND     #$3F,D0
9 00000026 0C40003F              CMP     #$3F,D0          UNUSED?
9 0000002A 67F4                  BEQ     NO2ND            ERROR - TRY AGAIN !
9 0000002C 610E                  BSR     BUFCHN
9 0000002E 650A                  BCS     BUFXIT           NOT READY - EXIT BAD
                         *
                         * NOW CHECK THE VOLTAGE INPUT NUMBER CHAIN. THIS IS DONE
                         * IN ANY CASE. (EXCEPT FREQUENCY, WHICH IS ALWAYS OK.)
                         *
9 00000030 3010          MONAD   MOVE    (A0),D0          GET 1ST WORD OF OPT ENTRY
9 00000032 EC48                  LSR     #6,D0            JUSTIFY INPUT NUMBER
9 00000034 0240003F              AND     #$3F,D0
9 00000038 6102                  BSR     BUFCHN           TRACE BUFFER CHAIN
                         *
9 0000003A 4E75          BUFXIT  RTS                      THIS WAY OUT!
                         *
                         *
                         * SUBROUTINES:
                         *
                         * BUFCHN - TRACE A CHAIN OF BUFFERS, AND RETURN W/ THE CARRY SET IF
                         *           ANY ONE IS NOT READY.
                         *
                         *          A0 - PTR TO OPT ENTRY
                         *          D0 - INPUT NUMBER
                         *          D2 - OUTPUT TYPE
                         *
                         *          A1, A2, D0, D1 DESTROYED.
                         *
9 0000003C 08100004      BUFCHN  BTST    #4,(A0)
9 00000040 6730                  BEQ     ABUF             INPUT TYPE IS ANALOG.
                         *
                         * INPUT TYPE IS DIGITAL. THE INPUT NUMBER POINTS TO THE
                         * 1ST OF THREE BUFFERS IF THE OUTPUT TYPE > 3. IF < 3,
                         * THE INPUT NUMBER POINTS TO A SINGLE BUFFER. (SAME RULES
                         * APPLY FOR ANALOG INPUT)
                         *
9 00000042 43FAFFBC              LEA     DIB$(PC),A1      POINT TO DIGITAL INPUT BUFFERS
9 00000046 C0FC0026              MULU    #DIBENT$,D0      CALCULATE OFFSET TO 1ST BUFFER
9 0000004A 083100060000          BTST    #6,(A1,D0)       BUFFER READY?
9 00000050 6756                  BEQ     BUFBSY           NO - RETURN BAD
9 00000052 0C020003              CMP.B   #3,D2
9 00000056 6D4A                  BLT     BUFIDL           SINGLE BUFFER PARAMETER - WE'RE FINISHED
9 00000058 06400026              ADD     #DIBENT$,D0      OK - BUMP OFFSET TO NEXT BUFFER
9 0000005C 083100060000          BTST    #6,(A1,D0)       2ND BUFFER READY?
9 00000062 6744                  BEQ     BUFBSY           NO - EXIT BAD
9 00000064 06400026              ADD     #DIBENT$,D0      OK - BUMP OFFSET TO LAST BUFFER
9 00000068 083100060000          BTST    #6,(A1,D0)
9 0000006E 6632                  BNE     BUFIDL           LAST BUFFER READY - EXIT OK
9 00000070 6036                  BRA     BUFBSY           NOT READY - EXIT BAD
                         *
                         * INPUT TYPE IS ANALOG. FOLLOW CHAIN IN INPUT PERSONALITY TABLE.
                         *
9 00000072 43FAFF8C      ABUF    LEA     AIB$(PC),A1      POINT TO ANALOG INPUT BUFFERS
9 00000076 45F900000000          LEA     IPT$,A2          POINT TO INPUT PERSONALITY TABLE
                         *
9 0000007C 3200          ALUP    MOVE    D0,D1            SAVE INPUT # IN D1.
9 0000007E C0FC0026              MULU    #AIBENT$,D0      OFFSET TO ANALOG BUFFER
9 00000082 083100060000          BTST    #6,(A1,D0)       IS BUFFER READY?
9 00000088 671E                  BEQ     BUFBSY           NO - EXIT BAD
9 0000008A 0C020003              CMP.B   #3,D2
9 0000008E 6D12                  BLT     BUFIDL           DONE - ONLY NEED TO CHECK 1 BUFFER
9 00000090 C2FC0014              MULU    #IPTENT$,D1      OFFSET TO IPT ENTRY
9 00000094 30321000              MOVE    (A2,D1),D0       GET LINK TO NEXT BUFFER IN D0.
9 00000098 0240003F              AND     #$3F,D0          MASK OUT EXTRA BITS
9 0000009C 0C40003F              CMP     #$3F,D0          END OF CHAIN?
9 000000A0 660A                  BNE     ALUP             NO - CONTINUE
```

```
               *
9 000000A2 023C00FE   BUFIDL   AND   #$FE,CCR        CLEAR CARRY, AND
9 000000A6 4E75                RTS                   RETURN OK!
               *
9 000000A8 003C0001   BUFBSY   OR    #1,CCR          SET CARRY
9 000000AC 4E75                RTS                   & RETURN BAD
               *
               *
                               END

****** TOTAL ERRORS      0--
****** TOTAL WARNINGS    0--

                      CRC16    IDNT  0,3             Update CRC word  2/08/83
                               OPT   PCS,BRS
               *
               * SUBROUTINE:    CRC
               *
               * REVISED:       2/08/83
               *
               * AUTHOR:        D. A. ZEICHNER
               *
               * PURPOSE:       UPDATE CRC WORD, 16 BIT WORD (CRC16)
               *                IS UPDATED A BYTE AT A TIME.
               *
               * INPUTS:        D0 - INCOMING BYTE
               *                D7 - INCOMING WORD OF CRC TO BE UPDATED
               *
               * OUTPUTS:       D7 - UPDATED CRC WORD
               *
               * EXTERNAL REFERENCES/DEFINITIONS:
               *
                               XDEF  CRC16
               *
               * LOCAL ASSIGNMENTS:
               *
        00008005      C16POLY  EQU   $8005           16 BIT CRC POLYNOMIAL
               *
                      REGS     REG   D0-D1           REGISTER LIST
               *
```

SYMBOL TABLE LISTING

| SYMBOL NAME | SECT | VALUE | SYMBOL NAME | SECT | VALUE |
|---|---|---|---|---|---|
| .1SEC | | 0000000A | EOT | | 00000004 |
| .AIQSIZ | | 00000038 | ETX | | 00000003 |
| .AOQSIZ | | 0000003B | F$ASMPL | | 00004000 |
| .COSINE | | 00000014 | F$DNUT | | 00000400 |
| .DIQSIZ | | 0000001C | F$EEPM | | 00000040 |
| .EFFECT | | 0000001C | F$KYBD | | 00000100 |
| .HIQSIZ | | 000000C8 | F$MON | | 00000080 |
| .HOQSIZ | | 00000180 | F$OST | | 00001000 |
| .ICOS | | 0000000A | F$PDI | | 00000800 |
| .IEFF | | 00000018 | F$PROC | | 00002000 |
| .ISCALE | | 00000006 | F$XMIT | | 00000200 |
| .ISIN | | 0000000E | FF | | 0000000C |
| .KWH | | 00000024 | HT | | 00000009 |
| .PIQSIZ | | 0000003F | IPT$ | XREF * | 00000000 |
| .RBFSIZ | | 00000400 | IPTENT$ | | 00000014 |
| .SAMPLE | | 00000002 | MAXAGE | | 00000004 |
| .SCALE1 | | 00000004 | MONAD | 9 | 00000030 |
| .SCALE2 | | 00000008 | MONEND | 9 | 00000920 |
| .SCALE3 | | 0000000C | ONESEC | | 00030090 |
| .SCALE4 | | 00000010 | ONETIK | | 000009C4 |

```
.SINE                00000016   OPTENT$            00000004
.STEMP               0000001C   PAAR               00000014
.TEMP                00000012   PACR               0000000C
.TOFSET              0000000E   PADDR              00000004
.TSCALE              0000000A   PADR               00000010
.VCOS                00000002   PBAR               00000016
.VEFF                00000014   PBCR               0000000E
.VSCALE              00000002   PBDDR              00000006
.VSIN                00000006   PBDR               00000012
.WATTS               00000020   PCDDR              00000008
.WATTSEC             00000022   PCDR               00000018
ABUF            9    00000072   PGCR               00000000
AIB$      XREF  5    00000000   PIVR               0000000A
AIBENT$              00000026   PPOM               00000009
ALUP            9    0000007C   PSR                0000001A
BUFBSY          9    000000A8   PSRR               00000002
BUFCHN          9    0000003C   PULL       MACR  x
BUFIDL          9    000000A2   PUSH       MACR  x
BUFRDY    XDEF  9    00000000   RAM                00000005
BUFXIT          9    0000003A   S60                000039DF
CNTR                 0000002E   SPACE              00000020
CPR                  00000024   STX                00000002
CR                   0000000D   TCR                00000020
CTRL13               00000000   TIMR1              00000004
CTRL2                00000002   TIMR2              00000008
DIB$      XREF  5    00000000   TIMR3              0000000C
DIBENT$              00000026   TIVR               00000022
DSFTENT$             00000010   TSR                00000034
EEPROM               00000007
```

```
                         CRCTST   IDNT    0,2                 BLOCK CRC CALCULATION     1/19/83
                                  OPT     PCS,BRS
                         x
                         x SUBROUTINE:    CRCTST
                         x
                         x REVISED:       1'19/83
                         x
                         x AUTHOR:        D. A. ZEILHNEF
                         x
                         x PURPOSE:       CALCULATE 16 BIT CRC OF SPECIFIED BLOCK OF MEMORY.
                         x
                         x INPUTS:        A0 - POINTER TO MEMORY BLOCK
                         x                D1 - # OF BYTES TO CHECK
                         x
                         x OUTPUTS:       A0 - ADDRESS FOLLOWING SPECIFIED BLOCK
                         x                D1 - ZERO
                         x                D0 - DESTROYED
                         x                D7 - 16 BIT CRC WORD
                         x
                         x EXTERNAL REFERENCES/DEFINITIONS:
                         x
                                  XDEF    CRCTST
                         x
                         x EPROM (PROGRAM) REFERENCE:
                         x
                                  XREF.S  9:CRC16
                         x
                         x
         00000009                 SECTION PROM
                         x
                         x WE HAVE A 16 BIT CRC. SHIFT LEFT 8 TIMES,
                         x AND XOR W/ POLYNOMIAL IF CARRY.
                         x
  9 00000000             CRC16    PUSH    REGS                SAVE D0,D1
  9 00000004 E140                 ASL     #8,D0               LEFT JUSTIFY INCOMING BYTE
  9 00000006 7207                 MOVEQ   #7,D1               # OF INCOMING DATA BITS (-1)
  9 00000008 B147                 EOR     D0,D7               EOR INCOMING DATA INTO CRC WORD
```

```
    *
9 0000000A E347        SHF16    ASL.W    #1,D7
9 0000000C 6404                 BCC      SHF16S               NO CARRY, SKIP XOR
9 0000000E 0A478005             EOR.W    #C16POLY,D7          CARRY - XOR W/ POLYNOMIAL
                       *
9 00000012 51C9FFF6    SHF16S   DBRA     D1,SHF16             DECREMENT COUNT & DO IT AGAIN
                       *
9 00000016             CRCXIT   PULL     REGS                 RESTORE REGISTERS
9 0000001A 4E75                 RTS                           AND RETURN
                       *
                       *
                                END

****** TOTAL ERRORS      0--
****** TOTAL WARNINGS    0--
```

SYMBOL TABLE LISTING

| SYMBOL NAME | SECT | VALUE | SYMBOL NAME | SECT | VALUE |
|---|---|---|---|---|---|
| .1SEC | | 0000000A | F$ASMPL | | 00004000 |
| .AIQSIZ | | 00000038 | F$DMUT | | 00000400 |
| .AOQSIZ | | 00000038 | F$KYBD | | 00000100 |
| .COSINE | | 00000014 | F$MON | | 00000080 |
| .DIQSIZ | | 0000001C | F$OST | | 00001000 |
| .EFFECT | | 0000001C | F$PDI | | 00000800 |
| .HIQSIZ | | 00000010 | F$PROC | | 00002000 |
| .HOQSIZ | | 00000180 | F$XMIT | | 00000200 |
| .ICOS | | 0000000A | FF | | 0000000C |
| .IEFF | | 00000018 | HT | | 00000009 |
| .ISCALE | | 00000006 | IPTENT$ | | 00000014 |
| .ISIN | | 0000000E | MAXAGE | | 00000004 |
| .KWH | | 00000024 | ONESEC | | 0003D090 |
| .PIQSIZ | | 0000003F | ONETIK | | 000007C4 |
| .RBFSIZ | | 00000400 | OPTENT$ | | 00000004 |
| .SAMPLE | | 00000002 | PAAR | | 00000014 |
| .SCALE1 | | 00000004 | PACR | | 0000000C |
| .SCALE2 | | 00000008 | PADDR | | 00000004 |
| .SCALE3 | | 0000000C | PADR | | 00000010 |
| .SCALE4 | | 00000010 | PBAR | | 00000016 |
| .SINE | | 00000018 | PBCR | | 0000000E |
| .STEMP | | 0000001C | PBDDR | | 00000006 |
| .TEMP | | 00000012 | PBDR | | 00000012 |
| .TOFSET | | 0000000E | PCDDR | | 00000008 |
| .TSCALE | | 0000000A | PCDR | | 00000018 |
| .VCOS | | 00000002 | PGCR | | 00000000 |
| .VEFF | | 00000014 | PIVR | | 0000000A |
| .VSCALE | | 00000002 | PROM | | 00000009 |
| .VSIN | | 00000006 | PSR | | 0000001A |
| .WATTS | | 00000020 | PSRR | | 00000002 |
| .WATTSEC | | 00000022 | PULL | MACR | * |
| AIBENT$ | | 00000026 | PUSH | MACR | * |
| C16POLY | | 00008005 | RAM | | 00000005 |
| CNTR | | 0000002E | REGS | REG | * |
| CPR | | 00000024 | S60 | | 000039DF |
| CR | | 0000000D | SHF16 | 9 | 0000000A |
| CRC16 XDEF | 9 | 00000000 | SHF16S | 9 | 00000012 |
| CRCXIT | 9 | 00000016 | SPACE | | 00000020 |
| DIBENT$ | | 00000026 | STX | | 00000002 |
| DSFTENT$ | | 00000010 | TCR | | 00000020 |
| EEPROM | | 00000007 | TIVR | | 00000022 |
| EOT | | 00000004 | TSR | | 00000034 |
| ETX | | 00000003 | | | |

SYMBOL TABLE LISTING

| SYMBOL NAME | SECT | VALUE | SYMBOL NAME | SECT | VALUE |
|---|---|---|---|---|---|
| .1SEC | | 0000000A | EOT | | 00000004 |
| .AIQSIZ | | 00000038 | ETX | | 00000003 |
| .AOQSIZ | | 00000038 | F$ASMPL | | 00004000 |
| .COSINE | | 00000014 | F$DNUT | | 00000400 |
| .DIQSIZ | | 0000001C | F$KYBD | | 00000100 |
| .EFFECT | | 0000001C | F$MON | | 00000080 |
| .HIQSIZ | | 00000010 | F$OST | | 00001000 |
| .HOQSIZ | | 00000180 | F$PDI | | 00000800 |
| .ICOS | | 0000000A | F$PROC | | 00002000 |
| .IEFF | | 00000018 | F$XMIT | | 00000200 |
| .ISCALE | | 00000006 | FF | | 0000000C |
| .ISIN | | 0000000E | HT | | 00000009 |
| .KWH | | 00000024 | IPTENT$ | | 00000014 |
| .PIQSIZ | | 0000003F | MAXAGE | | 00000004 |
| .RBFSIZ | | 00000400 | ONESEC | | 0003D090 |
| .SAMPLE | | 00000002 | ONETIK | | 000009C4 |
| .SCALE1 | | 00000004 | OPTENT$ | | 00000004 |
| .SCALE2 | | 00000008 | PAAR | | 00000014 |
| .SCALE3 | | 0000000C | PACR | | 0000000C |
| .SCALE4 | | 00000010 | PADDR | | 00000004 |
| .SINE | | 00000018 | PADR | | 00000010 |
| .STEMP | | 0000001C | PBAR | | 00000016 |
| .TEMP | | 00000012 | PBCR | | 0000000E |
| .TOFSET | | 0000000E | PBDDR | | 00000006 |
| .TSCALE | | 0000000A | PBDR | | 00000012 |
| .VCOS | | 00000002 | PCDDR | | 00000008 |
| .VEFF | | 00000014 | PCDR | | 00000018 |
| .VSCALE | | 00000002 | PGCR | | 00000000 |
| .VSIN | | 00000006 | PIVR | | 0000000A |
| .WATTS | | 00000020 | PROM | | 00000009 |
| .WATTSEC | | 00000022 | PSR | | 0000001A |
| AIBENT$ | | 00000026 | PSRR | | 00000002 |
| CNTR | | 0000002E | PULL | MACR | x |
| CPR | | 00000024 | PUSH | MACR | x |
| CR | | 0000000D | RAM | | 00000005 |
| CRC16 | XREF 9 | 00000000 | S60 | | 0000390F |
| CRCLUP | 9 | 00000002 | SPACE | | 00000020 |
| CRCTST | XDEF 9 | 00000000 | STX | | 00000002 |
| DIBENT$ | | 00000026 | TCR | | 00000020 |
| DSFTENT$ | | 00000010 | TIVR | | 00000022 |
| EEPROM | | 00000007 | TSR | | 00000034 |

```
185                      *
186          00000009              SECTION  PROM
187                      *
188 9 00000000 5341      CRCTST    SUBQ     #1,D1             ADJUST BYTE COUNT
189                      *
190 9 00000002 1018      CRCLUP    MOVE.B   (A0)+,D0          GET BYTE
191 9 00000004 6100FFFA            BSR      CRC16             AND UPDATE CRC
192 9 00000008 51C9FFF8            DBRA     D1,CRCLUP
193 9 0000000C 4E75                RTS
194                      *
195                      *
196                                END

****** TOTAL ERRORS      0--
****** TOTAL WARNINGS    0--
```

```
                         DEQUE   IDNT    0,3                 REMOVE DATA FROM QUEUE     1/19/83
                                 OPT     FCS,BRS
                         *
                         * SUBROUTINE:   DEQUE
                         *
                         * STARTED:      1/19/83
                         *
                         * AUTHOR:       D. A. ZEICHNER
                         *
                         * PURPOSE:      REMOVE DATA FROM QUEUE.
                         *
                         * INPUTS:       A0 - POINTER TO QUEUE HEADER BLOCK OF THE FORMAT:
                         *
                         *                    DS.W QUEUE HEAD POINTER
                         *                    DS.W QUEUE TAIL POINTER
                         *                    DS.W QUEUE END POINTER
                         *                    DS.W QUEUE STATUS BYTE
                         *                    DS.B QUEUE STORAGE AREA
                         *
                         * OUTPUTS:      D0 - BYTE/WORD DEQUED.
                         *               CARRY SET IF QUEUE EMPTY
                         *               Z FLAG SET (EQUAL) IF DEQUE SUCCESSFUL
                         *
                         * EXTERNAL REFERENCES/DEFINITIONS:
                         *
                                 XDEF    DEQUE
                         *
                         * LOCAL ASSIGNMENTS:
                         *
        00000007         QSTAT   EQU     7                   OFFSET TO QUEUE STATUS BYTE
        00000004         QEND    EQU     4                   OFFSET TO END OF QUEUE POINTER
        00000002         QTAIL   EQU     2                   OFFSET TO QUEUE TAIL POINTER
        00000001         QSIZE   EQU     1                   QUEUE ELEMENT SIZE BIT
        00000000         QHEAD   EQU     0                   OFFSET TO QUEUE HEAD POINTER
        00000000         QFULL   EQU     0                   QUEUE FULL BIT
                         *
                         *
        00000009                 SECTION PROM
                         *
9 00000000               DEQUE   PUSH    A1                  SAVE A1
                         *
9 00000004 32680002              MOVE    QTAIL(A0),A1        GET QUEUE TAIL POINTER
9 00000008 08A800000007          BCLR    #QFULL,QSTAT(A0)    RESET QUEUE FULL FLAG
                                 IF      <EQ> THEN
9 00000010 B2D0                    CMPA.W  QHEAD(A0),A1      FULL FLAG WAS ALREADY CLEAR - IS Q EMPTY?
9 00000012 672A                    BEQ     DEQMT             YES - EXIT BAD
                                 ENDI
9 00000014               Z_L1.000
                         *
9 00000014 082800010007          BTST    #QSIZE,QSTAT(A0)    TEST BYTE FLAG
                         *
                         * IF THE WORD FLAG IS SET, THEN
                         * REMOVE A FULL WORD FROM THE QUEUE.
                         *
                                 IF      <NE> THEN
9 0000001C 3019                    MOVE.W  (A1)+,D0
                                 ELSE
9 00000020               Z_L1.003
9 00000020 1019                    MOVE.B  (A1)+,D0
                                 ENDI
9 00000022               Z_L2.005
                         *
                         * IF WE HAVE REACHED THE END OF THE
                         * QUEUE, THEN ROLLOVER TO THE TOP
                         *
                                 IF      A1 <EQ> QEND(A0) THEN
```

```
9 0000002B 43E80008          LEA     8(A0),A1         QUEUE STARTS 8 BYTES AFTER HEADER
                             ENDI
9 0000002C          Z_L1.006
                    x
9 0000002C 31490002          MOVE    A1,QTAIL(A0)     UPDATE QUEUE TAIL POINTER
9 00000030 023C00FC          AND     #$FC,CCR         CLEAR CARRY & OVERFLOW
9 00000034 003C0004          OR      #4,CCR           & SET Z FLAG
                    x
9 00000038          DEQXIT   PULL    A1               RESTORE A1
9 0000003C 4E75              RTS                      AND RETURN
                    x
9 0000003E 003C0001 DEQMT    OR      #1,CCR           SET CARRY
9 00000042 60F4              BRA     DEQXIT           & RETURN .
                    x
                    x
                             END

xxxxxx TOTAL ERRORS      0--
xxxxxx TOTAL WARNINGS    0--
```

SYMBOL TABLE LISTING

| SYMBOL NAME | SECT | VALUE | SYMBOL NAME | SECT | VALUE |
|---|---|---|---|---|---|
| .1SEC | | 0000000A | F$MON | | 00000080 |
| .AIQSIZ | | 00000038 | F$OST | | 00001000 |
| .AOQSIZ | | 00000038 | F$PDI | | 00000800 |
| .COSINE | | 00000014 | F$PROC | | 00002000 |
| .DIQSIZ | | 0000001C | F$XMIT | | 00000200 |
| .EFFECT | | 0000001C | FF | | 0000000C |
| .HIQSIZ | | 00000010 | HT | | 00000009 |
| .HOQSIZ | | 00000180 | IPTENT$ | | 00000014 |
| .ICOS | | 0000000A | MAXAGE | | 00000004 |
| .IEFF | | 00000018 | ONESEC | | 0003D090 |
| .ISCALE | | 00000006 | ONETIK | | 000009C4 |
| .ISIN | | 0000000E | OPTENT$ | | 00000004 |
| .KWH | | 00000024 | PAAR | | 00000014 |
| .PIQSIZ | | 0000003F | PACR | | 0000000C |
| .RBFSIZ | | 00000400 | PADDR | | 00000004 |
| .SAMPLE | | 00000002 | PADR | | 00000010 |
| .SCALE1 | | 00000004 | PBAR | | 00000016 |
| .SCALE2 | | 00000008 | PBCR | | 0000000E |
| .SCALE3 | | 0000000C | PBDDR | | 00000006 |
| .SCALE4 | | 00000010 | PBDR | | 00000012 |
| .SINE | | 00000018 | PCDDR | | 00000008 |
| .STEMP | | 0000001C | PCDR | | 00000018 |
| .TEMP | | 00000012 | PGCR | | 00000000 |
| .TOFSET | | 0000000E | PIVR | | 0000000A |
| .TSCALE | | 0000000A | PROM | | 00000009 |
| .VCOS | | 00000002 | PSR | | 0000001A |
| .VEFF | | 00000014 | PSRR | | 00000002 |
| .VSCALE | | 00000002 | PULL | MACR x | |
| .VSIN | | 00000006 | PUSH | MACR x | |
| .WATTS | | 00000020 | QEND | | 00000004 |
| .WATTSEC | | 00000022 | QFULL | | 00000000 |
| AIBENT$ | | 00000026 | QHEAD | | 00000000 |
| CNTR | | 0000002E | QSIZE | | 00000001 |
| CPR | | 00000024 | QSTAT | | 00000007 |
| CR | | 00000000 | QTAIL | | 00000002 |
| DEQMT | 9 | 0000003E | RAM | | 00000005 |
| DEQUE XDEF | 9 | 00000000 | S60 | | 000039DF |
| DEQXIT | 9 | 00000038 | SPACE | | 00000020 |
| DIBENT$ | | 00000026 | STX | | 00000002 |
| DSFTENT$ | | 00000010 | TCR | | 00000020 |
| EEPROM | | 00000007 | TIVR | | 00000022 |

```
EOT                 00000004    TSR                00000034
ETX                 00000003    Z_L1.000       9   00000014
F$ASMPL             00004000    Z_L1.003       9   00000020
F$DNUT              00000400    Z_L1.006       9   0000002C
F$KYBD              00000100    Z_L2.005       9   00000022

                        DIRP    IDNT    0,4               Donut interrupt service  1/17/83
                                OPT     PCS,BRS
                        *
                        * SUBROUTINE:   DIRP
                        *
                        * REVISED:      1/17/83
                        *
                        * AUTHOR:       D. A. ZEICHNER
                        *
                        * PURPOSE:      DONUT RECEIVER INTERRUPT SERVICE
                        *
                        * INPUTS:       DONUT RECEIVER (DRCVR)
                        *
                        * OUTPUTS:      DONUT INPUT QUEUE (DNTIQ$)
                        *
                        * EXTERNAL REFERENCES/DEFINITIONS:
                        *
                                XDEF    DIRP
                        *
                        * HARDWARE REFERENCES:
                        *
                                XREF    DRCVR
                        *
                        * RAM REFERENCES:
                        *
                                XREF.S  5:DNTIQ$
                        *
                        * EPROM (PROGRAM) REFERENCES:
                        *
                                XREF.S  9:ENQUE
                        *
                        *
             00000009           SECTION PROM
                        *
    9 00000000          DIRP    PUSH    D0/A0             SAVE REGISTERS
    9 00000004 41F900000000     LEA     DRCVR,A0          POINT TO DONUT RECVR PI/T
    9 0000000A 01080010         MOVEP   PADR(A0),D0       & GET INCOMING DATA
    9 0000000E 41FAFFF0         LEA     DNTIQ$(PC),A0     GET QUEUE ADDRESS
                        *
                        * IF QUEUE FILLS UP, TOO BAD. WE JUST CAN'T
                        * PROCESS STUFF ANY FASTER THAN THIS. (MAYBE
                        * MAKE A BIGGER QUEUE?)
                        *
    9 00000012 4EBAFFEC         JSR     ENQUE(PC)         SAVE DATA ON QUEUE
    9 00000016 6402             BCC     DEXIT
                        *
                        * THIS NOP IS HERE SO WE CAN USE THE ANALYZER
                        * TO SEE IF WE'RE OVERFLOWING THE QUEUE.
                        *
    9 00000018 4E71             NOP                       JUST SO WE CAN SEE IF WE GET OVERFLOW.
                        *
    9 0000001A          DEXIT   PULL    D0/A0             RESTORE REGISTERS
    9 0000001E 4E73             RTE
                        *
                        *
                                END

****** TOTAL ERRORS     0--
****** TOTAL WARNINGS   0--
```

SYMBOL TABLE LISTING

| SYMBOL NAME | SECT | VALUE | SYMBOL NAME | SECT | VALUE |
|---|---|---|---|---|---|
| .1SEC | | 0000000A | ENQUE | XREF 9 | 00000000 |
| .AIQSIZ | | 00000038 | EOT | | 00000004 |
| .AOQSIZ | | 00000038 | ETX | | 00000003 |
| .COSINE | | 00000014 | F$ASMPL | | 00004000 |
| .DIQSIZ | | 0000001C | F$DNUT | | 00000400 |
| .EFFECT | | 0000001C | F$KYBD | | 00000100 |
| .HIQSIZ | | 00000010 | F$MON | | 00000080 |
| .HOQSIZ | | 00000180 | F$OST | | 00001000 |
| .ICOS | | 0000000A | F$PDI | | 00000800 |
| .IEFF | | 00000018 | F$PROC | | 00002000 |
| .ISCALE | | 00000006 | F$XMIT | | 00000200 |
| .ISIN | | 0000000E | FF | | 0000000C |
| .KWH | | 00000024 | HT | | 00000009 |
| .PIQSIZ | | 0000003F | IPTENT$ | | 00000014 |
| .REFSIZ | | 00000400 | MAXAGE | | 00000004 |
| .SAMPLE | | 00000002 | ONESEC | | 00030090 |
| .SCALE1 | | 00000004 | ONETIK | | 000009C4 |
| .SCALE2 | | 00000008 | OPTENT$ | | 00000004 |
| .SCALE3 | | 0000000C | PAAR | | 00000014 |
| .SCALE4 | | 00000010 | PACR | | 0000000C |
| .SINE | | 00000018 | PADDR | | 00000004 |
| .STEMP | | 0000001C | PADR | | 00000010 |
| .TEMP | | 00000012 | PBAR | | 00000016 |
| .TOFSET | | 0000000E | PBCR | | 0000000E |
| .TSCALE | | 0000000A | PBDDR | | 00000006 |
| .VCOS | | 00000002 | PBDR | | 00000012 |
| .VEFF | | 00000014 | PCDDR | | 00000008 |
| .VSCALE | | 00000002 | PCDR | | 00000018 |
| .VSIN | | 00000006 | PGCR | | 00000000 |
| .WATTS | | 00000020 | PIVR | | 0000000A |
| .WATTSEC | | 00000022 | PROM | | 00000009 |
| AIBENT$ | | 00000026 | PSR | | 0000001A |
| CNTR | | 0000002E | PSRR | | 00000002 |
| CPR | | 00000024 | PULL | MACR * | |
| CR | | 0000000D | PUSH | MACR * | |
| DEXIT | 9 | 0000001A | RAM | | 00000005 |
| DIBENT$ | | 00000026 | S60 | | 0000390F |
| DIRP | XDEF 9 | 00000000 | SPACE | | 00000020 |
| DNTIO$ | XREF 5 | 00000000 | STX | | 00000002 |
| DRCVR | XREF * | 00000000 | TCR | | 00000020 |
| DSFTENT$ | | 00000010 | TIVR | | 00000022 |
| EEPROM | | 00000007 | TSR | | 00000034 |

```
                DISPLY  IDNT    0,8                 Front panel display handler  2/23/83
                        OPT     PCS,BRS
*
* SUBROUTINE:   DISPLY/DISPCH
*
* REVISED:      2/23/83
*
* AUTHOR:       D. A. ZEICHNER
*
* PURPOSE:      WRITE STRING (CHARACTER) TO FRONT PANEL.
*               3 CONTROL CHARACTERS ARE SUPPORTED.
*               THEY ARE:
*
*                   CR ($D) - POSITION CURSOR AT START OF LINE
*                   FF ($C) - FILL DISPLAY W/ BLANKS & DO CR
*                   HT ($9) - MOVE CURSOR BACK TO ITS POSITION UPON ENTRY
*
* INPUTS:       A0 - POINTS TO STRING TERMINATED BY EOT ($4). (DISPLY)
```

```
                              *              D0 - CONTAINS BYTE TO BE DISPLAYED. (DISPCH)
                              *
                              * OUTPUTS:     A0 - POINTS TO BYTE FOLLOWING EOT. (DISPLY ONLY)
                              *              ALL OTHER REGISTERS PRESERVED.
                              *
                              * NOTE:   DISPCH PRESERVES D0 FOR ALL VALUES EXCEPT FORMFEED. IN THIS CASE,
                              *         THE LS WORD OF D0 IS RETURNED AS ZERO. (ALSO DISPCH ON ITS OWN WILL
                              *         TRY TO DISPLAY AN EOT. IT WILL APPEAR AS A SPACE)
                              *
                              * EXTERNAL REFERENCES/DEFINITIONS:
                              *
                                      XDEF    DISPLY
                                      XDEF    DISPCH
                              *
                              * HARDWARE REFERENCES:
                              *
                                      XREF    PANEL
                              *
                              * LOCAL DATA AREA:
                              *
           00000005                   SECTION RAM
                              *
 5 00000000 00000004          DISPTR  DS.L    1                  DISPLAY POINTER
 5 00000004 00000004          OLDPTR  DS.L    1                  OLD DISPLAY POINTER
                              *
                              *
           00000009                   SECTION FROM
                              *
 9 00000000                   DISPLY  PUSH    D0/A1
 9 00000004 43FAFFFE                  LEA     OLDPTR(PC),A1      GET ADDR OF OLD POINTER
 9 00000008 22EAFFF6                  MOVE.L  DISPTR(PC),(A1)    SAVE INCOMING CURSOR POSITION
                                      WHILE.B (A0) <NE> #EOT DO
 9 0000000C                   Z_L1.000
 9 00000012 1018                        MOVE.B  (A0)+,D0         GET CHARACTER
 9 00000014 610A                        BSR     DISPCH           & DISPLAY IT
                                      ENDW
 9 00000018                   Z_L2.001
 9 00000018 5248                      ADDQ    #1,A0              BUMP A0 PAST EOT
 9 0000001A                           PULL    A1/D0
 9 0000001E 4E75                      RTS                        & RETURN
                              *
                              *
 9 00000020                   DISPCH  PUSH    A0/A1
 9 00000024 41FAFFDA                  LEA     DISPTR(PC),A0
 9 00000028 227AFFD6                  MOVE.L  DISPTR(PC),A1      GET DISPLAY POINTER
                              *
                                      IF.B    D0 <EQ> #CR THEN
 9 00000032 227C00000020                MOVE.L  #PANEL+32,A1     RESET POINTER TO START OF DISPLAY
 9 00000038 603E                        BRA     DSPSKP
                                      ELSE
 9 0000003C                   Z_L1.003
                                        IF.B    D0 <EQ> #FF THEN CLEAR THE DISPLAY & RESET DISPLAY POINTER
 9 00000042 700F                          MOVEQ   #15,D0         # OF CHARACTERS -1
 9 00000044 227C00000000                  MOVE.L  #PANEL,A1
                              *
 9 0000004A 4211             CLRLUP       CLR.B   (A1)
 9 0000004C 5449                          ADDQ    #2,A1          BUMP TO NEXT COLUMN
 9 0000004E 51C8FFFA                      DBRA    D0,CLRLUP
                              *
 9 00000052 2089                          MOVE.L  A1,(A0)        UPDATE DISPLAY POINTER
 9 00000054 6024                          BRA     DSPXIT
                                        ELSE
 9 00000058                   Z_L1.006
                                          IF.B    D0 <EQ> #HT THEN
 9 0000005E 227AFFA4                        MOVE.L  OLDPTR(PC),A1  RESTORE PREVIOUS POSITION
 9 00000062 6014                            BRA     DSPSKP
                                          ENDI
```

```
    9 00000064                Z_L1.009
                                          ELSE
    9 00000064                Z_L2.008
    9 00000064 B3FC00000000                 CMP.L    #PANEL,A1
    9 0000006A 6F0C                         BLE      DSPSKP        PTR OUT OF RANGE - SKIP REST OF DISPLAY
    9 0000006C B3FC00000020                 CMP.L    #PANEL+32,A1
    9 00000072 6E04                         BGT      DSPSKP        PTR OUT OF RANGE - SKIP REST OF DISPLAY
                              *
    9 00000074 5549                         SUBQ     #2,A1         PTR IN RANGE - MOVE PTR TO NEXT COLUMN
    9 00000076 1280                         MOVE.B   D0,(A1)       & MOVE CHARACTER TO DISPLAY
                              *
                              DSPSKP      ENDI
    9 00000078                Z_L2.005
    9 00000078 2089                         MOVE.L   A1,(A0)       REPLACE DISPLAY POINTER
                              *
    9 0000007A                DSPXIT      PULL     A0-A1         RESTORE REGS
    9 0000007E 4E75                         RTS                    AND RETURN
                              *
                              *
                                          END

****** TOTAL ERRORS      0--
****** TOTAL WARNINGS    0--
```

SYMBOL TABLE LISTING

| SYMBOL NAME | SECT | VALUE | SYMBOL NAME | SECT | VALUE |
|---|---|---|---|---|---|
| .ISEC | | 0000000A | F$DNUT | | 00000400 |
| .AIQSIZ | | 00000038 | F$KYBD | | 00000100 |
| .AOQSIZ | | 00000038 | F$MON | | 00000080 |
| .COSINE | | 00000014 | F$OST | | 00001000 |
| .DIQSIZ | | 0000001C | F$PDI | | 00000800 |
| .EFFECT | | 0000001C | F$PROC | | 00002000 |
| .HIQSIZ | | 00000010 | F$XMIT | | 00000200 |
| .HOQSIZ | | 00000180 | FF | | 0000000C |
| .ICOS | | 0000000A | HT | | 00000009 |
| .IEFF | | 00000018 | IPTENT$ | | 00000014 |
| .ISCALE | | 00000006 | MAXAGE | | 00000004 |
| .ISIN | | 0000000E | OLDPTR | 5 | 00000004 |
| .KWH | | 00000024 | ONESEC | | 0003D090 |
| .PIQSIZ | | 0000003F | ONETIK | | 000009C4 |
| .RBFSIZ | | 00000400 | OPTENT$ | | 00000004 |
| .SAMPLE | | 00000002 | PAAR | | 00000014 |
| .SCALE1 | | 00000004 | PACR | | 0000000C |
| .SCALE2 | | 00000008 | PADDR | | 00000004 |
| .SCALE3 | | 0000000C | PADR | | 00000010 |
| .SCALE4 | | 00000010 | PANEL | XREF * | 00000000 |
| .SINE | | 00000018 | PBAR | | 00000016 |
| .STEMP | | 0000001C | PBCR | | 0000000E |
| .TEMP | | 00000012 | PBDDR | | 00000006 |
| .TOFSET | | 0000000E | PBDR | | 00000012 |
| .TSCALE | | 0000000A | PCDDR | | 00000008 |
| .VCOS | | 00000002 | PCDR | | 00000018 |
| .VEFF | | 00000014 | PGCR | | 00000000 |
| .VSCALE | | 00000002 | PIVR | | 0000000A |
| .VSIN | | 00000006 | PROM | | 00000009 |
| .WATTS | | 00000020 | PSR | | 0000001A |
| .WATTSEC | | 00000022 | PSRR | | 00000002 |
| AIBENT$ | | 00000026 | PULL | MACR * | |
| CLRLUP | 9 | 0000004A | PUSH | MACR * | |
| CNTR | | 0000002E | RAM | | 00000005 |
| CPR | | 00000024 | S60 | | 0000390F |
| CR | | 0000000D | SPACE | | 00000020 |
| DIBENT$ | | 00000026 | STY | | 00000002 |

```
DISPCH    XDEF  9  00000020    TCR            00000020
DISPLY    XDEF  9  00000000    TIVR           00000022
DISPTR          5  00000000    TSR            00000034
DSPTENT$           00000010    Z_L1.000    9  0000000C
DSPSKP          9  00000078    Z_L1.003    9  0000003C
DSPXIT          9  0000007A    Z_L1.006    9  00000058
EEPROM             00000007    Z_L1.009    9  00000064
EOT                00000004    Z_L2.001    9  00000018
ETX                00000003    Z_L2.005    9  00000078
F$ASMPL         ,  00004000    Z_L2.008    9  00000064
```

```
                     DNLOAD  IDNT    0,8              DOWN LOAD SELECTED TABLE   3/02/83
                             OPT     FCS,BRS
                     *
                     *
                     * SUBROUTINE:  DNLOAD
                     *
                     * STARTED:     3/02/83
                     *
                     * AUTHOR:      D. A. ZEICHNER
                     *
                     * PURPOSE:     LOAD NEW INPUT PERSONALITY TABLE, OUTPUT PERSONALITY
                     *              TABLE, DONUT SCALE FACTOR TABLE, OR ID. TABLE FROM THE
                     *              PROGRAMMING HOST.
                     *
                     * INPUTS:      NONE.
                     *
                     * OUTPUTS:     SELECTED TABLE IS UPDATED IF LOAD WENT OK. THE CARRY
                     *              IS SET IF ANY ERROR OCCURRED.
                     *              ALL REGISTERS ARE DESTROYED.
                     *
                     * LOCAL STACK SPACE USED: 4 BYTES
                     *
                     * EXTERNAL REFERENCES/DEFINITIONS:
                     *
                             XDEF    DNLOAD
                     *
                     * HARDWARE REFERENCE:
                     *
                             XREF    ADCTRL
                     *
                     * RAM REFERENCES:
                     *
                             XREF.S  5:RCVBUF
                             XREF.S  5:T_ANALOG
                             XREF.S  5:T_DIAG
                             XREF.S  5:T_DONUT
                             XREF.S  5:T_KB
                             XREF.S  5:T_OUTPUT
                             XREF.S  5:T_PROCES
                             XREF.S  5:T_XMON
                     *
                     * EPROM (PROGRAM) REFERENCES:
                     *
                             XREF.S  9:EEPMOV
                             XREF.S  9:RCVCHR
                             XREF.S  9:TBLTBL
                     *
                     * LOCAL ASSIGNMENTS:
                     *
          00000000   BCOUNT  EQU     0                LOCAL STACK OFFSET TO BYTE COUNT
          00000002   TBLID   EQU     2                LOCAL STACK OFFSET TO TABLE ID
                     *
                     *
          00000009           SECTION PROM
                     *
9 00000000 4FEFFFFC  DNLOAD  LEA     -4(SP),SP        ALLOCATE LOCAL SCRATCH SPACE
```

```
9 00000004 41FAFFFA          LEA     RCVBUF(PC),A0
9 00000008 303C03FF          MOVE    #.RBFSIZ-1,D0          NUMBER OF BYTES -1
                    *
9 0000000C 50D8     SETLUP   ST.B    (A0)+                  SET BUFFER TO ALL ONES
9 0000000E 51C8FFFC          DBRA    D0,SETLUP
                    *
9 00000012 4EBAFFEC          JSR     RCVCHR(PC)             GET MSB OF BYTE COUNT
9 00000016 650000BE          BCS.L   DNERR                  TRANSMISSION QUIT - ERROR
                    *
9 0000001A 1E80              MOVE.B  D0,BCOUNT(SP)          SAVE MSB OF BYTE COUNT ON STACK
9 0000001C 4EBAFFE2          JSR     RCVCHR(PC)             GET LSB OF BYTE COUNT
9 00000020 650000B4          BCS.L   DNERR                  TRANSMISSION QUIT - ERROR
9 00000024 1F400001          MOVE.B  D0,BCOUNT+1(SP)        SAVE LSB OF BYTE COUNT
                    *
9 00000028 4247              CLR     D7                     INITIALIZE CRC
9 0000002A 4EBAFFD4          JSR     RCVCHR(PC)             GET TABLE ID
9 0000002E 0C000030          CMP.B   #'0',D0                VALID?
9 00000032 6D0000A2          BLT.L   DNERR                  NO - RETURN BAD
9 00000036 0C000033          CMP.B   #'3',D0
9 0000003A 6E00009A          BGT.L   DNERR
9 0000003E 1F400002          MOVE.B  D0,TBLID(SP)           OK - SAVE TABLE ID IN STACK
9 00000042 41FAFFBC          LEA     RCVBUF(PC),A0          GET POINTER TO RECEIVE BUFFER
9 00000046 3217              MOVE    BCOUNT(SP),D1          GET BYTE COUNT
9 00000048 5B41              SUBQ    #5,D1                  CALC # OF BYTES TO SAVE IN BUFFER (-1)
                    *
9 0000004A 0C410400          CMP.W   #.RBFSIZ,D1            # OF BYTES > BUFFER SIZE,(1K) ?
9 0000004E 6C000086          BGE.L   DNERR                  YES- BUFFER OVERFLOW, EXIT
                    *
                    * READ IN TABLE DATA & SAVE IN BUFFER
                    *
9 00000052          DNLUP    PUSH    D1/A0                  SAVE BYTE COUNT & BUFFER POINTER
9 00000056 4EBAFFA8          JSR     RCVCHR(PC)             WAIT FOR NEXT CHARACTER
9 0000005A                   PULL    D1/A0                  RESTORE BYTE COUNT & BUFFER POINTER
9 0000005E 6576              BCS     DNERR                  TRANSMITTER FAILED - ERROR
9 00000060 10C0              MOVE.B  D0,(A0)+               GOT CHARACTER - SAVE IN BUFFER
9 00000062 51C9FFEE          DBRA    D1,DNLUP
                    *
9 00000066 4EBAFF98          JSR     RCVCHR(PC)             GET MSB OF CRC
9 0000006A 656A              BCS     DNERR                  XMIT FAILED - EXIT BAD
9 0000006C 4EBAFF92          JSR     RCVCHR(PC)             GET LSB OF CRC
9 00000070 6564              BCS     DNERR                  XMIT FAILED - EXIT BAD
                    *
9 00000072 4A47              TST.W   D7                     CRC OK?
9 00000074 6660              BNE     DNERR                  NO - EXIT BAD
                    *
9 00000076 4EBAFF88          JSR     RCVCHR(PC)             WAIT FOR ETX
9 0000007A 655A              BCS     DNERR                  NEVER CAME - ERROR
9 0000007C 0C000003          CMP.B   #ETX,D0                DID WE GET AN ETX?
9 00000080 6654              BNE     DNERR                  NO - ERROR
                    *
                    * GOT TABLE INTO INPUT BUFFER OK, STOP ALL OTHER TASKS,
                    * AND UPDATE THE APPROPRIATE TABLE.
                    *
9 00000082 41FA0058          LEA     STABLE(PC),A0          PTR TO LIST OF TASKS TO STOP
                    *
9 00000086 2250     STLUP    MOVE.L  (A0),A1                GET TASK FRAME FROM LIST
9 00000088 4A98              TST.L   (A0)+                  CHECK FOR END & BUMP PTR.
9 0000008A 670A              BEQ     STEND                  NO MORE TO DO - QUIT
9 0000008C 4269000C          CLR     TK$STF(A1)             SUSPEND THIS GUY
9 00000090 4269000E          CLR     TK$STM(A1)             & MAKE SURE HE NEVER WAKES UP!
9 00000094 60F0              BRA     STLUP
                    *
9 00000096 41FAFF68 STEND    LEA     TBLTBL(PC),A0          PTR TO LIST OF TABLE SIZES & ADDRS.
9 0000009A 102F0002          MOVE.B  TBLID(SP),D0
9 0000009E 04400030          SUB     #$30,D0                CONVERT TO BINARY
9 000000A2 4880              EXT.W   D0                     SIGN EXTEND TO 16 BITS
```

```
9 000000A4 C0FC0006          MULU    #6,D0              CALCULATE OFFSET
9 000000A8 34300000          MOVE    (A0,D0),D2         GET TABLE SIZE (+4 FROM UPLOAD)
9 000000AC 22700002          MOVE.L  2(A0,D0),A1        GET DESTINATION TABLE ADDRESS
9 000000B0 5942              SUBQ    #4,D2              ADJUST TABLE SIZE FOR MOVE
9 000000B2 41FAFF4C          LEA     RCVBUF(PC),A0      PTR TO RECEIVE BUFFER
9 000000B6                   PUSH    A0-A1/D2           PRESERVE REGS. FOR MOVE VERF
9 000000BA 4EBAFF44          JSR     EEPMOV(PC)         MOVE TBLID'S TO EEPROM
9 000000BE                   PULL    A0-A1/D2           RESTORE REGS.
9 000000C2 5342              SUBQ    #1,D2              ADJUST BYTE COUNT FOR VERF LOOP
                     *
                     * VERIFY THAT MOVE WENT OK.
                     *
9 000000C4 B308      VRFLUP  CMP.B   (A0)+,(A1)+
9 000000C6 660E              BNE     DNERR              NO VERIFY - ERROR
9 000000C8 51CAFFFA          DBRA    D2,VRFLUP
                     *
                     * NO PROBLEMS - CLEAR CARRY AND RETURN OK
                     *
9 000000CC 023C00FE          AND     #$FE,CCR           CLEAR CARRY
                     *
9 000000D0 4FEF0004  DNXIT   LEA     4(SP),SP           CLEAN UP STACK
9 000000D4 4E75              RTS                        & RETURN TO CALLER
                     *
9 000000D6 003C0001  DNERR   OR      #1,CCR             SET CARRY
9 000000DA 60F4              BRA     DNXIT              & EXIT BAD
                     *
                     *
                     * LOCAL TABLES:
                     *
                     * STABLE - TABLE OF TASK FRAMES TO BE STOFFED.
                     *
9 000000DC 00000000  STABLE  DC.L    T_ANALOG
9 000000E0 00000000          DC.L    T_DIAG
9 000000E4 00000000          DC.L    T_CONNUT
9 000000E8 00000000          DC.L    T_KB
9 000000EC 00000000          DC.L    T_OUTPUT
9 000000F0 00000000          DC.L    T_PROCES
9 000000F4 00000000          DC.L    T_XMON
9 000000F8 00000000          DC.L    0                  END OF TABLE
                     *
                     *
                             END

****** TOTAL ERRORS      0--
****** TOTAL WARNINGS    0--

SYMBOL TABLE LISTING


SYMBOL NAME     SECT   VALUE       SYMBOL NAME     SECT   VALUE


.1SEC                  0000000A    F$KYBD                 00000100
.AIQSIZ                00000038    F$MON                  00000080
.AOQSIZ                00000038    F$OST                  00001000
.COSINE                00000014    F$PDI                  00000800
.DIQSIZ                0000001C    F$PROC                 00002000
.EFFECT                0000001C    F$XMIT                 00000200
.HIQSIZ                00000010    FF                     0000000C
.HOQSIZ                00000150    HT                     00000009
.ICOS                  0000000A    IPTENT$                00000014
.IEFF                  00000018    MAXAGE                 00000004
.ISCALE                00000006    NEXTSK                 00000030
.ISIN                  0000000E    ONESEC                 0003D090
.KWH                   00000024    ONETIK                 000009C4
.PIQSIZ                0000003F    OPTENT$                00000004
.RBFSIZ                00000400    PARK                   00000014
```

```
.SAMPLE                   00000002   PACR                    0000000C
.SCALE1                   00000004   PADDR                   00000004
.SCALE2                   00000008   PADR                    00000010
.SCALE3                   0000000C   PBAR                    00000016
.SCALE4                   00000010   PBCR                    0000000E
.SINE                     00000018   PBDDR                   00000006
.SPMJP      MACR   x                 PBDR                    00000012
.STEMP                    0000001C   PCDDR                   00000008
.TEMP                     00000012   PCDR                    00000018
.TOFSET                   0000000E   PGCR                    00000000
.TSCALE                   0000000A   PIVR                    0000000A
.VCOS                     00000002   PROM                    00000009
.VEFF                     00000014   PSR                     0000001A
.VSCALE                   00000002   PSRR                    00000002
.VSIN                     00000006   PULL       MACR   x
.WATTS                    00000020   PUSH       MACR   x
.WATTSEC                  00000022   RAM                     00000005
ADCTRL      XREF   x      00000000   RCVBUF     XREF   5     00000000
AIBENT$                   00000026   RCVCHR     XREF   9     00000000
BCOUNT                    00000000   RDYALL                  00000003
CHGENT                    00000034   READY                   00000004
CNTR                      0000002E   RELEAS                  0000002C
CPR                       00000024   RESERV                  00000028
CR                        0000000D   RESTRT                  0000003C
DEVINI                    00000014   S60                     0000390F
DI$DEV                    0000000A   SAV$                    0000002A
DI$EVF                    00000000   SETLUP            9     0000000C
DI$IOM                    0000001B   SPACE                   00000020
DI$ISV                    00000006   STABLE            9     0000005C
DI$LNK                    00000016   STEND             9     00000096
DI$OWN                    00000002   STLUP             9     00000086
DI$PTR                    00000012   STX                     00000002
DI$QUE                    0000000E   SUSPEN                  0000000C
DI$RSO                    0000001A   TBLID                   00000002
DI$SIZ                    00000020   TBLTBL     XREF   9     00000000
DI$STA                    0000001C   TCR                     00000020
DI$USR                    0000001E   TIVR                    00000022
DIBENT$                   00000026   TK$CON                  00000012
DNERR              9      000000D6   TK$ENT                  00000004
DNLOAD      XDEF   9      00000000   TK$ID                   00000000
DNLUP              9      00000052   TK$LPT                  0000001C
DNXIT              9      000000D0   TK$NXT                  0000001A
DSFTENT$                  00000010   TK$RSO                  0000001E
EEPMOV      XREF   9      00000000   TK$SIZ                  00000022
EEPROM                    00000007   TK$SSP                  00000008
EOT                       00000004   TK$STF                  0000000C
EQS         MACR   x                 TK$STM                  0000000E
ETX                       00000003   TK$TIM                  00000010
EX$DV0                    0000000A   TSKEND                  0000003E
EX$DV1                    0000000E   TSKINI                  00000010
EX$DV2                    00000012   TSR                     00000034
EX$DV3                    00000016   T_ANALOG   XREF   5     00000000
EX$DV4                    0000001A   T_DIAG     XREF   5     00000000
EX$DV5                    0000001E   T_DONUT    XREF   5     00000000
EX$DV6                    00000022   T_HB       XREF   5     00000000
EX$DV7                    00000026   T_OUTPUT   XREF   5     00000000
EX$NXT                    00000006   T_PROCES   XREF   5     00000000
EX$SIZ                    0000002A   T_XMON     XREF   5     00000000
EX$TIM                    00000000   VRFLUP            9     00000004
EX$TSK                    00000002   WAIT                    0000001C
EXEC                      00000000   WAITCN                  00000020
F$ASMPL                   00004000   WAITLP                  00000024
F$DNUT                    00000400   WAKEUP                  00000018
F$EEPM                    00000040   XSVC       MACR   x

156              DONUT    IDNT       0,4                            DONUT INPUT TASK  1/17/83
157                       OPT        PCS,BRS
```

```
                    *
                    *
                    * SUBROUTINE:   DONUT
                    *
                    * REVISED:      1/17/83
                    *
                    * AUTHOR:       D. A. ZEICHNER
                    *
                    * PURPOSE:      BACKGROUND DONUT DATA ACQUISITION TASK.
                    *
                    * INPUTS:       DONUT INPUT QUEUE (DNTIQ$)
                    *
                    * OUTPUTS:      UPDATED DONUT INPUT BUFFER
                    *
                    * NOTE: A6 CONTAINS POINTER TO LAST BUFFER UPDATED.
                    *
                    * EXTERNAL REFERENCES/DEFINITIONS:
                    *
                             XDEF     DONUT
                    *
                    * RAM REFERENCES:
                    *
                             XREF.S   5:DIB$
                             XREF.S   5:DNTIQ$
                             XREF.S   5:PRCIQ$
                    *
                    * EPROM (PROGRAM) REFERENCES:
                    *
                             XREF.S   9:DEQUE
                             XREF.S   9:ENQUE
                             XREF.S   9:FFPIFP
                    *
                    * LOCAL ASSIGNMENTS:
                    *
          0000000E  MSGSIZ   EQU      14                 * MESSAGE LENGTH INCLUDING CRC
          0000000E  FSTWD    EQU      14                   FIRST WORD INDICATOR BIT #
                    *
                    *
          00000009           SECTION  PROM
                    *
9         00000000  DONUT    EQU      *
                    *
9 00000000 43FAFFFE NEWBUF   LEA      DIB$(PC),A1         INIT BUFFER POINTER
                    *
9 00000004 41FAFFFA MORBUF   LEA      DNTIQ$(PC),A0
9 00000008 4EBAFFF6          JSR      DEQUE(PC)           GET NEXT WORD FROM QUEUE
9 0000000C 6406              BCC      OK                  GOT IT.
9 0000000E                   XSVC     EXEC                QUEUE EMPTY - LET SOMEONE ELSE RUN
9 00000012 60F0              BRA      MORBUF              TRY AGAIN
                    *
9 00000014 0800000E OK       BTST     #FSTWD,D0           1ST WORD FLAG SET?
                    *
                             IF       <NE> THEN           THIS IS FIRST WORD
9 0000001A 43FAFFE4            LEA     DIB$(PC),A1        RESET BUFFER POINTER
9 0000001E 0880000E            BCLR    #FSTWD,D0          CLEAR 1ST WORD BIT
                             ELSE                         THIS IS NOT 1ST WORD
9 00000024          Z_L1.000
9 00000024 487AFFDA            PEA     DIB$(PC)
9 00000028 B3DF                CMP.L   (A7)+,A1           AT START OF BUFFER?
9 0000002A 67D4                BEQ     NEWBUF             SHOULDN'T BE - LOOK FOR NEW 1ST WORD
                             ENDI
9 0000002C          Z_L2.002
                    *
9 0000002C 3280              MOVE     D0,(A1)             SAVE WORD IN BUFFER
9 0000002E 02590FFF          AND      #$FFF,(A1)+         MASK TO 12 BITS & BUMP POINTER
                    *
9 00000032 487AFFDA          PEA      DIB$+MSGSIZ
```

```
9 00000036 B3DF            CMP.L   (A7)+,A1          MESSAGE DONE?
9 00000038 6DCA            BLT     MOREBUF           NO - KEEP GOING
                   *
9 0000003A 4A40            TST     D0                CRC OK?
9 0000003C 6BC2            BMI     NEWBUF            NO - START OVER
                   *
                   * GET DONUT ID FROM HEADER WORD, LOCATE BUFFER, AND
                   * SEE IF IT IS READY FOR MORE INPUT. IF NOT, START OVER.
                   *
9 0000003E 41FAFFC0        LEA     DIB$(PC),A0       GET PTR TO RECEIVE BUFFER
9 00000042 3010            MOVE    (A0),D0           GET HEADER
9 00000044 0240000F        AND     #$F,D0            ISOLATE DONUT ID
9 00000048 67B6            BEQ     NEWBUF            DON'T ACCEPT DELIVERY OF DONUT #0.
9 0000004A C0FC0026        MULU    #DIBENT$,D0       CALCULATE OFFSET TO PROPER INPUT BUFFER
9 0000004E 08F000070000    BSET    #7,(A0,D0)        TEST & SET DI FLAG.
9 00000054 66AA            BNE     NEWBUF            WAS ALREADY SET - START OVER
9 00000056 02709FF00000    AND     #$9FF0,(A0,D0)    CLEAR AC, VP FLAGS, & BUFFER AGE
                   *
                   * MOVE RECEIVED DATA TO INPUT BUFFER. (SCRAP THE 1ST WORD)
                   *
9 0000005C 4DF00000        LEA     (A0,D0),A6        SAVE ADDRESS OF BUFFER FOR LATER
9 00000060 41F00002        LEA     2(A0,D0),A0       SET A0 PAST HEADER WORD OF BUFFER
9 00000064 43FAFF9C        LEA     DIB$+2(PC),A1     SET A1 PAST HEADER WORD RECEIVED
9 00000068 303C0005        MOVE    #(MSGSIZ-4)/2,D0  # OF WORDS TO MOVE -2 (DON'T MOVE LAST)
                   *
9 0000006C 3E19    MOVLUP  MOVE    (A1)+,D7          GET WORD
9 0000006E 04470800        SUB     #$800,D7          CONVERT TO BINARY
9 00000072 48C7            EXT.L   D7                SIGN EXTEND TO 32 BITS
9 00000074 4EBAFF8A        JSR     FFFIFP(PC)        CONVERT TO FLOATING POINT
9 00000078 20C7            MOVE.L  D7,(A0)+          & MOVE TO DONUT INPUT BUFFER
9 0000007A 51C8FFF0        DBRA    D0,MOVLUP
                   *
9 0000007E 3091            MOVE    (A1),(A0)         MOVE LAST WORD (TEMP) WITHOUT CONVERSION
                   *
9 00000080 300E    QUELUP  MOVE    A6,D0
9 00000082 41FAFF7C        LEA     PRCIQ$(PC),A0
9 00000086 4EBAFF78        JSR     ENQUE(PC)         PUT BUFFER ADR ON PROCESS INPUT QUEUE
9 0000008A 6400FF74        BCC.L   NEWBUF            QUEUE WENT OK - DO NEXT ONE
9 0000008E 303C2000        MOVE    #F$PROC,D0        FLAG TO WAIT FOR
9 00000092 4241            CLR     D1                NO TIME INVOLVED
9 00000094                 XSVC    SUSPEN
9 00000098 60E6            BRA     QUELUP            TRY AGAIN
                   *
                   *
                           END

****** TOTAL ERRORS      0--
****** TOTAL WARNINGS    0--
```

SYMBOL TABLE LISTING

| SYMBOL NAME | SECT | VALUE | SYMBOL NAME | SECT | VALUE |
|---|---|---|---|---|---|
| .ISEC | | 0000000A | F$DNUT | | 00000400 |
| .AIQSIZ | | 00000038 | F$KYBD | | 00000100 |
| .AOQSIZ | | 00000032 | F$MON | | 00000080 |
| .COSINE | | 00000014 | F$OST | | 00001000 |
| .DIQSIZ | | 0000001C | F$PDI | | 00000800 |
| .EFFECT | | 0000001C | F$PROC | | 00002000 |
| .HIQSIZ | | 00000010 | F$XMIT | | 00000200 |
| .HOQSIZ | | 00000180 | FF | | 0000000C |
| .ICOS | | 0000000A | FFFIFP | XREF 9 | 00000000 |
| .IEFF | | 00000018 | FSTWO | | 0000000E |
| .ISCALE | | 00000006 | HT | | 00000009 |
| .ISIN | | 0000000E | IPTENT$ | | 00000014 |

| | | | | | | | |
|---|---|---|---|---|---|---|---|
| .KWH | | | 00000024 | MAXAGE | | | 00000004 |
| .PIQSIZ | | | 0000003F | MOREBUF | | 9 | 00000004 |
| .RBFSIZ | | | 00000400 | MOVLUP | | 9 | 0000006C |
| .SAMPLE | | | 00000002 | MSGSIZ | | | 0000000E |
| .SCALE1 | | | 00000004 | NEWBUF | | 9 | 00000000 |
| .SCALE2 | | | 00000008 | NEXTSK | | | 00000030 |
| .SCALE3 | | | 0000000C | OK | | 9 | 00000014 |
| .SCALE4 | | | 00000010 | ONESEC | | | 0003D090 |
| .SINE | | | 00000018 | ONETIK | | | 000009C4 |
| .SPNJP | MACR | x | | OPTENT$ | | | 00000004 |
| .STEMP | | | 0000001C | PAAR | | | 00000014 |
| .TEMP | | | 00000012 | PACR | | | 0000000C |
| .TOFSET | | | 0000000E | PADDR | | | 00000004 |
| .TSCALE | | | 0000000A | PADR | | | 00000010 |
| .VCOS | | | 00000002 | PBAR | | | 00000016 |
| .VEFF | | | 00000014 | PBCR | | | 0000000E |
| .VSCALE | | | 00000002 | PBDDR | | | 00000006 |
| .VSIN | | | 00000006 | PBDR | | | 00000012 |
| .WATTS | | | 00000020 | PCDDR | | | 00000008 |
| .WATTSEC | | | 00000022 | PCDR | | | 00000018 |
| AIRENT$ | | | 00000026 | PGCR | | | 00000000 |
| CHGENT | | | 00000034 | PIVR | | | 0000000A |
| CNTR | | | 0000002E | PRCIQ$ | XREF | 5 | 00000000 |
| CPR | | | 00000024 | PROM | | | 00000009 |
| CR | | | 0000000D | PSR | | | 0000001A |
| DEQUE | XREF | 9 | 00000000 | PSRR | | | 00000002 |
| DEVINI | | | 00000014 | PULL | MACR | x | |
| DI$DEV | | | 0000000A | PUSH | MACR | x | |
| DI$EVF | | | 00000000 | QUELUP | | 9 | 00000080 |
| DI$IOM | | | 0000001B | RAM | | | 00000005 |
| DI$ISV | | | 00000006 | RDYALL | | | 00000008 |
| DI$LNK | | | 00000016 | READY | | | 00000004 |
| DI$OWN | | | 00000002 | RELEAS | | | 0000002C |
| DI$PTR | | | 00000012 | RESERV | | | 00000028 |
| DI$QUE | | | 0000000E | RESTRT | | | 0000003C |
| DI$RSO | | | 0000001A | S60 | | | 0000390F |
| DI$SIZ | | | 00000020 | SAV$ | | | 0000002A |
| DI$STA | | | 0000001C | SPACE | | | 00000020 |
| DI$USR | | | 0000001E | STX | | | 00000002 |
| DIB$ | XREF | 5 | 00000000 | SUSPEN | | | 0000000C |
| DIBENT$ | | | 00000026 | TCR | | | 00000020 |
| DNTIQ$ | XREF | 5 | 00000000 | TIVR | | | 00000022 |
| DONUT | XDEF | 9 | 00000000 | TK$CON | | | 00000012 |
| DSFTENT$ | | | 00000010 | TK$ENT | | | 00000004 |
| EEPROM | | | 00000007 | TK$ID | | | 00000000 |
| ENQUE | XREF | 9 | 00000000 | TK$LPT | | | 00000016 |
| EOT | | | 00000004 | TK$NXT | | | 0000001A |
| EQS | MACR | x | | TK$RSO | | | 0000001E |
| ETX | | | 00000003 | TK$SIZ | | | 00000022 |
| EX$DV0 | | | 0000000A | TK$SSP | | | 00000008 |
| EX$DV1 | | | 0000000E | TK$STF | | | 0000000C |
| EX$DV2 | | | 00000012 | TK$STM | | | 0000000E |
| EX$DV3 | | | 00000016 | TK$TIM | | | 00000010 |
| EX$DV4 | | | 0000001A | TSKEND | | | 00000038 |
| EX$DV5 | | | 0000001E | TSKINI | | | 00000010 |
| EX$DV6 | | | 00000022 | TSR | | | 00000034 |
| EX$DV7 | | | 00000026 | WAIT | | | 0000001C |
| EX$NXT | | | 00000006 | WAITCN | | | 00000020 |
| EX$SIZ | | | 0000002A | WAITLP | | | 00000024 |
| EX$TIM | | | 00000000 | WAKEUP | | | 00000018 |
| EX$TSK | | | 00000002 | XSVC | MACR | x | |
| EXEC | | | 00000000 | Z_L1.000 | | 9 | 00000024 |
| F$ASMFL | | | 00004000 | Z_L2.002 | | 9 | 0000002C |

```
165                 EEPMOV   IDNT   0,1          EEPROM BLOCK MOVE    3/18/83
167                          OPT    PCS,BRS
168                 *
```

```
                  *
                  * SUBROUTINE:    EEPMOV
                  *
                  * REVISED:       3.19/85
                  *
                  * AUTHOR:        T. WEBER
                  *
                  * PURPOSE:       MOVE A BLOCK OF DATA TO EEPROM  (on the Communications board).
                  *
                  * INPUTS:        A0 - SOURCE ADDRESS OF MEMORY BLOCK
                  *                A1 - DESTINATION ADDRESS
                  *                D2 - # OF BYTES TO MOVE
                  *
                  * OUTPUTS:       ALL REGISTERED DESTROYED
                  *
                  * EXTERNAL REFERENCES/DEFINITIONS:
                  *
                          XDEF     EEPMOV
                          XDEF     LCKOUT
                  *
                  * HARDWARE REFERENCE:
                  *
                          XREF     DRCVR
                  *
                  * LOCAL ASSIGNMENTS:
                  *
                  REGS    REG      A0-A1/D2
                  *
         00000005         SECTION  RAM
5 00000000 00000002 LCKOUT DS.W    1
                  *
                  *
         00000009         SECTION  PROM
                  *
9        00000000 EEPMOV  EQU      *
                  *
9 00000000 08F900000000 SETLOC BSET #0,LCKOUT         SET LOCK OUT
         0000
9 00000008 6714           BEQ      BGIN
                  *
9 0000000A                PUSH     REGS
9 0000000E 303C0040       MOVE     #F$EEPM,D0         WAIT ON FLAGS TO SUSPEN
9 00000012 4241           CLR      D1                 NO TIME OUT
9 00000014                XSVC     SUSPEN             WAIT FOR MOVE TO FINISH
9 00000018                PULL     REGS
9 0000001C 60E2           BRA      SETLOC             TRY TO GAIN ACCESS AGAIN
                  *
9 0000001E 08F900040000 BGIN BSET.B #4,PADR+DRCVR     ENABLE EEPROM
         0010
9 00000026 5342           SUBQ     #1,D2              ADJUST BYTE COUNT FOR LOOP
                  *
9 00000028 12D8   BMVLUP  MOVE.B   (A0)+,(A1)+        MOVE A BYTE
9 0000002A                PUSH     REGS               SAVE POINTERS AFTER MOVE
9 0000002E 4240           CLR      D0                 CLEAR FLAGS
9 00000030 7202           MOVEQ    #2,D1              WAIT 2 TICKS BETWEEN MOVES
9 00000032                XSVC     SUSPEN
9 00000036                PULL     REGS               RESTORE POINTERS
9 0000003A 51CAFFEC       DBRA     D2,BMVLUP          ANY MORE BYTES TO MOVE?
                  *
9 0000003E 08B900000000 EXIT BCLR  #0,LCKOUT          MAKE AVAILABLE TO OTHER TASKS
         0000
9 00000046 08B900040000   BCLR.B   #4,PADR+DRCVR      WRITE PROTECT EEPROM
         0010
9 0000004E 303C0040       MOVE     #F$EEPM,D0         SET WAIT ON FLAGS
9 00000052                XSVC     RDYALL             WAKEUP EVERYONE WAITING TO GET IN HERE
9 00000056 4E75           RTS
```

```
                 *
                 *
                 *
                        END

****** TOTAL ERRORS      0--
****** TOTAL WARNINGS    0--
```

SYMBOL TABLE LISTING

| SYMBOL NAME | | SECT | VALUE | SYMBOL NAME | | SECT | VALUE |
|---|---|---|---|---|---|---|---|
| .1SEC | | | 0000000A | EXEC | | | 00000000 |
| .AIQSIZ | | | 00000038 | EXIT | | 9 | 0000003E |
| .AOQSIZ | | | 00000038 | F$ASMPL | | | 00004000 |
| .COSINE | | | 00000014 | F$DNUT | | | 00000400 |
| .DIQSIZ | | | 0000001C | F$EEPM | | | 00000040 |
| .EFFECT | | | 0000001C | F$KYBD | | | 00000100 |
| .HIQSIZ | | | 000000C8 | F$MON | | | 00000080 |
| .HOQSIZ | | | 00000180 | F$OST | | | 00001000 |
| .ICOS | | | 0000000A | F$PDI | | | 00000800 |
| .IEFF | | | 00000018 | F$PROC | | | 00002000 |
| .ISCALE | | | 00000006 | F$XMIT | | | 00000200 |
| .ISIN | | | 0000000E | FF | | | 0000000C |
| .KWH | | | 00000024 | HT | | | 00000009 |
| .FIQSIZ | | | 0000003F | IPTENT$ | | | 00000014 |
| .RBFSIZ | | | 00000400 | LCKOUT | XDEF | 5 | 00000000 |
| .SAMPLE | | | 00000002 | MAXAGE | | | 00000004 |
| .SCALE1 | | | 00000004 | NEXTSK | | | 00000030 |
| .SCALE2 | | | 00000008 | ONESEC | | | 0003D090 |
| .SCALE3 | | | 0000000C | ONETIK | | | 000009C4 |
| .SCALE4 | | | 00000010 | OPTENT$ | | | 00000004 |
| .SINE | | | 00000018 | PAAR | | | 00000014 |
| .SPNJP | MACR | * | | PACR | | | 0000000C |
| .STEMP | | | 0000001C | PADDR | | | 00000004 |
| .TEMP | | | 00000012 | PADR | | | 00000010 |
| .TOFSET | | | 0000000E | PBAR | | | 00000016 |
| .TSCALE | | | 0000000A | PBCR | | | 0000000E |
| .VCOS | | | 00000002 | PBDDR | | | 00000006 |
| .VEFF | | | 00000014 | PBDR | | | 00000012 |
| .VSCALE | | | 00000002 | PCDDR | | | 00000008 |
| .VSIN | | | 00000006 | PCDR | | | 00000018 |
| .WATTS | | | 00000020 | PGCR | | | 00000000 |
| .WATTSEC | | | 00000022 | PIVR | | | 0000000A |
| AIBENT$ | | | 00000026 | PROM | | | 00000009 |
| BGIN | | 9 | 0000001E | PSR | | | 0000001A |
| BMVLUP | | 9 | 00000028 | PSRR | | | 00000002 |
| CHGENT | | | 00000034 | PULL | MACR | * | |
| CNTR | | | 0000002E | PUSH | MACR | * | |
| CPR | | | 00000024 | RAM | | | 00000005 |
| CR | | | 0000000D | RDYALL | | | 00000008 |
| CTRL13 | | | 00000000 | READY | | | 00000004 |
| CTRL2 | | | 00000002 | REGS | REG | * | |
| DEVINI | | | 00000014 | RELEAS | | | 0000002C |
| DI$DEV | | | 0000000A | RESERV | | | 00000028 |
| DI$EVF | | | 00000000 | RESTRT | | | 0000003C |
| DI$IOM | | | 0000001B | S60 | | | 000039DF |
| DI$ISV | | | 00000006 | SAV$ | | | 0000002A |
| DI$LNK | | | 00000016 | SETLOC | | 9 | 00000000 |
| DI$OWN | | | 00000002 | SPACE | | | 00000020 |
| DI$PTR | | | 00000012 | STX | | | 00000002 |
| DI$QUE | | | 0000000E | SUSPEN | | | 0000000C |
| DI$RSG | | | 0000001A | TCR | | | 00000020 |
| DI$SIZ | | | 00000020 | TIMR1 | | | 00000004 |

```
DI$STA                  0000001C   TIMR2               00000008
DI$USR                  0000001E   TIMR3               0000000C
DIBENT$                 00000026   TIVR                00000022
DRCVR      XREF   x     00000000   TK$CON              00000012
DSFTENT$                00000010   TK$ENT              00000004
EEPMOV     XDEF   9     00000000   TK$ID               00000000
EEPROM                  00000007   TK$LPT              00000016
EOT                     00000004   TK$NXT              0000001A
EOS        MACR   x                TK$RSO              0000001E
ETX                     00000003   TK$SIZ              00000022
EX$DV0                  0000000A   TK$SSP              00000008
EX$DV1                  0000000E   TK$STF              0000000C
EX$DV2                  00000012   TK$STM              0000000E
EX$DV3                  00000016   TK$TIM              00000010
EX$DV4                  0000001A   TSKEND              00000038
EX$DV5                  0000001E   TSKINI              00000010
EX$DV6                  00000022   TSR                 00000034
EX$DV7                  00000026   WAIT                0000001C
EX$NXT                  00000006   WAITCN              00000020
EX$SIZ                  0000002A   WAITLF              00000024
EX$TIM                  00000000   WAKEUP              00000018
EX$TSK                  00000002   XSVC       MACR  x
```

```
EFFVAL   IDNT    0,11                    CALCULATE EFFECTIVE VALUES   3/30/83
         OPT     PCS,BRS
*
* SUBROUTINE:    EFFVAL
*
* REVISED:       3/30/83
*                Revised due to the conversation with Dick S., at 5:40 pm.
*                In which everything less than 512 will still be scaled.
*                Previously, this condition fell thru to a NOSCALE routine.
*                Floating point constants have also been changed .
*
* AUTHOR:        D. A. ZEICHNER
*
* PURPOSE:       GIVEN AN INPUT BUFFER CALCULATE ALL APPROPRIATE EFFECTIVE
*                VALUES, AND STORE IN THE BUFFER.  ALSO, SCALE THE VALUES IF
*                APPROPRIATE.
*
* INPUTS:        A0 - POINTER TO INPUT BUFFER TO PROCESS
*
* OUTPUTS:       PROCESSED BUFFER, ALL REGISTERS PRESERVED.
*
* EXTERNAL REFERENCES/DEFINITIONS:
*
         XDEF    EFFVAL
*
* RAM REFERENCES:
*
         XREF.S  5:IST$
*
* EEPROM REFERENCES:
*
         XREF    DSFT$
         XREF    IPT$
*
* EPROM (PROGRAM) REFERENCES:
*
         XREF.S  9:FFPADD
         XREF.S  9:FFPCMP
         XREF.S  9:FFPIFP
         XREF.S  9:FFPMUL
         XREF.S  9:FFPSQRT
         XREF.S  9:FFPSUB
*
```

```
                        * FLOATING POINT CONSTANTS:
                        *
                        *K512     EQU     $8000004A          512 (START OF 1ST CURRENT SCALE RANGE)
                        *
           8000004A     K$200     EQU     $8000004A          200 (START OF 2ND CURRENT SCALE RANGE)
           8000004B     K$400     EQU     $8000004B          400 (START OF 3RD CURRENT SCALE RANGE)
           C000004B     K$600     EQU     $C000004B          600 (START OF LAST CURRENT SCALE RANGE)
                        *
                        *
           00000009               SECTION  FROM
                        *
 9 00000000             EFFVAL    PUSH    D0-D1/D3-D7/A0-A1  SAVE INCOMING REGISTERS
                        *
 9 00000004 1010                  MOVE.B  (A0),D0            GET INPUT TYPE
 9 00000006 E608                  LSR.B   #3,D0              ISOLATE INPUT TYPE
 9 00000008 02000003              AND.B   #3,D0
 9 0000000C 0C000003              CMP.B   #3,D0
 9 00000010 670000D0              BEQ.L   DBUF               TYPE IS 3 - WE HAVE A DIGITAL INPUT BUFFER
                        *
                        * BUFFER IS ANALOG - IF WE HAVE A TEMPERATURE,
                        * CONVERT 1ST ENTRY TO FLOATING POINT & SAVE
                        * IN BUFFER.
                        *
 9 00000014 0C000002              CMP.B   #2,D0
 9 00000018 6616                  BNE     VOLTS              NOT TEMP - CHECK FOR VOLTAGE OR CURRENT
                        *
                        * TYPE IS TEMPERATURE - CONVERT.
                        *
 9 0000001A 3E280002              MOVE    .SAMPLE(A0),D7     GET RAW SAMPLE
 9 0000001E 04470800              SUB     #$800,D7           CONVERT TO 2'S COMPLEMENT
 9 00000022 48C7                  EXT.L   D7                 SIGN EXTEND TO 32 BITS
 9 00000024 4EBAFFDA              JSR     FFPIFP(PC)         CONVERT TO FLOATING POINT (D5 DESTROYED)
 9 00000028 2147001C              MOVE.L  D7,.EFFECT(A0)     AND STORE IN BUFFER
 9 0000002C 6000011C              BRA.L   EFFXIT
                        *
 9 00000030 3210        VOLTS     MOVE    (A0),D1            CALC. PTR TO IPT ENTRY
 9 00000032 EA49                  LSR     #5,D1
 9 00000034 0241003F              AND     #$3F,D1            ISOLATE INPUT NUMBER
 9 00000038 C2FC0014              MULU    #IPTENT$,D1        CALCULATE OFFSET
 9 0000003C 43F900000000          LEA     IPT$,A1            POINT TO IPT
                        *
                                  IF.B    D0 <EQ> #0 THEN    BUFFER IS VOLTAGE INPUT
                        *
 9 00000046 2C311004                MOVE.L  .SCALE1(A1,D1),D6  GET SCALE FACTOR
 9 0000004C 2E280014                MOVE.L  .COSINE(A0),D7   GET COSINE COMPONENT,
 9 00000050 4EBAFFAE                JSR     FFPMUL(PC)       SCALE IT,
 9 00000054 21470014                MOVE.L  D7,.COSINE(A0)   SAVE IN BUFFER
 9 00000058 2007                    MOVE.L  D7,D0            & IN D0
                        *
 9 0000005A 2E280018                MOVE.L  .SINE(A0),D7     GET SINE COMPONENT,
 9 0000005E 4EBAFFA0                JSR     FFPMUL(PC)       SCALE IT,
 9 00000062 21470018                MOVE.L  D7,.SINE(A0)     & SAVE IN BUFFER.
                        *
 9 00000066 610000E8                BSR.L   HYPOT            CALC THE SQRT OF SUM OF SQUARES
 9 0000006A 2147001C                MOVE.L  D7,.EFFECT(A0)   & SAVE IN BUFFER
                        *
                        .         ELSE                       BUFFER TYPE IS CURRENT
 9 00000070             Z_L1.000
                        *
 9 00000070 20280014                MOVE.L  .COSINE(A0),D0   GET COSINE COMPONENT,
 9 00000074 2E280018                MOVE.L  .SINE(A0),D7     SINE COMPONENT,
 9 00000078 610000D6                BSR.L   HYPOT            CALC. SQRT. OF SUM OF SQUARES,
 9 0000007C 2147001C                MOVE.L  D7,.EFFECT(A0)   & SAVE IN BUFFER
                        *
                        * GET THE SCALING FACTOR BASED ON THE VALUE
                        * OF D7. IF D7 < 512, THEN DON'T SCALE AT ALL.  ** NOT TRUE ANYMORE ! **
```

```
274                             *
275                             *          MOVE.L #K512,D6
276                             *          JSR    FFFCMP(PC)
277                             *          BMI    NOSCALE
278                             *
279 9 00000080 2C3C8000004A               MOVE.L  #K$200,D6
280 9 00000086 4EBAFF78                   JSR     FFFCMP(PC)
281 9 0000008A 6B2A                       BMI     SCALE1
282                             *
283 9 0000008C 2C3C8000004B               MOVE.L  #K$400,D6
284 9 00000092 4EBAFF6C                   JSR     FFFCMP(PC)
285 9 00000096 6B18                       BMI     SCALE2
286                             *
287 9 00000098 2C3CC000004B               MOVE.L  #K$600,D6
288 9 0000009E 4EBAFF60                   JSR     FFFCMP(PC)
289 9 000000A2 6B06                       BMI     SCALE3
290                             *
291 9 000000A4 20311010         SCALE4    MOVE.L  .SCALE4(A1,D1),D0
292 9 000000A8 6010                       BRA     EFF0
293                             *
294 9 000000AA 2031100C         SCALE3    MOVE.L  .SCALE3(A1,D1),D0
295 9 000000AE 600A                       BRA     EFF0
296                             *
297 9 000000B0 20311008         SCALE2    MOVE.L  .SCALE2(A1,D1),D0
298 9 000000B4 6004                       BRA     EFF0
299                             *
300 9 000000B6 20311004         SCALE1    MOVE.L  .SCALE1(A1,D1),D0
301                             *
302 9 000000BA 2C00             EFF0      MOVE.L  D0,D6                GET SCALE FACTOR (EFF VALUE ALREADY IN D7)
303 9 000000BC 4EBAFF42                   JSR     FFFMUL(PC)           SCALE EFFECTIVE VALUE
304 9 000000C0 2147001C                   MOVE.L  D7,.EFFECT(A0)       & STORE IN BUFFER
305                             *
306 9 000000C4 2E00                       MOVE.L  D0,D7                GET SCALE FACTOR
307 9 000000C6 2C280014                   MOVE.L  .COSINE(A0),D6
308 9 000000CA 4EBAFF34                   JSR     FFFMUL(PC)           SCALE COSINE COMPONENT
309 9 000000CE 21470014                   MOVE.L  D7,.COSINE(A0)
310                             *
311 9 000000D2 2E00                       MOVE.L  D0,D7                GET SCALE FACTOR
312 9 000000D4 2C280018                   MOVE.L  .SINE(A0),D6
313 9 000000D8 4EBAFF26                   JSR     FFFMUL(PC)           SCALE SINE COMPONENT
314 9 000000DC 21470018                   MOVE.L  D7,.SINE(A0)
315                             *
316                             NOSCALE  ENDI
    9 000000E0                  Z_L2.002
317 9 000000E0 6068                       BRA     EFFXIT               DONE!
318                             *
320                             *
321                             * INPUT WAS A DONUT BUFFER
322                             *
323 9 000000E2 3010             DBUF      MOVE    (A0),D0              GET DONUT NUMBER
324 9 000000E4 EE48                       LSR     #7,D0
325 9 000000E6 0240000F                   AND     #$F,D0               & ISOLATE INPUT NUMBER
326                             *
327 9 000000EA C0FC0010                   MULU    #DSFTENT$,D0         CALC OFFSET TO DSFT ENTRY 4 THIS DONUT
328 9 000000EE 227C00000000               MOVE.L  #DSFT$,A1
329 9 000000F4 43F10002                   LEA     2(A1,D0),A1          SET POINTER TO 1ST SCALE FACTOR
330                             *
331                             * SCALE VOLTAGE & CURRENT COMPONENTS:
332                             *
333                                       FOR     D1 = #0 TO #4 BY #4 DO
    9 000000FE                  Z_L1.004
334                             *
335 9 000000FE 2C19                       MOVE.L  (A1)+,D6             GET SCALING FACTOR
336 9 00000100 2E301002                   MOVE.L  .VCOS(A0,D1),D7      GET COSINE COMPONENT OF V (OR I)
337 9 00000104 4EBAFEFA                   JSR     FFFMUL(PC)           SCALE IT
338 9 00000108 21871002                   MOVE.L  D7,.VCOS(A0,D1)      PUT BACK INTO THE BUFFER
```

```
9 0000010C 2007                    MOVE.L  D7,D0              & SAVE IN D0.
                         *
9 0000010E 2E301006                MOVE.L  .VSIN(A0,D1),D7    GET SINE COMPONENT OF V (OR I)
9 00000112 4EBAFEEC                JSR     FFPMUL(PC)
9 00000116 21871006                MOVE.L  D7,.VSIN(A0,D1)
9 0000011A 6134                    BSR     HYPOT              CALCULATE EFFECTIVE VALUE
9 0000011C 21871014                MOVE.L  D7,.VEFF(A0,D1)    & STORE IN BUFFER
                                 ENDF
                         *
                         * SCALE TEMPERATURE & ADD OFFSET:
                         *
9 00000128 3E280012              MOVE    .TEMP(A0),D7        GET RAW TEMP VALUE
9 0000012C 48C7                  EXT.L   D7
9 0000012E 4EBAFED0              JSR     FFPIFP(PC)          CONVERT TEMP TO FLOATING POINT
9 00000132 2C19                  MOVE.L  (A1)+,D6            GET TEMPERATURE SCALE FACTOR
9 00000134 4EBAFECA              JSR     FFPMUL(PC)          & SCALE TEMP
9 00000138 2C07                  MOVE.L  D7,D6               SAVE SCALED TEMP FOR A SECOND
9 0000013A 3E11                  MOVE    (A1),D7             GET OFFSET (INTEGER)
9 0000013C 48C7                  EXT.L   D7                  SIGN EXTEND TO 32 BITS
9 0000013E 4EBAFEC0              JSR     FFPIFP(PC)          CONVERT TO FLOATING POINT
9 00000142 4EBAFEBC              JSR     FFPADD(PC)          & ADD TO SCALED TEMPERATURE
9 00000146 2147001C              MOVE.L  D7,.STEMP(A0)       & STORE IN SCALED TEMP FIELD
                         *
                         * THIS WAY OUT!!!!
                         *
9 0000014A               EFFXIT  PULL    D0-D1/D3-D7/A0-A1   RESTORE INCOMING REGISTERS
9 0000014E 4E75                  RTS                         AND RETURN
                         *
                         *
                         * LOCAL SUBROUTINES:
                         *
                         * HYPOT - CALCULATE THE SQUARE ROOT OF THE SUM OF THE SQUARES. (HYPOTENUSE)
                         *
                         * CALCULATION PERFORMED: C = SQRT(A**2 + B**2)
                         *
                         * INPUTS: D0 - B IN EQN. SHOWN ABOVE.
                         *         D7 - A IN EQN. SHOWN ABOVE.
                         *
                         * OUTPUTS: D7 - RESULT
                         *          D0 - CONTAINS B**2
                         *          D3,D4,D5 DESTROYED
                         *
9 00000150 2C07          HYPOT   MOVE.L  D7,D6
9 00000152 4EBAFEAC              JSR     FFPMUL(PC)          SQUARE B
9 00000156 CF40                  EXG     D7,D0               & SAVE IN D0
9 00000158 2C07                  MOVE.L  D7,D6
9 0000015A 4EBAFEA4              JSR     FFPMUL(PC)          SQUARE A
9 0000015E 2C00                  MOVE.L  D0,D6
9 00000160 4EBAFE9E              JSR     FFPADD(PC)          ADD SQUARES OF A & B
9 00000164 4EBAFE9A              JSR     FFPSQRT(PC)         & TAKE SQUARE ROOT.
9 00000168 4E75                  RTS
                         *
                         *
                                 END

****** TOTAL ERRORS     0--
****** TOTAL WARNINGS   0--
SYMBOL TABLE LISTING
```

| SYMBOL NAME | SECT | VALUE | SYMBOL NAME | SECT | | VALUE |
|---|---|---|---|---|---|---|
| .ISEC | | 0000000A | FF | | | 0000000C |
| .AIOSIZ | | 00000038 | FFPADD | XREF | 9 | 00000000 |
| .AOOSIZ | | 00000038 | FFPCMP | XREF | 9 | 00000000 |

| | | | | | | | |
|---|---|---|---|---|---|---|---|
| .COSINE | | | 00000014 | FFPIFF | XREF | 9 | 00000000 |
| .DIQSIZ | | | 0000001C | FFPMUL | XREF | 9 | 00000000 |
| .EFFECT | | | 0000001C | FFPSQRT | XREF | 9 | 00000000 |
| .HIQSIZ | | | 000000C8 | FFPSUB | XREF | 9 | 00000000 |
| .HOQSIZ | | | 00000160 | HT | | | 00000009 |
| .ICOS | | | 0000000A | HYPOT | | 9 | 00000150 |
| .IEFF | | | 00000018 | IPT$ | XREF | x | 00000000 |
| .ISCALE | | | 00000006 | IPTENT$ | | | 00000014 |
| .ISIN | | | 0000000E | IST$ | XREF | 5 | 00000000 |
| .KWH | | | 00000024 | K$200 | | | 8000004A |
| .PIQSIZ | | | 0000003F | K$400 | | | 8000004B |
| .RBFSIZ | | | 00000400 | K$600 | | | C000004B |
| .SAMPLE | | | 00000002 | MAXAGE | | | 00000004 |
| .SCALE1 | | | 00000004 | NOSCALE | | 9 | 000000E0 |
| .SCALE2 | | | 00000008 | ONESEC | | | 0003D090 |
| .SCALE3 | | | 0000000C | ONETIK | | | 000009C4 |
| .SCALE4 | | | 00000010 | OPTENT$ | | | 00000004 |
| .SINE | | | 00000018 | PAAR | | | 00000014 |
| .STEMP | | | 0000001C | PACR | | | 0000000C |
| .TEMP | | | 00000012 | PADDR | | | 00000004 |
| .TOFSET | | | 0000000E | PADR | | | 00000010 |
| .TSCALE | | | 0000000A | PBAR | | | 00000016 |
| .VCOS | | | 00000002 | PBCR | | | 0000000E |
| .VEFF | | | 00000014 | PBDDR | | | 00000006 |
| .VSCALE | | | 00000002 | PBDR | | | 00000012 |
| .VSIN | | | 00000006 | PCDDR | | | 00000008 |
| .WATTS | | | 00000020 | PCDR | | | 00000018 |
| .WATTSEC | | | 00000022 | PGCR | | | 00000000 |
| AIBENT$ | | | 00000026 | PIVR | | | 0000000A |
| CNTR | | | 0000002E | PROM | | | 00000009 |
| CPR | | | 00000024 | PSR | | | 0000001A |
| CR | | | 0000000D | PSRR | | | 00000002 |
| CTRL13 | | | 00000000 | FULL | MACR | x | |
| CTRL2 | | | 00000002 | PUSH | MACR | x | |
| DBUF | | 9 | 000000E2 | RAM | | | 00000005 |
| DIBENT$ | | | 00000026 | S60 | | | 000039DF |
| DSFT$ | XREF | x | 00000000 | SCALE1 | | 9 | 000000B6 |
| DSFTENT$ | | | 00000010 | SCALE2 | | 9 | 000000B0 |
| EEPROM | | | 00000007 | SCALE3 | | 9 | 000000AA |
| EFF0 | | 9 | 000000BA | SCALE4 | | 9 | 000000A4 |
| EFFVAL | XDEF | 9 | 00000000 | SPACE | | | 00000020 |
| EFFXIT | | 9 | 0000014A | STX | | | 00000002 |
| EOT | | | 00000004 | TCR | | | 00000020 |
| ETX | | | 00000003 | TIMR1 | | | 00000004 |
| F$ASHPL | | | 00004000 | TIMR2 | | | 00000008 |
| F$DNUT | | | 00000400 | TIMR3 | | | 0000000C |
| F$EEPM | | | 00000040 | TIVR | | | 00000022 |
| F$KYBD | | | 00000100 | TSR | | | 00000034 |
| F$MON | | | 00000080 | VOLTS | | 9 | 00000030 |
| F$OST | | | 00001000 | Z_L1.000 | | 9 | 00000070 |
| F$PDI | | | 00000800 | Z_L1.004 | | 9 | 000000FE |
| F$PROC | | | 00002000 | Z_L2.002 | | 9 | 000000E0 |
| F$XMIT | | | 00000200 | Z_L2.003 | | 9 | 00000122 |

```
ENQUE    IDNT     0,4                  PUT DATA ON QUEUE     1/19/83
         OPT      PCS,BRS
*
* SUBROUTINE:     ENQUE
*
* REVISED:        1/19/83
*
* AUTHOR:         D. A. ZEICHNER
*
* PURPOSE:        PUT DATA ON QUEUE.
*
* INPUTS:         D0 - BYTE (WORD) TO BE QUEUED.
```

```
                          *             A0 - POINTER TO QUEUE HEADER BLOCK OF THE FORMAT:
                          *
                          *                 DS.W QUEUE HEAD POINTER
                          *                 DS.W QUEUE TAIL POINTER
                          *                 DS.W QUEUE END POINTER
                          *                 DS.W QUEUE STATUS BYTE
                          *                 DS.B QUEUE STORAGE AREA
                          *
                          * OUTPUTS:    CARRY SET IF QUEUE FULL.
                          *             Z FLAG SET (EQUAL) IF SUCCESSFUL.
                          *             ALL OTHER REGISTERS PRESERVED.
                          *
                          * EXTERNAL REFERENCES/DEFINITIONS:
                          *
                                  XDEF     ENQUE
                          *
                          * LOCAL ASSIGNMENTS:
                          *
            00000008      QDATA   EQU      8                     OFFSET TO QUEUE DATA AREA
            00000007      QSTAT   EQU      7                     OFFSET TO QUEUE STATUS BYTE
            00000004      QEND    EQU      4                     OFFSET TO END OF QUEUE POINTER
            00000002      QTAIL   EQU      2                     OFFSET TO QUEUE TAIL POINTER
            00000001      QSIZE   EQU      1                     QUEUE ELEMENT SIZE BIT
            00000000      QFULL   EQU      0                     QUEUE FULL BIT
            00000000      QHEAD   EQU      0                     OFFSET TO QUEUE HEAD POINTER
                          *
                          *
            00000009              SECTION  PROM
                          *
9 00000000                ENQUE   PUSH     A1                    SAVE A1
                          *
9 00000004 082800000007           BTST     #QFULL,QSTAT(A0)      IS QUEUE FULL?
9 0000000A 6636                   BNE      ENQFUL                YES - EXIT BAD
                          *
9 0000000C 3250                   MOVE     (A0),A1               GET HEAD POINTER
9 0000000E 082800010007           BTST     #QSIZE,QSTAT(A0)      TEST WORD FLAG
                          *
                          * IF THE WORD FLAG IS SET, THEN
                          * PUT A FULL WORD ON THE QUEUE.
                          *
                                  IF       <NE> THEN
9 00000016 32C0                     MOVE.W   D0,(A1)+
                                  ELSE
9 0000001A                Z_L1.000
9 0000001A 12C0                     MOVE.B   D0,(A1)+
                                  ENDI
9 0000001C                Z_L2.002
                          *
                          * IF WE HAVE REACHED THE END OF THE
                          * QUEUE, THEN ROLLOVER TO THE TOP
                          *
                                  IF       A1 <EQ> QEND(A0) THEN
9 00000022 43E80008                 LEA      QDATA(A0),A1        QUEUE STARTS 8 BYTES AFTER HEADER
                                  ENDI
9 00000026                Z_L1.003
                          *
                                  IF       A1 <EQ> QTAIL(A0) THEN IS QUEUE FULL NOW?
9 0000002C 08E800000007             BSET     #QFULL,QSTAT(A0)    YES - SET QUEUE FULL FLAG
                                  ENDI
9 00000032                Z_L1.006
                          *
9 00000032 3089                   MOVE     A1,QHEAD(A0)          RESTORE HEAD POINETER
                          *
9 00000034 023C00FC               AND      #$FC,CCR              CLEAR CARRY & OVERFLOW
9 00000038 003C0004               OR       #4,CCR                & SET ZERO FLAG
                          *
```

```
232 9 0000003C            ENQXIT   PULL    A1              RESTORE A1
233 9 00000040 4E75                RTS                     AND RETURN
234                       *
235 9 00000042 003C0001   ENQFUL   OR      #1,CCR          SET CARRY
236 9 00000046 60F4                BRA     ENQXIT          AND RETURN BAD
237                       *
238                       *
239                                END
```

xxxxxx TOTAL ERRORS 0--
xxxxxx TOTAL WARNINGS 0--

SYMBOL TABLE LISTING

| SYMBOL NAME | SECT | VALUE | SYMBOL NAME | SECT | VALUE |
|---|---|---|---|---|---|
| .1SEC | | 0000000A | F$OST | | 00001000 |
| .AIQSIZ | | 00000038 | F$PDI | | 00000800 |
| .AOQSIZ | | 00000038 | F$PROC | | 00002000 |
| .COSINE | | 00000014 | F$XMIT | | 00000200 |
| .DIQSIZ | | 0000001C | FF | | 0000000C |
| .EFFECT | | 0000001C | HT | | 00000009 |
| .HIQSIZ | | 00000010 | IPTENT$ | | 00000014 |
| .HOQSIZ | | 00000180 | MAXAGE | | 00000004 |
| .ICOS | | 0000000A | ONESEC | | 0003D090 |
| .IEFF | | 00000018 | ONETIK | | 000009C4 |
| .ISCALE | | 00000006 | OPTENT$ | | 00000004 |
| .ISIN | | 0000000E | PAAR | | 00000014 |
| .KWH | | 00000024 | PACR | | 0000000C |
| .PIQSIZ | | 0000003F | PADDR | | 00000004 |
| .RBFSIZ | | 00000400 | PADR | | 00000010 |
| .SAMPLE | | 00000002 | PBAR | | 00000016 |
| .SCALE1 | | 00000004 | PBCR | | 0000000E |
| .SCALE2 | | 00000008 | PBDDR | | 00000006 |
| .SCALE3 | | 0000000C | PBDR | | 00000012 |
| .SCALE4 | | 00000010 | PCDDR | | 00000008 |
| .SINE | | 00000018 | PCDR | | 00000018 |
| .STEMP | | 0000001C | PGCR | | 00000000 |
| .TEMP | | 00000012 | PIVR | | 0000000A |
| .TOFSET | | 0000000E | PROM | | 00000009 |
| .TSCALE | | 0000000A | PSR | | 0000001A |
| .VCOS | | 00000002 | PSRR | | 00000002 |
| .VEFF | | 00000014 | PULL | MACR * | |
| .VSCALE | | 00000002 | PUSH | MACR * | |
| .VSIN | | 00000006 | QDATA | | 00000008 |
| .WATTS | | 00000020 | QEND | | 00000004 |
| .WATTSEC | | 00000022 | QFULL | | 00000003 |
| AIBENT$ | | 00000026 | QHEAD | | 00000000 |
| CNTP | | 0000002E | QSIZE | | 00000001 |
| CPR | | 00000024 | QSTAT | | 00000007 |
| CR | | 0000000D | QTAIL | | 00000002 |
| DIBENT$ | | 00000026 | RAM | | 00000005 |
| DSFTENT$ | | 00000010 | S60 | | 000039DF |
| EEPROM | | 00000007 | SPACE | | 00000020 |
| ENQFUL | 9 | 00000042 | STX | | 00000002 |
| ENQUE | XDEF 9 | 00000000 | TCR | | 00000020 |
| ENQXIT | 9 | 0000003C | TIVR | | 00000022 |
| EOT | | 00000004 | TSR | | 00000034 |
| ETX | | 00000003 | Z_L1.000 | 9 | 0000001A |
| F$ASMPL | | 00004000 | Z_L1.003 | 9 | 00000026 |
| F$DNUT | | 00000400 | Z_L1.006 | 9 | 00000032 |
| F$KYBD | | 00000100 | Z_L2.002 | 9 | 0000001C |
| F$MON | | 00000080 | | | |

```
                          EXEC    IDNT     0,5              TASK MANAGER PACKAGE 3/15/83
                                  OPT      FCS,FRS
                          *
                          *
                          * TASKMASTER FOR THE 68000
                          *
           00000009               SECTION  9
                          *
                                  XDEF     EXECSW
                                  XDEF     XECINI
                                  XDEF     TIMINT
                          *
                          * HARDWARE REFERENCES:
                          *
                                  XREF     DRCVR
                                  XREF     WTCHDOG
                          *
                          * RAM REFERENCES:
                          *
                                  XREF.S   5:EX.RAM
                          *
                          * EPROM (PROGRAM) REFERENCES:
                          *
                                  XREF.S   9:WDFEED

                          *
                          * CONDITIONAL ASSEMBLY OPTIONS:
                          *
           00000000       IRPOPT  EQU      0                NO INTERRUPT SERVICE HANDLER
           00000000       DEVOPT  EQU      0                NO DEVICE HANDLING ROUTINES
                          *
                                  IFEQ     DEVOPT
                          *
                          * NO DEVICE HANDLING ROUTINES HAVE BEEN SELECTED. IF
                          * ANY OF THEM SHOULD BE CALLED, PERFORM A DYNAMIC HALT.
                          * (SUCH A BLOW UP MAKES IT EASIER TO LOCATE CALLING ERRORS
                          * DURING DEBUGGING.)
                          *
9          00000000       .DEVINI EQU      *
9          00000000       .RESERV EQU      *
9          00000000       .RELEAS EQU      *
9          00000000       .WAKEUP EQU      *
9          00000000       .WAIT   EQU      *
9          00000000       .WAITLP EQU      *
9          00000000       .WAITCN EQU      *
9 00000000 2C5F                   MOVE.L   (A7)+,A6         RESTORE A6 SO WE CAN SEE IT.
9 00000002 60FE                   BRA.S    *                DYNAMIC HALT!
                          *
                                  ENDC
                          *
                          * QUESTION TO ANSWER: HOW WILL WE LOCATE TASK MGR. RAM?
                          *
                          *       THE ANSWER TO THIS QUESTION AFFECTS HOW WE WRITE ROUTINES
                          *       THAT ACCESS LOCAL RAM. IE. SHOULD THE RAM BLOCK BE RELATIVE
                          *       TO THE REST OF THE TASK MGR. OR NOT? FOR NOW, WE'LL FOLLOW
                          *       THE 6809'S LEAD, AND PROVIDE A LOCATION WHOSE VALUE IS THE
                          *       START ADDRESS OF LOCAL RAM. (IE. TO BE BURNED INTO PROM BY
                          *       - THE EXEC INITIALLY SETS UP AND SAVES A6. TO BE REFERENCED
                          *         AS THE START OF EX$RAM -
                          *
9 00000004 00000000       EX$RAM  DC.L     EX.RAM           ;Burn start adr of local ram here.

                          *
                          * EXECSW - TRAP #15 HANDLER. CALLS THE APPROPRIATE ROUTINE AS DETERMINED
                          *          BY THE 2 BYTE ARGUMENT FOLLOWING THE TRAP INSTRUCTION. ALL
```

```
                         *         REGISTERS ARE INTACT (EXCEPT FOR CCR) GOING INTO THE SELECTED
                         *         ROUTINE. IT IS THE CALLED ROUTINE'S RESPONSIBILITY TO SAVE ANY
                         *         REGISTERS EXCEPT FOR A6, WHICH IS SAVED BY EXECSW. THE CALLED
                         *         ROUTINE MUST RESTORE A6 BEFORE RETURNING.
                         *
9 00000008 48E700E2      EXECSW   MOVEM.L  A0-A2/A6,-(A7)     save task ptr,user stack & exec ram ptr.
9 0000000C 206F0012               MOVE.L   18(SP),A0          get return address
9 00000010 3250                   MOVE     (A0),A1            get trap argument (offset to table entry)
9 00000012 54AF0012               ADDQ.L   #2,18(SP)          bump rtn adr past argument
9 00000016 41FA0012               LEA      SWTBL(PC),A0       get ptr. to jump table
9 0000001A 2C7AFFE8               MOVE.L   EX$RAM,A6          index ptr. A6 = start of exec ram
9 0000001E 2F7090000008           MOVE.L   (A0,A1),8(SP)      put subroutine adr on stack
9 00000024 4CDF0300               MOVEM.L  (A7)+,A0/A1        restore stack & rte from there
9 00000028 4E75                   RTS                         xfer control to desired routine
                         *
                         * SWTBL - SUBROUTINE VECTORS
                         *
9 0000002A 000000D6      SWTBL    DC.L     .EXEC
9 0000002E 0000014E               DC.L     .READY
9 00000032 00000120               DC.L     .RDYALL
9 00000036 000000C2               DC.L     .SUSPEN
9 0000003A 00000078               DC.L     .TSKINI
9 0000003E 00000000               DC.L     .DEVINI
9 00000042 00000000               DC.L     .WAKEUP
9 00000046 00000000               DC.L     .WAIT
9 0000004A 00000000               DC.L     .WAITCN
9 0000004E 00000000               DC.L     .WAITLP
9 00000052 00000000               DC.L     .RESERV
9 00000056 00000000               DC.L     .RELEAS
9 0000005A 00000192               DC.L     .NEXTSK
9 0000005E 00000160               DC.L     .CHGENT
9 00000062 0000016A               DC.L     .TSKEND
9 00000066 00000178               DC.L     .RESTRT
                         *
                         *
                         * XECINI - INITIALIZE TASK MANAGER RAM. CALL THIS ROUTINE (BY JSR!)
                         *          BEFORE ANY OTHER TASK MANAGER CALLS.
                         *
9 0000006A 207AFF98      XECINI   MOVE.L   EX$RAM,A0          GET START OF RAM
9 0000006E 7029                   MOVEQ    #EX$SIZ-1,D0       # OF BYTES TO CLEAR - 1
                         *
9 00000070 4218          XECO     CLR.B    (A0)+
9 00000072 51C8FFFC               DBRA     D0,XECO
9 00000076 4E75                   RTS
                         *
                         *
                                  IFNE     DEVOPT             DEVICE HANDLING OPTIONS
                                  ENDC
                         *
                         *
                         *.TSKINI - Initialize & install a task frame. The last task installed is
                         *          the first (next) to run. Caller must NOT use same supervisor
                         *          visor stack as task being initialized!!!
                         *
                         *        A0 - Pointer to task frame to initialize.
                         *        A1 - Task ID. (4 bytes)
                         *        A2 - Task entry point.
                         *        A3 - Supervisor stack pointer for this task.
                         *        A4 - User stack pointer for this task.
                         *        A5 - Data stack pointer for this task.
                         *
                         * NOTE! Task priorities are not implemented in this version!
                         *
                         * D0 destroyed. A3 represents present system stack pointer.
                         * (with status, pc, user sp, and data sp on it.)
                         *
```

```
9 00000078 7021          .TSKINI  MOVEQ    #TK$SIZ-1,D0         # OF BYTES TO CLEAR -1
                         *
9 0000007A 42300000      TSKCLR   CLR.B    (A0,D0)              CLEAR OUT TASK FRAME
9 0000007E 51C8FFFA               DBRA     D0,TSKCLR
                         *
                         * Put all necessary state information on the supervisor stack for this
                         * task. To keep task frame size down, we are only keeping the supervisor
                         * stack pointer in the task frame. The status register, pc, data sp, and
                         * user sp are kept in the supervisor stack.
                         *
9 00000082 48D00600               MOVEM.L  A1-A2,TK$ID(A0)      Set task ID & entry point
9 00000086 270A                   MOVE.L   A2,-(A3)             Set pc to entry point
9 00000088 373C0000               MOVE     #0,-(A3)             Set task status to user, all irps on
9 0000008C 48E3000C               MOVEM.L  A4-A5,-(A3)          Put user sp & data sp on super stack
9 00000090 21480008               MOVE.L   A3,TK$SSP(A0)        & save ssp in task frame
                         *
                         * Supervisor stack now:
                         *
                         * (high memory)    Program Counter    4 bytes
                         *                  Status Register    2 bytes
                         *                  Data Stack Ptr     4 bytes
                         * SSP ->           User Stack Ptr     4 bytes
                         *
                         * Now, set bit 15 in the state mask (with the time count set to zero)
                         * so that this task will be suspended until user calls READY with an
                         * activation pattern of $8000.
                         *
9 00000094 08E80007000E           BSET     #7,TK$STM(A0)        Start up by bit 15 only (time flag)
                         *
                         * Install this task frame in the ring.
                         *
9 0000009A 200D                   MOVE.L   A5,D0                Save A5 - Data stack pointer
9 0000009C 2A6E0006               MOVE.L   EX$NXT(A6),A5        Get ptr to last frame installed
9 000000A0 BBFC00000000           CMP.L    #0,A5                Do we have a prior task frame?
9 000000A6 6606                   BNE      TSK2                 Yes - continue
                         *
                         * This is the first frame to be installed. Set its next pointer to itself
                         * and A5 pointing to it to get the ring started.
                         *
9 000000A8 2148001A               MOVE.L   A0,TK$NXT(A0)        We're the next (only) task on the ring
                         *
                         * TO INSTALL NEW TASK FRAME:
                         *
                         *        Set next of new frame (one pointed to by A0) equal to
                         *        next of old frame (one pointed to by EX$NXT).
                         *
                         *        Set next of old frame equal to new frame.
                         *
                         *        Set EX$NXT equal to new frame.
                         *
9 000000AE 216D001A001A  TSK2     MOVE.L   TK$NXT(A5),TK$NXT(A0) Move old next to new next
9 000000B4 2B48001A               MOVE.L   A0,TK$NXT(A5)        Set old next to new
9 000000B8 2D480006               MOVE.L   A0,EX$NXT(A6)        & make new next to run
9 000000BC 2A40                   MOVE.L   D0,A5                Restore A5
9 000000BE 600000CE               BRA.L    .EXIT                & return
                         *
                                  IFNE     DEVOPT
                                  ENDC
                         *
                         * AND FALL INTO '.SUSPEN'
                         *
                         *
                         * GENERAL INTERRUPT SERVICE WAIT
                         *
                         * ENTER WITH D0 = EVENT FLAGS
                         *            D1 = TIME LIMIT
```

```
                                *
                                * All registers are destroyed. (except A6)
                                *
9          000000C2             .SUSPEN  EQU      *
9 000000C2 206E0002                      MOVE.L   EX$TSK(A6),A0        ;point to the task, to suspend
9 000000C6 00408000                      OR       #$8000,D0            ;set msbit of timer event flags
9 000000CA 3140000E                      MOVE     D0,TK$STM(A0)        ;set new state mask
9 000000CE 4268000C                      CLR      TK$STF(A0)           ;clear flags = inactive state
9 000000D2 31410010                      MOVE     D1,TK$TIM(A0)        ;set task time out value
                                * AND FALL INTO '.EXEC'
                                *
                                * .EXEC - Search for an active task
                                *         - Interrupt status is preserved
                                *
                                * All registers are destroyed except A6.
                                *
9          000000D6             .EXEC    EQU      *
                                *        * save old task status *
9 000000D6 206E0002                      MOVE.L   EX$TSK(A6),A0        ;Current task
9 000000DA 4E6B                          MOVE.L   USP,A3               ;Move to an address reg.
9 000000DC 2F0B                          MOVE.L   A3,-(A7)             ;Save user sp on system sp
9 000000DE 214F0008                      MOVE.L   A7,TK$SSP(A0)        ;Save system sp in task frame
                                *        * point to next task from exec ram *
9 000000E2 41EEFFEC                      LEA      EX$NXT-TK$NXT(A6),A0 ;Force the next frame pointer
                                *
                                *        * active task loop *
                                *
9 000000E6 2068001A             TSTKLP   MOVE.L   TK$NXT(A0),A0        ;Ring pointer set
                                *        * while looking for an active task, we will feed the WATCH DOG
9 000000EA 4EBAFF14                      JSR      WDFEED(PC)
9 000000EE 4A68000C                      TST      TK$STF(A0)           ;Any active flags set for this task
9 000000F2 67F2                          BEQ      TSTKLP               ;No, try next on ring
                                *                                      ;Yes, get him ready to run
9 000000F4 2D480002                      MOVE.L   A0,EX$TSK(A6)        ;Make him the current task
9 000000F8 2D68001A0006                  MOVE.L   TK$NXT(A0),EX$NXT(A6) ;Get next task ptr from current
9 000000FE 2E680008                      MOVE.L   TK$SSP(A0),A7        ;Get ssp for new task
9 00000102 2C5F                          MOVE.L   (A7)+,A6             ;Get user stack ptr. off stack
9 00000104 4E66                          MOVE.L   A6,USP               ;Got to put it in an A reg.

                                *
9 00000106 60000086                      BRA.L    .EXIT                ;Go run the task

                                *
                                * TASK ACTIVATOR ROUTINES
                                * CALLED FROM INTERRUPT OR FOREGROUND
                                *
                                *  .ROYALL: D0 = event flags
                                *          If TK$TIM hits 0 , activate task
                                *
                                *  .READY:  Reactivate task after suspend
                                *           D0 = event flags
                                *           A0 = task frame
                                *
                                *  TIMINT: Task time interrupt service. Invoked
                                *          by real time clock interrupt.
                                *
                                * All registers preserved.
                                *
                                * NOTE:    TIMINT is not part of the exec as supplied, but is required for any
                                *          application which uses a real time clock.  Because of the wide var-
                                *          iety of RTC circuitry, TIMINT will probably be unique to each ap-
                                *          plication.  It has been included here (in this application) because
                                *          it is both logically and physically appropriate.
                                *
9 0000010A 08F900000000 TIMINT   BSET     #0,TSR+DRCVR         ;Clear timer interrupt
           0034
```

```
9 00000112 2F00                  MOVE.L  D0,-(A7)          ;Save D0
9 00000114 303C8000              MOVE    #$8000,D0
9 00000118                       XSVC    RDYALL            ;Tick everyone's time
9 0000011C 201F                  MOVE.L  (A7)+,D0          ;Restore D0
9 0000011E 4E73                  RTE                       ;& return
                       *
9          00000120    .RDYALL   EQU     *                 ;Activate task ring test
9 00000120 2F08                  MOVE.L  A0,-(A7)          ;Save A0
9 00000122 206E0006              MOVE.L  EX$NXT(A6),A0     ;Point to first task in ring
9 00000126 4A40                  TST     D0                ;Process time?
9 00000128 6A02                  BPL     FINTSK            ;no - check flags
9 0000012A 5256                  ADDQ.W  #1,EX$TIM(A6)     ;yes-inc system time
                       *
                       *         * DO ALL TASKS *
                       *
9 0000012C 4A40        FINTSK    TST     D0                ;msb of time evntflag = 1?
9 0000012E 6A0C                  BPL     CALRDY            ;no trap to Ready
9 00000130 4A680010              TST     TK$TIM(A0)        ;task time = 0?
9 00000134 670A                  BEQ     NXTTSK            ;yes, leave timer alone
9 00000136 53680010              SUBQ    #1,TK$TIM(A0)     ;no, decrement task time
                       *                                   ;time = 0 now?
9 0000013A 6604                  BNE     NXTTSK            ;no, don't wake him up yet
                       *
9 0000013C             CALRDY    XSVC    READY             ;yes, get him Ready to go
                       *
9 00000140 2068001A    NXTTSK    MOVE.L  TK$NXT(A0),A0     ;point to next task
9 00000144 B1EE0006              CMP.L   EX$NXT(A6),A0     ;done all tasks yet?
9 00000148 66E2                  BNE     FINTSK            ;no - keep going
9 0000014A 205F                  MOVE.L  (A7)+,A0          ;restore A0
9 0000014C 6040                  BRA     .EXIT             ;we checked all the tasks - bye!
                       *
                       *
                       * .READY - Activate selected task by given event flags.
                       *
                       * A0 - pointer to task frame
                       * D0 - event flags
                       *
                       * All registers preserved.
                       *
9 0000014E 48E78080    .READY    MOVEM.L A0/D0,-(A7)       ;preserve registers
9 00000152 C068000E              AND     TK$STM(A0),D0     ;input flags = flags to wait on
9 00000156 8168000C              OR      D0,TK$STF(A0)     ;result bits match = active flags
9 0000015A 4CDF0101              MOVEM.L (A7)+,A0/D0       ;restore registers
9 0000015E 602E                  BRA     .EXIT             ;and return
                       *
                       *
                       ******************************
                       * SUPPORT COMMANDS FOR THE EXEC
                       ******************************
                       *
                       * .CHGENT - Change reentry point of this task
                       *
                       *     A0  = the new PC
                       *
                       * All registers preserved.
                       *
9          00000160    .CHGENT   EQU     *
9 00000160 2C6E0002              MOVE.L  EX$TSK(A6),A6     ;get current task
9 00000164 2D480004              MOVE.L  A0,TK$ENT(A6)     ;new entry in frame
9 00000168 6024                  BRA     .EXIT             ;restore A6  & return
                       *
                       *.TSKEND - Suspend and resume task at new entry point
                       *
                       *        D0 = Event Flags
                       *        D1 = Timer
                       *
```

```
                         * All registers destroyed.
                         *
9           0000016A     .TSKEND  EQU      *
9 0000016A 206E0002               MOVE.L   EX$TSK(A6),A0
9 0000016E 2F6800040006           MOVE.L   TK$ENT(A0),6(A7)      ;save new entry in SSP
9 00000174 6000FF4C               BRA.L    .SUSPEN
                         *
                         * .RESTRT - Restart this task
                         *         (This is a HELP facility, begining from scratch)
                         *         xxxWARNINGxxx if not carefull, the return to
                         *                        SSP & PC may get overwritten!
                         *
                         * User required input:
                         *       A0 - Pointer to reinitialize task frame
                         *       A2 - PC,  task entry point
                         *       A3 - SSP, supervisior stack pointer
                         *       A4 - USP, user stack pointer
                         *       A5 - DSP, data stack pointer
                         *
                         * A3 reflects SSP w/ restart data on stack, all other registers preserved.
                         *
9           00000178     .RESTRT  EQU      *
9 00000178 270A                   MOVE.L   A2,-(A3)              ;set pc to entry point
9 0000017A 4263                   CLR      -(A3)                 ;set task status to user,irps on
9 0000017C 48E3000C               MOVEM.L  A4-A5,-(A3)           ;put user & data sp on super stack
9 00000180 21480008               MOVE.L   A3,TK$SSP(A0)         ;and save ssp in task frame
9 00000184 08E80007000E           BSET     #7,TK$STM(A0)         ;start up by msbit only (time flag)
9 0000018A 6002                   BRA      .EXIT
                         *
                         *
                                  IFNE     DEVOPT                DEVICE HANDLER OPTION
                                  ENDC
                         *
9 0000018C 4E71                   NOP                            Keeps the assembler happy on conditional assembly
                         *
9 0000018E 2C5F          .EXIT    MOVE.L   (A7)+,A6              ;restore A6
9 00000190 4E73                   RTE
                         *
                         * .NEXTSK - Let a specific task run, not the next one in the link chain.
                         *           (Right now we just call the EXEC, later it might suspend too)
                         *
                         * Enter with: A0 = Task frame address
                         *
                         * All registers destroyed. (except A6)
                         *
9 00000192 2D480006      .NEXTSK  MOVE.L   A0,EX$NXT(A6)         ;set this task to run next
9 00000196 6000FF3E               BRA.L    .EXEC
                         *
                         ************************************************************************
                         * End of support routines                                              *
                         ************************************************************************
                         *
                         *
                                  IFNE     IFFOPT
                                  ENDC
                         *
                         *
                                  END

****** TOTAL ERRORS       0--
****** TOTAL WARNINGS     0--
```

SYMBOL TABLE LISTING

| SYMBOL NAME | | SECT | VALUE | SYMBOL NAME | | SECT | VALUE |
|---|---|---|---|---|---|---|---|
| .1SEC | | | 0000000A | EX$SIZ | | | 0000002A |
| .AIQSIZ | | | 00000038 | EX$TIM | | | 00000000 |
| .AOQSIZ | | | 00000038 | EX$TSK | | | 00000002 |
| .CHGENT | | 9 | 00000160 | EX.RAM | XREF | 5 | 00000000 |
| .COSINE | | | 00000014 | EXEC | | | 00000000 |
| .DEVINI | | 9 | 00000000 | EXECSW | XDEF | 9 | 00000008 |
| .DIQSIZ | | | 0000001C | F$ASHFL | | | 00004000 |
| .EFFECT | | | 0000001C | F$ONUT | | | 00000400 |
| .EXEC | | 9 | 00000006 | F$EEPM | | | 00000040 |
| .EXIT | | 9 | 0000018E | F$KYBD | | | 00000100 |
| .HIQSIZ | | | 000000C8 | F$MON | | | 00000080 |
| .HOQSIZ | | | 00000180 | F$OST | | | 00001000 |
| .ICOS | | | 0000000A | F$PDI | | | 00000800 |
| .IEFF | | | 00000018 | F$PROC | | | 00002000 |
| .ISCALE | | | 00000006 | F$XMIT | | | 00000200 |
| .ISIN | | | 0000000E | FF | | | 0000000C |
| .KWH | | | 00000024 | FINTSK | | 9 | 0000012C |
| .NEXTSK | | 9 | 00000192 | HT | | | 00000009 |
| .PIQSIZ | | | 0000003F | IPTENT$ | | | 00000014 |
| .RBFSIZ | | | 00000400 | IRFOPT | | | 00000000 |
| .RDYALL | | 9 | 00000120 | MAXAGE | | | 00000004 |
| .READY | | 9 | 0000014E | NEXTSK | | | 00000030 |
| .RELEAS | | 9 | 00000000 | NXTTSK | | 9 | 00000140 |
| .RESERV | | 9 | 00000000 | ONESEC | | | 0003D090 |
| .RESTRT | | 9 | 00000178 | ONETIK | | | 000009C4 |
| .SAMPLE | | | 00000002 | OPTENT$ | | | 00000004 |
| .SCALE1 | | | 00000004 | PAAR | | | 00000014 |
| .SCALE2 | | | 00000008 | PACR | | | 0000000C |
| .SCALE3 | | | 0000000C | PADDR | | | 00000004 |
| .SCALE4 | | | 00000010 | PADR | | | 00000010 |
| .SINE | | | 00000018 | PBAR | | | 00000016 |
| .SPNJP | MACR | * | | PBCR | | | 0000000E |
| .STEMP | | | 0000001C | PBDDR | | | 00000006 |
| .SUSPEN | | 9 | 000000C2 | PBDR | | | 00000012 |
| .TEMP | | | 00000012 | PCDDR | | | 00000008 |
| .TOFSET | | | 0000000E | PCDR | | | 00000018 |
| .TSCALE | | | 0000000A | PGCR | | | 00000000 |
| .TSKEND | | 9 | 0000016A | PIVR | | | 0000000A |
| .TSKINI | | 9 | 00000078 | PRGM | | | 00000007 |
| .VCOS | | | 00000002 | PSR | | | 0000001A |
| .VEFF | | | 00000014 | PSRR | | | 00000002 |
| .VSCALE | | | 00000002 | PULL | MACR | * | |
| .VSIN | | | 00000006 | PUSH | MACR | * | |
| .WAIT | | 9 | 00000000 | RAM | | | 00000005 |
| .WAITCN | | 9 | 00000000 | RDYALL | | | 00000008 |
| .WAITLP | | 9 | 00000000 | READY | | | 00000004 |
| .WAKEUP | | 9 | 00000000 | RELEAS | | | 0000002C |
| .WATTS | | | 00000020 | RESERV | | | 00000028 |
| .WATTSEC | | | 00000022 | RESTRT | | | 0000003C |
| AIBENT$ | | | 00000026 | S60 | | | 000039DF |
| CALRDY | | 9 | 0000013C | SAV$ | | | 0000002A |
| CHGENT | | | 00000034 | SPACE | | | 00000020 |
| CNTR | | | 0000002E | STX | | | 00000002 |
| CPR | | | 00000024 | SUSPEN | | | 0000000C |
| CR | | | 0000000D | SWTBL | | 9 | 0000002A |
| CTRL13 | | | 00000000 | TCR | | | 00000020 |
| CTRL2 | | | 00000002 | TIMINT | XDEF | 9 | 0000010A |
| DEVINI | | | 00000014 | TIMR1 | | | 00000004 |
| DEVOPT | | | 00000000 | TIMR2 | | | 00000008 |
| DI$DEV | | | 0000000A | TIMR3 | | | 0000000C |

```
DI$EVF                 00000000   TIVR                00000022
DI$IOM                 0000001B   TK$CON              00000012
DI$ISV                 00000006   TK$ENT              00000004
DI$LNK                 00000016   TK$ID               00000000
DI$OWN                 00000002   TK$LPT              00000016
DI$PTR                 00000012   TK$NXT              0000001A
DI$QUE                 0000000E   TK$RSO              0000001E
DI$RSO                 0000001A   TK$SIZ              00000022
DI$SIZ                 00000020   TK$SSP              00000008
DI$STA                 0000001C   TK$STF              0000000C
DI$USR                 0000001E   TK$STM              0000000E
DIBENT$                00000026   TK$TIM              00000010
DRCVR     XREF   X     00000000   TSK2            9   000000AE
DSFTENT$               00000010   TSKCLR          9   0000007A
EEPROM                 00000007   TSKEND              00000035
EOT                    00000004   TSKINI              00000010
EGS       MACR   X                TSR                 00000034
ETX                    00000003   TSTKLP          9   000000E6
EX$DV0                 0000000A   WAIT                0000001C
EX$DV1                 0000000E   WAITCN              00000020
EX$DV2                 00000012   WAITLP              00000024
EX$DV3                 00000016   WAKEUP              00000018
EX$DV4                 0000001A   WDFEED    XREF  9   00000000
EX$DV5                 0000001E   WTCHDOG   XREF  X   00000000
EX$DV6                 00000022   XECO            9   00000070
EX$DV7                 00000026   XECINI    XDEF  9   0000006A
EX$NXT                 00000006   XSVC      MACR  X
EX$RAM           9     00000004
```

```
                   FORMAT  IDNT    0,6             FORMAT DATA FOR TRANSMISSION   3/11/83
                           OPT     FCS,BRS
                   *
                   * SUBROUTINE:   FORMAT
                   *
                   * REVISED:      3/11/83
                   *
                   * AUTHOR:       D. A. ZEICHNER
                   *
                   * PURPOSE:      CONVERT INCOMING FLOATING POINT VALUE INTO A 12 BIT OFFSET
                   *               BINARY INTEGER REPRESENTED BY AN ASCII HEADER BYTE AND
                   *               TWO ASCII DATA BYTES.
                   *
                   * INPUTS:       A0 - POINTER TO OUTPUT PERSONALITY TABLE (OPT) ENTRY- 4 BYTES
                   *               D0 - VALUE TO BE FORMATTED.
                   *
                   * OUTPUTS:      D0 - 1ST BYTE OF MESSAGE
                   *               D1 - 2ND BYTE OF MESSAGE
                   *               D2 - 3RD BYTE OF MESSAGE
                   *               ALL OTHER REGISTERS PRESERVED.
                   *
                   * EXTERNAL REFERENCES/DEFINITIONS:
                   *
                           XDEF    FORMAT
                   *
                   * EEPROM REFERENCES:
                   *
                           XREF    OPT$
                   *
                   * EPROM (PROGRAM) REFERENCES:
                   *
                           XREF.S  9:ROUND
                   *
                   *
       00000009            SECTION PROM
                   *
9 00000000         FORMAT  PUSH    D5-D7
                   *
```

```
9 00000004 2E00                      MOVE.L   D0,D7
9 00000006 4EBAFFF8                  JSR      ROUND(PC)         ROUND & CONVERT TO INTEGER
9 0000000A 06470800                  ADD      #$800,D7          CONVERT TO 12 BIT OFFSET BINARY
9 0000000E 0C470FFF                  CMP      #$FFF,D7          OVER FULL SCALE ?
9 00000012 6306                      BLS      OK
9 00000014 2E3C00000FFF              MOVE.L   #$FFF,D7          YES ACT LIKE FULL SCALE
                              *
9 0000001A 3207               OK     MOVE     D7,D1             & SAVE IN D1 & D2
9 0000001C 3407                      MOVE     D7,D2
                              *
                              * CALCULATE OUTPUT NUMBER
                              *
9 0000001E 2008                      MOVE.L   A0,D0
9 00000020 048000000000              SUB.L    #OPT$,D0
9 00000026 80FC0004                  DIVU     #OPTENT$,D0
                              *
9 0000002A 1E10                      MOVE.B   (A0),D7           GET OUTPUT TYPE
9 0000002C EA0F                      LSR.B    #5,D7
                                     IF       D7 <EQ> #7 THEN
9 00000034 08C00007                    BSET     #7,D0           SET HEADER FOR KWH
                                     ENDI
  9 00000038                  Z_L1.000
                              *
                              * NOW FORMAT THE TWO DATA BYTES.
                              *
9 00000038 EC49                      LSR      #6,D1             ISOLATE M.S. 6 BITS
9 0000003A 004100C0                  OR       #$C0,D1           SET 2 M.S. BITS IN 1ST DATA BYTE
9 0000003E 004200C0                  OR       #$C0,D2           SET 2 M.S. BITS IN 2ND DATA BYTE
                              *
9 00000042                           PULL     D5-D7             RESTORE REGISTERS
9 00000046 4E75                      RTS                        & RETURN
                              *
                              *
                                     END

****** TOTAL ERRORS       0--
****** TOTAL WARNINGS     0--
```

SYMBOL TABLE LISTING

| SYMBOL NAME | SECT | VALUE | SYMBOL NAME | SECT | VALUE |
|---|---|---|---|---|---|
| .1SEC | | 0000000A | F$KYBD | | 00000100 |
| .AIQSIZ | | 00000038 | F$MON | | 00000080 |
| .AOQSIZ | | 00000038 | F$OST | | 00001000 |
| .COSINE | | 00000014 | F$PDI | | 00000800 |
| .DIQSIZ | | 0000001C | F$PROC | | 00002000 |
| .EFFECT | | 0000001C | F$XMIT | | 00000200 |
| .HIQSIZ | | 000000C8 | FF | | 0000000C |
| .HOQSIZ | | 00000180 | FORMAT | XDEF 9 | 00000000 |
| .ICOS | | 0000000A | HT | | 00000009 |
| .IEFF | | 00000018 | IPTENT$ | | 00000014 |
| .ISCALE | | 00000006 | MAXAGE | | 00000004 |
| .ISIN | | 0000000E | OK | 9 | 0000001A |
| .KWH | | 00000024 | ONESEC | | 0003D090 |
| .PIQSIZ | | 0000003F | ONETIK | | 000009C4 |
| .RBFSIZ | | 00000400 | OPT$ | XREF * | 00000000 |
| .SAMPLE | | 00000002 | OPTENT$ | | 00000004 |
| .SCALE1 | | 00000004 | PAAR | | 00000014 |
| .SCALE2 | | 00000008 | PACR | | 0000000C |
| .SCALE3 | | 0000000C | PADDR | | 00000004 |
| .SCALE4 | | 00000010 | PADR | | 00000010 |
| .SINE | | 00000018 | PBAR | | 00000016 |
| .STEMP | | 0000001C | PBCR | | 0000000E |

```
.TEMP        00000012   PBDDR                 00000006
.TOFSET      0000000E   PBDR                  00000012
.TSCALE      0000000A   PCDDR                 00000008
.VCOS        00000002   PCDR                  00000018
.VEFF        00000014   PGCR                  00000000
.VSCALE      00000002   PIVR                  0000000A
.VSIN        00000006   PROM                  00000009
.WATTS       00000020   PSR                   0000001A
.WATTSEC     00000022   PSRR                  00000002
AIBENT$      00000026   PULL      MACR   x
CNTR         0000002E   PUSH      MACR   x
CPR          00000024   RAM                   00000005
CR           0000000D   ROUND     XREF   9    00000000
CTRL13       00000000   S60                   000039DF
CTRL2        00000002   SPACE                 00000020
DIBENT$      00000026   STX                   00000002
DSFTENT$     00000010   TCR                   00000020
EEPROM       00000007   TIMR1                 00000004
EOT          00000004   TIMR2                 00000008
ETX          00000003   TIMR3                 0000000C
F$ASMPL      00004000   TIVR                  00000022
F$DNUT       00000400   TSR                   00000034
F$EEPM       00000040   Z_L1.000         9    00000038
```

```
                HDWINI   IDNT    0,1?                  Hardware Initializer  3/21/83
                         OPT     FCS,..S
                x
                x
                x SUBROUTINE:    HDWINI
                x
                x REVISED:       3/21/83
                x
                x AUTHOR:        D. A. ZEICHNER
                x
                x PURPOSE:       INITIALIZE ALL HARDWARE IN THE FTI.
                x
                x INPUTS:        NONE.
                x
                x OUTPUTS:       NONE. NO REGISTERS PRESERVED.
                x
                x EXTERNAL REFERENCES/DEFINITIONS:
                x
                         XDEF     HDWINI
                x
                x HARDWARE REFERENCES:
                x
                         XREF     ADCTRL
                         XREF     AUXACIA
                         XREF     CTRLP
                         XREF     DATAP
                         XREF     DRCVR
                         XREF     HOSTACIA
                         XREF     WTCHDOG
                x
                x RAM REFERENCES:
                x
                         XREF.S   5:AUXTRAK
                         XREF.S   5:HOSTRAK
                         XREF.S   5:RAMTBL
                x
                x EPROM (PROGRAM) REFERENCES:
                x
                         XREF.S   9:HDINIT
                x
                x
       00000009          SECTION  PROM
```

```
                          *
                          *
9          00000000       HDWINI  EQU     *
                          *
                          * Initialize PI/T on data acquisition board to provide A/D
                          * data & control lines, and analog input selection.  The
                          * PI/T is set up to behave as a garden variety PIA.
                          *
                          * (Unidirectional 8 bit mode, bit I/O - no hand shaking, no irqs)
                          *
                          * OCCUPIES IRP VECTORS $40-$43 (UNUSED) AND $44 (TIMER - ALSO UNUSED)
                          *
9 00000000 41F900000000           LEA     ADCTRL,A0            POINT TO PI/T
9 00000006 10BC0000               MOVE.B  #0,PGCR(A0)          ALL HANDSHAKE LINES DISABLED
9 0000000A 117C00000002           MOVE.B  #0,PSRR(A0)          NO DMA, IRP FROM ANY PORT
9 00000010 117C00700004           MOVE.B  #$70,PADDR(A0)       PORT A
9 00000016 117C00000006           MOVE.B  #$0,PBDDR(A0)        PORT B ALL INPUT LINES
9 0000001C 117C00800018           MOVE.B  #$80,PCDR(A0)        MAKE SURE A/D IS OFF FIRST!
9 00000022 117C00BF0008           MOVE.B  #$BF,PCDDR(A0)       PORT C ALL OUTPUT LINES
9 00000028 117C00C0000C           MOVE.B  #$C0,PACR(A0)        BIT I/O ON PORTS A & B. (NO DBL BUF,
9 0000002E 117C00C0000E           MOVE.B  #$C0,PBCR(A0)        NO HANDSHAKE, NO IRPS... STD PIA)
                          *
                          * DISABLE ZERO CROSSING DETECTOR, HOLD COUNTERS
                          * (SAMPLE & PERIOD), AND UNFREEZE ANALOG LINES.
                          *
9 00000034 42280010               CLR.B   PADR(A0)

                          *
                          * Initialize PTM - PROGRAMMABLE TIMER MODULE , MC6840 SERIES
                          *
                          * OCCUPIES IRP VECTOR $78
                          *
9 00000038 4EBAFFC6               JSR     HDINIT(PC)
                          *
                          * Initialize PI/T on I/O board to read 12 bit shift register from
                          * donut receiver (double buffered mode), & provide 10 ms. interrupts.
                          *
                          * OCCUPIES IRP VECTORS $50-$54. ($52 & $54 USED)
                          *
9 0000003C 41F900000000           LEA     DRCVR,A0             POINT TO PI/T
9 00000042 10BC0040               MOVE.B  #$40,PGCR(A0)        UNIDIRECTIONAL 16 BIT MODE, H1-4 LO TRUE
9 00000046 117C00180002           MOVE.B  #$18,PSRR(A0)        NO DMA, IRP ON, H1 HIGHEST PRIORITY
9 0000004C 117C00300004           MOVE.B  #$30,PADDR(A0)       A & B ARE INPUTS
9 00000052 117C00000006           MOVE.B  #0,PBDDR(A0)
9 00000058 117C0050000A           MOVE.B  #$50,PIVR(A0)        PORT INTERRUPT VECTOR
9 0000005E 117C003A000E           MOVE.B  #$3A,PBCR(A0)        DBL BUF IN, PULSED HSHAKE, IRP FROM H3
9 00000064 117C00A00020           MOVE.B  #$A0,TCR(A0)         SET UP TIMER PARAMETERS, TIMER OFF
9 0000006A 117C00540022           MOVE.B  #$54,TIVR(A0)        TIMER IRP VECTOR
9 00000070 203C000009C4           MOVE.L  #ONETIK,D0           10 MS. TICK @ 8 MHZ.
9 00000076 01C80024               MOVEP.L D0,CPR(A0)
                          *
                          * INITIALIZE RTU COMMUNICATION ACIA (HOSTACIA)
                          *
9 0000007A 13FC00030000           MOVE.B  #$3,HOSTACIA         MASTER RESET ACIA
           0000
9 00000082 13FC00100000           MOVE.B  #$10,HOSTACIA        RX IRP OFF, 8 BITS, ODD PARITY, 1 SB, -16
           0000
9 0000008A 41FAFF74               LEA     HOSTRAK(PC),A0
9 0000008E 10BC0010               MOVE.B  #$10,(A0)            SET UP HOST ACIA TRACKING REGISTER
                          *
                          * INITIALIZE AUXILIARY COMMUNICATION ACIA (AUXACIA)
                          *
9 00000092 13FC00030000           MOVE.B  #$3,AUXACIA          MASTER RESET
           0000
9 0000009A 13FC00950000           MOVE.B  #$95,AUXACIA         CONFIGURED AS ABOVE, BUT 8 BITS, NO PARITY
           0000
```

```
9 000000A2 41FAFF5C          LEA    AUXTRAK(PC),A0
9 000000A6 10BC0095          MOVE.B #$95,(A0)        SET UP AUX ACIA TRACKING REGISTER
                    *
                    * INITIALIZE STC.
                    *
9 000000AA                   START$
9 000000C2                   INTL$
9 0000010A 4E75              RTS
                    *
                    *
                    * INITIALIZATION TABLES:
                    *
                    * INITIALIZE TABLE FOR STC:
                    *
9 000001DC          INITBL   TEMMR$  BIN,DDP,DDB,OFF,0,F1,OFF,OFF,OFF
9 000001DE                   TEACR$  0
9 000001E0                   TEACR$  0                ALARMS NOT USED
9 000001E2                   TECL$   0
9 000001E4                   TECM$   OFF,,,,,,,,      COUNTERS 1-3 NOT USED
9 000001E6                   TECL$   0
9 000001E8                   TECM$   OFF,,,,,,,,
9 000001EA                   TECL$   0
9 000001EC                   TECM$   OFF,,,,,,,,
9 000001EE                   TECL$   $60              COUNT FOR 60 HZ. SAMPLING PERIOD
9 000001F0                   TECM$   HLG,R,F1,OFF,L,REP,BIN,DN,HTC
9 000001F2                   TECL$   0                INITIAL PERIOD COUNT
9 000001F4                   TECM$   HLGM,R,F1,OFF,L,REP,BIN,UP,IOH
                    *
                    *
                             END

****** TOTAL ERRORS       0--
****** TOTAL WARNINGS     0--
```

SYMBOL TABLE LISTING

| SYMBOL NAME | SECT | VALUE | SYMBOL NAME | | SECT | VALUE |
|---|---|---|---|---|---|---|
| .1SEC | | 0000000A | HOSTACIA | XREF | * | 00000000 |
| .AIQSIZ | | 00000038 | HOSTRAK | XREF | 5 | 00000000 |
| .AOQSIZ | | 00000038 | HT | | | 00000009 |
| .COSINE | | 00000014 | INITBL | | 9 | 000001DC |
| .DIQSIZ | | 0000001C | INTL$ | MACR | * | |
| .EFFECT | | 0000001C | IPTENT$ | | | 00000014 |
| .HIQSIZ | | 000000C8 | LAM$ | MACR | * | |
| .HOQSIZ | | 00000180 | LCD$ | MACR | * | |
| .ICOS | | 0000000A | LOP.000 | | 9 | 000000CE |
| .IEFF | | 00000018 | MAXAGE | | | 00000004 |
| .ISCALE | | 00000006 | MMR | | | 00000000 |
| .ISIN | | 0000000E | MMR$ | MACR | * | |
| .KWH | | 00000024 | MMR$0 | | | 000070B0 |
| .PIQSIZ | | 0000003F | NOSEQ$ | MACR | * | |
| .RBFSIZ | | 00000400 | ONESEC | | | 00030090 |
| .SAMPLE | | 00000002 | ONETIK | | | 000009C4 |
| .SCALE1 | | 00000004 | OPTENT$ | | | 00000004 |
| .SCALE2 | | 00000008 | PAAR | | | 00000014 |
| .SCALE3 | | 0000000C | PACR | | | 0000000C |
| .SCALE4 | | 00000010 | PADDR | | | 00000004 |
| .SINE | | 00000018 | PADR | | | 00000010 |
| .STEMP | | 0000001C | PBAR | | | 00000016 |
| .TEMP | | 00000012 | PBCR | | | 0000000E |
| .TOFSET | | 0000000E | PBDDR | | | 00000006 |
| .TSCALE | | 0000000A | PBDR | | | 00000012 |
| .VCOS | | 00000002 | PCDDR | | | 00000008 |

| | | | | | | | |
|---|---|---|---|---|---|---|---|
| .VEFF | | | 00000014 | FCDR | | | 00000018 |
| .VSCALE | | | 00000002 | PGCR | | | 00000000 |
| .VSIN | | | 00000006 | PIVR | | | 0000000A |
| .WATTS | | | 00000020 | PROM | | | 00000009 |
| .WATTSEC | | | 00000022 | PSR | | | 0000001A |
| A1R | | | 00000002 | PSRR | | | 00000002 |
| A2R | | | 00000004 | PULL | MACR | * | |
| ADCTRL | XREF | * | 00000000 | PUSH | MACR | * | |
| AIBENT$ | | | 00000026 | RAM | | | 00000005 |
| ARM$ | MACR | * | | RAMTBL | XREF | 5 | 00000000 |
| AUXACIA | XREF | * | 00000000 | READ$ | MACR | * | |
| AUXTRAK | XREF | 5 | 00000000 | RITE$ | MACR | * | |
| B16$ | MACR | * | | RST$ | MACR | * | |
| C1L | | | 00000006 | S60 | | | 0000390F |
| C1M | | | 00000008 | SAV$ | MACR | * | |
| C2L | | | 0000000A | SEQ$ | MACR | * | |
| C2M | | | 0000000C | SET$ | MACR | * | |
| C3L | | | 0000000E | SPACE | | | 00000020 |
| C3M | | | 00000010 | STA$ | MACR | * | |
| C4L | | | 00000012 | STA1R$ | MACR | * | |
| C4M | | | 00000014 | STA2R$ | MACR | * | |
| C5L | | | 00000016 | START$ | MACR | * | |
| C5M | | | 00000018 | STC1L$ | MACR | * | |
| CLR$ | MACR | * | | STC1M$ | MACR | * | |
| CMR$ | MACR | * | | STC2L$ | MACR | * | |
| CMR$0 | | | 00006B2C | STC2M$ | MACR | * | |
| CNT5$ | MACR | * | | STC3L$ | MACR | * | |
| CNTR | | | 0000002E | STC3M$ | MACR | * | |
| CPR | | | 00000024 | STC4L$ | MACR | * | |
| CR | | | 0000000D | STC4M$ | MACR | * | |
| CTRL13 | | | 00000000 | STC5L$ | MACR | * | |
| CTRL2 | | | 00000002 | STC5M$ | MACR | * | |
| CTRLP | XREF | * | 00000000 | STCEQU | | 0 | 00000000 |
| DATAP | XREF | * | 00000000 | STMMR$ | MACR | * | |
| DIBENT$ | | | 00000026 | STP$ | MACR | * | |
| DRCVR | XREF | * | 00000000 | STX | | | 00000002 |
| DSA$ | MACR | * | | TCR | | | 00000020 |
| DSFTENT$ | | | 00000010 | TEACR$ | MACR | * | |
| DSV$ | MACR | * | | TECL$ | MACR | * | |
| EEPROM | | | 00000007 | TECM$ | MACR | * | |
| EOT | | | 00000004 | TEMMR$ | MACR | * | |
| ETX | | | 00000003 | TIMR1 | | | 00000004 |
| F$ASMPL | | | 00004000 | TIMR2 | | | 00000008 |
| F$CMUT | | | 00000400 | TIMR3 | | | 0000000C |
| F$EEPM | | | 00000040 | TIVR | | | 00000022 |
| F$KYED | | | 00000100 | TSR | | | 00000034 |
| F$MON | | | 00000080 | UPACR$ | MACR | * | |
| F$OST | | | 00001000 | UPC1M$ | MACR | * | |
| F$PDI | | | 00000800 | UPC2M$ | MACR | * | |
| F$PROC | | | 00002000 | UPC3M$ | MACR | * | |
| F$XMIT | | | 00000200 | UPC4M$ | MACR | * | |
| FF | | | 0000000C | UPC5M$ | MACR | * | |
| GET$ | MACR | * | | UPDCL$ | MACR | * | |
| GOF$ | MACR | * | | UPMMR$ | MACR | * | |
| GON$ | MACR | * | | WDINIT | XREF | 9 | 00000000 |
| HDWINI | XDEF | 9 | 00000000 | WTCHDOG | XREF | * | 00000000 |

```
               INIT    IDNT    0.14                System Initializer  3/21/83
                       OPT     PCS,BRS
               *
               *
               * SUBROUTINE:   INIT
               *
               * REVISED:      3/21/83
               *
               * AUTHOR:       D. A. ZEICHNER
```

```
*
* PURPOSE:        INITIALIZE SYSTEM HARDWARE, TABLES, BUFFERS, & TASKS.
*
* INPUTS:         NONE.
*
* OUTPUTS:        NONE.
*
* EXTERNAL REFERENCES/DEFINITIONS:
*
        XDEF    INIT
        XDEF    INIT0
*
* RAM REFERENCES:
*
        XREF.S  5:AUXTRAK
        XREF.S  5:EX.RAM
        XREF.S  5:HOSTRAK
        XREF.S  5:LCKOUT
*
* QUEUES:
*
        XREF.S  5:AUXIQ$
        XREF.S  5:AUXOQ$
        XREF.S  5:DNTIQ$
        XREF.S  5:HSTIQ$
        XREF.S  5:HSTOQ$
        XREF.S  5:PRCIQ$
*
* STACKS:
*
        XREF.S  5:S_ANALOG
        XREF.S  5:S_DIAG
        XREF.S  5:S_DONUT
        XREF.S  5:S_KB
        XREF.S  5:S_OFFLOD
        XREF.S  5:S_OUTPUT
        XREF.S  5:S_PROCES
        XREF.S  5:S_XMON
*
* TASK FRAMES:
*
        XREF.S  5:T_ANALOG
        XREF.S  5:T_DIAG
        XREF.S  5:T_DONUT
        XREF.S  5:T_KB
        XREF.S  5:T_OFFLOD
        XREF.S  5:T_OUTPUT
        XREF.S  5:T_PROCES
        XREF.S  5:T_XMON
*
* EEPROM REFERENCES:
*
        XREF    EPMEND
        XREF    EPMSTR
        XREF    SITEID
*
* EPROM (PROGRAM) REFERENCES:
*
        XREF.S  9:ANALOG
        XREF.S  9:BUFINI
        XREF.S  9:CRCTST
        XREF.S  9:DIAG
        XREF.S  9:DISPCH
        XREF.S  9:DONUT
        XREF.S  9:EEPROM
        XREF.S  9:HDWINI
```

```
         XREF.S   9:KB
         XREF.S   9:KBIRF
         XREF.S   9:OFFLOD
         XREF.S   9:OUTPUT
         XREF.S   9:PROCES
         XREF.S   9:TBLINI
         XREF.S   9:TIMER
         XREF.S   9:QUEINI
         XREF.S   9:VECINT
         XREF.S   9:WDSTRT
         XREF.S   9:XECINI
         XREF.S   9:XMTMON
*
* HARDWARE REFERENCES:
*
         XREF     AUXACIA
         XREF     ADCTRL
         XREF     DRDVR
         XREF     HOSTACIA
         XREF     KEYBRD
         XREF     PANEL
         XREF     WTCHDOG
*
*
* LOCAL MACROS:
*
* QUEUE PARAMETER INITIALIZER MACRO:
*
*        QUE[.B] QUEUE ADDR,NO. OF ELEMENTS
*
* ELEMENT SIZE DEFAULTS TO WORD. (SIZE IS EITHER WORD OR BYTE)
*
QUE      MACRO
         IFNC     '\0','B'
         DC.W     \2!$8000           QUEUE SIZE (ELEMENT IS WORD)
         ENDC
         IFC      '\0','B'
         DC.W     \2                 QUEUE SIZE (ELEMENT IS BYTE)
         ENDC
         DC.W     \1                 QUEUE HEADER BLOCK ADDRESS
         ENDM
*
* DEVICE LIST INITIALIZER MACRO - BUILD TABLE OF DICT PARAMETERS.
*
* CALLING SEQUENCE:
*
*        DEV   DICT ADR, IRP SVC ADR, DEV ADR, Q PTR, USR PTR,
*              DEVICE STATUS MASK, PRIORITY CHAIN LEVEL
*
DEV      MACRO
         IFNE     NARG-7
         FAIL     99                 * WRONG NUMBER OF ARGUMENTS
         ENDC
         DC.L     \1                 DICT ADDRESS
         DC.L     \2                 IRP SVC ADDRESS
         DC.L     \3                 DEVICE ADDRESS
         DC.L     \4                 QUEUE POINTER
         DC.L     \5                 USER POINTER
         DC.B     \6                 DEVICE STATUS MASK
         DC.B     \7                 PRIORITY CHAIN LEVEL
         ENDM
*
* TASK PARAMETER LIST INITIALIZER MACRO:
*
* CALLING SEQUENCE:
*
```

```
                         *        TSK    TASK FRAME ADR, ID, ENTRY POINT, USER SP,
                         *               SUPERVISOR SP SIZE, DATA SP
                         *
                         * NOTE:  The user stack pointer starts at the address given in the
                         *        macro call, and the system stack pointer starts at the user
                         *        sp + the supervisor stack size.
                         *
                         * NOTE:  Task ID must be enclosed in single quotes.
                         *
                         TSK      MACRO
                                  IFNE    NARG-6
                                  FAIL    99               * WRONG NUMBER OF ARGUMENTS *
                                  MEXIT
                                  ENDC
                         *
                                  DC.L    \1               TASK FRAME ADDRESS
                                  DC.L    \2               TASK ID
                                  DC.L    \3               TASK ENTRY POINT
                                  DC.L    \4+\5            SUPERVISOR SP
                                  DC.L    \4               USER SP
                                  DC.L    \6               DATA SP
                                  ENDM
                         *
                         *
             00000009             SECTION  PROM
                         *
  9 00000000 4E71        INIT     NOP                          START OF PROGRAM FOR VMEBUG
  9 00000002 4240                 CLR     D0
  9 00000004 6004                 BRA     INIT1
  9 00000006 303CFFFF    INIT0    MOVE    #-1,D0               DEBUG ENTRY
                         *
  9 0000000A 4E70        INIT1    RESET
  9 0000000C 4EBAFFF2             JSR     VECINT(PC)           SETUP VECTOR IRPS
  9 00000010 2E7C00000000         MOVE.L  #S_OFFLOD,A7         GET SSP FOR RESTARTS FROM OFFLOD
  9 00000016 007C2700             OR      #$2700,SR            TURN OFF ALL IRPS FOR NOW
  9 0000001A 4EBAFFE4             JSR     BUFINI(PC)           INIT ANALOG & DIGITAL INPUT BUFFERS
  9 0000001E 4EBAFFE0             JSR     TBLINI(PC)           BUILD INPUT SEQUENCE TABLE
  9 00000022 4EBAFFDC             JSR     HDWINI(PC)           INITIALIZE THE HARDWARE
                         *
  9 00000026 700C                 MOVEQ   #FF,D0               CLEAR DISPLAY (W/ FORM FEED)
  9 00000028 4EBAFFD6             JSR     DISPCH(PC)
                         *
                         * INITIALIZE ALL QUEUES!
                         *
  9 0000002C 4DFA0162             LEA     QTABLE(PC),A6
                         *
  9 00000030 4C9E0101    IQLUP    MOVEM   (A6)+,A0/D0
  9 00000034 4EBAFFCA             JSR     QUEINI(PC)           INITIALIZE QUEUE
  9 00000038 4A56                 TST     (A6)                 MORE TO DO?
  9 0000003A 66F4                 BNE     IQLUP                YES - CONTINUE
                         *
                         * INITIALIZE TIMER VALUES FOR ALL CLUSTERS
                         * TO APPROPRIATE TIME FOR 60 HZ INPUT.
                         *
  9 0000003C 303C39DF             MOVE    #S60,D0              SAMPLE TIME FOR 60HZ WAVEFORM
  9 00000040 4840                 SWAP    D0                   PUT IN MOST SIGNIFICANT WORD
                         *
                                  FOR     D0 = #0 TO #4 DO
  9 00000048             Z_L1.001
  9 00000048 2200                   MOVE.L  D0,D1              PRESERVE D0 THRU CALL
  9 0000004A 4EBAFFB4               JSR     TIMWR(PC)          INITIALIZE CLUSTERS 0-4
  9 0000004E 2001                   MOVE.L  D1,D0              RESTORE D0
                                  ENDF
                         *
  9 00000058 4EBAFFA6             JSR     XECINI(PC)           INITIALIZE THE EXEC.
                         *
```

```
                        * INSTALL ALL TASK FRAMES.
                        *
9 0000005C 4DFA009E             LEA     TSKTBL(PC),A6
                        *
9 00000060 4CDE3F00     ITSKLUP MOVEM.L (A6)+,A0-A5         GET PARAMETERS FROM TSKTBL
9 00000064                      XSVC    TSKINI              INITIALIZE TASK FRAME
9 00000068 4A96                 TST.L   (A6)                ALL TASKS INSTALLED?
9 0000006A 66F4                 BNE     ITSKLUP             NO - CONTINUE
                        *
                        * CHECK ID TABLE FOR NON-ASCII CHARACTERS. IF WE FIND
                        * ONE, THEN ONLY START UP THE OFFLOD TASK (T_OFFLOD),
                        * OTHERWISE START EVERYBODY.
                        *
9 0000006C 41F900000000         LEA     SITEID,A0
9 00000072 700F                 MOVEQ   #15,D0              # OF CHARACTERS TO CHECK (-1)
                        *
9 00000074 0C100020     ISITLUP CMP.B   #$20,(A0)
9 00000078 6D1A                 BLT     ONETSK              NOT ASCII - START UP OFFLOD ONLY
9 0000007A 0C18007F             CMP.B   #$7F,(A0)+
9 0000007E 6E14                 BGT     ONETSK
9 00000080 51C8FFF2             DBRA    D0,ISITLUP          CONTINUE TILL ALL CHARACTERS DONE.
                        *
                        * ALL CHARACTERS IN SITE ID ARE ASCII. THIS MEANS WE'VE BEEN
                        * INITIALIZED BEFORE, SO START UP ALL TASKS.
                        *
9 00000084 207C00000000         MOVE.L  #DRCVR,A0           POINT TO DONUT RECEIVER
9 0000008A 08D00005             BSET    #5,PGCR(A0)         & TURN DONUT RECEIVE IRP ON
9 0000008E 4DFA006C             LEA     TSKTBL(PC),A6       POINT TO START OF TASK TABLE
9 00000092 6004                 BRA     IWAKEUP             & WAKE UP ALL TASKS
                        *
                        * HAVE NEVER BEEN INITIALIZED BEFORE. START UP OFFLOD TASK ONLY.
                        *
9 00000094 4DFA00DE     ONETSK  LEA     LASTSK(PC),A6       OFFLOD IS LAST TASK ON LIST
                        *
9 00000098 303C8000     IWAKEUP MOVE    #$8000,D0           UNCONDITIONAL WAKE UP FLAG
9 0000009C 207C00000000         MOVE.L  #DRCVR,A0           GET ADR OF 10 MS. TIMER
9 000000A2 08E800000020         BSET    #0,TCR(A0)          & START IT UP.
                        *
                        * WAKE UP LOOP
                        *
9 000000A8 2056         IWAKLUP MOVE.L  (A6),A0             GET TASK FRAME FROM INIT TABLE
9 000000AA                      XSVC    READY               WAKE UP THIS TASK
9 000000AE 4DEE0018             LEA     24(A6),A6           POINT TO NEXT TASK FRAME
9 000000B2 4A96                 TST.L   (A6)                MORE TO GO?
9 000000B4 66F2                 BNE     IWAKLUP             YES - CONTINUE
                        *
9 000000B6 41FAFF48             LEA     EX.RAM(PC),A0       POINT TO EXEC'S RAM
9 000000BA 43FAFF44             LEA     T_OFFLOD(PC),A1     POINT TO OFFLOD TASK FRAME
9 000000BE 21490002             MOVE.L  A1,EX$TSK(A0)       MAKE OFFLOD THE PRESENT TASK
9 000000C2 4E67                 MOVE.L  A7,USP              SET UP USP
9 000000C4 4FFA00CA             LEA     S_OFFLOD+400(PC),A7 ASSUME PROPER SUPER STACK
9 000000C8 46FC0000             MOVE    #0,SR               MAKE OURSELVES MORTAL
                        *
                        * CALCULATE CRC FOR EEPROM - (MUST BE MOVED AFTER TIMER HAS STARTED).
                        *
9 000000CC 41F900000000         LEA     EPMSTR,A0           GET START OF EEPROM
9 000000D2 323C0000             MOVE    #EPMEND-EPMSTR,D1   # OF BYTES TO CHECK
9 000000D6 4247                 CLR     D7                  INIT CRC WORD
9 000000D8 4EBAFF26             JSR     CRCTST(PC)          CALCULATE CRC WORD
                        *
9 000000DC 43F900000000         LEA     EPMEND,A1           DESTINATION OF MOVE
9 000000E2 3F07                 MOVE    D7,-(A7)            SAVE THE SOURCE OF THE MOVE
9 000000E4 204F                 MOVE.L  A7,A0               GET SOURCE POINTER
9 000000E6 7402                 MOVEQ   #2,D2               TWO BYTES TO MOVE
9 000000E8 08B800000000         BCLR    #0,LCKOUT           INITIALIZE TASK LOCK OUT BIT
9 000000EE 4EBAFF10             JSR     EEPMOV(PC)          MOVE CRC WORD TO EEPROM
```

```
9 000000F2 549F             ADDQ.L   #2,A7                 RESTORE STACK
                   *
9 000000F4 4EBAFF0A         JSR      HOSTRT(PC)            START THE FTM  - WATCHDOG
                   *
9 000000F8 4EFAFF06         JMP      OFFLOD(PC)            AND DO IT!
                   *
                   * AND WE'RE ON THE AIR!
                   *
                   *
                   * INITIALIZATION PARAMETER TABLES:
                   *
                   * TABLE OF PARAMETERS TO INITIALIZE TASK FRAMES:
                   *
                   * (LAST ONE IN LIST IS 1ST TO GO)
                   *
                   **
                   *    NOTE: FOR TESTING WITHOUT THE BOTHER OF DIAG & DONUT, THEY HAVE
                   **          NOT BEEN MADE READY TO RUN. (NEVER INITIALIZED)-- REMOVE LATER!

9 000000FC         TSKTBL   TSK      T_ANALOG,'ANLG',ANALOG,S_ANALOG,400,0
                   *         TSK     T_DONUT,'DNUT',DONUT,S_DONUT,400,0
9 00000114                  TSK      T_PROCES,'PROC',PROCES,S_PROCES,400,0
9 0000012C                  TSK      T_OUTPUT,'OUPT',OUTPUT,S_OUTPUT,400,0
9 00000144                  TSK      T_KB,'KYBD',KB,S_KB,400,0
9 0000015C                  TSK      T_XMON,'XMON',XMTMON,S_XMON,400,0
                   *         TSK     T_DIAG,'DIAG',DIAG,S_DIAG,400,0
9 00000174         LASTSK   TSK      T_OFFLOD,'OFLD',OFFLOD,S_OFFLOD,400,0
                   *
9 0000018C 00000000         DC.L     0                     *END OF TASK PARAMETER TABLE
                   *
                   * TABLE OF PARAMETERS TO INITIALIZE QUEUES:
                   *
9 00000170         QTABLE   QUE.B    AUXIQ$,.AIQSIZ        AUXILIARY INPUT QUEUE (ELEMENT SIZE BYTE)
9 00000194                  QUE.B    AUXOQ$,.AOQSIZ        AUXILIARY OUTPUT QUEUE
9 00000198                  QUE      DNTIQ$,.DIQSIZ        DONUT INPUT QUEUE (ELEMENT SIZE WORD)
9 0000019C                  QUE.B    HSTIQ$,.HIQSIZ        HOST INPUT QUEUE
9 000001A0                  QUE.B    HSTOQ$,.HOQSIZ        HOST OUTPUT QUEUE
9 000001A4                  QUE      PRCIQ$,.PIQSIZ        PROCESS INPUT QUEUE (ELEMENT SIZE WORD)
                   *
9 000001A8 0000             DC.W     0                     END OF QUEUE PARAMETER TABLE
                   *
                   *
                            END

****** TOTAL ERRORS      0--
****** TOTAL WARNINGS    0--
```

SYMBOL TABLE LISTING

| SYMBOL NAME | | SECT | VALUE | SYMBOL NAME | | SECT | VALUE |
|---|---|---|---|---|---|---|---|
| .1SEC | | | 0000000A | INIT1 | | 9 | 0000000A |
| .AIQSIZ | | | 00000038 | IPTENT$ | | | 00000014 |
| .AOQSIZ | | | 00000038 | IQLUP | | 9 | 00000030 |
| .COSINE | | | 00000014 | ISITLUP | | 9 | 00000074 |
| .DIQSIZ | | | 0000001C | ITSKLUP | | 9 | 00000060 |
| .EFFECT | | | 0000001C | IWAKEUP | | 9 | 00000098 |
| .HIQSIZ | | | 000000C8 | IWAKLUP | | 9 | 00000068 |
| .HOQSIZ | | | 00000180 | KB | XREF | 9 | 00000000 |
| .ICOS | | | 0000000A | KBIRP | XREF | 9 | 00000000 |
| .IEFF | | | 00000018 | KEYBRD | XREF | * | 00000000 |
| .ISCALE | | | 00000006 | LASTSK | | 9 | 00000174 |
| .ISIN | | | 0000000E | LCKOUT | XREF | 5 | 00000000 |
| .KWH | | | 00000024 | MAXAGE | | | 00000004 |

| | | | | | | | |
|---|---|---|---|---|---|---|---|
| .PIQSIZ | | | 0000003F | NEXTSK | | | 00000030 |
| .RBFSIZ | | | 00000400 | OFFLOD | XREF | 9 | 00000000 |
| .SAMPLE | | | 00000002 | ONESEC | | | 00030090 |
| .SCALE1 | | | 00000004 | ONETIK | | | 000009C4 |
| .SCALE2 | | | 00000008 | ONETSK | | 9 | 00000094 |
| .SCALE3 | | | 0000000C | OPTENT$ | | | 00000004 |
| .SCALE4 | | | 00000010 | OUTPUT | XREF | 9 | 00000000 |
| .SINE | | | 00000018 | PAAR | | | 00000014 |
| .SPNJP | MACR | x | | PACR | | | 0000000C |
| .STEMP | | | 00000010 | PADDR | | | 00000004 |
| .TEMP | | | 00000012 | PADR | | | 00000010 |
| .TOFSET | | | 0000000E | PANEL | XREF | x | 00000000 |
| .TSCALE | | | 0000000A | PBAR | | | 00000016 |
| .VCOS | | | 00000002 | PBCR | | | 0000000E |
| .VEFF | | | 00000014 | PBDDR | | | 00000006 |
| .VSCALE | | | 00000002 | PBDR | | | 00000012 |
| .VSIN | | | 00000006 | PCDDR | | | 00000008 |
| .WATTS | | | 00000020 | PCDR | | | 00000018 |
| .WATTSEC | | | 00000022 | PGCR | | | 00000000 |
| ADCTRL | XREF | x | 00000000 | PIVR | | | 0000000A |
| AIBENT$ | | | 00000026 | PRCIQ$ | XREF | 5 | 00000000 |
| ANALOG | XREF | 9 | 00000000 | PROCES | XREF | 9 | 00000000 |
| AUXACIA | XREF | x | 00000000 | PROM | | | 00000009 |
| AUXIQ$ | XREF | 5 | 00000000 | PSR | | | 0000001A |
| AUXOQ$ | XREF | 5 | 00000000 | PSRR | | | 00000002 |
| AUXTRAK | XREF | 5 | 00000000 | PULL | MACR | x | |
| BUFINI | XREF | 9 | 00000000 | PUSH | MACR | x | |
| CHGENT | | | 00000034 | QTABLE | | 9 | 00000190 |
| CNTR | | | 0000002E | QUE | MACR | x | |
| CPR | | | 00000024 | QUEINI | XREF | 9 | 00000000 |
| CR | | | 0000000D | RAM | | | 00000005 |
| CRCTST | XREF | 9 | 00000000 | RDYALL | | | 00000008 |
| CTRL13 | | | 00000000 | READY | | | 00000004 |
| CTRL2 | | | 00000002 | RELEAS | | | 0000002C |
| DEV | MACR | x | | RESERV | | | 00000028 |
| DEVINI | | | 00000014 | RESTRT | | | 0000003C |
| DI$DEV | | | 0000000A | S60 | | | 000039DF |
| DI$EVF | | | 00000000 | SAV$ | | | 0000002A |
| DI$IOM | | | 00000018 | SITEID | XREF | x | 00000000 |
| DI$ISV | | | 00000006 | SPACE | | | 00000020 |
| DI$LNK | | | 00000016 | STX | | | 00000002 |
| DI$OWN | | | 00000002 | SUSPEN | | | 0000000C |
| DI$PTR | | | 00000012 | S_ANALOG | XREF | 5 | 00000000 |
| DI$QUE | | | 0000000E | S_DIAG | XREF | 5 | 00000000 |
| DI$RSO | | | 0000001A | S_DONUT | XREF | 5 | 00000000 |
| DI$SIZ | | | 00000020 | S_KB | XREF | 5 | 00000000 |
| DI$STA | | | 0000001C | S_OFFLOD | XREF | 5 | 00000000 |
| DI$USR | | | 0000001E | S_OUTPUT | XREF | 5 | 00000000 |
| DIAG | XREF | 9 | 00000000 | S_PROCES | XREF | 5 | 00000000 |
| DIBENT$ | | | 00000026 | S_XMON | XREF | 5 | 00000000 |
| DISPCH | XREF | 9 | 00000000 | TBLINI | XREF | 9 | 00000000 |
| DNTIQ$ | XREF | 5 | 00000000 | TCR | | | 00000020 |
| DONUT | XREF | 9 | 00000000 | TIMR1 | | | 00000004 |
| DRCVR | XREF | x | 00000000 | TIMR2 | | | 00000008 |
| DSPTENT$ | | | 00000010 | TIMR3 | | | 0000000C |
| EEPMOV | XREF | 9 | 00000000 | TIMWR | XREF | 9 | 00000000 |
| EEPROM | | | 00000007 | TIVR | | | 00000022 |
| EOT | | | 00000004 | TK$CON | | | 00000012 |
| EPMEND | XREF | x | 00000000 | TK$ENT | | | 00000004 |
| EPMSTR | XREF | x | 00000000 | TK$ID | | | 00000000 |
| EQS | MACR | x | | TK$LPT | | | 00000016 |
| ETX | | | 00000003 | TK$NXT | | | 0000001A |
| EX$DV0 | | | 0000000A | TK$RSO | | | 0000001E |
| EX$DV1 | | | 0000000E | TK$SIZ | | | 00000022 |
| EX$DV2 | | | 00000012 | TK$SSP | | | 00000008 |
| EX$DV3 | | | 00000016 | TK$STP | | | 0000000C |

```
EX$DV4                  0000001A    TK$STK                  0000000E
EX$DV5                  0000001E    TK$TIM                  00000010
EX$DV6                  00000022    TSK         MACR   x
EX$DV7                  00000026    TSKEND                  00000038
EX$NXT                  00000006    TSKINI                  00000010
EX$SIZ                  0000002A    TSKTBL             9    000000FC
EX$TIM                  00000000    TSR                     00000034
EX$TSK                  00000002    T_ANALOG    XREF   5    00000000
EX.RAM      XREF   5    00000000    T_DIAG      XREF   5    00000000
EXEC                    00000000    T_DDNUT     XREF   5    00000000
F$ASMPL                 00004000    T_KB        XREF   5    00000000
F$DNUT                  00000400    T_OFFLOD    XREF   5    00000000
F$EEPM                  00000040    T_OUTPUT    XREF   5    00000000
F$KYBD                  00000100    T_PROCES    XREF   5    00000000
F$MON                   00000080    T_XMON      XREF   5    00000000
F$OST                   00001000    VECINT      XREF   9    00000000
F$PDI                   00000800    WAIT                    0000001C
F$PROC                  00002000    WAITCN                  00000020
F$XMIT                  00000200    WAITLP                  00000024
FF                      0000000C    WAKEUP                  00000018
HDWINI      XREF   9    00000000    WDSTRT      XREF   9    00000000
HOSTACIA    XREF   x    00000000    WTCHDOG     XREF   x    00000000
HOSTRAK     XREF   5    00000000    XECINI      XREF   9    00000000
HSTIQ$      XREF   5    00000000    XMTMON      XREF   9    00000000
HSTOQ$      XREF   5    00000000    XSVC        MACR   x
HT                      00000009    Z_L1.001           9    00000046
INIT        XDEF   9    00000000    Z_L2.000           9    00000052
INITO       XDEF   9    00000006
```

```
        KB      IDNT    0,9                     Keyboard handler task  3/3/83
                OPT     FCS,BRS
*
*
* SUBROUTINE:   KB
*
* REVISED:      3/3/83
*
* AUTHOR:       D. A. ZEICHNER
*
* PURPOSE:      Monitor keyboard, and provide the appropriate response
*               to keyboard input.
*
* INPUTS:       None.
*
* OUTPUTS:      None.
*
* EXTERNAL REFERENCES/DEFINITIONS:
*
                XDEF    KB
                XDEF    BINASC
*
* HARDWARE REFERENCES:
*
                XREF    HOSTACIA
*
* RAM REFERENCES:
*
                XREF.S  5:HOSTRAK
                XREF.S  5:T_KB
                XREF.S  5:T_XMON
*
* EEPROM REFERENCES:
*
                XREF    RAMEPR
*
* PROM REFERENCES:
```

```
                             *
                                     XREF.S    9:DISPCH
                                     XREF.S    9:DISPLY
                                     XREF.S    9:FFPAFP
                                     XREF.S    9:FFFFPI
                             *
                             * LOCAL ASSIGNMENTS:
                             *
            0000000F         UPRQ    EQU       $F                      UPLOAD REQUEST KEY       N/A
            0000000E         ERLG    EQU       $E                      ERROR LOG DISPLAY KEY
            0000000D         PTMN    EQU       $D                      POINT MONITOR KEY
                             *
            00000000         TEMP    EQU       0                       STACK OFFSET TO LOCAL WORK AREA
                             *
                             *
                             *
            00000009                 SECTION   PROM
                             *
9 00000000 4DFAFFFE          KB      LEA       T_KB(PC),A6             POINTER TO TASK FRAME
9 00000004 42A7                      CLR.L     -(A7)                   ALLOCATE LOCAL SCRATCH SPACE
                             *
                             * KEYBOARD TASK PROCESSING:
                             *
9 00000006 303C0100          KBLUP   MOVE      #F$KYBD,D0              WAIT FOR KEYBOARD
9 0000000A 4241                      CLR       D1                      NO TIMEOUT
9 0000000C                           XSVC      SUSPEN
                             *
                             * TURN OFF XMTMON IRP & SUSPEND IT SO IT WON'T TRY TO WRITE ON
                             * THE DISPLAY WHILE WE'RE IN HERE. ALSO, BLANK THE DISPLAY.
                             *
9 00000010 08B800070000              BCLR      #7,HOSTRAK              CLEAR IRP BIT IN TRACKING REGISTER
9 00000016 13FAFFE80000              MOVE.B    HOSTRAK(PC),HOSTACIA    & SHUT OFF RCVR IRP.
           0000
                             *
                             * BY CLEARING THE STATE FLAGS IN XMTMON & SHUTTING OFF HIS RCVR IRP,
                             * WE HAVE GUARANTEED THAT HE WILL NOT RUN AGAIN UNTIL THE NEXT CHAR.
                             * RECEIVED AFTER WE TURN THE RCVR IRP BACK ON.
                             *
9 0000001E 41FAFFE0                  LEA       T_XMON(PC),A0           NOW SUSPEND THE TASK.
9 00000022 4268000C                  CLR       TK$STF(A0)
                             *
9 00000026 700C                      MOVEQ     #FF,D0                  PUT FORMFEED IN D0
9 00000028 4EBAFFD6                  JSR       DISPCH(PC)              & DISPLAY IT (CLEAR SCREEN)
                             *
9 0000002C 102E001E                  MOVE.B    TK$RS0(A6),D0           GET KEY RECEIVED
9 00000030 6100011A                  BSR.L     XKEY                    TRANSLATE KEY
                             *
9 00000034 0C00000F                  CMP.B     #UPRQ,D0                UPLOAD REQUEST?
9 00000038 6602                      BNE       KB1
                             *
                             * CALL XMTCHR W/ UPLOAD REQUEST.
                             * (WE'LL IMPLEMENT THIS THING LATER)
                             *
9 0000003A 60CA                      BRA       KBLUP
                             *
9 0000003C 0C00000E          KB1     CMP.B     #ERLG,D0                EXAMINE ERROR LOG?
9 00000040 6658                      BNE       KB2
                             *
9 00000042 41FA016C                  LEA       LOGMSG(PC),A0           YES - PROMPT FOR LOG NUMBER
9 00000046 4EBAFFB8                  JSR       DISPLY(PC)
                             *
                             * NEXT KEY IS ERROR LOG TO BE EXAMINED.
                             *
9 0000004A 610000E8                  BSR.L     GETKEY                  WAIT FOR KEYBOARD OR 10 SECONDS
9 0000004E 6B0000B4                  BMI.L     KBERR                   TIMEOUT - CLEAR DISPLAY & START OVER
                             *
```

```
9 00000052 0C000033          CMP.B    #'3',D0              LOG NUMBER MUST BE BETWEEN 0 AND 3
9 00000056 620000AC          BHI.L    KBERR                ERROR - CLEAR SCREEN & RETRY
                      *
9 0000005A 0240000F          AND      #$F,D0               CONVERT TO BINARY
9 0000005E 3200              MOVE     D0,D1                & SAVE IN D1.
9 00000060 41FA00FC          LEA      MSGS(PC),A0
9 00000064 10300000          MOVE.B   (A0,D0),D0           GET OFFSET TO APPROPRIATE MESSAGE
9 00000068 41F00000          LEA      (A0,D0),A0           GET ADDRESS OF MESSAGE
9 0000006C 4EBAFF92          JSR      DISPLY(PC)           & DISPLAY ON SCREEN
9 00000070 41F900000000      LEA      RAMERR,A0
9 00000076 10301000          MOVE.B   (A0,D1),D0           RETRIEVE ERROR COUNT
9 0000007A 0280000000FF      AND.L    #$FF,D0              CLEAR 3 MSB'S
                      *
                      * GOT ERROR COUNT IN D0. CONVERT TO ASCII DECIMAL.
                      *
9 00000080 6100008E          BSR.L    BINASC               CONVERT TO DECIMAL
                      *
                      * WE NOW HAVE A 4 DIGIT ASCII DECIMAL NUMBER IN D0. SCRAP THE
                      * LEADING DIGIT (ALWAYS 0), PUT TERMINATOR ON THE MESSAGE,
                      * SAVE IN STACK, & DISPLAY IT.
                      *
9 00000084 E180              ASL.L    #8,D0                MAKE F00n FOR TERMINATOR
9 00000086 103C0004          MOVE.B   #EOT,D0
9 0000008A 2F00              MOVE.L   D0,-(A7)             SAVE ERROR COUNT ON STACK
9 0000008C 204F              MOVE.L   A7,A0
9 0000008E 4EBAFF70          JSR      DISPLY(PC)           & DISPLAY ERROR COUNT
9 00000092 4FEF0004          LEA      4(A7),A7             DEALLOCATE STACK SCRATCH SPACE
9 00000096 6000FF6E          BRA      KBLUP
                      *
9 0000009A 0C00000D   KB2    CMP.B    #PTMN,D0             POINT MONITOR?
9 0000009E 6664              BNE      KBERR                NO - INVALID KEY
9 000000A0 41FA0104          LEA      PTMSG(PC),A0
9 000000A4 4EBAFF5A          JSR      DISPLY(PC)           GIVE POINT MONITOR MESSAGE
9 000000A8 6100008A          BSR.L    GETKEY               WAIT FOR TIME OR KEY
9 000000AC 6B56              BMI      KBERR                TIMEOUT - START OVER
                      *
9 000000AE 0C00003A          CMP.B    #$3A,D0              SEE IF DECIMAL KEY > 9
9 000000B2 6250              BHI      KBERR                INVALID KEY
9 000000B4 1E80              MOVE.B   D0,TEMP(A7)          SAVE KEY IN STACK
9 000000B6 4EBAFF48          JSR      DISPCH(PC)           & DISPLAY IT
9 000000BA 6178              BSR      GETKEY               GET NEXT KEY
9 000000BC 6B46              BMI      KBERR                TIMEOUT - START OVER
                      *
9 000000BE 0C00003A          CMP.B    #$3A,D0              SEE IF DECIMAL KEY > 9
9 000000C2 6C40              BGE      KBERR                INVALID KEY
9 000000C4 0C000030          CMP.B    #$30,D0
9 000000C8 6D3A              BLT      KBERR                INVALID KEY
9 000000CA 4EBAFF34          JSR      DISPCH(PC)
9 000000CE 1F400001          MOVE.B   D0,TEMP+1(A7)        SAVE IN STACK
9 000000D2 0C573633          CMP      #'63',(A7)           VALID POINT NUMBER?
9 000000D6 6E2C              BGT      KBERR                NO - ERROR
                      *
                      * GOT A VALID POINT NUMBER. CONVERT FROM ASCII TO BINARY, DISPLAY A SPACE
                      * BEFORE THE VALUE OF THE POINT NUMBER, AND SAVE IN XMTMON'S TASK FRAME.
                      *
9 000000D8 41D7              LEA      TEMP(A7),A0          POINT TO ASCII POINT NUMBER
9 000000DA 4EBAFF24          JSR      FFPAFP(PC)           CONVERT TO FLOATING POINT
9 000000DE 4EBAFF20          JSR      FFPFPI(PC)           AND TO INTEGER.
9 000000E2 303C0020          MOVE     #$20,D0              SPACE FOR DISPCH
9 000000E6 4EBAFF18          JSR      DISPCH(PC)           DO IT
9 000000EA 41FAFF14          LEA      T_XMON(PC),A0        GET XMTMON'S TASK FRAME
9 000000EE 1147001E          MOVE.B   D7,TK$PSO(A0)        & SAVE POINT NUMBER THERE
9 000000F2 08F800070000      BSET     #7,HOSTRAK           TURN ON XMTMON IRP
9 000000F8 13FAFF060000      MOVE.B   HOSTRAK(PC),HOSTACIA
9 00000100 6000FF04          BRA      KBLUP
                      *
```

```
                             * SOME KIND OF ERROR - BLANK SCREEN & START OVER.
                             *
9 00000104 303C000C          KBEFR    MOVE     #FF,D0              DISPLAY FORM FEED TO BLANK DISPLAY
9 00000108 4EBAFEF6                   JSR      DISPCH(PC)          CLEAR DISPLAY
9 0000010C 6000FEF8                   BRA      KBLUP               & START OVER
                             *
                             *
                             * SUBROUTINES:
                             *
                             * BINASC - INCOMING 12 BITS IN D0. 4 ASCII
                             *          DECIMAL CHARS RETURNED IN D0.
                             *
                             * D0, D1, D2 DESTROYED.
                             *
9 00000110 028000000FFF BINASC   AND.L    #$FFF,D0            RESTRICT TO 12 BITS
9 00000116 2200                  MOVE.L   D0,D1               & SAVE IN D1
9 00000118 243C000003E8          MOVE.L   #1000,D2
                             *
9 0000011E 82C2          BINLUP   DIVU     D2,D1               CALC VALUE OF THIS DECADE
9 00000120 00010030               OR.B     #'0',D1             CONVERT TO ASCII
9 00000124 E180                   ASL.L    #8,D0               MAKE ROOM FOR DIGIT
9 00000126 1001                   MOVE.B   D1,D0               & PUT IT IN
9 00000128 4841                   SWAP     D1                  REMAINDER BECOMES NEW DIVISOR
9 0000012A 48C1                   EXT.L    D1
9 0000012C 84FC000A               DIVU     #10,D2              GET SET FOR NEXT DECADE
9 00000130 66EC                   BNE      BINLUP
9 00000132 4E75                   RTS                          DONE - RETURN
                             *
                             *
                             * GETKEY - WAIT FOR KEY OR TIMEOUT. IF KEY RECEIVED,
                             *          IT IS RETURNED IN D0. IF TIMEOUT, NEGATIVE
                             *          FLAG IS SET.
                             *
                             * IF NOT TIMEOUT, D0 HAS KEY. ALL OTHER REGISTERS DESTROYED.
                             *
9 00000134 303C0100      GETKEY   MOVE     #F$KYBD,D0          WAIT FOR TIME OR KEY
9 00000138 323C03E8               MOVE     #1000,D1            10 SECONDS
9 0000013C                        XSVC     SUSPEN
9 00000140 102E001E               MOVE.B   TK$RB0(A6),D0       GET KEY (IF ANY)
9 00000144 6106                   BSR      XKEY                TRANSLATE KEY
9 00000146 4A6E000C               TST      TK$STF(A6)          SET NEGATIVE FLAG IF TIMEOUT
9 0000014A 4E75                   RTS                          & RETURN
                             *
                             * XKEY - TRANSLATE THE VALUE IN D0, TO CORRESPOND TO THE FACE VALUE
                             *        ON THE KEYBOARD.
                             *
9 0000014C 2F08          XKEY     MOVE.L   A0,-(A7)            SAVE REG
9 0000014E 41FA0072               LEA      KEYTBL(PC),A0       TABLE ADDRESS
9 00000152 0240000F               AND      #$F,D0              CLEAR MSByte OF INPUT KEY
9 00000156 10300000               MOVE.B   (A0,D0),D0          GET KEY FROM XLATE TABLE
9 0000015A 205F                   MOVE.L   (A7)+,A0            RESTORE REG
9 0000015C 4E75                   RTS
                             *
                             * MESSAGES & TABLES:
                             *
9 0000015E 04            MSGS     DC.B     RAMSG-MSGS
9 0000015F 15                     DC.B     ROMSG-MSGS
9 00000160 26                     DC.B     RSMSG-MSGS
9 00000161 37                     DC.B     CPUMSG-MSGS
                             *
9 00000162 0C2020202052 RAMSG    DC.B     FF,'    RAM ERRORS',CR,EOT
                             *
9 00000173 0C2020202052 ROMSG    DC.B     FF,'    ROM ERRORS',CR,EOT
                             *
9 00000184 0C2020202052 RSMSG    DC.B     FF,'    RESTARTS  ',CR,EOT
                             *
```

```
9 00000195 0C2020202043 CPUMSG   DC.B    FF,'    CPU ERRORS',CR,EOT
                        *
9 000001A6 0C504F494E54 PTMSG    DC.B    FF,'POINT # ',EOT
                        *
9 000001B0 0C4552524F52 LOGMSG   DC.B    FF,'ERROR TYPE (0-3)',EOT
                        *
                        *
                        * KEYBOARD ASCII TRANSLATION TABLE:
                        *
9 000001C2 31           KEYTBL   DC.B    '1'                 KEY POSITION  0
9 000001C3 32                    DC.B    '2'                 KEY POSITION  1
9 000001C4 33                    DC.B    '3'                 KEY POSITION  2
9 000001C5 7F                    DC.B    $7F                 KEY POSITION  3
9 000001C6 34                    DC.B    '4'                 KEY POSITION  4
9 000001C7 35                    DC.B    '5'                 KEY POSITION  5
9 000001C8 36                    DC.B    '6'                 KEY POSITION  6
9 000001C9 7F                    DC.B    $7F                 KEY POSITION  7
9 000001CA 37                    DC.B    '7'                 KEY POSITION  8
9 000001CB 38                    DC.B    '8'                 KEY POSITION  9
9 000001CC 39                    DC.B    '9'                 KEY POSITION  10
9 000001CD 7F                    DC.B    $7F                 KEY POSITION  11
9 000001CE 30                    DC.B    '0'                 KEY POSITION  12
9 000001CF 0F                    DC.B    $F                  KEY POSITION  13  = FUNCTION FOR UPLOAD
9 000001D0 0E                    DC.B    $E                  KEY POSITION  14  = FUNCTION FOR ERROR LOG
9 000001D1 0D                    DC.B    $D                  KEY POSITION  15  = FUNCTION FOR FT.MONITOR
                        *
                                 END

***** TOTAL ERRORS     0--
****** TOTAL WARNINGS  0--
```

SYMBOL TABLE LISTING

| SYMBOL NAME | SECT | VALUE | SYMBOL NAME | SECT | VALUE |
|---|---|---|---|---|---|
| .1SEC | | 0000000A | F$XMIT | | 00000200 |
| .AIQSIZ | | 00000038 | FF | | 0000000C |
| .AOQSIZ | | 00000038 | FFPAFP | XREF 9 | 00000000 |
| .COSINE | | 00000014 | FFPFPI | XREF 9 | 00000000 |
| .DIQSIZ | | 0000001C | GETKEY | 9 | 00000134 |
| .EFFECT | | 0000001C | HOSTACIA | XREF * | 00000000 |
| .HIQSIZ | | 000000C8 | HOSTRAK | XREF 5 | 00000000 |
| .HOQSIZ | | 00000180 | HT | | 00000009 |
| .ICOS | | 0000000A | IPTENT$ | | 00000014 |
| .IEFF | | 00000018 | KB | XDEF 9 | 00000000 |
| .ISCALE | | 00000006 | KB1 | 9 | 0000003C |
| .ISIN | | 0000000E | KB2 | 9 | 0000009A |
| .KKH | | 00000024 | KBERR | 9 | 00000104 |
| .PIQSIZ | | 0000003F | KBLUP | 9 | 00000006 |
| .RBFSIZ | | 00000400 | KEYTBL | 9 | 000001C2 |
| .SAMPLE | | 00000002 | LOGMSG | 9 | 000001B0 |
| .SCALE1 | | 00000004 | MAXAGE | | 00000004 |
| .SCALE2 | | 00000008 | MSG3 | 9 | 0000015E |
| .SCALE3 | | 0000000C | NEXTSK | | 00000030 |
| .SCALE4 | | 00000010 | ONESEC | | 00030090 |
| .SINE | | 00000018 | ONETIK | | 000009C4 |
| .SPNJP | MACR * | | OPTENT$ | | 00000004 |
| .STEMP | | 0000001C | PAAR | | 00000014 |
| .TEMP | | 00000012 | PACR | | 0000000C |
| .TOFSET | | 0000000E | PADDR | | 00000004 |
| .TSCALE | | 0000000A | PADR | | 00000010 |
| .VCOS | | 00000002 | PBAR | | 00000016 |
| .VEFF | | 00000014 | PBCR | | 0000000E |
| .VSCALE | | 00000002 | PBDDR | | 00000006 |

| | | | | | | | |
|---|---|---|---|---|---|---|---|
| .VSIN | | | 00000006 | PEDR | | | 00000012 |
| .WATTS | | | 00000020 | PCDDR | | | 00000008 |
| .WATTSEC | | | 00000022 | PCDR | | | 00000018 |
| AIBENT$ | | | 00000026 | PGCR | | | 00000000 |
| BINASC | XDEF | 9 | 00000110 | PIVR | | | 0000000A |
| BINLUP | | 9 | 0000011E | PROM | | | 00000009 |
| CHGENT | | | 00000034 | PSR | | | 0000001A |
| CNTR | | | 0000002E | PSRR | | | 00000002 |
| CPR | | | 00000024 | PTMN | | | 0000000D |
| CPUMSG | | 9 | 00000195 | PTMSG | | 9 | 000001A6 |
| CR | | | 0000000D | PULL | MACR | * | |
| CTRL13 | | | 00000000 | PUSH | MACR | * | |
| CTRL2 | | | 00000002 | RAM | | | 00000005 |
| DEVINI | | | 00000014 | RAMERR | XREF | * | 00000000 |
| DI$DEV | | | 0000000A | RAMSG | | 9 | 00000162 |
| DI$EVF | | | 00000000 | RDYALL | | | 00000008 |
| DI$IOM | | | 0000001B | READY | | | 00000004 |
| DI$ISV | | | 00000006 | RELEAS | | | 0000002C |
| DI$LNK | | | 00000016 | RESERV | | | 00000028 |
| DI$OWN | | | 00000002 | RESTRT | | | 0000003C |
| DI$PTR | | | 00000012 | ROMSG | | 9 | 00000173 |
| DI$QUE | | | 0000000E | RSMSG | | 9 | 00000184 |
| DI$RSV | | | 0000001A | S60 | | | 0000190F |
| DI$SIZ | | | 00000020 | SAV$ | | | 0000002A |
| DI$STA | | | 0000001C | SPACE | | | 00000020 |
| DI$USR | | | 0000001E | STX | | | 00000002 |
| DIBENT$ | | | 00000026 | SUSPEN | | | 0000000C |
| DISPCH | XREF | 9 | 00000000 | TCR | | | 00000020 |
| DISPLY | XREF | 9 | 00000000 | TEMP | | | 00000000 |
| DSFTENT$ | | | 00000010 | TIMR1 | | | 00000004 |
| EEPROM | | | 00000007 | TIMR2 | | | 00000008 |
| EOT | | | 00000004 | TIMR3 | | | 0000000C |
| EQS | MACR | * | | TIVR | | | 00000022 |
| ERLG | | | 0000000E | TK$CON | | | 00000012 |
| ETX | | | 00000003 | TK$ENT | | | 00000004 |
| EX$DV0 | | | 0000000A | TK$ID | | | 00000000 |
| EX$DV1 | | | 0000000E | TK$LPT | | | 00000016 |
| EX$DV2 | | | 00000012 | TK$NXT | | | 0000001A |
| EX$DV3 | | | 00000016 | TK$RSO | | | 0000001E |
| EX$DV4 | | | 0000001A | TK$SIZ | | | 00000022 |
| EX$DV5 | | | 0000001E | TK$SSP | | | 00000008 |
| EX$DV6 | | | 00000022 | TK$STF | | | 0000000C |
| EX$DV7 | | | 00000026 | TK$STM | | | 0000000E |
| EX$NXT | | | 00000006 | TK$TIM | | | 00000010 |
| EX$SIZ | | | 0000002A | TSKEND | | | 00000038 |
| EX$TIM | | | 00000000 | TSKINI | | | 00000010 |
| EX$TSK | | | 00000002 | TSR | | | 00000034 |
| EXEC | | | 00000000 | T_KB | XREF | 5 | 00000000 |
| F$ASMPL | | | 00004000 | T_XMON | XREF | 5 | 00000000 |
| F$ONUT | | | 00000400 | UPRO | | | 0000000F |
| F$EEPM | | | 00000040 | WAIT | | | 0000001C |
| F$KYBD | | | 00000100 | WAITCN | | | 00000020 |
| F$MON | | | 00000080 | WAITLP | | | 00000024 |
| F$OST | | | 00001000 | WAKEUP | | | 00000018 |
| F$PDI | | | 00000800 | XKEY | | 9 | 0000014C |
| F$PROC | | | 00002000 | XSVC | MACR | * | |

```
         KBIRP   IDNT    0,7          Keyboard Interrupt Service 1/20/83
                 OPT     FCS,BRS
         *
         *
         * SUBROUTINE:   KBIRP
         *
         * REVISED:      1/20/83
         *
         * AUTHOR:       D. A. ZEICHNER
         *
```

```
                         * PURPOSE:      When a key is struck, retrieve it and save in the reserved
                         *               area of the task frame. In this way, we are allowing for
                         *               the buffering of only one character.
                         *
                         * INPUTS:       None.
                         *
                         * OUTPUTS:      New key in TK$RS0 of KB'S task frame.
                         *               All registers preserved.
                         *
                         * EXTERNAL REFERENCES/DEFINITIONS:
                         *
                                 XDEF    KBIRP
                         *
                         * HARDWARE REFERENCES:
                         *
                                 XREF    KEYBRD
                         *
                         * RAM REFERENCES:
                         *
                                 XREF.S  5:T_KB
                         *
           00000009              SECTION PROM
                         *
 9 00000000              KBIRP   PUSH    A0/D0                  SAVE REGISTERS
 9 00000004 41FAFFFA             LEA     T_KB(PC),A0            POINT TO TASK FRAME
 9 00000008 117900000000         MOVE.B  KEYBRD,TK$RS0(A0)      GET KEY
           001E
 9 00000010 0228000F001E         AND.B   #$F,TK$RS0(A0)         MASK OUT MS NIBBLE
 9 00000016 303C0100             MOVE    #F$KYBD,D0             GET WAKEUP FLAGS, AND
 9 0000001A                      XSVC    READY                  WAKE UP KEYBOARD TASK
 9 0000001E                      PULL    A0/D0                  RESTORE REGISTERS
 9 00000022 4E73                 RTE
                         *
                         *
                                 END
```

xxxxxx TOTAL ERRORS 0--
xxxxxx TOTAL WARNINGS 0--

SYMBOL TABLE LISTING

| SYMBOL NAME | SECT | VALUE | SYMBOL NAME | | SECT | VALUE |
|---|---|---|---|---|---|---|
| .1SEC | | 0000000A | F$ASMPL | | | 00004000 |
| .AIQSIZ | | 00000038 | F$DNUT | | | 00000400 |
| .AOQSIZ | | 00000038 | F$KYBD | | | 00000100 |
| .COSINE | | 00000014 | F$MON | | | 00000080 |
| .DIQSIZ | | 0000001C | F$OST | | | 00001000 |
| .EFFECT | | 0000001C | F$PDI | | | 00000800 |
| .HIQSIZ | | 00000010 | F$PROC | | | 00002000 |
| .HOQSIZ | | 00000150 | F$XMIT | | | 00000200 |
| .ICOS | | 0000000A | FF | | | 0000000C |
| .IEFF | | 00000018 | HT | | | 00000009 |
| .ISCALE | | 00000006 | IPTENT$ | | | 00000014 |
| .ISIN | | 0000000E | KBIRP | XDEF | 9 | 00000000 |
| .KWH | | 00000024 | KEYBRD | XREF | x | 00000000 |
| .PIQSIZ | | 0000003F | MAXAGE | | | 00000004 |
| .RBFSIZ | | 00000400 | NEXTSK | | | 00000030 |
| .SAMPLE | | 00000002 | ONESEC | | | 00030090 |
| .SCALE1 | | 00000004 | ONETIK | | | 000009C4 |
| .SCALE2 | | 00000008 | OPTENT$ | | | 00000004 |
| .SCALE3 | | 0000000C | PAAR | | | 00000014 |
| .SCALE4 | | 00000010 | PACR | | | 0000000C |
| .SINE | | 00000018 | PADDR | | | 00000004 |

```
.SPNUP     MACR  x              PADR                 00000010
.STEMP               0000001C   PBAR                 00000016
.TEMP                00000012   PBCR                 0000000E
.TOFSET              0000000E   PBDDR                00000006
.TSCALE              0000000A   PBDR                 00000012
.VCOS                00000002   PCDDR                00000008
.VEFF                00000014   PCDR                 00000018
.VSCALE              00000002   PGCR                 00000000
.VSIN                00000006   PIVR                 0000000A
.WATTS               00000020   PROM                 00000009
.WATTSEC             00000022   PSR                  0000001A
AIBENT$              00000026   PSRR                 00000002
CHGENT               00000034   PULL       MACR  x
CNTR                 0000002E   PUSH       MACR  x
CPR                  00000024   RAM                  00000005
CR                   0000000D   RDYALL               00000008
DEVINI               00000014   READY                00000004
DI$DEV               0000000A   RELEAS               0000002C
DI$EVF               00000000   RESERV               00000028
DI$IOM               0000001E   RESTRT               0000003C
DI$ISV               00000006   S60                  0000370F
DI$LNK               00000016   SAV$                 0000002A
DI$OWN               00000002   SPACE                00000020
DI$PTR               00000012   STX                  00000002
DI$QUE               0000000E   SUSPEN               0000000C
DI$RSO               0000001A   TCR                  00000020
DI$SIZ               00000020   TIVR                 00000022
DI$STA               0000001C   TK$CON               00000012
DI$USR               0000001E   TK$ENT               00000004
DIBENT$              00000026   TK$ID                00000000
DSFTENT$             00000010   TK$LFT               00000016
EEPROM               00000007   TK$NXT               0000001A
EOT                  00000004   TK$RSO               0000001E
EOS        MACR  x              TK$SIZ               00000022
ETX                  00000003   TK$SSP               00000008
EX$DV0               0000000A   TK$STF               0000000C
EX$DV1               0000000E   TK$STM               0000000E
EX$DV2               00000012   TK$TIM               00000010
EX$DV3               00000016   TSKEND               00000038
EX$DV4               0000001A   TSKINI               00000010
EX$DV5               0000001E   TSR                  00000034
EX$DV6               00000022   T_KB       XREF  5   00000000
EX$DV7               00000026   WAIT                 0000001C
EX$NXT               00000006   WAITCH               00000020
EX$SIZ               0000002A   WAITLP               00000024
EX$TIM               00000000   WAKEUP               00000018
EX$TSK               00000002   XSVC       MACR  x
EXEC                 00000000
```

```
OFFLOD   IDNT     0,3                        RTI Auxiliary line monitor task  3/09/83
         OPT      FCS,BRS
*
*
* SUBROUTINE:     OFFLOD
*
* REVISED:        3/09/83
*
* AUTHOR:         D. A. ZEICHNER
*
* PURPOSE:        Monitor the programming I/O port, and switch to the
*                 function requested.
*
* INPUTS:         None.
*
* OUTPUTS:        None.
*
```

```
                          * EXTERNAL REFERENCES/DEFINITIONS:
                          *
                                  XDEF     OFFLOD
                                  XDEF     ACKMSG
                                  XDEF     NAKMSG
                          *
                          * RAM REFERENCES:
                          *
                                  XREF.S   5:AUXIQ$
                          *
                          * EPROM (PSCT) REFERENCES:
                          *
                                  XREF.S   9:DEQUE
                                  XREF.S   9:DNLOAD
                                  XREF.S   9:QUEINI
                                  XREF.S   9:RCVCHR
                                  XREF.S   9:UPLOAD
                                  XREF.S   9:XMTMSG
                          *
                          * LOCAL ASSIGNMENTS:
                          *
             00000003     ID      EQU      3                 TABLE ID.
             00000000     BCT     EQU      0                 Message byte count
                          *
                          *
             00000009             SECTION  PROM
                          *
 9 00000000 42A7          OFFLOD  CLR.L    -(A7)             Message work space
                          *
 9 00000002 41FA003E      OFFBEGN LEA      ACKMSG(PC),A0
 9 00000006 4EBAFFF8              JSR      XMTMSG(PC)        Xmit ACK msg to show we're ok
                          *
 9           0000000A     OFFLUP  EQU      *                 OFFLOD task loop
 9 0000000A 303C0B00              MOVE     #F$PDI,D0
 9 0000000E 4241                  CLR      D1
 9 00000010                       XSVC     SUSPEN            Wait until character is received
                          *
 9 00000014 41FAFFEA              LEA      AUXIQ$(PC),A0
 9 00000018 4EBAFFE6              JSR      DEQUE(PC)         Get character from input queue
 9 0000001C 0C000002              CMP.B    #STX,D0           Was it an STX?
 9 00000020 6658                  BNE      OFFERR            No - give NAK msg & wait for next msg
 9 00000022 4EBAFFDC              JSR      RCVCHR(PC)        Wait for character
 9 00000026 6552                  BCS      OFFERR            Timeout - send NAK & start over
                          *
 9 00000028 0C000044              CMP.B    #'D',D0           Is incoming character 'D'?
 9 0000002C 6608                  BNE      OFF1
 9 0000002E 4EBAFFD0              JSR      DNLOAD(PC)        Yes - download following table
 9 00000032 6546                  BCS      OFFERR            Error in download - send NAK msg
 9 00000034 60CC                  BRA      OFFBEGN           Send ACK & wait for next msg
                          *
 9 00000036 0C000030      OFF1    CMP.B    #'0',D0           Is incoming character 0 - 3?
 9 0000003A 6D36                  BLT      OFF2
 9 0000003C 0C000033              CMP.B    #'3',D0
 9 00000040 6E30                  BGT      OFF2
                          *                              Validate message
 9 00000042 3F400003              MOVE     D0,ID(A7)          Save table ID.
 9 00000046 4EBAFFB8              JSR      RCVCHR(PC)         Get byte count (msb)
 9 0000004A 652E                  BCS      OFFERR
 9 0000004C 1E80                  MOVE.B   D0,BCT(A7)
 9 0000004E 4EBAFFB0              JSR      RCVCHR(PC)
 9 00000052 6526                  BCS      OFFERR
 9 00000054 1F400001              MOVE.B   D0,BCT+1(A7)
 9 00000058 5357                  SUB      #1,BCT(A7)
 9 0000005A 6B1E                  BMI      OFFERR             Byte count does not match up
                          *
 9 0000005C 4EBAFFA2      RCVLUP  JSR      RCVCHR(PC)
```

```
9 00000060 6518               BCS     OFFERR
9 00000062 5357               SUB     #1,BCT(A7)
9 00000064 6AF6               BPL     RCVLUP
9 00000066 0C000003           CMP.B   #ETX,D0          End of message ?
9 0000006A 660E               BNE     OFFERR
                       *
9 0000006C 4EBAFF92           JSR     UPLOAD(PC)       Yes - upload selected table;
9 00000070 6092               BRA     OFFLUP           Wait for next msg
                       *
9 00000072 0C000052    OFF2   CMP.B   #'R',D0          Is incoming character 'R'?
9 00000076 6602               BNE     OFFERR           No - send NAK & start over
                       *
                       * We have a request for a restart here.
                       * What we would like to do is a RESET,
                       * Reinitialize the PC & SSP as per power up,
                       * & jump back to init. To do this, we need
                       * a special trap to get us into the supervisor
                       * state.  TRAP #14 will restart the system.
                       *
9 00000078 4E4E               TRAP    #14              Set trap 14 to point to following code
                       *
9 0000007A 41FAFF84    OFFERR LEA     AUXIQ$(PC),A0
9 0000007E 303C0038           MOVE    #.AIQSIZ,D0
9 00000082 4EBAFF7C           JSR     QUEINI(PC)       Reinitialize (clear) input queue
                       *
9 00000086 41FA0010           LEA     NAKMSG(PC),A0
9 0000008A 4EBAFF74           JSR     XMTMSG(PC)       Send NAK msg
9 0000008E 6000FF7A           BRA     OFFLUP           & start over
                       *
                       *
                       * MESSAGES:
                       *
9 00000092 050221000103 ACKMSG DC.B   5,STX,'!',0,1,ETX
                       *
9 00000098 05023F000103 NAKMSG DC.B   5,STX,'?',0,1,ETX
                       *
                       *
                              END

****** TOTAL ERRORS      0--
****** TOTAL WARNINGS    0--
```

SYMBOL TABLE LISTING

| SYMBOL NAME | SECT | VALUE | SYMBOL NAME | | SECT | VALUE |
|---|---|---|---|---|---|---|
| .1SEC | | 0000000A | F$KYBD | | | 00000100 |
| .AIQSIZ | | 00000038 | F$MDN | | | 00000080 |
| .AOQSIZ | | 00000038 | F$OST | | | 00001000 |
| .COSINE | | 00000014 | F$PDI | | | 00000800 |
| .DIQSIZ | | 0000001C | F$PROC | | | 00002000 |
| .EFFECT | | 0000001C | F$XMIT | | | 00000200 |
| .HIQSIZ | | 000000C8 | FF | | | 0000000C |
| .HOQSIZ | | 00000180 | HT | | | 00000009 |
| .ICOS | | 0000000A | ID | | | 00000003 |
| .IEFF | | 00000018 | IPTENT* | | | 00000014 |
| .ISCALE | | 00000006 | MAXAGE | | | 00000004 |
| .ISIN | | 0000000E | NAKMSG | XDEF | 9 | 00000098 |
| .KWH | | 00000024 | NEXTSK | | | 00000030 |
| .PIQSIZ | | 0000003F | OFF1 | | 9 | 00000036 |
| .RBFSIZ | | 00000400 | OFF2 | | 9 | 00000072 |
| .SAMPLE | | 00000002 | OFFBEGN | | 9 | 00000002 |
| .SCALE1 | | 00000004 | OFFERR | | 9 | 0000007A |
| .SCALE2 | | 00000008 | OFFLOD | XDEF | 9 | 00000000 |
| .SCALE3 | | 0000000C | OFFLUP | | 9 | 0000000A |

| | | | | | | | |
|---|---|---|---|---|---|---|---|
| .SCALE4 | | | 00000010 | ONESEC | | | 0003D090 |
| .SINE | | | 00000018 | ONETIK | | | 000009C4 |
| .SFNJP | MACR | * | | OPTENT$ | | | 00000004 |
| .STEMP | | | 0000001C | PAAR | | | 00000014 |
| .TEMP | | | 00000012 | PACR | | | 0000000C |
| .TOFSET | | | 0000000E | PADDR | | | 00000004 |
| .TSCALE | | | 0000000A | PADR | | | 00000010 |
| .VCOS | | | 00000002 | PBAR | | | 00000016 |
| .VEFF | | | 00000014 | PBCR | | | 0000000E |
| .VSCALE | | | 00000002 | PBDDR | | | 00000006 |
| .VSIN | | | 00000006 | PBDR | | | 00000012 |
| .WATTS | | | 00000020 | PCDDR | | | 00000008 |
| .WATTSEC | | | 00000022 | PCDR | | | 00000018 |
| ACKMSG | XDEF | 9 | 00000092 | PGCR | | | 00000000 |
| AIBENT$ | | | 00000026 | PIVR | | | 0000000A |
| AUXIO$ | XREF | 5 | 00000000 | PROM | | | 00000009 |
| BCT | | | 00000000 | PSR | | | 0000001A |
| CHGENT | | | 00000034 | PSRR | | | 00000002 |
| CNTR | | | 0000002E | PULL | MACR | * | |
| CPR | | | 00000024 | PUSH | MACR | * | |
| CR | | | 0000000D | QUEINI | XREF | 9 | 00000000 |
| CTRL13 | | | 00000000 | RAM | | | 00000005 |
| CTRL2 | | | 00000002 | RCVCHR | XREF | 9 | 00000000 |
| DEQUE | XREF | 9 | 00000000 | RCVLUP | | 9 | 0000005C |
| DEVINI | | | 00000014 | RDYALL | | | 00000008 |
| DI$DEV | | | 0000000A | READY | | | 00000004 |
| DI$EVF | | | 00000000 | RELEAS | | | 0000002C |
| DI$IOM | | | 00000018 | RESERV | | | 00000028 |
| DI$ISV | | | 00000006 | RESTRT | | | 0000003C |
| DI$LNK | | | 00000016 | S60 | | | 000039DF |
| DI$OWN | | | 00000002 | SAV$ | | | 0000002A |
| DI$PTR | | | 00000012 | SPACE | | | 00000020 |
| DI$QUF | | | 0000000E | STX | | | 00000002 |
| DI$RSO | | | 0000001A | SUSPEN | | | 0000000C |
| DI$SIZ | | | 00000020 | TCR | | | 00000020 |
| DI$STA | | | 0000001C | TIMR1 | | | 00000004 |
| DI$USR | | | 0000001E | TIMR2 | | | 00000008 |
| DIBENT$ | | | 00000026 | TIMR3 | | | 0000000C |
| DNLOAD | XREF | 9 | 00000000 | TIVR | | | 00000022 |
| DSFTENT$ | | | 00000010 | TK$CON | | | 00000012 |
| EEPROM | | | 00000007 | TK$ENT | | | 00000004 |
| EOT | | | 00000004 | TK$ID | | | 00000000 |
| EOS | MACR | * | | TK$LPT | | | 00000016 |
| ETX | | | 00000003 | TK$NXT | | | 0000001A |
| EX$DV0 | | | 0000000A | TK$RSG | | | 0000001E |
| EX$DV1 | | | 0000000E | TK$SIZ | | | 00000022 |
| EX$DV2 | | | 00000012 | TK$SSF | | | 00000008 |
| EX$DV3 | | | 00000016 | TK$STF | | | 0000000C |
| EX$DV4 | | | 0000001A | TK$STM | | | 0000000E |
| EX$DV5 | | | 0000001E | TK$TIM | | | 00000010 |
| EX$DV6 | | | 00000022 | TSKEND | | | 00000038 |
| EX$DV7 | | | 00000026 | TSKINI | | | 00000010 |
| EX$NXT | | | 00000006 | TSR | | | 00000034 |
| EX$SIZ | | | 0000002A | UPLOAD | XREF | 9 | 00000000 |
| EX$TIM | | | 00000000 | WAIT | | | 0000001C |
| EX$TSK | | | 00000002 | WAITCH | | | 00000020 |
| EXEC | | | 00000000 | WAITLP | | | 00000024 |
| F$ASMFL | | | 00004000 | WAKEUP | | | 00000018 |
| F$DNUT | | | 00000400 | XMTMSG | XREF | 9 | 00000000 |
| F$EEPM | | | 00000040 | XSVC | MACR | * | |

```
OUTPUT   IDNT   0,11          Output value calculation task  3/10/83
         OPT    FCS,BRS
*
*
* SUBROUTINE:   OUTPUT
```

```
                         *
                         * REVISED:      3/10/83
                         *
                         * AUTHOR:       D. A. ZEICHNER
                         *
                         * PURPOSE:      TASK TO CALCULATE OUTPUT VALUES AS DICTATED BY THE
                         *               OUTPUT PERSONALITY TABLE.
                         *
                         * INPUTS:       N/A
                         *
                         * OUTPUTS:      N/A
                         *
                         * OUTPUT RESERVES 2 BYTES OF STACK SPACE FOR LOCAL DATA.
                         *
                         * EXTERNAL REFERENCES/DEFINITIONS:
                         *
                                XDEF     OUTPUT
                         *
                         * HARDWARE REFERENCES:
                         *
                                XREF     HOSTACIA
                         *
                         * RAM REFERENCES:
                         *
                                XREF.S   5:AIB$
                                XREF.S   5:CSM$
                                XREF.S   5:DIB$
                                XREF.S   5:HOSTRAK
                                XREF.S   5:HSTOO$
                                XREF.S   5:T_ANALOG
                                XREF.S   5:T_OUTPUT
                         *
                         * EEPROM REFERENCES:
                         *
                                XREF     OPT$
                         *
                         * PROM REFERENCES:
                         *
                                XREF.S   9:BUFFDY
                                XREF.S   9:ENQUE
                                XREF.S   9:OUTVAL
                         *
                         * LOCAL ASSIGNMENTS:
                         *
            00000000     OUTPTR  EQU      0                  STACK OFFSET TO OPT POINTER
            00000100     OPTEND  EQU      256                OFFSET TO END OF OUTPUT PERSONALITY TABLE
                         *
                         *
            00000009             SECTION  PROM
                         *
  9 00000000 487900000000 OUTPUT PEA      OPT$
  9 00000006 4DFAFFF8            LEA      T_OUTPUT(PC),A6    GET TASK FRAME
  9 0000000A 3D7C00630010        MOVE     #99,TK$TIM(A6)     SET TASK TIMER TO 1 SEC. (-1 TICK)
                         *
  9 00000010 2057        OUTLUP  MOVE.L   OUTPTR(A7),A0      GET OPT POINTER
  9 00000012 3010                MOVE     (A0),D0            GET OPT ENTRY
  9 00000014 EC48                LSR      #6,D0              ISOLATE VOLTAGE INPUT #
  9 00000016 0240003F            AND      #$3F,D0
  9 0000001A 0C40003F            CMP      #$3F,D0            IS THIS ENTRY VALID?
  9 0000001E 673C                BEQ      NXTENT             NO - SKIP IT
                         *
  9 00000020 4EBAFFDE            JSR      BUFFDY(PC)         ARE APPROPRIATE BUFFERS READY?
  9 00000024 6406                BCC      BUFOK              YES - GO CALCULATE OUTPUT VALUE
  9 00000026                     XSVC     EXEC               NO - LET SOMEONE ELSE RUN
  9 0000002A 60E4                BRA      OUTLUP
                         *
```

```
9 0000002C 4EBAFFD2    BUFOK   JSR     OUTVAL(PC)
                       *
9 00000030 41FAFFCE            LEA     HSTOO$(PC),A0       GET ADDRESS OF OUTPUT QUEUE
                       *
9 00000034 610000EA            BSR.L   QBYTE               PUT 1ST BYTE ON QUEUE
9 00000038 3001                MOVE    D1,D0
9 0000003A 610000E4            BSR.L   QBYTE               PUT 2ND BYTE ON QUEUE
9 0000003E 3002                MOVE    D2,D0
9 00000040 610000DE            BSR.L   QBYTE               PUT LAST BYTE ON QUEUE
                       *
                       * SEE IF THIS ENTRY INVOLVED DONUTS. IF SO, BUMP THEIR AGES,
                       * AND IF ANY IS TOO OLD, CLEAR ITS DATA TO ZERO.
                       *
9 00000044 2057                MOVE.L  OUTPTR(A7),A0       GET OPT POINTER
9 00000046 08100004            BTST    #4,(A0)             DONUT BIT SET?
9 0000004A 6710                BEQ     NXTENT              NO - GO TO NEXT
                       *
                       * WE'VE GOT DONUTS. GET DONUT ID FROM OPT ENTRY, CALCULATE
                       * ADDRESS OF BUFFER & CHECK ITS AGE. DO THE SAME FOR THE
                       * TWO BUFFERS IMMEDIATELY FOLLOWING, ALSO.
                       *
9 0000004C 3010                MOVE    (A0),D0             GET DONUT ID
9 0000004E EC40                ASR     #6,D0               RIGHT JUSTIFY
9 00000050 0240000F            AND     #$F,D0              MASK OUT SPURIOUS BITS
9 00000054 C0FC0026            MULU    #DIBENT$,D0         CALCULATE OFFSET TO 1ST BUFFER OF TRIAD
9 00000058 45FAFFA6            LEA     DIB$(PC),A2         POINT TO DONUT BUFFERS
                       *
9 0000005C 5897        NXTENT  ADDQ.L  #4,OUTPTR(A7)       BUMP POINTER TO NEXT ENTRY
9 0000005E 0C9700000100        CMP.L   #OPT$+OPTEND,OUTPTR(A7) END OF TABLE?
9 00000064 6DAA                BLT     OUTLUP              NO - DO NEXT ENTRY
                       *
                       * All entries done. Set our startup mask (TK$STM) to $8000,
                       * clear out the state flags (TK$STF), and call EXEC. This
                       * will suspend us until our clock times out. Calling SUSPEN
                       * would alter the value of the clock, and we're interested in
                       * waiting for the remaining time left on the clock.
                       *
9 00000066 307C8000000E        MOVE    #$8000,TK$STM(A6)   STARTUP ON TIMEOUT ONLY
9 0000006C 426E000C            CLR     TK$STF(A6)          MAKE SURE WE'RE SUSPENDED
9 00000070 526E0010            ADDQ    #1,TK$TIM(A6)       & WE HAVE AT LEAST 1 TICK TO WAIT
9 00000074                     XSVC    EXEC
                       *
                       * The one second tick has arrived. Reset our task clock to one
                       * second, start up the transmitter, reset the AC & VP flags for
                       * all buffers, wait for the transmitter buffer to be empty, and
                       * start at the top of the Output Personality Table again.
                       *
9 00000078 307C00630010        MOVE    #99,TK$TIM(A6)      RESET TIMEOUT CLOCK TO 1 SEC. (-1 TICK)
9 0000007E 41FAFF80            LEA     HOSTRAK(PC),A0      GET POINTER TO TRACKING REGISTER
9 00000082 00100020            OR.B    #$20,(A0)           TURN ON XMIT IRP
9 00000086 13D000000000        MOVE.B  (A0),HOSTACIA
                       *
                       * CLEAR AC & VP FLAGS IN DONUT BUFFERS 1 - 15 AND ALL ANALOG BUFFERS.
                       * ALSO BUMP AGES OF THESE DONUT BUFFERS, AND ZERO OUT ANY TOO OLD.
                       *
                       * NOTE: BUFFERS WHOSE DATA AREAS ARE ZEROED OUT HAVE THEIR AGES SET
                       *         TO $F. THIS ALLOWS US TO TEST FOR UNUSED DONUT BUFFERS. IF
                       *         A BUFFER HAS ITS AGE = $1F, NO ONE HAS ACCESSED IT SINCE
                       *         THE LAST TIME IT WAS ZEROED OUT. IN THIS CASE, THERE IS NO
                       *         POINT IN BUMPING ITS AGE & HAVING TO ZERO IT OUT AGAIN
                       *         SOMEDAY. (WE'LL HOLD OFF THE AGING PROCESS UNTIL THE DONUT
                       *         TASK RECEIVES SOME STUFF FOR IT & SETS THE AGE TO ZERO)
                       *
                       * WARNING: THE ABOVE MEANS THAT MAXAGE MAY NOT EXCEED $1E!!!!!
                       *
9 0000008C 41FAFF72            LEA     DIB$(PC),A0         POINT TO DIGITAL INPUT BUFFERS
```

```
                               *
                                     FOR      D0 = #DIBENT$ TO #DIBENT$*15 BY #DIBENT$ DO
  9 00000096                   Z_L1.001
9 00000096 32300000                    MOVE     (A0,D0),D1
9 0000009A 0241001F                    AND      #$1F,D1              ISOLATE BUFFER AGE
9 0000009E 0C41001F                    CMP      #$1F,D1              UNUSED BUFFER?
9 000000A2 6722                        BEQ      NXTBUF               YES - DON'T BOTHER WITH AGE
                               *
                                       IF       D1 <GE> #MAXAGE THEN BUFFER IS TOO OLD - ZERO OUT DATA
9 000000AA 43F00002                      LEA    2(A0,D0),A1          CALC START ADR OF DATA
9 000000AE 343C0021                      MOVE   #33,D2               # OF BYTES TO CLEAR (-1)
                               *
9 000000B2 42312000            CLRLUP    CLR.B  (A1,D2)
9 000000B6 51CAFFFA                      DBRA   D2,CLRLUP
9 000000BA 0030001F0001                  OR.B   #$1F,1(A0,D0)        SET AGE TO $1F (MARK AS UNUSED)
                                       ELSE                          JUST BUMP BUFFER AGE
  9 000000C2                   Z_L1.002
9 000000C2 52700000                      ADDQ   #1,(A0,D0)
                                       ENDI
  9 000000C6                   Z_L2.004
                               *
9 000000C6 02709FFF0000        NXTBUF  AND      #$9FFF,(A0,D0)       RESET AC & VP FLAGS
                                     ENDF
                               *
9 000000D6 41FAFF28                  LEA      AIB$(PC),A0          POINT TO ANALOG INPUT BUFFERS
                                     FOR      D0 = #0 TO #AIBENT$*47 BY #AIBENT$ DO
  9 000000E0                   Z_L1.006
9 000000E0 02709FFF0000                AND      #$9FFF,(A0,D0)       RESET AC & VP FLAGS
                                     ENDF
                               *
9 000000F0 2EBC00000000              MOVE.L   #OPT$,OUTPTR(A7)     RESET OUTPUT PERSONALITY TABLE PTR
                               *
                               * Make all Analog buffers free by clearing the cluster status map.
                               * This will reactivate the continuing collection of raw input data.
                               *
9 000000F6 41FAFF08                  LEA      CSM$(PC),A0          POINT TO CLUSTER STATUS MASK
9 000000FA 42A8001E                  CLR.L    30(A0)               CLEAROUT THE FIRST 2 WORDS
9 000000FE 42680022                  CLR      34(A0)               &      THE LAST WORD OF THE MAP
                               *
9 00000102 41FAFEFC                  LEA      T_ANALOG(PC),A0      TALK TO ANALOG
9 00000106 303C1000                  MOVE     #F$OST,D0            OK TO GET MORE DATA
9 0000010A                           XSVC     READY
                               *
                               * Wait until the output queue has been emptied before continuing.
                               *
                               * Can't call SUSPEN because it would wreck the task timer.
                               * Just set up the startup mask, clear the state flags, &
                               * call EXEC.
                               *
9 0000010E 3D7C8200000E              MOVE     #$8000+F$XMIT,TK$STM(A6)
9 00000114 426E000C                  CLR      TK$STF(A6)
9 00000118                           XSVC     EXEC
9 0000011C 6000FEF2                  BRA      OUTLUP                & DO IT AGAIN
                               *
                               *
                               * SUBROUTINES:
                               *
                               * QBYTE - PUT A BYTE ON THE QUEUE & LET SOMEONE ELSE
                               *         RUN IF QUEUE IS FULL.
                               *
9 00000120 4EBAFEDE            QBYTE  JSR      ENQUE(PC)            QUEUE THE BYTE
9 00000124 640E                       BCC      QXIT                 NO PROBLEM - QUIT NOW
9 00000126                            PUSH     D0-D2/A0             SAVE REGISTERS
9 0000012A                            XSVC     EXEC                 & LET SOMEONE ELSE RUN
9 0000012E                            PULL     D0-D2/A0
9 00000132 60EC                       BRA      QBYTE                TRY AGAIN
```

```
498                           *
499 9 00000134 4E75           QXIT     RTS
500                           *
501                           *
502                                    END

****** TOTAL ERRORS      0--
****** TOTAL WARNINGS    0--
```

SYMBOL TABLE LISTING

| SYMBOL NAME | SECT | | VALUE | SYMBOL NAME | SECT | | VALUE |
|---|---|---|---|---|---|---|---|
| .1SEC | | | 0000000A | F$PDI | | | 00000800 |
| .AIQSIZ | | | 00000038 | F$PROC | | | 00002000 |
| .AOQSIZ | | | 00000038 | F$XMIT | | | 00000200 |
| .COSINE | | | 00000014 | FF | | | 0000000C |
| .DIQSIZ | | | 0000001C | HOSTACIA | XREF | * | 00000000 |
| .EFFECT | | | 0000001C | HOSTRAK | XREF | 5 | 00000000 |
| .HIQSIZ | | | 000000C8 | HSTOQ$ | XREF | 5 | 00000000 |
| .HOQSIZ | | | 00000180 | HT | | | 00000009 |
| .ICOS | | | 0000000A | IPTENT$ | | | 00000014 |
| .IEFF | | | 00000018 | MAXAGE | | | 00000004 |
| .ISCALE | | | 00000006 | NEXTSK | | | 00000030 |
| .ISIN | | | 0000000E | NXTBUF | | 9 | 000000C6 |
| .KWH | | | 00000024 | NXTENT | | 9 | 0000005C |
| .PIQSIZ | | | 0000003F | ONESEC | | | 00030090 |
| .RBFSIZ | | | 00000400 | ONETIK | | | 000009C4 |
| .SAMPLE | | | 00000002 | OPT$ | XREF | * | 00000000 |
| .SCALE1 | | | 00000004 | OPTEND | | | 00000100 |
| .SCALE2 | | | 00000008 | OPTENT$ | | | 00000004 |
| .SCALE3 | | | 0000000C | OUTLUP | | 9 | 00000010 |
| .SCALE4 | | | 00000010 | OUTPTR | | | 00000000 |
| .SINE | | | 00000018 | OUTPUT | XDEF | 9 | 00000000 |
| .SPNJP | MACR | * | | OUTVAL | XREF | 9 | 00000000 |
| .STEMP | | | 0000001C | PAAR | | | 00000014 |
| .TEMP | | | 00000012 | PACR | | | 0000000C |
| .TOFSET | | | 0000000E | PADDR | | | 00000004 |
| .TSCALE | | | 0000000A | PADR | | | 00000010 |
| .VCOS | | | 00000002 | PBAR | | | 00000016 |
| .VEFF | | | 00000014 | PBCR | | | 0000000E |
| .VSCALE | | | 00000002 | PBDDR | | | 00000006 |
| .VSIN | | | 00000006 | PBDR | | | 00000012 |
| .WATTS | | | 00000020 | PCDDR | | | 00000008 |
| .WATTSEC | | | 00000022 | PCDR | | | 00000018 |
| AIB$ | XREF | 5 | 00000000 | PGCR | | | 00000000 |
| AIBENT$ | | | 00000026 | PIVR | | | 0000000A |
| BUFOK | | 9 | 0000002C | PROM | | | 00000009 |
| BUFRDY | XREF | 9 | 00000000 | PSR | | | 0000001A |
| CHGENT | | | 00000034 | PSRR | | | 00000002 |
| CLRLUP | | 9 | 000000B2 | PULL | MACR | * | |
| CNTR | | | 0000002E | PUSH | MACR | * | |
| CPR | | | 00000024 | QBYTE | | 9 | 00000120 |
| CR | | | 0000000D | QXIT | | 9 | 00000134 |
| CSM$ | XREF | 5 | 00000000 | RAM | | | 00000005 |
| CTRL13 | | | 00000000 | RDYALL | | | 00000008 |
| CTRL2 | | | 00000002 | READY | | | 00000004 |
| DEVINI | | | 00000014 | RELEAS | | | 0000002C |
| DI$DEV | | | 0000000A | RESERV | | | 00000028 |
| DI$EVF | | | 00000000 | RESTRT | | | 0000003C |
| DI$IOM | | | 0000001E | S60 | | | 000039DF |
| DI$ISV | | | 00000006 | SAV$ | | | 0000002A |
| DI$LNK | | | 00000016 | SPACE | | | 00000020 |
| DI$OWN | | | 00000002 | STX | | | 00000002 |

```
DI$PTR                00000012   SUSPEN              0000000C
DI$QUE                0000000E   TCR                 00000020
DI$RSO                0000001A   TIMR1               00000004
DI$SIZ                00000020   TIMR2               00000008
DI$STA                0000001C   TIMR3               0000000C
DI$USP                0000001E   TIVR                00000022
DIB$      XREF   5    00000000   TK$CON              00000012
DIBENT$               00000026   TK$ENT              00000004
DSFTENT$              00000010   TK$ID               00000000
EEPROM                00000007   TK$LPT              00000016
ENQUE     XREF   9    00000000   TK$NXT              0000001A
EOT                   00000004   TK$RSO              0000001E
EQS       MACR   *               TK$SIZ              00000022
ETX                   00000003   TK$SEF              00000008
EX$DV0                0000000A   TK$STF              0000000C
EX$DV1                0000000E   TK$STA              0000000E
EX$DV2                00000012   TK$TIM              00000010
EX$DV3                00000016   TSKEND              00000038
EX$DV4                0000001A   TSKINI              00000010
EX$DV5                0000001E   TSR                 00000034
EX$DV6                00000022   T_ANALOG   XREF  5  00000000
EX$DV7                00000026   T_OUTPUT   XREF  5  00000000
EX$NXT                00000006   WAIT                0000001C
EX$SIZ                0000002A   WAITCN              00000020
EX$TIM                00000000   WAITLP              00000024
EX$TSK                00000002   WAKEUP              00000018
EXEC                  00000000   XSVC       MACR  *
F$ASHPL               00004000   Z_L1.001         9  00000096
F$DNUT                00000400   Z_L1.002         9  000000C2
F$EEPM                00000040   Z_L1.003         9  000000E0
F$KYBD                00000100   Z_L2.000         9  000000D0
F$MON                 00000080   Z_L2.004         9  000000C6
F$OST                 00001000   Z_L2.005         9  000000EA
```

```
        OUTVAL  IDNT    0,8                     CALCULATE OUTPUT POINT    1/18/83
                OPT     PCS,BRS
*
* SUBROUTINE:   OUTVAL
*
* REVISED:      1/18/83
*
* AUTHOR:       D. A. ZEICHNER
*
* PURPOSE:      CALCULATE THE VALUE SPECIFIED BY THE GIVEN OUTPUT PERSONALITY
*               TABLE (OPT) ENTRY, AND FORMAT IT FOR TRANSMISSION TO THE RTU.
*
* INPUTS:       A0 - POINTER TO OPT ENTRY
*
* OUTPUTS:      D0 - 1ST BYTE OF FORMATTED OUTPUT
*               D1 - 2ND BYTE OF FORMATTED OUTPUT
*               D2 - 3RD BYTE OF FORMATTED OUTPUT
*               ALL OTHER REGISTERS PRESERVED
*
* EXTERNAL REFERENCES/DEFINITIONS:
*
                XDEF    OUTVAL
*
* RAM REFERENCES:
*
                XREF.S  5:AIB$
                XREF.S  5:DIB$
*
* EPROM (PROGRAM) REFERENCES:
*
                XREF.S  9:FFPDIV
                XREF.S  9:FFPIFP
                XREF.S  9:FFPMUL
```

```
                                XREF.S  9:FFPSUB
                                XREF.S  9:FORMAT
                                XREF.S  9:PWRCAL
                                XREF.S  9:ROUND
                                XREF.S  9:TIMRD
                        *
                        * LOCAL ASSIGNMENTS:
                        *
          D9030054      K888880 EQU     $D9030054           CONSTANT = 888880
          CCB3334A      K818.8  EQU     $CCB3334A           CONSTANT = 818.8
          F0000046      K60     EQU     $F0000046           CONSTANT = 60
                        *
          00000400      WATICK  EQU     $400                # OF WATT SECONDS/KWH
                        *
          00000000      TYPE    EQU     0                   STACK OFFSET TO OUTPUT TYPE
          00000002      INUM    EQU     2                   STACK OFFSET TO INPUT NUMBER
                        *
                        *
          00000009              SECTION FROM
                        *
9 00000000              OUTVAL  PUSH    D0/D3-D7/A1         SAVE REGISTERS (D0 FOR LOCAL WORK SPACE)
                        *
                        * SET A1 TO POINT TO ANALOG OR DIGITAL INPUT BUFFERS
                        * ACCORDING TO THE STATE OF THE D BIT IN THE SPECIFIED
                        * OUTPUT PERSONALITY TABLE ENTRY.
                        *
9 00000004 08100004             BTST    #4,(A0)             ANALOG OR DIGITAL INPUT?
                        *
                                IF      <EQ> THEN
9 0000000A 227C00000000           MOVE.L  #AIB$,A1          ANALOG - POINT TO ANALOG INPUT BUFFERS
                                ELSE
9 00000012              Z_L1.000
9 00000012 227C00000000           MOVE.L  #DIB$,A1          DIGITAL - POINT TO DIGITAL INPUT BUFFERS
                                ENDI
9 00000018              Z_L2.002
                        *
9 00000018 3010                 MOVE    (A0),D0             GET OPT ENTRY
9 0000001A EC48                 LSR     #6,D0               RIGHT JUSTIFY INPUT NUMBER
9 0000001C 3F400002             MOVE    D0,INUM(SP)         & SAVE IN STACK
9 00000020 026F003F0002         AND     #$3F,INUM(SP)       ISOLATE INPUT NUMBER
9 00000026 EE48                 LSR     #7,D0               JUSTIFY OUTPUT TYPE (ALREADY ISOLATED)
9 00000028 3E80                 MOVE    D0,TYPE(SP)         & SAVE IN STACK
                        *
9 0000002A 0C400003             CMP     #3,D0               IS OUTPUT TYPE FREQUENCY?
9 0000002E 67000090             BEQ.L   FREQDEV             YES - GO READ TIMER & CALC FREQ DEVIATION
9 00000032 6E20                 BGT     POWER               OUTPUT TYPE IS POWER OF SOME SORT.
                        *
                        * OUTPUT VALUE IS VOLTAGE, CURRENT, OR TEMP.
                        * RETRIEVE VALUE FROM APPROPRIATE BUFFER, &
                        * FINISH UP.
                        *
                        * THE BUFFER OFFSET CALCULATION IS THE SAME FOR EITHER BUFFER TYPE.
                        *
9 00000034 322F0002             MOVE    INUM(SP),D1         GET INPUT #
9 00000038 C2FC0026             MULU    #AIBENT$,D1         CALCULATE OFFSET TO BUFFER
9 0000003C 08100004             BTST    #4,(A0)             IS THIS OUTPUT DONUT DERIVED?
                        *
                                IF      <NE> THEN           GET RESULT FROM DONUT BUFFER
9 00000042 E540                   ASL     #2,D0             CALC OFST TO VOLTAGE/CURRENT/TEMP
9 00000044 D041                   ADD     D1,D0             .VEFF(A1,D0) NOW POINTS TO DESIRED VALUE
9 00000046 20310014               MOVE.L  .VEFF(A1,D0),D0   RETRIEVE VALUE
                        *
                                ELSE                        GET RESULT FROM ANALOG BUFFER
9 0000004C              Z_L1.003
9 0000004C 2031101C               MOVE.L  .EFFECT(A1,D1),D0 RETRIEVE VALUE
                                ENDI
```

```
    9 00000050                Z_L2.005
  9 00000050 600000A0                BRA.L    FINISH                FORMAT VALUE & RETURN
                              *
                              * OUTPUT TYPE IS SOME SORT OF POWER. IF WATTS, WATT SECONDS, & KWH
                              * HAVE NOT BEEN UPDATED, DO THEM NOW.
                              *
  9 00000054 3210             POWER  MOVE     (A0),D1               GET CURRENT INPUT #1
  9 00000056 0241003F                AND      #$3F,D1               & ISOLATE IT
  9 0000005A C2FC0026                MULU     #DATLEN,D1            CALC. OFFSET TO BUFFER
                              *
  9 0000005E 43F11000                LEA      (A1,D1),A1            GET POINTER TO DESIRED BUFFER
  9 00000062 08110005                BTST     #5,(A1)               WATTS & KWH CALCULATED YET?
  9 00000066 6628                    BNE      KWHOK                 YES - SKIP CALCULATION
                              *
  9 00000068 7004                    MOVEQ    #4,D0                 CALCULATE WATTS
  9 0000006A 4EBAFF94                JSR      PWRCAL(PC)
  9 0000006E 2E00                    MOVE.L   D0,D7
  9 00000070 4EBAFFBE                JSR      ROUND(PC)             ROUND & CONVERT RESULT TO INTEGER
                              *
                              * SINCE THE OFFSETS TO WATTS, WATT-SEC, & KWH ARE THE SAME FOR
                              * BOTH ANALOG AND DIGITAL INPUT BUFFERS, WE DON'T NEED TO TEST
                              * FOR BUFFER TYPE HERE.
                              *
  9 00000074 33470020                MOVE     D7,.WATTS(A1)         UPDATE WATTS
  9 00000078 DE690022                ADD      .WATTSEC(A1),D7       ACCUMULATE WATT SECONDS THIS TICK
                              *
                              * DIVIDE ACCUMULATED WATT SECONDS BY # OF WATT SECONDS / KWH. THE
                              * REMAINDER IS THE NEW VALUE OF .WATTSEC, AND THE INTEGER PART IS
                              * ADDED TO ACCUMULATED KILOWATT HOURS.
                              *
  9 0000007C 48C7                    EXT.L    D7                    SIGN EXTEND TO 32 BITS
  9 0000007E 6FFC0400                DIVS     #WATICK,D7            DIVIDE BY # OF WATTSEC/KWH
  9 00000082 DF690024                ADD      D7,.KWH(A1)           ADD QUOTIENT TO OLD KWH VALUE
  9 00000086 4847                    SWAP     D7                    GET REMAINDER (NEW WATT SECONDS VALUE)
  9 00000088 33470022                MOVE     D7,.WATTSEC(A1)       UPDATE WATT SECONDS
  9 0000008C 03D10005                BSET     #5,(A1)               SET UP FLAG IN BUFFER
                              *
                              * SEE IF REQUESTED VALUE WAS KWH OR WATTS.
                              *
                              KWHOK  IF       TYPE(SP) <EQ> #4 THEN WATTS WAS REQUESTED
  9 00000096 3E290020                  MOVE     .WATTS(A1),D7
  9 0000009A 48C7                      EXT.L    D7                  SIGN EXTEND ARGUMENT TO 32 BITS
  9 0000009C 4EBAFF62                  JSR      FFPIFP(PC)          CONVERT TO FLOATING POINT FOR FORMAT
  9 000000A0 2007                      MOVE.L   D7,D0               PUT VALUE INTO D0 FOR FORMAT
  9 000000A2 604E                      BRA      FINISH              & FINISH UP
                                     ENDI
    9 000000A4                Z_L1.006
                              *
                                     IF       TYPE(SP) <EQ> #7 THEN KWH WAS REQUESTED
  9 000000AA 3E290024                  MOVE     .KWH(A1),D7         GET KWH
  9 000000AE 48C7                      EXT.L    D7                  EXTEND TO 32 BITS
  9 000000B0 4EBAFF4E                  JSR      FFPIFP(PC)
  9 000000B4 2007                      MOVE.L   D7,D0
  9 000000B6 603A                      BRA      FINISH
                                     ENDI
    9 000000B8                Z_L1.009
                              *
                              * REQUESTED OUTPUT WAS NOT WATTS OR KWH.
                              * GO CALCULATE REQUESTED VALUE.
                              *
  9 000000B8 3017                    MOVE     TYPE(SP),D0           GET OUTPUT TYPE
  9 000000BA 4EBAFF44                JSR      PWRCAL(PC)
  9 000000BE 6032                    BRA      FINISH                & FINISH UP
                              *
                              * READ APPROPRIATE TIMER, & CALCULATE FREQUENCY
                              * DEVIATION.
                              *
```

```
9 000000C0 302F0002     FREQDEV  MOVE     INUM(SP),D0        GET TIMER (CLUSTER) NUMBER
9 000000C4 4EBAFF3A              JSR      TIMRD(PC)          DESIRED TIMER COUNT IN D0
                        *
                        * NOTE: IF TIMRD GOES WRONG, THEN WHAT DO WE DO?
                        *          RIGHT NOW, WE LET THE COUNTER NUMBER
                        *          EQUAL THE TIMER COUNT.
                        *
                        * FREQUENCY DEVIATION IS CALCULATED AS FOLLOWS:
                        *
                        *          DEV. = ((888880/D0) - 60) * 818.8
                        *
9 000000C8 3E00                  MOVE     D0,D7
9 000000CA 48C7                  EXT.L    D7                 SIGN EXTEND TO 32 BITS
9 000000CC 4EBAFF32              JSR      FFPIFP(PC)         CONVERT TO FLOATING POINT
9 000000D0 2C07                  MOVE.L   D7,D6              PUT IN DENOMINATOR
9 000000D2 2E3CD9030054          MOVE.L   #K888880,D7
9 000000D8 4EBAFF26              JSR      FFPDIV(PC)         CHECK FOR DIVIDE BY ZERO 1ST?
9 000000DC 2C3CF0000046          MOVE.L   #K60,D6
9 000000E2 4EBAFF1C              JSR      FFPSUB(PC)
9 000000E6 2C3CCCB3334A          MOVE.L   #K818.8,D6
9 000000EC 4EBAFF12              JSR      FFPMUL(PC)         RESULT IN D7
9 000000F0 2007                  MOVE.L   D7,D0              PUT IN D0 FOR FORMAT
                        *
                        * FORMAT DATA FOR TRANSMISSION & RETURN TO CALLER
                        *
9 000000F2 4EBAFF0C     FINISH   JSR      FORMAT(PC)         FORMAT D0
9 000000F6 4FEF0004              LEA      4(SP),A7           SCRAP LOCAL WORK AREA
9 000000FA                       PULL     D3-D7/A1           RESTORE REGISTERS
9 000000FE 4E75                  RTS                         & RETURN
                        *
                        *
                                 END

****** TOTAL ERRORS      0--
****** TOTAL WARNINGS    0--
```

SYMBOL TABLE LISTING

| SYMBOL NAME | SECT | VALUE | SYMBOL NAME | | SECT | VALUE |
|---|---|---|---|---|---|---|
| .1SEC | | 0000000A | FFPMUL | XREF | 9 | 00000000 |
| .AIQSIZ | | 00000038 | FFPSUB | XREF | 9 | 00000000 |
| .AOQSIZ | | 00000038 | FINISH | | 9 | 000000F2 |
| .COSINE | | 00000014 | FORMAT | XREF | 9 | 00000000 |
| .DIQSIZ | | 0000001C | FREQDEV | | 9 | 000000C0 |
| .EFFECT | | 0000001C | HT | | | 00000009 |
| .HIQSIZ | | 00000010 | INUM | | | 00000002 |
| .HOQSIZ | | 00000180 | IPTENT$ | | | 00000014 |
| .ICOS | | 0000000A | K60 | | | F0000046 |
| .IEFF | | 00000018 | K818.8 | | | CCB3334A |
| .ISCALE | | 00000006 | K888880 | | | D9030054 |
| .ISIN | | 0000000E | KWHOK | | 9 | 00000090 |
| .KWH | | 00000024 | MAXAGE | | | 00000004 |
| .PIQSIZ | | 0000003F | ONESEC | | | 0003D090 |
| .RBFSIZ | | 00000400 | ONETIK | | | 000009C4 |
| .SAMPLE | | 00000002 | OPTENT$ | | | 00000004 |
| .SCALE1 | | 00000004 | OUTVAL | XDEF | 9 | 00000000 |
| .SCALE2 | | 00000008 | PAAR | | | 00000014 |
| .SCALE3 | | 0000000C | PACR | | | 0000000C |
| .SCALE4 | | 00000010 | PADDR | | | 00000004 |
| .SINE | | 00000018 | PADR | | | 00000010 |
| .STEMP | | 0000001C | PBAR | | | 00000016 |
| .TEMP | | 00000012 | PBCR | | | 0000000E |
| .TOFSET | | 0000000E | PBDDR | | | 00000006 |

```
.TSCALE                 0000000A    PBDR                   00000012
.VCOS                   00000002    PCDDR                  00000008
.VEFF                   00000014    PCDR                   00000018
.VSCALE                 00000002    PGCR                   00000000
.VSIN                   00000006    PIVR                   0000000A
.WATTS                  00000020    POWER             9    00000054
.WATTSEC                00000022    PROM.                  00000009
AIB$      XREF    5     00000000    PSR                    0000001A
AIBENT$                 00000026    PSRR                   00000002
CNTR                    0000002E    PULL       MACR   *
CPR                     00000024    PUSH       MACR   *
CR                      0000000D    PWRCAL     XREF   9    00000000
DIB$      XREF    5     00000000    RAM                    00000005
DIBENT$                 00000026    ROUND      XREF   9    00000000
DSFTENT$                00000010    S60                    000039DF
EEPROM                  00000007    SPACE                  00000020
EOT                     00000004    STX                    00000002
ETX                     00000003    TCR                    00000020
F$ASMPL                 00004000    TIMRD      XREF   9    00000000
F$DNUT                  00000400    TIVR                   00000022
F$KYBD                  00000100    TSR                    00000034
F$MON                   00000080    TYPE                   00000000
F$OST                   00001000    WATICK                 00000400
F$PDI                   00000800    Z_L1.000          9    00000012
F$PROC                  00002000    Z_L1.003          9    0000004C
F$XMIT                  00000200    Z_L1.006          9    000000A4
FF                      0000000C    Z_L1.009          9    000000E8
FFPDIV    XREF    9     00000000    Z_L2.002          9    00000010
FFPIFF    XREF    9     00000000    Z_L2.005          9    00000050

                       PROCES  IDNT     0,6                 IMMEDIATE BUFFER PROCESSING   3/10/83
                               OPT      PCS,BRS
                       *
                       *
                       * SUBROUTINE:    PROCES
                       *
                       * REVISED:       3/10/83
                       *
                       * AUTHOR:        D. A. ZEICHNER
                       *
                       * PURPOSE:       PROCESS THIS BUFFER. ONLY 'IMMEDIATE' PROCESSING IS
                       *                PERFORMED. THAT IS, CALCULATIONS WHICH REQUIRE ONLY
                       *                DATA FOUND WITHIN THE BUFFER. (IE. FOURIER TRANSFORM
                       *                AND EFFECTIVE VALUE CALCULATIONS)
                       *
                       * INPUTS:        N/A (THIS IS A TASK SHELL)
                       *
                       * OUTPUTS:       N/A
                       *
                       * EXTERNAL REFERENCES/DEFINITIONS:
                       *
                               XDEF     PROCES
                       *
                       * RAM REFERENCES:
                       *
                               XREF.S   5:PRCIO$
                       *
                       * EPROM (PROGRAM) REFERENCES:
                       *
                               XREF.S   9:DEQUE
                               XREF.S   9:EFFVAL
                               XREF.S   9:XFORM
                       *
                       *
         00000009              SECTION  PROM
                       *
  9 00000000 41FAFFFE  PROCES  LEA      PRCIO$(PC),A0        POINT TO INPUT QUEUE
```

```
9 00000004 4EBAFFFA            JSR     DEQUE(PC)
9 00000008 640A                BCC     GOTBUF           QUEUE NOT EMPTY - CONTINUE
9 0000000A 4240                CLR     D0               EMPTY - WAIT FOR A WHILE
9 0000000C 7203                MOVEQ   #3,D1            ABOUT THE THREE TICKS IS GOOD
9 0000000E                     XSVC    SUSPEN
9 00000012 60EC                BRA     PROCES           TRY AGAIN
                      *
9 00000014 0280000FFFF GOTBUF  AND.L   ##FFFF,D0        CLEAR MSW
9 0000001A 2040                MOVE.L  D0,A0
9 0000001C 08D00006            BSET    #6,(A0)          SET AC FLAG.
9 00000020 6712                BEQ     DOBUF            WASN'T PREVIOUSLY SET - GO DO BUFFER
                      *
                      *...Actually this test is inappropriate, since we can't access Proces
                      *  unless we can set the AC flag ....

9 00000022                     PUSH    D0               AC ALREADY SET - SAVE D0, AND
9 00000026 4240                CLR     D0               WAIT FOR A WHILE AGAIN
9 00000028 7203                MOVEQ   #3,D1            ABOUT THE THREE TICKS IS GOOD
9 0000002A                     XSVC    SUSPEN
9 0000002E                     PULL    D0
9 00000032 60E0                BRA     GOTBUF           TRY AGAIN.
                      *
9 00000034 1010         DOBUF  MOVE.B  (A0),D0          GET BUFFER HEADER
9 00000036 E608                LSR.B   #3,D0            ISOLATE INPUT TYPE
9 00000038 02400003            AND     #3,D0
                      *
9 0000003C 0C400001            CMP     #1,D0            INPUT VOLTAGE OR CURRENT?
9 00000040 6E12                BGT     NOFOUR           NO - SKIP FOURIER ANALYSIS
9 00000042 4EBAFFBC            JSR     XFORM(PC)        YES - DO FOURIER ANALYSIS
                      *
9 00000046 43E80002            LEA     .SAMPLE(A0),A1   1st RAW DATA ENTRY IN AIB$
9 0000004A 7008                MOVEQ   #8,D0            ADJUST BUFFER # FOR CLEAR LOOP
9 0000004C 32FC0800     CLRBUF MOVE    ##800,(A1)+      CLEAR INPUT BUFFER
9 00000050 51C8FFFA            DBRA    D0,CLRBUF        GO AROUND AGAIN ?
                      *
9 00000054 4EBAFFAA     NOFOUR JSR     EFFVAL(PC)       CALCULATE EFFECTIVE VALUES
9 00000058 0C000003            CMP.B   #3,D0            STILL HAS INPUT TYPE FROM BEFORE
9 0000005C 67A2                BEQ     PROCES           TYPE IS DONUT - READY TO START W/ NEXT ONE
                      *
9 0000005E 303C2000            MOVE    #F$PROC,D0
9 00000062                     XSVC    RDYALL           WAKE UP EVERYBODY WAITING FOR US
9 00000066 6098                BRA     PROCES           & DO IT AGAIN!
                      *
                      *
                               END

****** TOTAL ERRORS      0--
****** TOTAL WARNINGS    0--
```

SYMBOL TABLE LISTING

| SYMBOL NAME | SECT | VALUE | SYMBOL NAME | SECT | VALUE |
|---|---|---|---|---|---|
| .1SEC | | 0000000A | F$ASMPL | | 00004000 |
| .AIQSIZ | | 00000038 | F$DNUT | | 00000400 |
| .AOQSIZ | | 00000038 | F$EEPM | | 00000040 |
| .COSINE | | 00000014 | F$KYBD | | 00000100 |
| .DIGSIZ | | 0000001C | F$MON | | 00000080 |
| .EFFECT | | 0000001C | F$OST | | 00001000 |
| .HIQSIZ | | 000000C8 | F$PDI | | 00000800 |
| .HOQSIZ | | 00000120 | F$PROC | | 00002000 |
| .ICOS | | 0000000A | F$XMIT | | 00000200 |
| .IEFF | | 00000018 | FF | | 0000000C |
| .ISCALE | | 00000006 | GOTBUF | 9 | 00000014 |

| | | | | | | | |
|---|---|---|---|---|---|---|---|
| .ISIN | | | 0000000E | HT | | | 00000009 |
| .KWH | | | 00000024 | IPTENT$ | | | 00000014 |
| .PIOSIZ | | | 0000003F | MAXAGE | | | 00000004 |
| .RBFSIZ | | | 00000400 | NEXTSK | | | 00000030 |
| .SAMPLE | | | 00000002 | NOFOUR | | 9 | 00000054 |
| .SCALE1 | | | 00000004 | ONESEC | | | 0003D090 |
| .SCALE2 | | | 00000008 | ONETIK | | | 000009C4 |
| .SCALE3 | | | 0000000C | OPTENT$ | | | 00000004 |
| .SCALE4 | | | 00000010 | PAAR | | | 00000014 |
| .SINE | | | 00000018 | PACR | | | 0000000C |
| .SPNUP | MACR | x | | PADDR | | | 00000004 |
| .STEMP | | | 0000001C | PADR | | | 00000010 |
| .TEMP | | | 00000012 | PBAR | | | 00000016 |
| .TOFSET | | | 0000000E | PBCR | | | 0000000E |
| .TSCALE | | | 0000000A | PBDDR | | | 00000006 |
| .VCOS | | | 00000002 | PBDR | | | 00000012 |
| .VEFF | | | 00000014 | PCDDR | | | 00000008 |
| .VSCALE | | | 00000002 | PCDR | | | 00000018 |
| .VSIN | | | 00000006 | PGCR | | | 00000000 |
| .WATTS | | | 00000020 | PIVR | | | 0000000A |
| .WATTSEC | | | 00000022 | PRCIQ$ | XREF | 5 | 00000000 |
| AIBENT$ | | | 00000026 | PROCES | XDEF | 9 | 00000000 |
| CHGENT | | | 00000034 | PROM | | | 00000009 |
| CLRBUF | | 9 | 0000004C | PSR | | | 0000001A |
| CNTR | | | 0000002E | PSFR | | | 00000002 |
| CPR | | | 00000024 | PULL | MACR | x | |
| CR | | | 0000000D | PUSH | MACR | x | |
| CTRL13 | | | 00000000 | RAM | | | 00000005 |
| CTRL2 | | | 00000002 | RDYALL | | | 00000008 |
| DEQUE | XREF | 9 | 00000000 | READY | | | 00000004 |
| DEVINI | | | 00000014 | RELEAS | | | 0000002C |
| DI$DEV | | | 0000000A | RESERV | | | 00000028 |
| DI$EVF | | | 00000000 | RESTRT | | | 0000003C |
| DI$IOM | | | 0000001B | S60 | | | 000039DF |
| DI$ISV | | | 00000006 | SAV$ | | | 0000002A |
| DI$LNK | | | 00000016 | SPACE | | | 00000020 |
| DI$OWN | | | 00000002 | STX | | | 00000002 |
| DI$PTR | | | 00000012 | SUSPEN | | | 0000000C |
| DI$QUE | | | 0000000E | TCR | | | 00000020 |
| DI$RSO | | | 0000001A | TIMR1 | | | 00000004 |
| DI$SIZ | | | 00000020 | TIMR2 | | | 00000008 |
| DI$STA | | | 0000001C | TIMR3 | | | 0000000C |
| DI$USR | | | 0000001E | TIVR | | | 00000022 |
| DIBENT$ | | | 00000026 | TK$CON | | | 00000012 |
| DOBUF | | 9 | 00000034 | TK$ENT | | | 00000004 |
| DSFTENT$ | | | 00000010 | TK$ID | | | 00000000 |
| EEPROM | | | 00000007 | TK$LPT | | | 00000016 |
| EFFVAL | XREF | 9 | 00000000 | TK$NXT | | | 0000001A |
| EOT | | | 00000004 | TK$RSO | | | 0000001E |
| EOS | MACR | x | | TK$SIZ | | | 00000022 |
| ETX | | | 00000003 | TK$SSP | | | 00000008 |
| EX$DV0 | | | 0000000A | TK$STF | | | 0000000C |
| EX$DV1 | | | 0000000E | TK$STM | | | 0000000E |
| EX$DV2 | | | 00000012 | TK$TIM | | | 00000010 |
| EX$DV3 | | | 00000016 | TSKEND | | | 00000038 |
| EX$DV4 | | | 0000001A | TSKINI | | | 00000010 |
| EX$DV5 | | | 0000001E | TSR | | | 00000034 |
| EX$DV6 | | | 00000022 | WAIT | | | 0000001C |
| EX$DV7 | | | 00000026 | WAITCN | | | 00000020 |
| EX$NXT | | | 00000006 | WAITLP | | | 00000024 |
| EX$SIZ | | | 0000002A | WAKEUP | | | 00000018 |
| EX$TIM | | | 00000000 | XFORM | XREF | 9 | 00000000 |
| EX$TSK | | | 00000002 | XSVC | MACR | x | |
| EXEC | | | 00000000 | | | | |

```
         PWRCAL  IDNT   0,7              POWER CALCULATIONS   2/16/83
                 OPT    PCS,BRS
```

```
                                *
                                * SUBROUTINE:     PWRCAL
                                *
                                * REVISED:        2/16/83
                                *
                                * AUTHOR:         D. A. ZEICHNER
                                *
                                * PURPOSE:        GIVEN A SPECIFIC OUTPUT PERSONALITY TABLE ENTRY, CALCULATE
                                *                 WATTS, VARS OR VA, AND RETURN TO THE USER.
                                *
                                * INPUTS:         A0 - POINTER TO OUTPUT PERSONALITY TABLE (OPT) ENTRY
                                *                 D0 - PARAMETER TO BE CALCULATED:
                                *                      4 - WATTS
                                *                      5 - VA
                                *                      6 - VARS
                                *
                                * OUTPUTS:        D0 - VALUE OF PARAMETER CALCULATED. (IN FLOATING POINT)
                                *                 CARRY SET IF A0 POINTS TO INVALID ENTRY OR PARAMETER
                                *                 SPEC OUT OF RANGE.
                                *
                                * EXTERNAL REFERENCES/DEFINITIONS:
                                *
                                        XDEF     PWRCAL
                                *
                                * RAM REFERENCES:
                                *
                                        XREF.S   5:AIB$
                                        XREF.S   5:DIB$
                                *
                                * EEPROM REFERENCE:
                                *
                                        XREF     IPT$
                                *
                                * EPROM (PROGRAM) REFERENCES:
                                *
                                        XREF.S   9:FFPADD
                                        XREF.S   9:FFPDIV
                                        XREF.S   9:FFPIFP
                                        XREF.S   9:FFPMUL
                                        XREF.S   9:FFPSUB
                                *
                                * LOCAL STACK OFFSETS:
                                *
            00000000            V0      EQU      0                       VOLTAGE INPUT #
            00000001            I1      EQU      1                       1ST CURRENT INPUT #
            00000002            I2      EQU      2                       2ND CURRENT INPUT #
            00000003            FUNC    EQU      3                       FUNCTION CODE
            00000004            PSCAL   EQU      4                       POWER SCALE FACTOR (2 BYTES)
                                *
                                *
            00000009                    SECTION  PROM
                                *
 9 00000000                     PWRCAL  PUSH     D1-D7/A1-A6
                                *
 9 00000004 4FEFFFFA                    LEA      -6(SP),SP               ALLOCATE LOCAL SCRATCH SPACE
 9 00000008 1F400003                    MOVE.B   D0,FUNC(SP)             SAVE FUNCTION CODE IN STACK
                                *
 9 0000000C 3410                        MOVE     (A0),D2                 GET OPT ENTRY
 9 0000000E 1F420001                    MOVE.B   D2,I1(SP)               SAVE 1ST CURRENT INPUT IN STACK
                                *
 9 00000012 EC4A                        LSR      #6,D2                   RIGHT JUSTIFY VOLTAGE INPUT #
 9 00000014 1E82                        MOVE.B   D2,V0(SP)               SAVE IN STACK
                                *
 9 00000016 1F6800030002                MOVE.B   3(A0),I2(SP)            PUT 2ND CURRENT INPUT # IN STACK
                                *
 9 0000001C 02973F3F3F07                AND.L    #$3F3F3F07,V0(SP)       MASK OUT EXTRA BITS IN V0, I1, I2, & FUNC
```

```
                                  *
 9 00000022 0C2F00040003              CMP.B    #4,FUNC(SP)          CHECK THAT FUNCTION CODE IS IN RANGE
 9 00000028 6D0000EE                  BLT.L    FWRERR
 9 0000002C 0C2F00060003              CMP.B    #6,FUNC(SP)
 9 00000032 6E0000E4                  BGT.L    FWRERR
                                  *
 9 00000036 247C00000000              MOVE.L   #0,A2                SET ACCUMULATED POWER TO ZERO.
 9 0000003C 426F0004                  CLR      PSCAL(SP)            INITIALIZE POWER SCALE FACTOR.
                                  *
                                      WHILE.B  V0(SP) <LT> #$3F AND PSCAL(SP) <LT> #$1900 DO.L
 9 00000040                 Z_L1.000
 9 00000052 1017                        MOVE.B  V0(SP),D0         GET ALL 3 INPUT NUMBERS FOR PTRCAL
 9 00000054 122F0001                    MOVE.B  I1(SP),D1
 9 00000058 142F0002                    MOVE.B  I2(SP),D2
 9 0000005C 61000106                    BSR.L   PTRCAL            CALCULATE OFFSETS & GET NEXT INPUT NUMBERS
 9 00000060 40C7                        MOVE    SR,D7             SAVE CCR WHILE WE STORE NEW INPUT NUMBERS
 9 00000062 1E83                        MOVE.B  D3,V0(SP)         SAVE NEW INPUT NUMBERS
 9 00000064 1F440001                    MOVE.B  D4,I1(SP)
 9 00000068 1F450002                    MOVE.B  D5,I2(SP)
 9 0000006C 44C7                        MOVE    D7,CCR            RESTORE CONDITION CODES
                                  *
                                  *
                                        IF      <CC> THEN  .       WE HAVE ANALOG DERIVED DATA
                                          IF.B     FUNC(SP) <NE> #5 THEN DOING WATTS OR VARS - GET COMPONENTS
                                  *
 9 00000078 4CF118000014                    MOVEM.L  .COSINE(A1,D0),A3-A4 GET COSINE & SINE VOLTAGE COMPONENTS
 9 0000007E 4CF160001014                    MOVEM.L  .COSINE(A1,D1),A5-A6 GET COSINE & SINE CURRENT COMPONENTS
 9 00000084 44C7                            MOVE     D7,CCR           GET CCR BACK AGAIN
                                  *
                                            IF       <PL> THEN        WE HAVE TWO INPUT CURRENTS
 9 00000088 2E0D                              MOVE.L   A5,D7          ADD COSINE COMPONENTS
 9 0000008A 2C312014                          MOVE.L   .COSINE(A1,D2),D6
 9 0000008E 4EBAFF70                          JSR      FFPADD(PC)
 9 00000092 2A47                              MOVE.L   D7,A5          & SAVE SUM
                                  *
 9 00000094 2E0E                              MOVE.L   A6,D7          DO THE SAME WITH THE SINE COMPONENTS
 9 00000096 2C312018                          MOVE.L   .SINE(A1,D2),D6
 9 0000009A 4EBAFF64                          JSR      FFPADD(PC)
 9 0000009E 2C47                              MOVE.L   D7,A6
                                            ENDI
 9 000000A0                 Z_L1.007
                                          ELSE                        WE'RE DOING VA - GET EFFECTIVE VALUES
 9 000000A2                 Z_L1.005
 9 000000A2 2671001C                        MOVE.L   .EFFECT(A1,D0),A3 GET EFFECTIVE VOLTAGE
 9 000000A6 2A71101C                        MOVE.L   .EFFECT(A1,D1),A5 GET EFFECTIVE CURRENT
 9 000000AA 44C7                            MOVE     D7,CCR           RESTORE CONDITION CODES
                                  *
                                            IF       <PL> THEN
 9 000000AE 2E0D                              MOVE.L   A5,D7          BREAKER & A HALF - SUM BOTH CURRENTS
 9 000000B0 2C31201C                          MOVE.L   .EFFECT(A1,D2),D6 GET SECOND EFFECTIVE CURRENT VALUE
 9 000000B4 4EBAFF4A                          JSR      FFPADD(PC)
 9 000000B8 2A47                              MOVE.L   D7,A5
                                            ENDI
 9 000000BA                 Z_L1.011
                                          ENDI
 9 000000BA                 Z_L2.010
                                        ELSE                          WE HAVE DONUT DERIVED DATA
 9 000000BC                 Z_L1.003
                                  *
                                          IF.B     FUNC(SP) <NE> #5 THEN DOING WATTS OR VARS - GET COMPONENTS
 9 000000C4 4CF178000002                    MOVEM.L  .VCOS(A1,D0),A3-A6 SET UP A3-A6 AS ABOVE (ALL FROM SAME BUF)
                                  *
                                          ELSE                        WE'RE DOING VA - GET EFFECTIVE VALUES
 9 000000CC                 Z_L1.015
 9 000000CC 26710014                        MOVE.L   .VEFF(A1,D0),A3
 9 000000D0 2A710018                        MOVE.L   .IEFF(A1,D0),A5
```

```
                                          ENDI
  9 000000D4              . Z_L2.017
                                     ENDI
  9 000000D4                Z_L2.014
                            *
                            * CALL THE APPROPRIATE ROUTINE BASED ON THE
                            * VALUE OF THE INCOMING FUNCTION CODE.
                            *
  9 000000D4 102F0003                MOVE.B  FUNC(SP),D0
  9 000000D8 5900                    SUBQ.B  #4,D0
  9 000000DA E340                    ASL     #1,D0              CALCULATE OFFSET INTO VECTOR TABLE
  9 000000DC 4880                    EXT     D0                 CLEAR MSB OF WORD
  9 000000DE 43FA0040                LEA     VECTOR(PC),A1      GET PTR TO VECTOR TABLE
  9 000000E2 4EB10000                JSR     (A1,D0)            DO THE COMPUTED JSR
                            *
                            * ACCUMULATE THE RESULT IN A2.
                            *
  9 000000E6 2C0A                    MOVE.L  A2,D6              GET TOTAL
  9 000000E8 4EBAFF16                JSR     FFPADD(PC)         ACCUMULATE RESULT
  9 000000EC 2447                    MOVE.L  D7,A2
  9 000000EE 066F08000004            ADD     #$800,FSCAL(SP)    BUMP SCALE FACTOR
                            *
                                    ENDW
  9 000000F8                Z_L2.001
  9 000000F6 3E2F0004               MOVE    FSCAL(SP),D7        GET SCALING FACTOR,
  9 000000FC 48C7                   EXT.L   D7                  SIGN EXTEND TO 32 BITS,
  9 000000FE 4EBAFF00               JSR     FFPIFP(PC)          & CONVERT TO FLOATING POINT
  9 00000102 2C07                   MOVE.L  D7,D6
  9 00000104 2E0A                   MOVE.L  A2,D7               GET ACCUMULATED POWER VALUE
                            *
                                    IF      <NE> THEN           ALLOW DIVIDE IF NUMERATOR NON-ZERO
  9 00000108 4EBAFEF6                JSR     FFPDIV(PC)
                                    ENDI
  9 0000010C                Z_L1.018
  9 0000010C 2007                   MOVE.L  D7,D0               PUT RESULT IN D0
                            *
  9 0000010E 4FEF0006       PWRXIT  LEA     6(SP),A7            DEALLOCATE LOCAL STACK SPACE
  9 00000112                        PULL    D1-D7/A1-A6         RESTORE REGISTERS
  9 00000116 4E75                   RTS                         & RETURN
                            *
  9 00000118 4280           PWRERR  CLR.L   D0                  SET RESULT TO 0
  9 0000011A 003C0001               OR.B    #1,CCR              SET CARRY
  9 0000011E 60EE                   BRA     PWRXIT              & RETURN BAD
                            *
                            *
  9 00000120 6004           VECTOR  BRA     WATTS
  9 00000122 6036                   BRA     VA
  9 00000124 601A                   BRA     VARS
                            *
                            * WATTS, VARS, VA SUBROUTINES:
                            *
                            * INPUTS: A3 - VA (VEFF FOR VA)
                            *         A4 - VB
                            *         A5 - IA (IEFF FOR VA)
                            *         A6 - IB
                            *
                            * OUTPUT: D7 - RESULT
                            *
                            * WATTS - EQN. PERFORMED: D7 = (VB x IB) + (VA x IA)
                            *
  9 00000126 2E0C           WATTS   MOVE.L  A4,D7
  9 00000128 2C0E                   MOVE.L  A6,D6
  9 0000012A 4EBAFED4               JSR     FFPMUL(PC)           (VB x IB)
                            *
  9 0000012E 2007                   MOVE.L  D7,D0
  9 00000130 2E0B                   MOVE.L  A3,D7
```

```
9 00000132 2C0D              MOVE.L  A5,D6
9 00000134 4EBAFECA          JSR     FFPMUL(PC)        (VA * IA)
                    *
9 00000138 2C00              MOVE.L  D0,D6
9 0000013A 4EBAFEC4          JSR     FFPADD(PC)        ADD THE TWO TOGETHER
9 0000013E 4E75              RTS                       & RETURN
                    *
                    *
                    * VARS - EQN. PERFORMED: D7 = (VA * IB) - (VB * IA)
                    *
9 00000140 2E0C     VARS     MOVE.L  A4,D7
9 00000142 2C0D              MOVE.L  A5,D6
9 00000144 4EBAFEBA          JSR     FFPMUL(PC)        (VB * IA)
                    *
9 00000148 2007              MOVE.L  D7,D0             SAVE INTERMEDIATE RESULT
9 0000014A 2E0B              MOVE.L  A3,D7
9 0000014C 2C0E              MOVE.L  A6,D6
9 0000014E 4EBAFEB0          JSR     FFPMUL(PC)        (VA * IB)
                    *
9 00000152 2C00              MOVE.L  D0,D6
9 00000154 4EBAFEAA          JSR     FFPSUB(PC)        DO SUBTRACTION OF TWO TERMS
9 00000158 4E75              RTS                       & RETURN
                    *
                    *
                    * VA - EQN. PERFORMED: D7 = VEFF * IEFF
                    *
9 0000015A 2C0B     VA       MOVE.L  A3,D6
9 0000015C 2E0D              MOVE.L  A5,D7
9 0000015E 4EBAFEA0          JSR     FFPMUL(PC)
9 00000162 4E75              RTS
                    *
                    *
                    * PTRCAL - CALCULATE POINTER TO APPROPRIATE INPUT BUFFER.
                    *
                    * INPUTS: A0 - POINTS TO DFT ENTRY
                    *         D0 - VOLTAGE INPUT #
                    *         D1 - 1ST CURRENT INPUT # (ANALOG ONLY)
                    *         D2 - 2ND CURRENT INPUT # (ANALOG ONLY)
                    *
                    * OUTPUT: A1 - POINTS TO START OF APPROPRIATE INPUT BUFFER TYPE. (AIB/DIB)
                    *         D0 - OFFSET TO VOLTAGE INPUT BUFFER
                    *         D1 - OFFSET TO CURRENT INPUT BUFFER #1
                    *         D2 - OFFSET TO CURRENT INPUT BUFFER #2 (IF USED)
                    *         D3 - NEXT VOLTAGE INPUT BUFFER ($3F IF END)
                    *         D4 - NEXT CURRENT INPUT BUFFER #1
                    *         D5 - NEXT CURRENT INPUT BUFFER #2
                    *
                    *         CARRY IS SET IF OUTPUT WAS DONUT DERIVED
                    *         NEGATIVE BIT IS SET IF ONLY 1 CURRENT INPUT USED & INPUT WAS ANALOG.
                    *
9 00000164 08100004 PTRCAL   BTST    #4,(A0)           PROCESSING DONUT DATA?
9 00000168 665C              BNE     PTRDNT            YES - GO CALC POINTER
                    *
                    * INPUT WAS ANALOG. CALCULATE OFFSET TO BUFFER, & GET
                    * INPUT NUMBER OF NEXT PHASE FOR VOLTAGE & CURRENT(S)
                    * FROM INPUT PERSONALITY TABLE.
                    *
9 0000016A 43F900000000      LEA     IPT$,A1           SET POINTER TO INPUT PERSONALITY TABLE
                    *
9 00000170 0240003F          AND     #$3F,D0           ISOLATE INPUT NUMBER
9 00000174 3600              MOVE    D0,D3
9 00000176 C0FC0026          MULU    #AIBENT$,D0       CALCULATE OFFSET TO ANALOG INPUT BUFFER
9 0000017A C6FC0014          MULU    #IPTENT$,D3       CALCULATE OFFSET TO IPT ENTRY
9 0000017E 36313000          MOVE    (A1,D3),D3        GET LINK
9 00000182 0243003F          AND     #$3F,D3           & ISOLATE IT
                    *
```

```
                          * DO THE SAME FOR THE 1ST CURRENT INPUT
                          *
9 00000186 0241003F               AND     #$3F,D1              ISOLATE INPUT NUMBER
9 0000018A 3801                   MOVE    D1,D4
9 0000018C C2FC0026               MULU    #AIBENT$,D1
9 00000190 C8FC0014               MULU    #IPTENT$,D4
9 00000194 38314000               MOVE    (A1,D4),D4
9 00000198 0244003F               AND     #$3F,D4
                          *
                          * AND AGAIN FOR THE 2ND CURRENT INPUT IF WE HAVE ONE.
                          * IF WE DON'T, SET THE OFFSET TO -1, & THE LINK TO $3F.
                          *
9 0000019C 0242003F               AND     #$3F,D2              ISOLATE INPUT NUMBER
9 000001A0 3A02                   MOVE    D2,D5                SAVE FOR IPT CALCS.
                          *
                                  IF      D2 <NE> #$3F THEN
9 000001A8 C4FC0026                 MULU    #AIBENT$,D2
9 000001AC CAFC0014                 MULU    #IPTENT$,D5        CALC. OFFSET TO IPT ENTRY
9 000001B0 3A315000                 MOVE    (A1,D5),D5         GET NEXT LINK
9 000001B4 0245003F                 AND     #$3F,D5            & ISOLATE IT
                                  ELSE
  9 000001BA              Z_L1.021
                          *
9 000001BA 343CFFFF                 MOVE    #-1,D2             SET OFFSET TO -1
                                  ENDI
  9 000001BE              Z_L2.023
                          *
9 000001BE 43FAFE40               LEA     AIB$(PC),A1          SET A1 TO POINT TO ANALOG INPUT BUFFERS
9 000001C2 4A42                   TST     D2                   SET N BIT AS APPROPRIATE & CLEAR CARRY.
9 000001C4 4E75                   RTS                          RETURN
                          *
                          * INPUT WAS DONUT DERIVED. VOLTAGE & CURRENT COME FROM
                          * THE SAME BUFFER. THE LINK TO THE NEXT BUFFER IS OBTAINED
                          * BY SIMPLY INCREMENTING THE INCOMING INPUT NUMBER.
                          *
                          * NOTE: WE HAVE NO WAY OF KNOWING WHEN WE'RE DONE HERE, SO
                          *        YOU'LL JUST HAVE TO WATCH OUT FOR YOURSELF.
                          *
9 000001C6 43FAFE38       PTFONT  LEA     DIB$(PC),A1          SET POINTER TO DONUT INPUT BUFFERS
                          *
9 000001CA 0240000F               AND     #$F,D0               ISOLATE DONUT ID
9 000001CE 3600                   MOVE    D0,D3
9 000001D0 5243                   ADDQ    #1,D3                CALCULATE NEXT DONUT ID
9 000001D2 C0FC0026               MULU    #DIBENT$,D0          CALC OFFSET TO DONUT INPUT BUFFER
9 000001D6 003C0001               OR      #1,CCR               SET CARRY BIT
9 000001DA 4E75                   RTS                          & RETURN
                          *
                          *
                                  END

****** TOTAL ERRORS       0--
****** TOTAL WARNINGS     0--

SYMBOL TABLE LISTING


SYMBOL NAME     SECT   VALUE        SYMBOL NAME     SECT   VALUE


.1SEC                  0000000A     HT                     00000009
.AIOSIZ                00000038     I1                     00000001
.AOOSIZ                00000038     I2                     00000002
.COSINE                00000014     IPT$        XREF  *    00000000
.DIOSIZ                0000001C     IPTENT$                00000014
.EFFECT                0000001C     MAXAGE                 00000004
.HIOSIZ                00000010     ONESEC                 00030090
.HOOSIZ                00000180     ONETIK                 000009C4
```

```
.ICOS                    0000000A   OPTENT$                00000004
.IEFF                    00000018   PAAR                   00000014
.ISCALE                  00000006   PACR                   0000000C
.ISIN                    0000000E   PADDR                  00000004
.KWH                     00000024   PADR                   00000010
.PIOSIZ                  0000003F   PBAR                   00000016
.RBFSIZ                  00000400   PBCR                   0000000E
.SAMPLE                  00000002   PBDDR                  00000006
.SCALE1                  00000004   PBDR                   00000012
.SCALE2                  00000008   PCDDR                  00000008
.SCALE3                  0000000C   PCDR                   00000018
.SCALE4                  00000010   PGCR                   00000000
.SINE                    00000018   PIVR                   0000000A
.STEMP                   0000001C   PROM                   00000009
.TEMP                    00000012   PSCAL                  00000004
.TOFSET                  0000000E   PSR                    0000001A
.TSCALE                  0000000A   PSRR                   00000002
.VCOS                    00000002   PTRCAL          9      00000164
.VEFF                    00000014   PTRDNT          9      000001C6
.VSCALE                  00000002   PULL     MACR   *
.VSIN                    00000006   PUSH     MACR   *
.WATTS                   00000020   PWRCAL   XDEF   9      00000000
.WATTSEC                 00000022   PWRERR          9      00000118
AIB$       XREF   5      00000000   PWRXIT          9      0000010E
AIBENT$                  00000026   RAM                    00000005
CNTR                     0000002E   S60                    0000390F
CPR                      00000024   SPACE                  00000020
CR                       0000000D   STX                    00000002
DIB$       XREF   5      00000000   TCR                    00000020
DIBENT$                  00000026   TIVR                   00000022
DSFTENT$                 00000010   TSR                    00000034
EEPROM                   00000007   V0                     00000000
EOT                      00000004   VA              9      0000015A
ETX                      00000003   VARS            9      00000140
F$ASMPL                  00004000   VECTOR          9      00000120
F$DNUT                   00000400   WATTS           9      00000126
F$KYBD                   00000100   Z_L1.000        9      00000040
F$MON                    00000080   Z_L1.003        9      000000EC
F$OST                    00001000   Z_L1.005        9      00000062
F$PCI                    00000800   Z_L1.007        9      000000A0
F$PROC                   00002000   Z_L1.011        9      000000BA
F$XMIT                   00000200   Z_L1.015        9      000000CC
FF                       0000000C   Z_L1.018        9      0000010C
FFPADD     XREF   9      00000000   Z_L1.021        9      0000011A
FFPDIV     XREF   9      00000000   Z_L2.001        9      000000F8
FFPIFP     XREF   9      00000000   Z_L2.010        9      000000BA
FFPMUL     XREF   9      00000000   Z_L2.014        9      000000D4
FFPSUB     XREF   9      00000000   Z_L2.017        9      00000004
FUNC                     00000003   Z_L2.023        9      000001EE
```

```
QUEINI  IDNT    0.2                     QUEUE INITIALIZER    1/19/83
        OPT     PCS,FRS,BRS
*
* SUBROUTINE:   QUEINI
*
* STARTED:      1/19/83
*
* AUTHOR:       D. A. ZEICHNER
*
* PURPOSE:      BUILD A QUEUE HEADER BLOCK OF THE FORMAT:
*
*                            DS.W   QUEUE HEAD POINTER
*                            DS.W   QUEUE TAIL POINTER
*                            DS.W   END OF QUEUE POINTER
*                            DS.W   QUEUE STATUS WORD
*                            DS.B   DATA SPACE
```

```
                          *
                          * INPUTS:        A0 - POINTER TO START OF QUEUE HEADER BLOCK.
                          *                D0 - # OF ELEMENTS IN QUEUE. (SIZE IS WORD IF
                          *                     BIT 15 IS SET, ELSE BYTE)
                          *
                          * OUTPUTS:       D0, D1, A1 DESTROYED. ALL OTHERS PRESERVED.
                          *
                          * EXTERNAL REFERENCES/DEFINITIONS:
                          *
                                  XDEF     QUEINI
                          *
                          * LOCAL ASSIGNMENTS:
                          *
            00000000      QHEAD   EQU      0                    OFFSET TO QUEUE HEAD POINTER
            00000002      QTAIL   EQU      2                    OFFSET TO QUEUE TAIL POINTER
            00000004      QEND    EQU      4                    OFFSET TO END OF QUEUE POINTER
            00000007      QSTAT   EQU      7                    OFFSET TO QUEUE STATUS BYTE
            00000001      QSIZE   EQU      1                    QUEUE ELEMENT SIZE BIT
                          *
                          *
            00000009              SECTION  PROM
                          *
9 00000000 42680006       QUEINI  CLR.W    QSTAT-1(A0)          CLEAR QUEUE STATUS & PRECEEDING BYTE
9 00000004 43E80008               LEA      8(A0),A1             CALCULATE START OF QUEUE DATA
9 00000008 3089                   MOVE.W   A1,QHEAD(A0)         & INIT HEAD & TAIL PTRS
9 0000000A 31490002               MOVE.W   A1,QTAIL(A0)
                          *
9 0000000E 0800000F               BTST     #15,D0               MSB SET?
                                  IF       <NE> THEN
9 00000014 E340                     ASL      #1,D0              SIZE WAS WORD - MULT. D0 BY 2
9 00000016 08E800010007             BSET     #1,QSTAT(A0)       SET WORD FLAG IN STATUS BYTE
                                  ENDI
9 0000001C                Z_L1.000
                          *
9 0000001C 43F10000               LEA      (A1,D0),A1           CALC. END OF QUEUE
9 00000020 31490004               MOVE.W   A1,QEND(A0)          STORE END OF QUEUE POINTER
9 00000024 4E75                   RTS                           & RETURN
                          *
                          *
                                  END

****** TOTAL ERRORS       0--
****** TOTAL WARNINGS     0--
```

SYMBOL TABLE LISTING

| SYMBOL NAME | SECT | VALUE | SYMBOL NAME | SECT | VALUE |
|---|---|---|---|---|---|
| .1SEC | | 0000000A | F$MON | | 00000060 |
| .AIQSIZ | | 00000038 | F$OST | | 00001000 |
| .AOQSIZ | | 00000038 | F$PDI | | 00000800 |
| .COSINE | | 00000014 | F$PROC | | 00002000 |
| .DIQSIZ | | 0000001C | F$XMIT | | 00000200 |
| .EFFECT | | 0000001C | FF | | 0000000C |
| .HIQSIZ | | 000000C8 | HT | | 00000009 |
| .HOQSIZ | | 00000180 | IPTENT$ | | 00000014 |
| .ICOS | | 0000000A | MAXAGE | | 00000004 |
| .IEFF | | 00000018 | ONESEC | | 00030090 |
| .ISCALE | | 00000006 | ONETIK | | 000009C4 |
| .ISIN | | 0000000E | OPTENT$ | | 00000004 |
| .KWH | | 00000024 | PAAR | | 00000014 |
| .PIQSIZ | | 0000003F | PACR | | 0000000C |
| .REFSIZ | | 00000400 | PADDR | | 00000004 |
| .SAMPLE | | 00000002 | PADR | | 00000010 |

```
.SCALE1          00000004    PBAR                  00000016
.SCALE2          00000008    PBCR                  0000000E
.SCALE3          0000000C    PBDDR                 00000006
.SCALE4          00000010    PBDR                  00000012
.SINE            00000018    PCDDR                 0000000E
.STEMP           0000001C    PCDR                  00000018
.TEMP            00000012    PGCR                  00000000
.TOFSET          0000000E    PIVR                  0000000A
.TSCALE          00000004    PROM                  00000009
.VCOS            00000002    PSR                   0000001A
.VEFF            00000014    PSRR                  00000002
.VSCALE          00000002    PULL      MACR   x
.VSIN            00000006    PUSH      MACR   x
.WATTS           00000020    QEND                  00000004
.WATTSEC         00000022    QHEAD                 00000000
AIBENT$          00000026    QSIZE                 00000001
CNTR             0000002E    QSTAT                 00000007
CPR              00000024    QTAIL                 00000002
CR               0000000D    QUEINI    XDEF   9    00000000
CTRL13           00000000    RAM                   00000005
CTRL2            00000002    S60                   000039DF
DIBENT$          00000026    SPACE                 00000020
DSFTENT$         00000010    STX                   00000002
EEPROM           00000007    TCR                   00000020
EOT              00000004    TIMR1                 00000004
ETX              00000003    TIMR2                 00000008
F$ASMPL          00004000    TIMR3                 0000000C
F$DMUT           00000400    TIVR                  00000022
F$EEPM           00000040    TSR                   00000034
F$KYED           00000100    Z_L1.000         9    0000001C
```

```
                   RCVCHR   IDNT    0,2              Auxiliary port character receiver  1/14/83
                            OPT     PCS,BRS
                   *
                   *
                   * SUBROUTINE:    RCVCHR
                   *
                   * REVISED:       1/14/83
                   *
                   * AUTHOR:        D. A. ZEICHNER
                   *
                   * PURPOSE:       GET A CHARACTER FROM THE AUX INPUT QUEUE &
                   *                UPDATE INCOMING CRC WORD.
                   *
                   * INPUTS:        D7 - CRC WORD TO UPDATE
                   *
                   * OUTPUTS:       D0 - CHARACTER RECEIVED
                   *                D7 - UPDATED CRC (IF CHARACTER RECEIVED)
                   *                CARRY SET IF TIMEOUT (100MS BEFORE CHARACTER REC'D)
                   *                ALL OTHER REGISTERS DESTROYED
                   *
                   * EXTERNAL REFERENCES/DEFINITIONS:
                   *
                            XDEF    RCVCHR
                   *
                   * RAM REFERENCES:
                   *
                            XREF.S  5:AUXIO$
                   *
                   * EPROM (PROGRAM) REFERENCES:
                   *
                            XREF.S  9:CRC16
                            XREF.S  9:DEQUE
                   *
                   *
        00000009            SECTION  PROM
```

```
              x
9 00000000 41FAFFFE  RCVCHR  LEA     AUXIQ$(PC),A0   GET POINTER TO AUX INPUT QUEUE
9 00000004 4EBAFFFA          JSR     DEQUE(PC)       GET CHARACTER FROM QUEUE
9 00000008 641A              BCC     RCVOK           GOT CHARACTER - UPDATE CRC
              x
              x SET UP TO WAIT FOR 100 MS. OR AUX INPUT QUEUE
              x NOT EMPTY FLAG.
              x
9 0000000A                   PUSH    D7/A0           SAVE D7 & A0 THRU TASK CHANGE
9 0000000E 303C0800          MOVE    #F$PDI,D0       WAIT FOR PROGRAMMING DATA IN (Q NOT MT)
9 00000012 720A              MOVEQ   #10,D1          OR 10 TICKS (100 MS.)
9 00000014                   XSVC    SUSPEN
9 00000018                   PULL    D7/A0           RESTORE CRC & QUEUE POINTER
9 0000001C 4EBAFFE2          JSR     DEQUE(PC)       GET CHARACTER FROM QUEUE
9 00000020 6402              BCC     RCVOK           GOT CHARACTER - UPDATE CRC
              x
              x COULDN'T GET CHARACTER FROM QUEUE AFTER
              x 100 MS. EXIT WITH CARRY SET. (DONE BY DEQUE)
              x
9 00000022 4E75      RCVXIT  RTS                     & RETURN
              x
9 00000024 4EBAFFDA  RCVOK   JSR     CRC16(PC)       GOT CHARACTER - UPDATE CRC
9 00000028 60F8              BRA     RCVXIT          & FINISH UP
              x
              x
                             END

xxxxxx TOTAL ERRORS     0--
xxxxxx TOTAL WARNINGS   0--
```

SYMBOL TABLE LISTING

| SYMBOL NAME | SECT | VALUE | SYMBOL NAME | SECT | VALUE |
|---|---|---|---|---|---|
| .1SEC | | 0000000A | EX$TSK | | 00000002 |
| .AIQSIZ | | 00000038 | EXEC | | 00000000 |
| .AOQSIZ | | 00000038 | F$ASMPL | | 00004000 |
| .COSINE | | 00000014 | F$DNUT | | 00000400 |
| .DIQSIZ | | 0000001C | F$KYBD | | 00000100 |
| .EFFECT | | 0000001C | F$MON | | 00000080 |
| .HIQSIZ | | 00000010 | F$OST | | 00001000 |
| .HOQSIZ | | 00000180 | F$PDI | | 00000800 |
| .ICOS | | 0000000A | F$PROC | | 00002000 |
| .IEFF | | 00000018 | F$XMIT | | 00000200 |
| .ISCALE | | 00000006 | FF | | 0000000C |
| .ISIN | | 0000000E | HT | | 00000009 |
| .KWH | | 00000024 | IPTENT$ | | 00000014 |
| .PIQSIZ | | 0000003F | MAXAGE | | 00000004 |
| .RBFSIZ | | 00000400 | NEXTSK | | 00000030 |
| .SAMPLE | | 00000002 | ONESEC | | 0003D090 |
| .SCALE1 | | 00000004 | ONETIK | | 000009C4 |
| .SCALE2 | | 00000008 | OPTENT$ | | 00000004 |
| .SCALE3 | | 0000000C | PAAR | | 00000014 |
| .SCALE4 | | 00000010 | PACR | | 0000000C |
| .SINE | | 00000018 | PADDR | | 00000004 |
| .SPNJP | MACR | x | PADR | | 00000010 |
| .STEMP | | 0000001C | PBAR | | 00000016 |
| .TEMP | | 00000012 | PBCR | | 0000000E |
| .TOFSET | | 0000000E | PBDDR | | 00000006 |
| .TSCALE | | 0000000A | PBDR | | 00000012 |
| .VCOS | | 00000002 | PCDDR | | 00000008 |
| .VEFF | | 00000014 | PCDR | | 00000018 |
| .VSCALE | | 00000002 | PGCR | | 00000000 |
| .VSIN | | 00000006 | PIVR | | 0000000A |

```
.WATTS                  00000020   PROM               00000009
.WATTSEC                00000022   PSR                0000001A
AIBENT$                 00000026   PSRR               00000002
AUXIO$     XREF    5    00000000   PULL      MACR  *
CHGENT                  00000034   PUSH      MACR  *
CNTR                    0000002E   RAM                00000005
CPR                     00000024   RCVCHR    XDEF  9  00000000
CR                      0000000D   RCVOK           9  00000024
CRC16      XREF    9    00000000   RCVXIT          9  00000022
DEQUE      XREF    9    00000000   RDYALL             00000008
DEVINI                  00000014   READY              00000004
DI$DEV                  0000000A   RELEAS             0000002C
DI$EVF                  00000000   RESERV             00000028
DI$IOM                  00000018   RESTRT             0000003C
DI$ISV                  00000006   S60                000039DF
DI$LNK                  00000016   SAV$               0000002A
DI$OWN                  00000002   SPACE              00000020
DI$PTR                  00000012   STX                00000002
DI$QUE                  0000000E   SUSPEN             0000000C
DI$RSO                  0000001A   TCR                00000020
DI$SIZ                  00000020   TIVR               00000022
DI$STA                  0000001C   TK$CON             00000012
DI$USR                  0000001E   TK$ENT             00000004
DIBENT$                 00000026   TK$ID              00000000
DSFTENT$                00000010   TK$LPT             00000016
EEPROM                  00000007   TK$NXT             0000001A
EOT                     00000004   TK$RSO             0000001E
EQS        MACR    *               TK$SIZ             00000022
ETX                     00000003   TK$SSP             00000008
EX$DV0                  0000000A   TK$STF             0000000C
EX$DV1                  0000000E   TK$STM             0000000E
EX$DV2                  00000012   TK$TIM             00000010
EX$DV3                  00000016   TSKEND             00000038
EX$DV4                  0000001A   TSKINI             00000010
EX$DV5                  0000001E   TSR                00000034
EX$DV6                  00000022   WAIT               0000001C
EX$DV7                  00000026   WAITCN             00000020
EX$NXT                  00000006   WAITLP             00000024
EX$SIZ                  0000002A   WAKEUP             00000018
EX$TIM                  00000000   XSVC      MACR  *
```

```
ROUND   IDNT    0,1                      ROUND FLOATING POINT VALUE    1/19/83
        OPT     FCS,BRS
*
* SUBROUTINE:   ROUND
*
* REVISED:      1/19/83
*
* AUTHOR:       D. A. ZEICHNER
*
* PURPOSE:      ROUND A NUMBER IN MOTOROLA FFP FORMAT AND CONVERT TO
*               INTEGER FORMAT. ROUNDING IS ACHIEVED BY ADDING .5 TO
*               A POSITIVE NUMBER, OR SUBTRACTING .5 FROM A NEGATIVE
*               NUMBER.
*
* INPUTS:       D7 - FLOATING POINT NUMBER TO BE ROUNDED
*
* OUTPUTS:      D7 - ROUNDED INTEGER. D5, D6 DESTROYED.
*
* EXTERNAL REFERENCES/DEFINITIONS:
*
        XDEF    ROUND
*
* EPROM (PROGRAM) REFERENCES:
*
        XREF.S  9:FFPADD
        XREF.S  9:FFPFPI
```

```
                        *
                        * LOCAL ASSIGNMENTS:
                        *
                        K.5      EQU     $80000040          CONSTANT .5
                        *
                        *
           00000009              SECTION PROM
                        *
9 00000000 4A87         ROUND    TST.L   D7
9 00000002 6716                  BEQ     RNDXIT             INCOMING VALUE IS ZERO - QUIT NOW
                        *
9 00000004 2C3C80000040          MOVE.L  #K.5,D6
9 0000000A 4A07                  TST.B   D7
9 0000000C 6A04                  BPL     RNDO               VALUE IS POSITIVE - GO ADD CONSTANT
9 0000000E 08C60007              BSET    #7,D6              VALUE IS NEGATIVE - MAKE CONSTANT NEGATIVE
                        *
9 00000012 4EBAFFEC     RNDO     JSR     FFPADD(PC)         ADD CONSTANT
9 00000016 4EBAFFE8              JSR     FFPFPI(PC)         & CONVERT TO INTEGER
                        *
9 0000001A 4E75         RNDXIT   RTS
                        *
                        *
                                 END
```

xxxxxx TOTAL ERRORS 0--
xxxxxx TOTAL WARNINGS 0--

SYMBOL TABLE LISTING

| SYMBOL NAME | SECT | VALUE | SYMBOL NAME | SECT | VALUE |
|---|---|---|---|---|---|
| .1SEC | | 0000000A | F$MON | | 00000080 |
| .AIDSIZ | | 00000038 | F$OST | | 00001000 |
| .AOQSIZ | | 00000038 | F$PDI | | 00000800 |
| .COSINE | | 00000014 | F$PROC | | 00002000 |
| .DIQSIZ | | 0000001C | F$XMIT | | 00000200 |
| .EFFECT | | 0000001C | FF | | 0000000C |
| .HIQSIZ | | 00000010 | FFPADD | XREF 9 | 00000000 |
| .HOQSIZ | | 00000180 | FFPFPI | XREF 9 | 00000000 |
| .ICOS | | 0000000A | HT | | 00000009 |
| .IEFF | | 00000018 | IFTENT$ | | 00000014 |
| .ISCALE | | 00000006 | K.5 | | 80000040 |
| .ISIN | | 0000000E | MAXAGE | | 00000004 |
| .KWH | | 00000024 | ONESEC | | 0003D090 |
| .PIQSIZ | | 0000003F | ONETIK | | 000009C4 |
| .RBFSIZ | | 00000400 | OPTENT$ | | 00000004 |
| .SAMPLE | | 00000002 | PAAR | | 00000014 |
| .SCALE1 | | 00000004 | PACR | | 0000000C |
| .SCALE2 | | 00000008 | PADDR | | 00000004 |
| .SCALE3 | | 0000000C | PADR | | 00000010 |
| .SCALE4 | | 00000010 | PBAR | | 00000016 |
| .SINE | | 00000018 | PBCR | | 0000000E |
| .STEMP | | 0000001C | PBDDR | | 00000006 |
| .TEMP | | 00000012 | PBDR | | 00000012 |
| .TOFSET | | 0000000E | PCDDR | | 00000008 |
| .TSCALE | | 0000000A | PCDR | | 00000018 |
| .VCOS | | 00000002 | PGCR | | 00000000 |
| .VEFF | | 00000014 | PIVR | | 0000000A |
| .VSCALE | | 00000002 | PROM | | 00000009 |
| .VSIN | | 00000006 | PSR | | 0000001A |
| .WATTS | | 00000020 | PSRR | | 00000002 |
| .WATTSEC | | 00000022 | PULL | MACR * | |
| AIBENT$ | | 00000026 | PUSH | MACR * | |
| CNTR | | 0000002E | RAM | | 00000005 |

```
CPR           00000024     RNDO           9   00000012
CR            0000000D     RNDXIT         9   0000001A
DIBENT$       00000026     ROUND   XDEF   9   00000000
DSFTENT$      00000010     S60                000039DF
EEPROM        00000007     SPACE              00000020
EOT           00000004     STX                00000002
ETX           00000003     TCR                00000020
F$ASMPL       00004000     TIVR               00000022
F$DOUT        00000400     TSR                00000034
F$KYBD        00000100

                           EEPROM   IDNT    0,4              EEPROM definitions  3/09/83
                                    OPT     PCS,CRS
                           *
                           * EEPROM TABLE DEFINITIONS
                           *
                           * EXTERNAL REFERENCES/DEFINITIONS:
                           *
                                    XDEF    CPUERR
                                    XDEF    DSFT$
                                    XDEF    EPMEND
                                    XDEF    EPMSTR
                                    XDEF    RSTERR
                                    XDEF    IPT$
                                    XDEF    OPT$
                                    XDEF    RAMERR
                                    XDEF    ROMERR
                                    XDEF    SITEID
                           *
             00000007               SECTION EEPROM
                           *
  7          00000000      EPMSTR   EQU     *                START OF EEPROM
  7          00000FFE      EPMEND   EQU     *+$FFE           ADR OF EEPROM CRC
                           *
                           * I.D. TABLE:
                           *
  7 00000000 00000001      RAMERR   DS.B    1                # OF RAM FAILURES
  7 00000001 00000001      ROMERR   DS.B    1                # OF PROM/EEPROM FAILURES
  7 00000002 00000001      RSTERR   DS.B    1                # OF RESTARTS OCCURRED
  7 00000003 00000001      CPUERR   DS.B    1                # OF CPU FAILURES
  7 00000004 0000000C               DS.B    12               EXPANSION
  7 00000010 00000010      SITEID   DS.B    16               SITE NAME
                           *
                           * INPUT PERSONALITY TABLE:
                           *
  7 00000020 000003C0      IPT$     DS.B    48*IPTENT$       48 ENTRIES
                           *
                           * DOUNT SCALE FACTOR TABLE:
                           *
  7 000003E0 00000100      DSFT$    DS.B    16*DSFTENT$      16 ENTRIES
                           *
                           * OUTPUT PERSONALITY TABLE:
                           *
  7 000004E0 00000100      OPT$     DS.B    64*4             64 ENTRIES
                           *
                           *
                                    END

****** TOTAL ERRORS      0--
****** TOTAL WARNINGS    0--

SYMBOL TABLE LISTING

SYMBOL NAME   SECT  VALUE        SYMBOL NAME   SECT  VALUE

.1SEC               0000000A     F$EEPM              00000040
.AIQSIZ             00000038     F$KYBD              00000100
.AOQSIZ             00000038     F$MON               00000080
```

```
.COSINE       00000014    F$DST                  00001000
.DIQSIZ       0000001C    F$FDI                  00000800
.EFFECT       0000001C    F$PROC                 00002000
.HIQSIZ       000000C8    F$XMIT                 00000200
.HOQSIZ       00000150    FF                     0000000C
.ICOS         0000000A    HT                     00000009
.IEFF         00000018    IPT$       XDEF   7    00000020
.ISCALE       00000006    IPTENT$                00000014
.ISIN         0000000E    MAXAGE                 00000004
.KWH          00000024    ONESEC                 0003D090
.PIQSIZ       0000003F    ONETIK                 000009C4
.RBFSIZ       00000400    OPT$       XDEF   7    000004E0
.SAMPLE       00000002    OPTENT$                00000004
.SCALE1       00000004    PAAR                   00000014
.SCALE2       00000008    PACR                   0000000C
.SCALE3       0000000C    PADDR                  00000004
.SCALE4       00000010    PADR                   00000010
.SINE         00000018    PBAR                   00000016
.STEMP        0000001C    PBCR                   0000000E
.TEMP         00000012    PBDDR                  00000006
.TOFSET       0000000E    PBDR                   00000012
.TSCALE       0000000A    PCDDR                  00000008
.VCOS         00000002    PCDR                   00000018
.VEFF         00000014    PGCR                   00000000
.VSCALE       00000002    PIVR                   0000000A
.VSIN         00000006    PROM                   00000009
.WATTS        00000020    PSR                    0000001A
.WATTSEC      00000022    PSRR                   00000002
AIBENT$       00000026    PULL       MACR   x
CNTR          0000002E    PUSH       MACR   x
CPR           00000024    RAM                    00000005
CPUERR XDEF 7 00000003    RAMERR     XDEF   7    00000000
CR            0000000D    ROMERR     XDEF   7    00000001
CTRL13        00000000    RSTERR     XDEF   7    00000002
CTRL2         00000002    S60                    0000390F
DIBENT$       00000026    SITEID     XDEF   7    00000010
DSFT$  XDEF 7 000003E0    SPACE                  00000020
DSFTENT$      00000010    STX                    00000002
EEPROM        00000007    TCR                    00000020
EOT           00000004    TIMR1                  00000004
EPMEND XDEF 7 00000FFE    TIMR2                  00000008
EPMSTR XDEF 7 00000000    TIMR3                  0000000C
ETX           00000003    TIVR                   00000012
F$ASMPL       00004000    TSR                    00000034
F$DMUT        00000400

                         RTIEQU/SCRAP:NO),SCRAP:NOX,SCRAP:NO):RDSZ=100

xxxxxx ERROR   310--
 155                     SCRAP   IDNT    0,0                  SCRATCH / STACK AREA (DEBUG)
 156                             OPT     PCS,FRS,BRS
 157                     x
 158                     x THIS IS JUST A SCRATCH AREA THAT WE CAN
 159                     x USE FOR ANYTHING WE WANT WHILE DEBUGGING
 160                     x IN THE XORMAX. (SYMBUG NEEDS DECLARED MEMORY)
 161                     x
 162                     x EXTERNAL REFERENCES/DEFINITIONS:
 163                     x
 164                             XDEF    STACK
 165                             XDEF    STUB
 166                     x
 167                             XREF.S  SINGEN
 168                     x
 170                     x
 171          00000009           SECTION PROM
 172                     x
 173 9 00000000 000000FE         DS.B    $FE
 174 9 000000FE 00000002 STACK   DS.B    2                    TOP OF STACK
```

```
175                            *
176                            * BY DECLARING THE STACK AS ABOVE, STUB FALLS ON A PAGE BOUNDARY.
177                            *
178                            * THIS LOOP PUTS SAMPLE DATA IN ALL THE BUFFERS IN THE INPUT
179                            * SEQUENCE TABLE. AFTER USE, THIS AREA MAY BE USED AS SCRATCH
180                            * SPACE.
181                            *
182 9 00000100 4DF8011A        STUB    LEA     BUFLST,A6         GET ADDRESS OF BUFFER LIST
183 9 00000104 305E                    MOVE    (A6)+,A0
184                            *
185 9 00000106 303C07FF        SLOOP   MOVE    #$7FF,D0
186 9 0000010A 4EB80000                JSR     SINGEN            INITIALIZE BUFFER
187 9 0000010E 305E                    MOVE    (A6)+,A0          GET POINTER TO NEXT BUFFER
188 9 00000110 B0FC0000                CMP     #0,A0
189 9 00000114 66F0                    BNE     SLOOP
190                            *
191 9 00000116 4E71                    NOP                       END OF INITIALIZER
192 9 00000118 4E71                    NOP
193                            *
194 9 0000011A 0404042A0450 BUFLST     DC.W    $404,$42A,$450,$476,$49C,$4C2,$580,$5A6,$5CC
195 9 00000120 04EB050E0534            DC.W    $4E8,$50E,$534,$55A
196 9 00000134 0A400A660A8C            DC.W    $A40,$A66,$A8C,$7CE,$9F4,$A1A
197 9 00000140 0000                    DC.W    0
198                            *
199 9 00000142 00000200                DS.W    $100              MORE USER SCRATCH SPACE
200                            *
201                            *
202                                    END

****** TOTAL ERRORS       1--    0
****** TOTAL WARNINGS     0--    0
```

SYMBOL TABLE LISTING

| SYMBOL NAME | SECT | VALUE | CROSS-REF (LINENUMBERS) |
|---|---|---|---|
| .1SEC | | 0000000A | -14 |
| .AIQSIZ | | 00000038 | -80 |
| .AOQSIZ | | 00000038 | -81 |
| .COSINE | | 00000014 | -44 |
| .DIQSIZ | | 0000001C | -82 |
| .EFFECT | | 0000001C | -43 |
| .HOQSIZ | | 00000180 | -84 |
| .ICOS | | 0000000A | -51 |
| .IEFF | | 00000018 | -55 |
| .ISCALE | | 00000006 | -67 |
| .ISIN | | 0000000E | -52 |
| .KWH | | 00000024 | -62 |
| .PIQSIZ | | 0000003F | -83 |
| .REFSIZ | | 00000400 | -85 |
| .SAMPLE | | 00000002 | -42 |
| .SCALE1 | | 00000004 | -73 |
| .SCALE2 | | 00000008 | -74 |
| .SCALE3 | | 0000000C | -75 |
| .SCALE4 | | 00000010 | -76 |
| .SINE | | 00000018 | -45 |
| .STEMP | | 0000001C | -56 |
| .TEMP | | 00000012 | -53 |
| .TOFSET | | 0000000E | -69 |
| .TSCALE | | 0000000A | -68 |
| .VCOS | | 00000002 | -49 |
| .VEFF | | 00000014 | -54 |
| .VSCALE | | 00000002 | -66 |
| .VSIN | | 00000006 | -50 |
| .WATTS | | 00000020 | -60 |
| .WATTSEC | | 00000022 | -61 |

```
AIBENT$             00000026   -33
BUFLST         9    0000011A   -194   182
CNTR                0000002E   -117
CPR                 00000026   -116
CR                  0000000D    -25
DIBENT$             00000026    -32
DSFTENT$            00000010    -36
EEPROM              00000007     -7
EOT                 00000004    -22
ETX                 00000003    -21
F$ASMPL             00004000    -89
F$DNUT              00000400    -93
F$KYBD              00000100    -95
F$MON               00000080    -96
F$OST               00001000    -91
F$PDI               00000600    -92
F$PROC              00002000    -90
F$XMIT              00000200    -94
FF                  0000000C    -24
HT                  00000009    -23
IPTENT$             00000014    -34
ONESEC              0003D090    -13
ONETIK              000009C4    -15
OPTENT$             00000004    -35
PAAR                00000014   -110
PACR                0000000C   -106
PADDR               00000004   -102
PADR                00000010   -108
PBAR                00000016   -111
PBCR                0000000E   -107
PBDDR               00000006   -103
PBDR                00000012   -109
PCDDR               00000008   -104
PCDR                00000018   -112
PGCR                00000000   -100
PIVR                0000000A   -105
PROM                00000009     -6   171
PSR                 0000001A   -113
PSRR                00000002   -101
PULL      MACR x               -139
PUSH      MACR x               -124
RAM                 00000005     -8
S60                 0000390F    -12
SINGEN    XREF x    00000000   -167   166
SLGOP          9    00000106   -185   189
SPACE               00000020    -26
STACK     XDEF 9    000000FE   -174  -164
STUB      XDEF 9    00000100   -182  -165
STX                 00000002    -20
TCR                 00000020   -114
TIVR                00000022   -115
TSR                 00000034   -118
```

```
        RTIRAM  IDNT    0,5                     RII ram definition  2/03/83
                OPT     FLS
        *
        *
        * EXTERNAL REFERENCES/DEFINITIONS:
        *
        * TABLES/BUFFERS:
        *
                XDEF    AIB$
                XDEF    CSM$
                XDEF    DIB$
                XDEF    IST$
        *
        * QUEUES:
```

```
                           *
                                   XDEF     AUXIO$
                                   XDEF     AUXOO$
                                   XDEF     DNTIO$
                                   XDEF     HSTIO$
                                   XDEF     HSTOO$
                                   XDEF     PRCIO$
                                   XDEF     RCVBUF
                           *
                           * TASKS:
                           *
                                   XDEF     T_ANALOG
                                   XDEF     T_DIAG
                                   XDEF     T_DONUT
                                   XDEF     T_KB
                                   XDEF     T_OFFLOD
                                   XDEF     T_OUTPUT
                                   XDEF     T_PROCES
                                   XDEF     T_XMON
                           *
                           * STACKS:
                           *
                                   XDEF     S_ANALOG
                                   XDEF     S_DIAG
                                   XDEF     S_DONUT
                                   XDEF     S_KB
                                   XDEF     S_OFFLOD
                                   XDEF     S_OUTPUT
                                   XDEF     S_PROCES
                                   XDEF     S_XMON
                           *
                                   XDEF     AUXTRAK
                                   XDEF     EX.RAM
                                   XDEF     HOSTRAK
                                   XDEF     RAMEND
                                   XDEF     RAMSTR
                                   XDEF     RAMTBL
                           *
                           *
            00000005               SECTION  5                   RAM SECTION
                           *
5           00000000       RAMSTR  EQU      *
5           00004000       RAMEND  EQU      *+$4000             16KB OF RAM FOR NOW
                           *
                           * ANALOG INPUT BUFFERS:
                           *
5 00000000 00000720        AIB$    DS.B     AIBENT$*48          48 ANALOG INPUT BUFFERS
                           *
                           * DIGITAL INPUT BUFFERS:
                           *
5 00000720 00000260        DIB$    DS.B     DIBENT$*16          16 DIGITAL INPUT BUFFERS
                           *
                           * INPUT SEQUENCE TABLE:
                           *
5 00000980 000000D2        IST$    DS.W     105                 105 WORDS FOR INPUT SEQ. TABLE
                           *
                           * CLUSTER STATUS MASKS & MAP.
                           *
                           * NOTE: THE 1ST 5 GROUPS OF 3 WORDS
                           *       EACH ARE THE CLUSTER STATUS
                           *       MASKS 0-4, AND THE LAST 3
                           *       WORDS ARE THE CLUSTER STATUS
                           *       MAP.
                           *
5 00000A52 00000024        CSM$    DS.W     18                  CLUSTER STATUS MASKS & MAP
                           *
```

```
                              *
                              * QUEUES:
                              *
5 00000A76 00000008      AUXIQ$   DS.W    4              PROGRAMMING PORT (AUX) INPUT QUEUE
5 00000A7E 00000038               DS.B    .AIQSIZ
                              *
5 00000AB6 00000008      AUXOQ$   DS.W    4              PROGRAMMING PORT (AUX) OUTPUT QUEUE
5 00000ABE 00000038               DS.B    .AOQSIZ
                              *
5 00000AF6 00000008      DNTIQ$   DS.W    4              DONUT RECEIVER QUEUE
5 00000AFE 00000038               DS.W    .DIQSIZ        (ELEMENT SIZE IS WORD, NOT BYTE)

                              *
5 00000B36 00000008      HSTIQ$   DS.W    4              INPUT QUEUE FROM HOST (XMTMON)
5 00000B3E 000000C8               DS.B    .HIQSIZ

                              *
5 00000C06 00000008      HSTOQ$   DS.W    4              OUTPUT QUEUE TO HOST
5 00000C0E 00000180               DS.B    .HOQSIZ
                              *
5 00000D8E 00000008      PRCIQ$   DS.W    4              PROCESS INPUT QUEUE
5 00000D96 0000007E               DS.W    .PIQSIZ        (ELEMENT SIZE IS WORD, NOT BYTE)
                              *
5 00000E14 00000400      RCVBUF   DS.B    .RBFSIZ        DOWNLOAD BUFFER (NOT REALLY QUEUE)
                              *
                              * ACIA STATUS TRACKING REGISTERS:
                              *
5 00001214 00000001      AUXTRAK  DS.B    1              AUX ACIA TRACKING REGISTER
5 00001215 00000001      HOSTRAK  DS.B    1              HOST ACIA TRACKING REGISTER
                              *
                              * TASK FRAMES:
                              *
5 00001216 00000022      T_ANALOG DS.B    TK$SIZ         A/D PROCESSING TASK
5 00001238 00000022      T_DONUT  DS.B    TK$SIZ         DONUT INPUT PROCESSING TASK
5 0000125A 00000022      T_OFFLOD DS.B    TK$SIZ         UP/DN LOAD TASK
5 0000127C 00000022      T_PROCES DS.B    TK$SIZ         BUFFER PROCESSING TASK
5 0000129E 00000022      T_OUTPUT DS.B    TK$SIZ         OUTPUT CALCULATIONS TASK
5 000012C0 00000022      T_KB     DS.B    TK$SIZ         KEYBOARD TASK
5 000012E2 00000022      T_XMON   DS.B    TK$SIZ         XMIT MONITOR TASK
5 00001304 00000022      T_DIAG   DS.B    TK$SIZ         DIAGNOSTIC TASK
                              *
                              * TASK STACKS:
                              *
                              * NOTE:   THESE ALLOCATIONS INCLUDE BOTH USER & SUPERVISOR STACKS.
                              *         THE SUPERVISOR STACK SIZE IS DETERMINED IN TSKINI. FOR
                              *         NOW, WE'LL USE 80 BYTES OF SPACE FOR THE SUPERVISOR STACK.
                              *         (THIS ASSUMES THAT THE EXEC DOES NOT SAVE ALL REGISTERS ON
                              *         TASK CHANGE AND THAT ALL TASKS ARE RUNNING IN USER MODE)
                              *         THE STACK FORMAT IS AS FOLLOWS:
                              *
                              *                 DS.L  USRSIZ      USER STACK SIZE
                              *         LABEL   DS.L  SUPERSIZ    SUPER STACK SIZE
                              *
5 00001326 00000190               DS.L    100
5 000014B6 00000190      S_ANALOG DS.L    100
                              *
5 00001646 00000190               DS.L    100
5 000017D6 00000190      S_DONUT  DS.L    100
                              *
5 00001966 00000190               DS.L    100
5 00001AF6 00000190      S_OFFLOD DS.L    100
                              *
5 00001C86 00000190               DS.L    100
5 00001E16 00000190      S_PROCES DS.L    100
                              *
5 00001FA6 00000190               DS.L    100
```

```
5 00002136 00000190     S_OUTPUT DS.L     100
                        *
5 000022C6 00000190              DS.L     100
5 00002456 00000190     S_KB     DS.L     100
                        *
5 000025E6 00000190              DS.L     100
5 00002776 00000190     S_XMON   DS.L     100
                        *
5 00002906 00000190              DS.L     100
5 00002A96 00000190     S_DIAG   DS.L     100
                        *
                        * RAM TABLE FOR STC PACKAGE:
                        *
5 00002C26 0000001A     RAMTBL   DS.B     26
                        *
5 00002C40 0000003C     EX.RAM   DS.L     15                    RAM FOR EXEC
                        *
                        *
                                 END

****** TOTAL ERRORS      0--
****** TOTAL WARNINGS    0--
```

SYMBOL TABLE LISTING

| SYMBOL NAME | SECT | | VALUE | SYMBOL NAME | SECT | | VALUE |
|---|---|---|---|---|---|---|---|
| .1SEC | | | 0000000A | F$XMIT | | | 00000200 |
| .AIQSIZ | | | 00000038 | FF | | | 0000000C |
| .AOQSIZ | | | 00000038 | HOSTRAK | XDEF | 5 | 00001215 |
| .COSINE | | | 00000014 | HSTIQ$ | XDEF | 5 | 00000836 |
| .DIQSIZ | | | 0000001C | HSTOQ$ | XDEF | 5 | 00000C06 |
| .EFFECT | | | 0000001C | HT | | | 00000009 |
| .HIQSIZ | | | 000000C8 | IFTENT$ | | | 00000014 |
| .HOQSIZ | | | 00000180 | IST$ | XDEF | 5 | 00000980 |
| .ICOS | | | 0000000A | MAXAGE | | | 00000004 |
| .IEFF | | | 00000018 | NEXTSK | | | 00000030 |
| .ISCALE | | | 00000006 | ONESEC | | | 0003D090 |
| .ISIN | | | 0000000E | ONETIK | | | 000009C4 |
| .KWH | | | 00000024 | OPTENT$ | | | 00000004 |
| .PIQSIZ | | | 0000003F | PAAR | | | 00000014 |
| .RBFSIZ | | | 00000400 | PACR | | | 0000000C |
| .SAMPLE | | | 00000002 | PADDR | | | 00000004 |
| .SCALE1 | | | 00000004 | PADR | | | 00000010 |
| .SCALE2 | | | 00000008 | PBAR | | | 00000016 |
| .SCALE3 | | | 0000000C | PBCR | | | 0000000E |
| .SCALE4 | | | 00000010 | PBDDR | | | 00000006 |
| .SINE | | | 00000018 | PBDR | | | 00000012 |
| .SPNJP | MACR | * | | PCDDR | | | 00000008 |
| .STEMP | | | 0000001C | PCDR | | | 00000018 |
| .TEMP | | | 00000012 | PGCR | | | 00000000 |
| .TOFSET | | | 0000000E | PIVR | | | 0000000A |
| .TSCALE | | | 0000000A | PRCIQ$ | XDEF | 5 | 000008E |
| .VCOS | | | 00000002 | PROM | | | 00000009 |
| .VEFF | | | 00000014 | PSR | | | 0000001A |
| .VSCALE | | | 00000002 | PSRR | | | 00000002 |
| .VSIN | | | 00000006 | PULL | MACR | * | |
| .WATTS | | | 00000020 | PUSH | MACR | * | |
| .WATTSEC | | | 00000022 | RAM | | | 00000005 |
| AIB$ | XDEF | 5 | 00000000 | RAMEND | XDEF | 5 | 00004000 |
| AIBENT$ | | | 00000026 | RAMSTR | XDEF | 5 | 00000000 |
| AUXIQ$ | XDEF | 5 | 00000A76 | RAMTBL | XDEF | 5 | 00002C26 |
| AUXOQ$ | XDEF | 5 | 00000A86 | RCVBUF | XDEF | 5 | 00000E14 |
| AUXTRAK | XDEF | 5 | 00001214 | RDYALL | | | 00000008 |
| CHGENT | | | 00000034 | READY | | | 00000004 |
| CNTR | | | 0000002E | RELEAS | | | 0000002C |

```
CPR                      00000024   RESERV                  00000028
CR                       0000000D   RESTRT                  0000003C
CSM$       XDEF    5     00000A52   S60                     0000390F
CTRL13                   00000000   SAV$                    0000002A
CTRL2                    00000002   SPACE                   00000020
DEVINI                   00000014   STX                     00000002
DI$DEV                   0000000A   SUSPEN                  0000000C
DI$EVF                   00000000   S_ANALOG   XDEF    5    000014E6
DI$IOM                   0000001B   S_DIAG     XDEF    5    00002A96
DI$ISV                   00000006   S_DONUT    XDEF    5    000017D6
DI$LNK                   00000016   S_KB       XDEF    5    00002456
DI$OWN                   00000002   S_OFFLOD   XDEF    5    00001AF6
DI$PTR                   00000012   S_OUTPUT   XDEF    5    00002136
DI$QUE                   0000000E   S_PROCES   XDEF    5    00001E16
DI$RSO                   0000001A   S_XMON     XDEF    5    00002776
DI$SIZ                   00000020   TCR                     00000020
DI$STA                   0000001C   TIMR1                   00000004
DI$USR                   0000001E   TIMR2                   00000008
DIB$       XDEF    5     00000720   TIMR3                   0000000C
DIBENT$                  00000026   TIVR                    00000022
DNTIR$     XDEF    5     00000AF6   TK$CON                  00000012
DSFTENT$                 00000010   TK$ENT                  00000004
EEPROM                   00000007   TK$ID                   00000000
EOT                      00000004   TK$LPT                  00000016
EOS        MACR    *                TK$NXT                  0000001A
ETX                      00000003   TK$RSO                  0000001E
EX$DV0                   0000000A   TK$SIZ                  00000022
EX$DV1                   0000000E   TK$SSP                  00000008
EX$DV2                   00000012   TK$STF                  0000000C
EX$DV3                   00000016   TK$STM                  0000000E
EX$DV4                   0000001A   TK$TIM                  00000010
EX$DV5                   0000001E   TSKEND                  00000038
EX$DV6                   00000022   TSKINI                  00000010
EX$DV7                   00000026   TSR                     00000034
EX$NXT                   00000006   T_ANALOG   XDEF    5    00001216
EX$SIZ                   0000002A   T_DIAG     XDEF    5    00001304
EX$TIM                   00000000   T_DONUT    XDEF    5    00001238
EX$TSK                   00000002   T_KB       XDEF    5    000012C0
EX.RAM     XDEF    5     00002C40   T_OFFLOD   XDEF    5    0000125A
EXEC                     00000000   T_OUTPUT   XDEF    5    0000129E
F$ASMPL                  00004000   T_PROCES   XDEF    5    0000127C
F$DNUT                   00000400   T_XMON     XDEF    5    000012E2
F$EEPM                   00000040   WAIT                    0000001C
F$KYBD                   00000100   WAITCN                  00000020
F$MON                    00000080   WAITLP                  00000024
F$OST                    00001000   WAKEUP                  00000018
F$PDI                    00000800   XSVC       MACR    *
F$PROC                   00002000
```

```
                    SINCOS   IDNT     1,0                         SINE/COSINE TABLES     1/19/83
                             OPT      PCS,BRS
                    *
                    * REVISED:        1/19/83
                    *
                    * AUTHOR:         D. A. ZEICHNER
                    *
                    * PURPOSE:        SINE & COSINE TABLES FOR USE BY XFORM
                    *
                    * EXTERNAL REFERENCES/DEFINITIONS:
                    *
                             XDEF     COSINE$
                             XDEF     SINE$
                    *
                    *
          00000009           SECTION  PROM
                    *
                    * NOTE:   SAMPLES ARE ACTUALLY TAKEN EVERY 80 DEGREES, BUT SINCE THE
```

```
                   *       SAMPLING PERIOD IS STRETCHED OUT OVER 2 CYCLES, THE EFFECT
                   *       IS THE SAME AS IF SAMPLES HAD BEEN TAKEN EVERY 40 DEGREES
                   *       OVER THE SPACE OF A SINGLE CYCLE.
                   *
                   *       THE ORDER OF THE ENTRIES IN THE TABLES REFLECTS THE ACTUAL
                   *       ORDER IN WHICH THE SAMPLES ARE TAKEN. I.E. THE 3RD ENTRY IN
                   *       THE SINE$ TABLE IS USED IN PROCESSING THE 3RD SAMPLE IN THE
                   *       ANALOG INPUT BUFFER.
                   *
                   *       THE ENTRIES IN THE TABLES ARE THE SINE(OR COSINE) OF THE ANGLE
                   *       DIVIDED BY 4.5. THE 4.5 APPEARS AS A CONSTANT IN THE FOURIER
                   *       EQUATION, AND IS INCLUDED IN THE TABLE TO AVOID UNNECESSARY
                   *       CALCULATION. (SEE EQN. SECTION OF DESIGN SPEC FOR DETAILS)
                   *
9 00000000 E38E393E  COSINE$  DC.L   $E38E393E          COS(0)/4.5
9 00000004 9E0F893C           DC.L   $9E0F893C          COS(80)/4.5
9 00000008 D5D4ED8E           DC.L   $D5D4ED8E          COS(160)/4.5
9 0000000C E38F45BD           DC.L   $E38F45BD          COS(240)/4.5
9 00000010 AE50033E           DC.L   $AE50033E          COS(320)/4.5
9 00000014 AE51F33E           DC.L   $AE51F33E          COS(400)/4.5
9 00000018 E38C38BD           DC.L   $E38C38BD          COS(480)/4.5
9 0000001C D5D585BE           DC.L   $D5D585BE          COS(560)/4.5
9 00000020 9E08FE3C           DC.L   $9E08FE3C          COS(640)/4.5
                   *
                   *
9 00000024 00000000  SINE$    DC.L   $00000000          SIN(0)/4.5
9 00000028 E0192D3E           DC.L   $E0192D3E          SIN(80)/4.5
9 0000002C 9BA8F03D           DC.L   $9BA8F03D          SIN(160)/4.5
9 00000030 C51155BE           DC.L   $C51155BE          SIN(240)/4.5
9 00000034 924582BE           DC.L   $924582BE          SIN(320)/4.5
9 00000038 924458E3           DC.L   $924458E3          SIN(400)/4.5
9 0000003C C512373E           DC.L   $C512373E          SIN(480)/4.5
9 00000040 9BA5BABD           DC.L   $9BA5BABD          SIN(560)/4.5
9 00000044 E0197ABE           DC.L   $E0197ABE          SIN(640)/4.5
                   *
                   *
                              END

****** TOTAL ERRORS      0--
****** TOTAL WARNINGS    0--
```

SYMBOL TABLE LISTING

| SYMBOL NAME | SECT | VALUE | SYMBOL NAME | SECT | VALUE |
|---|---|---|---|---|---|
| .1SEC | | 0000000A | F$ASMPL | | 00004000 |
| .AIQSIZ | | 00000038 | F$DNUT | | 00000400 |
| .AOQSIZ | | 00000038 | F$KYBD | | 00000100 |
| .COSINE | | 00000014 | F$MON | | 00000050 |
| .DIQSIZ | | 0000001C | F$OST | | 00001000 |
| .EFFECT | | 0000001C | F$PDI | | 00000800 |
| .HIQSIZ | | 00000010 | F$PROC | | 00002000 |
| .HOQSIZ | | 00000180 | F$XMIT | | 00000200 |
| .ICOS | | 0000000A | FF | | 0000000C |
| .IEFF | | 00000018 | HT | | 00000009 |
| .ISCALE | | 00000006 | IPTENT$ | | 00000014 |
| .ISIN | | 0000000E | MAXAGE | | 00000004 |
| .KWH | | 00000024 | ONESEC | | 0003D090 |
| .PIQSIZ | | 0000003F | ONETIK | | 000009C4 |
| .RBFSIZ | | 00000400 | OPTENT$ | | 00000004 |
| .SAMPLE | | 00000002 | PAAR | | 00000014 |
| .SCALE1 | | 00000004 | PACR | | 0000000C |
| .SCALE2 | | 00000008 | PADDR | | 00000004 |
| .SCALE3 | | 0000000C | PADR | | 00000010 |
| .SCALE4 | | 00000010 | PBAR | | 00000016 |
| .SINE | | 00000018 | PBCR | | 0000000E |

```
.STEMP                0000001C   PBDDR             00000006
.TEMP                 00000012   PBDR              00000012
.TOFSET               0000000E   PCDDR             00000008
.TSCALE               0000000A   PCDR              00000018
.VCOS                 00000002   PGCR              00000000
.VEFF                 00000014   PIVR              0000000A
.VSCALE               00000002   PROM              00000009
.VSIN                 00000006   PSR               0000001F
.WATTS                00000020   PSRR              00000002
.WATTSEC              00000022   PULL     MACR  x
AIBENT$               00000026   PUSH     MACR  x
CNTR                  0000002E   RAM               00000005
COSINE$   XDEF   9    00000000   S60               000039DF
CPR                   00000024   SINE$    XDEF  9  00000024
CR                    0000000D   SPACE             00000020
DIBENT$               00000026   STX               00000002
DSFTENT$              00000010   TCR               00000020
EEPROM                00000007   TIVR              00000022
EOT                   00000004   TSR               00000034
ETX                   00000003

              TBLINI  IDNT    0,2                  INITIALIZE INPUT SEQUENCE TABLE   2/16/83
                      OPT     PCS,BRS
              *
              * SUBROUTINE:    TBLINI
              *
              * STARTED:       2/16/83
              *
              * AUTHOR:        D. A. ZEICHNER
              *
              * PURPOSE:       BUILD THE INPUT SEQUENCE TABLE AND CLUSTER STATUS MASKS.
              *
              * INPUTS:        NONE.
              *
              * OUTPUTS:       INITIALIZED INPUT SEQUENCE TABLE AND CLUSTER STATUS MASKS.
              *
              * INTERNAL REGISTER ALLOCATION:
              *
              *         A0 - POINTS TO CLUSTER STATUS MAP
              *         A1 - POINTS TO INPUT PERSONALITY TABLE
              *         A2 - POINTS TO NEXT INPUT SEQUENCE TABLE ENTRY
              *         A3 - GP SCRATCH REGISTER
              *
              *         D0 - GP SCRATCH REGISTER
              *         D1 - GP SCRATCH REGISTER
              *         D4 - LAST GROUP BUILT IN INPUT SEQUENCE TABLE
              *         D5 - PRESENT INPUT PERSONALITY TABLE ENTRY #
              *         D6 - PRESENT VOLTAGE GROUP #
              *         D7 - OFFSET INTO INPUT PERSONALITY TABLE
              *
              * EXTERNAL REFERENCES/DEFINITIONS:
              *
                        XDEF     TBLINI
              *
              * RAM REFERENCES:
              *
                        XREF.S   5:AIB$
                        XREF.S   5:CSM$
                        XREF.S   5:IST$
              *
              * EEPROM REFERENCE:
              *
                        XREF     IPT$
              *
              *
      00000009          SECTION  PROM
              *
```

```
9 00000000 41FAFFFE    TBLINI   LEA     CSM#(PC),A0          A0 POINTS TO CLUSTER STATUS MAP
9 00000004 43F900000000         LEA     IPT$,A1              A1 POINTS TO INPUT PERSONALITY TABLE
9 0000000A 45FAFFF4             LEA     IST#(PC),A2          A2 POINTS TO INPUT SEQUENCE TABLE
                       *
                       * INITIALIZE IST ENTRIES TO -1.
                       *
9 0000000E 303C00CB             MOVE    #203,D0              NUMBER OF BYTES TO INIT. (-1)
                       *
9 00000012 50F20000    SETLUP   ST      (A2,D0)              SET BYTE IN TABLE TO -1
9 00000016 51C8FFFA             DBRA    D0,SETLUP            LOOP UNTIL DONE
                       *
                       * INITIALIZE CLUSTER STATUS MASKS TO 0.
                       *
9 0000001A 7023                 MOVEQ   #35,D0               NUMBER OF BYTES TO INIT. (-1)
                       *
9 0000001C 42300000    CLRLUP   CLR.B   (A0,D0)              SET BYTE TO 0.
9 00000020 51C8FFFA             DBRA    D0,CLRLUP            LOOP UNTIL DONE
                       *
                       * BUILD TABLE BY VOLTAGE GROUP #. WITHIN VOLTAGE GROUPS,
                       * SAVE VOLTAGES FIRST; THEN CURRENTS IN ORDER FOUND IN
                       * IFT.
                       *
                       * NOTE: D6 CONTAINS VOLTAGE GROUP #, AND D5
                       *         CONTAINS IPT ENTRY NUMBER.
                       *
                                FOR     D6 = #0 TO #4 DO
9 0000002A             Z_L1.001
                       *
9 0000002A 4287                   CLR.L   D7                 CLEAR IPT ENTRY OFFSET
                       *
                                  FOR     D5 = #0 TO #47 DO
9 00000032             Z_L1.003
                       *
                       * GET IPT ENTRY
                       *
9 00000032 10317000                 MOVE.B  (A1,D7),D0       GET IPT ENTRY
9 00000036 E208                     LSR.B   #1,D0            ISOLATE INPUT TYPE & GROUP #
                       *
                       * DOES IT = 0 AND GP = D6?
                       *
                                    IF.B    D0 <EQ> D6 THEN
9 0000003C 617C                       BSR     ISTINT         SAVE INPUT # & BUFFER PTR
9 0000003E 61000094                   BSR.L   SETCSM         SET APPROPRIATE BIT IN CSM
                       *
                                    ENDI
9 00000042             Z_L1.004
9 00000042 06470014                 ADD     #IPTENT$,D7      BUMP IPT OFFSET TO NEXT ENTRY
                                  ENDF                       END ENTRY
                       *
                       * NOW DO ALL CURRENTS FOR
                       * THIS VOLTAGE GROUP.
                       *
9 0000004E 4287                   CLR.L   D7                 INIT. IPT ENTRY OFFSET
                       *
                                  FOR     D5 = #0 TO #47 DO
                       *
                       * GET IPT ENTRY
                       *
9 00000056 10317000                 MOVE.B  (A1,D7),D0       GET IPT ENTRY
9 0000005A EC08                     LSR.B   #6,D0            ISOLATE INPUT TYPE
                       *
                       * IF IT = 1 (CURRENT) AND VG = GROUP (CURRENT INPUT BELONGS
                       * TO GROUP BEING PROCESSED), THEN MAKE A NEW IST ENTRY.
                       *
                                    IF.B    D0 <EQ> #1 THEN
9 00000062 10317003                   MOVE.B  3(A1,D7),D0    GET VG OF THIS ENTRY
```

```
9 00000066 02000007            AND.B   #7,D0             ISOLATE VG
                               IF.B    D0 <EQ> D6 THEN
9 0000006E 614A                  BSR     ISTINT          SET NEXT IST ENTRY
9 00000070 6162                  BSR     SETCSM          SET BIT IN CSM
                               ENDI
9 00000072             Z_L1.011
                             ENDI
9 00000072             Z_L1.009
9 00000072 06470014            ADD     #IPTENT$,D7       BUMP OFFSET TO NEXT IPT ENTRY
                             ENDF                        END ENTRY
                       *
                       * IF THE PRECEDING WORD IS $FFFF, THEN THERE WERE NO ENTRIES FOR
                       * THIS VOLTAGE GROUP. IN THIS CASE, DON'T BUMP IST$ POINTER.
                       *
                             IF      -2(A2) <NE> #$FFFF THEN
9 00000086 544A                ADDQ    #2,A2             BUMP IST POINTER TO NEXT WORD
                             ENDI
9 00000088             Z_L1.015
                           ENDF                          END GROUP
                       *
                       * BACK IST POINTER UP ONE WORD, AND
                       * APPEND TEMPERATURE INPUT (IF ANY)
                       * TO THIS LAST GROUP.
                       *
9 00000090 554A            SUBQ    #2,A2                 BACK UP IST PTR
9 00000092 4247            CLR     D7                    CLEAR OFFSET INTO IPT
9 00000094 1C04            MOVE.B  D4,D6                 SET GROUP TO LAST VALID.
                       *
                           FOR     D5 = #0 TO #17 DO
9 0000009C             Z_L1.019
9 0000009C 10317000          MOVE.B  (A1,D7),D0          GET 1ST BYTE OF IPT ENTRY
9 000000A0 EC08              LSR.B   #6,D0               ISOLATE INPUT TYPE
                       *
                             IF.B    D0 <EQ> #2 THEN
9 000000A8 6110                BSR     ISTINT            BUILD A NEW IST ENTRY
9 000000AA 6128                BSR     SETCSM            & SET THE APPROPRIATE CSM BIT
                             ENDI
9 000000AC             Z_L1.020
9 000000AC 06470014          ADD     #IPTENT$,D7         BUMP OFFSET TO NEXT IPT ENTRY
                           ENDF
                       *
9 000000B8 4E75            RTS                           THIS WAY OUT!!!!!!
                       *
                       *
                       * SUBROUTINES:
                       *
                       * ISTINT - INITIALIZES AN INPUT SEQUENCE TABLE (IST) ENTRY.
                       *          THE 1ST WORD OF THE ENTRY IS SET TO THE VALUE
                       *          IN ENTRY, AND THE 2ND WORD IS SET TO POINT TO
                       *          THE ANALOG INPUT BUFFER CORRESPONDING TO THE
                       *          ENTRY NUMBER. THE PRESENT IST ENTRY POINTER IS
                       *          ALSO INCREMENTED.
                       *
                       * INPUTS: ENTRY - INPUT NUMBER TO BE INSERTED IN LOW 5 BITS OF
                       *                 1ST WORD OF CURRENT IST ENTRY.
                       *         A2 - POINTS TO PRESENT IST ENTRY
                       *
                       * OUTPUT: A2 - POINTS TO NEXT IST ENTRY
                       *         A3 - POINTS TO ENTRY'TH ANALOG INPUT BUFFER (AIB)
                       *         D0 - OFFSET TO ENTRY'TH AIB
                       *
9 000000BA 15450001    ISTINT  MOVE.B  D5,1(A2)          STORE INPUT # IN THIS IST ENTRY
9 000000BE 3005                MOVE    D5,D0             CALCULATE OFFSET TO BUFFER
9 000000C0 C0FC0026            MULU    #AIBENT$,D0       CALCULATE OFFSET TO TABLE
9 000000C4 47FAFF3A            LEA     AIB$(PC),A3
9 000000C8 47F30000            LEA     (A3,D0),A3        CALCULATE POINTER TO BUFFER
```

```
9 000000CC 35460002          MOVE    A3,2(A2)          SAVE POINTER
9 000000D0 584A              ADDQ    #4,A2             BUMP TO NEXT ENTRY
9 000000D2 4E75              RTS                       DONE!
                     *
                     * SETCSM - SET THE APPROPRIATE BIT IN THE PROPER CLUSTER STATUS MASK.
                     *          BIT 47 IS THE MSB, AND CORRESPONDS TO INPUT #47
                     *
                     * INPUTS: D6 - CSM IN WHICH TO SET BIT.
                     *         D5 - BIT IN CSM TO BE SET.
                     *
                     * OUTPUT: D0,D1 DESTROYED
                     *         D4 - CONTAINS PRESENT GROUP PROCESSED (D6)
                     *
9 000000D4 3E06      SETCSM  MOVE    D6,D4             UPDATE LAST GROUP PROCESSED
9 000000D6 3006              MOVE    D6,D0             GET GROUP # & CALC BYTE OFFSET TO CSM
9 000000D8 C0FC0006          MULU    #6,D0             EACH ENTRY IS 6 BYTES LONG
                     *
                     * NOW SET OFFSET TO POINT TO BYTE IN
                     * WHICH SPECIFIED BIT IS CONTAINED.
                     * NOTE THAT BIT #47-40 ARE IN THE 1ST
                     * BYTE.
                     *
9 000000DC 722F              MOVEQ   #47,D1
9 000000DE 9245              SUB     D5,D1
9 000000E0 E649              LSR     #3,D1             CALCULATE BYTE OFFSET INTO CSM
9 000000E2 D041              ADD     D1,D0             TO BYTE CONTAINING SPECIFIED BIT
                     *
9 000000E4 0BF00000          BSET    D5,(A0,D0)        SET THE BIT
9 000000E8 4E75              RTS
                     *
                     *
                             END

****** TOTAL ERRORS      0--
****** TOTAL WARNINGS    0--
```

| SYMBOL NAME | SECT | VALUE | SYMBOL NAME | | SECT | VALUE |
|---|---|---|---|---|---|---|
| .1SEC | | 0000000A | FF | | | 0000000C |
| .AIQSIZ | | 00000038 | HT | | | 00000009 |
| .AOQSIZ | | 00000038 | IPT$ | XREF | * | 00000000 |
| .COSINE | | 00000014 | IPTENT$ | | | 00000014 |
| .DIQSIZ | | 0000001C | IST$ | XREF | 5 | 00000000 |
| .EFFECT | | 0000001C | ISTINT | | 9 | 000000BA |
| .HIQSIZ | | 00000010 | MAXAGE | | | 00000004 |
| .HOQSIZ | | 00000180 | ONESEC | | | 0003D090 |
| .ICOS | | 0000000A | ONETIK | | | 000009C4 |
| .IEFF | | 00000018 | OPTENT$ | | | 00000004 |
| .ISCALE | | 00000006 | PAAR | | | 00000014 |
| .ISIN | | 0000000E | PACR | | | 0000000C |
| .KWH | | 00000024 | PADDR | | | 00000004 |
| .PIQSIZ | | 0000003F | PADR | | | 00000010 |
| .RBFSIZ | | 00000400 | PBAR | | | 00000016 |
| .SAMPLE | | 00000002 | PBCR | | | 0000000E |
| .SCALE1 | | 00000004 | PBDDR | | | 00000006 |
| .SCALE2 | | 00000008 | PBDR | | | 00000012 |
| .SCALE3 | | 0000000C | PCDDR | | | 00000008 |
| .SCALE4 | | 00000010 | PCDR | | | 00000018 |
| .SINE | | 00000018 | PGCR | | | 00000000 |
| .STEMP | | 0000001C | PIVR | | | 0000000A |
| .TEMP | | 00000012 | PROM | | | 00000009 |
| .TOFSET | | 0000000E | PSR | | | 0000001A |
| .TSCALE | | 0000000A | PSRR | | | 00000002 |
| .VCOS | | 00000002 | PULL | MACR | * | |
| .VEFF | | 00000014 | PUSH | MACR | * | |

| | | | | | | | |
|---|---|---|---|---|---|---|---|
| . .VSCALE | | | 00000002 | RAM | | | 00000005 |
| .VSIN | | | 00000006 | S60 | | | 000039DF |
| .WATTS | | | 00000020 | SETCSM | | 9 | 00000004 |
| .WATTSEC | | | 00000022 | SETLUP | | 9 | 00000012 |
| AIB$ | XREF | 5 | 00000000 | SPACE | | | 00000020 |
| AIBENT$ | | | 00000026 | STX | | | 00000002 |
| CLRLUP | | 9 | 0000001C | TBLINI | XDEF | 9 | 00000000 |
| CNTR | | | 0000002E | TCR | | | 00000020 |
| CPR | | | 00000024 | TIVR | | | 00000022 |
| CR | | | 0000000D | TSR | | | 00000034 |
| CSM$ | XREF | 5 | 00000000 | Z_L1.001 | | 9 | 0000002A |
| DIBENT$ | | | 00000026 | Z_L1.003 | | 9 | 00000032 |
| DSFTENT$ | | | 00000010 | Z_L1.004 | | 9 | 00000042 |
| EEPROM | | | 00000007 | Z_L1.008 | | 9 | 00000056 |
| EOT | | | 00000004 | Z_L1.009 | | 9 | 00000072 |
| ETX | | | 00000003 | Z_L1.011 | | 9 | 00000072 |
| F$ASMPL | | | 00004000 | Z_L1.015 | | 9 | 00000088 |
| F$DNUT | | | 00000400 | Z_L1.019 | | 9 | 0000009C |
| F$KYED | | | 00000100 | Z_L1.020 | | 9 | 000000AC |
| F$MON | | | 00000080 | Z_L2.000 | | 9 | 0000008A |
| F$OST | | | 00001000 | Z_L2.002 | | 9 | 00000048 |
| F$PDI | | | 00000800 | Z_L2.007 | | 9 | 00000078 |
| F$PROC | | | 00002000 | Z_L2.018 | | 9 | 00000082 |
| F$XMIT | | | 00000200 | | | | |
| .1SEC | | | 0000000A | FF | | | 0000000C |
| .AIQSIZ | | | 00000038 | HT | | | 00000009 |
| .AOQSIZ | | | 00000038 | IPT$ | XREF | x | 00000000 |
| .COSINE | | | 00000014 | IPTENT$ | | | 00000014 |
| .DIQSIZ | | | 0000001C | IST$ | XREF | 5 | 00000000 |
| .EFFECT | | | 0000001C | ISTINT | | 9 | 000000BA |
| .HIQSIZ | | | 00000010 | MAXAGE | | | 00000004 |
| .HOQSIZ | | | 00000180 | ONESEC | | | 00030090 |
| .ICOS | | | 0000000A | ONETIK | | | 000009C4 |
| .IEFF | | | 00000018 | OPTENT$ | | | 00000004 |
| .ISCALE | | | 00000006 | PAAR | | | 00000014 |
| .ISIN | | | 0000000E | PACR | | | 0000000C |
| .KWH | | | 00000024 | PADDR | | | 00000004 |
| .PIQSIZ | | | 0000003F | PADR | | | 00000010 |
| .RBFSIZ | | | 00000400 | PBAR | | | 00000016 |
| .SAMPLE | | | 00000002 | PBCR | | | 0000000E |
| .SCALE1 | | | 00000004 | PBDDR | | | 00000006 |
| .SCALE2 | | | 00000008 | PBDR | | | 00000012 |
| .SCALE3 | | | 0000000C | PCDDR | | | 00000008 |
| .SCALE4 | | | 00000010 | PCDR | | | 00000018 |
| .SINE | | | 00000018 | PGCR | | | 00000000 |
| .STEMP | | | 0000001C | PIVR | | | 0000000A |
| .TEMP | | | 00000012 | PROM | | | 00000009 |
| .TOFSET | | | 0000000E | PSR | | | 0000001A |
| .TSCALE | | | 0000000A | PSRR | | | 00000002 |
| .VCOS | | | 00000002 | PULL | MACR | x | |
| .VEFF | | | 00000014 | PUSH | MACR | x | |
| . .VSCALE | | | 00000002 | RAM | | | 00000005 |
| .VSIN | | | 00000006 | S60 | | | 000039DF |
| .WATTS | | | 00000020 | SETCSM | | 9 | 00000004 |
| .WATTSEC | | | 00000022 | SETLUP | | 9 | 00000012 |
| AIB$ | XREF | 5 | 00000000 | SPACE | | | 00000020 |
| AIBENT$ | | | 00000026 | STX | | | 00000002 |
| CLRLUP | | 9 | 0000001C | TBLINI | XDEF | 9 | 00000000 |
| CNTR | | | 0000002E | TCR | | | 00000020 |
| CPR | | | 00000024 | TIVR | | | 00000022 |
| CR | | | 0000000D | TSR | | | 00000034 |
| CSM$ | XREF | 5 | 00000000 | Z_L1.001 | | 9 | 0000002A |
| DIBENT$ | | | 00000026 | Z_L1.003 | | 9 | 00000032 |
| DSFTENT$ | | | 00000010 | Z_L1.004 | | 9 | 00000042 |
| EEPROM | | | 00000007 | Z_L1.008 | | 9 | 00000056 |
| EOT | | | 00000004 | Z_L1.009 | | 9 | 00000072 |

```
ETX          00000003    Z_L1.011     9   00000072
F$ASMPL      00004000    Z_L1.015     9   00000088
F$DNUT       00000400    Z_L1.019     9   0000009C
F$KYED       00000100    Z_L1.020     9   000000FC
F$MON        00000080    Z_L2.000     9   000000BA
F$OST        00001000    Z_L2.002     9   00000048
F$PDI        00000800    Z_L2.007     9   00000078
F$PFOC       00002000    Z_L2.018     9   000000B2
F$XMIT       00000200

                       TIMGR   IDNT    0,3                   TIMER MANAGER  1/17/83
                               OPT     PCS,BRS
                       *
                       * SUBROUTINE:    TIMRD/TIMWR
                       *
                       * REVISED:       1/17/83
                       *
                       * AUTHOR:        D. A. ZEICHNER
                       *
                       * PURPOSE:       UPDATE/RETRIEVE THE SAMPLING PERIOD FOR THE SPECIFIED CLUSTER
                       *
                       * INPUTS:        D0 - BITS 31-16 NEW VALUE OF SPECIFIED CLUSTER
                       *                     BITS 15-0  CLUSTER # TO READ/UPDATE
                       *
                       * OUTPUTS:       D0 - BITS 15-0 VALUE OF SPECIFIED CLUSTER
                       *                CARRY SET IF INVALID CLUSTER #
                       *
                       * EXTERNAL REFERENCES/DEFINITIONS:
                       *
                               XDEF    TIMRD
                               XDEF    TIMWR
                       *
                       * LOCAL DATA AREA:
                       *
            00000005           SECTION  RAM
                       *
 5 00000000 0000000A   CTRTBL  DS.W     5                    COUNTER STORAGE
                       *
                       *
            00000009           SECTION  PROM
                       *
 9 00000000            TIMRD   PUSH     A0/D1
 9 00000004 0C400004           CMP      #4,D0                GROUP # OUT OF RANGE - QUIT
 9 00000008 622A               BHI      TIMERR
 9 0000000A E340               ASL      #1,D0                CALCULATE OFFSET
 9 0000000C 41FAFFF2           LEA      CTRTBL(PC),A0
 9 00000010 30300000           MOVE     (A0,D0),D0           READ SPECIFIED TIMER
 9 00000014 6018               BRA      TIMXIT
                       *
 9 00000016            TIMWR   PUSH     A0/D1
 9 0000001A 0C400004           CMP      #4,D0                GROUP # IN RANGE?
 9 0000001E 6214               BHI      TIMERR               NO - QUIT NOW
 9 00000020 3200               MOVE     D0,D1                YES - ISOLATE GROUP #
 9 00000022 E341               ASL      #1,D1                AND CALCULATE OFFSET INTO TABLE
 9 00000024 4840               SWAP     D0                   GET TIMER VALUE INTO LOWER HALF OF D0
 9 00000026 41FAFFD8           LEA      CTRTBL(PC),A0        POINT TO COUNTER TABLE
 9 0000002A 31801000           MOVE     D0,(A0,D1)           & STORE VALUE IN TABLE
                       *
 9 0000002E            TIMXIT  PULL     A0/D1                RESTORE REGISTERS
 9 00000032 4E75               RTS                           & RETURN OK
                       *
 9 00000034 023C0001   TIMERR  AND      #1,CCR               SET CARRY
 9 00000038 60F4               BRA      TIMXIT               & RETURN BAD
                       *
                       *
                               END
****** TOTAL ERRORS      0--
****** TOTAL WARNINGS    0--
```

SYMBOL TABLE LISTING

| SYMBOL NAME | SECT | VALUE | SYMBOL NAME | SECT | VALUE |
|---|---|---|---|---|---|
| .1SEC | | 0000000A | F$DNUT | | 00000400 |
| .AIQSIZ | | 00000038 | F$KYBD | | 00000100 |
| .AOQSIZ | | 00000038 | F$MON | | 00000080 |
| .COSINE | | 00000014 | F$OST | | 00001000 |
| .DIQSIZ | | 0000001C | F$PDI | | 00000800 |
| .EFFECT | | 0000001C | F$PROC | | 00002000 |
| .HIQSIZ | | 00000010 | F$XMIT | | 00000200 |
| .HOQSIZ | | 00000180 | FF | | 0000000C |
| .ICOS | | 0000000A | HT | | 00000009 |
| .IEFF | | 00000018 | IPTENT$ | | 00000014 |
| .ISCALE | | 00000006 | MAXAGE | | 00000004 |
| .ISIN | | 0000000E | ONESEC | | 00030090 |
| .KWH | | 00000024 | ONETIK | | 000009C4 |
| .PIQSIZ | | 0000003F | OPTENT$ | | 00000004 |
| .RBFSIZ | | 00000400 | PAAR | | 00000014 |
| .SAMPLE | | 00000002 | PACR | | 0000000C |
| .SCALE1 | | 00000004 | PADDR | | 00000004 |
| .SCALE2 | | 00000008 | PADR | | 00000010 |
| .SCALE3 | | 0000000C | PBAR | | 00000016 |
| .SCALE4 | | 00000010 | PBCR | | 0000000E |
| .SINE | | 00000018 | PBDDR | | 00000006 |
| .STEMP | | 0000001C | PBDR | | 00000012 |
| .TEMP | | 00000012 | PCDDR | | 00000008 |
| .TOFSET | | 0000000E | PCDR | | 00000018 |
| .TSCALE | | 0000000A | PGCR | | 00000000 |
| .VCOS | | 00000002 | PIVR | | 0000000A |
| .VEFF | | 00000014 | PROM | | 00000009 |
| .VSCALE | | 00000002 | PSR | | 0000001A |
| .VSIN | | 00000006 | PSRR | | 00000002 |
| .WATTS | | 00000020 | PULL | MACR * | |
| .WATTSEC | | 00000022 | PUSH | MACR * | |
| AIBENT$ | | 00000026 | RAM | | 00000005 |
| CNTR | | 0000002E | S60 | | 000039DF |
| CPR | | 00000024 | SPACE | | 00000020 |
| CR | | 0000000D | STX | | 00000002 |
| CTRTBL | 5 | 00000000 | TCR | | 00000020 |
| DIBENT$ | | 00000026 | TIMERR | 9 | 00000034 |
| DSFTENT$ | | 00000010 | TIMRD | XDEF 9 | 00000000 |
| EEPROM | | 00000007 | TIMWR | XDEF 9 | 00000016 |
| EOT | | 00000004 | TIMXIT | 9 | 0000002E |
| ETX | | 00000003 | TIVR | | 00000022 |
| F$ASMPL | | 00004000 | TSR | | 00000034 |

```
         UPLOAD   IDNT     0.6                Transmit selected table to host 3/09/83
                  OPT      FCS.BRS
*
*
* SUBROUTINE:     UPLOAD
*
* REVISED:        3/09/83
*
* AUTHOR:         D. A. ZEICHNER
*
* PURPOSE:        Format and transmit selected table to host.
*
* INPUTS:         D0 - Table I.D. (ASCII 0-3)
*
* OUTPUTS:        No registers preserved.
*                 No exception processing.
*
* EXTERNAL REFERENCES/DEFINITIONS:
*
```

```
                                  XDEF    UPLOAD
                                  XDEF    TBLTBL
                        *
                        * HARDWARE REFERENCES:
                        *
                                  XREF    HOSTACIA
                        *
                        * RAM REFERENCES:
                        *
                                  XREF.S  5:HOSTRAK
                                  XREF.S  5:T_KB
                                  XREF.S  5:T_XMON
                        *
                        * EEPROM REFERENCES:
                        *
                                  XREF    DSFT$
                                  XREF    IPT$
                                  XREF    OPT$
                                  XREF    RAMERR
                        *
                        * EPROM (PROGRAM) REFERENCES:
                        *
                                  XREF.S  9:DISPCH
                                  XREF.S  9:XMTCHR
                                  XREF.S  9:XMTMSG
                        *
                        *
           00000009               SECTION PROM
                        *
  9        00000000     UPLOAD    EQU     *
                        *
                        * DISABLE KEYBOARD & XMTMON TASKS
                        *
  9 00000000 41FAFFFE             LEA     T_KB(PC),A0
  9 00000004 3468000E             MOVE    TK$STM(A0),A2        Save state mask
  9 00000008 4268000E             CLR     TK$STM(A0)
  9 0000000C 4268000C             CLR     TK$STF(A0)           & make sure task is dead!
                        *
  9 00000010 08B800070000         BCLR    #7,HOSTRAK           Clear IRP bit in tracking reg.
  9 00000016 13FAFFE80000         MOVE.B  HOSTRAK(PC),HOSTACIA & Shut off receive IRP
           0000
  9 0000001E 41FAFFE0             LEA     T_XMON(PC),A0        Suspend  XMTMON task
  9 00000022 4268000C             CLR     TK$STF(A0)           Flags cleared, it really won't run now!
                        *
  9 00000026 4880                 EXT     D0                   Clear MSB of function code (TBL #)
                        *
                        * Calculate index to table sizes.
                        * Message size in D1, table address in A1.
                        * Message size is # of bytes transmitted.
                        * excluding header and byte count itself.
                        *
  9 00000028 3200                 MOVE    D0,D1
  9 0000002A 04410030             SUB     #$30,D1              Convert to binary
  9 0000002E C2FC0006             MULU    #6,D1                * 4 for offset.
  9 00000032 41FA0060             LEA     TBLTBL(PC),A0
  9 00000036 22701002             MOVE.L  2(A0,D1),A1          Get address of table.
  9 0000003A 32301000             MOVE    (A0,D1),D1           Get # of bytes in table to move.
                        *
                        * Transmit message header..
                        *
  9 0000003E C141                 EXG     D0,D1                Save table ID for a minute
  9 00000040 41FA004E             LEA     HDRMSG(PC),A0        Pointer to message
  9 00000044 4EBAFFEA             JSR     XMTMSG(PC)           Send header
                        *
                        * Transmit byte count (MSB first)
                        *
```

```
9 00000048 E058              ROR     #8,D0
9 0000004A 4EBAFFB4          JSR     XMTCHR(PC)
9 0000004E E058              ROR     #8,D0
9 00000050 4EBAFFAE          JSR     XMTCHR(PC)
                     *
9 00000054 C141              EXG     D0,D1              Get table ID back
9 00000056 4247              CLR     D7                 Initialize CRC
9 00000058 4EBAFFA6          JSR     XMTCHR(PC)         Transmit Table ID.
9 0000005C 5B41              SUBQ    #5,D1              Adjust msg size for table size -1
                     *
9 0000005E 1019      UPLUP   MOVE.B  (A1)+,D0           Get next byte of table
9 00000060 4EBAFF9E          JSR     XMTCHR(PC)         & transmit it.
9 00000064 51C9FFF8          DBRA    D1,UPLUP
                     *
                     * Transmit CRC & message trailer.
                     *
9 00000068 3007              MOVE    D7,D0              Get CRC
9 0000006A E058              ROR     #8,D0              Isolate MSB first
9 0000006C 4EBAFF92          JSR     XMTCHR(PC)         Xmit it
9 00000070 E058              ROR     #8,D0              Same for LSB
9 00000072 4EBAFF8C          JSR     XMTCHR(PC)
9 00000076 303C0003          MOVE    #ETX,D0            Send End Of Text. (trailer)
9 0000007A 4EBAFF84          JSR     XMTCHR(PC)
                     *
9 0000007E 303C000C          MOVE    #FF,D0             Clear out display
9 00000082 4EBAFF7C          JSR     DISPCH(PC)

                     * Re-enable keyboard task.
9 00000086 41FAFF78          LEA     T_KB(PC),A0
9 0000008A 314A000E          MOVE    A2,TK$STM(A0)      Put state mask back
                     *
9 0000008E 4E75      UPXIT   RTS                        This way out.
                     *
                     *
                     * Messages & Tables:
                     *
9 00000090 020255    HDRMSG  DC.B    2,STX,'U'
                     *
                     * Message sizes are calculated as follows:
                     *
                     *       # of bytes in table + 1 for ID + 2 for CRC + 1 for ETX
                     *
9 00000094 0024      TBLTBL  DC.W    36
9 00000096 00000000          DC.L    RAMERR             Start of ID table
                     *
9 0000009A 03C4              DC.W    (48*IPTENT$)+4
9 0000009C 00000000          DC.L    IPT$               Start of Input Personality table
                     *
9 000000A0 0104              DC.W    (64*4)+4
9 000000A2 00000000          DC.L    OPT$               Start of Output Personality table
                     *
9 000000A6 0104              DC.W    (16*DSFTENT$)+4
9 000000A8 00000000          DC.L    DSFT$              Start of donut scale factor table
                     *
                     *
                             END

****** TOTAL ERRORS       0--
****** TOTAL WARNINGS     0--
SYMBOL TABLE LISTING


SYMBOL NAME    SECT   VALUE       SYMBOL NAME    SECT   VALUE


.1SEC                 0000000A    F$OST                 00001000
```

| | | | | | | | | |
|---|---|---|---|---|---|---|---|---|
| .AIQSIZ | | | 00000038 | F$PDI | | | 00000800 |
| .AOQSIZ | | | 00000038 | F$PROC | | | 00002000 |
| .COSINE | | | 00000014 | F$XMIT | | | 00000200 |
| .DIQSIZ | | | 0000001C | FF | | | 0000000C |
| .EFFECT | | | 0000001C | HDRMSG | | 9 | 00000090 |
| .HIQSIZ | | | 000000C8 | HOSTACIA | XREF | * | 00000000 |
| .HOQSIZ | | | 00000180 | HOSTRAK | XREF | 5 | 00000000 |
| .ICOS | | | 0000000A | HT | | | 00000009 |
| .IEFF | | | 00000018 | IPT$ | XREF | * | 00000000 |
| .ISCALE | | | 00000006 | IPTENT$ | | | 00000014 |
| .ISIN | | | 0000000E | MAXAGE | | | 00000004 |
| .KWH | | | 00000024 | NEXTSK | | | 00000030 |
| .PIQSIZ | | | 0000003F | ONESEC | | | 0003D090 |
| .RBFSIZ | | | 00000400 | ONETIK | | | 000009C4 |
| .SAMPLE | | | 00000002 | OPT$ | XREF | * | 00000000 |
| .SCALE1 | | | 00000004 | OPTENT$ | | | 00000004 |
| .SCALE2 | | | 00000008 | PAAR | | | 00000014 |
| .SCALE3 | | | 0000000C | PACR | | | 0000000C |
| .SCALE4 | | | 00000010 | PADDR | | | 00000004 |
| .SINE | | | 00000018 | PADR | | | 00000010 |
| .SPNJP | MACR | * | | PBAR | | | 00000016 |
| .STEMP | | | 0000001C | PBCR | | | 0000000E |
| .TEMP | | | 00000012 | PBDDR | | | 00000006 |
| .TOFSET | | | 0000000E | PBDR | | | 00000012 |
| .TSCALE | | | 0000000A | PCDDR | | | 00000008 |
| .VCOS | | | 00000002 | PCDR | | | 00000018 |
| .VEFF | | | 00000014 | PGCR | | | 00000000 |
| .VSCALE | | | 00000002 | PIVR | | | 0000000A |
| .VSIN | | | 00000006 | PROM | | | 00000009 |
| .WATTS | | | 00000020 | PSR | | | 0000001A |
| .WATTSEC | | | 00000022 | PSRR | | | 00000002 |
| AIBENT$ | | | 00000026 | PULL | MACR | * | |
| CHGENT | | | 00000034 | PUSH | MACR | * | |
| CNTR | | | 0000002E | RAM | | | 00000005 |
| CPR | | | 00000024 | RAMERR | XREF | * | 00000000 |
| CR | | | 0000000D | RDYALL | | | 00000008 |
| CTRL13 | | | 00000000 | READY | | | 00000004 |
| CTRL2 | | | 00000002 | RELEAS | | | 0000002C |
| DEVINI | | | 00000014 | RESERV | | | 00000028 |
| DI$DEV | | | 0000000A | RESTRT | | | 0000003C |
| DI$EVF | | | 00000000 | S60 | | | 000039DF |
| DI$IOM | | | 0000001B | SAV$ | | | 0000002A |
| DI$ISV | | | 00000006 | SPACE | | | 00000020 |
| DI$LNK | | | 00000016 | STX | | | 00000002 |
| DI$OWN | | | 00000002 | SUSPEN | | | 0000000C |
| DI$PTR | | | 00000012 | TBLTBL | XDEF | 9 | 00000094 |
| DI$QUE | | | 0000000E | TCR | | | 00000020 |
| DI$RSO | | | 0000001A | TIMR1 | | | 00000004 |
| DI$SIZ | | | 00000020 | TIMR2 | | | 00000008 |
| DI$STA | | | 0000001C | TIMR3 | | | 0000000C |
| DI$USR | | | 0000001E | TIVR | | | 00000022 |
| DIBENT$ | | | 00000036 | TK$CON | | | 00000012 |
| DISPCH | XREF | 9 | 00000000 | TK$ENT | | | 00000004 |
| DSFT$ | XREF | * | 00000000 | TK$ID | | | 00000000 |
| DSFTENT$ | | | 00000010 | TK$LPT | | | 00000016 |
| EEPROM | | | 00000007 | TK$NXT | | | 0000001A |
| EOT | | | 00000004 | TK$RSO | | | 0000001E |
| EQS | MACR | * | | TK$SIZ | | | 00000022 |
| ETX | | | 00000003 | TK$SSP | | | 00000008 |
| EX$DV0 | | | 0000000A | TK$STF | | | 0000000C |
| EX$DV1 | | | 0000000E | TK$STM | | | 0000000E |
| EX$DV2 | | | 00000012 | TK$TIM | | | 00000010 |
| EX$DV3 | | | 00000016 | TSKEND | | | 0000003E |
| EX$DV4 | | | 0000001A | TSKINI | | | 00000010 |
| EX$DV5 | | | 0000001E | TSR | | | 00000034 |
| EX$DV6 | | | 00000022 | T_KB | XREF | 5 | 00000000 |

```
EX$DV7                 00000026   T_XMON    XREF   5   00000000
EX$NXT                 00000006   UFLOAD    XDEF   9   00000000
EX$SIZ                 0000002A   UPLUP            9   0000005E
EX$TIM                 00000000   UPXIT            9   0000008E
EX$TSK                 00000002   WAIT                 0000001C
EXEC                   00000000   WAITCN               00000020
F$ASMPL                00004000   WAITLP               00000024
F$DMUT                 00000400   WAKEUP               00000018
F$EEPM                 00000040   XMTCHR    XREF   9   00000000
F$KYBD                 00000100   XMTMSG    XREF   9   00000000
F$MON                  00000080   XSVC      MACR   *

                       VECINT  IDNT    0,6                    VECTOR INITIALIZATION  3/21/83
                               OPT     PCS,BRS
                       *
                       * INTERRUPT  VECTORS INITIALIZATION SETUP ROUTINES:
                       *  ( FOR RTI & VMEBUG )
                       *
                       * EXTERNAL REFERENCES/DEFINITIONS:
                       *
                               XDEF    VECINT
                       *
                               XREF    TRAP15
                               XREF    START
                       *
                       * EPROM (PROGRAM) REFERENCES:
                       *
                               XREF.S  9:EXECSW
                               XREF.S  9:DIRP
                               XREF.S  9:ADIRP
                               XREF.S  9:HOSTIO
                               XREF.S  9:INIT
                               XREF.S  9:AUXIO
                               XREF.S  9:TIMINT
                               XREF.S  9:KBIRP
                               XREF.S  9:WDIRP
                       *
                       *
          00000009             SECTION PROM

                       *
                       * SINCE THE REAL GUTS OF VMEBUG ARE NOT PRESENT, WE WILL
                       * REASSIGN ALL IRP VECTORS FROM 0 TO $3FC , TO THE WATCHDOG.
                       *
9 00000000 4A40        VECINT  TST     D0
9 00000002 6B24                BMI     VECDEB                 DEBUGGING
9 00000004 41F80000            LEA     0,A0                   POINTER TO VECTOR 0
9 00000008 303C00FF            MOVE.W  #255,D0                ADJUST COUNT
9 0000000C 43FAFFF2            LEA     WDIRP(PC),A1           GET THE WATCHDOG!
9 00000010 20C9        REASSN  MOVE.L  A1,(A0)+               REASSIGN & BUMP TO NEXT VECTOR
9 00000012 51C8FFFC            DBRA    D0,REASSN              MORE VECTORS?
                       *
9 00000016 41FAFFE8            LEA     WDIRP(PC),A0
9 0000001A 21C80078            MOVE.L  A0,$78                 INSTALL WATCHDOG VECTOR
                       *
9 0000001E 41F900000000        LEA     START,A0
9 00000024 21C8007C            MOVE.L  A0,$7C                 INSTALL VMEBUG VECTOR
                       *
                       * RTI VECTORS- SIMULATE POWER ON RESET, INITIALIZE OUR VECTORS,
                       *              SET SYSTEM STACK POINTER, & JUMP TO INIT.
                       *
9 00000028 41FAFFD6    VECDEB  LEA     INIT(PC),A0
9 0000002C 21C800B8            MOVE.L  A0,$B8                 INSTALL TRAP 14 (RESTART)
                       *
9 00000030 41FAFFCE            LEA     EXECSW(PC),A0
9 00000034 21C800BC            MOVE.L  A0,$BC                 INSTALL TRAP 15 (TASK MANAGER)
                       *
```

```
9 00000038 41FAFFC6          LEA      DIRP(PC),A0
9 0000003C 21C80148          MOVE.L   A0,$52*4          INSTALL DONUT IRP SVC VECTOR
                       *
9 00000040 41FAFFBE          LEA      TIMINT(PC),A0
9 00000044 21C80150          MOVE.L   A0,$54*4          INSTALL RTC VECTOR
                       *
9 00000048 41FAFFB6          LEA      KBIRP(PC),A0
9 0000004C 21C80184          MOVE.L   A0,$61*4          INSTALL KEYBOARD VECTOR
                       *
9 00000050 41FAFFAE          LEA      AUXIO(PC),A0
9 00000054 21C80074          MOVE.L   A0,$74            INSTALL HOST PORT IRP VECTOR
                       *
9 00000058 41FAFFA6          LEA      ADIRP(PC),A0
9 0000005C 21C8018C          MOVE.L   A0,$63*4          INSTALL A/D VECTOR
                       *
9 00000060 41FAFF9E          LEA      HOSTIO(PC),A0
9 00000064 21C80190          MOVE.L   A0,$190           INSTALL AUX PORT VECTOR
                       *
9 00000068 4E75              RTS                        RETURN TO INIT
                       *
                       *

                             END

****** TOTAL ERRORS      0--
****** TOTAL WARNINGS    0--
SYMBOL TABLE LISTING
```

| SYMBOL NAME | SECT | | VALUE | SYMBOL NAME | SECT | | VALUE |
|---|---|---|---|---|---|---|---|
| .1SEC | | | 0000000A | F$MON | | | 00000080 |
| .AIQSIZ | | | 00000038 | F$OST | | | 00001000 |
| .AOQSIZ | | | 00000038 | F$PDI | | | 00000800 |
| .COSINE | | | 00000014 | F$PROC | | | 00002000 |
| .DIQSIZ | | | 0000001C | F$XMIT | | | 00000200 |
| .EFFECT | | | 0000001C | FF | | | 0000000C |
| .HIQSIZ | | | 000000C8 | HOSTIO | XREF | 9 | 00000000 |
| .HOQSIZ | | | 00000180 | HT | | | 00000009 |
| .ICOS | | | 0000000A | INIT | XREF | 9 | 00000000 |
| .IEFF | | | 00000018 | IPTENT$ | | | 00000014 |
| .ISCALE | | | 00000006 | KBIRP | XREF | 9 | 00000000 |
| .ISIN | | | 0000000E | MAXAGE | | | 00000004 |
| .KWH | | | 00000024 | ONESEC | | | 00030090 |
| .PIQSIZ | | | 0000003F | ONETIK | | | 000009C4 |
| .RBFSIZ | | | 00000400 | OPTENT$ | | | 00000004 |
| .SAMPLE | | | 00000002 | PAAR | | | 00000014 |
| .SCALE1 | | | 00000004 | PACR | | | 0000000C |
| .SCALE2 | | | 00000008 | PADDR | | | 00000004 |
| .SCALE3 | | | 0000000C | PADR | | | 00000010 |
| .SCALE4 | | | 00000010 | PBAR | | | 00000016 |
| .SINE | | | 00000018 | PBCR | | | 0000000E |
| .STEMP | | | 0000001C | PBDDR | | | 00000006 |
| .TEMP | | | 00000012 | PBDR | | | 00000012 |
| .TOFSET | | | 0000000E | PCDDR | | | 00000008 |
| .TSCALE | | | 0000000A | PCDR | | | 00000018 |
| .VCOS | | | 00000002 | PGCR | | | 00000000 |
| .VEFF | | | 00000014 | PIVR | | | 0000000A |
| .VSCALE | | | 00000002 | PROM | | | 00000009 |
| .VSIN | | | 00000006 | PSR | | | 0000001A |
| .WATTS | | | 00000020 | PSRR | | | 00000002 |
| .WATTSEC | | | 00000022 | PULL | MACR | * | |
| ADIRP | XREF | 9 | 00000000 | PUSH | MACR | * | |
| AIBENT$ | | | 00000026 | RAM | | | 00000005 |
| AUXIO | XREF | 9 | 00000000 | REASSN | | 9 | 00000010 |

```
CNTR                      0000002E   S60                   000039DF
CPR                       00000024   SPACE                 00000020
CR                        0000000D   START     XREF   *    00000000
CTRL13                    00000000   STX                   00000002
CTRL2                     00000002   TCR                   00000020
DIBENT$                   00000026   TIMINT    XREF   9    00000000
DIRP        XREF   9      00000000   TIMR1                 00000004
DSFTENT$                  00000010   TIMR2                 00000008
EEPROM                    00000007   TIMR3                 0000000C
EOT                       00000004   TIVR                  00000022
ETX                       00000003   TRAP15    XREF   *    00000000
EXECSW      XREF   9      00000000   TSR                   00000034
F$ASMPL                   00004000   VECDEB           9    00000028
F$DNUT                    00000400   VECINT    XDEF   9    00000000
F$EEPM                    00000040   WDIRP     XREF   9    00000000
F$KYBD                    00000100
```

```
                        WDINIT  IDNT     0,0                    Watchdog Initializer  3/16/83
                                OPT      FCS,BRS
                        *
                        *
                        * SUBROUTINE:    WDINIT
                        *
                        * REVISED:       3/15/83
                        *
                        * AUTHOR:        T. WEBER
                        *
                        * PURPOSE:       INITIALIZE THE PTM MC6840.
                        *
                        * INPUTS:        NONE.
                        *
                        * OUTPUTS:       A0 - ONLY REGISTER PRESERVED.
                        *
                        * EXTERNAL REFERENCES/DEFINITIONS:
                        *
                                XDEF     WDINIT
                                XDEF     WDSTRT
                                XDEF     WDFEED
                        *
                        * HARDWARE REFERENCES:
                        *
                                XREF     WTCHDOG
                        *
                        *
          00000009              SECTION  PROM
                        *
                        *
9         00000000      WDINIT  EQU      *
                        *
                        * Initialize PTM - PROGRAMMABLE TIMER MODULE , MC6840 SERIES
                        *
                        * OCCUPIES IRP VECTOR $72
                        *
9 00000000                      PUSH     A0                     SAVE REG
9 00000004 41F900000000         LEA      WTCHDOG,A0             POINT TO PTM
9 0000000A 42280002             CLR.B    CTRL2(A0)              ENABLE WRITE TO CTRL REG. 3
9 0000000E 10BC0040             MOVE.B   #$40,(A0)              CTR 3 OUTPUT OFF, REP COUNT, IRP ENABLE
                        *
9 00000012 117C00010002         MOVE.B   #1,CTRL2(A0)           ENABLE WRITE TO CTRL REG. 1
9 00000018 10BC0001             MOVE.B   #1,(A0)                RESET TIMER & CLEAR IRPS
9 0000001C 303C4E20             MOVE     #$4E20,D0              1 SEC COUNT @ 1200 BAUD X 16 CLOCK
9 00000020 01880000C            MOVEP    D0,TIMR3(A0)           SET THE COUNTER
9 00000024                      PULL     A0                     RESTORE REG
9 00000028 4E75                 RTS
                        *
                        *
```

```
                       *
                       * WDSTRT - START THE WATCH DOG
                       *
9          0000002A    WDSTRT   EQU     *
9 0000002A                      PUSH    A0
9 0000002E 41F900000000         LEA     WTCHDOG,A0         POINT TO PTM
9 00000034 4210                 CLR.B   (A0)               START TIMER (bit 0)
9 00000036                      PULL    A0
9 0000003A 4E75                 RTS
                       *
                       *

                       *
                       * WDFEED - FEED THE WATCHDOG
                       *
9          0000003C    WDFEED   EQU     *
9 0000003C                      PUSH    A0                 SAVE A0
9 00000040 41F900000000         LEA     WTCHDOG,A0         POINT TO PTM
9 00000046 10BC0001             MOVE.B  #1,(A0)            TOGGLE CONTROL REG 1
9 0000004A 4210                 CLR.B   (A0)               TO TICK TIMER
9 0000004C                      PULL    A0
9 00000050 4E75                 RTS
                       *
                       *
                                END

****** TOTAL ERRORS      0--
****** TOTAL WARNINGS    0--
SYMBOL NAME    SECT   VALUE      CROSS-REF (LINENUMBERS)


.1SEC                 0000000A    -14
.AIQSIZ               00000038    -80
.AOQSIZ               0000003B    -81
.COSINE               00000014    -44
.DIQSIZ               0000001C    -82
.EFFECT               0000001C    -43
.HIQSIZ               000000C8    -84
.HOQSIZ               00000180    -85
.ICOS                 0000000A    -51
.IEFF                 00000018    -55
.ISCALE               00000006    -67
.ISIN                 0000000E    -52
.KWH                  00000024    -62
.PIQSIZ               0000003F    -83
.RBFSIZ               00000400    -86
.SAMPLE               00000002    -42
.SCALE1               00000004    -73
.SCALE2               00000008    -74
.SCALE3               0000000C    -75
.SCALE4               00000010    -76
.SINE                 00000018    -45
.STEMP                0000001C    -56
.TEMP                 00000012    -53
.TOFSET               0000000E    -69
.TSCALE               0000000A    -68
.VCOS                 00000002    -49
.VEFF                 00000014    -54
.VSCALE               00000002    -66
.VSIN                 00000006    -50
.WATTS                00000020    -60
.WATTSEC              00000022    -61
AIBENT$               00000026    -33
CNTR                  0000002E    -119
CPR                   00000024    -118
CR                    0000000D    -25
```

```
CTRL13                  00000000  -124
CTRL2                   00000002  -125   204   207
DIBENT$                 00000026   -32
DSFTENT$                00000010   -36
EEPROM                  00000007    -7
EOT                     00000004   -22
ETX                     00000003   -21
F$ASMPL                 00004000   -90
F$DNUT                  00000400   -94
F$EEPM                  00000040   -98
F$KYBD                  00000100   -96
F$MON                   00000080   -97
F$OST                   00001000   -92
F$PDI                   00000800   -93
F$PROC                  00002000   -91
F$XMIT                  00000200   -95
FF                      0000000C   -24
HT                      00000009   -23
IPTENT$                 00000014   -34
MAXAGE                  00000004   -16
ONESEC                  0003D090   -13
ONETIK                  000009C4   -15
OPTENT$                 00000004   -35
PAAR                    00000014  -112
PACR                    0000000C  -108
PADDR                   00000004  -104
PADR                    00000010  -110
PBAR                    00000016  -113
PBCR                    0000000E  -109
PBDDR                   00000006  -105
PBDR                    00000012  -111
PCDDR                   00000008  -106
PCDR                    00000018  -114
PGCR                    00000000  -102
PIVR                    0000000A  -107
PROM                    00000009    -6   193
PSR                     0000001A  -115
PSRR                    00000002  -103
PULL      MACR    *               -149     1   211   223   236
PUSH      MACR    *               -134     1   202   220   232
RAM                     00000005    -8
S60                     0000390F   -12
SPACE                   00000020   -26
STX                     00000002   -20
TCR                     00000020  -116
TIMR1                   00000004  -126
TIMR2                   00000008  -127
TIMR3                   0000000C  -128   210
TIVR                    00000022  -117
TSR                     00000034  -120
WDFEED    XDEF    9     0000003C  -231  -185
WDINIT    XDEF    9     00000000  -196  -183
WDSTRT    XDEF    9     0000002A  -219  -184
WTCHDOG   XREF    *     00000000  -189   203   221   233
165                         WDIRP   IDNT     0.0               Watchdog Interrupt Service 3/09/83
166                                 OPT      PCS,BRS
167                         *
300                         *
301                         * SUBROUTINE:    WDIRP
302                         *
303                         * REVISED:       3/09/83
304                         *
305                         * AUTHOR:        T. WEBER
306                         *
307                         * PURPOSE:       This interrupt happens in the event that no one has
308                         *                ticked the PTM (watchdog), in a while. The timer will be
309                         *                reactivated, thus illiminating a stall situation.
```

```
                              *
                              * INPUTS:         None.
                              *
                              * OUTPUTS:        None.
                              *
                              * EXTERNAL REFERENCES/DEFINITIONS:
                              *
                                      XDEF     WDIRP
                              *
                              * EEPROM REFERRENCES:
                              *
                                      XREF     RSTERR
                              *
                              * EPROM (PROGRAM) REFERRENCES:
                              *
                                      XREF.S   9:EEPMOV
                                      XREF.S   9:INIT
                                      XREF.S   9:WDINIT
                              *
             00000009                 SECTION  PROM
                              *
  9 00000000 41F900000000 WDIRP       LEA      RSTERR,A0            GET ADRESS OF # OF RESTARTS FROM EEPROM
  9 00000006 0C1000FF                 CMP.B    #$FF,(A0)            HIT $FF YET ?
  9 0000000A 671A                     BEQ      OVRFLW               YES - JUST RESTART
                              *
  9 0000000C 4EBAFFF2                 JSR      WDINIT(PC)           DISABLE WATCH DOG
  9 00000010 027CF8FF                 AND      #$F8FF,SR            IRP LEVEL 0
                              *
  9 00000014 1F10                     MOVE.B   (A0),-(A7)           WE ONLY NEED A BYTE BUT WE GOT A WORD
  9 00000016 5217                     ADD.B    #1,(A7)              NO - BUMP ERROR COUNT IN MEMORY
  9 00000018 2248                     MOVE.L   A0,A1                SETUP MOVE DESTINATION
  9 0000001A 204F                     MOVE.L   A7,A0                SETUP MOVE SOURCE
  9 0000001C 7401                     MOVEQ    #1,D2                ONLY 1 BYTE TO MOVE INTO EEPROM
  9 0000001E 4EBAFFE0                 JSR      EEPMOV(PC)
  9 00000022 4FEF0002                 LEA      2(A7),A7             RESTORE STACK
                              *
  9 00000026 4E4E             OVRFLW  TRAP     #14                  RESET

                              *
                              *
                                      END

****** TOTAL ERRORS      0--
****** TOTAL WARNINGS    0--
```

SYMBOL TABLE LISTING

| SYMBOL NAME | SECT | VALUE | SYMBOL NAME | SECT | | VALUE |
|---|---|---|---|---|---|---|
| .1SEC | | 0000000A | F$DNUT | | | 00000400 |
| .AIQSIZ | | 00000038 | F$EEPM | | | 00000040 |
| .AOQSIZ | | 00000038 | F$KYBD | | | 00000100 |
| .COSINE | | 00000014 | F$MON | | | 00000080 |
| .DIQSIZ | | 0000001C | F$OST | | | 00001000 |
| .EFFECT | | 0000001C | F$PDI | | | 00000800 |
| .HIQSIZ | | 000000C8 | F$PROC | | | 00002000 |
| .HOQSIZ | | 00000180 | F$XMIT | | | 00000200 |
| .ICOS | | 0000000A | FF | | | 0000000C |
| .IEFF | | 00000018 | HT | | | 00000009 |
| .ISCALE | | 00000006 | INIT | XREF | 9 | 00000000 |
| .ISIN | | 0000000E | IPTENT$ | | | 00000014 |
| .KWH | | 00000024 | MAXAGE | | | 00000004 |
| .PIQSIZ | | 0000003F | NEXTSK | | | 00000030 |
| .REFSIZ | | 00000400 | ONESEC | | | 0003D090 |

```
.SAMPLE                00000002   ONETIK                 000009C4
.SCALE1                00000004   OPTENT$                00000004
.SCALE2                00000008   OVRFLW            9    00000026
.SCALE3                0000000C   PAAR                   00000014
.SCALE4                00000010   PACR                   0000000C
.SINE                  00000018   PADDR                  00000004
.SPNJP     MACR   *               PADR                   00000010
.STEMP                 0000001C   PBAR                   00000016
.TEMP                  00000012   PBCR                   0000000E
.TOFSET                0000000E   PBDDR                  00000006
.TSCALE                0000000A   PBDR                   00000012
.VCOS                  00000002   PCDDR                  00000008
.VEFF                  00000014   PCDR                   00000018
.VSCALE                00000002   PGCR                   00000000
.VSIN                  00000006   PIVR                   0000000A
.WATTS                 00000020   PROM                   00000009
.WATTSEC               00000022   PSR                    0000001A
AIBENT$                00000026   PSRR                   00000002
CHGENT                 00000034   PULL      MACR    *
CNTR                   0000002E   PUSH      MACR    *
CPR                    00000024   RAM                    00000005
CR                     0000000D   RDYALL                 00000008
CTRL13                 00000000   READY                  00000004
CTRL2                  00000002   RELEAS                 0000002C
DEVINI                 00000014   RESERV                 00000028
DI$DEV                 0000000A   RESTRT                 0000003C
DI$EVF                 00000000   RSTERR    XREF    *    00000000
DI$IOM                 0000001B   S60                    000039DF
DI$ISV                 00000006   SAV$                   0000002A
DI$LNK                 00000016   SPACE                  00000020
DI$OWN                 00000002   STX                    00000002
DI$PTR                 00000012   SUSPEN                 0000000C
DI$QUE                 0000000E   TCR                    00000020
DI$RSO                 0000001A   TIMR1                  00000004
DI$SIZ                 00000020   TIMR2                  00000008
DI$STA                 0000001C   TIMR3                  0000000C
DI$USR                 0000001E   TIVR                   00000022
DIBENT$                00000026   TK$CON                 00000012
DSFTENT$               00000010   TK$ENT                 00000004
EEPMOV     XREF   9    00000000   TK$ID                  00000000
EEPROM                 00000007   TK$LPT                 00000016
EOT                    00000004   TK$NXT                 0000001A
EOS        MACR   *               TK$RSO                 0000001E
ETX                    00000003   TK$SIZ                 00000022
EX$DV0                 0000000A   TK$SSP                 00000008
EX$DV1                 0000000E   TK$STF                 0000000C
EX$DV2                 00000012   TK$STM                 0000000E
EX$DV3                 00000016   TK$TIM                 00000010
EX$DV4                 0000001A   TSKEND                 00000038
EX$DV5                 0000001E   TSKINI                 00000010
EX$DV6                 00000022   TSR                    00000034
EX$DV7                 00000026   WAIT                   0000001C
EX$NXT                 00000006   WAITCN                 00000020
EX$SIZ                 0000002A   WAITLP                 00000024
EX$TIM                 00000000   WAKEUP                 00000018
EX$TSK                 00000002   WDINIT    XREF    9    00000000
EXEC                   00000000   WDIRP     XDEF    9    00000000
F$ASMFL                00004000   XSVC      MACR    *
```

```
        XFORM   IDNT    0,2                    CALCULATE FOURIER COMPONENTS   1/19/83
                OPT     PCS,FRS,BRS
        *
        * SUBROUTINE:   XFORM
        *
        * STARTED:      1/19/83
        *
        * AUTHOR:       D. A. ZEICHNER
```

```
                          *
                          * PURPOSE:       FROM THE RAW DATA GIVEN IN THE SPECIFIED ANALOG INPUT BUFFER,
                          *                CALCULATE THE PEAK SINE AND COSINE COMPONENTS AND SAVE IN
                          *                THE BUFFER.
                          *
                          * INPUTS:        A0 - POINTER TO ANALOG INPUT BUFFER TO PROCESS.
                          *
                          * OUTPUTS:       PROCESSED BUFFER. ALL REGISTERS PRESERVED.
                          *
                          * EXTERNAL REFERENCES/DEFINITIONS:
                          *
                                  XDEF     XFORM
                          *
                          * EPROM (PROGRAM) REFERENCES:
                          *
                                  XREF.S   9:COSINE$
                                  XREF.S   9:FFPADD
                                  XREF.S   9:FFPIFP
                                  XREF.S   9:FFPMUL
                                  XREF.S   9:SINE$
                          *
                          *
         00000009                 SECTION  PROM
                          *
9 00000000                XFORM   PUSH     D0-D7/A1-A3          SAVE REGISTERS
                          *
9 00000004 4281                   CLR.L    D1                   INITIALIZE COSINE COMPONENT
9 00000006 4282                   CLR.L    D2                   INITIALIZE SINE COMPONENT
9 00000008 43FAFFF6               LEA      COSINE$(PC),A1       SET PTR TO COSINE TABLE
9 0000000C 45FAFFF2               LEA      SINE$(PC),A2         SET PTR TO SINE TABLE
                          *
                                  FOR      A3 = #.SAMPLE TO #.SAMPLE+16 BY #2 DO
9 00000016                Z_L1.001
9 00000016 3E30B000                 MOVE     (A0,A3),D7         GET RAW SAMPLE
9 0000001A 04470800                 SUB      #$800,D7           CONVERT TO 2'S COMPLEMENT
9 0000001E 48C7                     EXT.L    D7                 SIGN EXTEND TO 32 BITS
9 00000020 4EBAFFDE                 JSR      FFPIFP(PC)         CONVERT TO FLOATING POINT
9 00000024 2007                     MOVE.L   D7,D0              SAVE IN D0 FOR LATER
                          *
                          * ACCUMULATE COSINE COMPONENT
                          *
9 00000026 2C19                     MOVE.L   (A1)+,D6           GET COSINE COEFFICIENT
9 00000028 4EBAFFD6                 JSR      FFPMUL(PC)
9 0000002C 2C01                     MOVE.L   D1,D6
9 0000002E 4EBAFFD0                 JSR      FFPADD(PC)         ACCUMULATE COSINE VALUE
9 00000032 2207                     MOVE.L   D7,D1
                          *
                          * NOW FOR SINE COMPONENT
                          *
9 00000034 2E00                     MOVE.L   D0,D7              RESTORE CONVERTED RAW VALUE
9 00000036 2C1A                     MOVE.L   (A2)+,D6           GET SINE COEFFICIENT
9 00000038 4EBAFFC6                 JSR      FFPMUL(PC)
9 0000003C 2C02                     MOVE.L   D2,D6
9 0000003E 4EBAFFC0                 JSR      FFPADD(PC)         ACCUMULATE SINE VALUE
9 00000042 2407                     MOVE.L   D7,D2
                          *
                                  ENDF
                          *
                          * SAVE COMPUTED COSINE & SINE COMPONENTS IN INPUT BUFFER.
                          *
9 0000004C 21410014               MOVE.L   D1,.COSINE(A0)
9 00000050 21420018               MOVE.L   D2,.SINE(A0)
                          *
9 00000054                        PULL     D0-D7/A1-A3          RESTORE REGISTERS
9 00000058 4E75                   RTS                           & RETURN
                          *
```

```
         *
                  END

****** TOTAL ERRORS     0--
****** TOTAL WARNINGS   0--
SYMBOL TABLE LISTING
```

| SYMBOL NAME | SECT | VALUE | SYMBOL NAME | SECT | VALUE |
|---|---|---|---|---|---|
| .1SEC | | 0000000A | F$MON | | 00000080 |
| .AIOSIZ | | 00000038 | F$OST | | 00001000 |
| .AOOSIZ | | 00000038 | F$PDI | | 00000800 |
| .COSINE | | 00000014 | F$PROC | | 00002000 |
| .DIOSIZ | | 0000001C | F$XMIT | | 00000200 |
| .EFFECT | | 0000001C | FF | | 0000000C |
| .HIOSIZ | | 00000010 | FFPADD | XREF 9 | 00000000 |
| .HOOSIZ | | 00000180 | FFPDIV | XREF 9 | 00000000 |
| .ICOS | | 0000000A | FFPMUL | XREF 9 | 00000000 |
| .IEFF | | 00000016 | HT | | 00000009 |
| .ISCALE | | 00000006 | IPTENT$ | | 00000014 |
| .ISIN | | 0000000E | MAXAGE | | 00000004 |
| .KWH | | 00000024 | ONESEC | | 0003D090 |
| .PIOSIZ | | 0000003F | ONETIK | | 000009C4 |
| .RBFSIZ | | 00000400 | OPTENT$ | | 00000004 |
| .SAMPLE | | 00000002 | PAAR | | 00000014 |
| .SCALE1 | | 00000004 | PACR | | 0000000C |
| .SCALE2 | | 00000008 | PADDR | | 00000004 |
| .SCALE3 | | 0000000C | PADR | | 00000010 |
| .SCALE4 | | 00000010 | PBAR | | 00000016 |
| .SINE | | 00000018 | PBCR | | 0000000E |
| .STEMP | | 0000001C | PBDDR | | 00000006 |
| .TEMP | | 00000012 | PBDR | | 00000012 |
| .TOFSET | | 0000000E | PCDDR | | 00000008 |
| .TSCALE | | 0000000A | PCDR | | 00000018 |
| .VCOS | | 00000002 | PGCR | | 00000000 |
| .VEFF | | 00000014 | PIVR | | 0000000A |
| .VSCALE | | 00000002 | PROM | | 00000009 |
| .VSIN | | 00000006 | PSR | | 0000001A |
| .WATTS | | 00000020 | PSRR | | 00000002 |
| .WATTSEC | | 00000022 | PULL | MACR * | |
| AIBENT$ | | 00000026 | PUSH | MACR * | |
| CNTR | | 0000002E | RAM | | 00000005 |
| COSINE$ | XREF 9 | 00000000 | S60 | | 000037DF |
| CPR | | 00000024 | SINE$ | XREF 9 | 00000000 |
| CR | | 0000000D | SPACE | | 00000020 |
| DIBENT$ | | 00000026 | STX | | 00000002 |
| DSFTENT$ | | 00000010 | TCR | | 00000020 |
| EEPROM | | 00000007 | TIVR | | 00000022 |
| EOT | | 00000004 | TSR | | 00000034 |
| ETX | | 00000003 | XFORM | XDEF 9 | 00000000 |
| F$ASMPL | | 00004000 | Z_L1.001 | 9 | 00000016 |
| F$DNUT | | 00000400 | Z_L2.000 | 9 | 00000046 |
| F$KYBD | | 00000100 | | | |

```
         XMTCHR  IDNT    0,4                    Xmit byte to programming host 1/20/83
                 OPT     FCS,BRS
         *
         *
         * SUBROUTINE:   XMTCHR
         *
         * REVISED:      1/20/83
         *
         * AUTHOR:       D. A. ZEICHNER
         *
```

```
                        * PURPOSE:     Put a character on the programming host transmit queue,
                        *              and updates the CRC in D7.
                        *
                        * INPUTS:      D0 - byte to be queued.
                        *              D7 - CRC (16 bits) to be updated.
                        *
                        * OUTPUTS:     D7 - Updated CRC
                        *              D0, D1, A0 preserved
                        *
                        * EXTERNAL REFERENCES/DEFINITIONS:
                        *
                                 XDEF     XMTCHR
                        *
                        * HARDWARE REFERENCES:
                        *
                                 XREF     AUXACIA
                        *
                        * RAM REFERENCES:
                        *
                                 XREF.S   5:AUXOQ$
                                 XREF.S   5:AUXTRAK
                        *
                        * PROM REFERENCES:
                        *
                                 XREF.S   9:CRC16
                                 XREF.S   9:ENQUE
                        *
                        *
                        REGS     REG      D0-D1/D7/A0
                        *

                        *
           00000009              SECTION  PROM
                        *
9 00000000 2F08         XMTCHR   MOVE.L   A0,-(A7)              Save A0
9 00000002 41FAFFFC              LEA      AUXOQ$(PC),A0         Get output queue
                        *
9 00000006 4EBAFFF8     XMTQUE   JSR      ENQUE(PC)             Put data on queue
9 0000000A 6412                  BCC      XMTOK                 Queue went ok - finish up
9 0000000C                       PUSH.L   REGS                  Save registers thru task change
9 00000010 4240                  CLR      D0
9 00000012 720A                  MOVEQ    #10,D1
9 00000014                       XSVC     SUSPEN                Wait 10 ticks (100ms)
9 00000018                       PULL.L   REGS                  Restore registers
9 0000001C 60E8                  BRA      XMTQUE                & try again.
                        *
9 0000001E 4EBAFFE0     XMTOK    JSR      CRC16(PC)             Update CRC
9 00000022 41FAFFDC              LEA      AUXTRAK(PC),A0        Get XMIT
9 00000026 08D00005              BSET     #5,(A0)               Xmit irp on
9 0000002A 13FAFFD40000          MOVE.B   AUXTRAK(PC),AUXACIA   Update ACIA control register
           0000
9 00000032 205F                  MOVE.L   (A7)+,A0              Restore A0
9 00000034 4E75                  RTS                            & return
                        *
                        *
                                 END

****** TOTAL ERRORS       0--
****** TOTAL WARNINGS     0--
SYMBOL TABLE LISTING


SYMBOL NAME      SECT   VALUE       SYMBOL NAME      SECT   VALUE


.1SEC                   0000000A    EX$TSK                  00000002
```

| | | | | | | | |
|---|---|---|---|---|---|---|---|
| .AIQSIZ | | | 00000038 | EXEC | | | 00000000 |
| .AOQSIZ | | | 00000038 | F$ASMPL | | | 00004000 |
| .COSINE | | | 00000014 | F$DNUT | | | 00000400 |
| .DIQSIZ | | | 0000001C | F$KYBD | | | 00000100 |
| .EFFECT | | | 0000001C | F$MON | | | 00000080 |
| .HIQSIZ | | | 00000010 | F$OST | | | 00001000 |
| .HOQSIZ | | | 00000180 | F$PDI | | | 00000800 |
| .ICOS | | | 0000000A | F$PROC | | | 00002000 |
| .IEFF | | | 00000018 | F$XMIT | | | 00000200 |
| .ISCALE | | | 00000006 | FF | | | 0000000C |
| .ISIN | | | 0000000E | HT | | | 00000009 |
| .KWH | | | 00000024 | IPTENT$ | | | 00000014 |
| .PIQSIZ | | | 0000003F | MAXAGE | | | 00000004 |
| .RBFSIZ | | | 00000400 | NEXTSK | | | 00000030 |
| .SAMPLE | | | 00000002 | ONESEC | | | 00030D90 |
| .SCALE1 | | | 00000004 | ONETIK | | | 000009C4 |
| .SCALE2 | | | 00000008 | OPTENT$ | | | 00000004 |
| .SCALE3 | | | 0000000C | PAAR | | | 00000014 |
| .SCALE4 | | | 00000010 | PACR | | | 0000000C |
| .SINE | | | 00000018 | PADDR | | | 00000004 |
| .SPNJP | MACR | x | | PADR | | | 00000010 |
| .STEMP | | | 0000001C | PBAR | | | 00000016 |
| .TEMP | | | 00000012 | PBCR | | | 0000000E |
| .TOFSET | | | 0000000E | PBDDR | | | 00000006 |
| .TSCALE | | | 0000000A | PBDR | | | 00000012 |
| .VCOS | | | 00000002 | PCDDR | | | 00000008 |
| .VEFF | | | 00000014 | PCDR | | | 00000018 |
| .VSCALE | | | 00000002 | PGCR | | | 00000000 |
| .VSIN | | | 00000006 | PIVR | | | 0000000A |
| .WATTS | | | 00000020 | PROM | | | 00000009 |
| .WATTSEC | | | 00000022 | PSR | | | 0000001A |
| AIBENT$ | | | 00000026 | PSRR | | | 00000002 |
| AUXACIA | XREF | x | 00000000 | PULL | MACR | x | |
| AUXOO$ | XREF | 5 | 00000000 | PUSH | MACR | x | |
| AUXTRAK | XREF | 5 | 00000000 | RAM | | | 00000005 |
| CHGENT | | | 00000034 | RDYALL | | | 00000008 |
| CNTR | | | 0000002E | READY | | | 00000004 |
| CPR | | | 00000024 | REGS | REG | x | |
| CR | | | 0000000D | RELEAS | | | 0000002C |
| CRC16 | XREF | 9 | 00000000 | RESERV | | | 00000028 |
| DEVINI | | | 00000014 | RESTRT | | | 0000003C |
| DI$DEV | | | 0000000A | S60 | | | 000039DF |
| DI$EVF | | | 00000000 | SAV$ | | | 0000002A |
| DI$IOH | | | 0000001B | SPACE | | | 00000020 |
| DI$ISV | | | 00000006 | STX | | | 00000002 |
| DI$LNK | | | 00000016 | SUSPEN | | | 0000000C |
| DI$OWN | | | 00000002 | TCR | | | 00000020 |
| DI$PTR | | | 00000012 | TIVR | | | 00000022 |
| DI$QUE | | | 0000000E | TK$CON | | | 00000012 |
| DI$RSO | | | 0000001A | TK$ENT | | | 00000004 |
| DI$SIZ | | | 00000020 | TK$ID | | | 00000000 |
| DI$STA | | | 0000001C | TK$LPT | | | 00000016 |
| DI$USR | | | 0000001E | TK$NXT | | | 0000001A |
| DIBENT$ | | | 00000026 | TK$RSO | | | 0000001E |
| DSFTENT$ | | | 00000010 | TK$SIZ | | | 00000022 |
| EEPROM | | | 00000007 | TK$SSP | | | 00000008 |
| ENQUE | XREF | 9 | 00000000 | TK$STF | | | 0000000C |
| EOT | | | 00000004 | TK$STM | | | 0000000E |
| EQS | MACR | x | | TK$TIM | | | 00000010 |
| ETX | | | 00000003 | TSKEND | | | 00000038 |
| EX$DV0 | | | 0000000A | TSKINI | | | 00000010 |
| EX$DV1 | | | 0000000E | TSR | | | 00000034 |
| EX$DV2 | | | 00000012 | WAIT | | | 0000001C |
| EX$DV3 | | | 00000016 | WAITCN | | | 00000020 |
| EX$DV4 | | | 0000001A | WAITLP | | | 00000024 |
| EX$DV5 | | | 0000001E | WAKEUP | | | 00000018 |

```
EX$DV6          00000022     XMTCHR     XDEF   9   00000000
EX$DV7          00000026     XMTOK             9   0000001E
EX$NXT          00000006     XMTQUE            9   00000006
EX$SIZ          0000002A     XSVC       MACR   x
EX$TIM          00000000

                          XMTMON   IDNT     0,7                     PTI - RTU channel monitor  3/08/83
                                   OPT      PCS,BRS
                          x
                          x
                          x SUBROUTINE:    XMTMON
                          x
                          x REVISED:       3/08/83
                          x
                          x AUTHOR:        D. A. ZEICHNER
                          x
                          x PURPOSE:       MONITOR THE PTI - RTU COMMUNICATION LINK, AND DISPLAY
                          x                THE SELECTED POINT.
                          x
                          x INPUTS:        THE POINT # TO BE MONITORED IS IN THE TASK FRAME.
                          x
                          x OUTPUTS:       N/A
                          x
                          x NOTE:   THIS TASK USES 4 BYTES OF STACK FOR LOCAL DATA.
                          x
                          x EXTERNAL REFERENCES/DEFINITIONS:
                          x
                                   XDEF     XMTMON
                          x
                          x RAM REFERENCES:
                          x
                                   XREF.S   5:HSTIO$
                                   XREF.S   5:T_XMON
                          x
                          x EPROM (PROGRAM) REFERENCES:
                          x
                                   XREF.S   9:BINASC
                                   XREF.S   9:DEQUE
                                   XREF.S   9:DISPLY
                          x
                          x LOCAL ASSIGNMENTS:
                          x
          00000000        PTVAL    EQU      0                       OFFSET TO POINT VALUE BEING ASSEMBLED
                          x
                          x
          00000009                 SECTION  PROM
                          x
9 00000000 4DFAFFFE       XMTMON   LEA      T_XMON(PC),A6           POINTER TO TASK FRAME
9 00000004 4FEFFFFA                LEA      -6(A7),A7               RESERVE SCRATCH AREA ON STACK
9 00000008 3F7C09040004            MOVE     #(HT*256)+EOT,PTVAL+4(A7) PUT HT, EOT PAIR IN SCRATCH AREA
                          x
9 0000000E 6130           XMTLUP   BSR      GETCHR                  WAIT FOR CONSOLE INPUT
9 00000010 66FC                    BNE      XMTLUP                  NOT A POINT # , JUST WAIT
                          x
9 00000012 0240003F       XMTOK    AND      #$3F,D0                 THIS IS A NEW POINT NUMBER - ISOLATE IT
9 00000016 B02E001E                CMP.B    TK$RSO(A6),D0           IS THIS THE DESIRED POINT?
9 0000001A 66F2                    BNE      XMTLUP                  NO - WAIT FOR NEXT
                          x
                          x THIS IS THE POINT WE WANT DISPLAYED. GET THE NEXT
                          x 2 CHARACTERS, ASSEMBLE THE 12 BIT VALUE, CONVERT
                          x TO ASCII, AND DISPLAY IT.
                          x
9 0000001C 6122                    BSR      GETCHR                  GET NEXT BYTE (1ST OF 12 BIT VALUE)
9 0000001E 67EE                    BEQ      XMTLUP                  POINT # - START OVER
                          x
9 00000020 0240003F                AND      #$3F,D0                 ISOLATE THE 6 BITS OF DATA
9 00000024 ED40                    ASL      #6,D0                   & MOVE TO MS HALF OF WORD.
```

```
9 00000026 3E80                  MOVE    D0,PTVAL(A7)        SAVE IN STACK
                               *
9 00000028 6116                  BSR     GETCHR              GET NEXT BYTE (2ND OF 12 BIT VALUE)
9 0000002A 67E2                  BEQ     XMTLUP              POINT # - START OVER
                               *
9 0000002C 0240003F              AND     #$3F,D0             ISOLATE THE DATA
9 00000030 8057                  OR      PTVAL(A7),D0        PUT 2 HALVES TOGETHER
9 00000032 4EBAFFCC              JSR     BINASC(PC)          CONVERT TO DECIMAL ASCII
9 00000036 2E80                  MOVE.L  D0,PTVAL(A7)        OVERWRITE SCRATCH AREA W/ ASCII EQUIVALENT
9 00000038 204F                  MOVE.L  A7,A0               STRING POINTER FOR DISPLY
9 0000003A 4EBAFFC4              JSR     DISPLY(PC)          AND DISPLAY IT.
9 0000003E 60CE                  BRA     XMTLUP              NOW DO IT AGAIN.
                               *
                               *
                               * SUBROUTINES:
                               *
                               * GETCHR  - WAIT FOR A CHARACTER FROM THE RTI - RTU COMMUNICATION
                               *           MONITOR. DEFINE TYPE OF INPUT AND RETURN IT IN D0.
                               *         - Z FLAG SET (EQUAL), IF BYTE IS A POINT #
                               *         - CLEARED (NOT EQUAL),IF BYTE IS A DATA VALUE.
                               *
9 00000040 41FAFFBE       GETCHR  LEA     HSTIQ$(PC),A0       GET POINTER TO INPUT QUEUE
9 00000044 4EBAFFBA               JSR     DEQUE(PC)           & GET CHAR - CARRY SET IF NONE
9 00000048 640C                   BCC     GETOK               GOT A CHAR OF
                               *
9 0000004A 303C0080               MOVE    #F$MON,D0           TASK FLAGS
9 0000004E 4241                   CLR     D1                  NO TIMEOUT ON CONSOLE INPUT
9 00000050                        XSVC    SUSPEN              WAIT FOR CHARACTER
9 00000054 60EA                   BRA     GETCHR              TRY AGAIN TO GET A CHARACTER

                               * GOT A CHARACTER FROM THE Q , CHECK FOR POINT # OR DATA ***

9 00000056 08000006       GETOK   BTST    #6,D0               START OF AN OUTPUT POINT ?
                               *
                               *
9 0000005A 4E75           GETXIT  RTS
                               *
                               *
                                  END

****** TOTAL ERRORS      0--
****** TOTAL WARNINGS    0--
SYMBOL TABLE LISTING
```

| SYMBOL NAME | SECT | VALUE | SYMBOL NAME | SECT | VALUE |
|---|---|---|---|---|---|
| .1SEC | | 0000000A | F$EEPM | | 00000040 |
| .AIQSIZ | | 00000038 | F$KYBD | | 00000100 |
| .AOQSIZ | | 00000038 | F$MON | | 00000080 |
| .COSINE | | 00000014 | F$OST | | 00001000 |
| .DIQSIZ | | 0000001C | F$PDI | | 00000800 |
| .EFFECT | | 0000001C | F$PROC | | 00002000 |
| .HIQSIZ | | 000000C8 | F$XMIT | | 00000200 |
| .HOQSIZ | | 00000180 | FF | | 0000000C |
| .ICOS | | 0000000A | GETCHR | 9 | 00000040 |
| .IEFF | | 00000018 | GETOK | 9 | 00000056 |
| .ISCALE | | 00000006 | GETXIT | 9 | 0000005A |
| .ISIN | | 0000000E | HSTIQ$ | XREF 5 | 00000000 |
| .KWH | | 00000024 | HT | | 00000009 |
| .PIQSIZ | | 0000003F | IPTENT$ | | 00000014 |
| .RBFSIZ | | 00000400 | MAXAGE | | 00000004 |
| .SAMPLE | | 00000002 | NEXTSK | | 00000030 |
| .SCALE1 | | 00000004 | ONESEC | | 0003D090 |
| .SCALE2 | | 00000008 | ONETIK | | 000009C4 |

```
.SCALE3                  0000000C   OPTENT$                00000004
.SCALE4                  00000010   PAAR                   00000014
.SINE                    00000018   PACR                   0000000C
.SPNJP    MACR  *                   PADDR                  00000004
.STEMP                   0000001C   PADR                   00000010
.TEMP                    00000012   PBAR                   00000016
.TOFSET                  0000000E   PBCR                   0000000E
.TSCALE                  0000000A   PBDDR                  00000006
.VCDS                    00000002   PBDR                   00000012
.VEFF                    00000014   PCDDR                  00000008
.VSCALE                  00000002   PCDR                   00000018
.VSIN                    00000006   PGCR                   00000000
.WATTS                   00000020   PIVR                   0000000A
.WATTSEC                 00000022   PROM                   00000909
AIBENT$                  00000026   PSR                    0000001A
BINASC    XREF  9        00000000   PSRR                   00000002
CHGENT                   00000034   PTVAL                  00000000
CNTR                     0000002E   PULL     MACR  *
CPR                      00000024   PUSH     MACR  *
CR                       0000000D   RAM                    00000005
CTRL12                   00000000   RDYALL                 00000008
CTRL2                    00000002   READY                  00000004
DEQUE     XREF  9        00000000   RELEAS                 0000002C
DEVINI                   00000014   RESERV                 00000028
DI$DEV                   0000000A   RESTRT                 0000003C
DI$EVF                   00000000   S60                    0000390F
DI$IOM                   0000001B   SAV$                   0000002A
DI$ISV                   00000006   SPACE                  00000020
DI$LNK                   00000016   STX                    00000002
DI$OWN                   00000002   SUSPEN                 0000000C
DI$PTR                   00000012   TCR                    00000020
DI$QUE                   0000000E   TIMR1                  00000004
DI$RS0                   0000001A   TIMR2                  00000008
DI$SIZ                   00000020   TIMR3                  0000000C
DI$STA                   0000001C   TIVR                   00000022
DI$USR                   0000001E   TK$CON                 00000012
DIBENT$                  00000026   TK$ENT                 00000004
DISPLY    XREF  9        00000000   TK$ID                  00000000
DSPTENT$                 00000010   TK$LFT                 00000016
EEPROM                   00000007   TK$NXT                 0000001A
EOT                      00000004   TK$RS0                 0000001E
EQS       MACR  *                   TK$SIZ                 00000022
ETX                      00000003   TK$SSP                 00000008
EX$DV0                   0000000A   TK$STF                 0000000C
EX$DV1                   0000000E   TK$STM                 0000000E
EX$DV2                   00000012   TK$TIM                 00000010
EX$DV3                   00000016   TSKEND                 00000038
EX$DV4                   0000001A   TSKINI                 00000010
EX$DV5                   0000001E   TSR                    00000034
EX$DV6                   00000022   T_XMON   XREF  5       00000000
EX$DV7                   00000026   WAIT                   0000001C
EX$NXT                   00000006   WAITCN                 00000020
EX$SIZ                   0000002A   WAITLP                 00000024
EX$TIM                   00000000   WAKEUP                 00000018
EX$TSK                   00000002   XMTLUP         9       0000000E
EXEC                     00000000   XMTMON   XDEF  9       00000000
F$ASMFL                  00004000   XMTOK          9       00000012
F$DNUT                   00000400   XSVC     MACR  *

          XMTMSG   IDNT    0,4            Xmit msg to programming host 1/20/83
                   OPT     FCS,BRS
          *
          * SUBROUTINE:    XMTMSG
          *
          * STARTED:       1/20/83
          *
          * AUTHOR:        D. A. ZEICHNER
```

```
                    *
                    * PURPOSE:       Transmit message to programming host.
                    *
                    * INPUTS:        A0 - Pointer to message. 1st byte is # of characters to
                    *                     be transmitted.
                    *
                    * OUTPUTS:       D7 - updated CRC
                    *                D0, D1, A0 preserved.
                    *
                    * EXTERNAL REFERENCES/DEFINITIONS:
                    *
                           XDEF     XMTMSG
                    *
                    * EPROM (PROGRAM) REFERENCE:
                    *
                           XREF.S   9:XMTCHR
                    *
                    REGS   REG      D0-D1/A0
                    *
                    *
           00000009        SECTION  PROM
                    *
9 00000000          XMTMSG PUSH.L   REGS              Save registers
                    *
9 00000004 1218            MOVE.B   (A0)+,D1          Get byte count
9 00000006 024100FF        AND      #$FF,D1           Clear MSb of count
9 0000000A 5341            SUBQ     #1,D1             Adjust for loop count
                    *
9 0000000C 1018     XMTLUP MOVE.B   (A0)+,D0          Get character
9 0000000E 4EBAFFF0        JSR      XMTCHR(PC)        Transmit it
9 00000012 51C9FFF8        DBRA     D1,XMTLUP         & repeat until done
                    *
9 00000016                 PULL.L   REGS              Restore registers
9 0000001A 4E75            RTS                        & return
                    *
                    *
                           END

****** TOTAL ERRORS       0--
****** TOTAL WARNINGS     0--
```

SYMBOL TABLE LISTING

| SYMBOL NAME | SECT | VALUE | SYMBOL NAME | SECT | VALUE |
|---|---|---|---|---|---|
| .1SEC | | 0000000A | F$KYED | | 00000100 |
| .AIQSIZ | | 00000038 | F$MON | | 00000080 |
| .AOQSIZ | | 00000038 | F$OST | | 00001000 |
| .COSINE | | 00000014 | F$PDI | | 00000800 |
| .DIQSIZ | | 0000001C | F$PROC | | 00002000 |
| .EFFECT | | 0000001C | F$XMIT | | 00000200 |
| .HIQSIZ | | 00000010 | FF | | 0000000C |
| .HOQSIZ | | 00000180 | HT | | 00000009 |
| .ICOS | | 0000000A | IPTENT$ | | 00000014 |
| .IEFF | | 00000018 | MAXAGE | | 00000004 |
| .ISCALE | | 00000006 | ONESEC | | 0003D090 |
| .ISIN | | 0000000E | ONETIK | | 000009C4 |
| .NUM | | 00000024 | OPTENT$ | | 00000004 |
| .PIQSIZ | | 0000003F | PAAR | | 00000014 |
| .RBFSIZ | | 00000400 | PACR | | 0000000C |
| .SAMPLE | | 00000002 | PADDR | | 00000004 |
| .SCALE1 | | 00000004 | PADR | | 00000010 |
| .SCALE2 | | 00000008 | PBAR | | 00000016 |
| .SCALE3 | | 0000000C | PBCR | | 0000000E |
| .SCALE4 | | 00000010 | PBDDR | | 00000006 |

```
.SINE       00000018   PBDR                00000012
.STEMP      0000001C   PCDDR               00000008
.TEMP       00000012   PCDR                00000018
.TOFSET     0000000E   PGCR                00000000
.TSCALE     00000004   PIVR                0000000A
.VCOS       00000002   PROM                00000009
.VEFF       00000014   PSR                 0000001A
.VSCALE     00000002   PSRR                00000002
.VSIN       00000006   PULL     MACR  *
.WATTS      00000020   PUSH     MACR  *
.WATTSEC    00000022   RAM                 00000005
AIBENT$     00000026   REGS     REG   *
CNTR        0000002E   S60                 000039DF
CPR         00000024   SPACE               00000020
CR          0000000D   STX                 00000002
DIBENT$     00000026   TCR                 00000020
DSFTENT$    00000010   TIVR                00000022
EEPROM      00000007   TSR                 00000034
EOT         00000004   XMTCHR   XREF  9    00000000
ETX         00000003   XMTLUP         9    0000000C
F$ASMFL     00004000   XMTMSG   XDEF  9    00000000
F$ONUT      00000400
```

APPENDIX C

Copyright (C) 1983

Product Development Services, Inc. (PDS)

```
                     *        NOLIST

                     ***************************************************
                     *                                                 *
                     *        T H E     A M 9 5 1 3                    *
                     *                                                 *
                     *        "SYSTEM TIMING CONTROLLER"               *
                     *                                                 *
                     *         SOFTWARE OPERATIONS PACKAGE.            *
                     *                                                 *
                     *                                                 *
                     *                                                 *
                     * COPYRIGHT(C)PDS            INC.    1982         *
                     ***************************************************
                     *
                     * STCPKG.SA - MACRO DEFINITIONS
                     *
                     *
                     * FILE NAME:    STCEQU
                     *
                     * PURPOSE:      DEFINES THE REGISTER IDENTIFIER
                     *               NAMES AND THE 26 BYTE OFFSETS FOR
                     *               BOTH "INITBL" AND "RAMTBL".
                     *
                     *
0         00000000   STCEQU   EQU    *
                     *               TABLE ENTRY OFFSETS:
          00000000   MMR      EQU    0                    MASTER MODE REGISTER
          00000002   A1R      EQU    2                    ALARM REGISTER-COUNTER 1
          00000004   A2R      EQU    4                    ALARM REGISTER-COUNTER 2
          00000006   C1L      EQU    6                    COUNTER 1 LOAD REGISTER
          00000008   C1M      EQU    8                    COUNTER 1 MODE REGISTER
          0000000A   C2L      EQU    10                   COUNTER 2 LOAD REGISTER
          0000000C   C2M      EQU    12                   COUNTER 2 MODE REGISTER
          0000000E   C3L      EQU    14                   COUNTER 3 LOAD REGISTER
```

```
        00000010   C3M    EQU    16              COUNTER 3 MODE REGISTER
        00000012   C4L    EQU    18              COUNTER 4 LOAD REGISTER
        00000014   C4M    EQU    20              COUNTER 4 MODE REGISTER
        00000016   C5L    EQU    22              COUNTER 5 LOAD REGISTER
        00000018   C5M    EQU    24              COUNTER 5 MODE REGISTER
                   *
                   *
                   * FILE NAME:    START - 'COMMAND TO INITIALIZE THE  9513'
                   *
                   * FUNCTION:     THIS COMMAND ACTIVATES THE CHIP
                   *               SELECT LOGIC AND ENTERS 16 BIT
                   *               BUS MODE.
                   *
                   * NOTE:         This one byte command, written
                   *               into the Control Port, must be
                   *               the first call in the application
                   *               program. However, it is not necessary
                   *               if the first call entered is a RST$.
                   *  (The same instructions are duplicated in the software reset command).
                   *
                   * CALL NAME:    START$
                   *
                   * ARGUMENTS REQUIRED:   0
                   *
                   * FORMAT:       START$
                   *
                   START$   MACRO
                   * Load call counters to activate chip select *
                            MOVE.W   #$FF5F,CTRLP
                   * Enter 16 bit bus mode *
                            MOVE.W   #$FFEF,CTRLP
                   * UPDATE RAM
                            LEA      RAMTBL(PC),A1   ram table address
                            BSET.B   #6,(A1)         set bit 6 of the MSByte in MMR
                            ENDM
                   *
                   * FILE NAME:    CMDB16 - 'COMMAND TO ENTER 16 BIT BUS MODE'
                   *
                   * FUNCTION:     SETS MASTER MODE BIT 13 WITHOUT
                   *               AFFECTING ANY OTHER BIT VALUES.
                   *               THE MULTIPLEXER IS DISABLED,
                   *               ALLOWING ALL 16 EXTERNAL BUS
                   *               LINES TO TRANSFER INFORMATION
                   *               TO AND FROM THE CHIP.
                   *
                   * NOTE:         This one byte command, written
                   *               into the Control Port, must be
                   *               called whenever the Master mode
                   *               register is cleared and after a
                   *               power on reset.
                   *      (The MMR in the ram table is also updated).
                   *
                   * CALL NAME:    B16$
                   *
                   * ARGUMENTS REQUIRED:   0
                   *
                   * FORMAT:       B16$
                   *
                   B16$     MACRO
                            MOVE.W   #$FFEF,CTRLP       write to Control Port
                   * UPDATE RAM
                            LEA      RAMTBL(PC),A1   ram table address
                            BSET.B   #6,(A1)         set bit 6 of the MSByte
                            ENDM
                   *
                   * FILENAME:     CMDRST - 'COMMAND TO RESET REGISTER(S)'
```

```
*
* PURPOSE:      RESET IS USED TO CLEAR THE 9513
*               LOAD REGISTERS, SET MODE REGISTER(S)
*               TO A PRESET CONDITION, CLEAR THE
*               MASTER MODE REGISTER, DISARM ALL
*               COUNTERS AND CLEAR ALARMS.
*
* FUNCTION:     RESET MAY BE USED TO INVOKE A
*               MASTER RESET IN WHICH ALL OF THE
*               ABOVE OCCURRS.
*   or          RESET MAY BE SPECIFIED FOR ONLY
*               1 REGISTER.
*
* NOTE:         'RAMTBL' IS UPDATED AFTER A REGISTER
*               HAS AQUIRED A RESET VALUE.
*
* MACRO:        RST$
*
* ARGUMENTS REQUIRED:   NONE or ONE
*
* FORMAT1:      RST$                       - MASTER RESET ALL REGS.
* FORMAT2:      RST$  <REG. LABLE NAME>    - RESET 1 ONLY.
*                     MMR,A1R,A2R,C1L,C2M,C2L, ETC....
*
RST$     MACRO
         LEA      RAMTBL(PC),A1   RAM TABLE ADDR.

*         ** MASTER RESET ALL REGISTERS **
         IFEQ     NARG
         MOVE.W   #$FFFF,CTRLP    SEND RESET TO COMMAND REG.
         MOVE.W   #$FF5F,CTRLP    LOAD ALL CTRS. FOR CHIP SELECT
         MOVE.W   #$FFEF,CTRLP    ENTER 16 BIT MODE
* UPDATE RAM TABLE*
         MOVE.W   #$2000,MMR(A1)  CLEAR MMR,EXCEPT BIT 13
         CLR.W    A1R(A1)         CLEAR
         CLR.W    A2R(A1)               ALARMS
* CLEAR ALL LOAD REGISTERS *
         CLR.W    C1L(A1)
         CLR.W    C2L(A1)
         CLR.W    C3L(A1)
         CLR.W    C4L(A1)
         CLR.W    C5L(A1)
* SET ALL MODE REGISTERS TO PRESET CONDITION *
         MOVE.W   #$0B00,C1M(A1)
         MOVE.W   #$0B00,C2M(A1)
         MOVE.W   #$0B00,C3M(A1)
         MOVE.W   #$0B00,C4M(A1)
         MOVE.W   #$0B00,C5M(A1)
         MEXIT
         ENDC

*          ** RESET 1 REGISTER ONLY **
         IFEQ     NARG-1          REG. SPECIFIED
TMP$0    SET      1               SET MODE FLAG

* FOR MODE REGISTERS ONLY *
         IFNC     '\1','C1M'
         IFNC     '\1','C2M'
         IFNC     '\1','C3M'
         IFNC     '\1','C4M'
         IFNC     '\1','C5M'
TMP$0    SET      0               CLEAR MODE REG FLAG
         ENDC
         ENDC
         ENDC
         ENDC
```

```
        ENDC
*
* IF TMP$0 FLAG = 1, THAN IT'S A MODE REGISTER **
        IFNE    TMP$0
        MOVE.W  #$0B00,\1(A1)   PRESET VALUE
        ST\1$
        MEXIT
        ENDC

* CLEAR ANY OTHER REGISTER - WHEN FLAG = 0 **
        IFEQ    TMP$0

*       BUT PREVENT THE MASTER MODE FROM ENTERING 8 BIT MODE *
        IFC     '\1','MMR'
        MOVE.W  #$2000,MMR(A1)  SET BIT 13 ONLY
        STMMR$
        MEXIT
        ENDC

        CLR.W   \1(A1)          CLEAR ANY OTHER REG.
        ST\1$
        ENDC
*
        ENDC
*
        ENDM
*
* MACRO CALL NAME:      TEMMR$
*
* PURPOSE:      TABLE ENTRY- MASTER MODE REGISTER
*
* FUNCTION:     ENTERS THE FIRST TWO BYTES
*               IN THE ROM 'INITBL' TABLE
*               WITH THE BIT CONFIGURATION
*               FORMED BY CALLING THE MMR$ MACRO.
*
* ENTRY NOTE:   ALL REGISTERS ARE ENTERED
*               IN THE TABLE STARTING WITH THE
*               MOST SIGINIFICANT BYTE.
*
* ARGUMENTS REQUIRED:   9
*
* FORMAT: TEMMR$  <scaler control>,<data pointer sequencing>;
*                 <data bus width>,<fout gate>,<fout divider>;
*                 <fout source>,<compare 2>,<compare 1>;
*                 <time of day mode>
*
TEMMR$  MACRO
*
        IFNE    NARG-9
        FAIL    **ERROR**INVALID-STRING-ARGUMENT***
        MEXIT
        ENDC
*
        IFEQ    NARG-9
        MMR$    \1,\2,\3,\4,\5,\6,\7,\8,\9
        DC.W    MMR$0           2 byte ROM  entry
        ENDC
        ENDM
*
* MACRO CALL NAME:      TEACR$
*
* PURPOSE:      TABLE ENTRY FOR ALARM
*               COUNTER REGISTERS - 1 & 2
*
* FUNCTION:     ENTERS THE ROM 'INITBL' TABLE
```

```
*               VALUES FOR THE ALARMS. THIS
*               MACRO MUST BE CALLED TWICE FOR
*               SPECIFING BOTH COUNTERS.
*
* NOTE:         THE INPUT VALUE DEPENDS ON THE
*               COMPARATOR OPTION IN THE MASTER
*               MODE REGISTER. IF ENABLED, MUST
*               ENTER A VALUE IN THE ARGUMENT
*               FIELD. IF DISABLED, MUST ENTER A
*               TWO BYTE ZERO VALUE.
*
* ARGUMENTS REQUIRED:  1
*
* FORMAT:       TEACR$ <2 byte comparator value>
*
TEACR$   MACRO
         DC.W     \1
         ENDM
*
* MACRO CALL NAME:      TECL$
*
* PURPOSE:      TABLE ENTRY- COUNTER LOAD REGISTER
*
* FUNCTION:     ENTERS THE INITIAL VALUE
*               FOR THE COUNTERS IN THE
*               ROM 'INITBL' TABLE.
*
* NOTE:         - MUST CALL THIS MACRO FIVE
*               TIMES PER COUNTER REGISTER.
*               - ALL COUNTERS NOT GIVEN A
*               SPECIFIC VALUE MUST HAVE A
*               TWO BYTE ZERO ENTRY.
*               - A TECM$ CALL MUST FOLLOW
*               A TECL$, IN ORDER TO COMPLETE
*               THE REQUIRED INFORMATION FOR THE
*               SAME COUNTER NUMBER.
*
*
* ARGUMENTS REQUIRED:  1
*
* FORMAT:       TECL$ <init counter value>
*
TECL$    MACRO
         DC.W     \1
         ENDM
*
* MACRO CALL NAME:      TECM$
*
* PURPOSE:      TABLE ENTRY- COUNTER MODE REGISTER
*
* FUNCTION:     PLACES THIS VALUE IN THE ROM
*               'INITBL' TABLE. THE BIT CON-
*               FIGURATIONS ARE FORMED BY
*               CALLING THE CHR$ MACRO.
*
* NOTE:         THIS MACRO MUST BE CALLED FIVE
*               TIMES, SPECIFIC TO EACH COUNTER.
*               - UNUSED COUNTERS MUST HAVE AN
*                 ENTRY OF $0000
*               - A TECM$ CALL MUST IMMEDIATELY
*                 FOLLOW A TECL$ CALL, SINCE
*                 BOTH MACROS DEAL WITH THE
*                 SAME COUNTER NUMBER.
*
* ARGUMENTS REQUIRED:  9
*
```

```
* FORMAT:  TECH$ <gating control>,<count edge type>;
*               <count source selection>;
*               <special gate>,<reload register>;
*               <count occurrence>,<type of count>;
*               <step count>,<output control>
*
TECH$    MACRO
*
         IFNE     NARG-9
         FAIL     **ERROR***INVALID-STRING-ARGUMENT***
         MEXIT
         ENDC
*
         IFEQ     NARG-9
         CHR$     \1,\2,\3,\4,\5,\6,\7,\8,\9
         DC.W     CHR$0         2 byte ROM  entry
         ENDC
         ENDM
*
* FILE NAME:    CMDINTL - 'COMMAND TO INITIALIZE RAM & CHIP REGS.'
*
* PURPOSE:      - INITIALIZE 'RAMTBL' AND
*               9513 REGISTERS.
*       or      - REINITIALIZE 1 REGISTER ONLY.
*
* FUNCTION:     COPIES THE ORIGINAL VALUES
*               ENTERED IN 'INITBL' TO THE
*               CORRESPONDING RAM AND CHIP
*               REGISTERS.
*               THE TABLE IS BUILT STARTING
*               WITH THE LAST BYTE AND WORKING
*               IT'S WAY TO THE BEGINING.
*
* NOTE:         THIS MACRO MAYBE USED TO MOVE
*               ALL 26 BYTES AT ONCE OR ONLY
*               1 REGISTER.
*
* REGISTER STATUS:      A0 = INITBL
*                       A1 = RAMTBL
*                       D0 = A 26 BYTE COUNTER
*
* MACRO CALL NAME:      INTL$
*
* FORMAT1:  INTL$                 - BLANK ARGUMENT  = ALL 26 BYTES
* FORMAT2:  INTL$ <reg.name>      - REINITIALIZE ONLY 1 REGISTER
*                                 * (REGISTER NAMES FROM EQUATE FILE)
*
INTL$    MACRO
         LEA      INITBL(PC),A0       ROM SOURCE
         LEA      RAMTBL(PC),A1       RAM DESTINATION

* INITIALIZE ALL 26 *
         IFEQ     NARG
         MOVE.W   #$0019,D0        OFFSET VALUE = 25
LOP\@    MOVE.B   (A0,D0),(A1,D0)
         DBRA     D0,LOP\@         D0 = -1 ?  (YES = DONE)
         STMMR$   >
         STA1R$   >
         STA2R$   >
         STC1L$   >
         STC1M$   >
         STC2L$   >
         STC2M$   >> INIT CHIP REGS.
         STC3L$   >
         STC3M$   >
         STC4L$   >
```

```
                STC4M$   >
                STC5L$   >
                STC5M$   >
                MEXIT
                ENDC

        * REINITIALIZE 1 REGISTER *
                IFEQ     NARG-1          MOVE 1 REGISTER
                MOVE.W   \1(A0),\1(A1)   MOVE ROM TO RAM REG.
                ST\1$    INIT CHIP REGISTER
                ENDC
        *
                ENDM
        *
        *
        * MACRO CALL NAME:      UPMMR$
        *
        * PURPOSE:      UPDATE THE MASTER MODE REGISTER
        *
        * FUNCTION:     CHANGES THE VALUE OF THE MMR
        *               IN THE RAM TABLE.
        *               THIS VALUE MAY BE SPECIFIED BY:
        *               - Field , using format 1, which
        *               calls MMR$ to form the 2 byte value
        *               - or by directly entering the
        *               Word value,with immediate sign,
        *               when using format 2.
        *
        * NOTE:         IN ORDER TO SEND THIS UPDATED
        *               REGISTER TO THE 9513, ISSUE A
        *               CALL TO STMMR$
        *
        * ARGUMENTS REQUIRED:   9 ARE REQUIRED FOR FORMAT 1
        *                       1 IS  REQUIRED FOR FORMAT 2
        *
        * FORMAT 1:  UPMMR$  <scaler control>,<data pointer sequencing>;
        *                    <data bus width>,<fout gate>,<fout divider>;
        *                    <fout source>,<compare 2>,<compare 1>;
        *                    <time of day mode>
        *
        * FORMAT 2:  UPMMR$  <2 byte value>
        *
        *
        *
        UPMMR$  MACRO
                LEA      RAMTBL(PC),A1          ADDRESS OF RAM TABLE
        *
                IFEQ     NARG-1
                MOVE.W   \1,A1
                MEXIT
                ENDC
        *
                IFNE     NARG-1
                MMR$     \1,\2,\3,\4,\5,\6,\7,\8,\9
                MOVE.W   #(MMR$0),A1               GET NEW VALUE
                ENDC
        *
                ENDM
        *
        * MACRO CALL NAME:      UPACR$
        *
        * PURPOSE:      UPDATE ALARM COUNTER REGISTERS - (1 & 2)
        *
        * FUNCTION:     CHANGES THE VALUE OF THE A1R OR THE
        *               A2R IN THE RAM TABLE, DEPENDING ON
        *               THE COUNTER NUMBER SPECIFIED.
```

```
*
* NOTE:         IN ORDER TO SEND THIS UPDATED
*               REGISTER TO THE 9513, ISSUE
*               A CALL TO STA1R$ OR STA2R$.
*
* ARGUMENTS REQUIRED:   2
*
* FORMAT:       UPACR$ <2 byte comparator value>,<counter #>
*
UPACR$   MACRO
*
         IFNE    NARG-2
         FAIL    **ERROR***INVALID-STRING-ARGUMENT***
         MEXIT
         ENDC
*
         LEA     RAMTBL(PC),A1          RAM TABLE ADDRESS
         MOVE.W  \1,A\2R(A1)            WRITE NEW VALUE IN TABLE
         ENDM
*
* MACRO CALL NAME:          UPDCL$
*
* PURPOSE:      UPDATE COUNTER # LOAD REGISTER
*
* FUNCTION:     CHANGES THE CONTENTS OF SPECIFIED
*               LOAD REGISTER IN THE RAM TABLE
*               WITH THE NEW INPUT VALUE.
*
* NOTE:         IN ORDER TO SEND THIS UPDATED
*               REGISTER TO THE 9513, ISSUE THE
*               CORRESPONDING ST...$  CALL.
*
* ARGUMENTS REQUIRED:   2
*
* FORMAT:       UPDCL$ <init counter value>,<counter #>
*
UPDCL$   MACRO
*
         IFNE    NARG-2
         FAIL    **ERROR***INVALID-STRING-ARGUMENT***
         MEXIT
         ENDC
*
         IFEQ    NARG-2
         LEA     RAMTBL(PC),A1          RAM TABLE ADDRESS
         MOVE.W  \1,C\2L(A1)            WRITE NEW VALUE IN TABLE
         ENDC
         ENDM
*
* MACRO CALL NAME:      UPC1M$
*
* PURPOSE:      UPDATE THE COUNTER 1 MODE REGISTER
*
* FUNCTION:     CHANGES THE VALUE OF THE C1M REGISTER
*               IN THE RAM TABLE.
*               THIS VALUE MAY EITHER BE SPECIFIED BY:
*               - Field, using format 1, which calls
*               CMR$ to form the double byte     OR
*               - by directly entering the 2 Byte value,
*               with immediate sign, using format 2.
*
* NOTE:         IN ORDER TO SEND THIS UPDATED
*               REGISTER TO THE 9513, ISSUE A
*               CALL TO STC1M$.
*
* ARGUMENTS REQUIRED:   9 ARE NECESSARY FOR FORMAT 1
```

```
*                         1 IS  REQUIRED  IN  FORMAT 2
*
* FORMAT 1: UPC1M$  <gating control>,<count edge type>;
*                   <count source selection>;
*                   <special gate>,<reload register>;
*                   <count occurrence>,<type of count>;
*                   <step count>,<output control>
*
* FORMAT 2:   UPC1M$    <2 byte value>
*
UPC1M$   MACRO
         LEA      RAMTBL(PC),A1             RAM TABLE ADDRESS
*
         IFEQ     NARG-1
         MOVE.W   \1,C1M(A1)
         MEXIT
         ENDC
*
         IFNE     NARG-1
         CMR$     \1,\2,\3,\4,\5,\6,\7,\8,\9
         MOVE.W   #(CMR$0),C1M(A1)        WRITE NEW VALUE IN TABLE
         ENDC
*
         ENDM
*
* MACRO CALL NAME:     UPC2M$
*
* PURPOSE:      UPDATE COUNTER 2 MODE REGISTER
*
* FUNCTION:     CHANGES THE VALUE OF THE C2M
*               REGISTER IN THE RAM TABLE.
*               THIS VALUE MAY EITHER BE SPECIFIED BY:
*               - Field, using format 1, which calls
*               CMR$ to form the 2 bytes        OR
*               - by directly entering the 2 Byte
*               value, using format 2.
*
* NOTE:         IN ORDER TO SEND THIS UPDATED
*               REGISTER TO THE 9513, ISSUE
*               A CALL TO STC2M$.
*
* ARGUMENTS REQUIRED:   9  ARE NECESSARY FOR FORMAT 1
*                       1  IS  REQUIRED  IN  FORMAT 2
*
* FORMAT 1: UPC2M$  <gating control>,<count edge type>;
*                 <count source selection>;
*                 <special gate>,<reload register>;
*                 <count occurrence>,<type of count>;
*                 <step count>,<output control>
*
* FORMAT 2:     UPC2M$   <2 byte value>
*
UPC2M$   MACRO
         LEA      RAMTBL(PC),A1           RAM TABLE ADDRESS
*
         IFEQ     NARG-1
         MOVE.W   #\1,C2M(A1)
         ENDC
*
         IFNE     NARG-1
         CMR$     \1,\2,\3,\4,\5,\6,\7,\8,\9
         MOVE.W   #CMR$0,C2M(A1)        WRITE NEW VALUE TABLE
         ENDC
*
         ENDM
*
```

```
* MACRO CALL NAME:      UPC3M$
*
* PURPOSE:      UPDATE THE COUNTER 3 MODE REGISTER
*
* FUNCTION:     ENABLES CHANGING THE VALUE OF THE
*               C3M REGISTER IN THE RAM TABLE.
*               THIS VALUE MAY EITHER BE SPECIFIED BY:
*               - Field, using format 1, which calls
*               CHR$ to form the double byte      OR
*               - by directly entering the 2 Byte
*               value,with immediate sign, using format 2.
*
* NOTE:         IN ORDER TO SEND THIS UPDATED
*               REGISTER TO THE 9513, ISSUE A
*               CALL TO STC3M$.
*
* ARGUMENTS REQUIRED:   9 ARE NECESSARY FOR FORMAT 1
*                       1 IS  REQUIRED  IN  FORMAT 2
*
* FORMAT 1: UPC3M$  <gating control>,<count edge type>;
*                 <count source selection>;
*                 <special gate>,<reload register>;
*                 <count occurrence>,<type of count>;
*                 <step count>,<output control>
*
* FORMAT 2:     UPC3M$  <2 byte value>
*
UPC3M$  MACRO
        LEA     RAMTBL(PC),A1
*
        IFEQ    NARG-1
        MOVE.W  \1,C3M(A1)
        ENDC
*
        IFNE    NARG-1
        CHR$    \1,\2,\3,\4,\5,\6,\7,\8,\9
        MOVE.W  #(CHR$0),C3M(A1)          WRITE NEW VALUE IN TABLE
        ENDC
*
        ENDM
*
* MACRO CALL NAME:      UPC4M$
*
* PURPOSE:      UPDATE THE COUNTER 4 MODE REGISTER
*
* FUNCTION:     ENABLES CHANGING THE VALUE OF THE
*               C4M REGISTER IN THE RAM TABLE.
*               THIS VALUE MAY EITHER BE SPECIFIED BY:
*               - Field, using format 1, which calls
*               CHR$ to form the double byte     OR
*               - by directly entering the 2 Byte
*               value, with immediate sign, using format 2.
*
* NOTE:         IN ORDER TO SEND THIS UPDATED
*               REGISTER TO THE 9513, ISSUE
*               A CALL TO STC4M$.
*
* ARGUMENTS REQUIRED:   9 ARE NECESSARY FOR FORMAT 1
*                       1 IS  REQUIRED  IN  FORMAT 2
*
* FORMAT 1: UPC4M$  <gating control>,<count edge type>;
*                 <count source selection>;
*                 <special gate>,<reload register>;
*                 <count occurrence>,<type of count>;
*                 <step count>,<output control>
*
```

```
* FORMAT 2: UPC4M$    <2 byte value>
*
UPC4M$   MACRO
         LEA      RAMTBL(PC),A1
*
         IFEQ     NARG-1
         MOVE.W   \1,C4M(A1)
         MEXIT
         ENDC
*
         IFNE     NARG-1
         CHR$     \1,\2,\3,\4,\5,\6,\7,\8,\9
         MOVE.W   #(CHR$0),C4M(A1)
         ENDC
*
         ENDM
*
* MACRO CALL NAME:      UPC5M$
*
* PURPOSE:       UPDATE THE COUNTER 5 MODE REGISTER
*
* FUNCTION:      ENABLES CHANGING THE VALUE OF THE
*                C5M REGISTER IN THE RAM TABLE.
*                THIS VALUE MAY EITHER BE SPECIFIED BY:
*                - Field, using format 1, which calls
*                CHR$ to form the double byte     OR
*                - by directly entering the 2 Byte
*                value, with immediate sign, using format 2.
*
* NOTE:          IN ORDER TO SEND THIS UPDATED
*                REGISTER TO THE 9513, ISSUE A
*                CALL TO STC5M$.
*
* ARGUMENTS REQUIRED:   9 ARE NECESSARY FOR FORMAT 1
*                       1 IS  REQUIRED  IN  FORMAT 2
*
* FORMAT 1: UPC5M$  <gating control>,<count edge type>;
*                   <count source selection>;
*                   <special gate>,<reload register>;
*                   <count occurrence>,<type of count>;
*                   <step count>,<output control>
*
* FORMAT 2:      UPC5M$  <2 byte value>
*
UPC5M$   MACRO
         LEA      RAMTBL(PC),A1              RAM TABLE ADDRESS
*
         IFEQ     NARG-1
         MOVE.W   \1,C5M(A1)
         MEXIT
         ENDC
*
         IFNE     NARG-1
         CHR$     \1,\2,\3,\4,\5,\6,\7,\8,\9
         MOVE.W   #(CHR$0),C5M(A1)           WRITE NEW TABLE VALUE
         ENDC
*
         ENDM
*
* MACRO CALL NAME:      STMMR$
*
* PURPOSE:       SET THE DATA POINTER REGISTER
*                TO  THE MASTER MODE  REGISTER.
*
* FUNCTION:      THIS IS A SOFTWARE FACILITY WHICH
*                ENABLES A HARDWARE COMPONENT TO
*                BE SET IN THE 9513.
```

```
*               - (AN INTERFACE TO THE CHIP) -
*
* NOTE:         IN GENERAL, STMMR$ SHOULD BE
*               CALLED FOLLOWING AN UPDATE
*               OF THE MASTER MODE REGISTER -
*               ACCOMPLISHED  VIA  UPMMR$.
*
* FORMAT:       STMMR$          - NO ARGUMENT REQUIRED -
*
STMMR$   MACRO
         LEA      RAMTBL(PC),A1     RAM TABLE ADDR.
         MOVE.W   #$FF17,CTRLP      SET DATA PTR IN PORT
         MOVE.W   MMR(A1),DATAP     WRITE IN DATA PORT
         ENDM
*
* MACRO CALL NAME:      STA1R$
*
* PURPOSE:      SET THE DATA POINTER REGISTER
*               TO  THE ALARM COUNTER 1 REGISTER.
*
* FUNCTION:     THIS IS A SOFTWARE FACILITY WHICH
*               ENABLES A HARDWARE COMPONENT TO
*               BE SET IN THE 9513.
*               - (AN INTERFACE TO THE CHIP) -
*
* NOTE:         IN GENERAL, STA1R$ SHOULD BE
*               CALLED FOLLOWING AN UPDATE
*               OF THE ALARM REGISTER -
*               ACCOMPLISHED  VIA  UPACR$.
*
* FORMAT:       STA1R$          - NO ARGUMENT REQUIRED -
*
STA1R$   MACRO
         LEA      RAMTBL(PC),A1     RAM TABLE ADDR.
         MOVE.W   #$FF07,CTRLP      SET DATA POINTER REG.
         MOVE.W   A1R(A1),DATAP     SET IT IN CHIP
         ENDM
*
* MACRO CALL NAME:      STA2R$
*
* PURPOSE:      SET THE DATA POINTER REGISTER
*               TO  THE ALARM COUNTER 2 REGISTER.
*
* FUNCTION:     THIS IS A SOFTWARE FACILITY WHICH
*               ENABLES A HARDWARE COMPONENT TO
*               BE SET IN THE 9513.
*               - (AN INTERFACE TO THE CHIP) -
*
* NOTE:         IN GENERAL, STA2R$ SHOULD BE
*               CALLED FOLLOWING AN UPDATE
*               OF THE ALARM REGISTER -
*               ACCOMPLISHED  VIA  UPACR$.
*
* FORMAT:       STA2R$          - NO ARGUMENT REQUIRED -
*
STA2R$   MACRO
         LEA      RAMTBL(PC),A1   RAM TABLE ADDR.
         MOVE.W   #$FF0F,CTRLP        SET DATA POINTER REG.
         MOVE.W   A2R(A1),DATAP       SET THE CHIP
         ENDM
*
* MACRO CALL NAME:      STC1L$
*
* PURPOSE:      SET THE DATA POINTER REGISTER
*               TO  THE COUNTER 1 LOAD REGISTER.
*
```

```
* FUNCTION:     THIS IS A SOFTWARE FACILITY WHICH
*               ENABLES A HARDWARE COMPONENT TO
*               BE SET IN THE 9513.
*               - (AN INTERFACE TO THE CHIP) -
*
* NOTE:         IN GENERAL, STC1L$ SHOULD BE
*               CALLED FOLLOWING AN UPDATE
*               OF THE COUNTER LOAD REGISTER -
*               ACCOMPLISHED  VIA  UPCL$.
*
* FORMAT:       STC1L$          - NO ARGUMENT REQUIRED -
*
STC1L$   MACRO
         LEA      RAMTBL(PC),A1    RAM TABLE ADDR.
         MOVE.W   #$FF09,CTRLP     SET DATA PTR. REG.
         MOVE.W   C1L(A1),DATAP    SET THE CHIP
         ENDM
*
* MACRO CALL NAME:      STC1M$
*
* PURPOSE:      SET THE DATA POINTER REGISTER
*               TO  THE COUNTER 1 MODE REGISTER.
*
* FUNCTION:     THIS IS A SOFTWARE FACILITY WHICH
*               ENABLES A HARDWARE COMPONENT TO
*               BE SET IN THE 9513.
*               - (AN INTERFACE TO THE CHIP) -
*
* NOTE:         IN GENERAL, STC1M$ SHOULD BE
*               CALLED FOLLOWING AN UPDATE
*               OF THE COUNTER MODE REGISTER -
*               ACCOMPLISHED   VIA  UPC1M$.
*
* FORMAT:       STC1M$          - NO ARGUMENT REQUIRED -
*
STC1M$   MACRO
         LEA      RAMTBL(PC),A1    RAM TABLE ADDR.
         MOVE.W   #$FF01,CTRLP     SET DATA PTR. REG.
         MOVE.W   C1M(A1),DATAP    SET VALUE IN CHIP
         ENDM
*
* MACRO CALL NAME:      STC2L$
*
* PURPOSE:      SET THE DATA POINTER REGISTER
*               TO  THE COUNTER 2 LOAD REGISTER.
*
* FUNCTION:     THIS IS A SOFTWARE FACILITY WHICH
*               ENABLES A HARDWARE COMPONENT TO
*               BE SET IN THE 9513.
*               - (AN INTERFACE TO THE CHIP) -
*
* NOTE:         IN GENERAL, STC2L$ SHOULD BE
*               CALLED FOLLOWING AN UPDATE
*               OF THE COUNTER LOAD REGISTER -
*               ACCOMPLISHED   VIA  UPDCL$.
*
* FORMAT:       STC2L$          - NO ARGUMENT REQUIRED -
*
STC2L$   MACRO
         LEA      RAMTBL(PC),A1   RAM TABLE ADDR.
         MOVE.W   #$FF0A,CTRLP    SET DATA PTR. REG.
         MOVE.W   C2L(A1),DATAP   SET NEW VALUE IN CHIP
         ENDM
*
* MACRO CALL NAME:      STC2M$
*
```

```
* PURPOSE:      SET THE DATA POINTER REGISTER
*               TO  THE COUNTER 2 MODE REGISTER.
*
* FUNCTION:     THIS IS A SOFTWARE FACILITY WHICH
*               ENABLES A HARDWARE COMPONENT TO
*               BE SET IN THE 9513.
*               - (AN INTERFACE TO THE CHIP) -
*
* NOTE:         IN GENERAL, STC2M$ SHOULD BE
*               CALLED FOLLOWING AN UPDATE
*               OF THE COUNTER MODE REGISTER -
*               ACCOMPLISHED   VIA  UPC2M$.
*
* FORMAT:       STC2M$          - NO ARGUMENT REQUIRED -
*
STC2M$   MACRO
         LEA      RAMTBL(PC),A1    RAM TABLE ADDR.
         MOVE.W   #$FF02,CTRLP     SET DATA PTR. REG.
         MOVE.W   C2M(A1),DATAP    SET NEW VALUE IN CHIP
         ENDM
*
* MACRO CALL NAME:      STC3L$
*
* PURPOSE:      SET THE DATA POINTER REGISTER
*               TO  THE COUNTER 3 LOAD REGISTER.
*
* FUNCTION:     THIS IS A SOFTWARE FACILITY WHICH
*               ENABLES A HARDWARE COMPONENT TO
*               BE SET IN THE 9513.
*               - (AN INTERFACE TO THE CHIP) -
*
* NOTE:         IN GENERAL, STC3L$ SHOULD BE
*               CALLED FOLLOWING AN UPDATE
*               OF THE COUNTER LOAD REGISTER -
*               ACCOMPLISHED   VIA  UPDCL$.
*
* FORMAT:       STC3L$          - NO ARGUMENT REQUIRED -
*
STC3L$   MACRO
         LEA      RAMTBL(PC),A1      RAM TABLE ADDR.
         MOVE.W   #$FF0B,CTRLP       SET DATA POINTER REG.
         MOVE.W   C3L(A1),DATAP      SET NEW VALUE IN CHIP
         ENDM
*
* MACRO CALL NAME:      STC3M$
*
* PURPOSE:      SET THE DATA POINTER REGISTER
*               TO  THE COUNTER 3 MODE REGISTER.
*
* FUNCTION:     THIS IS A SOFTWARE FACILITY WHICH
*               ENABLES A HARDWARE COMPONENT TO
*               BE SET IN THE 9513.
*               - (AN INTERFACE TO THE CHIP) -
*
* NOTE:         IN GENERAL, STC3M$ SHOULD BE
*               CALLED FOLLOWING AN UPDATE
*               OF THE COUNTER MODE REGISTER -
*               ACCOMPLISHED   VIA  UPC3M$.
*
* FORMAT:       STC3M$          - NO ARGUMENT REQUIRED -
*
STC3M$   MACRO
         LEA      RAMTBL(PC),A1    RAM TABLE ADDR.
         MOVE.W   #$FF03,CTRLP     SET DATA PTR. REG.
         MOVE.W   C3M(A1),DATAP    SET NEW VALUE IN CHIP
         ENDM
```

```
*
* MACRO CALL NAME:      STC4L$
*
* PURPOSE:      SET THE DATA POINTER REGISTER
*               TO  THE COUNTER 4 LOAD REGISTER.
*
* FUNCTION:     THIS IS A SOFTWARE FACILITY WHICH
*               ENABLES A HARDWARE COMPONENT TO
*               BE SET IN THE 9513.
*               - (AN INTERFACE TO THE CHIP) -
*
* NOTE:         IN GENERAL, STC4L$ SHOULD BE
*               CALLED FOLLOWING AN UPDATE
*               OF THE COUNTER LOAD REGISTER -
*               ACCOMPLISHED   VIA  UPDCL$.
*
* FORMAT:       STC4L$          - NO ARGUMENT REQUIRED -
*
STC4L$   MACRO
         LEA      RAMTBL(PC),A1   RAM TABLE ADDR.
         MOVE.W   #$FF0C,CTRLP    SET DATA PTR. REG.
         MOVE.W   C4L(A1),DATAP   SET NEW VALUE IN CHIP
         ENDM
*
* MACRO CALL NAME:      STC4M$
*
* PURPOSE:      SET THE DATA POINTER REGISTER
*               TO  THE COUNTER 4 MODE REGISTER.
*
* FUNCTION:     THIS IS A SOFTWARE FACILITY WHICH
*               ENABLES A HARDWARE COMPONENT TO
*               BE SET IN THE 9513.
*               - (AN INTERFACE TO THE CHIP) -
*
* NOTE:         IN GENERAL, STC4M$ SHOULD BE
*               CALLED FOLLOWING AN UPDATE
*               OF THE COUNTER MODE REGISTER -
*               ACCOMPLISHED   VIA  UPC4M$.
*
* FORMAT:       STC4M$          - NO ARGUMENT REQUIRED -
*
STC4M$   MACRO
         LEA      RAMTBL(PC),A1   RAM TABLE ADDR,
         MOVE.W   #$FF04,CTRLP    SET DATA PTR. REG.
         MOVE.W   C4M(A1),DATAP   SET NEW VALUE IN CHIP
         ENDM
*
* MACRO CALL NAME:      STC5L$
*
* PURPOSE:      SET THE DATA POINTER REGISTER
*               TO  THE COUNTER 5 LOAD REGISTER.
*
* FUNCTION:     THIS IS A SOFTWARE FACILITY WHICH
*               ENABLES A HARDWARE COMPONENT TO
*               BE SET IN THE 9513.
*               - (AN INTERFACE TO THE CHIP) -
*
* NOTE:         IN GENERAL, STC5L$ SHOULD BE
*               CALLED FOLLOWING AN UPDATE
*               OF THE COUNTER LOAD REGISTER -
*               ACCOMPLISHED   VIA  UPDCL$.
*
* FORMAT:       STC5L$          - NO ARGUMENT REQUIRED -
*
STC5L$   MACRO
         LEA      RAMTBL(PC),A1   RAM TABLE ADDR.
```

```
        MOVE.W   #$FF0D,CTRLP    SET DATA PTR. REG.
        MOVE.W   C5L(A1),DATAP   SET NEW VALUE IN CHIP
        ENDM
*
* MACRO CALL NAME:     STC5M$
*
* PURPOSE:      SET THE DATA POINTER REGISTER
*               TO  THE COUNTER 5 MODE REGISTER.
*
* FUNCTION:     THIS IS A SOFTWARE FACILITY WHICH
*               ENABLES A HARDWARE COMPONENT TO
*               BE SET IN THE 9513.
*               - (AN INTERFACE TO THE CHIP) -
*
* NOTE:         IN GENERAL, STC5M$ SHOULD BE
*               CALLED FOLLOWING AN UPDATE
*               OF THE COUNTER MODE REGISTER -
*               ACCOMPLISHED   VIA  UPDC5M$.
*
* FORMAT:       STC5M$          - NO ARGUMENT REQUIRED -
*
STC5M$  MACRO
        LEA      RAMTBL(PC),A1   RAM TABLE ADDR.
        MOVE.W   #$FF05,CTRLP    SET DATA PTR. REG.
        MOVE.W   C5M(A1),DATAP   SET NEW VALUE IN CHIP
        ENDM
*
* FILE NAME:    CMDARM -'COMMAND TO ARM COUNTERS'
*
* PURPOSE:      DIRECTLY CONTROLS
*               THE COUNTING PROCESS.
*
* FUNCTION:     ARMS COUNTER(S) TO BEGIN COUNTING
*               AT INITIALIZE TIME.
*
* MACRO NAME:   ARM$
*
* ARGUMENTS REQUIRED:   A MAXIMUM OF FIVE
*
* FORMAT:       ARM$ <counter 5>,<counter 4>,<counter 3>;
*                    <counter 2>,<counter 1>
* CALLS:        CNT5$
*
ARM$    MACRO
*
BYTE$0  SET      $FF20           SET ARM BITS
        CNT5$    \1,\2,\3,\4,\5
        ENDM
*
* FILE NAME:    CMDLOD -'COMMAND TO LOAD COUNTERS'
*
* PURPOSE:      DIRECTLY CONTROLS
*               THE COUNTING PROCESS.
*
* FUNCTION:     LOAD COUNTER(S) WITH THE VALUE OF THE
*               ASSOCIATED LOAD OR HOLD REGISTER
*               CONTENTS, DETERMINED BY THE MODE
*               REGISTER.
*
* MACRO NAME:   LOD$
*
* ARGUMENTS REQUIRED:   A MAXIMUM OF FIVE
*
* FORMAT:       LOD$ <counter 5>,<counter 4>,<counter 3>;
*                    <counter 2>,<counter 1>
*
```

```
* CALLS:        CNT5$
*
LOD$     MACRO
*
BYTE$0   SET      $FF40            SET LOAD BITS
         CNT5$    \1,\2,\3,\4,\5
         ENDM
*
* FILE NAME:    CMDLAM -'COMMAND TO LOAD & ARM COUNTERS'
*
* PURPOSE:      DIRECTLY CONTROLS
*               THE COUNTING PROCESS.
*
* FUNCTION:     LOAD COUNTER(S) WITH THE VALUE OF THE
*               ASSOCIATED LOAD OR HOLD REGISTER
*               CONTENTS, DETERMINED BY THE MODE
*               REGISTER.
*               - AFTER THE SPECIFIED COUNTER(S) ARE
*               LOADED, THEY WILL AUTOMATICALLY BE
*               READIED WITH AN ARM COMMAND.
*
* MACRO NAME:   LAM$
*
* ARGUMENTS REQUIRED:   A MAXIMUM OF FIVE
*
* FORMAT:       LAM$ <counter 5>,<counter 4>,<counter 3>;
*                    <counter 2>,<counter 1>
*
* CALLS:        CNT5$
*
LAM$     MACRO
*
BYTE$0   SET      $FF60            SET LOAD&ARM BITS
         CNT5$    \1,\2,\3,\4,\5
         ENDM
*
* FILE NAME:    CMDDSA -'COMMAND TO DISARM COUNTERS'
*
* PURPOSE:      DIRECTLY CONTROLS
*               THE COUNTING PROCESS.
*
* FUNCTION:     ANY COMBINATION OF COUNTERS MAYBE
*               DISABLED FROM COUNTING, INDEPENDENT
*               FROM OTHER CONTROL CONDITIONS.
*               - **NOTE** A COUNTER IN A TC STATE
*                          WILL COUNT ONCE AFTER
*                          BEING DISARMED.
*
* MACRO NAME:   DSA$
*
* ARGUMENTS REQUIRED:   A MAXIMUM OF FIVE
*
* FORMAT:       DSA$ <counter 5>,<counter 4>,<counter 3>;
*                    <counter 2>,<counter 1>
*
* CALLS:        CNT5$
*
DSA$     MACRO
*
BYTE$0   SET      $FFC0            SET DISARM BITS
         CNT5$    \1,\2,\3,\4,\5
         ENDM
*
* FILE NAME:    CMDSAV -'COMMAND TO SAVE COUNTERS'
*
* PURPOSE:      DIRECTLY CONTROLS
```

```
*               THE COUNTING PROCESS.
*
* FUNCTION:     ANY COMBINATION OF COUNTERS MAY HAVE
*               ITS' CONTENTS TRANSFERRED INTO THE
*               ASSOCIATED HOLD REGISTER.
*
* MACRO NAME:   SAV$
*
* ARGUMENTS REQUIRED:   A MAXIMUM OF FIVE
*
* FORMAT:       SAV$ <counter 5>,<counter 4>,<counter 3>;
*                    <counter 2>,<counter 1>
*
* CALLS:        CNT5$
*
SAV$    MACRO
*
BYTE$0  SET     $FFA0           SET SAVE BITS
        CNT5$   \1,\2,\3,\4,\5
        ENDM
*
* FILE NAME:    CMDDSV -'COMMAND TO DISARM & SAVE COUNTERS'
*
* PURPOSE:      DIRECTLY CONTROLS
*               THE COUNTING PROCESS.
*
* FUNCTION:     ANY COMBINATION OF COUNTERS MAYBE
*               DISABLED FROM COUNTING AND HAVE
*               ITS' CONTENTS TRANSFERRED INTO THE
*               ASSOCIATED HOLD REGISTER.
*
* MACRO NAME:   DSV$
*
* ARGUMENTS REQUIRED:   A MAXIMUM OF FIVE
*
* FORMAT:       DSV$ <counter 5>,<counter 4>,<counter 3>;
*                    <counter 2>,<counter 1>
*
* CALLS:        CNT5$
*
DSV$    MACRO
*
BYTE$0  SET     $FF80           SET DISARM&SAVE BITS
        CNT5$   \1,\2,\3,\4,\5
        ENDM
*
* FILE NAME:    CMDSTP - 'COMMAND TO STEP A COUNTER'
*
* FUNCTION:     COUNTER (N) IS DECREMENTED OR
*               INCREMENTED BY ONE DEPENDING ON
*               ITS OPERATING CONFIGURATION.
*
* NOTE1:        THIS DEPENDS ON BIT 3 OF THE
*               ASSOCIATED COUNTER MODE REG:
*               - CM3= 0  = DECREMENT
*               - CM3= 1  = INCREMENT
*
* NOTE2:        A STEP COMMAND WILL TAKE
*               EFFECT, EVEN IF THE COUNTER
*               HAS BEEN PREVIOUSLY DISARMED.
*
* NOTE3:        THIS IS A ONE BYTE COMMAND
*               AND MUST BE WRITTEN TO THE
*               CONTROL PORT OF THE 9513.
*
* CALL NAME:    STP$
```

```
*
* ARGUMENTS REQUIRED:   1
*
* FORMAT:       STP$ <COUNTER #>
*
STP$    MACRO
        MOVE.W   #($FFF0+\1),CTRLP      WRITE BYTE TO C-PORT
        ENDM
*
* FILE NAME:    CMDSET - 'COMMAND TO SET A COUNTER'
*
* FUNCTION:     THE OUTPUT TOGGLE FOR COUNTER(N)
*               IS SET. THE OUT(N) SIGNAL WILL
*               BE DRIVEN HIGH UNLESS A TC
*               OUTPUT IS SPECIFIED.
*
* NOTE:         THIS IS A ONE BYTE COMMAND
*               AND MUST BE WRITTEN TO THE
*               CONTROL PORT OF THE 9513.
*
* CALL NAME:    SET$
*
* ARGUMENTS REQUIRED:   1
*
* FORMAT:       SET$ <COUNTER #>
*
SET$    MACRO
        MOVE.W   #($FFE8+\1),CTRLP    WRITE TO C-PORT
        ENDM
*
* FILE NAME:    CMDCLR - 'COMMAND TO CLEAR A COUNTER'
*
* FUNCTION:     THE OUTPUT TOGGLE FOR COUNTER(N)
*               IS RESET. THE OUT(N) SIGNAL WILL
*               BE DRIVEN LOW UNLESS A TC
*               OUTPUT IS SPECIFIED.
*
* NOTE:         THIS IS A ONE BYTE COMMAND
*               AND MUST BE WRITTEN TO THE
*               CONTROL PORT OF THE 9513.
*
* CALL NAME:    CLR$
*
* ARGUMENTS REQUIRED:   1
*
* FORMAT:       CLR$ <COUNTER #>
*
CLR$    MACRO
        MOVE.W   #($FFE0+\1),CTRLP     WRITE TO CONTROL PORT
        ENDM
*
* FILE NAME:    CMDSTA - 'COMMAND TO READ STATUS REGISTER'
*
* PURPOSE:      THE READ ONLY STATUS REGISTER
*               INDICATES THE STATE OF THE BYTE
*               POINTER BIT IN THE DATA POINTER
*               REGISTER AND THE STATE OF THE
*               OUT SIGNAL FOR EACH OF THE
*               FIVE GENERAL COUNTERS.
*
* BIT ASSIGNMENTS: ---------------------------------
*                  !SR7!SR6!SR5!SR4!SR3!SR2!SR1!SR0!
*                  ---------------------------------
*                    '   '   '   '   '   '   '   '
*                    1   1 OUT5  '  OUT3 '  OUT1 '
*                              OUT4    OUT2     BYTE
```

```
*                                                POINTER
*
* NOTE:          - THIS IS A ONE BYTE REGISTER
*                AND MAY BE READ FROM EITHER
*                OF THE TWO PORTS IN THE 9513.
*                - IN THIS CASE, 'SR' IS READ
*                FROM THE CONTROL PORT.
*
* OUTPUT REGISTER STATUS:    D1 - CONTAINS THE STATUS
*                                 REGISTER,FOUND IN THE
*                                 LEAST SIGNIFICANT WORD.
*
* CALL NAME:     STA$
*
* ARGUMENTS REQUIRED:   NONE
*
* FORMAT:        STA$
*
STA$     MACRO
         MOVE.W   CTRLP,D1
         ENDM
*
* FILE NAME:     CMDSEQ - 'COMMAND TO ENABLE SEQUENCING'
*
* FUNCTION:      CLEARS MASTER MODE BIT 14 WITHOUT
*                AFFECTING ANY OTHER BIT VALUES.
*                THIS ALLOWS SEQUENTIAL HOST
*                PROCESSOR ACCESS TO SEVERAL
*                INTERNAL LOACTIONS WITHOUT
*                REPETITIVE UPDATING OF THE
*                DATA POINTER.
*
* NOTE:          The value of the Master Mode
*                is also updated in the ram table.
*
* CALL NAME:     SEQ$
*
* ARGUMENTS REQUIRED:   0
*
* FORMAT:        SEQ$
*
SEQ$     MACRO
         MOVE.W   #$FFE0,CTRLP     write to the port
* UPDATE MMR IN RAM
         LEA      RAMTBL(PC),A1    ram address
         BCLR.B   #7,(A1)          clear bit 7 of the MSByte
         ENDM
*
* FILE NAME:     CMDNSQ - 'COMMAND TO DISABLE SEQUENCING'
*
* FUNCTION:      SETS MASTER MODE BIT 14 WITHOUT
*                AFFECTING ANY OTHER BIT VALUES.
*                THIS ALLOWS SEQUENTIAL HOST
*                PROCESSOR ACCESS TO A GIVEN
*                INTERNAL LOACTION WITHOUT
*                REPETITIVE UPDATING OF THE
*                DATA POINTER.
*
* NOTE:          The Master Mode  register is
*                also updated in the ram table.
*
* CALL NAME:     NOSEQ$
*
* ARGUMENTS REQUIRED:   0
*
* FORMAT:        NOSEQ$
```

```
*
NOSEQ$   MACRO
         MOVE.W   #$FFE8,CTRLP    write to Control Port
* UPDATE RAM
         LEA      RAMTBL(PC),A1   ram table address
         BSET.B   #7,(A1)         set bit 7 of the MSByte
         ENDM
*
* FILE NAME:    CMDGON - 'COMMAND TO GATE ON FOUT'
*
* FUNCTION:     CLEARS MASTER MODE BIT 12
*               WITHOUT AFFECTING OTHER BITS
*               IN THE MMR.
*
* DESCRIPTION:  MM12 CONTROLS THE THE OUTPUT
*               STATUS OF THE FOUT SIGNAL.
*               - FOUT BECOMES ACTIVE AND
*               DRIVES OUT THE SELECTED AND
*               DIVIDED FOUT SIGNAL.
*
* NOTE:         - THIS IS A ONE BYTE COMMAND
*               AND MUST BE WRITTEN TO THE
*               CONTROL PORT OF THE 9513.
*               - THE MMR IS ALSO UPDATED
*               IN 'RAMTBL'.
*
* CALL NAME:    GON$
*
* ARGUMENTS REQUIRED:   NONE
*
* FORMAT:       GON$
*
GON$     MACRO
         MOVE.W   #$FFE6,CTRLP     SET THE BYTE IN C-PORT

* UPDATE MMR IN RAM
         LEA      RAMTBL(PC),A1   RAM ADDRESS
         BCLR.B   #5,(A1)         CLEAR BIT 5 OF THE MSByte
         ENDM
*
* FILE NAME:    CMDGOF - 'COMMAND TO GATE OFF FOUT'
*
* FUNCTION:     SETS MASTER MODE BIT 12
*               WITHOUT AFFECTING OTHER BITS
*               IN THE MMR.
*
* DESCRIPTION:  MM12 CONTROLS THE THE OUTPUT
*               STATUS OF THE FOUT SIGNAL.
*               - FOUT LINE WILL EXHIBIT
*               A LOW IMPEDANCE TO GROUND.
*
* NOTE:         - THIS IS A ONE BYTE COMMAND
*               AND MUST BE WRITTEN TO THE
*               CONTROL PORT OF THE 9513.
*               - THE RAM TABLE IS ALSO
*               UPDATED WITH THIS MMR VALUE.
*
* CALL NAME:    GOF$
*
* ARGUMENTS REQUIRED:   NONE
*
* FORMAT:       GOF$
*
GOF$     MACRO
         MOVE.W   #$FFEE,CTRLP    SET BYTE IN CONTROL PORT
```

```
* UPDATE RAM
        LEA     RAMTBL(PC),A1   RAM TABLE ADDRESS
        BSET.B  #5,(A1)         SET BIT 5 IN THE MSByte
        ENDM
*
* FILE NAME:    CMDREAD - ' COMMAND TO READ A REGISTER '
*
* PURPOSE:      THE SPECIFIED REGISTER
*               WILL BE READ FROM EITHER THE
*               RAM TABLE OR THE DATA PORT OF
*               THE CHIP.
*
* DESCRIPTION:  READ$ CONFIGURES THE COMMAND THAT
*               WILL BE LOADED INTO THE DATA
*               POINTER AND CALLS UPON GET$
*               TO RETRIEVE THE DATA.
*
* CALLS:        GET$
*
* MACRO:        READ$
*
* ARGUMENTS REQUIRED:   3
*
* FORMAT:       READ$ <group pointer>,<element pointer>;
*                       <read source>
*
* OUTPUT REGISTER STATUS:    D0 = 'RAMTBL' REGISTER VALUE
*                            D1 = REGISTER CONTENT FROM THE CHIP
*
*     note: When specifing either the Status Register or
*           one of the Hold Registers, D0 is unaffected.
*           These registers are not in the ram table,
*           rendering them only available from the chip.
*
*
* VALID PARAMETERS:
*                                                                  *
*         GROUP POINTERS       !       ELEMENT POINTERS            *
*         --------------       !       ----------------            *
*      C1 = COUNTER ONE        !    MR = MODE REGISTER             *
*      C2 = COUNTER TWO        !    LR = LOAD REGISTER             *
*      C3 = COUNTER THREE      !    HR = HOLD REGISTER             *
*      C4 = COUNTER FOUR       !    HI = HOLD CYCLE INCREMENT      *
*      C5 = COUNTER FIVE       !                                   *
*------------------------------!-----------------------------------*
*      CG = CONTROL GROUP      !    A1 = ALARM REG. COUNTER 1      *
*                              !    A2 = ALARM REG. COUNTER 2      *
*                              !    MM = MASTER MODE REGISTER      *
*                              !    SR = STATUS REGISTER           *
*                                                                  *
*     note: The Group Pointer determines the type of               *
*           Element Pointer register that will be read.            *
*           A single selection from each pointer is required.      *
*                                                                  *
*                                                                  *
* READ SOURCE :      R = READ FROM RAM                             *
*                    C = READ FROM THE CHIP                        *
*                                                                  *
********************************************************************
*
READ$   MACRO
*
        IFNE    NARG-3
        FAIL    **ERROR***INVALID-STRING-ARGUMENT***
        MEXIT
        ENDC
```

```
*
         IFEQ    NARG-3
BYTE$0   SET     $FF00            SET READ BITS

*          ***** CONTROL GROUP *****
         IFC     '\1','CG'
BYTE$0   SET     (BYTE$0)+$07     SET CG IN DATA PTR.
*
         IFC     '\2','A1'
BYTE$0   SET     (BYTE$0)+$00     SET ALARM 1
         GET$    A1R,\3           GET REGISTER W/SOURCE
         MEXIT
         ENDC
*
         IFC     '\2','A2'
BYTE$0   SET     (BYTE$0)+$08     SET ALARM 2
         GET$    A2R,\3           GET REG. W/ SOURCE
         MEXIT
         ENDC
*
         IFC     '\2','MM'
BYTE$0   SET     (BYTE$0)+$10     SET MASTER MODE
         GET$    MMR,\3           GET REG. W/ SOURCE
         MEXIT
         ENDC
*
         IFC     '\2','SR'
BYTE$0   SET     (BYTE$0)+$18     SET STATUS REG (READ ONLY)
         MOVE.W  CTRLP,D1         READ STATUS
         MEXIT
         ENDC
         ENDC
*
*          ***** COUNTER GROUP *****

* COUNTER 1
*
         IFC     '\1','C1'
BYTE$0   SET     (BYTE$0)+$01     SET COUNTER 1
*
         IFC     '\2','MR'
BYTE$0   SET     (BYTE$0)+$00     SET MODE REG.
         GET$    C1M,\3           GET REG. CONTENT
         MEXIT
         ENDC
*
         IFC     '\2','LR'
BYTE$0   SET     (BYTE$0)+$08     SET LOAD REG.
         GET$    C1L,\3           GET REG. CONTENT
         MEXIT
         ENDC
*
         IFC     '\2','HR'
BYTE$0   SET     (BYTE$0)+$10     SET HOLD REG.
         MOVE.W  #$FF11,CTRLP     SET DATA PTR. IN C-PORT
         MOVE.W  DATAP,D1         PUT HOLD IN D1 REG.
         MEXIT
         ENDC
*
         IFC     '\2','HI'
BYTE$0   SET     (BYTE$0)+$18     SET HOLD CYCLE INCREMENT
         MOVE.W  #$FF19,CTRLP     SET DATA PTR. IN C-PORT
         MOVE.W  DATAP,D1         READ HOLD CYCLE REG.
         MEXIT
         ENDC
         ENDC
```

```
*
* COUNTER 2
         IFC      '\1','C2'
BYTE$0   SET      (BYTE$0)+02
*
         IFC      '\2','MR'
BYTE$0   SET      (BYTE$0)+$00
         GET$     C2M,\3
         MEXIT
         ENDC
*
         IFC      '\2','LR'
BYTE$0   SET      (BYTE$0)+$08
         GET$     C2L,\3
         MEXIT
         ENDC
*
         IFC      '\2','HR'
BYTE$0   SET      (BYTE$0)+$10
         MOVE.W   #$FF12,CTRLP
         MOVE.W   DATAP,D1
         MEXIT
         ENDC
*
         IFC      '\2','HI'
BYTE$0   SET      (BYTE$0)+$18
         MOVE.W   #$FF1A,CTRLP
         MOVE.W   DATAP,D1
         MEXIT
         ENDC
         ENDC
*
* COUNTER 3
         IFC      '\1','C3'
BYTE$0   SET      (BYTE$0)+$03
*
         IFC      '\2','MR'
BYTE$0   SET      (BYTE$0)+$00
         GET$     C3M,\3
         MEXIT
         ENDC
*
         IFC      '\2','LR'
BYTE$0   SET      (BYTE$0)+$08
         GET$     C3L,\3
         MEXIT
         ENDC
*
         IFC      '\2','HR'
BYTE$0   SET      (BYTE$0)+$10
         MOVE.W   #$FF13,CTRLP
         MOVE.W   DATAP,D1
         MEXIT
         ENDC
*
         IFC      '\2','HI'
BYTE$0   SET      (BYTE$0)+$18
         MOVE.W   #$FF1B,CTRLP
         MOVE.W   DATAP,D1
         MEXIT
         ENDC
         ENDC
*
* COUNTER 4
         IFC      '\1','C4'
BYTE$0   SET      (BYTE$0)+$04
```

```
*
         IFC      '\2','MR'
BYTE$0   SET      (BYTE$0)+$00
         GET$     C4M,\3
         MEXIT
         ENDC
*
         IFC      '\2','LR'
BYTE$0   SET      (BYTE$0)+$08
         GET$     C4L,\3
         MEXIT
         ENDC
*
         IFC      '\2','HR'
BYTE$0   SET      (BYTE$0)+$10
         MOVE.W   #$FF14,CTRLP
         MOVE.W   DATAP,D1
         MEXIT
         ENDC
*
         IFC      '\2','HI'
BYTE$0   SET      (BYTE$0)+$18
         MOVE.W   #$FF1C,CTRLP
         MOVE.W   DATAP,D1
         MEXIT
         ENDC
         ENDC
*
* COUNTER 5
         IFC      '\1','C5'
BYTE$0   SET      (BYTE$0)+$05
*
         IFC      '\2','MR'
BYTE$0   SET      (BYTE$0)+$00
         GET$     C5M,\3
         MEXIT
         ENDC
*
         IFC      '\2','LR'
BYTE$0   SET      (BYTE$0)+$08
         GET$     C5L,\3
         MEXIT
         ENDC
*
         IFC      '\2','HR'
BYTE$0   SET      (BYTE$0)+$10
         MOVE.W   #$FF15,CTRLP
         MOVE.W   DATAP,D1
         MEXIT
         ENDC
*
         IFC      '\2','HI'
BYTE$0   SET      (BYTE$0)+$18
         MOVE.W   #$FF1D,CTRLP
         MOVE.W   DATAP,D1
         ENDC
         ENDC
*
         ENDC
         ENDM
*
* FILE NAME:    CMDRITE - 'COMMAND TO WRITE A REGISTER'
*
* PURPOSE:      SEND A 16 BIT VALUE ,
*               BY BYTE OR BY FIELD , TO THE
*               SPECIFIED REGISTER IN THE CHIP.
```

```
*                  ALSO UPDATES THE RAM TABLE WITH
*                  THIS NEW INPUT VALUE.
*
* CALLS:           UPxxx$ - TO UPDATE RAM     &
*                 STxxx$ - TO WRITE TO THE CHIP
*                  (xxx  - represents the register name)
*
* MACRO:          RITE$
*
* ARGUMENTS REQUIRED:   3 ARE REQUIRED FOR FORMAT 1
*                      11 ARE REGUIRED FOR FORMAT 2
*
* FORMAT 1:       RITE$ <group pointer>,<element pointer>;
*                       <2 byte write value>
*
* FORMAT 2:       MAY BE USED FOR SPECIFYING  MODE REGISTEKS
*                 BY FIELD. THIS FORMAT MUST ENTER THE UNIQUE
*                 PARAMETERS FOR EITHER THE MASTER MODE REGISTER
*                 OR ONE OF THE FIVE COUNTER MODE REGISTERS.
*
*                 - MASTER MODE REGISTER -
*  RITE$          <group pointer>,<element pointer>;
*                 <scaler control>,<data pointer seq>;
*                 <data bus width>,<fout gate>;
*                 <fout divider>,<fout source>;
*                 <compare 1>,<compare 2>,<time of day>
*
*                 - ANY COUNTER MODE REGISTER -
*  RITE$          <group pointer>,<element pointer>;
*                 <gating control>,<count edge type>;
*                 <count source selection>,<special gate>;
*                 <reload register>,<count occurrence>;
*                 <type of count>,<step count>,<output control>
*
* NOTE:           - THE GROUP POINTER DETERMINES THE
*                 ELEMENT POINTER REGISTER THAT WILL
*                 BE WRITTEN TO.
*                 - THE VALUE SENT WILL BE USED AS
*                 AN ARGUMENT WHEN UPDATE IS CALLED.
*                 - EXCEPTION OCCURRS IF A WRITE IS
*                 ATTEMPTED TO THE STATUS REGISTER.
*
* VALID PARAMETERS:***** SELECT ONLY 1 FROM EACH POINTER *********
*                                                                *
*         GROUP POINTERS      !      ELEMENT POINTERS            *
*         --------------      !      ----------------            *
*      C1 = COUNTER ONE       !   MR = MODE REGISTER             *
*      C2 = COUNTER TWO       !   LR = LOAD REGISTER             *
*      C3 = COUNTER THREE     !   HR = HOLD REGISTER             *
*      C4 = COUNTER FOUR      !   HI = HOLD CYCLE INCREMENT      *
*      C5 = COUNTER FIVE      !                                  *
*-----------------------------!----------------------------------*
*      CG = CONTROL GROUP     !   A1 = ALARM REG. COUNTER 1      *
*                             !   A2 = ALARM REG. COUNTER 2      *
*                             !   MM = MASTER MODE REGISTER      *
******************************************************************
*
RITE$    MACRO
*
         IFNE     NARG-3
         IFNE     NARG-11
         FAIL     ***INVALID-STRING-ARGUMENT***
         MEXIT
         ENDC
         ENDC
*
```

```
*         ***** CONTROL GROUP *****
          IFC     '\1','CG'

          IFC     '\2','A1'
          UPACR$  \3,1           UPDATE ALARM 1
          STA1R$
          MEXIT
          ENDC

          IFC     '\2','A2'
          UPACR$  \3,2           UPDATE ALARM 2
          STA2R$
          MEXIT
          ENDC
*                               UPDATE MASTER MODE
          IFC     '\2','MM'
          IFEQ    NARG-3
          UPMMR$  \3
          ENDC
          IFEQ    NARG-11
          UPMMR$  \3,\4,\5,\6,\7,\8,\9,\A,\B
          ENDC
          STMMR$
          MEXIT
          ENDC

*                               STATUS REG IS READ ONLY
          IFC     '\2','SR'
          FAIL    *ERROR***INVALID-WRITE-REQUEST***
          MEXIT
          ENDC
          ENDC
*
*         ***** COUNTER GROUP *****
* COUNTER 1
          IFC     '\1','C1'

*                               UPDATE MODE REG.
          IFC     '\2','MR'
          IFEQ    NARG-3
          UPC1M$  \3
          ENDC
          IFEQ    NARG-11
          UPC1M$  \3,\4,\5,\6,\7,\8,\9,\A,\B
          ENDC
          STC1M$
          MEXIT
          ENDC

          IFC     '\2','LR'
          UPDCL$  \3,1           UPDATE LOAD REG.
          STC1L$
          MEXIT
          ENDC

          IFC     '\2','HR'
          MOVE.W  #$FF11,CTRLP   SET DATA PTR.IN C-PORT
          MOVE.W  \3,DATAP       WRITE HOLD REG. VALUE
          MEXIT
          ENDC

          IFC     '\2','HI'
          MOVE.W  #$FF19,CTRLP   SET DATA PTR. IN C-PORT
          MOVE.W  \3,DATAP       WRITE HOLD CYCLE VALUE
          MEXIT
          ENDC
```

```
        ENDC
*
* COUNTER 2
        IFC     '\1','C2'
        IFC     '\2','MR'
        IFEQ    NARG-3
        UPC2M$  \3
        ENDC
        IFEQ    NARG-11
        UPC2M$  \3,\4,\5,\6,\7,\8,\9,\A,\B
        ENDC
        STC2M$
        MEXIT
        ENDC
        IFC     '\2','LR'
        UPDCL$  \3,2
        STC2L$
        MEXIT
        ENDC
        IFC     '\2','HR'
        MOVE.W  #$FF12,CTRLP
        MOVE.W  \3,DATAP
        MEXIT
        ENDC
        IFC     '\2','HI'
        MOVE.W  #$FF1A,CTRLP
        MOVE.W  \3,DATAP
        MEXIT
        ENDC
        ENDC
*
* COUNTER 3
        IFC     '\1','C3'
        IFC     '\2','MR'
        IFEQ    NARG-3
        UPC3M$  \3
        ENDC
        IFEQ    NARG-11
        UPC3M$  \3,\4,\5,\6,\7,\8,\9,\A,\B
        ENDC
        STC3M$
        MEXIT
        ENDC
        IFC     '\2','LR'
        UPDCL$  \3,3
        STC3L$
        MEXIT
        ENDC
        IFC     '\2','HR'
        MOVE.W  #$FF13,CTRLP
        MOVE.W  \3,DATAP
        MEXIT
        ENDC
        IFC     '\2','HI'
        MOVE.W  #$FF1B,CTRLP
        MOVE.W  \3,DATAP
```

```
        MEXIT
        ENDC

        ENDC
*
* COUNTER 4
        IFC     '\1','C4'

        IFC     '\2','MR'
        IFEQ    NARG-3
        UPC4M$  \3
        ENDC
        IFEQ    NARG-11
        UPC4M$  \3,\4,\5,\6,\7,\8,\9,\A,\B
        ENDC
        STC4M$
        MEXIT
        ENDC

        IFC     '\2','LR'
        UPDCL$  \3,4
        STC4L$
        MEXIT
        ENDC

        IFC     '\2','HR'
        MOVE.W  #$FF14,CTRLP
        MOVE.W  \3,DATAP
        MEXIT
        ENDC

        IFC     '\2','HI'
        MOVE.W  #$FF1C,CTRLP
        MOVE.W  \3,DATAP
        MEXIT
        ENDC

        ENDC
*
* COUNTER 5
        IFC     '\1','C5'

        IFC     '\2','MR'
        IFEQ    NARG-3
        UPC5M$  \3
        ENDC
        IFEQ    NARG-11
        UPC5M$  \3,\4,\5,\6,\7,\8,\9,\A,\B
        ENDC
        STC5M$
        MEXIT
        ENDC

        IFC     '\2','LR'
        UPDCL$  \3,5
        STC5L$
        MEXIT
        ENDC

        IFC     '\2','HR'
        MOVE.W  #$FF15,CTRLP
        MOVE.W  \3,DATAP
        MEXIT
        ENDC

        IFC     '\2','HI'
```

```
         MOVE.W   #$FF1D,CTRLP
         MOVE.W   \3,DATAP
         ENDC

         ENDC
*
         ENDM
*
*
* FILE NAME:    STCMMR
*
* PURPOSE:      FORM THE MASTER MODE REGISTER -
*
* CALLED BY:    1). TEMMR$ - TABLE ENTRY, SPECIFIES
*               THE INITIAL VALUE OF THE MMR
*               IN THE ROM TABLE,CALLED 'INITBL'.
*               2). UPMMR$ - UPDATE, SPECIFIES
*               THE NEW VALUE OF THE MMR
*               IN THE RAM TABLE,CALLED 'RAMTBL'.
*
* MACRO CALL NAME: MMR$
*
* ARGUMENTS REQUIRED:   9
*
* FORMAT: MMR$ <scaler control>,<data pointer sequencing>;
*              <data bus width>,<fout gate>,<fout divider>;
*              <fout source>,<compare 2>,<compare 1>;
*              <time of day mode>
*
MMR$     MACRO
MMR$0    SET      $0000

* TEST FIRST PARAMETER - (SCALER CONTROL) *
         IFC      '\1','BCD'
MMR$0    SET      $80             BCD DIVISION
         ENDC
         IFC      '\1','BIN'
MMR$0    SET      $0              SET BINARY DIVISION BIT
         ENDC

* TEST SECOND PARAMETER - (DATA POINTER SEQUENCING) *
         IFC      '\2','DDP'
MMR$0    SET      (MMR$0)+$40     DISABLE
         ENDC
         IFC      '\2','EDP'
MMR$0    SET      (MMR$0)+$0      ENABLE
         ENDC

* TEST THIRD PARAMETER - (DATA BUS WIDTH) *
         IFC      '\3','DDB'
MMR$0    SET      (MMR$0)+$20     16-BIT
         ENDC
         IFC      '\3','SDB'
MMR$0    SET      (MMR$0)+$20     YOU'LL STILL GET 16-BIT
         ENDC

* TEST FOURTH PARAMETER - (FOUT GATE) *
         IFC      '\4','ON'
MMR$0    SET      (MMR$0)+$0      ENABLE
         ENDC
         IFC      '\4','OFF'
MMR$0    SET      (MMR$0)+$10     DISABLE
         ENDC
*              LOGICAL AND, FOUT DIVIDER
MMR$0    SET      ((MMR$0)+(\5)&($F))<<8
```

```
        * TEST SIXTH PARAMETER - (FOUT SOURCE) *
                IFC     '\6','S1'
MMR$0           SET     (MMR$0)!$10             SET SOURCE 1
                ENDC
                IFC     '\6','S2'
MMR$0           SET     (MMR$0)!$20             SET SOURCE 2
                ENDC
                IFC     '\6','S3'
MMR$0           SET     (MMR$0)!$30             SET SOURCE 3
                ENDC
                IFC     '\6','S4'
MMR$0           SET     (MMR$0)!$40             SET SOURCE 4
                ENDC
                IFC     '\6','S5'
MMR$0           SET     (MMR$0)!$50             SET SOURCE 5
                ENDC
                IFC     '\6','G1'
MMR$0           SET     (MMR$0)!$60             SET GATE 1
                ENDC
                IFC     '\6','G2'
MMR$0           SET     (MMR$0)!$70             SET GATE 2
                ENDC
                IFC     '\6','G3'
MMR$0           SET     (MMR$0)!$80             SET GATE 3
                ENDC
                IFC     '\6','G4'
MMR$0           SET     (MMR$0)!$90             SET GATE 4
                ENDC
                IFC     '\6','G5'
MMR$0           SET     (MMR$0)!$A0             SET GATE 5
                ENDC
                IFC     '\6','F1'
MMR$0           SET     (MMR$0)!$B0             SET FREQUENCY 1
                ENDC
                IFC     '\6','F2'
MMR$0           SET     (MMR$0)!$C0             SET F2
                ENDC
                IFC     '\6','F3'
MMR$0           SET     (MMR$0)!$D0             SET 'F3
                ENDC
                IFC     '\6','F4'
MMR$0           SET     (MMR$0)!$E0             SET 'F4
                ENDC
                IFC     '\6','F5'
MMR$0           SET     (MMR$0)!$F0             SET F5
                ENDC

        * TEST SEVENTH PARAMETER - (COMPARATOR 2) *
                IFC     '\7','ON'
MMR$0           SET     (MMR$0)!$08     ENABLE
                ENDC
                IFC     '\7','OFF'
MMR$0           SET     (MMR$0)!$00     DISABLE
                ENDC

        * TEST EIGHTH PARAMETER - (COMPARATOR 1) *
                IFC     '\8','ON'
MMR$0           SET     (MMR$0)!$04     ENABLE
                ENDC
                IFC     '\8','OFF'
MMR$0           SET     (MMR$0)!$0      DISABLE
                ENDC

        * TEST NINTH PARAMETER - (TIME OF DAY) *
                IFC     '\9','5'
MMR$0           SET     (MMR$0)!$01     ENABLE TOD - DIV 5
```

```
               ENDC
               IFC      '\9','6'
        MMR$0  SET      (MMR$0)!$02     ENABLE TOD - DIV 6
               ENDC
               IFC      '\9','10'
        MMR$0  SET      (MMR$0)!$03     ENABLE TOD - DIV 10
               ENDC
               IFC      '\9','OFF'
        MMR$0  SET      (MMR$0)!$0      DISABLE TOD
               ENDC
        *
               ENDM
        *
        *
        * FILE NAME:    STCCHR
        *
        * PURPOSE:      FORM THE COUNTER MODE REGISTER
        *
        * CALLED BY:    1). TECM$ -TABLE ENTRY, SPECIFIES
        *               THE INITIAL VALUE OF THE CMR IN THE
        *               'INITBL' TABLE.
        *               2). UPC$M$ - UPDATE COUNTER MODE REG,
        *               SPECIFIES THE NEW VALUE OF THE CMR
        *               IN THE 'RAMTBL' TABLE.
        *
        * MACRO CALL NAME:      CMR$
        *
        * ARGUMENTS REQUIRED:   9
        *
        * NOTE:         CMR$ MAY BE CALLED A MAXIMUM OF
        *               OF FIVE TIMES, ONCE FOR EACH COUNTER.
        *               AT LEAST ONE CALL IS REQUIRED AND A
        *               CMR$ MUST IMMEDIATELY FOLLOW A CLD$.
        *
        * FORMAT: CMR$  <gating control>,<count edge type>;
        *               <count source selection>;
        *               <special gate>,<reload register>;
        *               <count occurrence>,<type of count>;
        *               <step count>,<output control>
        *
        CMR$   MACRO

        CMR$0  SET      $0000

        * TEST FIRST PARAMETER - (GATING CONTROL) *
               IFC      '\1','OFF'
        CMR$0  SET      $00             DISABLE GATING
               ENDC
               IFC      '\1','HLT'
        CMR$0  SET      $20             HIGH LEVEL TCN-1
               ENDC
               IFC      '\1','HLGP'
        CMR$0  SET      $40             HIGH LEVEL GATE N+1
               ENDC
               IFC      '\1','HLGM'
        CMR$0  SET      $60             HIGH LEVEL GATE N-1
               ENDC
               IFC      '\1','HLG'
        CMR$0  SET      $80             HIGH LEVEL GATE N
               ENDC
               IFC      '\1','LLG'
        CMR$0  SET      $A0             LOW LEVEL GATE N
               ENDC
               IFC      '\1','HEG'
        CMR$0  SET      $C0             HIGH EDGE GATE N
               ENDC
```

```
                IFC     '\1','LEG'
        CHR$0   SET     $E0             LOW EDGE GATE N
                ENDC

        * TEST SECOND PARAMETER - (COUNT EDGE TYPE) *
                IFC     '\2','R'
        CHR$0   SET     (CHR$0)+$0      RISING EDGE
                ENDC
                IFC     '\2','F'
        CHR$0   SET     (CHR$0)+$10     FALLING EDGE
                ENDC

        * TEST THIRD PARAMETER - (COUNT SOURCE SELECTION) *
                IFC     '\3','T'
        CHR$0   SET     (CHR$0)+$0      TCN-1
                ENDC
                IFC     '\3','S1'
        CHR$0   SET     (CHR$0)+$01     SOURCE 1
                ENDC
                IFC     '\3','S2'
        CHR$0   SET     (CHR$0)+$02     SOURCE 2
                ENDC
                IFC     '\3','S3'
        CHR$0   SET     (CHR$0)+$03     SOURCE 3
                ENDC
                IFC     '\3','S4'
        CHR$0   SET     (CHR$0)+$04     SOURCE 4
                ENDC
                IFC     '\3','S5'
        CHR$0   SET     (CHR$0)+$05     SOURCE 5
                ENDC
                IFC     '\3','G1'
        CHR$0   SET     (CHR$0)+$06     GATE 1
                ENDC
                IFC     '\3','G2'
        CHR$0   SET     (CHR$0)+$07     GATE 2
                ENDC
                IFC     '\3','G3'
        CHR$0   SET     (CHR$0)+$08     GATE 3
                ENDC
                IFC     '\3','G4'
        CHR$0   SET     (CHR$0)+$09     GATE 4
                ENDC
                IFC     '\3','G5'
        CHR$0   SET     (CHR$0)+$0A     GATE 5
                ENDC
                IFC     '\3','F1'
        CHR$0   SET     (CHR$0)+$0B     F1
                ENDC
                IFC     '\3','F2'
        CHR$0   SET     (CHR$0)+$0C     F2
                ENDC
                IFC     '\3','F3'
        CHR$0   SET     (CHR$0)+$0D     F3
                ENDC
                IFC     '\3','F4'
        CHR$0   SET     (CHR$0)+$0E     F4
                ENDC
                IFC     '\3','F5'
        CHR$0   SET     (CHR$0)+$0F     F5
                ENDC
        CHR$0   SET     (CHR$0)<<8
        *
        * - THE NEXT FIVE PARAMETERS SPECIFY COUNT COUNTROL: -
        * TEST FOURTH PARAMETER - (SPECIAL GATE) *
                IFC     '\4','ON'
```

```
CMR$0   SET     (CMR$0)!$80             ENABLE
        ENDC
        IFC     '\4','OFF'
CMR$0   SET     (CMR$0)!$0              DISABLE
        ENDC
*
*
* TEST FIFTH PARAMETER - (RELOAD REGISTER) *
        IFC     '\5','L'
CMR$0   SET     (CMR$0)!$00     RELOAD FROM LOAD
        ENDC
        IFC     '\5','LH'
CMR$0   SET     (CMR$0)!$40     RELOAD FROM LOAD/HOLD
        ENDC

* TEST SIXTH PARAMETER - (COUNT OCCURRENCE) *
        IFC     '\6','ONE'
CMR$0   SET     (CMR$0)!$00     COUNT ONCE
        ENDC
        IFC     '\6','REP'
CMR$0   SET     (CMR$0)!$20     REPETITIVE COUNT
        ENDC

* TEST SEVENTH PARAMETER - (TYPE OF COUNT) *
        IFC     '\7','BIN'
CMR$0   SET     (CMR$0)!$00     BINARY COUNT
        ENDC
        IFC     '\7','BCD'
CMR$0   SET     (CMR$0)!$10     BCD COUNT
        ENDC

* TEST EIGHTH PARAMETER - (STEP COUNT) *
        IFC     '\8','DW'
CMR$0   SET     (CMR$0)!$00     COUNT DOWN
        ENDC
        IFC     '\8','UP'
CMR$0   SET     (CMR$0)!$08     COUNT UP
        ENDC

* TEST NINTH PARAMETER - (OUTPUT CONTROL) *
        IFC     '\9','IOL'
CMR$0   SET     (CMR$0)!$00     INACTIVE OUTPUT LOW
        ENDC
        IFC     '\9','HTC'
CMR$0   SET     (CMR$0)!$01     HIGH TC PULSE
        ENDC
        IFC     '\9','TCT'
CMR$0   SET     (CMR$0)!$02     TC TOGGLED
        ENDC
        IFC     '\9','IOH'
CMR$0   SET     (CMR$0)!$04     INACTIVE OUTPUT HIGH
        ENDC
        IFC     '\9','LTC'
CMR$0   SET     (CMR$0)!$05     LOW TC PULSE
        ENDC
*
        ENDM
*
*
* FILE NAME:    CNT5 - COUNTERS 5
*
* PURPOSE:      FORM THE COMMAND BYTE FOR
*               MULTIPLE COUNTER ENTRIES.
*
* NOTE:         ALL COMMANDS ARE 1 BYTE AND
*               ENTERED INTO THE COMMAND REG
```

```
*               BY WRITING TO THE CONTROL PORT.
*
* CALLED FROM:  ARM$, LOD$, LAM$, DSA$, SAV$, DSV$
*
* FORMAT:       CNT5$ <counter 5>,<counter 4>,counter 3>;
*                     <counter 2>,<counter 1>
*
* BIT ASSIGNMENTS:    -------------------------------
*                     !x!x!x!ctr5!ctr4!ctr3!ctr2!ctr1!
*                     -------------------------------
*                     command      counters
*
*
CNT5$   MACRO
*
        IFNE    \1-0
BYTE$0  SET     BYTE$0!(1<<(\1-1))
        ENDC
*
        IFNE    \2-0
BYTE$0  SET     BYTE$0!(1<<(\2-1))
        ENDC
*
        IFNE    \3-0
BYTE$0  SET     BYTE$0!(1<<(\3-1))
        ENDC
*
        IFNE    \4-0
BYTE$0  SET     BYTE$0!(1<<(\4-1))
        ENDC
*
        IFNE    \5-0
BYTE$0  SET     BYTE$0!(1<<(\5-1))
        ENDC
*
        MOVE.W  #(BYTE$0),CTRLP     WRITE TO CONTROL PORT
        ENDM
*
*****************************************************************
* EXPLANATION:    ARM = $20 / LOD = $40 / LAM = $60             *
*                 DSA = $C0 / SAV = $A0 / DSV = $80             *
*               THE CALLING COMMAND BIT VALUE IS LOGICALLY OR'ED*
*               WITH THE BIT VALUE OF THE COUNTERS SPECIFIED.   *
*               THESE COUNTERS ARE DEFINED BY ONE BIT SHIFTED   *
*               LEFT TO THE PROPER POSITION. THIS CREATES THE   *
*               DESIRED BYTE CONFIGURATION.                     *
*****************************************************************
*
* FILE NAME:    GET - 'GET REGISTER TO BE READ'
*
* PURPOSE:      -WRITES READ COMMAND TO CONTROL PORT
*               -GETS THE REGISTER FROM THE DATA PORT
*                OR FROM 'RAMTBL'.
*
* INPUT  REGISTER STATUS:    A1 = RAM  TABLE ADDRESS
* OUTPUT REGISTER STATUS:    D0 = RAM  REGISTER CONTENT
*                            D1 = CHIP REGISTER CONTENT
* CALLED BY:    READ$
*
* ARGUMENTS REQUIRED:   2
*
* FORMAT:       GET$  <register>,<read source>
*
*     note*       - only accessable through a READ$ call,
*                   which enters the required arguments.
*
```

```
                    GET$    MACRO
                            IFC     '\2','C'
                            MOVE.W  #BYTE$O,CTRLP    READ$ COMMAND BYTE
                            MOVE.W  DATAP,D1         GET REGISTER FROM CHIP
                            MEXIT
                            ENDC
                    *
                            IFC     '\2','R'
                            LEA     RAMTBL(PC),A1     RAM TABLE ADDR.
                            MOVE.W  \1(A1),D0         GET REG. OFFSET FROM TABLE
                            ENDC
                            ENDM

                    *
                    *
                            END

****** TOTAL ERRORS     0--
****** TOTAL WARNINGS   0--
```

SYMBOL TABLE LISTING

| SYMBOL NAME | | SECT | VALUE | SYMBOL NAME | | SECT | VALUE |
|---|---|---|---|---|---|---|---|
| A1R | | | 00000002 | SEQ$ | MACR | * | |
| A2R | | | 00000004 | SET$ | MACR | * | |
| ARM$ | MACR | * | | STA$ | MACR | * | |
| B16$ | MACR | * | | STA1R$ | MACR | * | |
| C1L | | | 00000006 | STA2R$ | MACR | * | |
| C1M | | | 00000008 | START$ | MACR | * | |
| C2L | | | 0000000A | STC1L$ | MACR | * | |
| C2M | | | 0000000C | STC1M$ | MACR | * | |
| C3L | | | 0000000E | STC2L$ | MACR | * | |
| C3M | | | 00000010 | STC2M$ | MACR | * | |
| C4L | | | 00000012 | STC3L$ | MACR | * | |
| C4M | | | 00000014 | STC3M$ | MACR | * | |
| C5L | | | 00000016 | STC4L$ | MACR | * | |
| C5M | | | 00000018 | STC4M$ | MACR | * | |
| CLR$ | MACR | * | | STC5L$ | MACR | * | |
| CMR$ | MACR | * | | STC5M$ | MACR | * | |
| CNT5$ | MACR | * | | STCEQU | | 0 | 00000000 |
| DSA$ | MACR | * | | STMMR$ | MACR | * | |
| DSV$ | MACR | * | | STP$ | MACR | * | |
| GET$ | MACR | * | | TEACR$ | MACR | * | |
| GOF$ | MACR | * | | TECL$ | MACR | * | |
| GON$ | MACR | * | | TECM$ | MACR | * | |
| INTL$ | MACR | * | | TEMMR$ | MACR | * | |
| LAM$ | MACR | * | | UPACR$ | MACR | * | |
| LOD$ | MACR | * | | UPC1M$ | MACR | * | |
| MMR | | | 00000000 | UPC2M$ | MACR | * | |
| MMR$ | MACR | * | | UPC3M$ | MACR | * | |
| NOSEQ$ | MACR | * | | UPC4M$ | MACR | * | |
| READ$ | MACR | * | | UPC5M$ | MACR | * | |
| RITE$ | MACR | * | | UPDCL$ | MACR | * | |
| RST$ | MACR | * | | UPMMR$ | MACR | * | |
| SAV$ | MACR | * | | | | | |

```
                    *       NOLIST
                    *
                    * REAL TIME EXECUTIVE EQUATE FILE.
                    *
                    *
                    * NUMBER SEQUENTIAL EQUATES MACRO (SHOULD BE IN ANOTHER EQUATE FILE?)
                    *
                    *       EQS[.S] LABEL   WHERE:
```

```
                        *
                        *       .S IS SIZE OF PRESENT ENTRY (Byte, Word, or Long. Default is byte)
                        *
                        EQS     MACRO
                        *
                        \1      EQU     SAV$
                        *
                                IFC     '\0','W'
                        SAV$    SET     SAV$+2
                                MEXIT
                                ENDC
                        *
                                IFC     '\0','L'
                        SAV$    SET     SAV$+4
                                MEXIT
                                ENDC
                        *
                        SAV$    SET     SAV$+1
                        *
                                ENDM
                        *
                        * EXEC CALLING MACRO:
                        *
                        XSVC    MACRO
                        *
                                TRAP    #15
                                DC.W    \1
                                ENDM
                        *
              00000000  SAV$    SET     0
                        *
                        * EXEC CALLS:
                        *
0 00000000                      EQS.L   EXEC            (USED TO BE LOTHER) MUST BE 1ST ONE.
0 00000000                      EQS.L   READY           (USED TO BE CSTINT)
0 00000000                      EQS.L   RDYALL          (USED TO BE STTINT)
0 00000000                      EQS.L   SUSPEN          (USED TO BE WAITIO)
0 00000000                      EQS.L   TSKINI          (USED TO BE STARSK)
                        *
                        * NOTE:  WAKEUP IS A SPECIAL CASE OF READY,
                        *        WAIT IS A SPECIAL CASE OF WAITIO,
                        *        WAITCN & WAITLP ARE SPECIAL CASES OF WAIT.
                        *
0 00000000                      EQS.L   DEVINI          INITIALIZE DICT
0 00000000                      EQS.L   WAKEUP          WAKE UP OWNER OF THIS DEVICE
0 00000000                      EQS.L   WAIT            WAIT FOR THIS DEVICE
0 00000000                      EQS.L   WAITCN          WAIT FOR OUR CONSOLE DEVICE
0 00000000                      EQS.L   WAITLP          WAIT FOR OUR PRINTER DEVICE
0 00000000                      EQS.L   RESERV          RESERVE A DEVICE
0 00000000                      EQS.L   RELEAS          RELEASE A DEVICE
0 00000000                      EQS.L   NEXTSK          SET NEXT TASK TO RUN
0 00000000                      EQS.L   CHGENT          CHANGE ENTRY POINT FOR THIS TASK
0 00000000                      EQS.L   TSKEND          SUSPEND & RESUME FROM NEW PC
0 00000000                      EQS.L   RESTRT          RESTART FROM SCRATCH
                        *
                        * TASK FRAME TABLE EQUATES:
                        *     36 BYTES/TASK
                        *
              00000000  SAV$    SET     0
                        *
0 00000000                      EQS.L   TK$ID           ;Task ID.
0 00000000                      EQS.L   TK$ENT          ;Restart entry point
0 00000000                      EQS.L   TK$SSP          ;Supervisor stack ptr.
0 00000000                      EQS.W   TK$STF          ;Activation flags
0 00000000                      EQS.W   TK$STM          ;Wait on flags
0 00000000                      EQS.W   TK$TIM          ;Timeout value
```

```
0 00000000                  EQS.L    TK$CON         ;DICT of console (Q input)-----Prime I/O
0 00000000                  EQS.L    TK$LPT         ;DICT of printer (or output)---Devices
0 00000000                  EQS.L    TK$NXT         ;Next task frame ptr.
0 00000000                  EQS.L    TK$RS0         ;Reserved
           00000022 TK$SIZ  EQU      SAV$           ;Task frame size
                    *
                    * DEVICE INTERRUPT CONTROL TABLE:
                    *        32 BYTES/DEVICE-ENTRY
                    *
           00000000 SAV$    SET      0
                    *
0 00000000                  EQS.W    DI$EVF         ;Event flags
0 00000000                  EQS.L    DI$OWN         ;Task frame addr. of owner
0 00000000                  EQS.L    DI$ISV         ;IRP SVC. address
0 00000000                  EQS.L    DI$DEV         ;Addr. HDWE ctrl reg.
0 00000000                  EQS.L    DI$QUE         ;Pointer to queue header block (0 if none)
0 00000000                  EQS.L    DI$PTR         ;User defined pointer (0 if none)
0 00000000                  EQS.L    DI$LNK         ;Link to next DICT
0 00000000                  EQS.B    DI$RS0         ;Reserved
0 00000000                  EQS.B    DI$IOM         ;Status I/O mask
0 00000000                  EQS.W    DI$STA         ;User status fields
0 00000000                  EQS.W    DI$USR         ;User area
           00000020 DI$SIZ  EQU      SAV$           ;DICT size
                    *
                    * TASK EXEC RAM OFFSETS:
                    *
           00000000 SAV$    SET      0
                    *
0 00000000                  EQS.W    EX$TIM         ;Master clock
0 00000000                  EQS.L    EX$TSK         ;Current running task ptr.
0 00000000                  EQS.L    EX$NXT         ;Next task to go ptr.
                    *
                    * DICT CHAINS: (1 for each priority level)
                    *
0 00000000                  EQS.L    EX$DV0         ;Ptr to devices not on any priority level
0 00000000                  EQS.L    EX$DV1         ;Pointer to priority 1 (low) device chain
0 00000000                  EQS.L    EX$DV2
0 00000000                  EQS.L    EX$DV3
0 00000000                  EQS.L    EX$DV4
0 00000000                  EQS.L    EX$DV5
0 00000000                  EQS.L    EX$DV6
0 00000000                  EQS.L    EX$DV7         ;Pointer to priority 7 (high) device chain
           0000002A EX$SIZ  EQU      SAV$           ;Task exec ram size in bytes
                    *
                    *
                    * .SPNJP - Suspend and Jump
                    *        arguments: <PC>,<FLAGS>,<TIME>
                    *
                    .SPNJP  MACRO
                            MOVE.L   #\2,D0   ;get event flags
                            MOVE.L   #\3,D1   ;get time
                            XSVC     .SUSPEN  ;trap to suspend
                            JMP      \1       ;jump to PC
                            ENDM
                    *
                    *
                    *
                    *
                            END

****** TOTAL ERRORS     0--
****** TOTAL WARNINGS   0--
```

SYMBOL TABLE LISTING

| SYMBOL NAME | SECT | VALUE | SYMBOL NAME | SECT | VALUE |
|---|---|---|---|---|---|
| .SPNJP | MACR ¤ | | EXEC | | 00000000 |
| CHGENT | | 00000034 | NEXTSK | | 00000030 |
| DEVINI | | 00000014 | RDYALL | | 00000008 |
| DI$DEV | | 0000000A | READY | | 00000004 |
| DI$EVF | | 00000000 | RELEAS | | 0000002C |
| DI$IOM | | 0000001B | RESERV | | 00000028 |
| DI$ISV | | 00000006 | RESTRT | | 0000003C |
| DI$LNK | | 00000016 | SAV$ | | 0000002A |
| DI$OWN | | 00000002 | SUSPEN | | 0000000C |
| DI$PTR | | 00000012 | TK$CON | | 00000012 |
| DI$QUE | | 0000000E | TK$ENT | | 00000004 |
| DI$RSO | | 0000001A | TK$ID | | 00000000 |
| DI$SIZ | | 00000020 | TK$LPT | | 00000016 |
| DI$STA | | 0000001C | TK$NXT | | 0000001A |
| DI$USR | | 0000001E | TK$RSO | | 0000001E |
| EQS | MACR ¤ | | TK$SIZ | | 00000022 |
| EX$DV0 | | 0000000A | TK$SSP | | 00000008 |
| EX$DV1 | | 0000000E | TK$STF | | 0000000C |
| EX$DV2 | | 00000012 | TK$STM | | 0000000E |
| EX$DV3 | | 00000016 | TK$TIM | | 00000010 |
| EX$DV4 | | 0000001A | TSKEND | | 00000038 |
| EX$DV5 | | 0000001E | TSKINI | | 00000010 |
| EX$DV6 | | 00000022 | WAIT | | 0000001C |
| EX$DV7 | | 00000026 | WAITCN | | 00000020 |
| EX$NXT | | 00000006 | WAITLP | | 00000024 |
| EX$SIZ | | 0000002A | WAKEUP | | 00000018 |
| EX$TIM | | 00000000 | XSVC | MACR ¤ | |
| EX$TSK | | 00000002 | | | |

```
                ¤        NOLIST
                ¤
                ¤ SECTION EQUATES:
                ¤
      00000009  PROM     EQU    9           PROM (PSCT) IN SECTION 9
      00000007  EEPROM   EQU    7           EEPROM (DSCT) IN SECTION 7
      00000005  RAM      EQU    5           RAM IN SECTION 5
                ¤
                ¤ MISCELLANEOUS CONSTANTS:
                ¤
      000039DF  S60      EQU    14815       SAMPLE INTERVAL FOR 60HZ WAVEFORM
      0003D090  ONESEC   EQU    $3D090      ONE SECOND @ 8 MHZ (32 X SCALE DOWN)
      0000000A  .1SEC    EQU    10          # OF 10 MS TICKS IN 100 MS
      000009C4  ONETIK   EQU    $9C4        10 MS. @ 8 MHZ (32 X SCALE DOWN)
      00000004  MAXAGE   EQU    4           DIB AGE OF BAD DONUT. (MUST BE < $1F)
                ¤
                ¤ ASCII CONTROL CHARACTERS:
                ¤
      00000002  STX      EQU    $2          START OF TEXT
      00000003  ETX      EQU    $3          END OF TEXT
      00000004  EOT      EQU    $4          END OF TRANSMISSION
      00000009  HT       EQU    $9          HORIZONTAL TAB
      0000000C  FF       EQU    $C          FORM FEED
      0000000D  CR       EQU    $D          CARRAIGE RETURN
      00000020  SPACE    EQU    $20         SPACE
                ¤
                ¤ NOTE: ALL HARDWARE ADDRESSES MUST BE DEF'ED IN THE LINK CHAIN FILE
                ¤
                ¤ TABLE ENTRY SIZES:
                ¤
      00000026  DIBENT$  EQU    38          # BYTES / DIB ENTRY
```

```
00000026    AIBENT$  EQU     38              # BYTES / AIB ENTRY
00000014    IPTENT$  EQU     20              # BYTES / IPT ENTRY
00000004    OPTENT$  EQU     4               # BYTES / OPT ENTRY
00000010    DSFTENT$ EQU     16              # BYTES / DSFT ENTRY
            *
            * TABLE/BUFFER BYTE OFFSETS:
            *
            * ANALOG INPUT BUFFER OFFSETS:
            *
00000002    .SAMPLE  EQU     2               RAW SAMPLE #1
0000001C    .EFFECT  EQU     28              EFFECTIVE VALUE
00000014    .COSINE  EQU     20              COSINE COMPONENT
00000018    .SINE    EQU     24              SINE COMPONENT
            *
            * DIGITAL INPUT BUFFER OFFSETS:
            *
00000002    .VCOS    EQU     2               VOLTAGE COSINE COMPONENT
00000006    .VSIN    EQU     6               VOLTAGE SINE COMPONENT
0000000A    .ICOS    EQU     10              CURRENT COSINE COMPONENT
0000000E    .ISIN    EQU     14              CURRENT SINE COMPONENT
00000012    .TEMP    EQU     18              RAW TEMPERATURE VALUE
00000014    .VEFF    EQU     20              EFFECTIVE VOLTAGE
00000018    .IEFF    EQU     24              EFFECTIVE CURRENT
0000001C    .STEMP   EQU     28              SCALED TEMPERATURE
            *
            * DIGITAL & ANALOG BUFFER OFFSETS:
            *
00000020    .WATTS   EQU     32              TOTAL WATTS
00000022    .WATTSEC EQU     34              ACCUMULATED WATT SECONDS
00000024    .KWH     EQU     36              ACCUMULATED KILOWATT HOURS
            *
            * DONUT SCALE FACTOR TABLE OFFSETS:
            *
00000002    .VSCALE  EQU     2               VOLTAGE SCALE FACTOR
00000006    .ISCALE  EQU     6               CURRENT SCALE FACTOR
0000000A    .TSCALE  EQU     10              TEMPERATURE SCALE FACTOR
0000000E    .TOFSET  EQU     14              TEMPERATURE OFFSET
            *
            * INPUT PERSONALITY TABLE ENTRY OFFSETS:
            *
00000004    .SCALE1  EQU     4               1ST SCALING FACTOR
00000008    .SCALE2  EQU     8               2ND SCALING FACTOR
0000000C    .SCALE3  EQU     12              3RD SCALING FACTOR
00000010    .SCALE4  EQU     16              4TH SCALING FACTOR
            *
            * QUEUE SIZES: (IN BYTES UNLESS OTHERWISE SPECIFIED)
            *
00000038    .AIQSIZ  EQU     56              AUX PORT INPUT QUEUE SIZE
00000038    .AOQSIZ  EQU     56              AUX PORT OUTPUT QUEUE SIZE
0000001C    .DIQSIZ  EQU     28              DONUT INPUT QUEUE SIZE (IN WORDS)
0000003F    .PIQSIZ  EQU     (48+15)         PROCESS INPUT QUEUE SIZE (IN WORDS)
000000C8    .HIQSIZ  EQU     200             HOST INPUT QUEUE SIZE
00000180    .HOQSIZ  EQU     128*3           HOST OUTPUT QUEUE SIZE
00000400    .RBFSIZ  EQU     $400            DOWNLOAD BUFFER SIZE (NOT REALLY QUEUE)
            *
            * EVENT FLAGS:
            *
00004000    F$ASMPL  EQU     $4000           SAMPLING FOR THIS CLUSTER COMPLETE
00002000    F$PROC   EQU     $2000           BUFFER PROCESSED
00001000    F$OST    EQU     $1000           OUTPUT SET FOR TRANSMISSION
00000800    F$PDI    EQU     $800            DATA REC'D FROM PROGRAMMING PORT
00000400    F$DNUT   EQU     $400            VALID DONUT BUFFER REC'D    N/A
00000200    F$XMIT   EQU     $200            RTU XMIT Q EMPTY
00000100    F$KYBD   EQU     $100            KEY WAITING FROM KB
00000080    F$MON    EQU     $80             DATA RCD FROM RTU XMIT MONITOR
00000040    F$EEPM   EQU     $40             BLOCK MOVE TO EEPROM INDICATOR
```

```
                   *
                   * PI/T REGISTER OFFSETS:
                   *
        00000000   PGCR     EQU     0                  PORT GENERAL CONTROL REGISTER
        00000002   PSRR     EQU     2                  PORT SERVICE REQUEST REGISTER
        00000004   PADDR    EQU     4                  PORT A DATA DIRECTION REGISTER
        00000006   PBDDR    EQU     6                  PORT B DATA DIRECTION REGISTER
        00000008   PCDDR    EQU     8                  PORT C DATA DIRECTION REGISTER
        0000000A   PIVR     EQU     $A                 PORT INTERRUPT VECTOR REGISTER
        0000000C   PACR     EQU     $C                 PORT A CONTROL REGISTER
        0000000E   PBCR     EQU     $E                 PORT B CONTROL REGISTER
        00000010   PADR     EQU     $10                PORT A DATA REGISTER
        00000012   PBDR     EQU     $12                PORT B DATA REGISTER
        00000014   PAAR     EQU     $14                PORT A ALTERNATE REGISTER
        00000016   PBAR     EQU     $16                PORT B ALTERNATE REGISTER
        00000018   PCDR     EQU     $18                PORT C DATA REGISTER
        0000001A   PSR      EQU     $1A                PORT STATUS REGISTER
        00000020   TCR      EQU     $20                TIMER CONTROL REGISTER
        00000022   TIVR     EQU     $22                TIMER INTERRUPT VECTOR REGISTER
        00000024   CPR      EQU     $24                COUNTER PRELOAD REGISTER (32 BITS)
        0000002E   CNTR     EQU     $2E                COUNTER REGISTER (32 BITS)
        00000034   TSR      EQU     $34                TIMER STATUS REGISTER
                   *
                   * PTM - (WATCHDOG) REGISTER OFFSETS:
                   *
        00000000   CTRL13   EQU     $0                 RESET TIMER CONTROL REGS 1 & 3
        00000002   CTRL2    EQU     $2                 CONTROL REGISTER 2
        00000004   TIMR1    EQU     $4                 TIMER # 1
        00000008   TIMR2    EQU     $8                 TIMER # 2
        0000000C   TIMR3    EQU     $C                 TIMER # 3
                   *
                   *
                   * RTI MACROS:
                   *
                   PUSH:    MACRO   PUSH SPECIFIED REGISTERS ON STACK
                            IFNE    NARG-1
                            FAIL    100             WRONG # OF ARGUMENTS
                            MEXIT
                            ENDC
                   *
                            IFNC    '\0','W'
                            MOVEM.L \1,-(SP)
                            ENDC
                   *
                            IFC     '\0','W'
                            MOVEM   \1,-(SP)
                            ENDC
                            ENDM
                   *
                   PULL:    MACRO   PULL SPECIFIED REGISTERS FROM STACK
                            IFNE    NARG-1
                            FAIL    100             WRONG # OF ARGUMENTS
                            MEXIT
                            ENDC
                   *
                            IFNC    '\0','W'
                            MOVEM.L (SP)+,\1
                            ENDC
                   *
                            IFC     '\0','W'
                            MOVEM   (SP)+,\1
                            ENDC
                            ENDM
                   *
                   *
                   *
```

167 END xxxxxx TOTAL ERRORS 0--
xxxxxx TOTAL WARNINGS 0--
SYMBOL TABLE LISTING

| SYMBOL NAME | SECT | VALUE | SYMBOL NAME | SECT | VALUE |
|---|---|---|---|---|---|
| .1SEC | | 0000000A | F$DNUT | | 00000400 |
| .AIQSIZ | | 00000038 | F$EEPM | | 00000040 |
| .AOQSIZ | | 00000038 | F$KYBD | | 00000100 |
| .COSINE | | 00000014 | F$MON | | 00000080 |
| .DIQSIZ | | 0000001C | F$OST | | 00001000 |
| .EFFECT | | 0000001C | F$PDI | | 00000800 |
| .HIQSIZ | | 000000C8 | F$PROC | | 00002000 |
| .HOQSIZ | | 00000180 | F$XMIT | | 00000200 |
| .ICOS | | 0000000A | FF | | 0000000C |
| .IEFF | | 00000018 | HT | | 00000009 |
| .ISCALE | | 00000006 | IPTENT$ | | 00000014 |
| .ISIN | | 0000000E | MAXAGE | | 00000004 |
| .KWH | | 00000024 | ONESEC | | 0003D090 |
| .PIQSIZ | | 0000003F | ONETIK | | 000009C4 |
| .RBFSIZ | | 00000400 | OPTENT$ | | 00000004 |
| .SAMPLE | | 00000002 | PAAR | | 00000014 |
| .SCALE1 | | 00000004 | PACR | | 0000000C |
| .SCALE2 | | 00000008 | PADDR | | 00000004 |
| .SCALE3 | | 0000000C | PADR | | 00000010 |
| .SCALE4 | | 00000010 | PBAR | | 00000016 |
| .SINE | | 00000018 | PBCR | | 0000000E |
| .STEMP | | 0000001C | PBDDR | | 00000006 |
| .TEMP | | 00000012 | PBDR | | 00000012 |
| .TOFSET | | 0000000E | PCDDR | | 00000008 |
| .TSCALE | | 0000000A | PCDR | | 00000018 |
| .VCOS | | 00000002 | PGCR | | 00000000 |
| .VEFF | | 00000014 | PIVR | | 0000000A |
| .VSCALE | | 00000002 | PROM | | 00000009 |
| .VSIN | | 00000006 | PSR | | 0000001A |
| .WATTS | | 00000020 | PSRR | | 00000002 |
| .WATTSEC | | 00000022 | PULL | MACR | x |
| AIBENT$ | | 00000026 | PUSH | MACR | x |
| CNTR | | 0000002E | RAM | | 00000005 |
| CPR | | 00000024 | S60 | | 000039DF |
| CR | | 0000000D | SPACE | | 00000020 |
| CTRL13 | | 00000000 | STX | | 00000002 |
| CTRL2 | | 00000002 | TCR | | 00000020 |
| DIBENT$ | | 00000026 | TIMR1 | | 00000004 |
| DSFTENT$ | | 00000010 | TIMR2 | | 00000008 |
| EEPROM | | 00000007 | TIMR3 | | 0000000C |
| EOT | | 00000004 | TIVR | | 00000022 |
| ETX | | 00000003 | TSR | | 00000034 |
| F$ASMPL | | 00004000 | | | |

Having described our invention, what we claim as new and desire to secure by Letters Patent is:

1. A system for monitoring the state of and for control of an electric power delivery network including a plurality of power conductors, said system comprising:

a plurality of sensor modules distributed throughout said network, each being removably attached to a respective one of the power conductors of the network, each of said sensor modules adapted to measure a plurality of characteristics of the conductor to which it is attached, and each of said sensor modules including a radio transmitter for transmitting at selected times the value of said measured characteristics;

a radio receiver for receiving said measured characteristics from a plurality of said sensor modules, said receiver including means for deriving operational status information about said plurality of power conductors from said measured characteristics;

state determining apparatus in communication with said radio receiver for determining the state of said power delivery network from said operational status information about said plurality of power conductors received from said radio receiver; and control apparatus coupled to said state determining apparatus and to said plurality of power conductors for controlling said power delivery network in accordance with said state of said network as determined by said state determining apparatus.

2. The system defined in claim 1, wherein said module is adapted to measure at least one electrical characteristic of the conductor to which it is attached.

3. A system for monitoring the state of and for control of an electric power delivery network including a plurality of power conductors connected on the primary side and secondary side of a power transformer, said system comprising:

a plurality of sensor modules, one or more of said sensors each being removably attached to a respective one of the power conductors on the primary side of a power transformer, and one or more of said sensor modules each being removably attached to a respective one of the power conductors on the secondary side of a power transformer, each of said sensor modules adapted to measure a plurality of electrical characteristics of the conductor to which it is attached; and each of said sensor modules including a transmitter for transmitting through the air at selected times the value of said measured characteristics;

a radio receiver for receiving said measured charactertics from a plurality of said sensor modules, said receiver including means for deriving operational status information about said power transformer from said measured characteristics;

state determining apparatus in communication with said radio receiver for determining the state of said power transformer from said operational status information about said power transformer received from said radio receiver, and control apparatus coupled to said state determining apparatus and to said plurality of power conductors for controlling said power delivery network in accordance with said state of said power transformer as determined by said state determining apparatus.

4. A system as defined in claims 1 or 3 including a plurality of sensor modules mounted to power conductors at an electrical substation, said sensor modules monitoring conductor characteristics at said substation, and automatic control means responsive to transmissions from said sensor modules to control said substation.

5. A system as defined in claim 4 wherein said automatic control means provides transformer differential protection at said substation.

6. A system as defined in claim 4 wherein sensor modules are provided at two or more substations and said automatic control means controls transfer trip relaying between substations.

7. A system for monitoring the state of and for control of an electric power delivery network including a plurality of power conductors connected on the primary side and secondary side of power transformers, said system comprising:

a first substation comprising a first power transformer, a plurality of sensor modules at said first substation, one or more of said sensor modules each being removably attached to a respective one of the power conductors on the primary side of said first power transformer, and one or more of said sensor modules each being removably attached to a respective one of the power conductors on the secondary side of said first power transformer, each of said sensor modules adapted to measure a plurality of electrical characteristics of the conductor to which it is attached, and each of said sensor modules including a transmitter for transmitting through the air at selected times the value of said measured characteristics;

a first radio receiver for receiving said measured characteristics from a plurality of said sensor modules, said first receiver including means for deriving operational status information about said first power transformer from said measured characteristics;

first substation state determining apparatus in communication with said first radio receiver for determining the state of said first power operational status information about said first power transformer received from said first radio receiver;

a second substation comprising a second power transformer, a plurality of sensor modules at said second substation, one or more of said sensor modules each being removably attached to a respective one of the power conductors on the primary side of said second power transformer, and one or more of said sensor modules each being removably attached to a respective one of the power conductors on the secondary side of said second power transformer, each of said sensor modules adapted to measure a plurality of electrical characteristic of the conductor to which it is attached, and each of said sensor modules including a transmitter for transmitting through the air at selected times the value of said measured characteristic;

a second radio receiver for receiving said measured characteristics from a plurality of said sensor modules, said second receiver including means for deriving operational status from said measured characteristics;

second substation state determining apparatus in communication with said second radio receiver for determining the state of said second power transformer from said operational status information about said second power transformer receiver from said second radio receiver;

a transmission line connecting said first and second power transformers;

a first communications link between said first substation state determining apparatus and a central station, and a second communication link between said second substation state determining apparatus and said central station;

system state determining apparatus at said central station for determining the state of said electric power delivery network from said state of said first and second power transformers as determined by said first and second substation state determining apparatus respectively; and control apparatus coupled to said system state determining apparatus and to said plurality of power conductors for controlling said power delivery network in accordance with said state of said network as determined by said system determining apparatus.

8. A system as defined in claim 2 wherein said control apparatus includes switchgear at at least one of said substations for controlling the power transmitted over said transmission line, and a third communications link between said central station and said switchgear for controlling said switchgear in accordance with the state of said network as determined by said system state determining apparatus.

9. A system as defined in claims 1, 3 or 7 wherein said sensor modules transmit a sensor module indentification with each transmission of said measured characteristics.

10. A system as defined in claim 9 wherein said radio receiver receives said module identification and is responsive to said identification for determining the source of said transmitted characteristics.

11. A system as defined in claim 8, and including first substation switchgear at said first substation for controlling power to said first transformer and a fourth communications link between said first substation state determining apparatus and said first substation switchgear for controlling said first substation switchgear in accordance with the state of said first transformer as determined by said first substation state determining apparatus.

12. A system as defined in claims 1, 3, or 7 wherein one of said characteristics is current.

13. A system as defined in claims 1, 3 or 7 wherein one of said characteristics is voltage.

14. A system as defined in claims 1, 3 or 7 wherein said power conductors carry alternating current and one of said characteristics is a Fourier component of current.

15. A system as defined in claims 1, 3 or 7 wherein said power conductors carry alternating current and one of said characteristics is a Fourier component of voltage.

16. A system as defined in claims 1, 3, or 7 wherein one of said characteristics is the temperature of the conductor to which the sensor is attached.

17. A system as defined in claims 1, 3, or 7 wherein one of said characteristics is the temperature of the ambient air surrounding the conductor to which the sensor is attached.

18. A system as defined in claims 1, 3 or 7 wherein said power conductors carry alternating current and one of said characterized is in the frequency of the alternating current power carried by the conductor to which a sensor module is attached.

19. The system defined in claims 1, 3, 7, or 8 wherein said module is hot stick mountable to an energized conductor.

20. A method of monitoring an electric power delivery system including a plurality of power lines, comprising:

mounting each one of a plurality of removably attachable power line state estimator modules to a respective one of said plurality of power lines, measuring a plurality of characteristics of each of said power lines with said attached module.

transmitting at selected times the value of said measured characteristics from each of said modules to a remote radio receiver.

deriving at said receiver operational status information about said plurality of lines from said measured characteristics and transmitting said status information to a central station, determining at said central station the state of said power delivery system from said operational status information received from said radio receiver, and controlling said power delivery network in accordance with said state of said network as determined by said state determining apparatus.

21. The method defined in claim 20 wherein a fault in said power delivery system is indicated by a module measuring reverse fault current and the physical location of said fault is determined at said control station.

22. The method as defined in claims 20 or 21 wherein at least one of said modules measures current.

23. The method as defined in claims 20 or 21 wherein at least one of said modules measures voltage.

24. The method as defined in claims 20 or 21 wherein at least one of said modules measures the temperature of the power line to which it is mounted.

25. The method as defined in claims 20 or 21 wherein at least one of said modules measures the ambient temperature.

26. The method as defined in claims 20 or 21 wherein said modules measure current, voltage and temperature of the power line to which it is mounted.

* * * * *

UNITED STATES PATENT AND TRADEMARK OFFICE
CERTIFICATE OF CORRECTION

PATENT NO. : 4,689,752

DATED : August 25, 1987

INVENTOR(S) : Roosevelt A. Fernandes, William R. Smith-Vaniz

It is certified that error appears in the above-identified patent and that said Letters Patent is hereby corrected as shown below:

In Claim 8, line 1, "claim 2" should be -- claim 7 --.

Signed and Sealed this

Nineteenth Day of September, 1989

*Attest:*

DONALD J. QUIGG

*Attesting Officer*

*Commissioner of Patents and Trademarks*